US005768561A

United States Patent [19]

Wise

[11] Patent Number: 5,768,561

[45] Date of Patent: Jun. 16, 1998

[54] TOKENS-BASED ADAPTIVE VIDEO PROCESSING ARRANGEMENT

[75] Inventor: Adrian Philip Wise, Bristol, United Kingdom

[73] Assignee: Discovision Associates, Irvine, Calif.

[21] Appl. No.: 399,898

[22] Filed: Mar. 7, 1995

Related U.S. Application Data

[60] Division of Ser. No. 400,397, Mar. 7, 1995, which is a continuation-in-part of Ser. No. 382,958, Feb. 2, 1995, abandoned, which is a continuation of Ser. No. 82,291, Jun. 24, 1993, abandoned.

[30] Foreign Application Priority Data

| | | | |
|---|---|---|---|
| Jun. 30, 1992 | [EP] | European Pat. Off. | 92306038 |
| Mar. 24, 1994 | [GB] | United Kingdom | 9405914 |
| Feb. 28, 1995 | [GB] | United Kingdom | 9504047 |

[51] Int. Cl.$^6$ ..... G06F 3/14

[52] U.S. Cl. ..... 395/500; 395/800.15; 395/200.51

[58] Field of Search ..... 395/500, 650, 395/700, 800, 200.01, 200.06, 200.13–200.21, 800.15, 653, 284, 200.51

[56] References Cited

U.S. PATENT DOCUMENTS

| | | | |
|---|---|---|---|
| Re. 33,632 | 7/1991 | Nakamura et al. | 358/261.1 |
| 3,875,391 | 4/1975 | Shapiro et al. | 364/200 |
| 3,893,042 | 7/1975 | Whitman et al. | 331/55 |
| 3,962,685 | 6/1976 | Belle Isle | 340/172.5 |
| 4,107,780 | 8/1978 | Grimsdale et al. | 364/521 |
| 4,142,205 | 2/1979 | Iinuma | 358/13 |
| 4,149,242 | 4/1979 | Pirz | 364/200 |
| 4,196,448 | 4/1980 | Whitehouse et al. | 358/135 |
| 4,215,369 | 7/1980 | Iijima | 358/146 |
| 4,225,920 | 9/1980 | Stokes | 364/200 |
| 4,228,497 | 10/1980 | Gupta et al. | 364/200 |
| 4,302,775 | 11/1981 | Widergren et al. | 358/136 |
| 4,307,447 | 12/1981 | Provanzano et al. | 364/200 |

(List continued on next page.)

FOREIGN PATENT DOCUMENTS

| | | |
|---|---|---|
| 0196911 | 10/1986 | European Pat. Off. . |
| 0255767 | 2/1988 | European Pat. Off. . |
| 0468480 | 1/1992 | European Pat. Off. . |
| 0572262 | 12/1993 | European Pat. Off. . |
| 0572263 | 12/1993 | European Pat. Off. . |
| 0576749 | 1/1994 | European Pat. Off. . |
| 0589734 | 3/1994 | European Pat. Off. . |
| 0618728 | 10/1994 | European Pat. Off. . |
| 0639032 | 2/1995 | European Pat. Off. . |

(List continued on next page.)

OTHER PUBLICATIONS

Chong, "A Data Flow Architecture For Digital Image Processing," WesconTech. Papers No. 4/6, Oct. 30, 1984, Anaheim, California, USA, pp. 1–10.

P. Yip, et al., "DIT and DIF Algorithm for Discrete Sine and Cosine Transforms" Proceedings of the International Symposium on Circuits and Systems, IEEE Press, New York, US, vol. 2/3, 5 Jun. 1985, Kyoto, JP, pp. 941–944.

(List continued on next page.)

*Primary Examiner*—Kevin J. Teska
*Assistant Examiner*—Tyrone V. Walker
*Attorney, Agent, or Firm*—Ronald J. Clark; Robert T. Braun; Arthur S. Bickel

[57] ABSTRACT

A multi-standard video decompression apparatus has a plurality of stages interconnected by a two-wire interface arranged as a pipeline processing machine. Control tokens and DATA Tokens pass over the single two-wire interface for carrying both control and data in token format. A token decode circuit is positioned in certain of the stages for recognizing certain of the tokens as control tokens pertinent to that stage and for passing unrecognized control tokens along the pipeline. Reconfiguration processing circuits are positioned in selected stages and are responsive to a recognized control token for reconfiguring such stage to handle an identified DATA Token. A wide variety of unique supporting subsystem circuitry and processing techniques are disclosed for implementing the system.

37 Claims, 124 Drawing Sheets

U.S. PATENT DOCUMENTS

| | | | |
|---|---|---|---|
| 4,334,246 | 6/1982 | Saran | 358/261 |
| 4,433,308 | 2/1984 | Hirata | 331/17 |
| 4,437,072 | 3/1984 | Asami | 331/1 A |
| 4,467,409 | 8/1984 | Potash et al. | 364/200 |
| 4,495,629 | 1/1985 | Zasio et al. | 377/70 |
| 4,540,903 | 9/1985 | Cooke et al. | 307/465 |
| 4,580,066 | 4/1986 | Berndt | 307/276 |
| 4,598,372 | 7/1986 | McRoberts | 364/518 |
| 4,617,657 | 10/1986 | Drynan et al. | 370/60 |
| 4,630,198 | 12/1986 | Yuan | 364/200 |
| 4,646,151 | 2/1987 | Welles, II et al. | 358/149 |
| 4,679,163 | 7/1987 | Arnould et al. | 364/725 |
| 4,710,866 | 12/1987 | Zolnowsky et al. | 364/200 |
| 4,747,070 | 5/1988 | Trottier et al. | 364/900 |
| 4,785,349 | 11/1988 | Keith et al. | 358/136 |
| 4,789,927 | 12/1988 | Hannah | 364/200 |
| 4,799,677 | 1/1989 | Frederiksen | 273/1 E |
| 4,809,159 | 2/1989 | Sowa | 364/200 |
| 4,811,214 | 3/1989 | Nosenchuck et al. | 364/200 |
| 4,811,413 | 3/1989 | Kimmel | 382/41 |
| 4,814,978 | 3/1989 | Dennis | 364/200 |
| 4,823,201 | 4/1989 | Simon et al. | 358/133 |
| 4,829,465 | 5/1989 | Knauer et al. | 364/725 |
| 4,831,440 | 5/1989 | Borgers et al. | 358/133 |
| 4,841,436 | 6/1989 | Asano et al. | 364/200 |
| 4,855,947 | 8/1989 | Zymslowski et al. | 364/200 |
| 4,866,510 | 9/1989 | Goodfellow et al. | 358/13 |
| 4,866,637 | 9/1989 | Gonzalez-Lopez et al. | 364/518 |
| 4,887,224 | 12/1989 | Okano et al. | 364/518 |
| 4,891,784 | 1/1990 | Kato et al. | 364/900 |
| 4,897,803 | 1/1990 | Calarco et al. | 364/518 |
| 4,903,018 | 2/1990 | Wiebach et al. | 341/51 |
| 4,912,668 | 3/1990 | Aubie et al. | 364/725 |
| 4,922,341 | 5/1990 | Strobach | 358/136 |
| 4,922,418 | 5/1990 | Dolecek | 364/200 |
| 4,924,298 | 5/1990 | Kitamura | 358/12 |
| 4,924,308 | 5/1990 | Feuchtwanger | 358/133 |
| 4,943,916 | 7/1990 | Asano et al. | 364/200 |
| 4,953,082 | 8/1990 | Nomura et al. | 364/200 |
| 4,975,595 | 12/1990 | Roberts et al. | 307/272.2 |
| 4,985,766 | 1/1991 | Morrison et al. . | |
| 4,989,138 | 1/1991 | Radochonski | 364/200 |
| 4,991,112 | 2/1991 | Callemyn | 364/518 |
| 5,003,204 | 3/1991 | Cushing et al. | 307/465 |
| 5,014,138 | 5/1991 | Fischer et al. | 358/448 |
| 5,021,947 | 6/1991 | Campbell et al. | 364/200 |
| 5,027,212 | 6/1991 | Marlton et al. | 358/183 |
| 5,038,209 | 8/1991 | Hang | 358/136 |
| 5,043,880 | 8/1991 | Yoshida | 364/200 |
| 5,050,166 | 9/1991 | Cantoni et al. | 370/94.1 |
| 5,053,985 | 10/1991 | Friedlander et al. | 364/725 |
| 5,055,841 | 10/1991 | Cordell | 341/67 |
| 5,057,793 | 10/1991 | Cowley et al. | 331/1 A |
| 5,057,917 | 10/1991 | Shalkauser et al. | 358/135 |
| 5,060,242 | 10/1991 | Arbeiter | 375/122 |
| 5,081,450 | 1/1992 | Lucas et al. | 340/728 |
| 5,086,489 | 2/1992 | Shimura | 382/56 |
| 5,091,721 | 2/1992 | Hamori | 340/727 |
| 5,107,345 | 4/1992 | Lee | 358/432 |
| 5,111,292 | 5/1992 | Kuriacose et al. | 358/133 |
| 5,113,255 | 5/1992 | Nagata et al. | 358/136 |
| 5,122,873 | 6/1992 | Golin | 358/133 |
| 5,122,875 | 6/1992 | Raychaudhuri et al. | 358/133 |
| 5,122,948 | 6/1992 | Zapolin | 364/131 |
| 5,124,790 | 6/1992 | Nakayama | 358/133 |
| 5,126,842 | 6/1992 | Andrews et al. | 358/133 |
| 5,129,059 | 7/1992 | Hannah | 395/166 |
| 5,130,568 | 7/1992 | Miller et al. | 307/272.2 |
| 5,134,487 | 7/1992 | Taguchi et al. | 358/209 |
| 5,134,697 | 7/1992 | Scheffler | 395/425 |
| 5,136,371 | 8/1992 | Savatier et al. | 358/133 |
| 5,142,380 | 8/1992 | Sakagami et al. | 358/432 |
| 5,146,325 | 9/1992 | Ng | 358/135 |
| 5,146,326 | 9/1992 | Hasegawa | 358/135 |
| 5,148,271 | 9/1992 | Kato et al. | 358/133 |
| 5,148,524 | 9/1992 | Harlin et al. | 395/166 |
| 5,151,875 | 9/1992 | Sato | 364/784 |
| 5,159,449 | 10/1992 | Allmendinger | 358/136 |
| 5,163,149 | 11/1992 | Brantley et al. | 395/650 |
| 5,164,819 | 11/1992 | Music | 358/13 |
| 5,168,356 | 12/1992 | Acampora et al. | 358/133 |
| 5,168,375 | 12/1992 | Reisch et al. | 358/432 |
| 5,172,011 | 12/1992 | Leuthold et al. | 307/272.2 |
| 5,173,695 | 12/1992 | Sun et al. | 341/67 |
| 5,175,617 | 12/1992 | Wallace et al. | 358/133 |
| 5,179,372 | 1/1993 | West et al. | 340/799 |
| 5,182,642 | 1/1993 | Gersdorff et al. | 358/133 |
| 5,184,124 | 2/1993 | Molpus et al. | 341/50 |
| 5,184,347 | 2/1993 | Farwell et al. | 370/94.1 |
| 5,185,819 | 2/1993 | Ng et al. | 382/56 |
| 5,189,526 | 2/1993 | Sasson | 358/432 |
| 5,191,548 | 3/1993 | Balkanski et al. | 364/725 |
| 5,193,002 | 3/1993 | Guichard et al. | 358/133 |
| 5,201,056 | 4/1993 | Daniel et al. | 395/800 |
| 5,202,847 | 4/1993 | Bolton et al. | 364/725 |
| 5,203,003 | 4/1993 | Donner | 395/800 |
| 5,212,549 | 5/1993 | Ng et al. | 358/135 |
| 5,212,742 | 5/1993 | Normile et al. | 382/56 |
| 5,214,507 | 5/1993 | Aravind et al. | 358/133 |
| 5,214,770 | 5/1993 | Ramanujan et al. | 395/425 |
| 5,216,724 | 6/1993 | Suzuki et al. | 382/7 |
| 5,218,436 | 6/1993 | Sugiyama et al. | 358/141 |
| 5,223,926 | 6/1993 | Stone et al. | 358/133 |
| 5,226,131 | 7/1993 | Grafe et al. | 395/375 |
| 5,227,863 | 7/1993 | Bilbrey et al. | 348/578 |
| 5,227,878 | 7/1993 | Puri et al. | 358/136 |
| 5,228,098 | 7/1993 | Crinon et al. | 382/56 |
| 5,229,863 | 7/1993 | Kao et al. | 358/426 |
| 5,231,484 | 7/1993 | Gonzales et al. | 358/133 |
| 5,231,486 | 7/1993 | Acampora et al. | 358/133 |
| 5,233,420 | 8/1993 | Piri et al. | 358/149 |
| 5,233,545 | 8/1993 | Ho et al. | 364/569 |
| 5,233,690 | 8/1993 | Sherlock et al. | 395/165 |
| 5,237,413 | 8/1993 | Israelson et al. | 358/160 |
| 5,241,222 | 8/1993 | Small et al. | 307/449 |
| 5,241,383 | 8/1993 | Chen et al. | 358/136 |
| 5,241,635 | 8/1993 | Papadopoulos et al. | 395/375 |
| 5,241,658 | 8/1993 | Masterson et al. | 395/162 |
| 5,247,612 | 9/1993 | Quinard | 395/166 |
| 5,249,146 | 9/1993 | Uramoto et al. | 364/725 |
| 5,253,058 | 10/1993 | Gharavi | 358/136 |
| 5,253,078 | 10/1993 | Balkanski et al. | 358/426 |
| 5,257,213 | 10/1993 | Kim et al. | 364/725 |
| 5,257,223 | 10/1993 | Dervisoglu | 365/154 |
| 5,257,350 | 10/1993 | Howard et al. | 395/162 |
| 5,258,725 | 11/1993 | Kinoshita | 331/17 |
| 5,260,781 | 11/1993 | Soloff et al. | 358/133 |
| 5,260,782 | 11/1993 | Hui | 358/133 |
| 5,261,047 | 11/1993 | Rivshin | 395/163 |
| 5,263,136 | 11/1993 | DeAguiar et al. | 395/164 |
| 5,267,334 | 11/1993 | Normille et al. | 382/56 |
| 5,276,513 | 1/1994 | van der Wal et al. | 358/136 |
| 5,276,681 | 1/1994 | Tobagi et al. | 370/85.4 |
| 5,276,784 | 1/1994 | Ohki | 395/127 |
| 5,278,520 | 1/1994 | Parker et al. | 331/1 A |
| 5,278,646 | 1/1994 | Civanlar et al. | 358/133 |
| 5,278,647 | 1/1994 | Hingorani et al. | 358/136 |
| 5,283,646 | 2/1994 | Bruder | 348/415 |
| 5,287,178 | 2/1994 | Acampora et al. | 348/384 |
| 5,287,193 | 2/1994 | Lin | 358/261.1 |
| 5,287,420 | 2/1994 | Barrett | 382/56 |
| 5,289,276 | 2/1994 | Siracusa et al. | 348/467 |

| | | | |
|---|---|---|---|
| 5,289,577 | 2/1994 | Gonzales et al. | 395/163 |
| 5,293,229 | 3/1994 | Iu | 348/415 |
| 5,294,894 | 3/1994 | Gebara | 331/1 A |
| 5,297,263 | 3/1994 | Ohtsuka et al. | 395/375 |
| 5,298,896 | 3/1994 | Lei et al. | 341/51 |
| 5,298,992 | 3/1994 | Pietras et al. | 348/415 |
| 5,299,025 | 3/1994 | Shirasawa | 358/400 |
| 5,300,949 | 4/1994 | Rodriguez et al. | 345/202 |
| 5,301,019 | 4/1994 | Citta | 348/416 |
| 5,301,032 | 4/1994 | Hong et al. | 358/261.2 |
| 5,301,040 | 4/1994 | Hoshi et al. | 358/465 |
| 5,301,136 | 4/1994 | McMillan, Jr. et al. | 364/725 |
| 5,301,242 | 4/1994 | Gonzales et al. | 382/56 |
| 5,301,272 | 4/1994 | Atkins | 395/165 |
| 5,301,344 | 4/1994 | Kolchinsky | 395/800 |
| 5,303,342 | 4/1994 | Edge | 395/164 |
| 5,304,953 | 4/1994 | Heim et al. | 331/1 A |
| 5,305,438 | 4/1994 | MacKay et al. | 395/164 |
| 5,309,527 | 5/1994 | Ohki | 382/56 |
| 5,309,563 | 5/1994 | Farrand et al. | 395/200.01 |
| 5,311,309 | 5/1994 | Ersoz et al. | 348/409 |
| 5,325,092 | 6/1994 | Allen et al. | 341/65 |
| 5,329,313 | 7/1994 | Keith | 348/422 |
| 5,329,619 | 7/1994 | Page et al. | 395/200.01 |
| 5,333,212 | 7/1994 | Ligtenberg | 382/56 |
| 5,333,266 | 7/1994 | Boaz et al. | 395/200 |
| 5,341,371 | 8/1994 | Simpson | 370/85.4 |
| 5,351,047 | 9/1994 | Behlen | 341/67 |
| 5,367,636 | 11/1994 | Colley et al. | 395/200.16 |
| 5,369,405 | 11/1994 | Choi et al. | 341/63 |
| 5,406,279 | 4/1995 | Anderson et al. | 341/51 |
| 5,412,782 | 5/1995 | Hausman et al. | 395/250 |
| 5,414,813 | 5/1995 | Shiobara | 395/200 |
| 5,421,028 | 5/1995 | Swanson | 395/800 |
| 5,442,790 | 8/1995 | Nosenchuck | 395/700 |
| 5,446,866 | 8/1995 | Drako et al. | 395/500 |
| 5,448,310 | 9/1995 | Kopet et al. | 348/719 |
| 5,450,599 | 9/1995 | Horvath et al. | 395/800 |
| 5,452,006 | 9/1995 | Auld | 348/390 |
| 5,457,780 | 10/1995 | Shaw et al. | 395/165 |
| 5,461,679 | 10/1995 | Normile et al. | 395/650 |
| 5,481,689 | 1/1996 | Stamm et al. | 395/412 |
| 5,487,064 | 1/1996 | Galand et al. | 370/60 |
| 5,490,247 | 2/1996 | Tung et al. | 395/200.04 |
| 5,495,291 | 2/1996 | Adams | 348/390 |
| 5,497,498 | 3/1996 | Taylor | 395/800 |
| 5,504,869 | 4/1996 | Uchida | 395/375 |
| 5,510,857 | 4/1996 | Kopet et al. | 348/699 |
| 5,517,603 | 5/1996 | Kelley et al. | 395/126 |
| 5,517,670 | 5/1996 | Allen et al. | 395/850 |
| 5,535,290 | 7/1996 | Allen | 382/250 |
| 5,566,089 | 10/1996 | Hoogenboom | 364/514 A |
| 5,574,933 | 11/1996 | Horst | 395/800 |
| 5,579,052 | 11/1996 | Artieri | 348/416 |
| 5,590,283 | 12/1996 | Hillis et al. | 395/200.02 |

FOREIGN PATENT DOCUMENTS

| | | | |
|---|---|---|---|
| 2045035 | 10/1980 | United Kingdom . | |
| 2059724 | 4/1981 | United Kingdom . | |
| 2171578 | 8/1986 | United Kingdom . | |
| 2194085 | 2/1988 | United Kingdom . | |
| 2268035 | 12/1993 | United Kingdom . | |
| 2269070 | 1/1994 | United Kingdom . | |
| WO 94/25935 | 11/1994 | WIPO | G06K 15/00 |

OTHER PUBLICATIONS

Hsieh S. Hou. "A Fast Recursive Algorithm for Computing the Discrete Cosine Transform," IEEE Transactions on Acoustics, Speech, and Signal Processing, vol. 35, No. 10, Oct. 1987, IEEE Press, New York, US, pp. 1455–1461.

Komori et al., An Elastic Pipeline Mechanism By Self–Timed Circuits, IEEE Journal Of Solid–State Circuits, vol. 23, No. 1, Feb. 1988, New York, NY, USA, pp. 111–117.

A. Gupta et al., "A Fast Recursive Algorithm for the Discrete Sine Transform," IEEE Transactions on Acoustics, Speech, and Signal Processing, vol. 38, No. 3, Mar. 1990, IEEE Press, New York, US, pp. 553–557.

H.R. Wu, et al., "A Two Dimensional Fast Cosine Tranform Algorithm Based on Hou's Approach," IEEE Transaction on Acoustics, Speech, and Signal Processing, vol. 39, No. 2, Feb. 1991, IEEE Press, New York, US, pp. 544–546.

Kopet, Tom 'Programmable architecture for real–time video compression'.

4th International Conference on Signal Processing Applications & Technology, vol. 2, 28 Sep. 1993–1 Oct. 1993 Santa Clara, Californai USA pp. 1031–1038.

Mayer, A.C. 'The Architecture of a Single–Chip Processor Array for Video Compression'.

Proceedings of the International Conference on Consumer Electronics, Rosemont, Jun. 8–10, 1993, No. Conf 12,8 Jun. 1993 Institute of Electrical and Electronics Engineers, pp. 294–295 XP 000427624.

Elliott, J A et al 'Real Time Simulation Of Videophone Image Coding Algorithms On Reconfigurable Multicomputers'.

IEEE Proceedings E. Computers & Digital Techniques. vol. 139, No. 3 Part E, 1 May 1992 pp. 269–279, XP000306411.

Tokumichi Murakami et al 'A DSP Architectural Design For Low Bit–Rate Motion Video Codec'.

IEEE Transactions On Circuits and Systems, vol. 36, No. 10 1 Oct. 1989 pp. 1267–1274, XP 000085313.

Kaoru Uchida et al 'A Pipelined Dataflow Processor Architecture Based On A Variable Length Token Concept'.

Architecture, University Park, Aug. 15–19, 1988, vol. 1, 15 Aug. 1988 Briggs F A, pp. 209–216, XP 000079309.

Hong, Yang–Chang; T.H. Payne. A Hybrid Approach for Efficient Dataflow Computing, Computers and Communications, 1990 Int'l Phoenix Conference, IEEE Publications, May 1990 pp. 170–178.

Normile, James, Dan Wright, Image Compression Using Coarse Grain Parallel Processing, ICASSP 1991: Acoustics, Speech & Signal Processing Conference, IEEE Publications, Jul. 1991 pp. 1121–1124.

Yang, Kun–Min. VLSI Architecture Design for a Versatile Variable Length Decoding Chip for Real–Time Video Codecs, Tencon 1990 IEEE Region 10 Conference on Computer and Communication . . . , IEEE Publications Feb. 1990, pp. 551–554.

MacInnis,. Alexander G. "The MPEG Systems Coding Specification," Signal Processing: Image Communication 4 (1992) pp. 153–159.

McCarthy, Charles L. "A Low–Cost Audio/Video Decoder Solution for MPEG System Streams," IEEE Jun. 21, 1994, pp. 312–313.

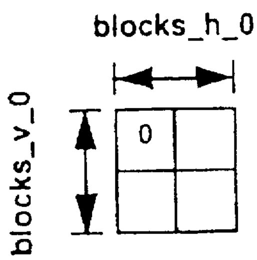
FIG.74A
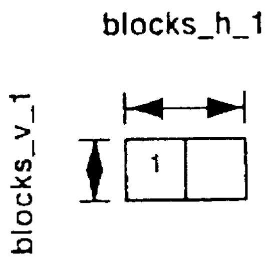
FIG.74B
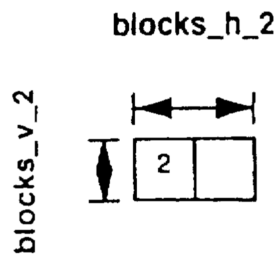
FIG.74C
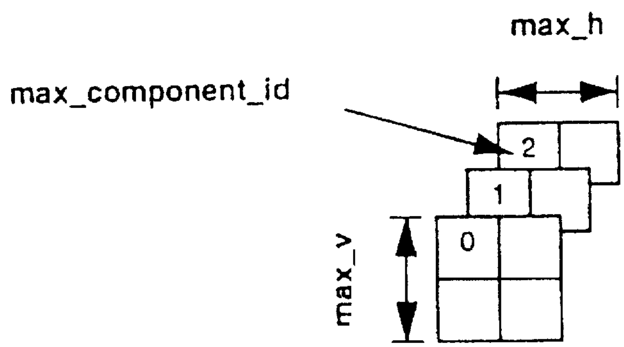
FIG.74D
$$\begin{cases} \text{horiz\_macroblocks} = \dfrac{\text{horiz\_pels} + 15}{16} \\ \text{vert\_macroblocks} = \dfrac{\text{vert\_pels} + 15}{16} \end{cases}$$
FIG.75

| | | | | | | | | | | |
|---|---|---|---|---|---|---|---|---|---|---|
| 1 | 2 | 3 | 4 | 5 | 6 | 7 | 8 | 9 | 10 | 11 |
| 12 | 13 | 14 | 15 | 16 | 17 | 18 | 19 | 20 | 21 | 22 |
| 23 | 24 | 25 | 26 | 27 | 28 | 29 | 30 | 31 | 32 | 33 |

| | | | | | | | |
|---|---|---|---|---|---|---|---|
| 1 | 2 | 3 | 4 | 5 | 6 | 7 | 8 |
| 9 | 10 | 11 | 12 | 13 | 14 | 15 | 16 |

.
.
.

| | | | | | | | |
|---|---|---|---|---|---|---|---|
| 59 | 58 | 59 | 60 | 61 | 62 | 63 | 64 |

| | | | | | | | |
|---|---|---|---|---|---|---|---|
| 0 | 1 | 2 | 3 | 4 | 5 | 6 | 7 |
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |

Read Cycle

Write Cycle

BUFFER OFFSET 0x00

COMPONENT OFFSET 0x000 + ......

| | | | | | | | | | | | |
|---|---|---|---|---|---|---|---|---|---|---|---|
| 00 | 01 | 02 | 03 | 04 | 05 | 06 | 07 | 08 | 09 | 0A | 0B |
| 0C | 0D | 0E | 0F | 10 | 11 | 12 | 13 | 14 | 15 | 16 | 17 |
| 18 | 19 | 1A | 1B | 1C | 1D | 1E | 1F | 20 | 21 | 22 | 23 |
| 24 | 25 | 26 | 27 | 28 | 29 | 2A | 2B | 2C | 2D | 2E | 2F |
| 30 | 31 | 32 | 33 | 34 | 35 | 36 | 37 | 38 | 39 | 3A | 3B |
| 3C | 3D | 3E | 3F | 40 | 41 | 42 | 43 | 44 | 45 | 46 | 47 |
| 48 | 49 | 4A | 4B | 4C | 4D | 4E | 4F | 50 | 51 | 52 | 53 |
| 54 | 55 | 56 | 57 | 58 | 59 | 5A | 5B | 5C | 5D | 5E | 5F |
| 60 | 61 | 62 | 63 | 64 | 65 | 66 | 67 | 68 | 69 | 6A | 6B |
| 6C | 6D | 6E | 6F | 70 | 71 | 72 | 73 | 74 | 75 | 76 | 77 |
| 78 | 79 | 7A | 7B | 7C | 7D | 7E | 7F | 80 | 81 | 82 | 83 |
| 84 | 85 | 86 | 87 | 88 | 89 | 8A | 8B | 8C | 8D | 8E | 8F |

FIG. 161A

COMPONENT1 OFFSET 0x100 + ......

| | | | | | |
|---|---|---|---|---|---|
| 00 | 01 | 02 | 03 | 04 | 05 |
| 06 | 07 | 08 | 09 | 0A | 0B |
| 0C | 0D | 0E | 0F | 10 | 11 |
| 12 | 13 | 14 | 15 | 16 | 17 |
| 18 | 19 | 1A | 1B | 1C | 1D |
| 1E | 1F | 20 | 21 | 22 | 23 |

FIG. 161B

COMPONENT1 OFFSET 0x200 + ......

| | | | | | |
|---|---|---|---|---|---|
| 00 | 01 | 02 | 03 | 04 | 05 |
| 06 | 07 | 08 | 09 | 0A | 0B |
| 0C | 0D | 0E | 0F | 10 | 11 |
| 12 | 13 | 14 | 15 | 16 | 17 |
| 18 | 19 | 1A | 1B | 1C | 1D |
| 1E | 1F | 20 | 21 | 22 | 23 |

FIG. 161C

BLOCK ADDRESS=0+0+0x5D8+0x28+0x2C+1=0x62D

BLOCK ADDRESS=0+0+0+0x2A+0+0=0x2A

TOKENS-BASED ADAPTIVE VIDEO PROCESSING ARRANGEMENT

CROSS-REFERENCE TO RELATED APPLICATIONS

This application is a division of application Ser. No. 08/400,397, filed Mar. 7, 1995, which is a continuation-in-part of U.S. application Ser. No. 08/382,958, filed Feb. 2, 1995 (abandoned), which is a continuation of U.S. application Ser. No. 08/082,291, filed Jun. 24, 1993 (abandoned).

The following U.S. patent application have subject matter related to this Application: application Ser. Nos. 08/399,851 filed Mar. 7, 1995; 08/482,296, filed Jun. 7, 1995; 08/486,396, filed Jun. 7, 1995; 08/484,730, filed Jun. 7, 1995 (now U.S. Pat. No. 5,677,648); 08/479,279, filed Jun. 7, 1995; 08/483,020, filed Jun. 7, 1995; 08/487,224, filed Jun. 7, 1995; 08/400,722, filed Mar. 7, 1995 (now U.S. Pat. No. 5,596,517); 08/400,723, filed Mar. 7, 1995 (now U.S. Pat. No. 5,594,678); 08/404,067, filed Mar. 14, 1995 (now U.S. Pat. No. 5,590,067); 08/567,555, filed Dec. 5, 1995 (now U.S. Pat. No. 5,617,458); 08/396,834, filed Mar. 1, 1995; 08/473,813, filed Jun. 7, 1995; 08/484,456, filed Jun. 7, 1995; 08/476,814, filed Jun. 7, 1995; 08/481,561, filed Jun. 7, 1995; 08/482,381, filed Jun. 7, 1995; 08/479,910, filed Jun. 7, 1995; 08/475,729, filed Jun. 7, 1995; 08/484,578, filed Jun. 7, 1995; 08/473,615, filed Jun. 7, 1995; 08/487,356, filed Jun. 7, 1995; 08/487,134, filed Jun. 7, 1995; 08/481,772, filed Jun. 7, 1995; 08/481,785, filed Jun. 7, 1995 (now U.S. Pat. No. 5,703,793); 08/486,908, filed Jun. 7, 1995; 08/486,034, filed Jun. 7, 1995; 08/487,740, filed Jun. 7, 1995; 08/488,348, filed Jun. 7, 1995; 08/484,170, filed Jun. 7, 1995; 08/516,038, filed Aug. 17, 1995, 08/399,810, filed Mar. 7, 1995 (now U.S. Pat. No. 5,625,571); 08/400,201, filed Mar. 7, 1995 (now U.S. Pat. No. 5,603,012); 08/400,215, filed Mar. 7, 1995; 08/400,072, filed Mar. 7, 1995, 08/402,602, filed Mar. 7, 1995; 08/400,206, filed Mar. 7, 1995; 08/400,151, filed Mar. 7, 1995; 08/400,202, filed Mar. 7, 1995; 08/400,398, filed Mar. 7, 1995; 08/400,161, filed Mar. 7, 1995; 08/400,141, filed Mar. 7, 1995; 08/400,211, filed Mar. 7, 1995; 08/400,331, filed Mar. 7, 1995; 08/400,207, filed Mar. 7, 1995; 08/399,665, filed Mar. 7, 1995; 08/400,058, filed Mar. 7, 1995; 08/399,800, filed Mar. 7, 1995; 08/399,801, filed Mar. 7, 1995; 08/399,799, filed Mar. 7, 1995; 08/474,222, filed Jun. 7, 1995; 08/486,481, filed Jun. 7, 1995; 08/474,231, filed Jun. 7, 1995; 08/474,830, filed Jun. 7, 1995; 08/474,220, filed Jun. 7, 1995 (now U.S. Pat. No. 5,699,544); 08/473,868, filed Jun. 7, 1995; 08/474,603, filed Jun. 7, 1995; 08/485,242, filed Jun. 7, 1995 (now U.S. Pat. No. 5,689,313); 08/477,048, filed Jun. 7, 1995; and 08/485,744, filed Jun. 7, 1995; 08/850,125, filed May 1, 1997; 08/812,820, filed Mar. 6, 1997; 08/804,620, filed Feb. 24, 1997; 08/876,720, filed Jun. 16, 1997; 08/903,969, filed Jul. 31, 1997; 08/947,727, filed Sep. 25, 1997; 08/937,143, filed Sep. 24, 1997; 08/946,754, filed Oct. 7, 1997; 08/947,646, filed Oct. 8, 1997; 08/950,892, filed Oct. 15, 1997; 08/955,476, filed Oct. 21, 1997; 08/967,515, filed Nov. 11, 1997.

BACKGROUND OF THE INVENTION

The present invention is directed to improvements in methods and apparatus for decompression which operates to decompress and/or decode a plurality of differently encoded input signals. The illustrative embodiment chosen for description hereinafter relates to the decoding of a plurality of encoded picture standards. More specifically, this embodiment relates to the decoding of any one of the well known standards known as JPEG, MPEG and H.261.

A serial pipeline processing system of the present invention comprises a single two-wire bus used for carrying unique and specialized interactive interfacing tokens, in the form of control tokens and data tokens, to a plurality of adaptive decompression circuits and the like positioned as a reconfigurable pipeline processor.

Video compression/decompression systems are generally well-known in the art. However, such systems have generally been dedicated in design and use to a single compression standard. They have also suffered from a number of other inefficiencies and inflexibility in overall system and subsystem design and data flow management.

Examples of prior art systems and subsystems are enumerated as follows:

One prior art system is described in U.S. Pat. No. 5,216,724. The apparatus comprises a plurality of compute modules, in a preferred embodiment, for a total of four compute modules coupled in parallel. Each of the compute modules has a processor, dual port memory, scratchpad memory, and an arbitration mechanism. A first bus couples the compute modules and a host processor. The device comprises a shared memory which is coupled to the host processor and to the compute modules with a second bus.

U.S. Pat. No. 4,785,349 discloses a full motion color digital video signal that is compressed, formatted for transmission, recorded on compact disc media and decoded at conventional video frame rates. During compression, regions of a frame are individually analyzed to select optimum fill coding methods specific to each region. Region decoding time estimates are made to optimize compression thresholds. Region descriptive codes conveying the size and locations of the regions are grouped together in a first segment of a data stream. Region fill codes conveying pixel amplitude indications for the regions are grouped together according to fill code type and placed in other segments of the data stream. The data stream segments are individually variable length coded according to their respective statistical distributions and formatted to form data frames. The number of bytes per frame is withered by the addition of auxiliary data determined by a reverse frame sequence analysis to provide an average number selected to minimize pauses of the compact disc during playback, thereby avoiding unpredictable seek mode latency periods characteristic of compact discs. A decoder includes a variable length decoder responsive to statistical information in the code stream for separately variable length decoding individual segments of the data stream. Region location data is derived from region descriptive data and applied with region fill codes to a plurality of region specific decoders selected by detection of the fill code type (e.g., relative, absolute, dyad and DPCM) and decoded region pixels are stored in a bit map for subsequent display.

U.S. Pat. No. 4,922,341 discloses a method for scene-model-assisted reduction of image data for digital television signals, whereby a picture signal supplied at time is to be coded, whereby a predecessor frame from a scene already coded at time t-1 is present in an image store as a reference, and whereby the frame-to-frame information is composed of an amplification factor, a shift factor, and an adaptively acquired quad-tree division structure. Upon initialization of the system, a uniform, prescribed gray scale value or picture half-tone expressed as a defined luminance value is written into the image store of a coder at the transmitter and in the image store of a decoder at the receiver store, in the same way for all picture elements (pixels). Both the image store in the coder as well as the image store in the decoder are each operated with feed back to themselves in a manner such that the content of the image store in the coder and decoder can be read out in blocks of variable size, can be amplified with a factor greater than or less than 1 of the luminance and can be written back into the image store with shifted addresses, whereby the blocks of variable size are organized according to a known quad tree data structure.

U.S. Pat. No. 5,122,875 discloses an apparatus for encoding/decoding an HDTV signal. The apparatus includes a compression circuit responsive to high definition video source signals for providing hierarchically layered codewords CW representing compressed video data and associated codewords T, defining the types of data represented by the codewords CW. A priority selection circuit, responsive to the codewords CW and T, parses the codewords CW into high and low priority codeword sequences wherein the high and low priority codeword sequences correspond to compressed video data of relatively greater and lesser importance to image reproduction respectively. A transport processor, responsive to the high and low priority codeword sequences, forms high and low priority transport blocks of high and low priority codewords, respectively. Each transport block includes a header, codewords CW and error detection check bits. The respective transport blocks are applied to a forward error check circuit for applying additional error check data. Thereafter, the high and low priority data are applied to a modem wherein quadrature amplitude modulates respective carriers for transmission.

U.S. Pat. No. 5,146,325 discloses a video decompression system for decompressing compressed image data wherein odd and even fields of the video signal are independently compressed in sequences of intraframe and interframe compression modes and then interleaved for transmission. The odd and even fields are independently decompressed. During intervals when valid decompressed odd/even field data is not available, even/odd field data is substituted for the unavailable odd/even field data. Independently decompressing the even and odd fields of data and substituting the opposite field of data for unavailable data may be used to advantage to reduce image display latency during system start-up and channel changes.

U.S. Pat. No. 5,168,356 discloses a video signal encoding system that includes apparatus for segmenting encoded video data into transport blocks for signal transmission. The transport block format enhances signal recovery at the receiver by virtue of providing header data from which a receiver can determine re-entry points into the data stream on the occurrence of a loss or corruption of transmitted data. The re-entry points are maximized by providing secondary transport headers embedded within encoded video data in respective transport blocks.

U.S. Pat. No. 5,168,375 discloses a method for processing a field of image data samples to provide for one or more of the functions of decimation, interpolation, and sharpening. This is accomplished by an array transform processor such as that employed in a JPEG compression system. Blocks of data samples are transformed by the discrete even cosine transform (DECT) in both the decimation and interpolation processes, after which the number of frequency terms is altered. In the case of decimation, the number of frequency terms is reduced, this being followed by inverse transformation to produce a reduced-size matrix of sample points representing the original block of data. In the case of interpolation, additional frequency components of zero value are inserted into the array of frequency components after which inverse transformation produces an enlarged data sampling set without an increase in spectral bandwidth. In the case of sharpening, accomplished by a convolution or filtering operation involving multiplication of transforms of data and filter kernel in the frequency domain, there is provided an inverse transformation resulting in a set of blocks of processed data samples. The blocks are overlapped followed by a savings of designated samples, and a discarding of excess samples from regions of overlap. The spatial representation of the kernel is modified by reduction of the number of components, for a linear-phase filter, and zero-padded to equal the number of samples of a data block, this being followed by forming the discrete odd cosine transform (DOCT) of the padded kernel matrix.

U.S. Pat. No. 5,175,617 discloses a system and method for transmitting logmap video images through telephone line band-limited analog channels. The pixel organization in the logmap image is designed to match the sensor geometry of the human eye with a greater concentration of pixels at the center. The transmitter divides the frequency band into channels, and assigns one or two pixels to each channel, for example a 3 KHz voice quality telephone line is divided into 768 channels spaced about 3.9 Hz apart. Each channel consists of two carrier waves in quadrature, so each channel can carry two pixels. Some channels are reserved for special calibration signals enabling the receiver to detect both the phase and magnitude of the received signal. If the sensor and pixels are connected directly to a bank of oscillators and the receiver can continuously receive each channel, then the receiver need not be synchronized with the transmitter. An FFT algorithm implements a fast discrete approximation to the continuous case in which the receiver synchronizes to the first frame and then acquires subsequent frames every frame period. The frame period is relatively low compared with the sampling period so the receiver is unlikely to lose frame synchrony once the first frame is detected. An experimental video telephone transmitted 4 frames per second, applied quadrature coding to 1440 pixel logmap images and obtained an effective data transfer rate in excess of 40,000 bits per second.

U.S. Pat. No. 5,185,819 discloses a video compression system having odd and even fields of video signal that are independently compressed in sequences of intraframe and interframe compression modes. The odd and even fields of independently compressed data are interleaved for transmission such that the intraframe even field compressed data occurs midway between successive fields of intraframe odd field compressed data. The interleaved sequence provides receivers with twice the number of entry points into the signal for decoding without increasing the amount of data transmitted.

U.S. Pat. No. 5,212,742 discloses an apparatus and method for processing video data for compression/decompression in real-time. The apparatus comprises a plurality of compute modules, in a preferred embodiment, for a total of four compute modules coupled in parallel. Each of the compute modules has a processor, dual port memory, scratch-pad memory, and an arbitration mechanism. A first bus couples the compute modules and host processor. Lastly, the device comprises a shared memory which is coupled to the host processor and to the compute modules with a second bus. The method handles assigning portions of the image for each of the processors to operate upon.

U.S. Pat. No. 5,231,484 discloses a system and method for implementing an encoder suitable for use with the proposed ISO/IEC MPEG standards. Included are three cooperating components or subsystems that operate to variously adaptively pre-process the incoming digital motion video sequences, allocate bits to the pictures in a sequence, and adaptively quantize transform coefficients in different regions of a picture in a video sequence so as to provide optimal visual quality given the number of bits allocated to that picture.

U.S. Pat. No. 5,267,334 discloses a method of removing frame redundancy in a computer system for a sequence of moving images. The method comprises detecting a first scene change in the sequence of moving images and generating a first keyframe containing complete scene information for a first image. The first keyframe is known, in a preferred embodiment, as a "forward-facing" keyframe or intraframe, and it is normally present in CCITT compressed video data. The process then comprises generating at least one intermediate compressed frame, the at least one intermediate compressed frame containing difference information from the first image for at least one image following the first image in time in the sequence of moving images. This at least one frame being known as an interframe. Finally, detecting a second scene change in the sequence of moving images and generating a second keyframe containing complete scene information for an image displayed at the time just prior to the second scene change, known as a "backward-facing" keyframe. The first keyframe and the at least one intermediate compressed frame are linked for forward play, and the second keyframe and the intermediate compressed frames are linked in reverse for reverse play. The intraframe may also be used for generation of complete scene information when the images are played in the forward direction. When this sequence is played in reverse, the backward-facing keyframe is used for the generation of complete scene information.

U.S. Pat. No. 5,276,513 discloses a first circuit apparatus, comprising a given number of prior-art image-pyramid stages, together with a second circuit apparatus, comprising the same given number of novel motion-vector stages, perform cost-effective hierarchical motion analysis (HMA) in real-time, with minimum system processing delay and/or employing minimum system processing delay and/or employing minimum hardware structure. Specifically, the first and second circuit apparatus, in response to relatively high-resolution image data from an ongoing input series of successive given pixel-density image-data frames that occur at a relatively high frame rate (e.g., 30 frames per second), derives, after a certain processing-system delay, an ongoing output series of successive given pixel-density vector-data frames that occur at the same given frame rate. Each vector-data frame is indicative of image motion occurring between each pair of successive image frames.

U.S. Pat. No. 5,283,646 discloses a method and apparatus for enabling a real-time video encoding system to accurately deliver the desired number of bits per frame, while coding the image only once, updates the quantization step size used to quantize coefficients which describe, for example, an image to be transmitted over a communications channel. The data is divided into sectors, each sector including a plurality of blocks. The blocks are encoded, for example, using DCT coding, to generate a sequence of coefficients for each block. The coefficients can be quantized, and depending upon the quantization step, the number of bits required to describe the data will vary significantly. At the end of the transmission of each sector of data, the accumulated actual number of bits expended is compared with the accumulated desired number of bits expended, for a selected number of sectors associated with the particular group of data. The system then readjusts the quantization step size to target a final desired number of data bits for a plurality of sectors, for example describing an image. Various methods are described for updating the quantization step size and determining desired bit allocations.

The article, Chong, Yong M., *A Data-Flow Architecture for Digital Image Processing*, Wescon Technical Papers: No. 2 Oct./Nov. 1984, discloses a real-time signal processing system specifically designed for image processing. More particularly, a token based data-flow architecture is disclosed wherein the tokens are of a fixed one word width having a fixed width address field. The system contains a plurality of identical flow processors connected in a ring fashion. The tokens contain a data field, a control field and a tag. The tag field of the token is further broken down into a processor address field and an identifier field. The processor address field is used to direct the tokens to the correct data-flow processor, and the identifier field is used to label the data such that the data-flow processor knows what to do with the data. In this way, the identifier field acts as an instruction for the data-flow processor. The system directs each token to a specific data-flow processor using a module number (MN). If the MN matches the MN of the particular stage, then the appropriate operations are performed upon the data. If unrecognized, the token is directed to an output data bus.

The article, Kimori, S. et al. *An Elastic Pipeline Mechanism by Self-Timed Circuits*, IEEE J. of Solid-State Circuits, Vol. 23, No. 1, February 1988, discloses an elastic pipeline having self-timed circuits. The asynchronous pipeline comprises a plurality of pipeline stages. Each of the pipeline stages consists of a group of input data latches followed by a combinatorial logic circuit that carries out logic operations specific to the pipeline stages. The data latches are simultaneously supplied with a triggering signal generated by a data-transfer control circuit associated with that stage. The data-transfer control circuits are interconnected to form a chain through which send and acknowledge signal lines control a hand-shake mode of data transfer between the successive pipeline stages. Furthermore, a decoder is generally provided in each stage to select operations to be done on the operands in the present stage. It is also possible to locate the decoder in the preceding stage in order to predecode complex decoding processing and to alleviate critical path problems in the logic circuit. The elastic nature of the pipeline eliminates any centralized control since all the interworkings between the submodules are determined by a completely localized decision and, in addition, each submodule can autonomously perform data buffering and self-timed data-transfer control at the same time. Finally, to increase the elasticity of the pipeline, empty stages are interleaved between the occupied stages in order to ensure reliable data transfer between the stages.

Accordingly, those concerned with the design, development and use of video compression/decompression systems and related subsystems have long recognized a need for improved methods and apparatus providing enhanced flexibility, efficiency and performance. The present invention clearly fulfills all these needs.

SUMMARY OF INVENTION

Briefly, and in general terms the present invention provides in a pipeline system having an input, an output and a plurality of processing stages between the input and the output, an interactive interfacing token, defining a universal adaptation unit, which may also be metamorphic, for control and/or data functions among the various processing stages, whereby the processing stages are afforded enhanced flexibility in configuration and processing in the performance of diverse tasks. The token/adaptation unit is dynamically adaptive and may be position dependent upon the processing stages for performance of functions, or position independent of the processing stages for performance of functions. In addition the token may be altered by interfacing with the processing stages. The token may interact with all of the stages, or only interact with some, but less than all of the stages. The token may interact with adjacent stages, or interact with non-adjacent stages, and some tokens cause the processing stages to reconfigure. The tokens also may be position dependent for some functions and position independent for other functions, and the tokens provide basic building blocks for the system. The interaction of a token with a particular processing stage may be stage conditioned by the previous processing history of that stage.

A token, in accordance with the invention may have an address field which characterizes that token and wherein interaction with a selected processing stage is determined by the address field.

The token may also include an extension bit which indicates the presence of additional words in the token, and identifies the last word in the token.

The address field of a token may be of variable length, is typically Huffman coded, and is generated by a processing stage. A token may include data for transfer to the processing stages. A control token may be devoid of data, whereas a DATA Token provides data to the processing stages. A control token may only conditions the processing stages and this conditioning includes reconfiguring of the processing stages. A token may also provide both data and conditioning to the processing stages. A token may identify a coding standard to the processing stages. A token may also operate independent of any coding standard among the processing stages. A token may also be capable of successive alteration by the processing stages. The interactive flexibility of the token/adaptation unit in cooperation with the processing stages facilitates greater functional diversity of the processing stages for resident structure an the flexibility of the token facilitates system expansion and/or alteration. In this regard, a token may also facilitate a plurality of functions within a processing stage. The token adaptation unit may be hardware based or software based. The tokens provide data and control simultaneously to a processing stage facilitate more efficient use of system bandwidth.

The above and other objectives and advantages of the invention will become apparent from the following more detailed description when taken in conjunction with the accompanying drawings.

DESCRIPTION OF THE DRAWINGS

FIG. 14*a* is a memory map showing a first arrangement of macroblocks;

FIG. 14*b* is a memory map showing a second arrangement of macroblocks;

FIG. 14*c* is a memory map showing a further arrangement of macroblocks;

Figure 29:
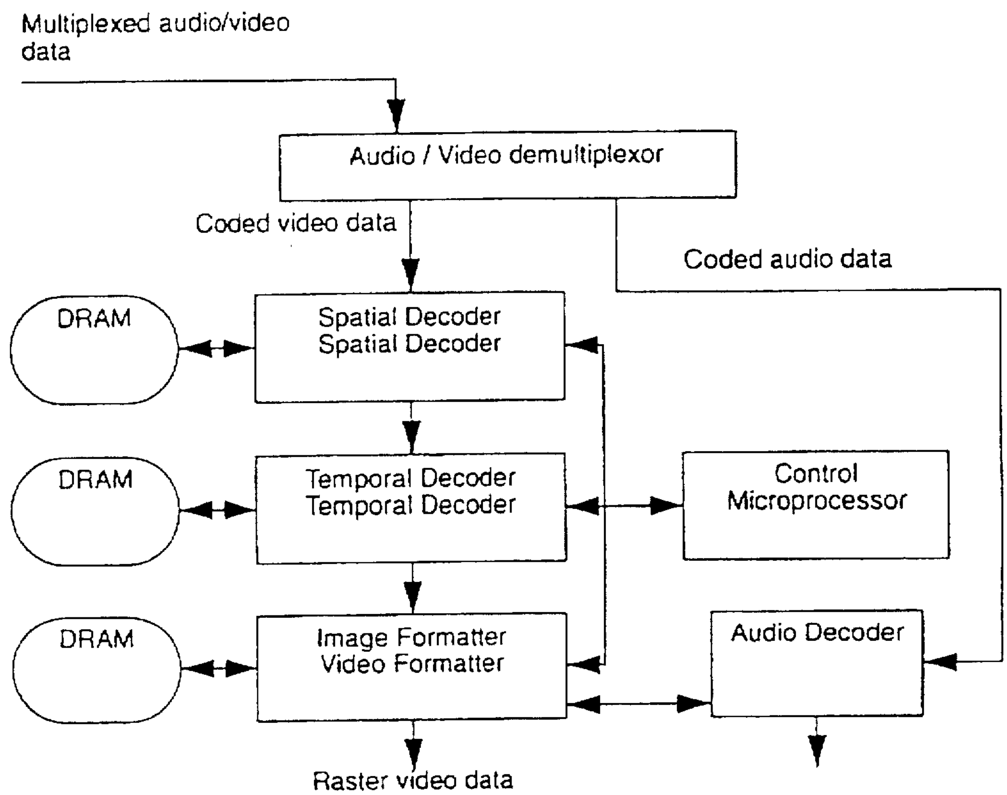
Figure 30:
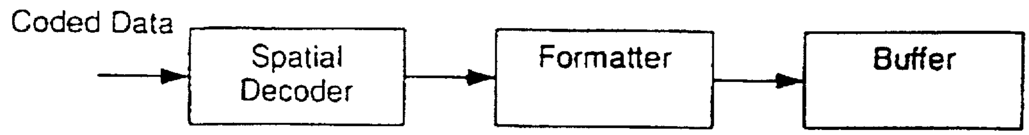
Figure 31:
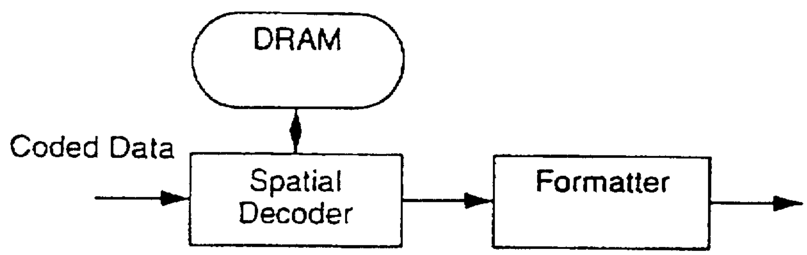
Figure 32:
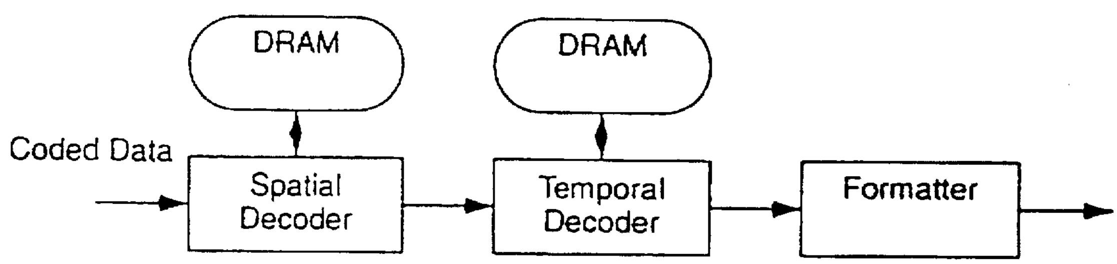
Figure 33:
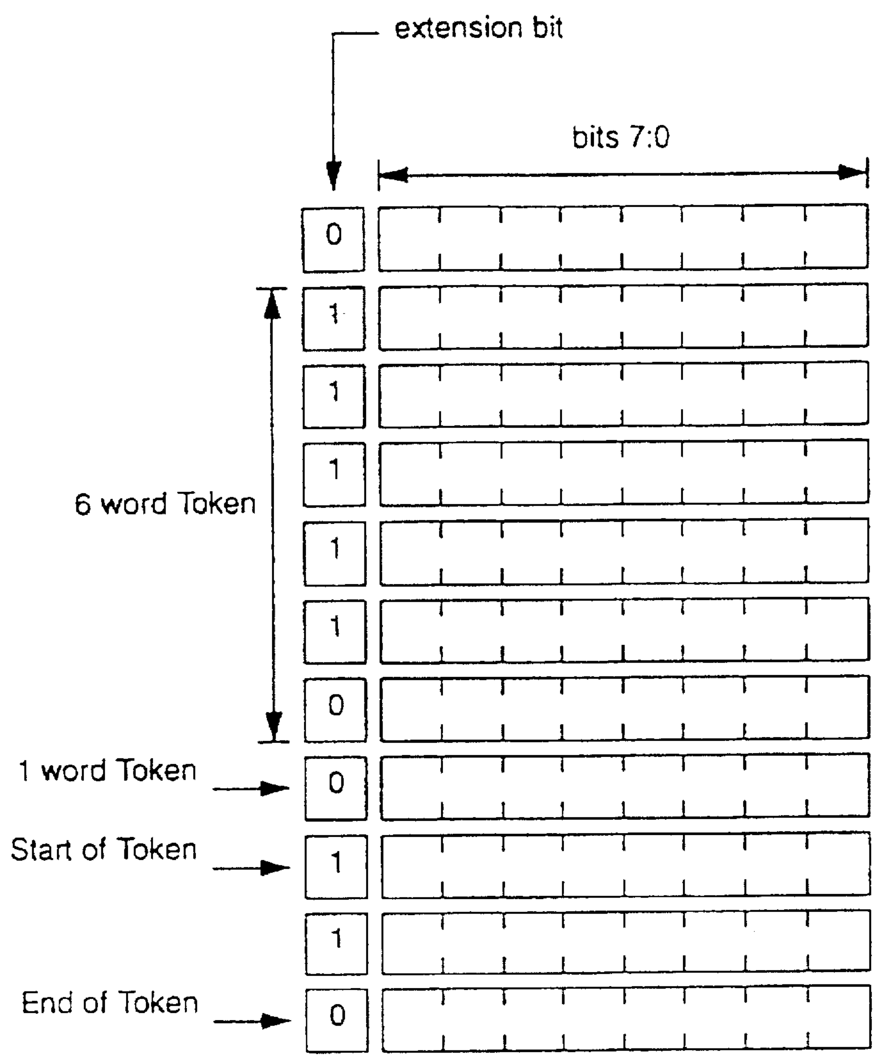
Figure 34:
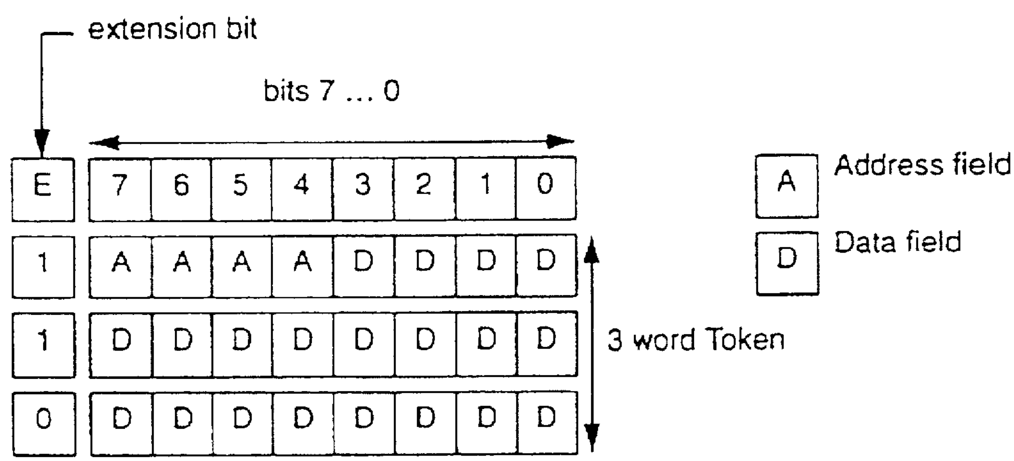

| FIGS. | |
|---|---|
| FIG. 29 | shows a typical decoder system; |
| FIG. 30 | shows a JPEG still picture decoder; |
| FIG. 31 | shows a JPEG video decoder; |
| FIG. 32 | shows a multi-standard video decoder; |
| FIG. 33 | shows the start and the end of a token; |
| FIG. 34 | shows a token address and data fields; |

-continued

Figure 35:
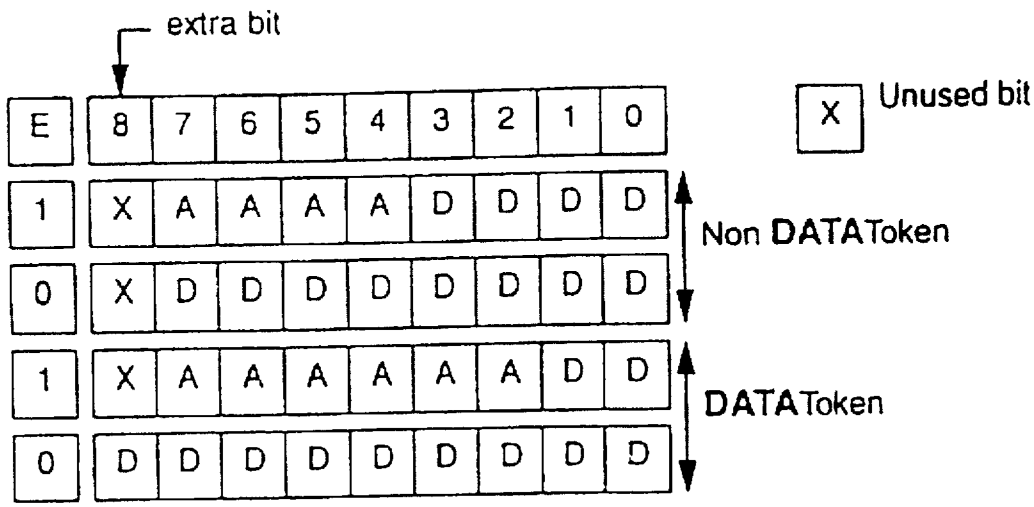
Figure 36A:
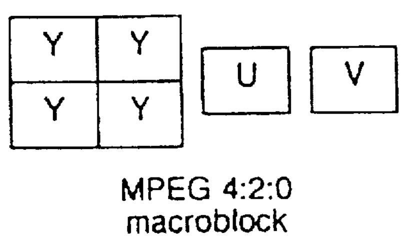
Figure 36B:
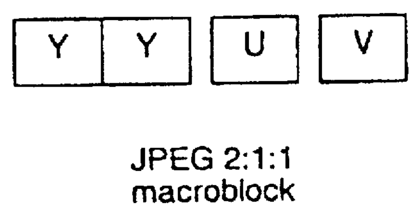
Figure 37:
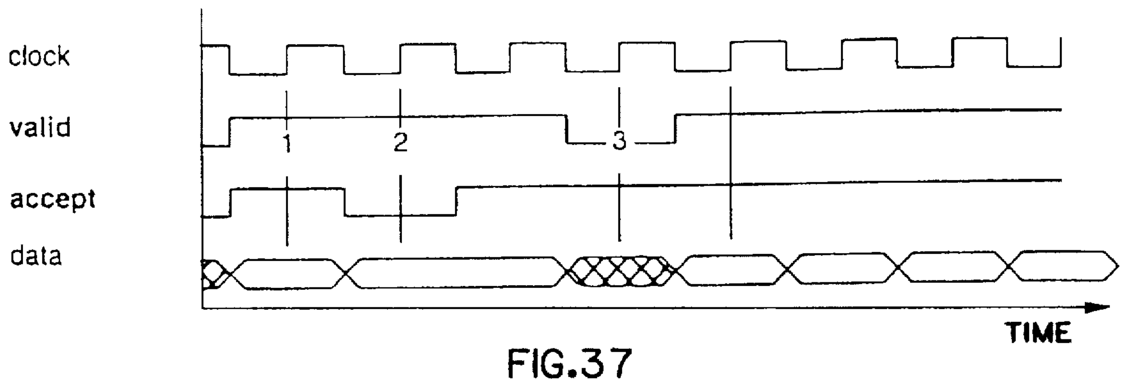
Figure 38:
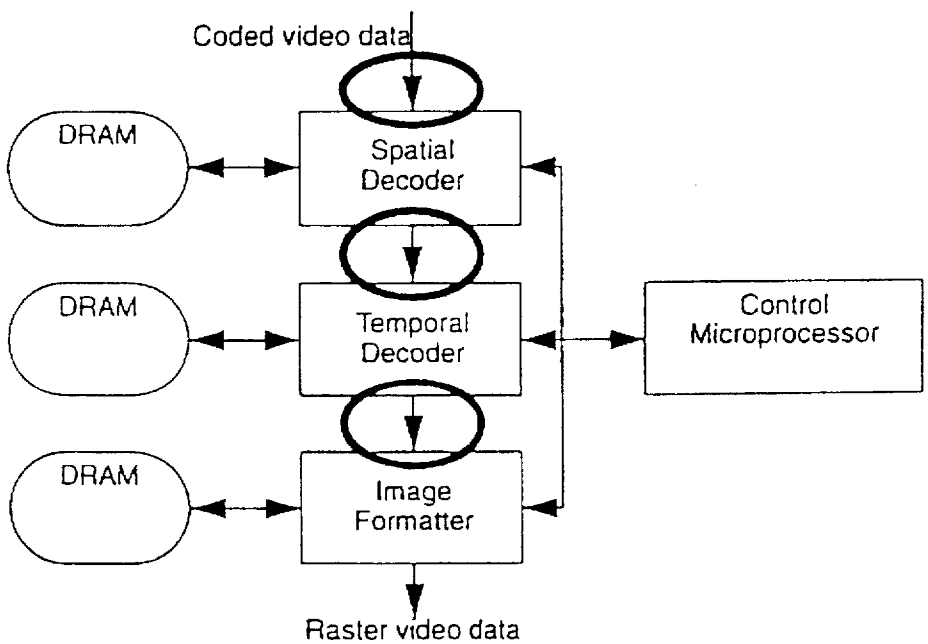
Figure 39:
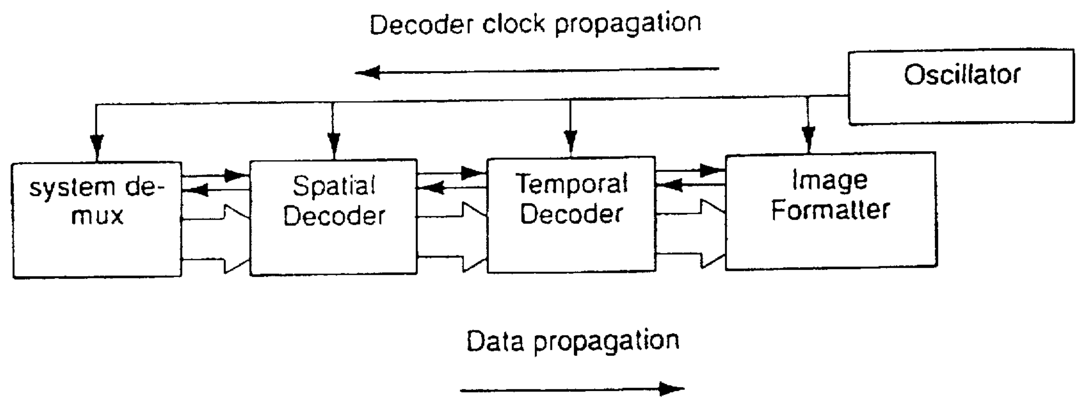
Figure 40:
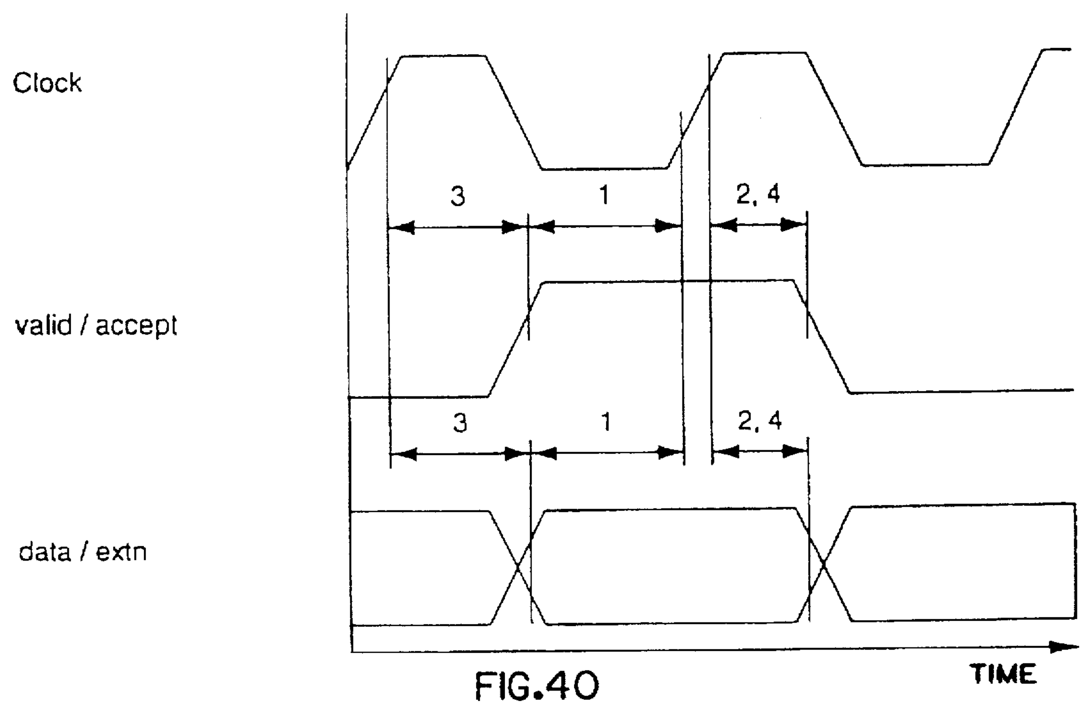
Figure 41:
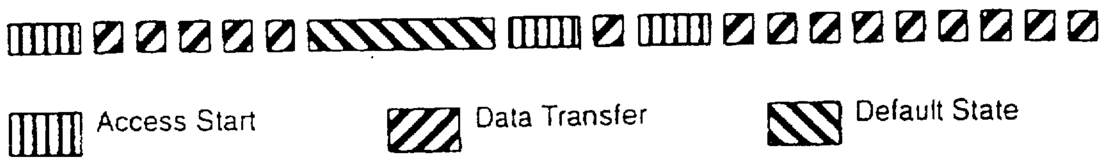
Figure 42:
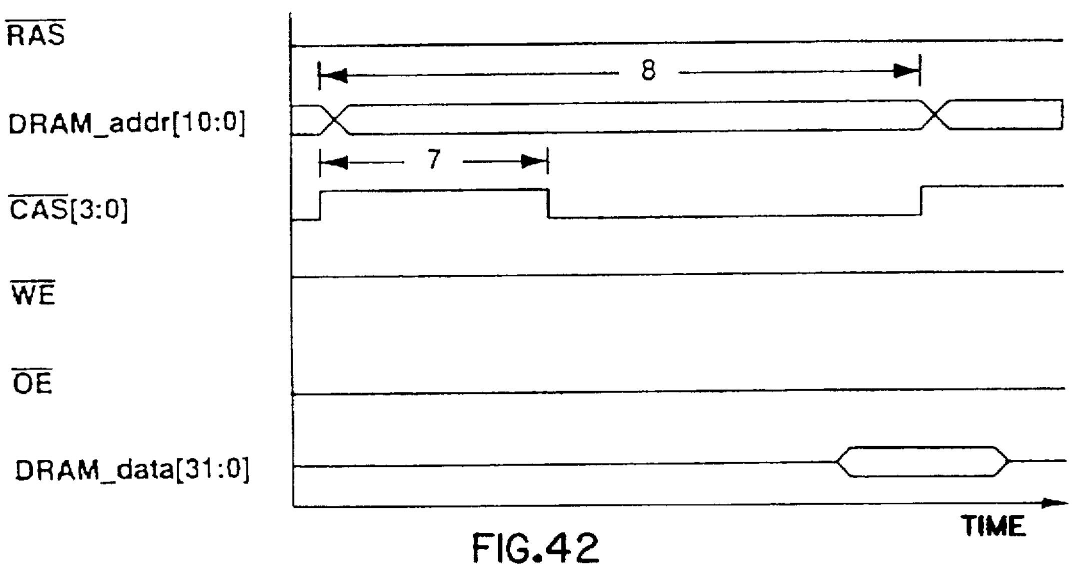
Figure 43:
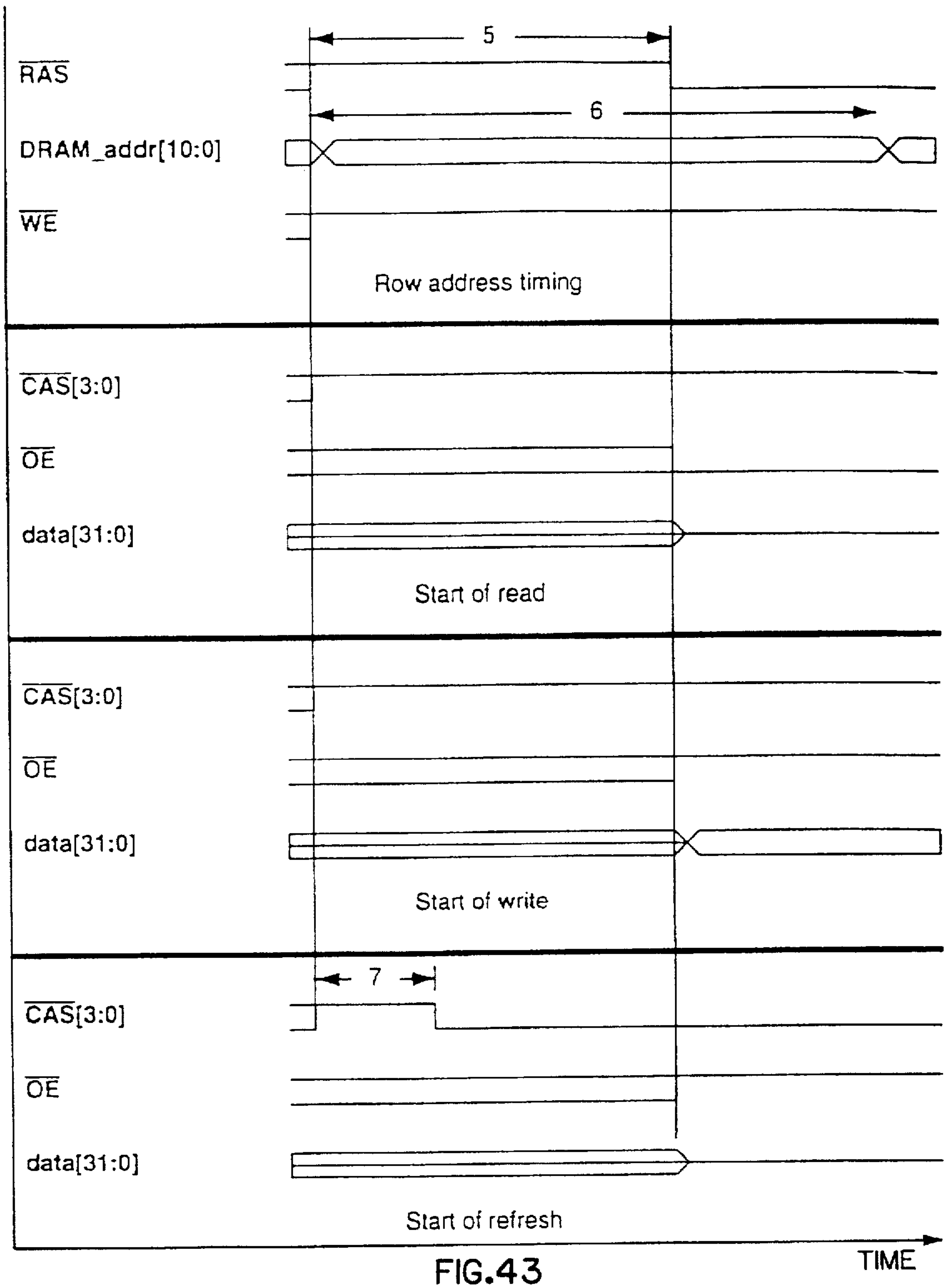
Figure 44:
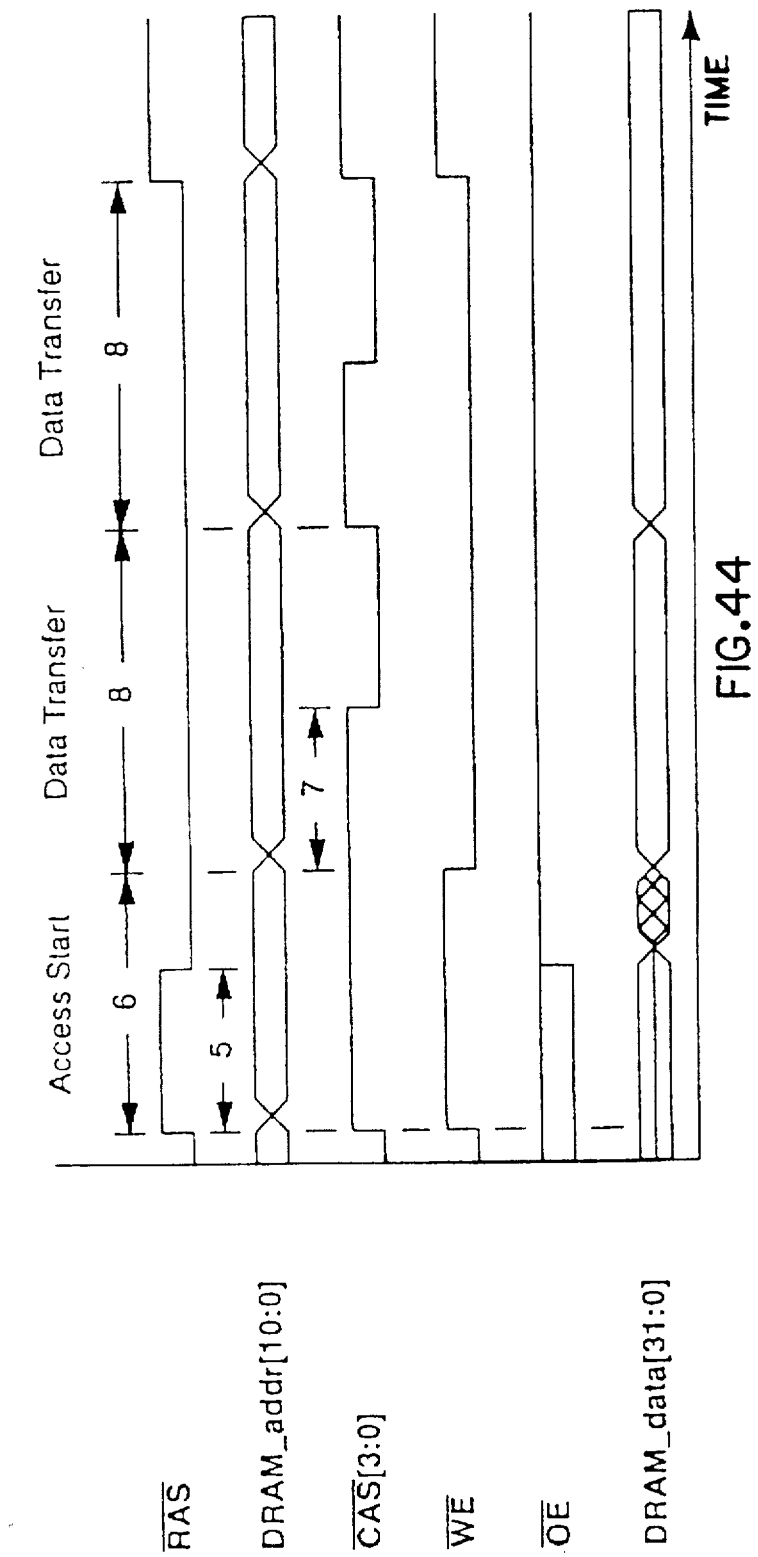
Figure 45:
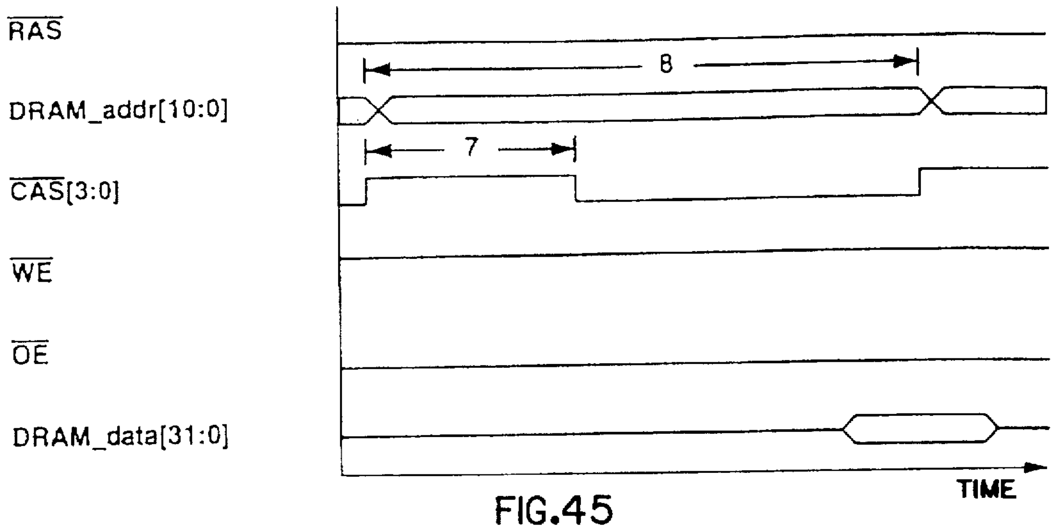
Figure 46:
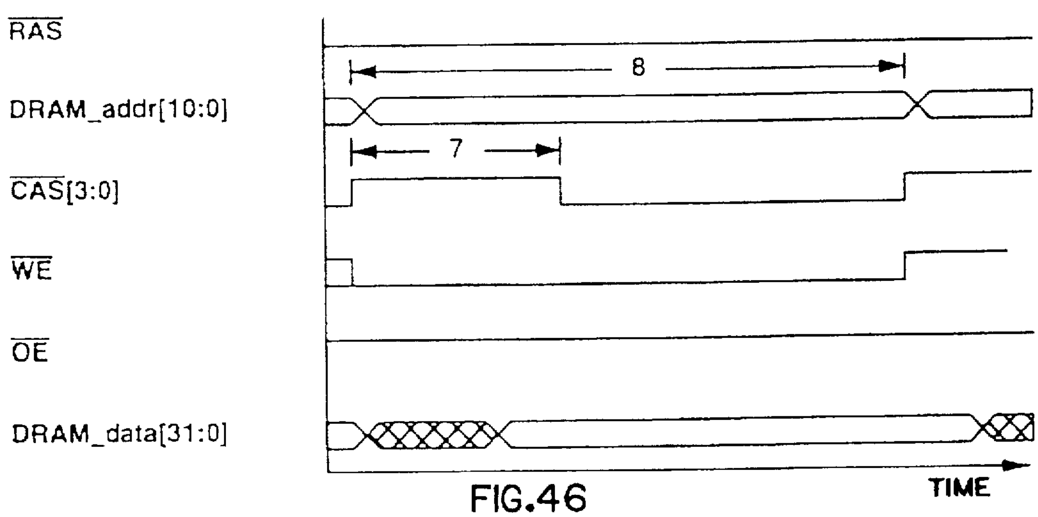
Figure 47:
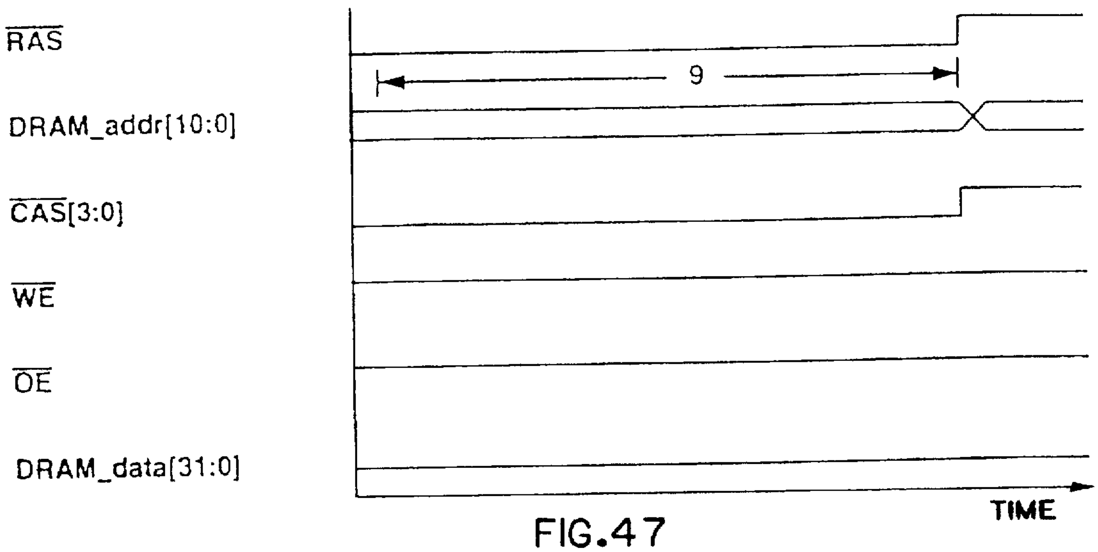
Figure 48:
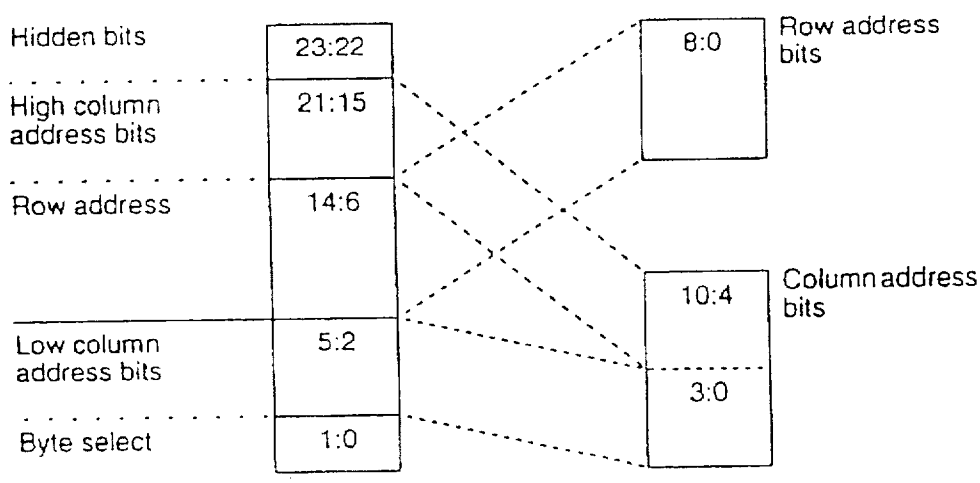
Figure 49:
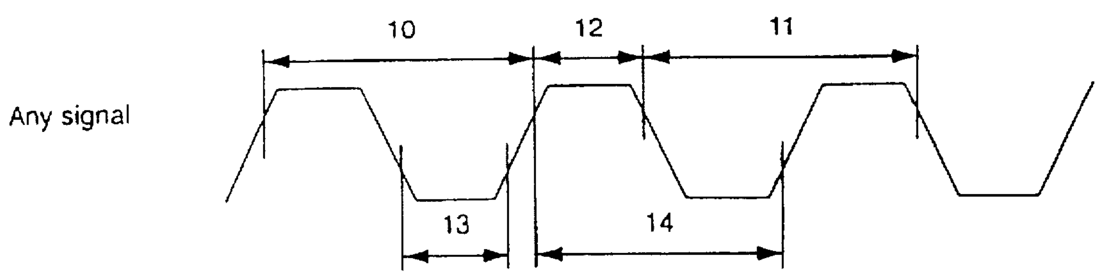
Figure 50:
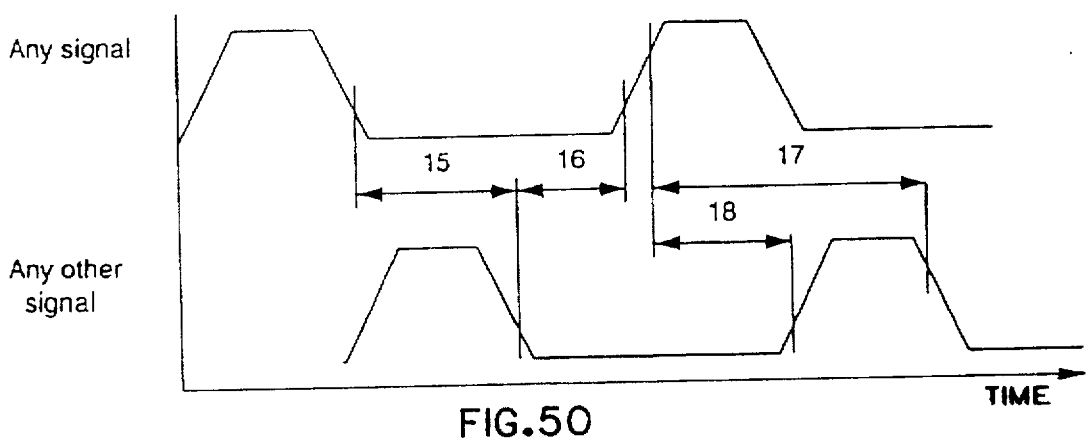
Figure 51:
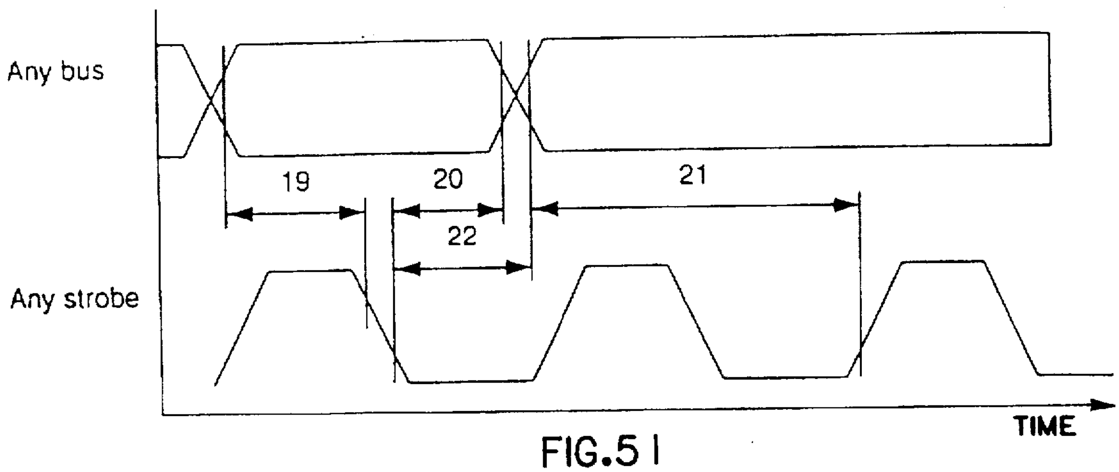
Figure 52:
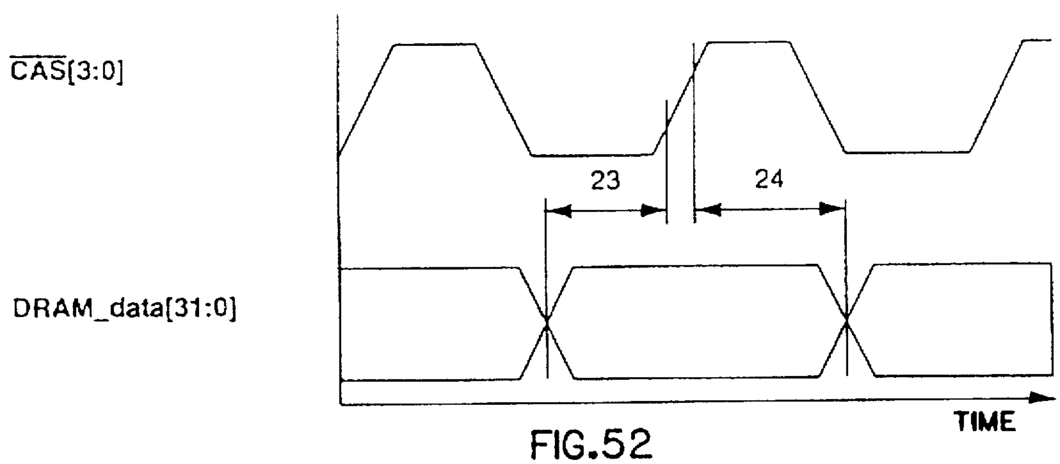
Figure 53:
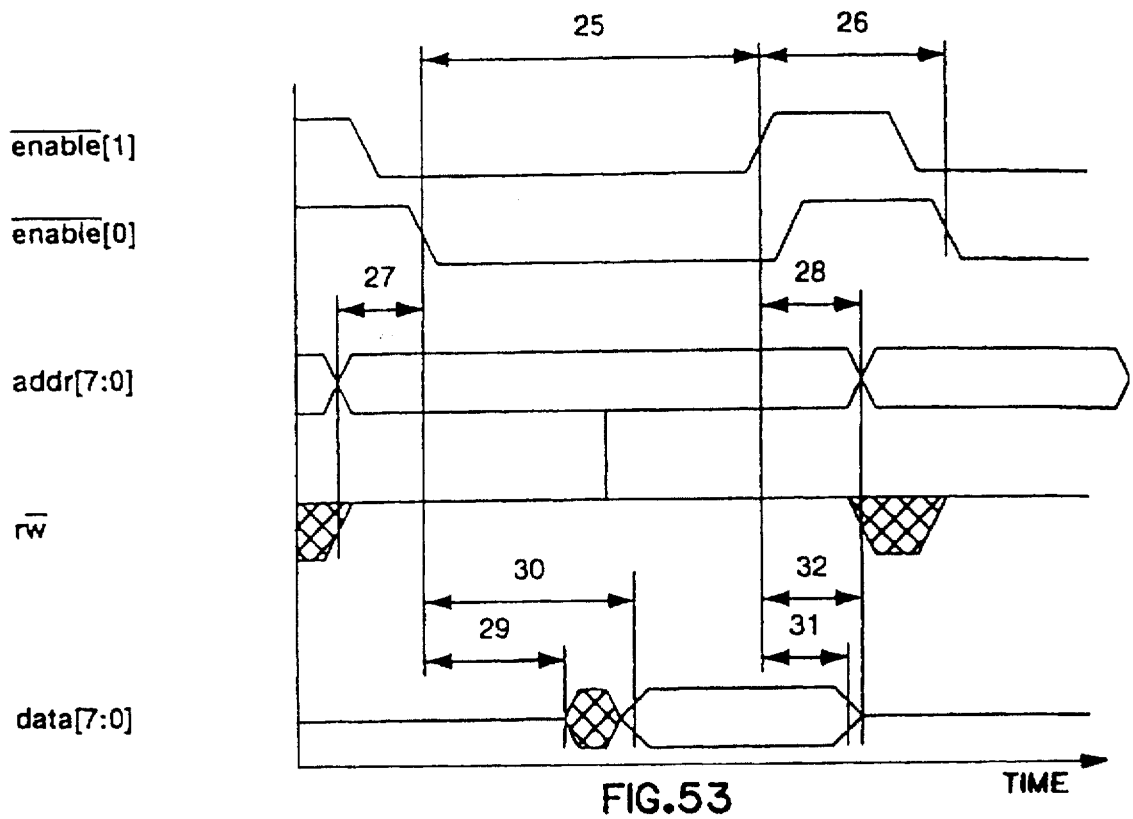
Figure 54:
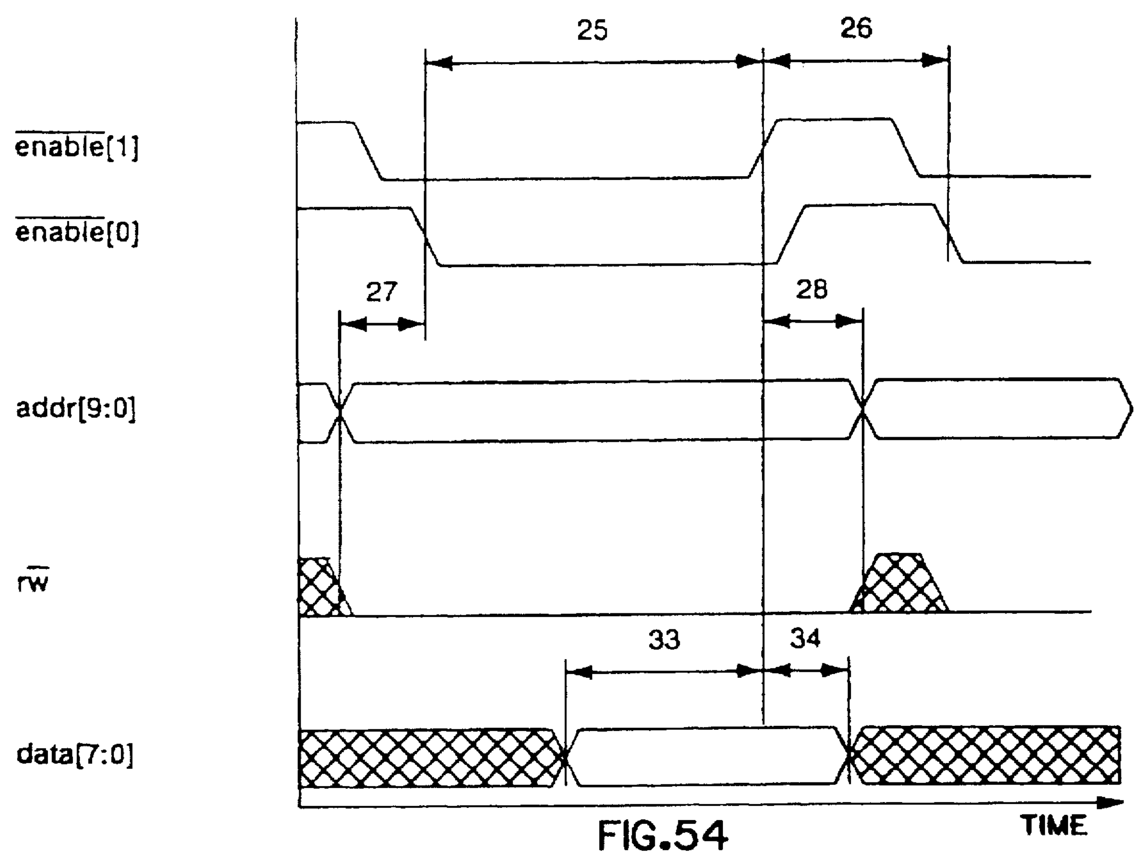
Figure 55:
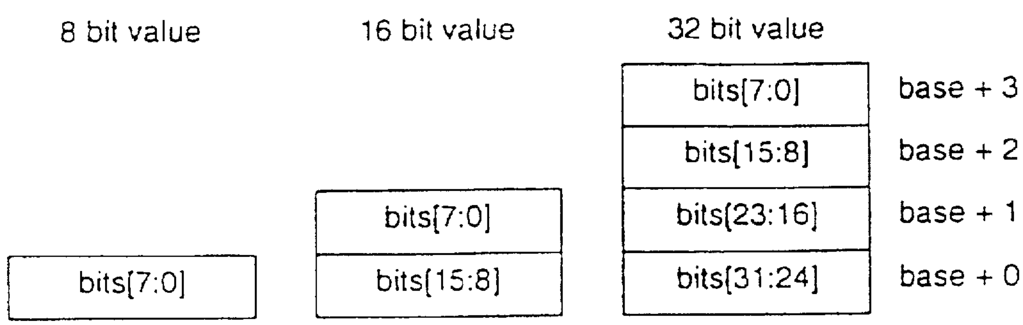
Figure 56:
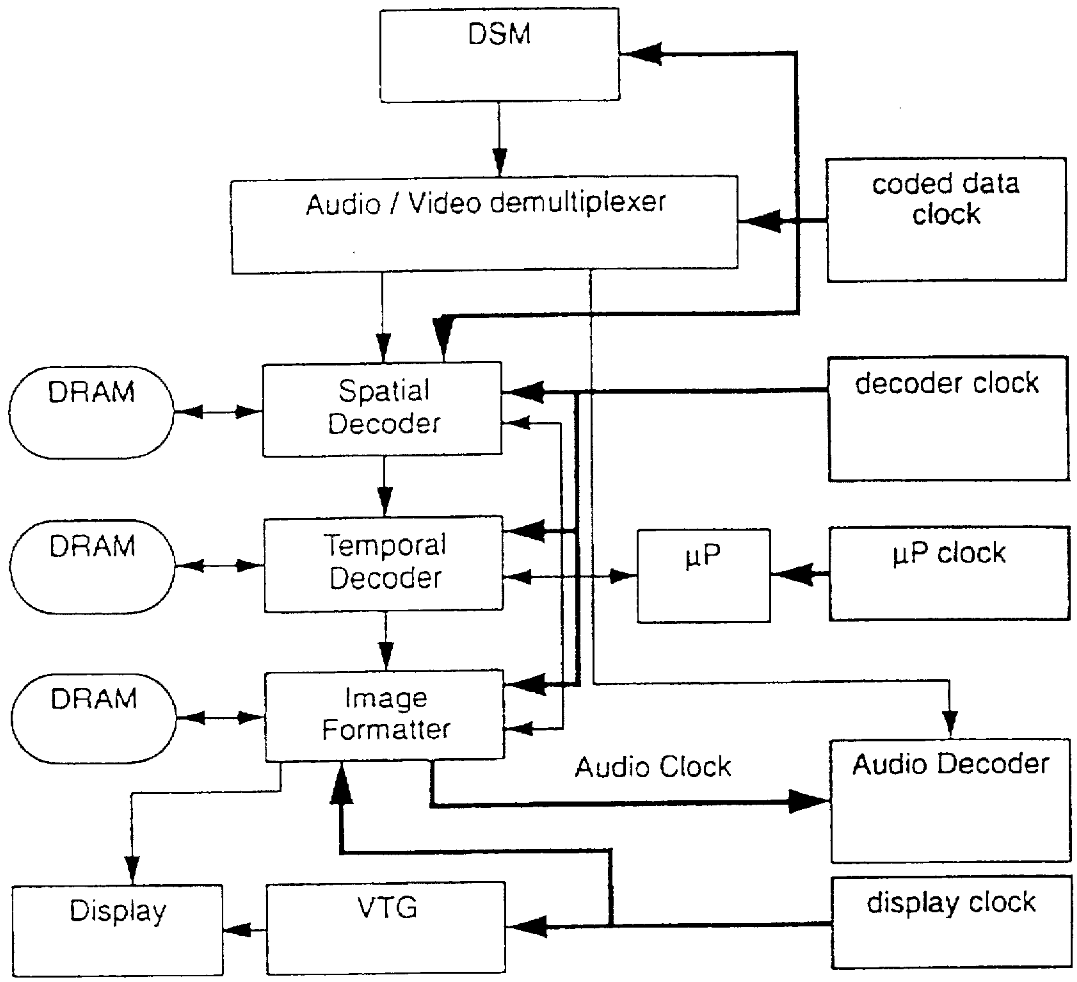
Figure 57:
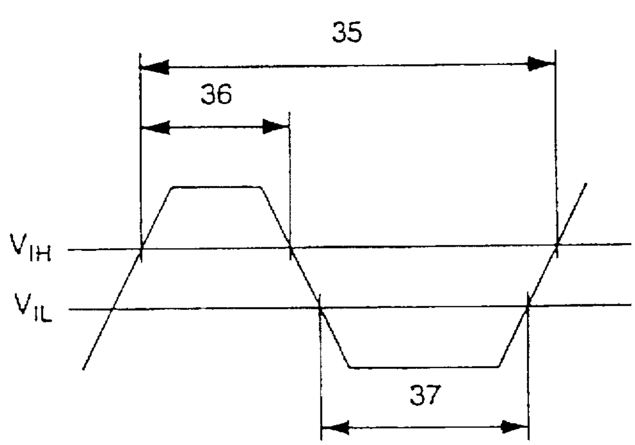
Figure 58:
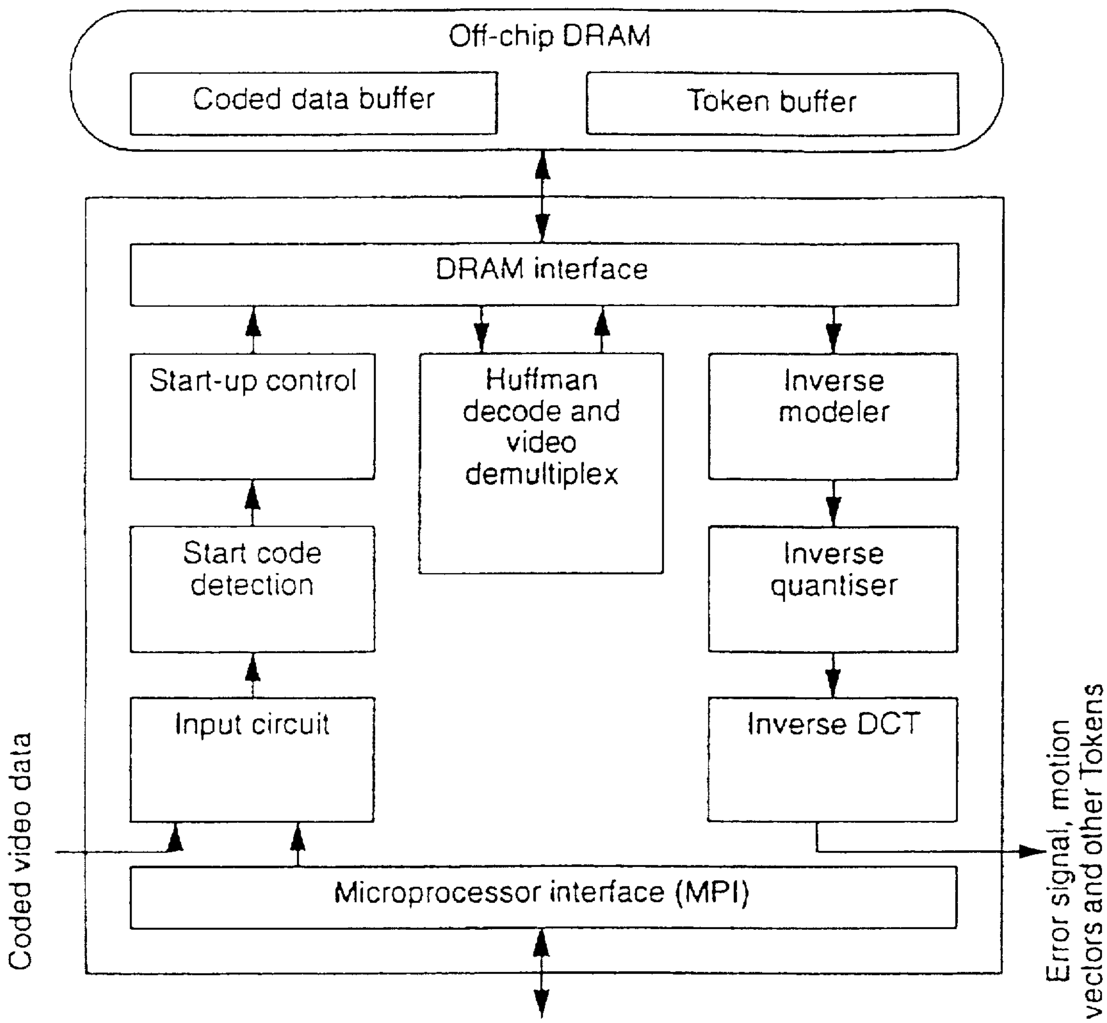
Figure 59:
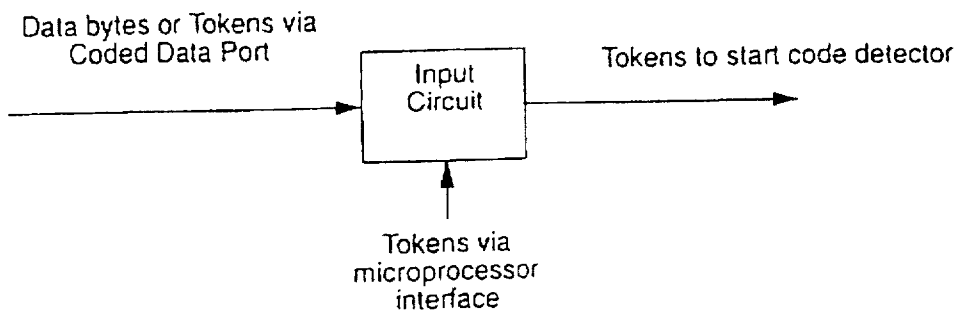
Figure 60:
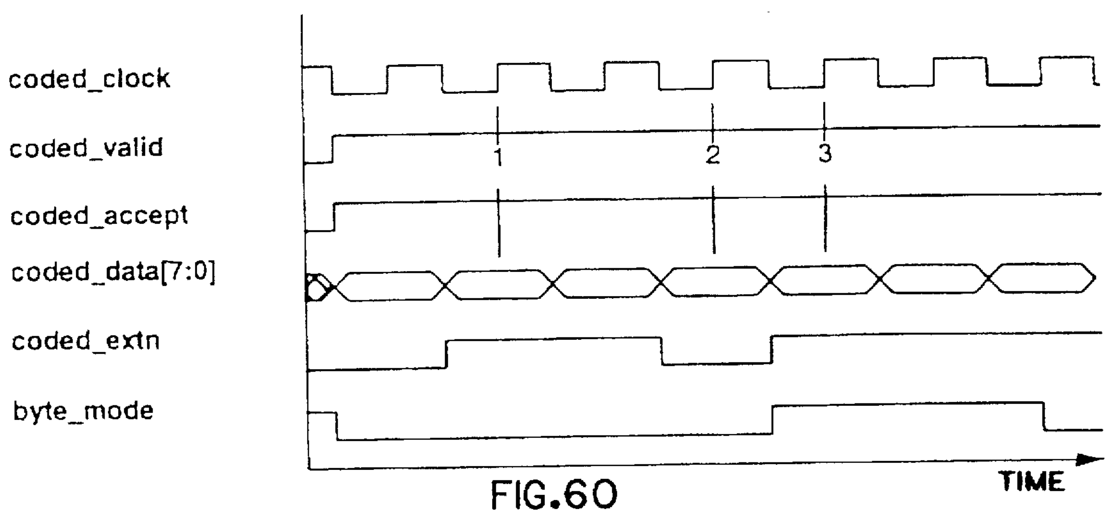
Figure 61:
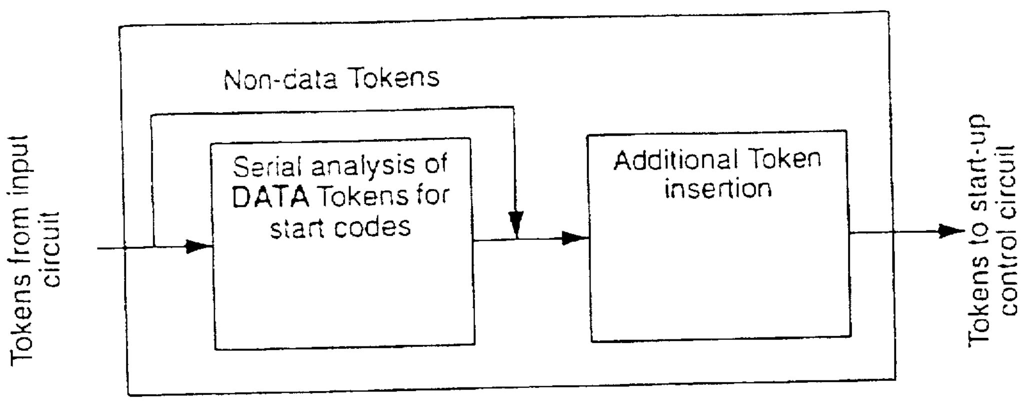
Figure 62:
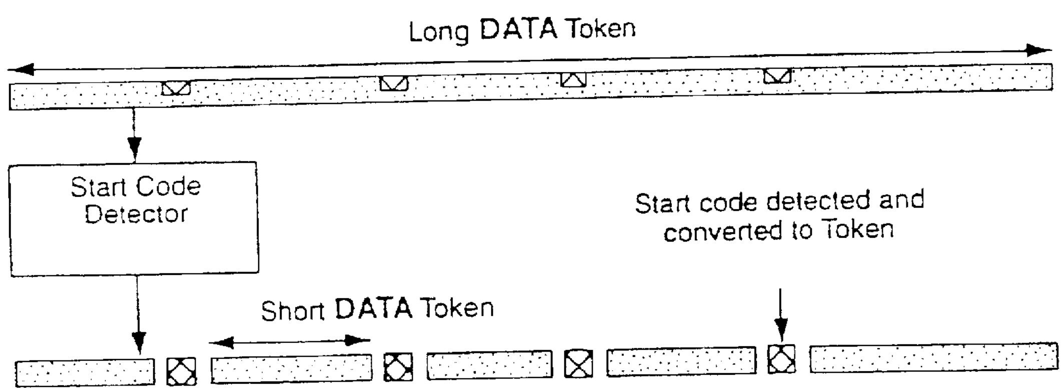
Figure 63:
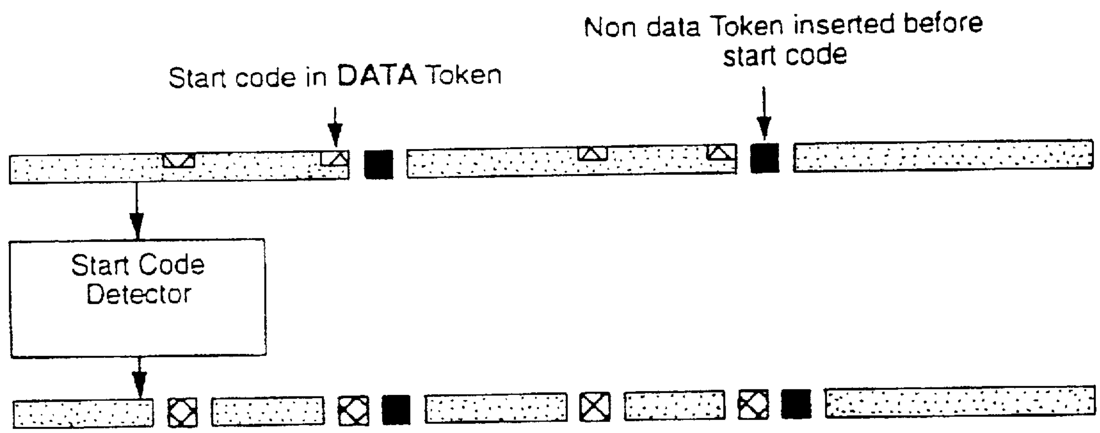
Figure 64:
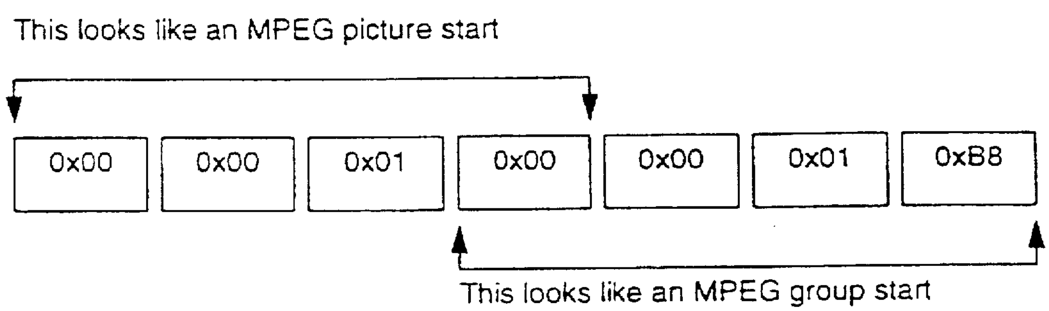
Figure 65:
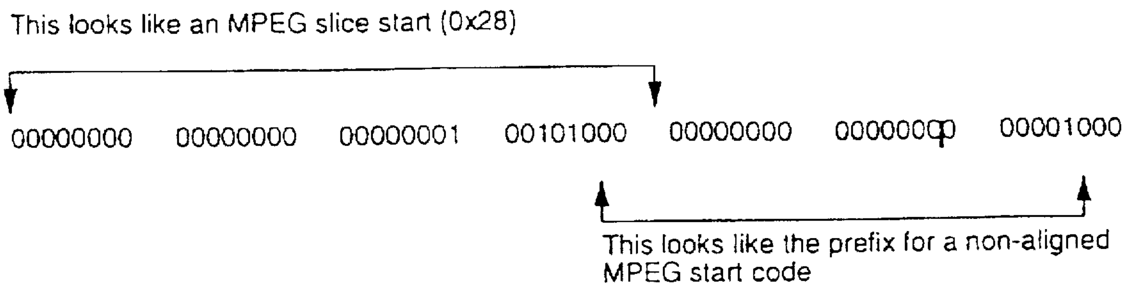
Figure 66:
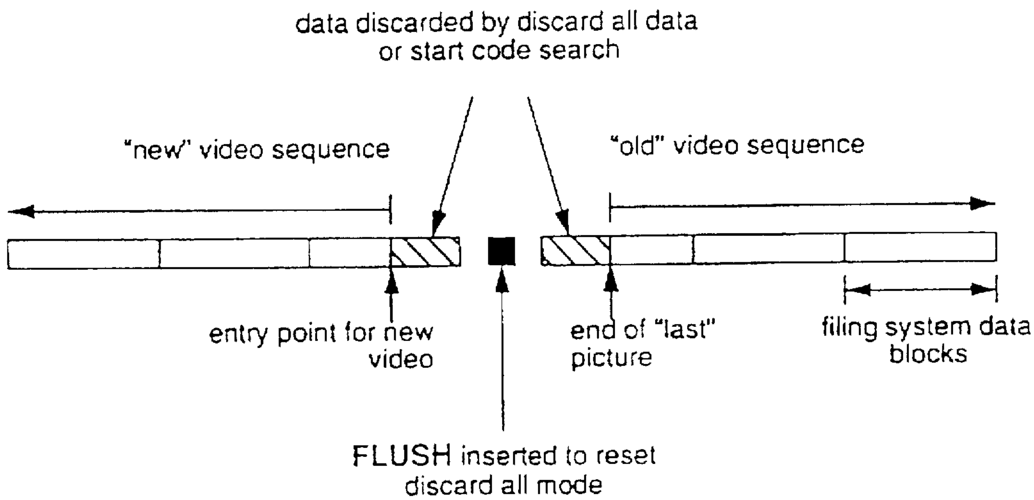
Figure 67:
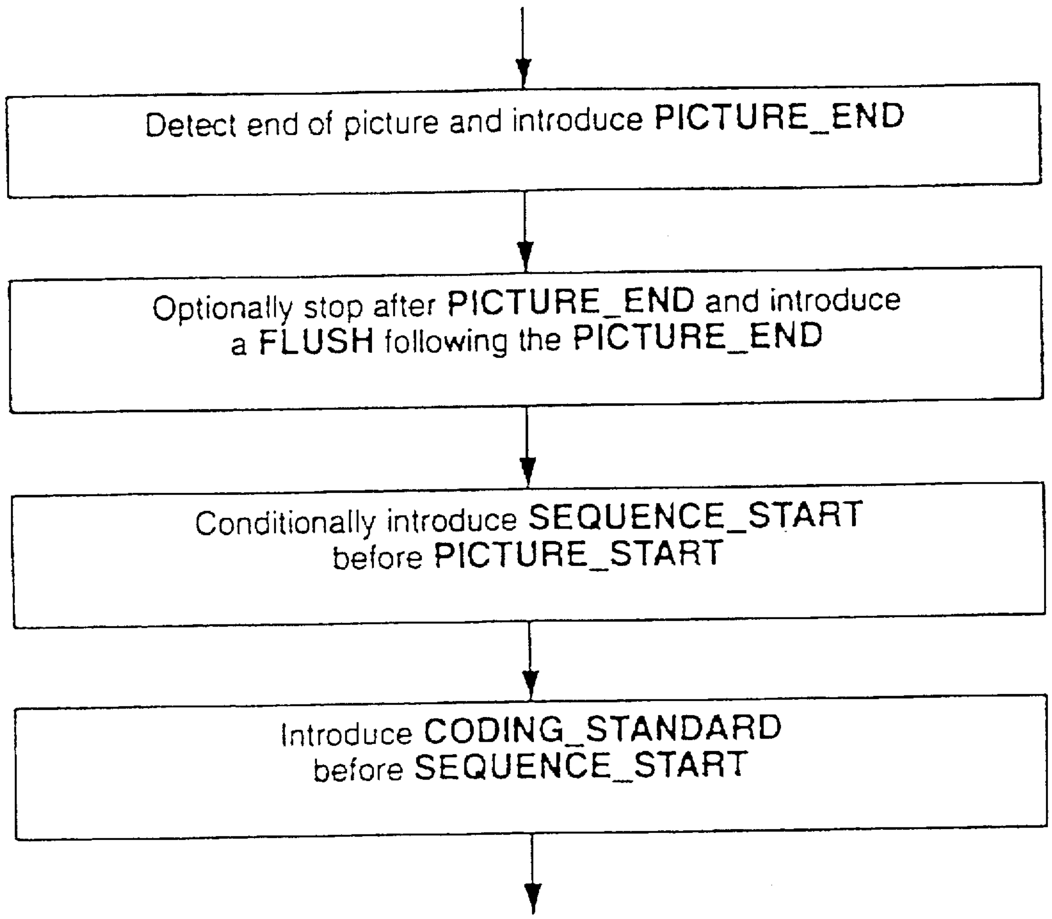
Figure 68:
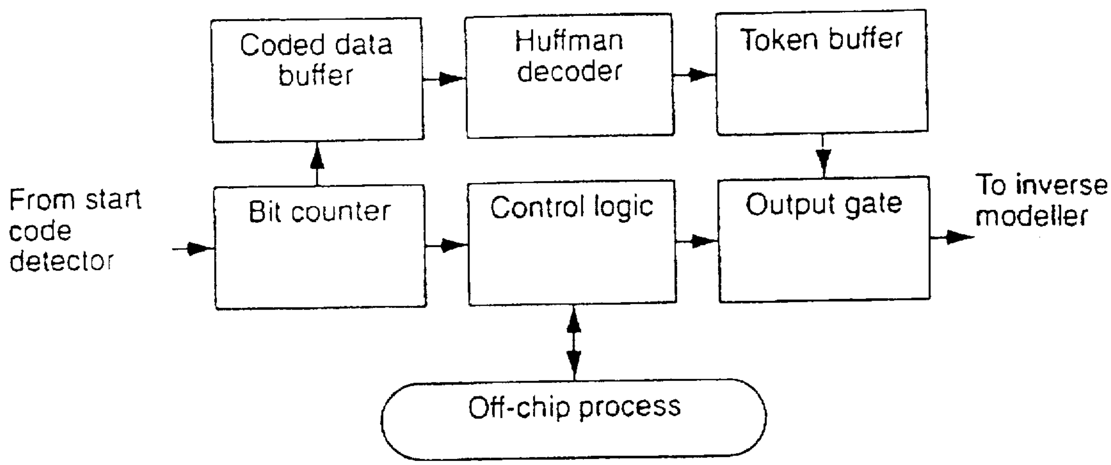
Figure 69:
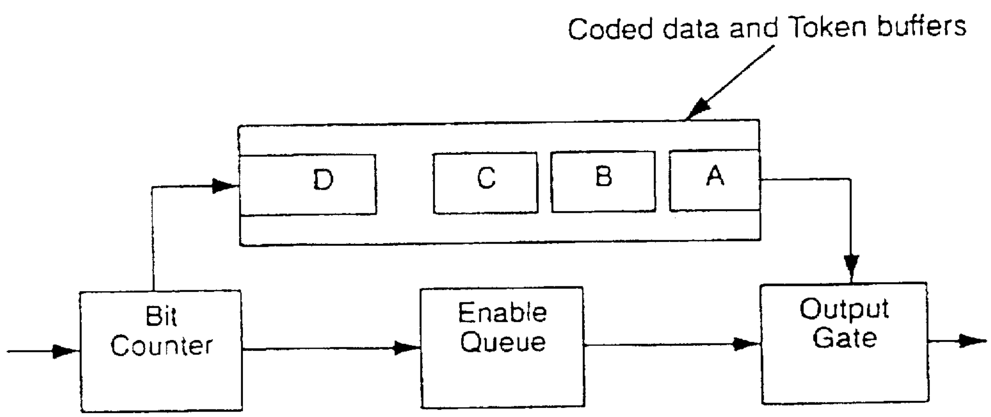
Figure 70:
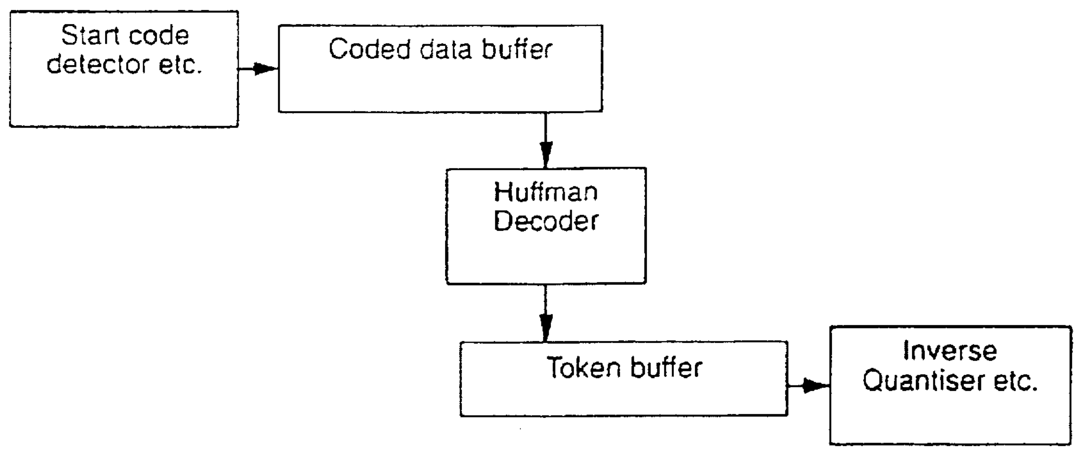
Figure 71:
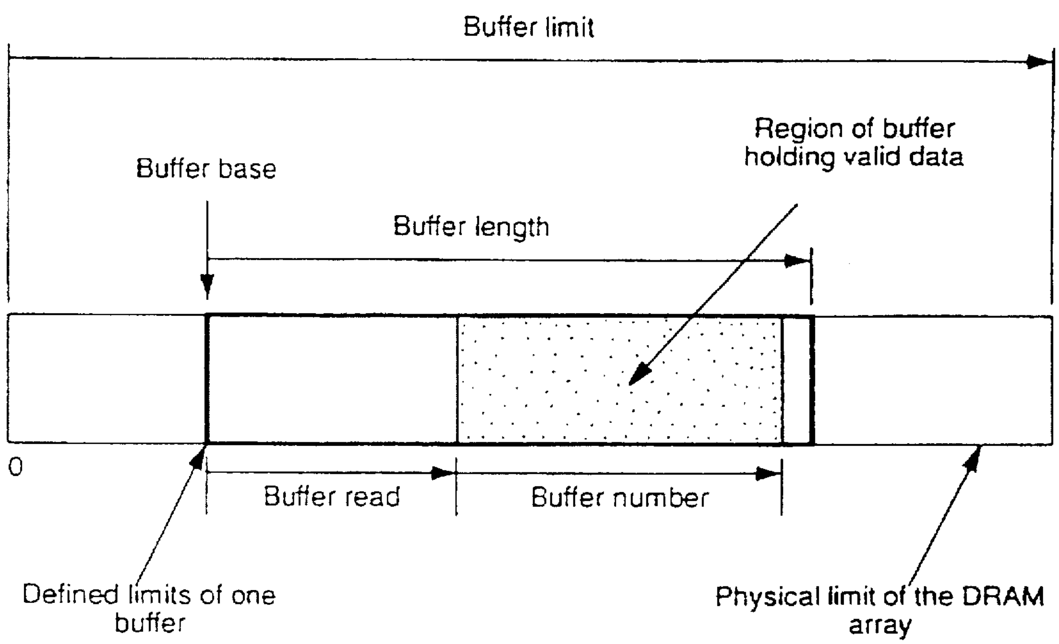
Figure 72:
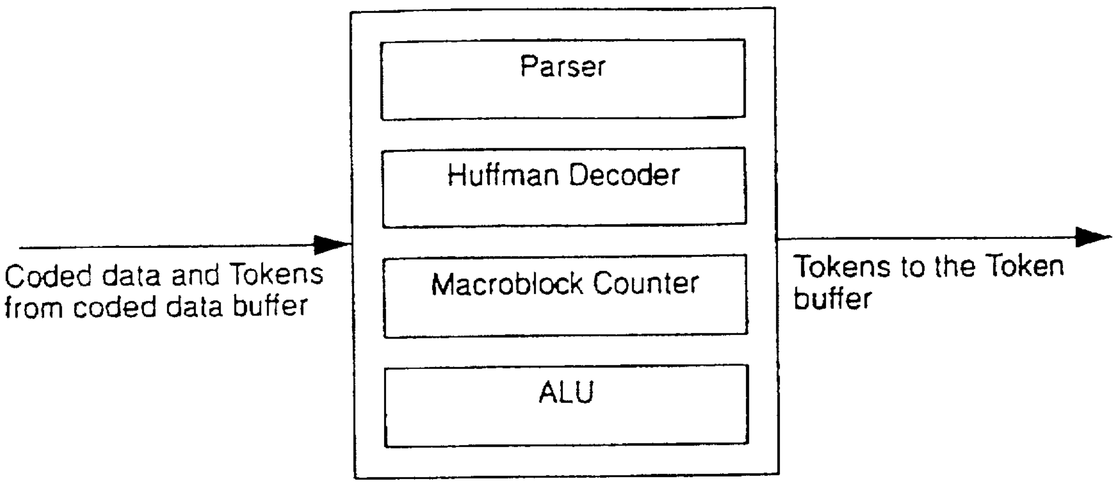
Figure 73:
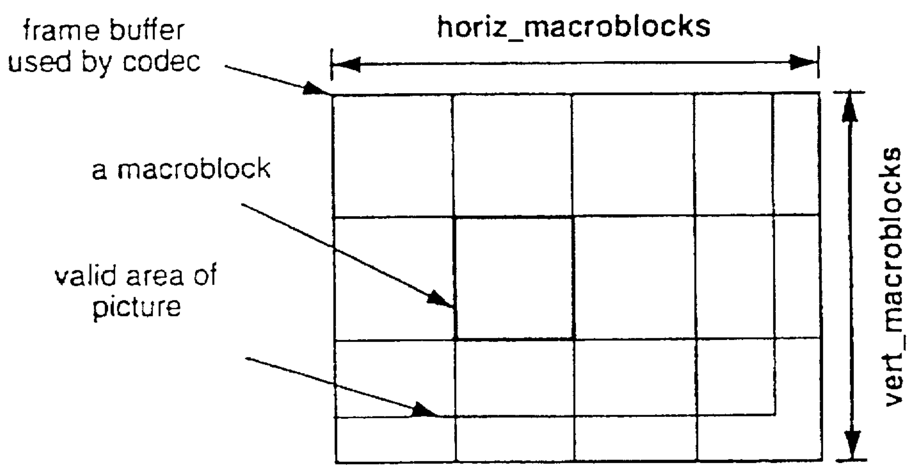
Figure 76:
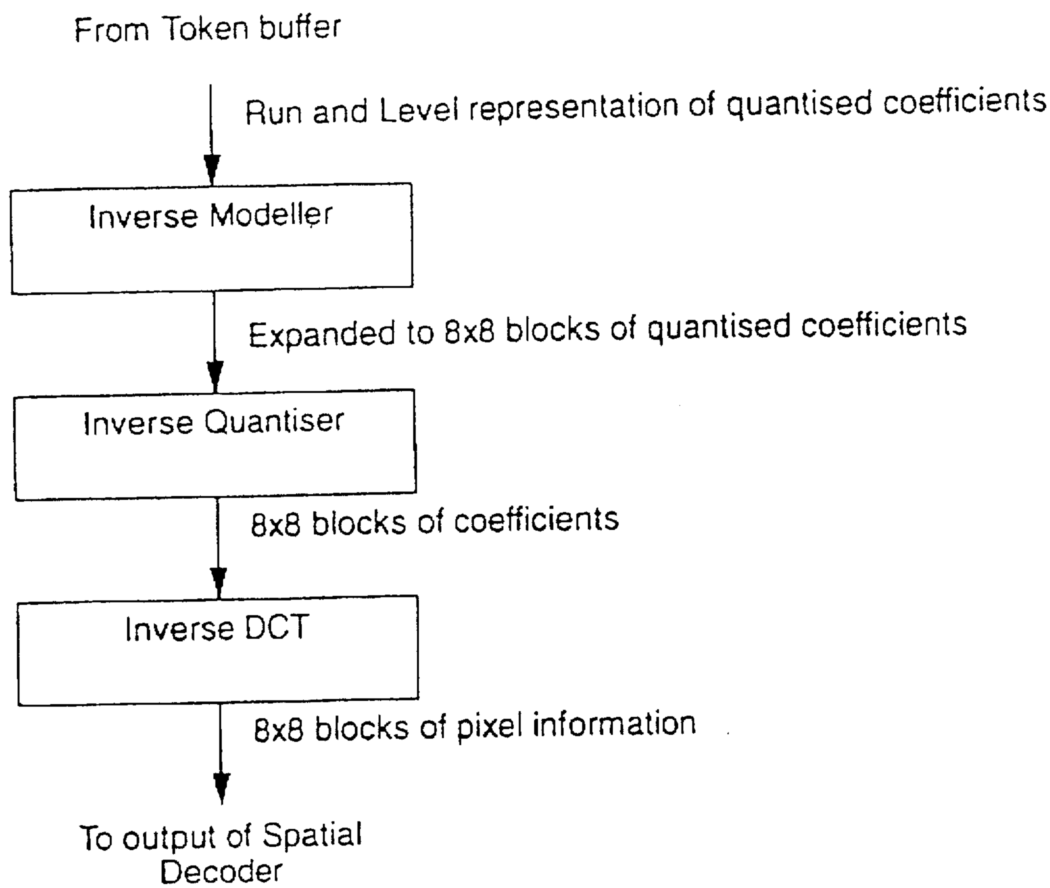
Figure 77:
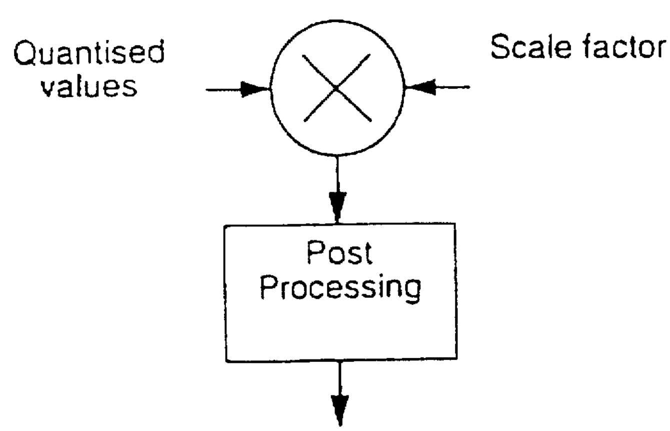
Figure 78:
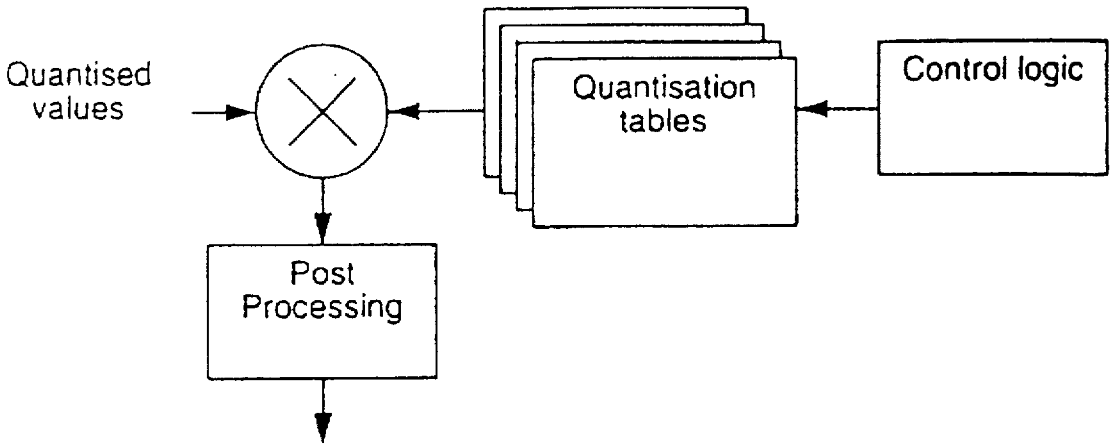
Figure 79:
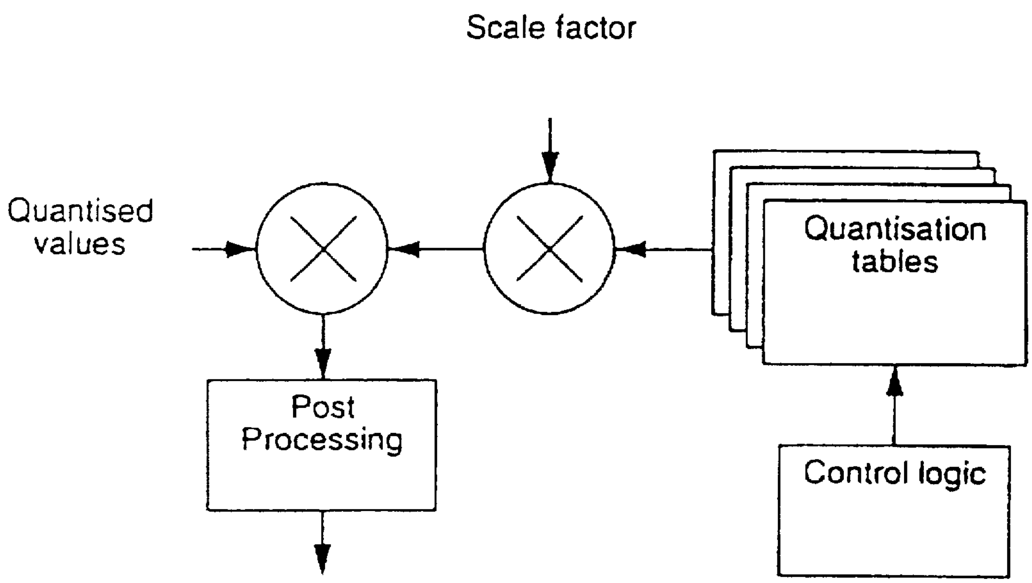
Figure 80:
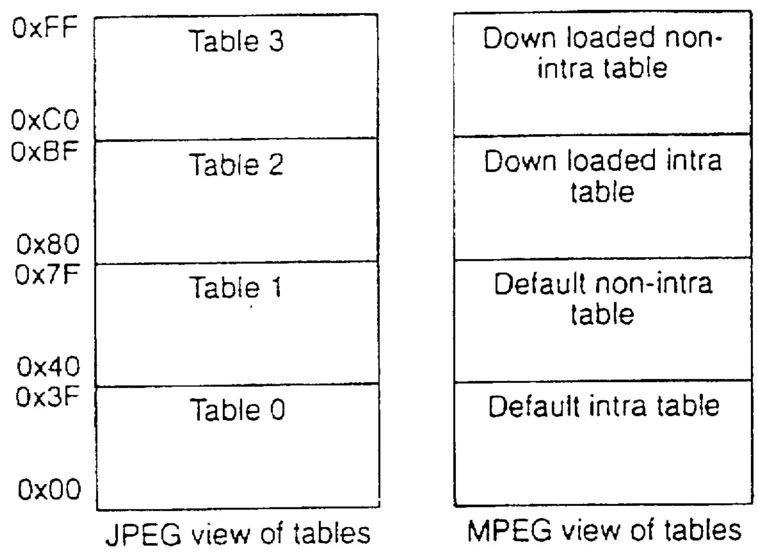
Figure 81:
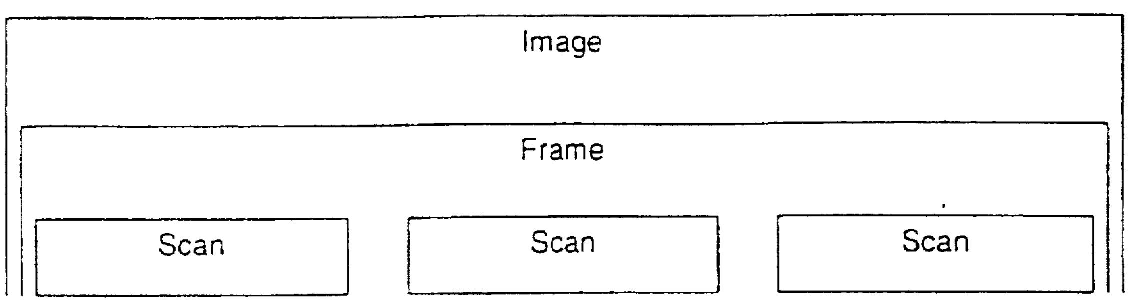
Figure 82:
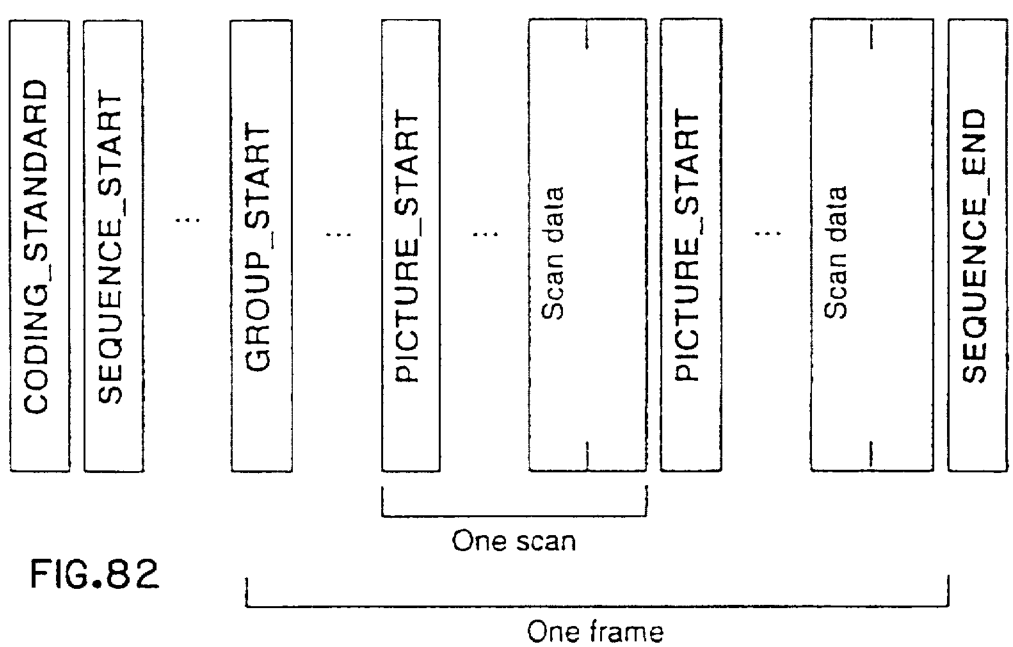
Figure 83:
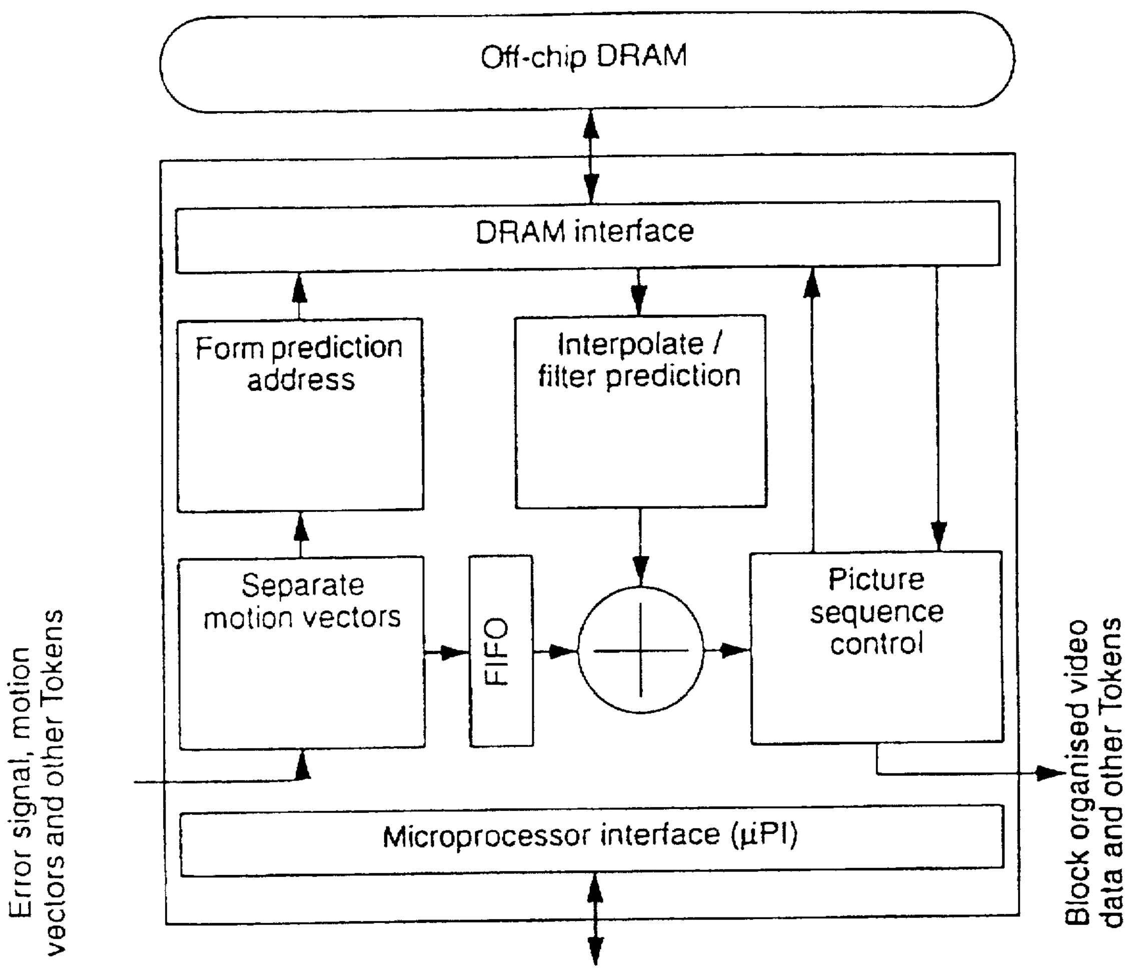
Figure 84:
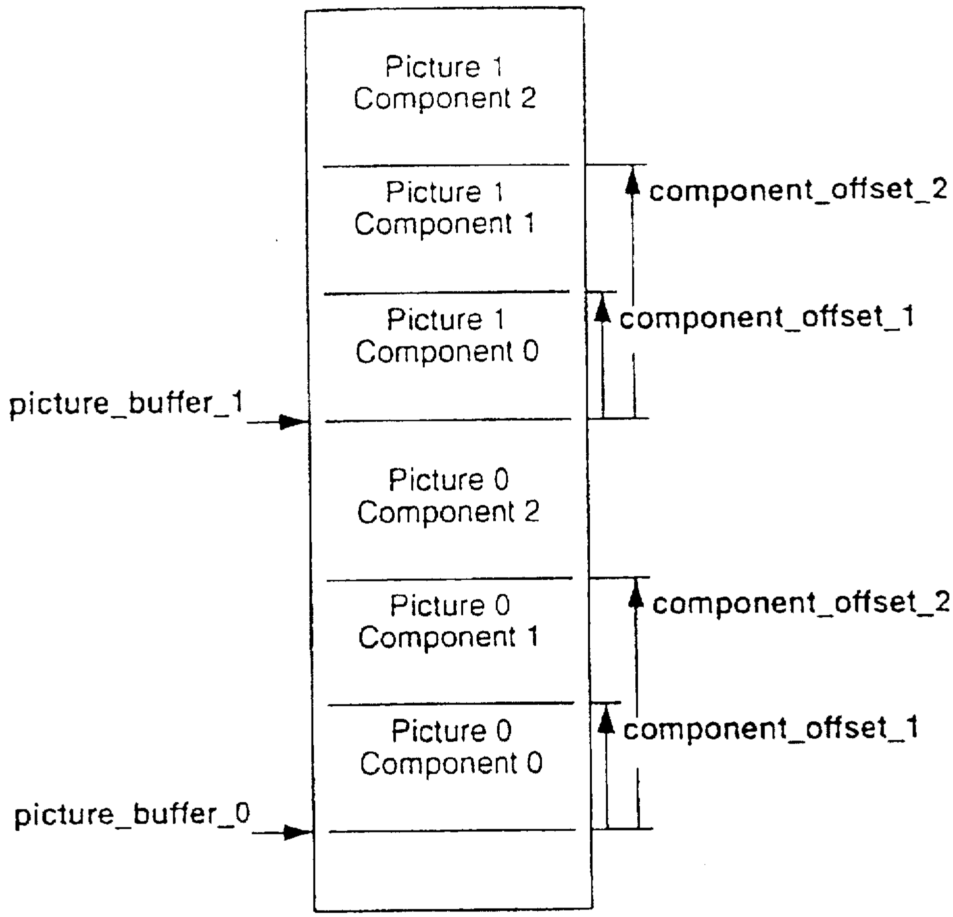
Figure 85:
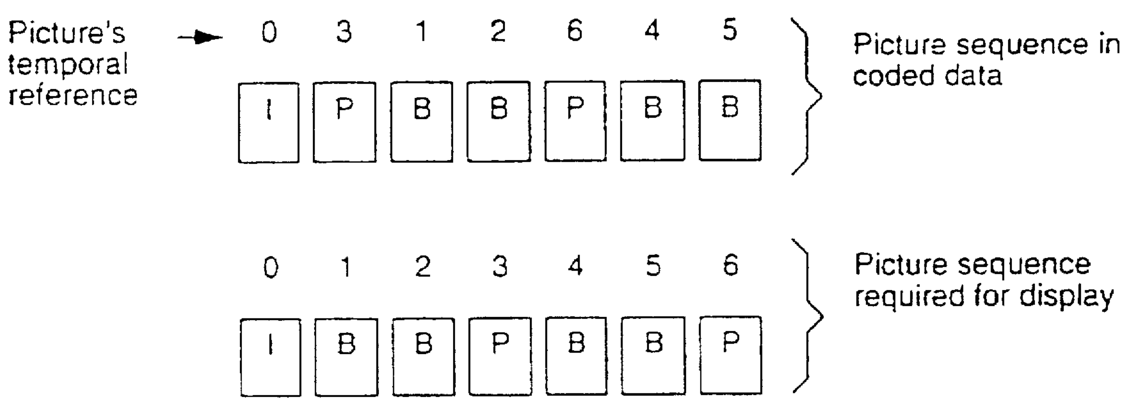
Figure 86:
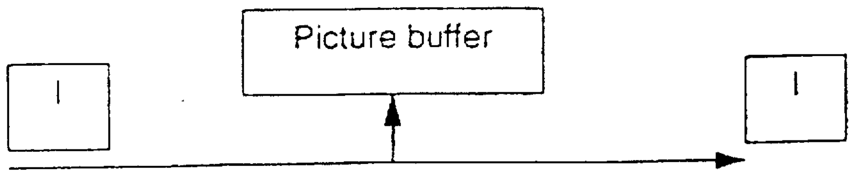
Figure 87:
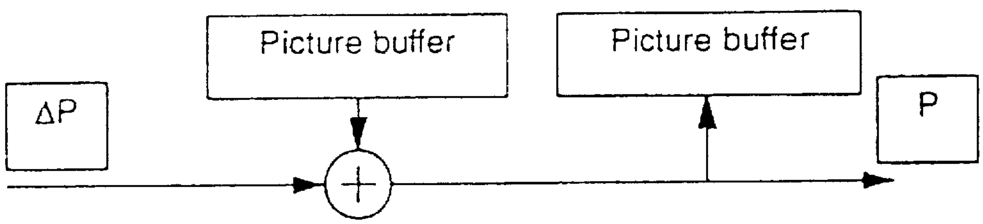

| FIGS. | |
|---|---|
| FIG. 35 | shows a token on an interface wider than 8 bits; |
| FIG. 36 | shows a macroblock structure; |
| FIG. 37 | shows a two-wire interface protocol; |
| FIG. 38 | shows the location of external two-wire interfaces; |
| FIG. 39 | shows clock propagation; |
| FIG. 40 | shows two-wire interface timing; |
| FIG. 41 | shows examples of access structure; |
| FIG. 42 | shows a read transfer cycle; |
| FIG. 43 | shows an access start timing; |
| FIG. 44 | shows an example access with two write transfers; |
| FIG. 45 | shows a read transfer cycle; |
| FIG. 46 | shows a write transfer cycle; |
| FIG. 47 | shows a refresh cycle; |
| FIG. 48 | shows a 32 bit data bus and a 256 kbit deep DRAMs (9 bit row address); |
| FIG. 49 | shows timing parameters for any strobe signal; |
| FIG. 50 | shows timing parameters between any two strobe signals; |
| FIG. 51 | shows timing parameters between a bus and a strobe; |
| FIG. 52 | shows timing parameters between a bus and a strobe; |
| FIG. 53 | shows an MPI read timing; |
| FIG. 54 | shows an MPI write timing; |
| FIG. 55 | shows organization of large integers in the memory map; |
| FIG. 56 | shows a typical decoder clock regime; |
| FIG. 57 | shows input clock requirements; |
| FIG. 58 | shows the Spatial Decoder; |
| FIG. 59 | shows the inputs and outputs of the input circuit; |
| FIG. 60 | shows the coded port protocol; |
| FIG. 61 | shows the start code detector; |
| FIG. 62 | shows start codes detected and converted to Tokens; |
| FIG. 63 | shows the start codes detector passing Tokens; |
| FIG. 64 | shows overlapping MPEG start codes (byte aligned); |
| FIG. 65 | shows overlapping MPEG start codes (not byte aligned); |
| FIG. 66 | shows jumping between two video sequences; |
| FIG. 67 | shows a sequence of extra Token insertion; |
| FIG. 68 | shows decoder start-up control; |
| FIG. 69 | shows enabled streams queued before the output; |
| FIG. 70 | shows a spatial decoder buffer; |
| FIG. 71 | shows a buffer pointer; |
| FIG. 72 | shows a video demux; |
| FIG. 73 | shows a construction of a picture; |
| FIG. 74 | shows a construction of a 4:2:2 macroblock; |
| FIG. 75 | shows a calculating macroblock dimension from pel ones; |
| FIG. 76 | shows spatial decoding; |
| FIG. 77 | shows an overview of H.261 inverse quantization; |
| FIG. 78 | shows an overview of JPEG inverse quantization; |
| FIG. 79 | shows an overview of MPEG inverse quantization; |
| FIG. 80 | shows a quantization table memory map; |
| FIG. 81 | shows an overview of JPEG baseline sequential structure; |
| FIG. 82 | shows a tokenised JPEG picture; |
| FIG. 83 | shows a temporal decoder; |
| FIG. 84 | shows a picture buffer specification; |
| FIG. 85 | shows an MPEG picture sequence (m=3); |
| FIG. 86 | shows how "I" pictures are stored and output; |
| FIG. 87 | shows how "P" pictures are formed, stored and output; |

-continued

Figure 88:
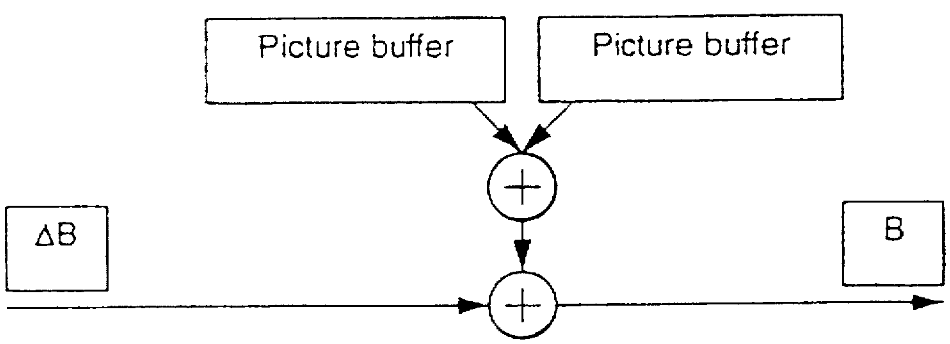
Figure 89:
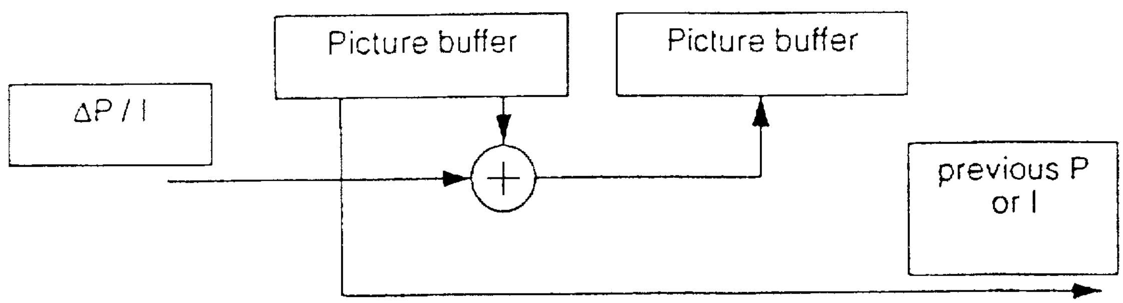
Figure 90:
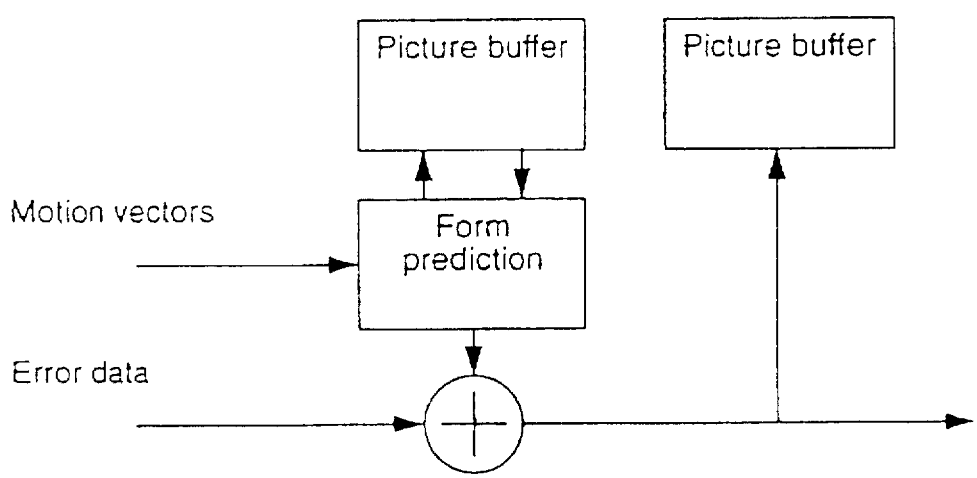
Figure 91:
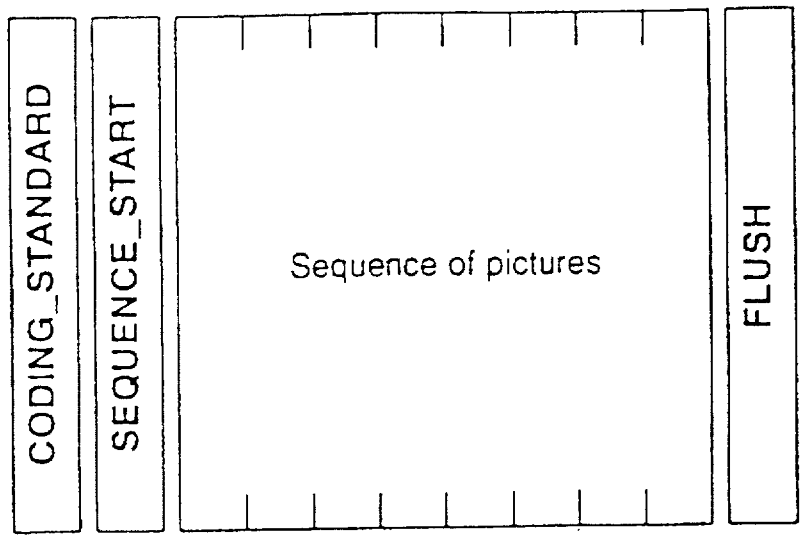
Figure 92:
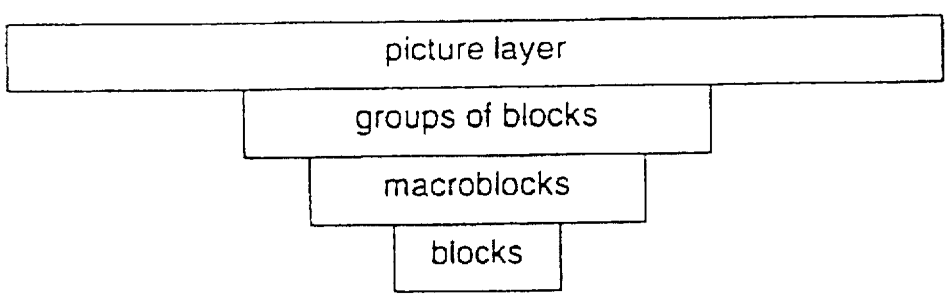
Figure 93:
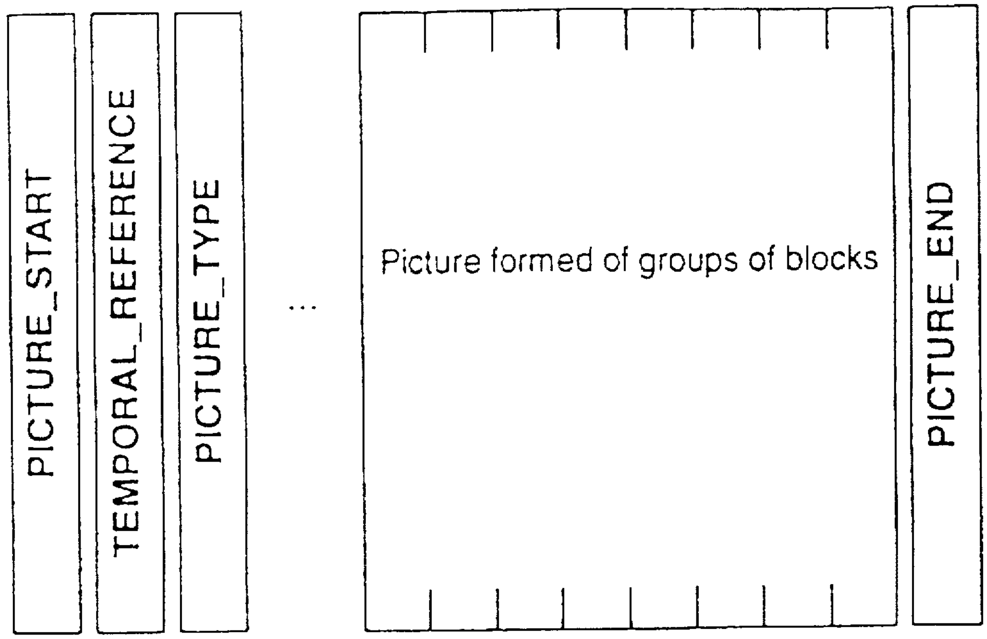
Figure 94:
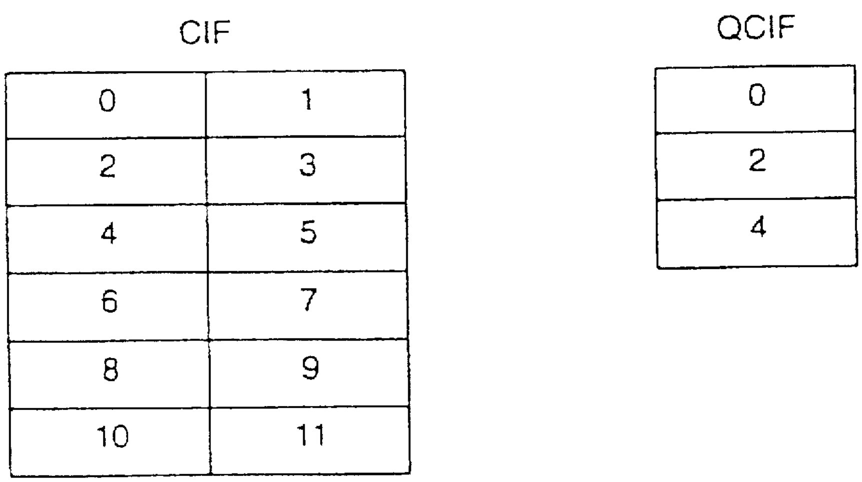
Figures 95, 96:
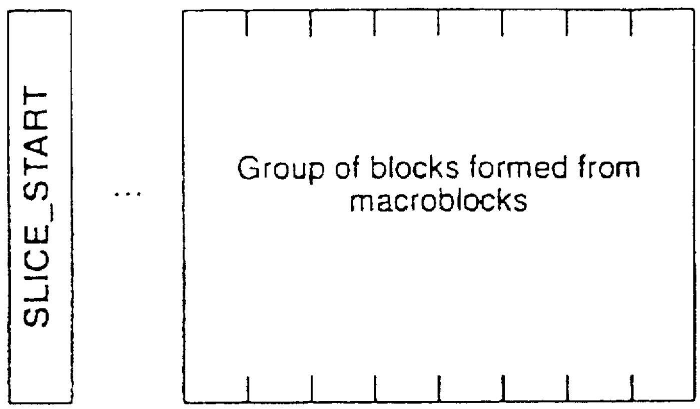
Figure 97:
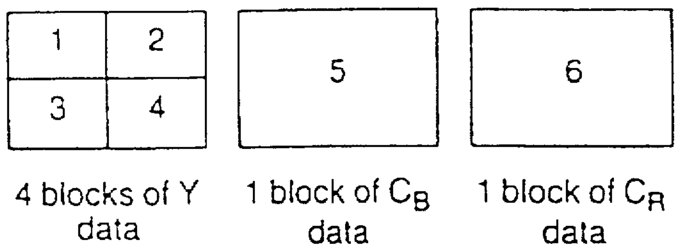
Figure 98:
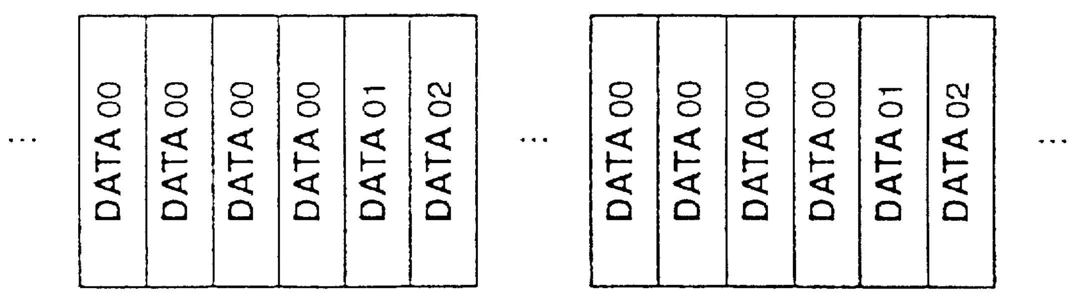
Figures 99, 100:
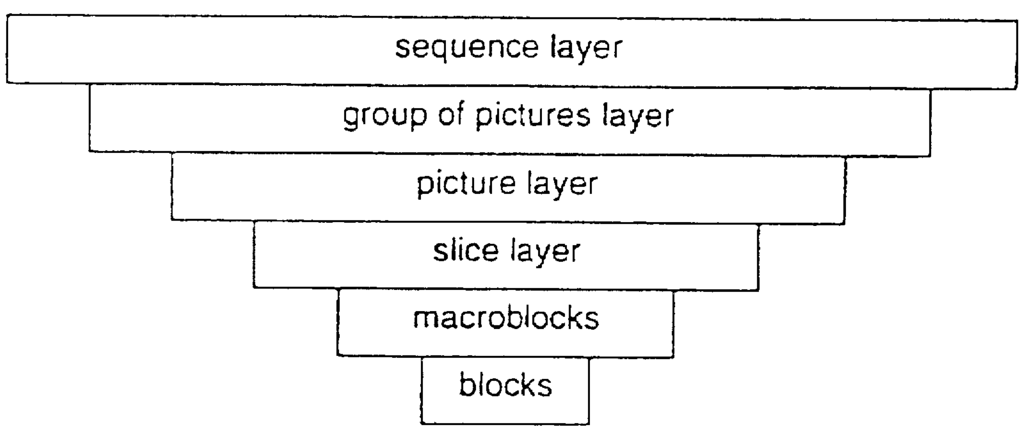
Figure 101:
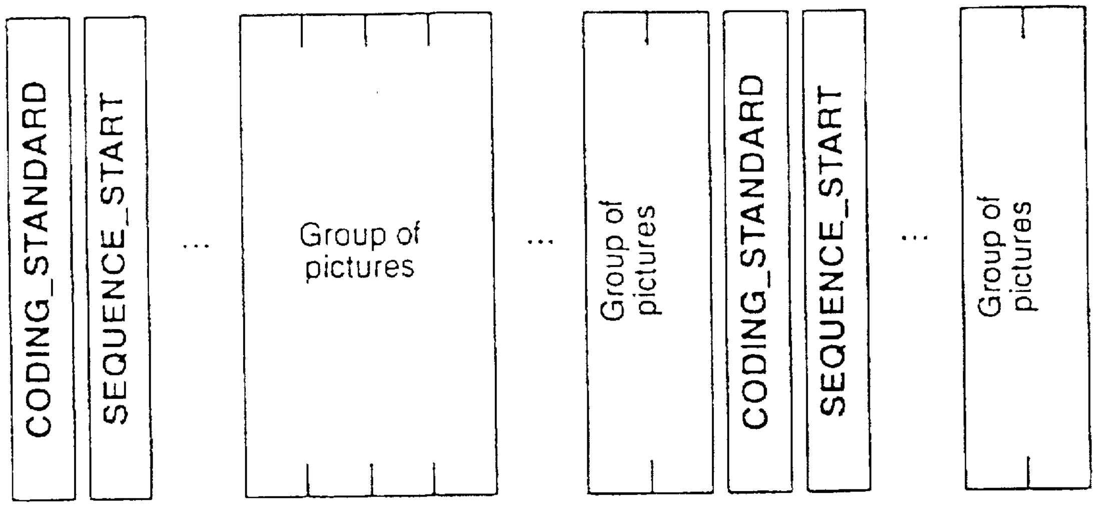
Figure 102:
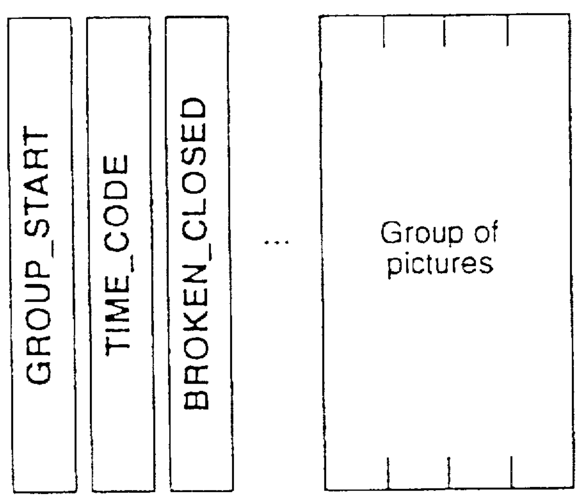
Figure 103:
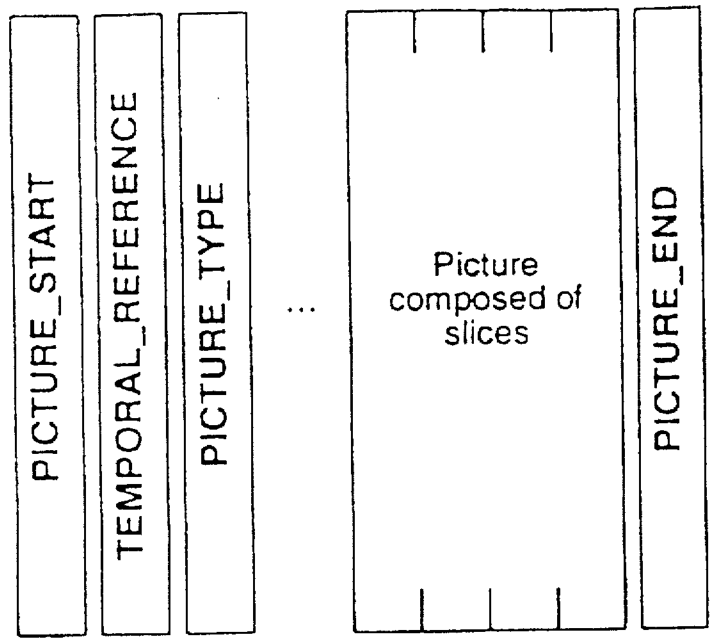
Figure 104:
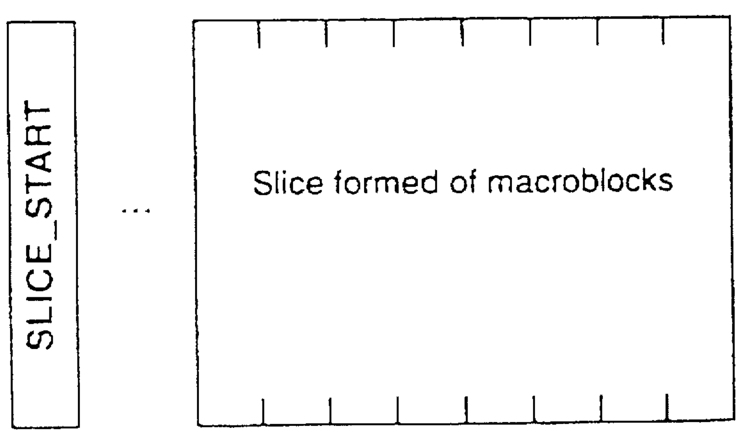
Figure 105:
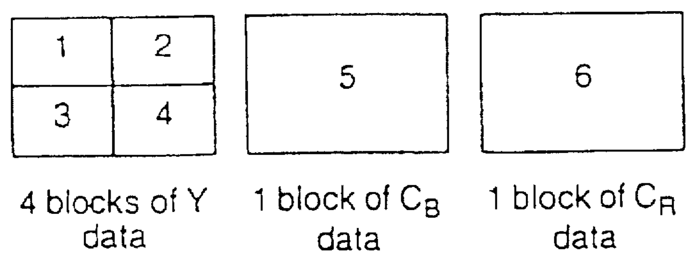
Figure 106:
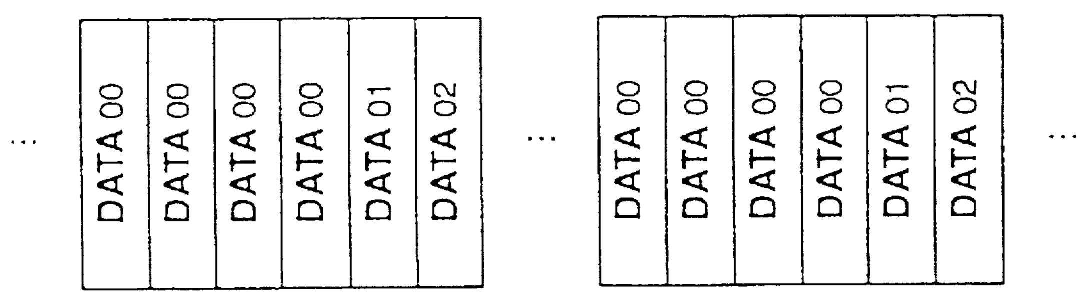
Figure 107:
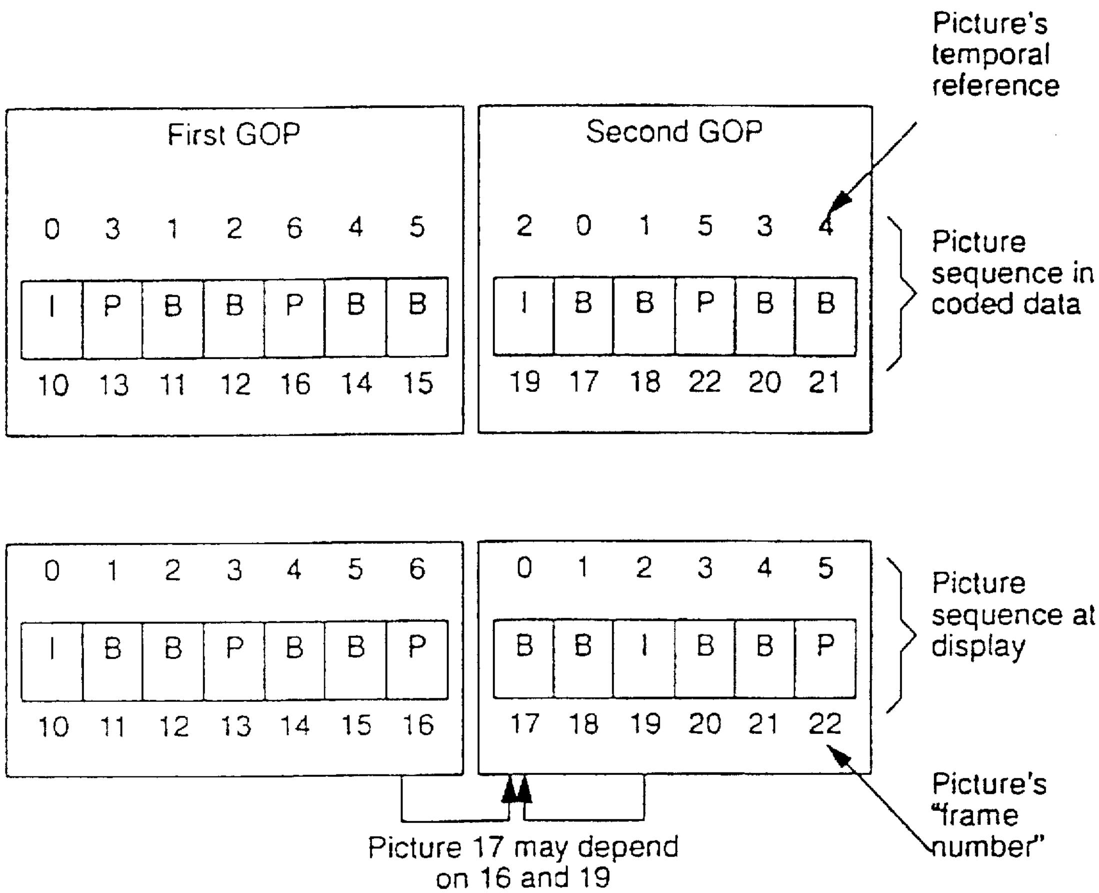
Figure 108:
Figure 109:
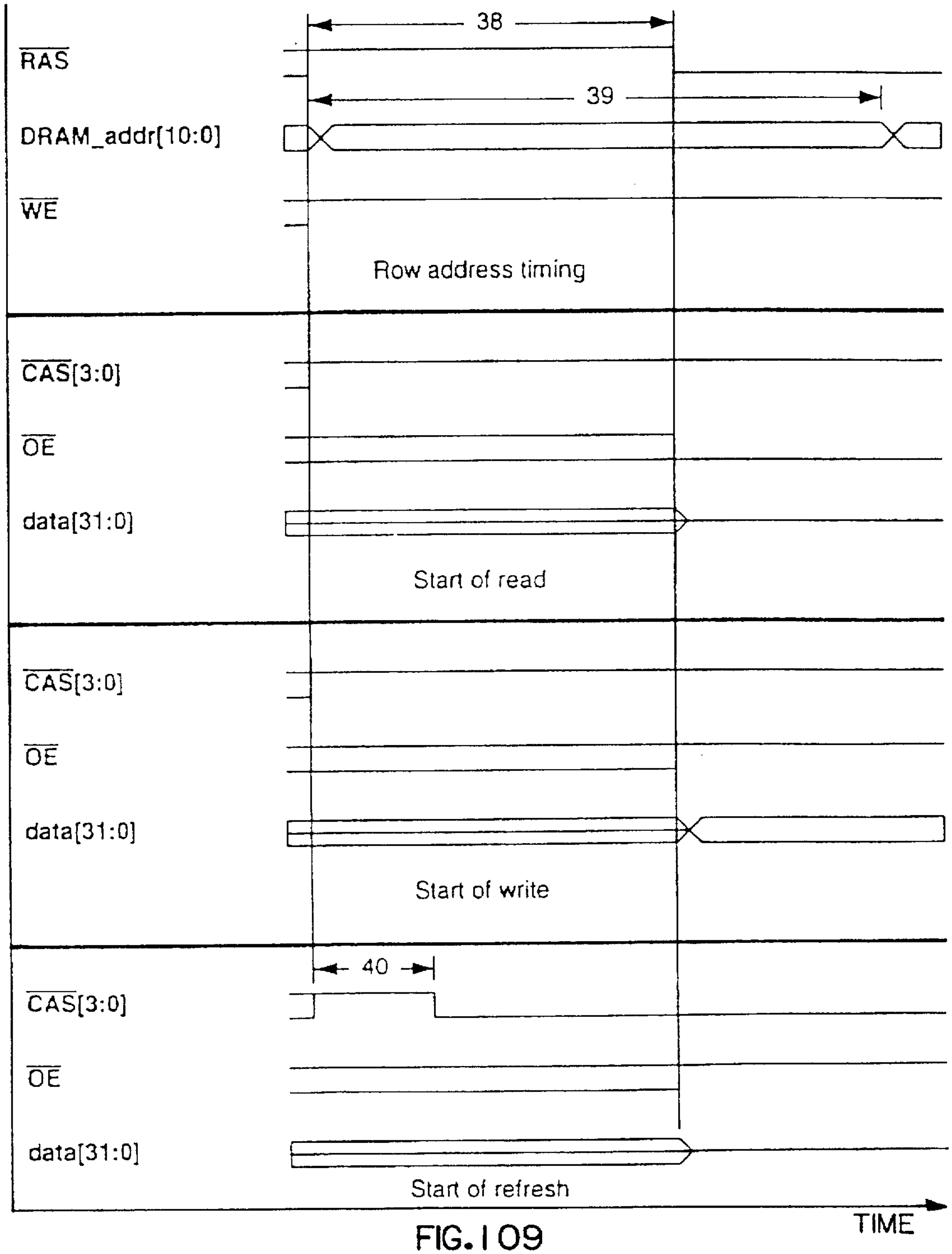
Figure 110:
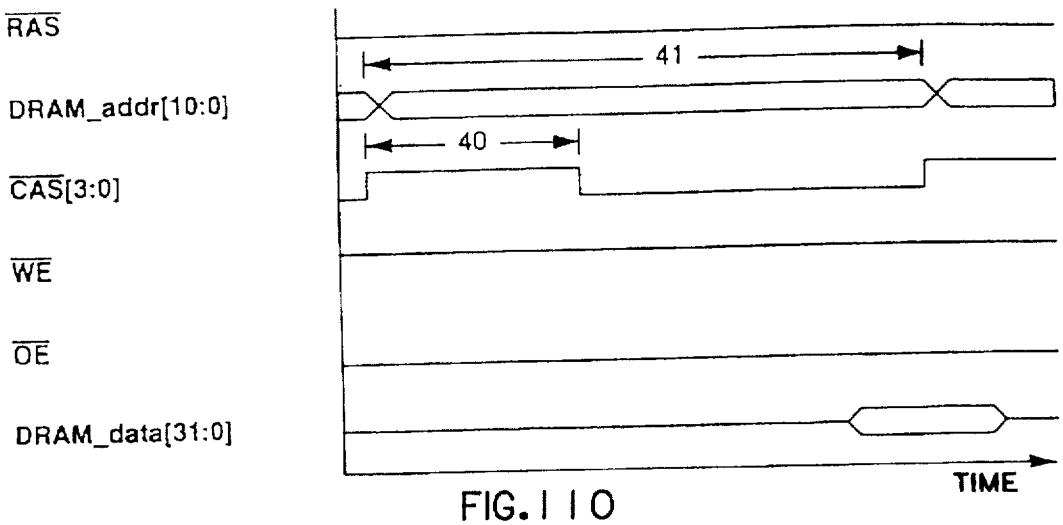
Figure 111:
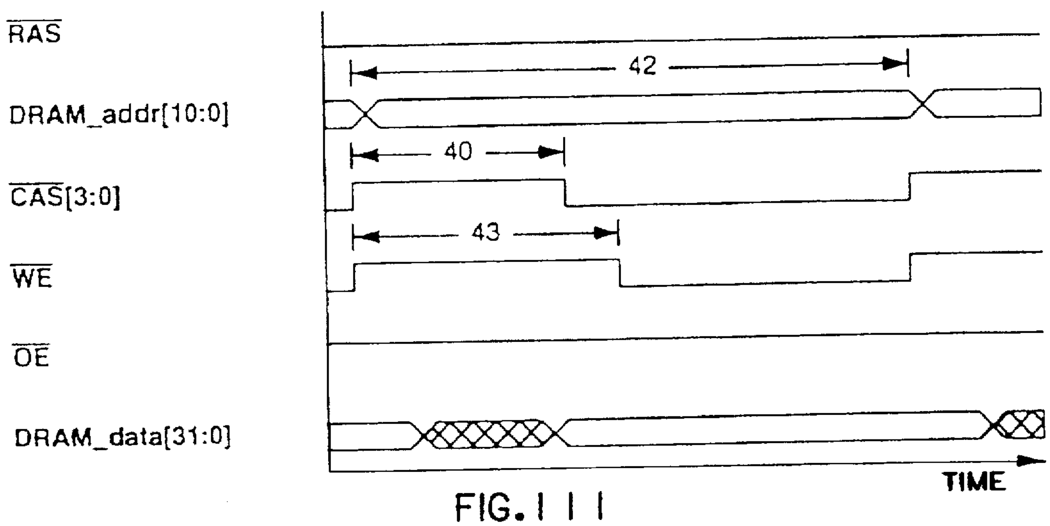
Figure 112:
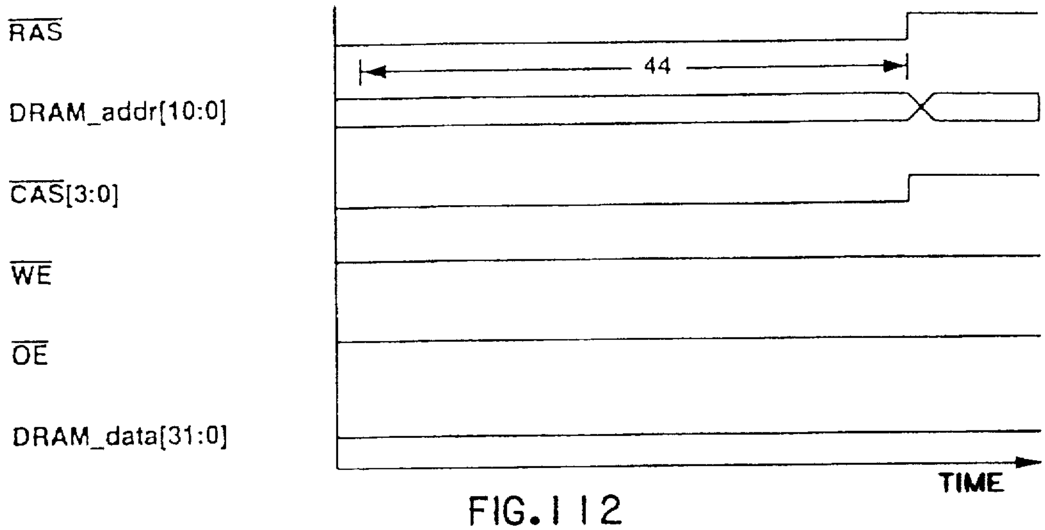
Figure 113:
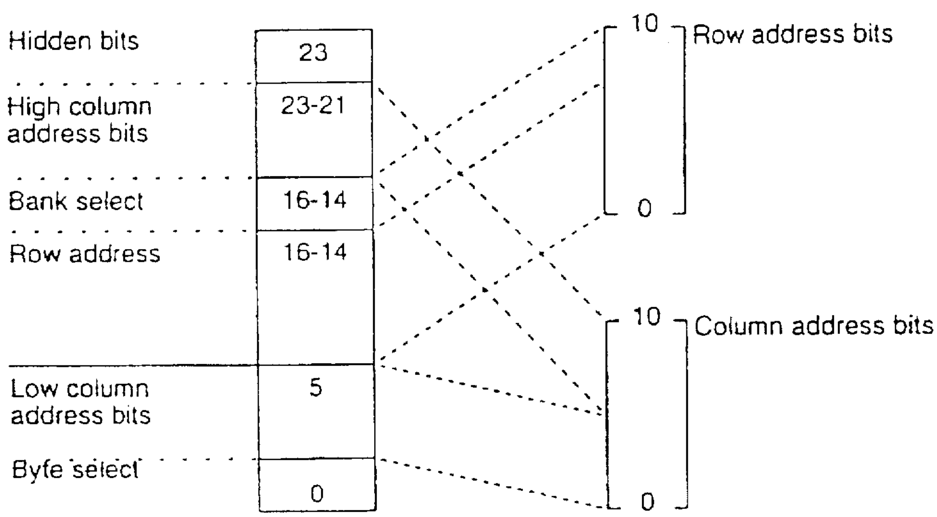
Figure 114:
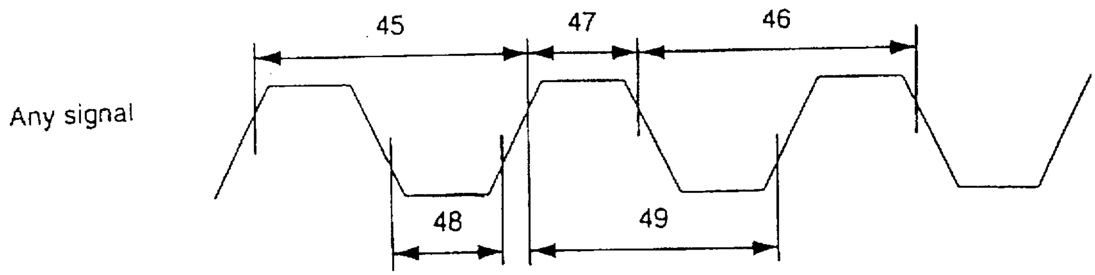
Figure 115:
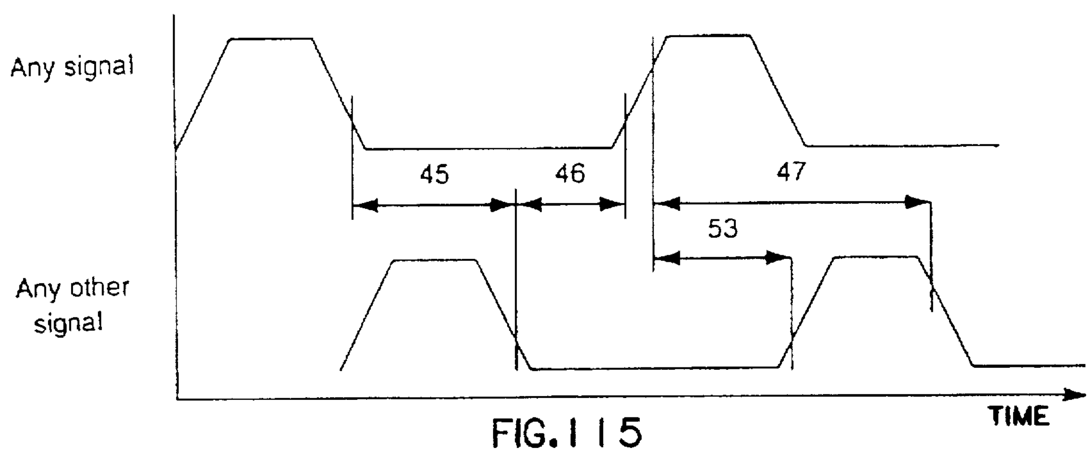
Figure 116:
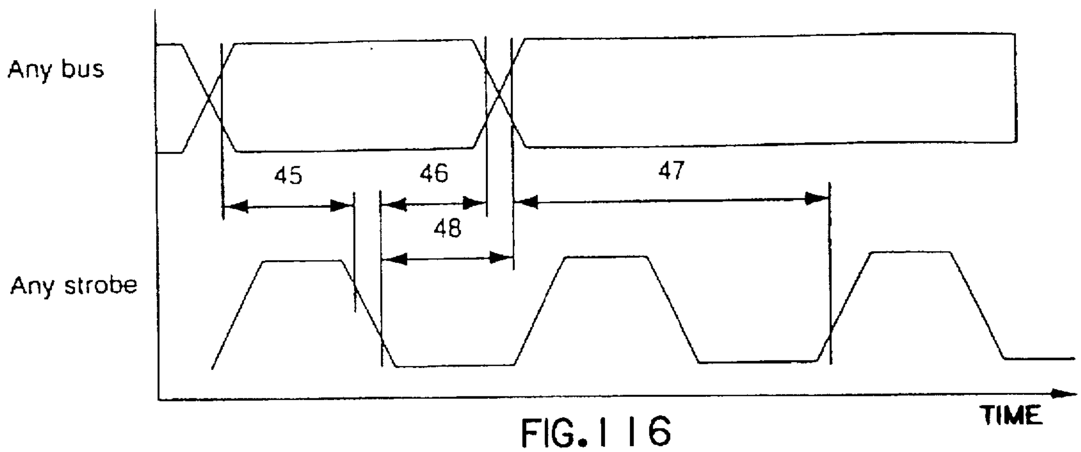
Figure 117:
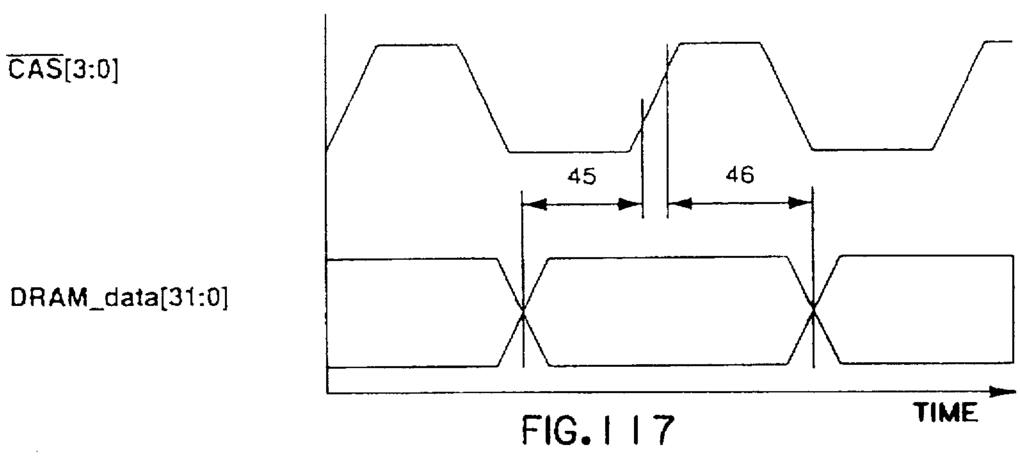
Figure 118:
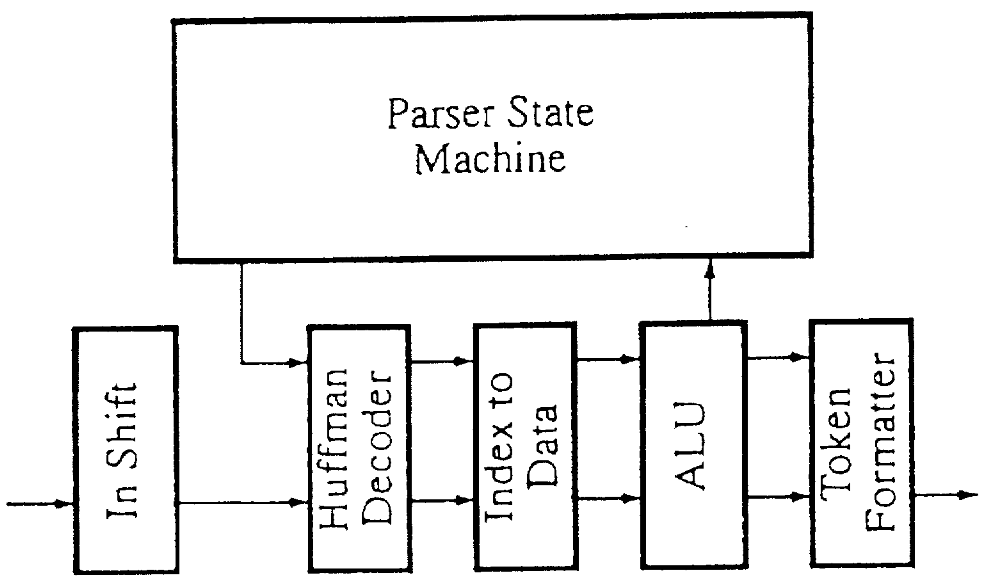
Figure 119:
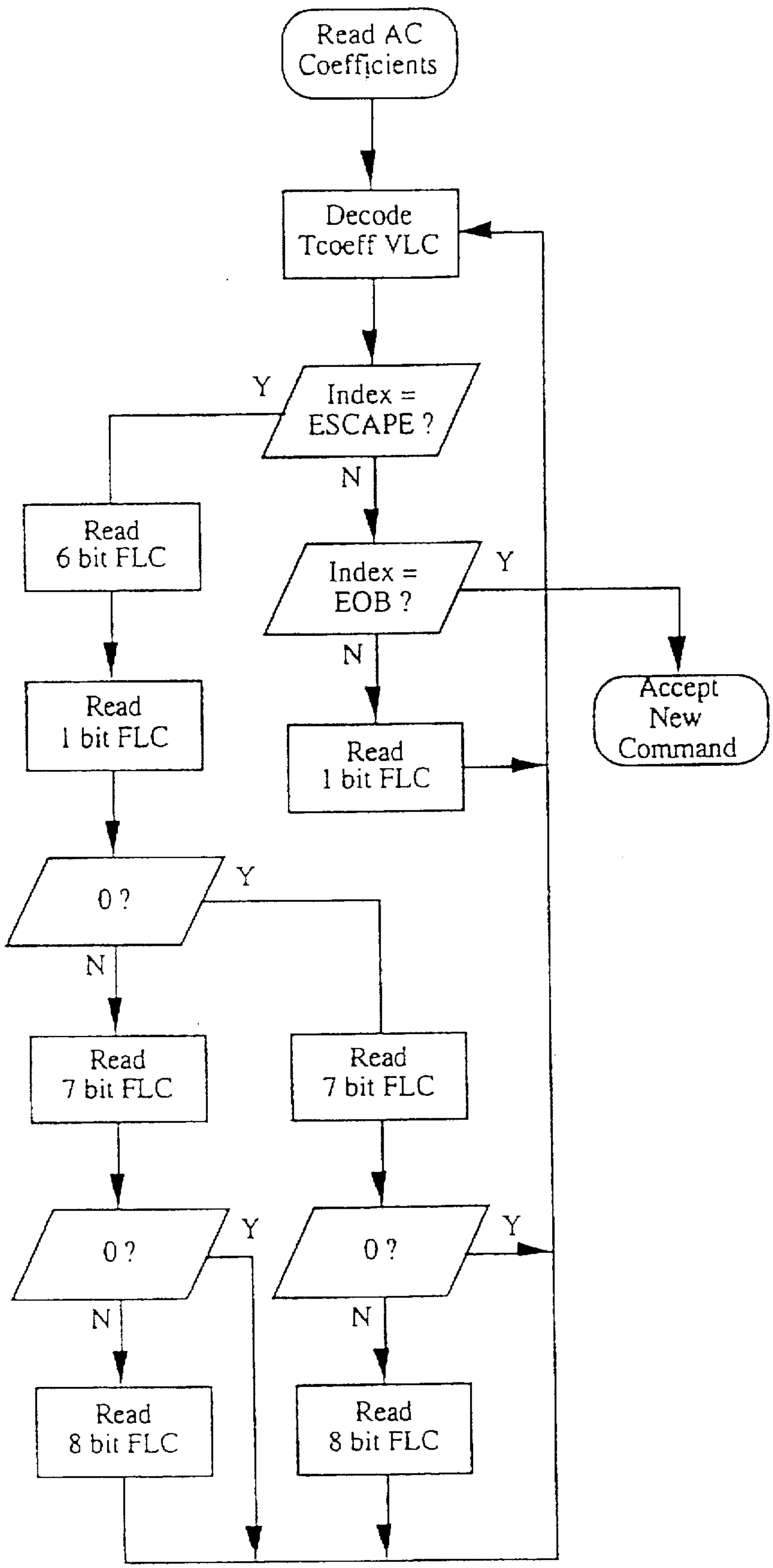
Figure 120:
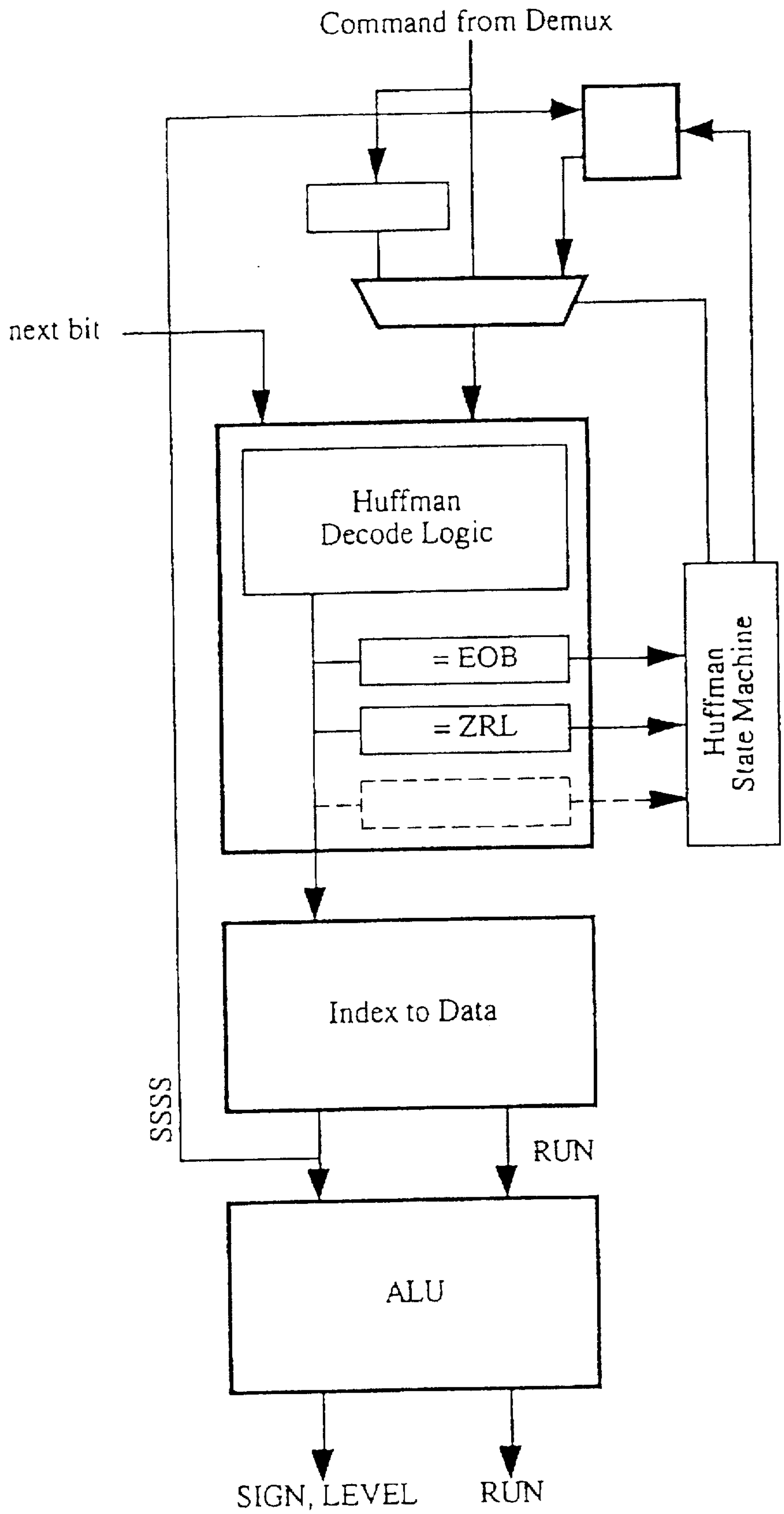
Figure 121A:
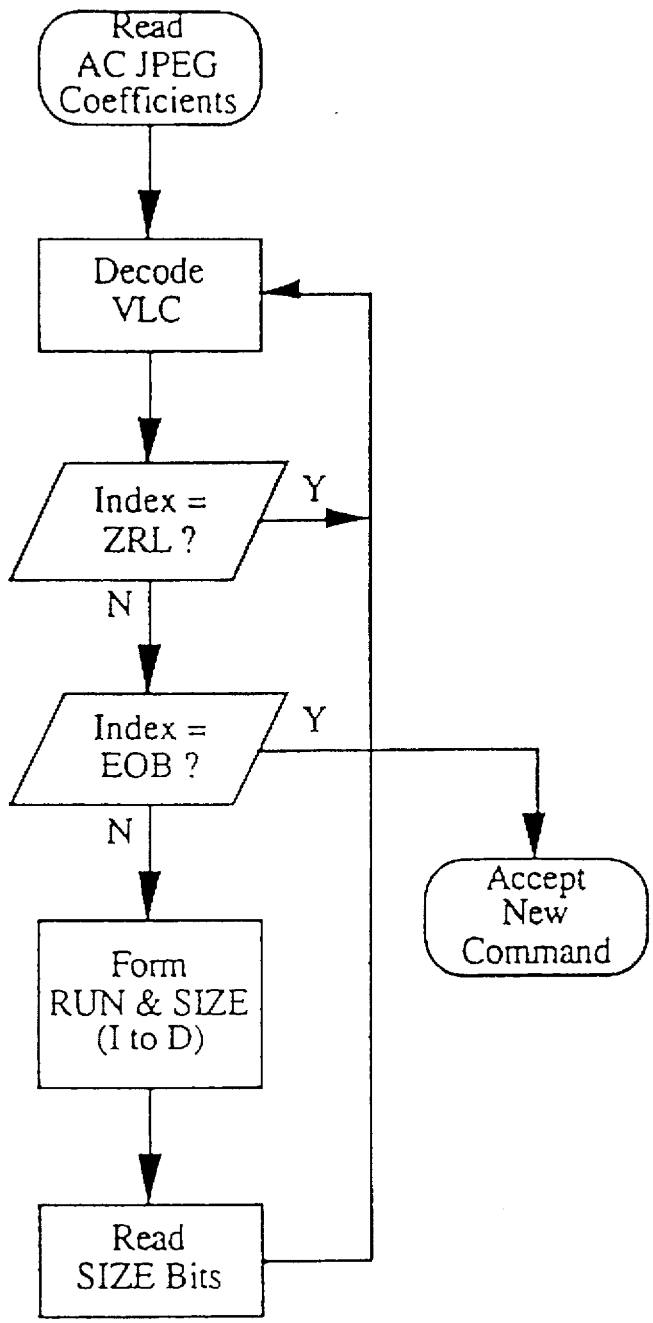
Figure 121B:
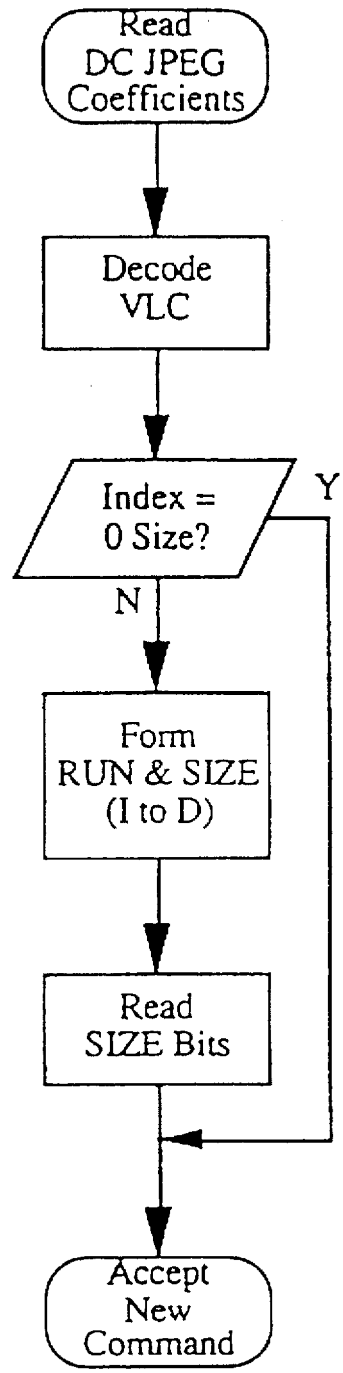
Figure 122:
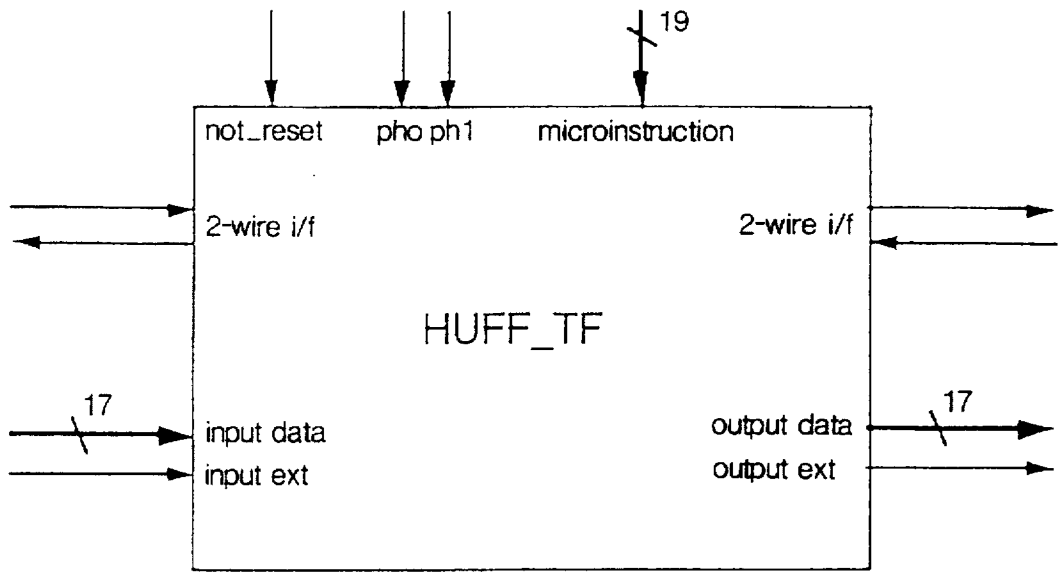
Figure 123:
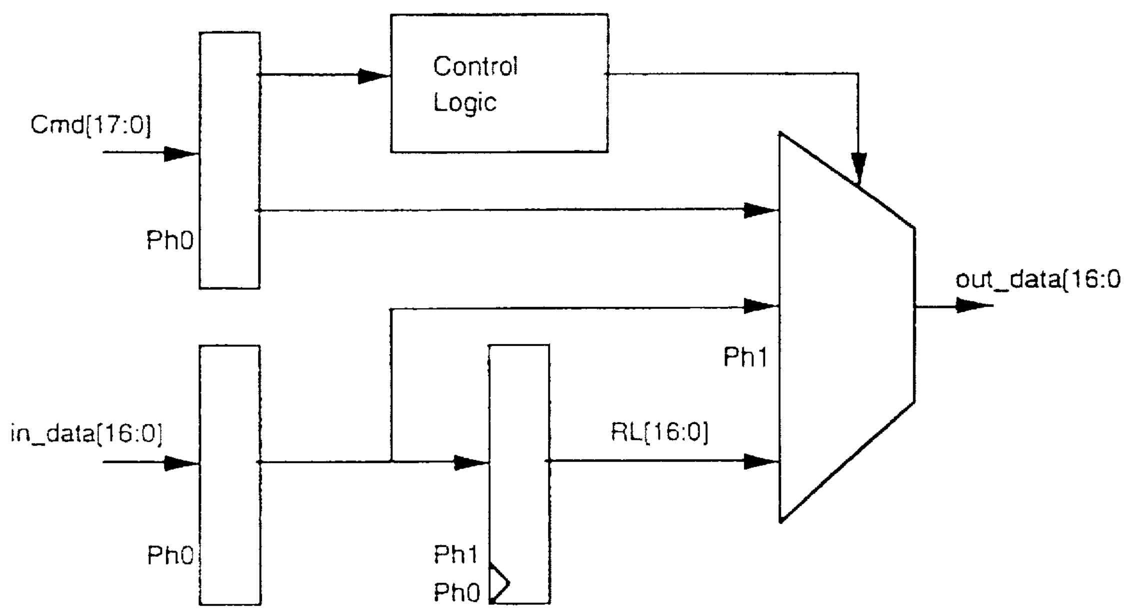
Figure 124:
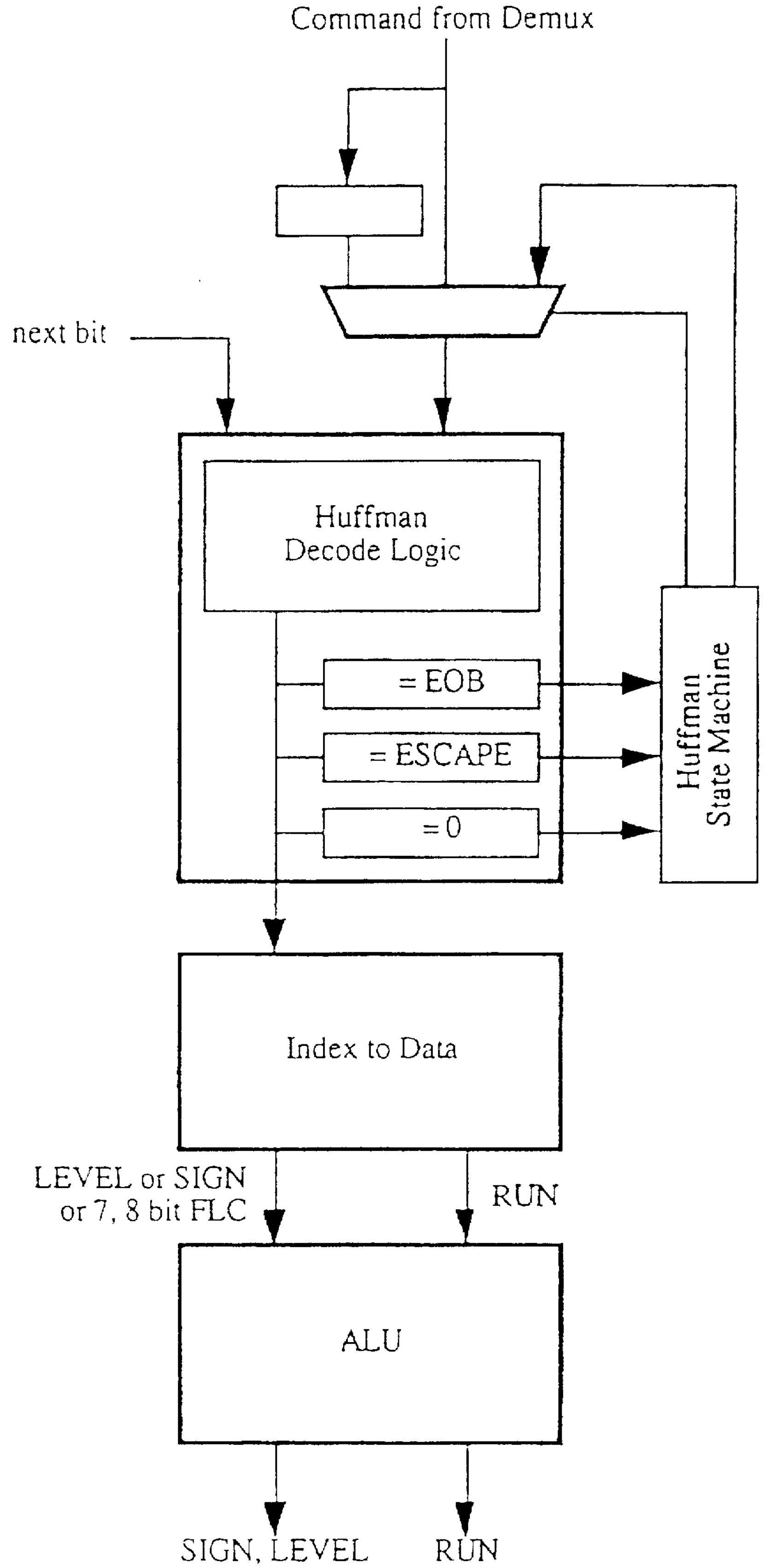
Figure 125:
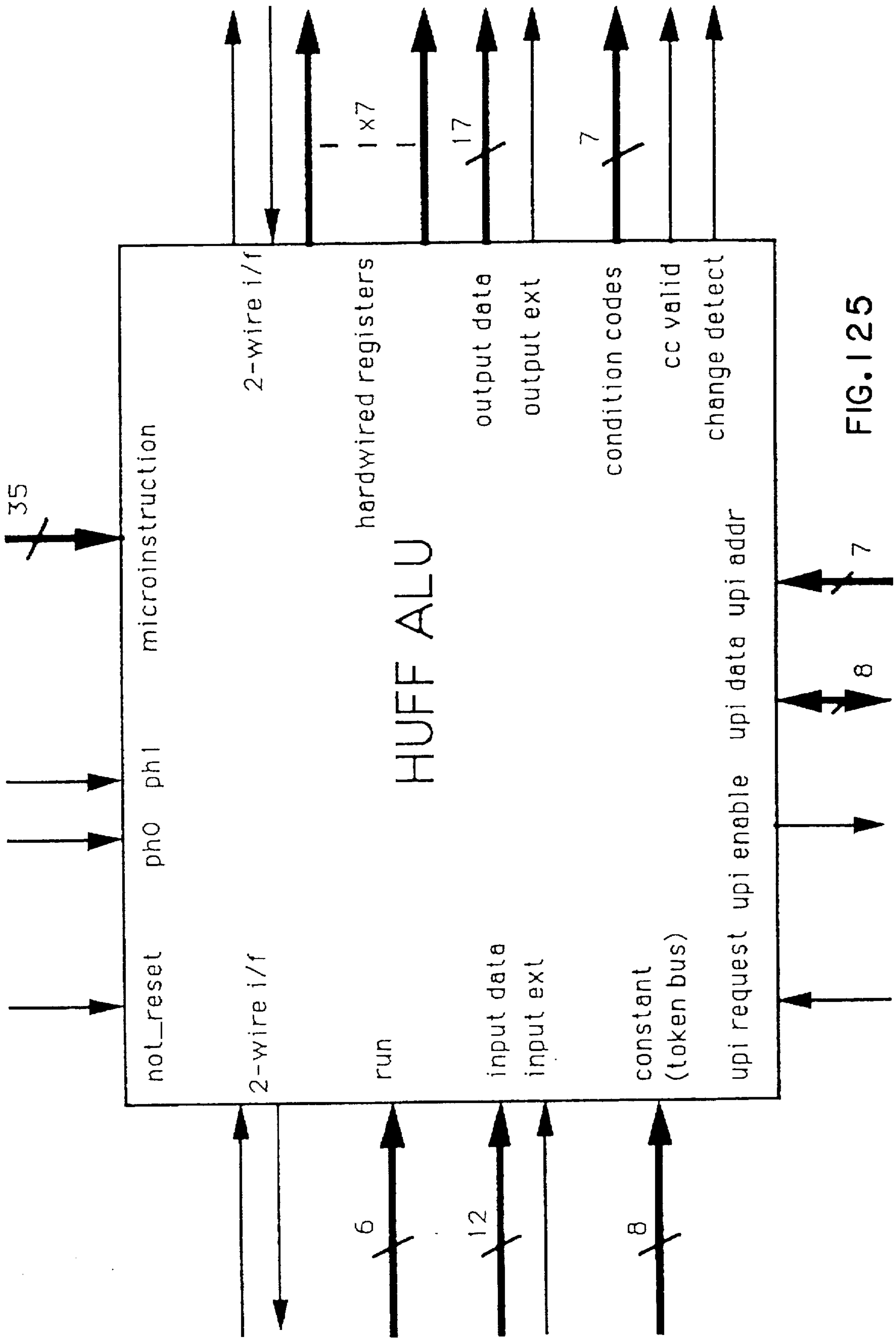
Figure 126:
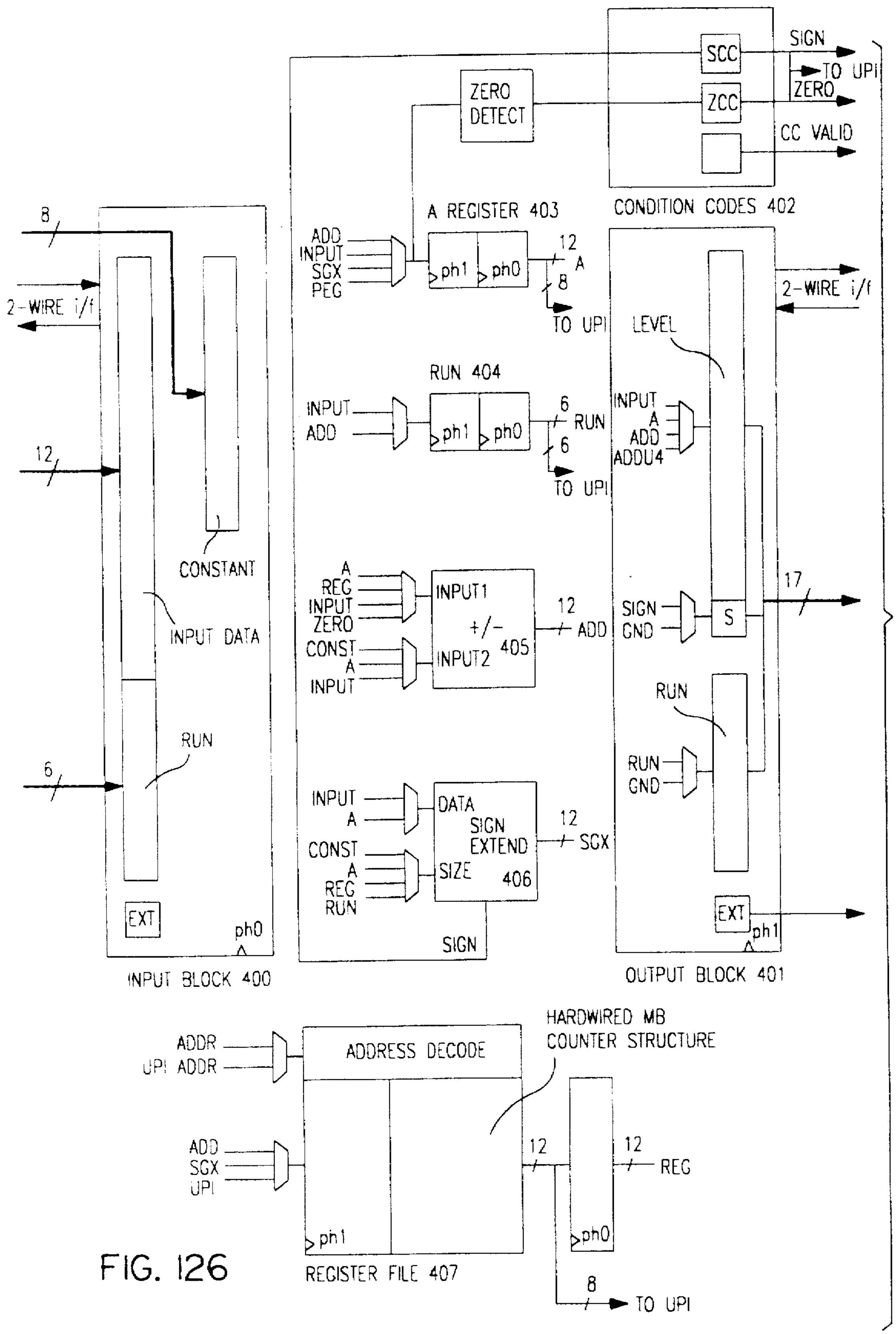
Figure 127:
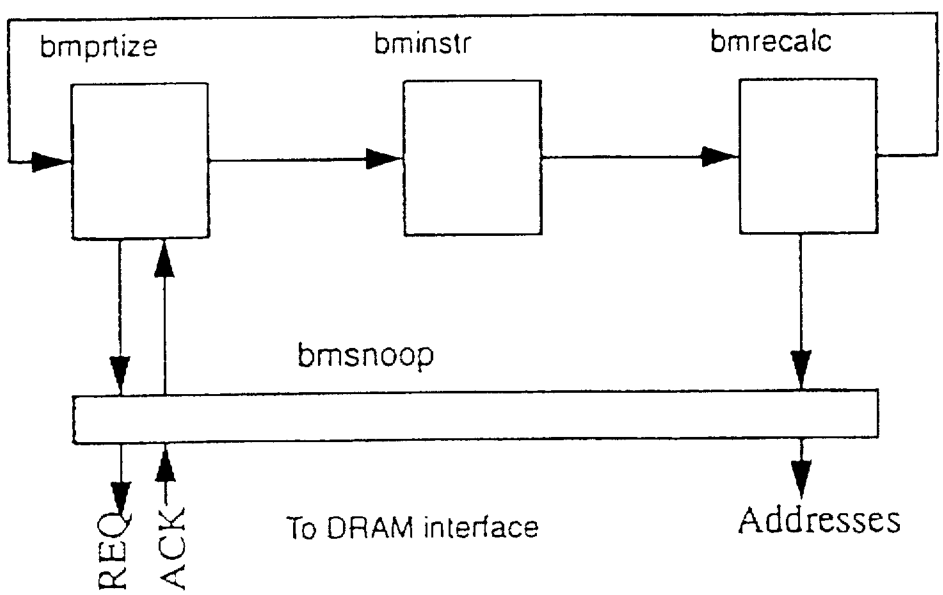
Figure 128:
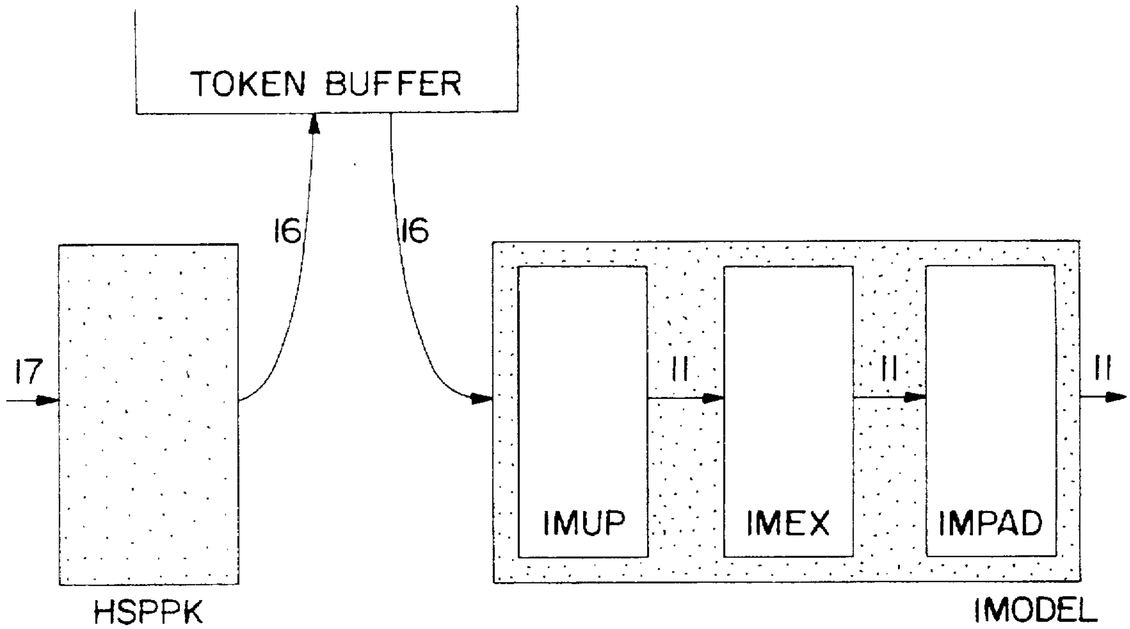
Figure 129:
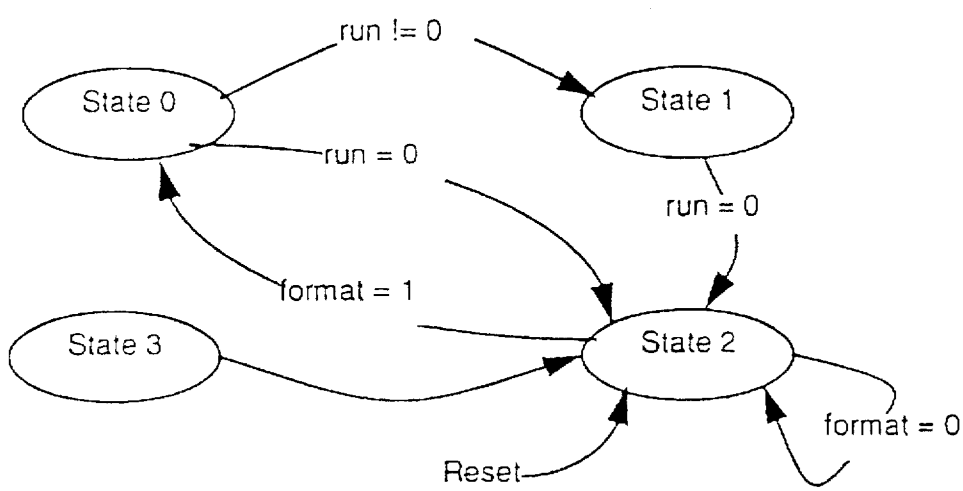
Figure 130:
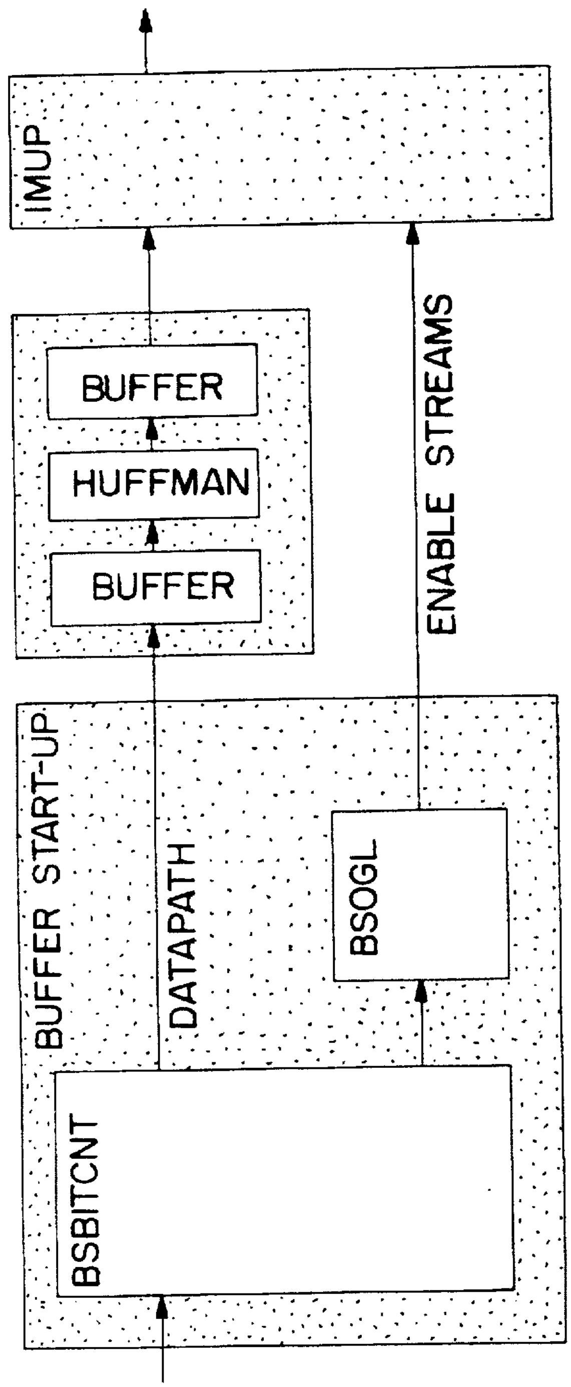
Figure 131:
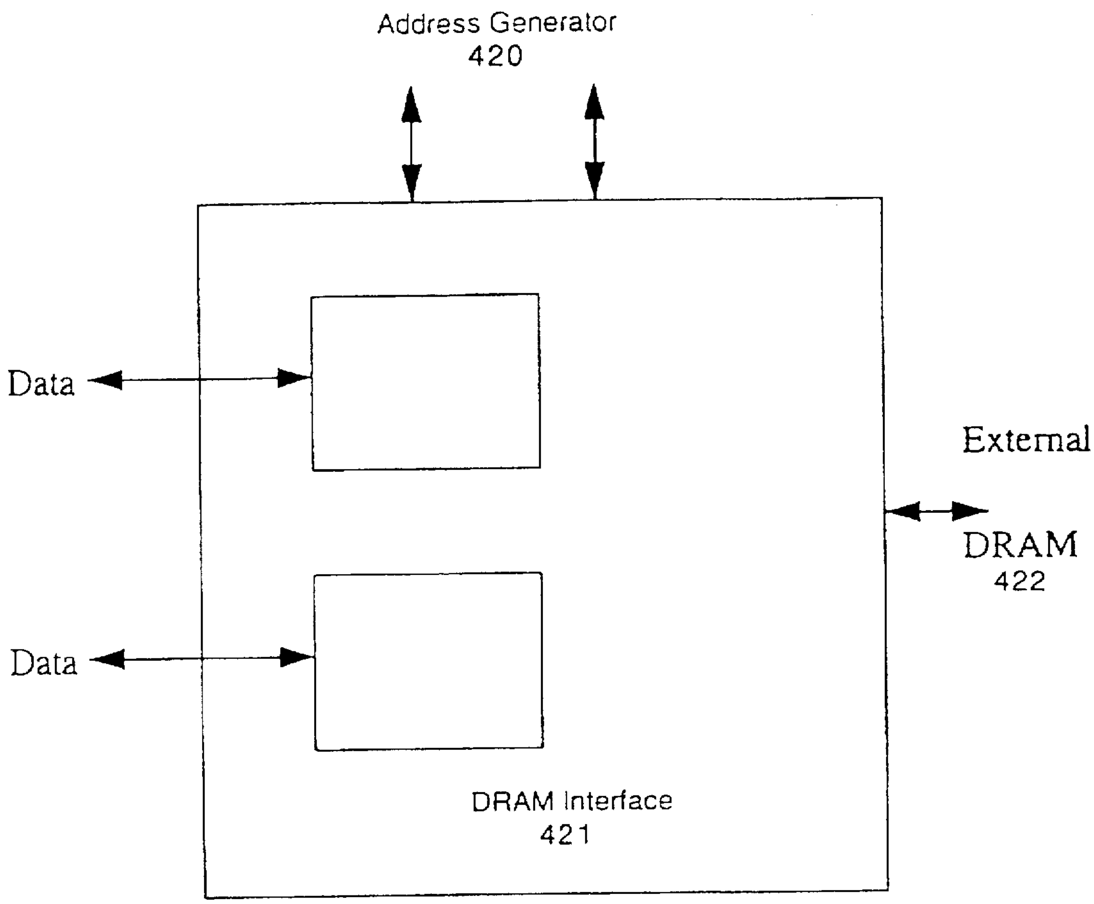
Figure 132:
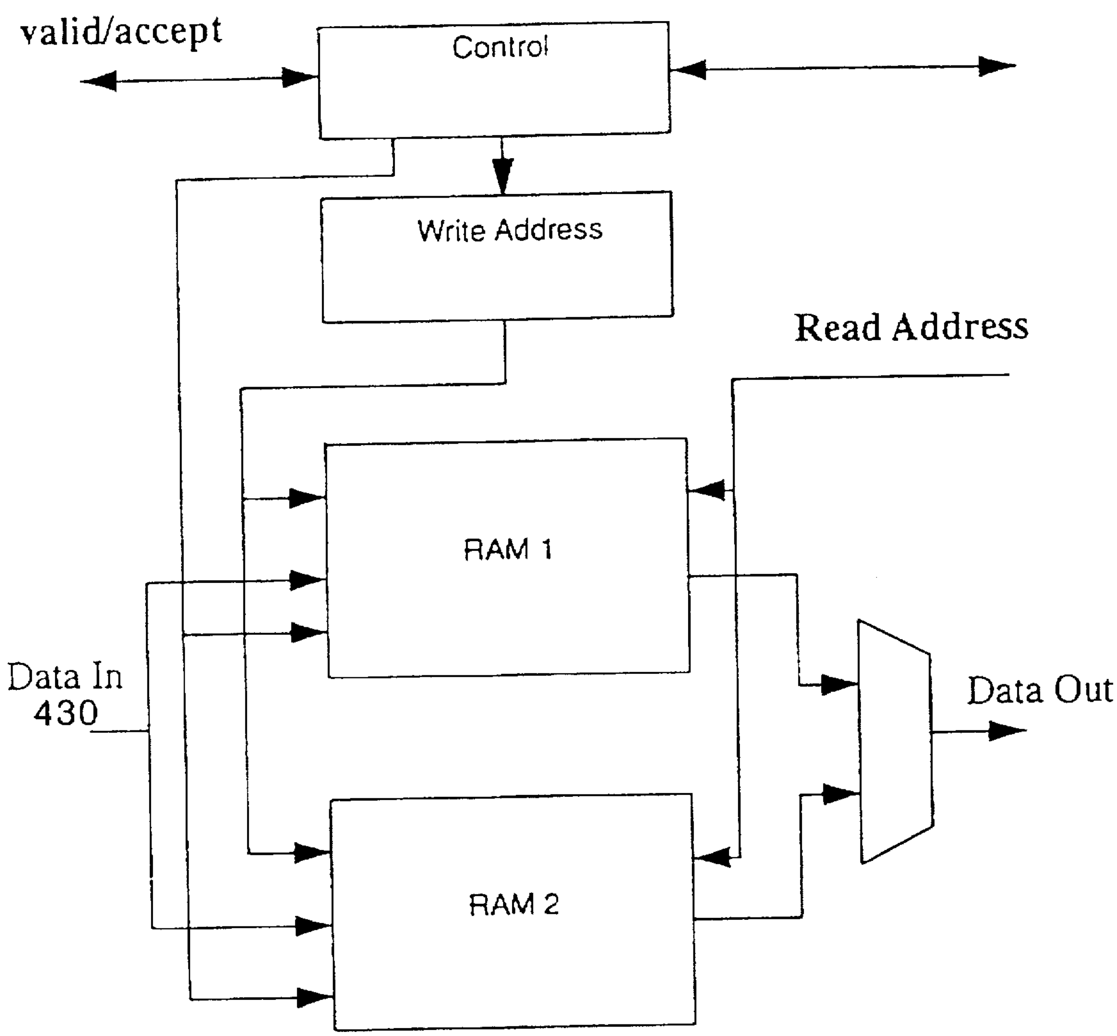
Figure 133:
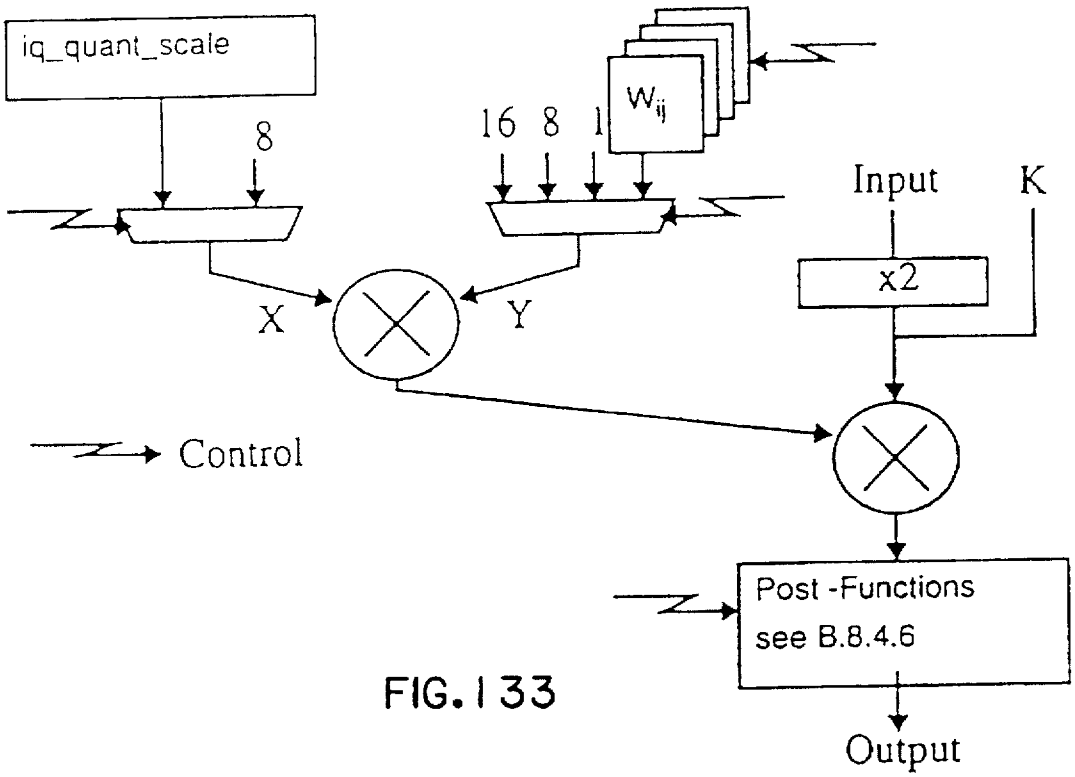
Figure 134:
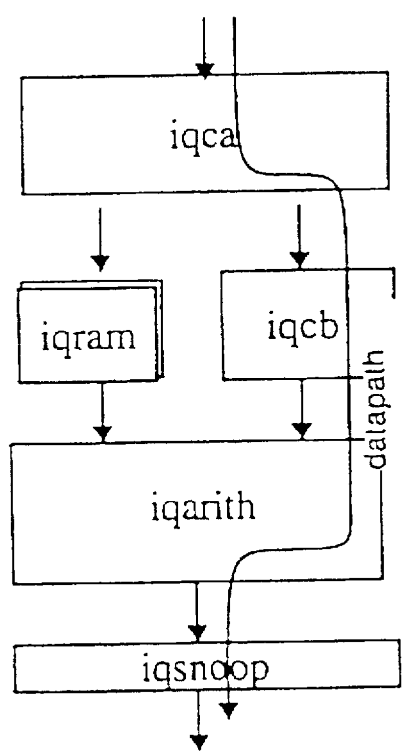
Figure 135:
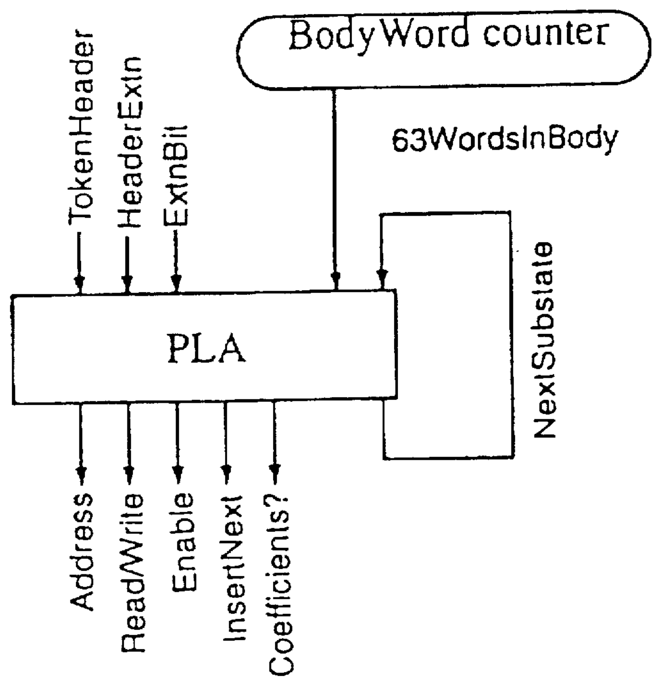
Figure 136:
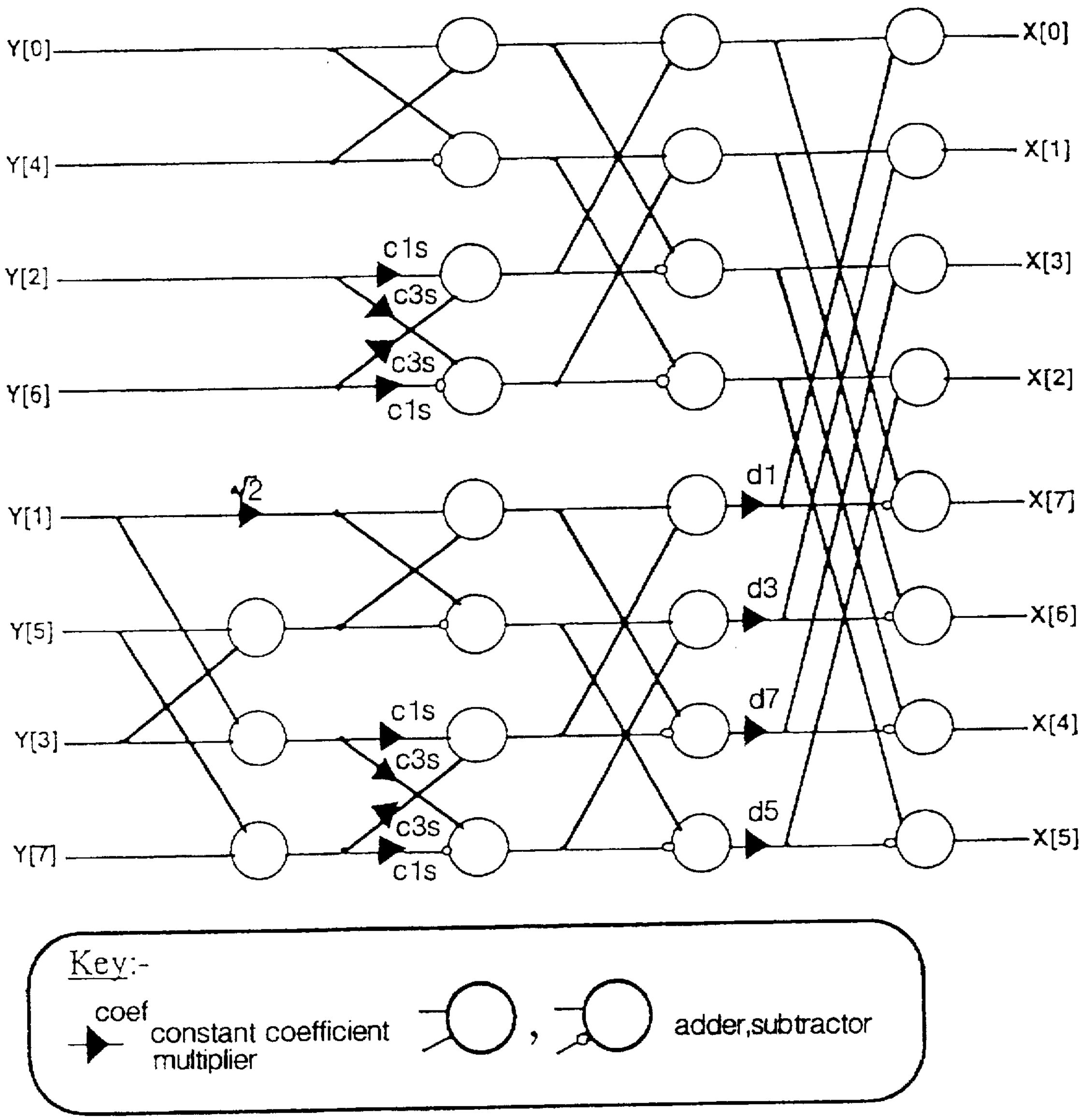
Figure 137:
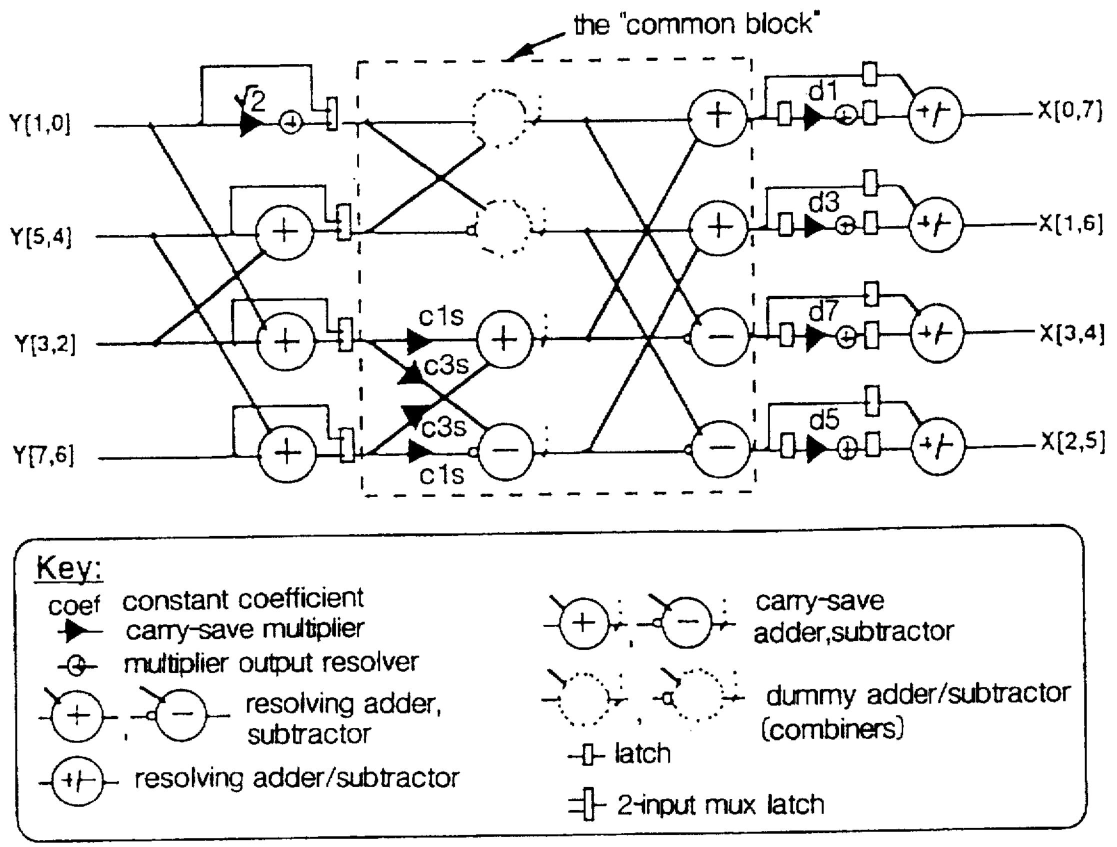
Figure 138:
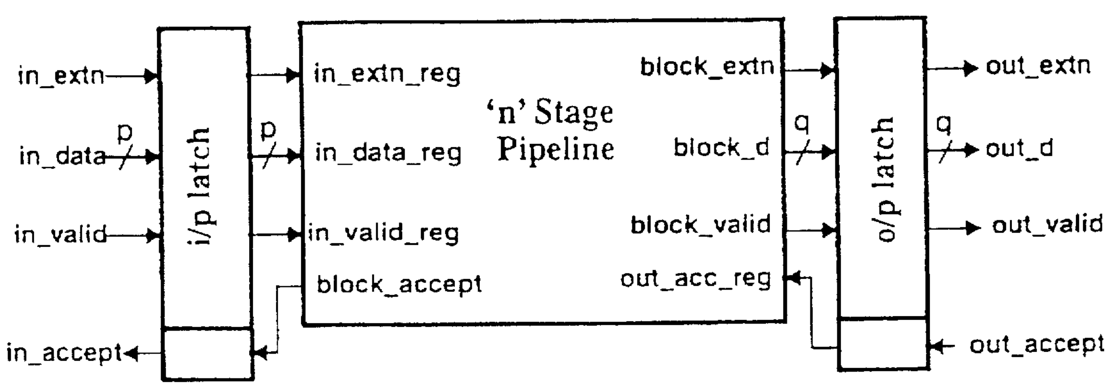
Figure 139:
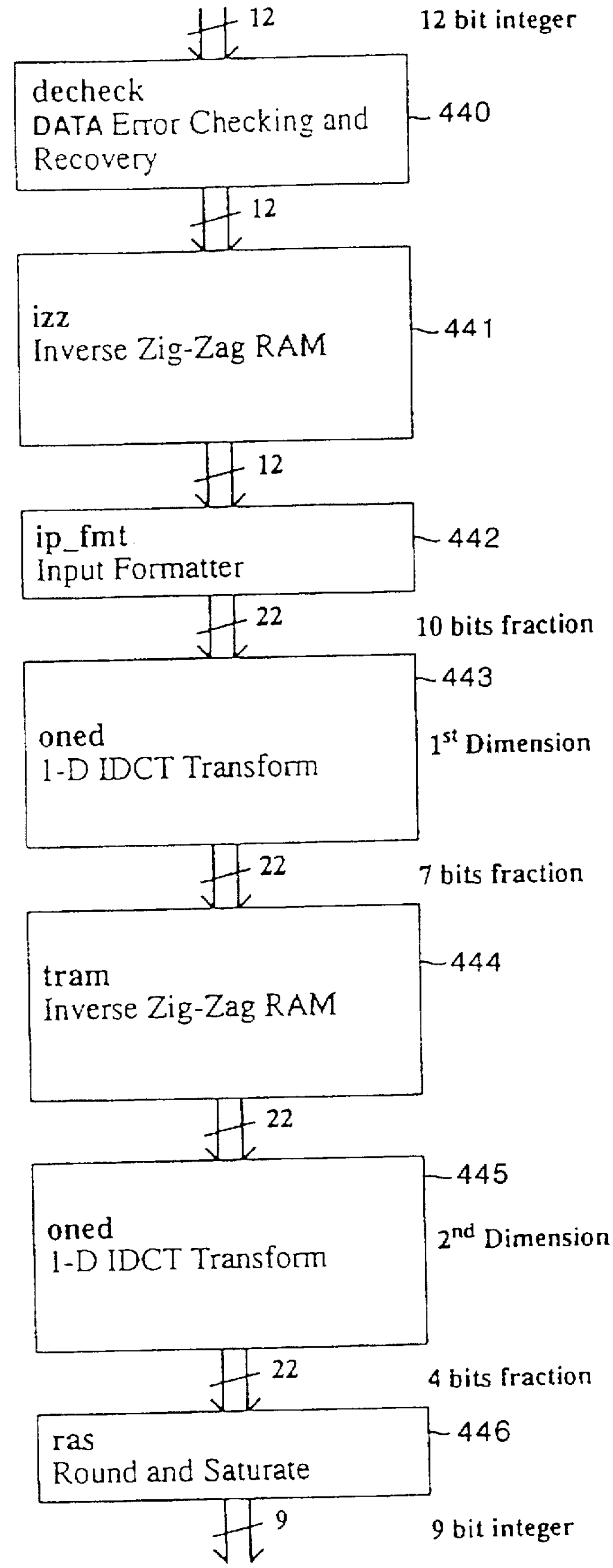
Figure 140:
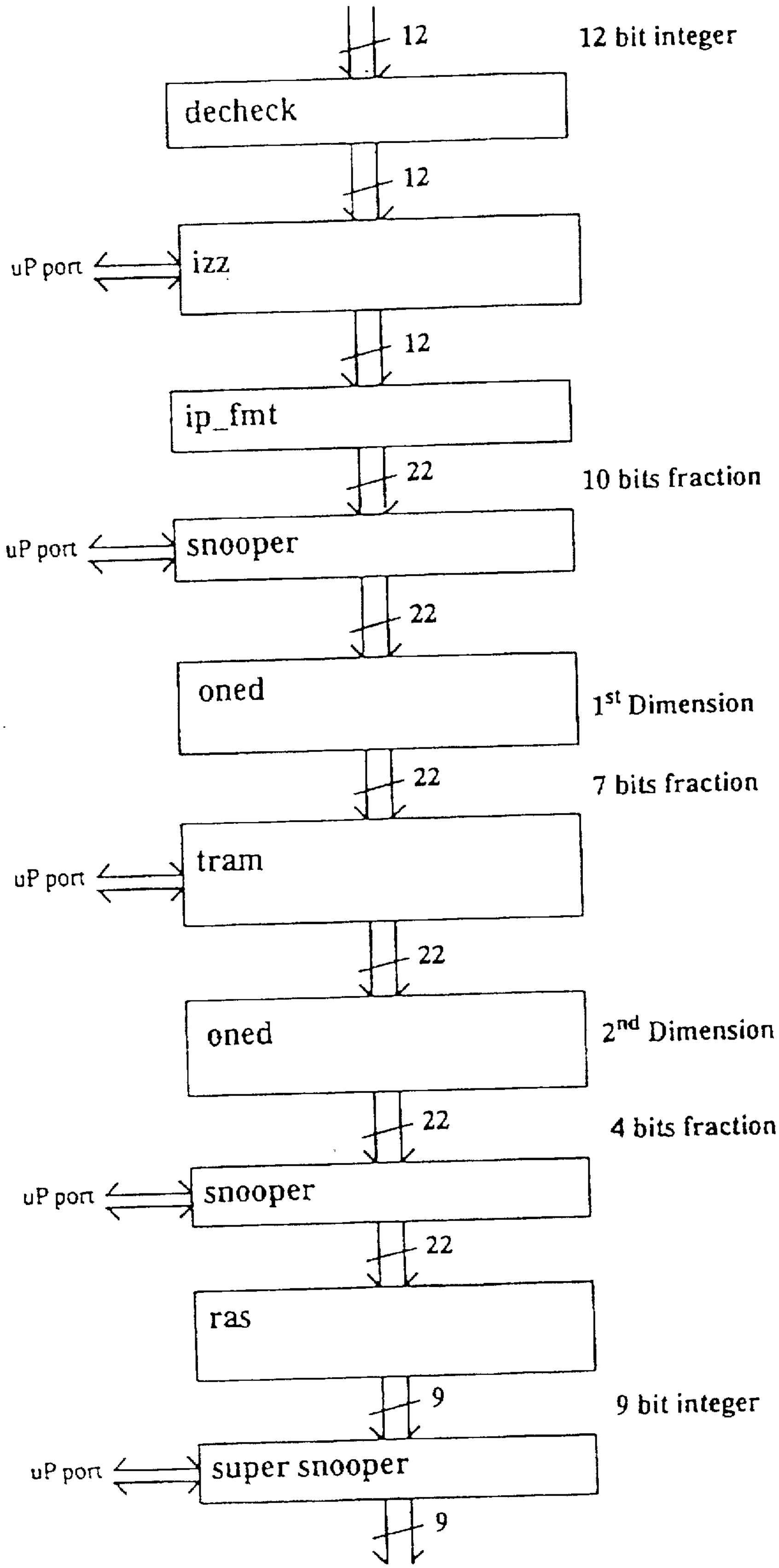
Figure 141:
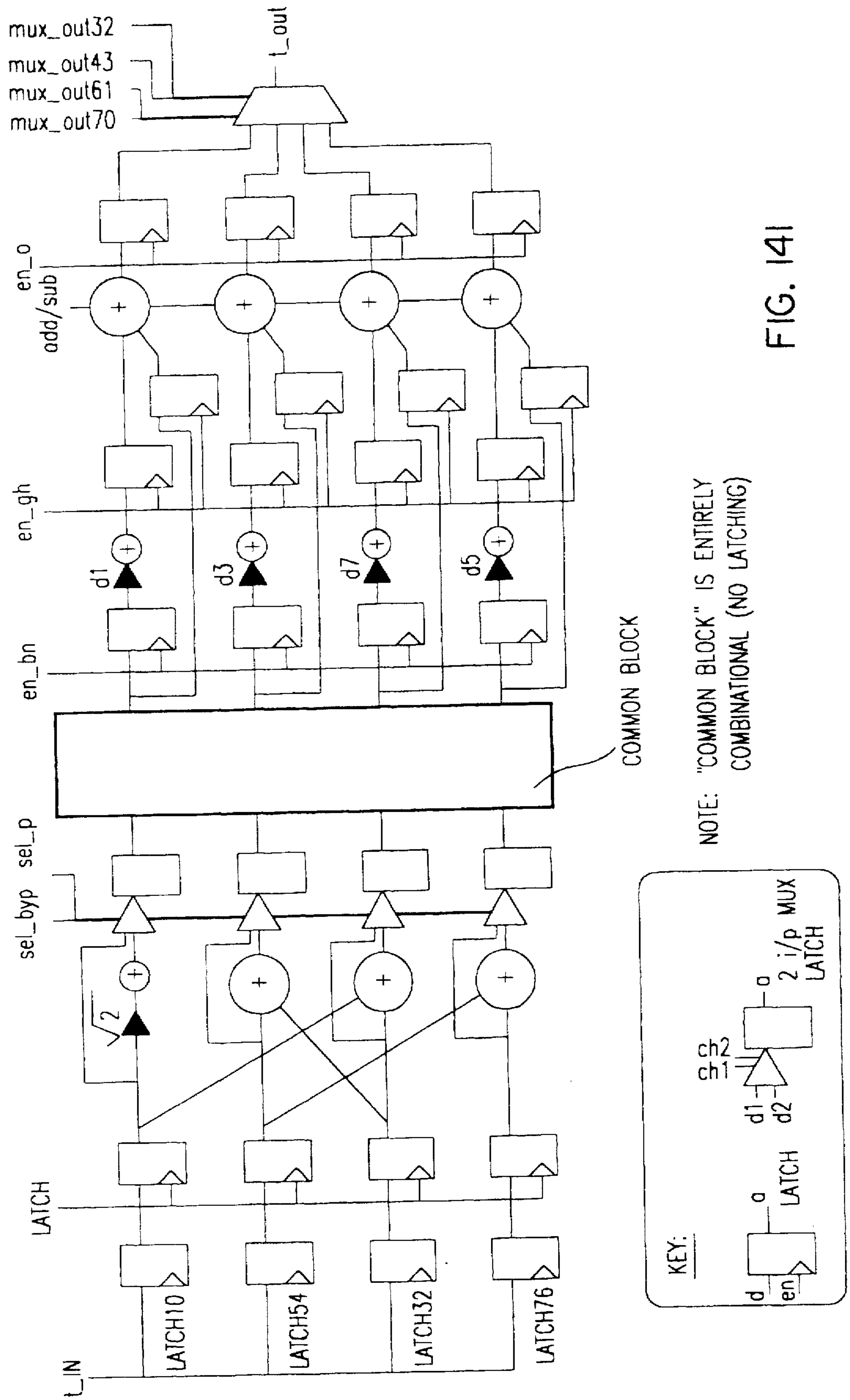
Figure 142:
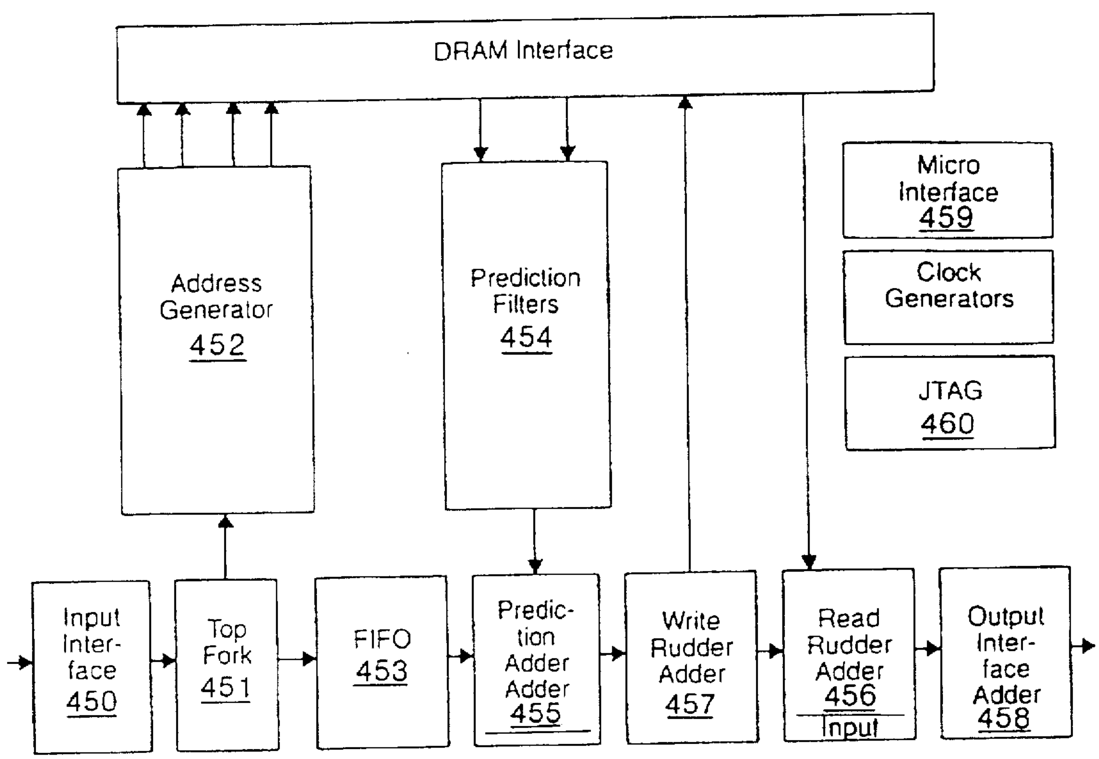
Figure 143:
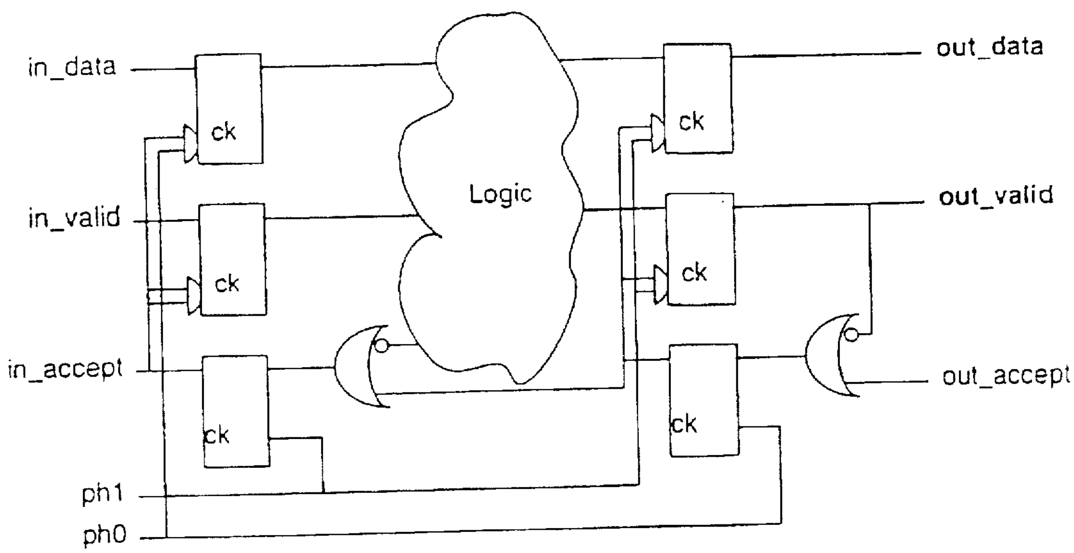
Figure 144:
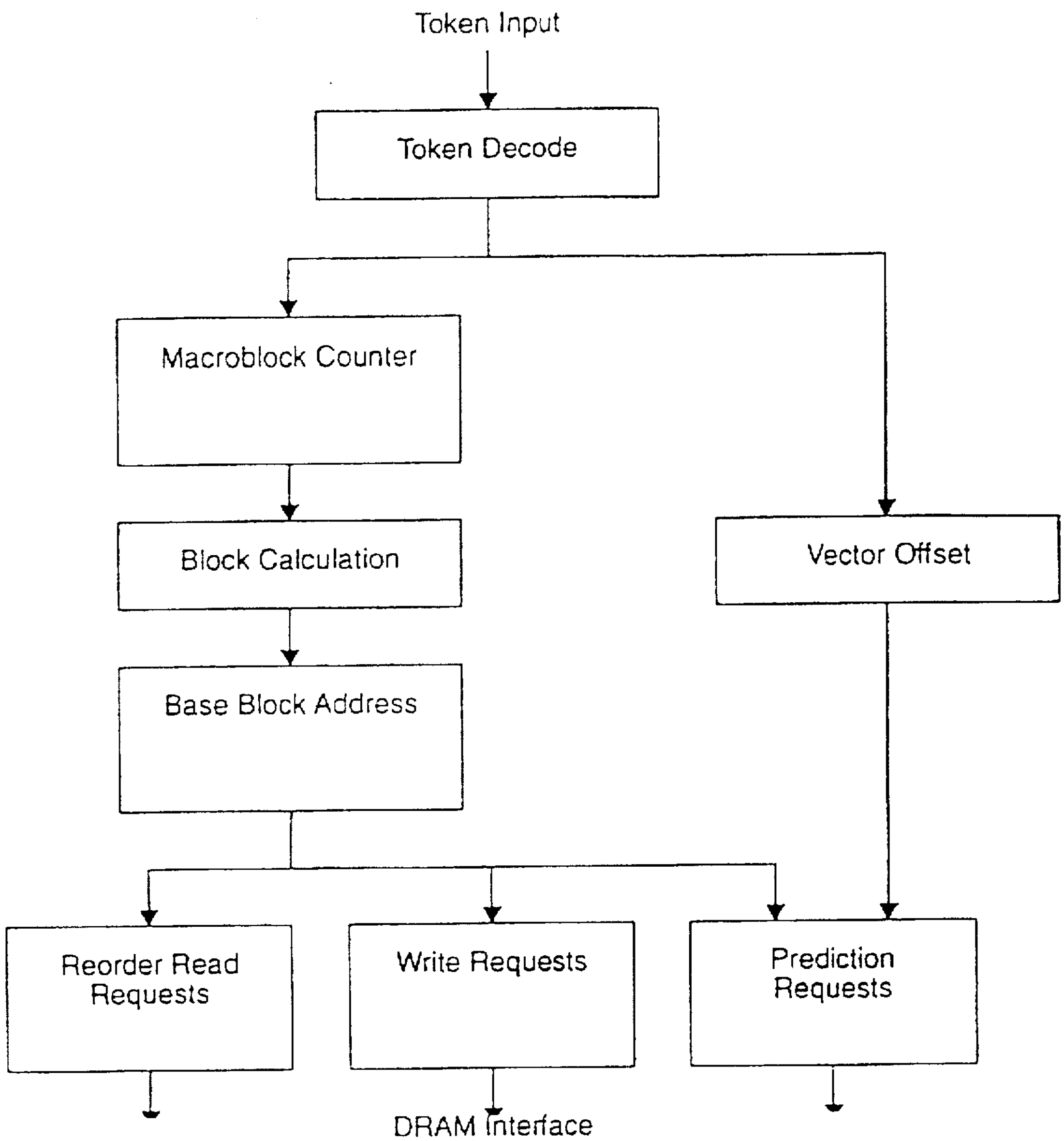
Figure 145:
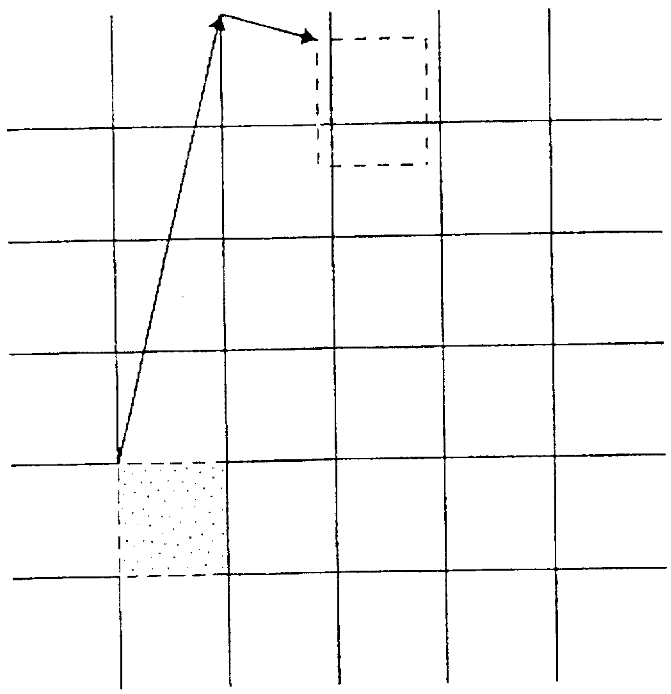
Figure 146:
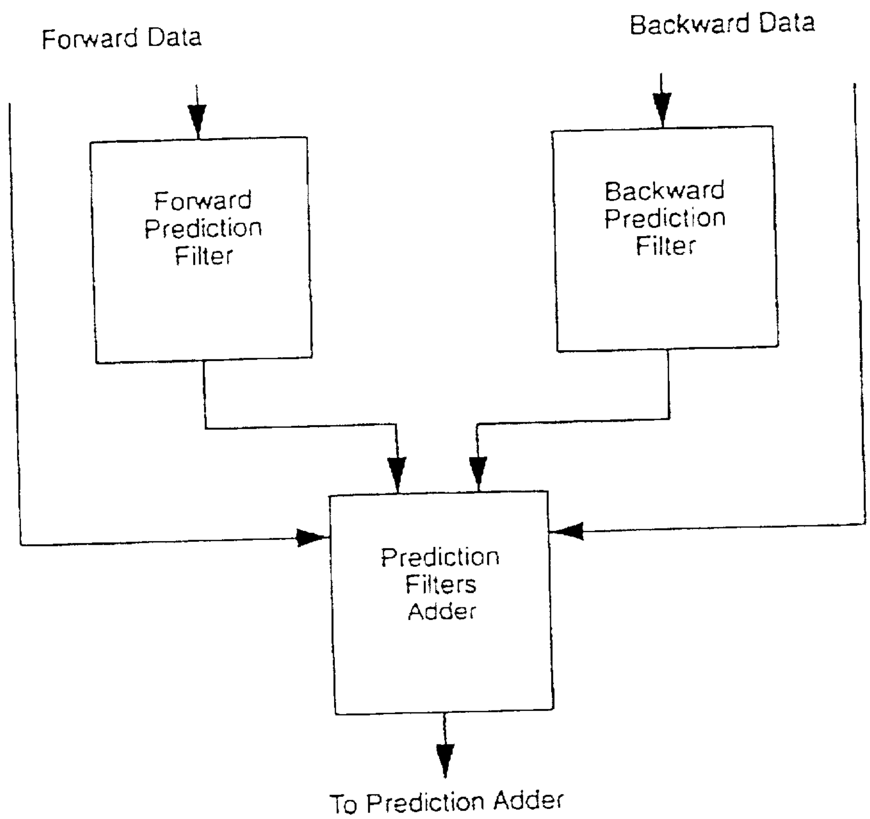
Figure 147:
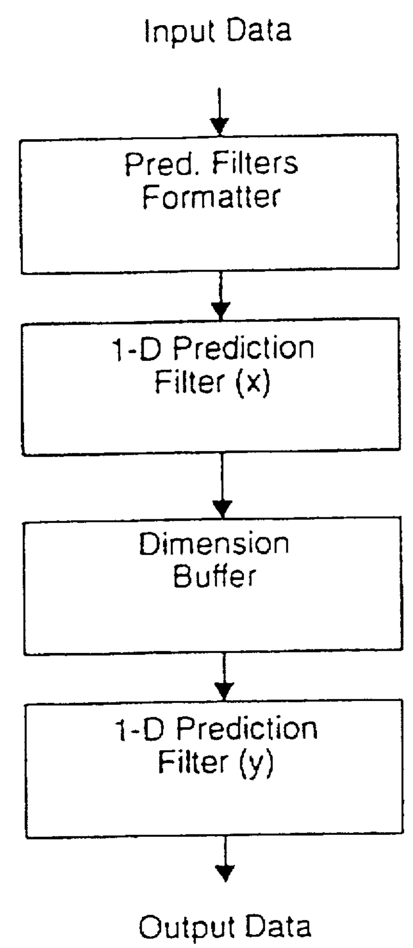

| FIGS. | |
|---|---|
| FIG. 88 | shows how "B" pictures are formed and output; |
| FIG. 89 | shows P picture formation; |
| FIG. 90 | shows H.261 prediction formation; |
| FIG. 91 | shows an H.261 "sequence"; |
| FIG. 92 | shows a hierarchy of H.261 syntax; |
| FIG. 93 | shows an H.261 picture layer; |
| FIG. 94 | shows an H.261 arrangement of groups of blocks; |
| FIG. 95 | shows an H.261 "slice" layer; |
| FIG. 96 | shows an H.261 arrangement of macroblocks; |
| FIG. 97 | shows an H.261 sequence of blocks; |
| FIG. 98 | shows an H.261 macroblock layer; |
| FIG. 99 | shows an H.261 arrangement of pels in blocks; |
| FIG. 100 | shows a hierarchy of MPEG syntax; |
| FIG. 101 | shows an MPEG sequence layer; |
| FIG. 102 | shows an MPEG group of pictures layer; |
| FIG. 103 | shows an MPEG picture layer; |
| FIG. 104 | shows an MPEG "slice" layer; |
| FIG. 105 | shows an MPEG sequence of blocks; |
| FIG. 106 | shows an MPEG macroblock layer; |
| FIG. 107 | shows an "open GOP"; |
| FIG. 108 | shows examples of access structure; |
| FIG. 109 | shows access start timing; |
| FIG. 110 | shows a fast page read cycle; |
| FIG. 111 | shows a fast page write cycle; |
| FIG. 112 | shows a refresh cycle; |
| FIG. 113 | shows extracting row and column address from a chip address; |
| FIG. 114 | shows timing parameters for any strobe signal; |
| FIG. 115 | shows timing parameters between any two strobe signals; |
| FIG. 116 | shows timing parameters between a bus and a strobe; |
| FIG. 117 | shows timing parameters between a bus and a strobe; |
| FIG. 118 | shows a Huffman decoder and parser; |
| FIG. 119 | shows an H.261 and an MPEG AC Coefficient Decoding Flow Chart; |
| FIG. 120 | shows a block diagram for JPEG (AC and DC) coefficient decoding; |
| FIG. 121 | shows a flow diagram for JPEG (AC and DC) coefficient decoding; |
| FIG. 122 | shows an interface to the Huffman Token Formatter; |
| FIG. 123 | shows a token formatter block diagram; |
| FIG. 124 | shows an H.261 and an MPEG AC Coefficient Decoding; |
| FIG. 125 | shows the interface to the Huffman ALU; |
| FIG. 126 | shows the basic structure of the Huffman ALU; |
| FIG. 127 | shows the buffer manager; |
| FIG. 128 | shows an imodel and hsppk block diagram; |
| FIG. 129 | shows an imex state diagram; |
| FIG. 130 | illustrates the buffer start-up; |
| FIG. 131 | shows a DRAM interface; |
| FIG. 132 | shows a write swing buffer; |
| FIG. 133 | shows an arithmetic block; |
| FIG. 134 | shows an iq block diagram; |
| FIG. 135 | shows an iqca state machine; |
| FIG. 136 | shows an IDCT 1-D Transform Algorithm; |
| FIG. 137 | shows an IDCT 1-D Transform Architecture; |
| FIG. 138 | shows a token stream block diagram; |
| FIG. 139 | shows a standard block structure; |
| FIG. 140 | is a block diagram showing; microprocessor test access; |
| FIG. 141 | shows 1-D Transform Micro-Architecture; |
| FIG. 142 | shows a temporal decoder block diagram; |
| FIG. 143 | shows the structure of a Two-wire interface stage; |
| FIG. 144 | shows the address generator block diagram; |
| FIG. 145 | shows the block and pixel offsets; |
| FIG. 146 | shows multiple prediction filters; |
| FIG. 147 | shows a single prediction filter; |

-continued

Figures 148, 149:
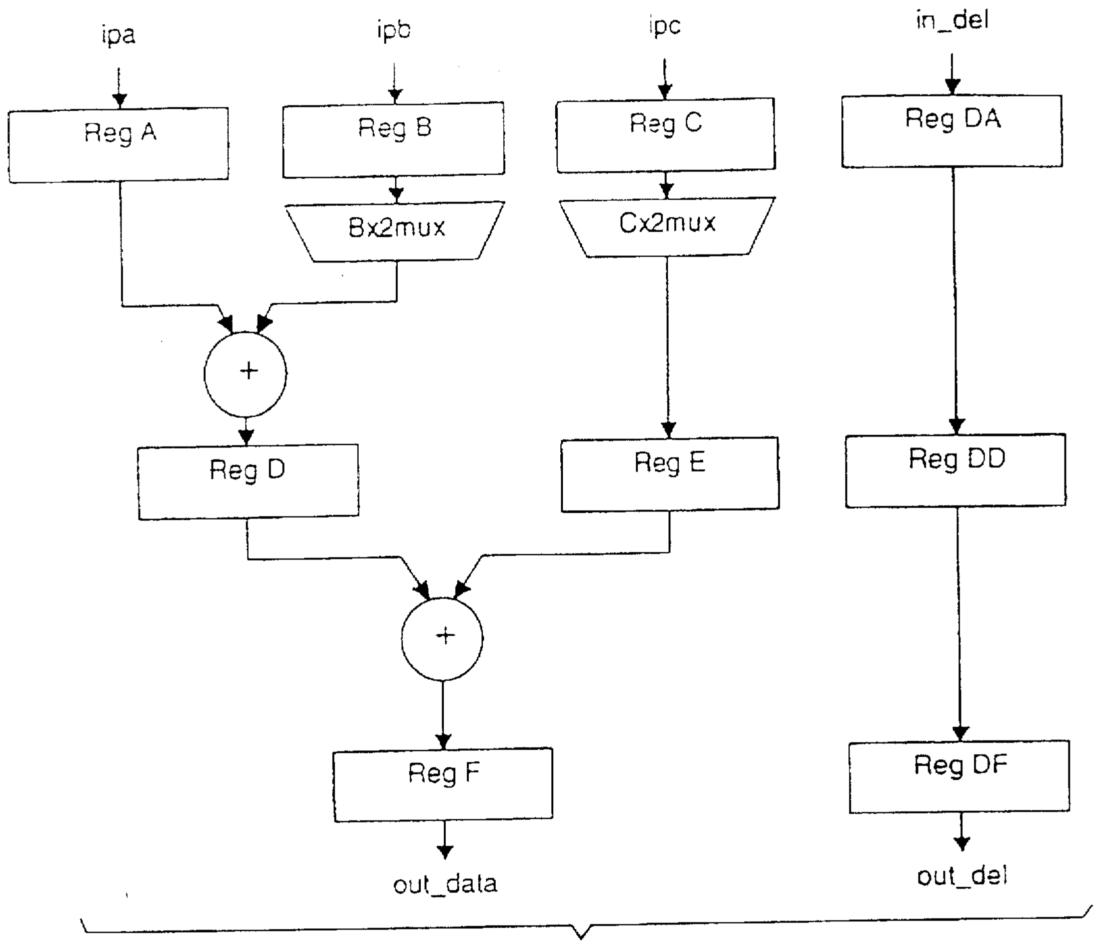
Figure 150:
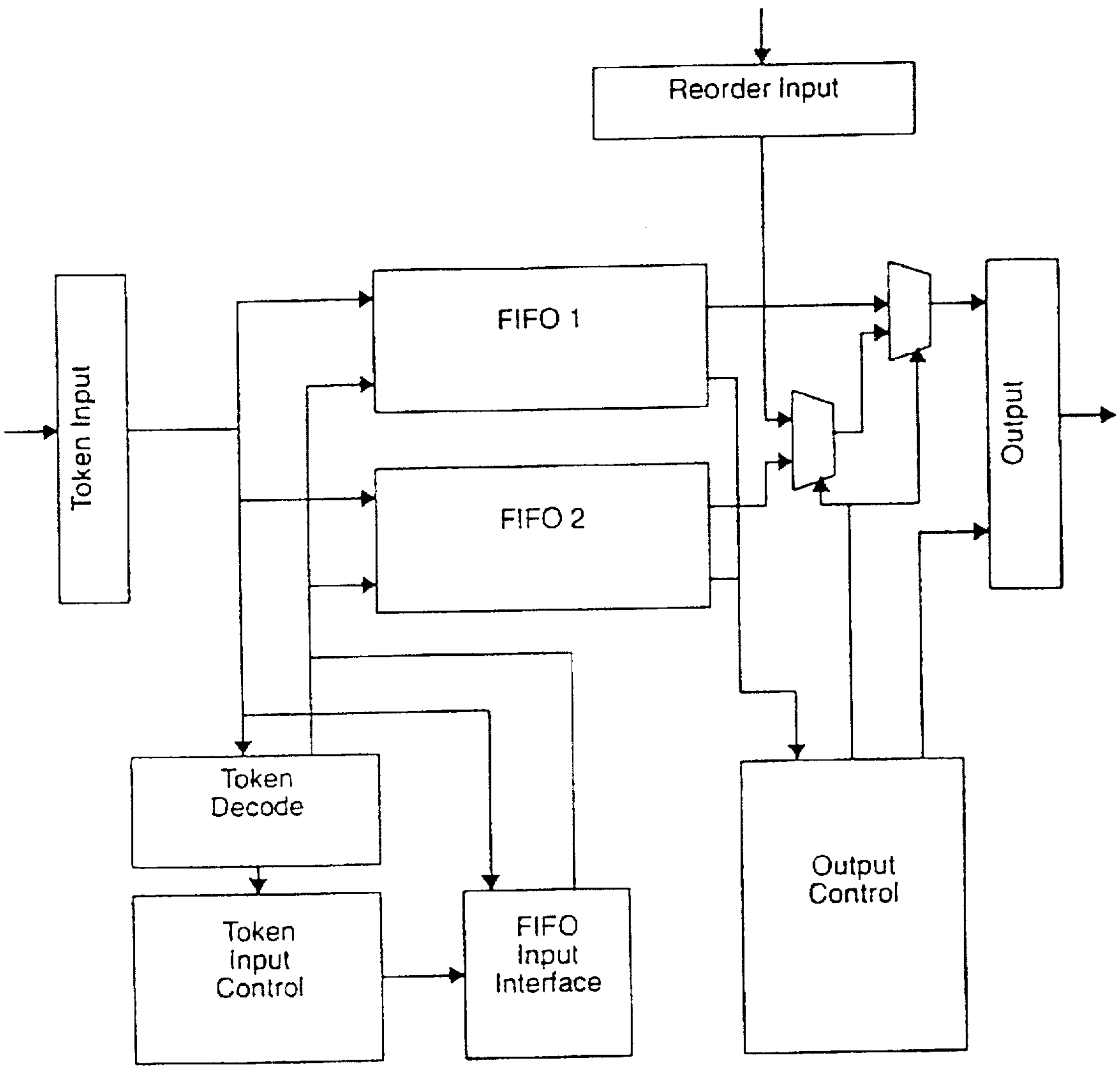
Figure 151:
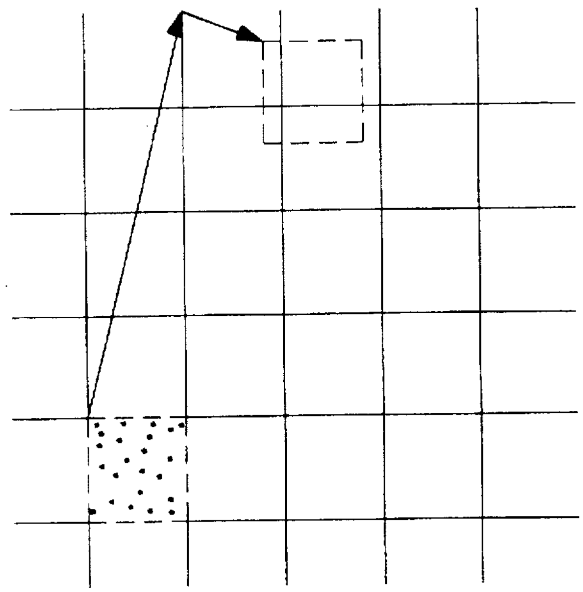
Figure 152:
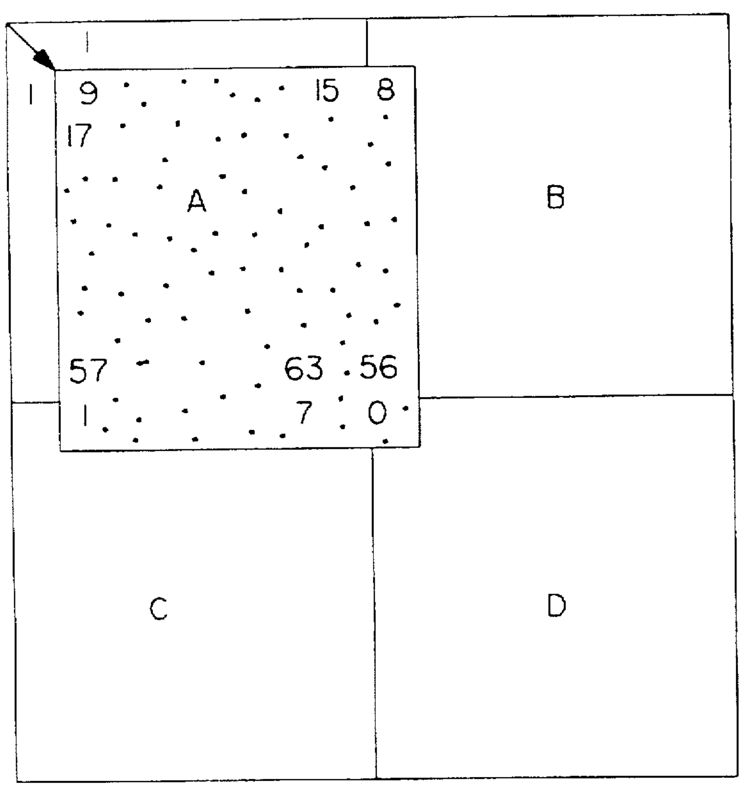
Figure 153:
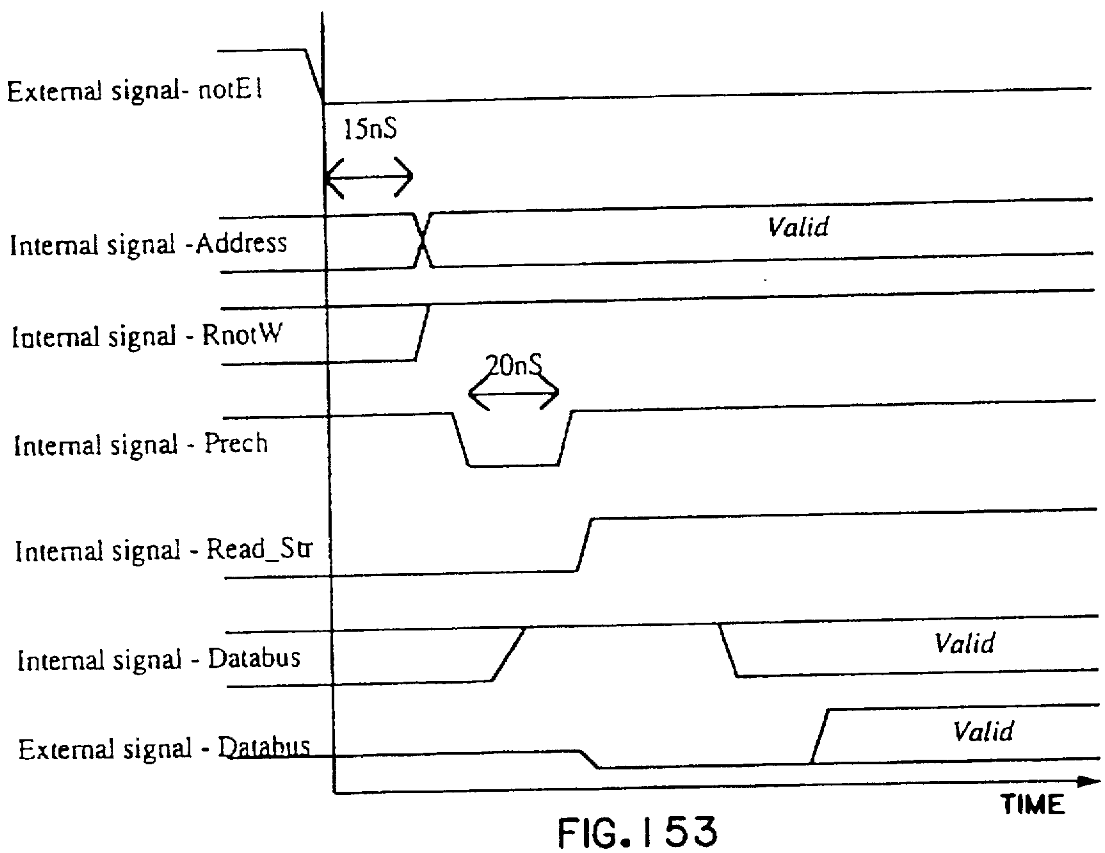
Figure 154:
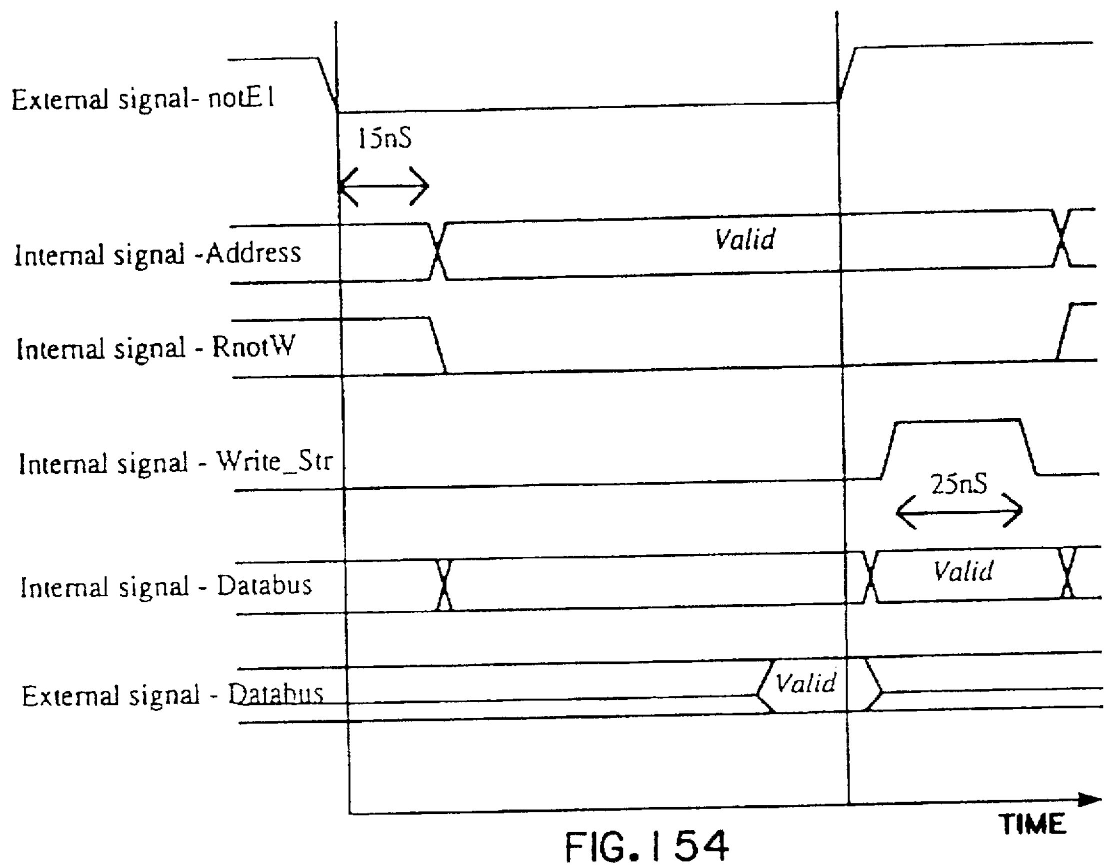
Figure 155:
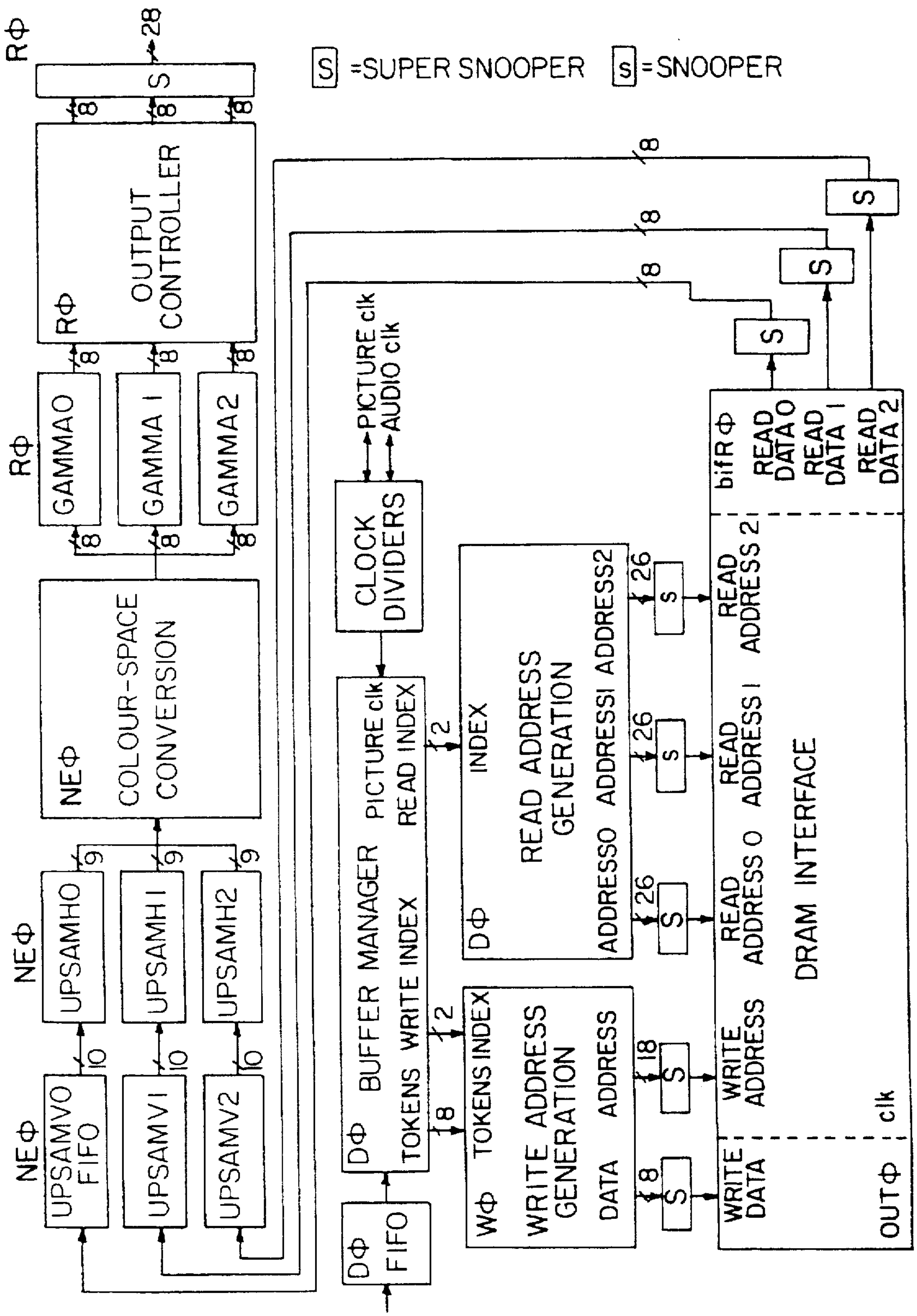
Figure 156:
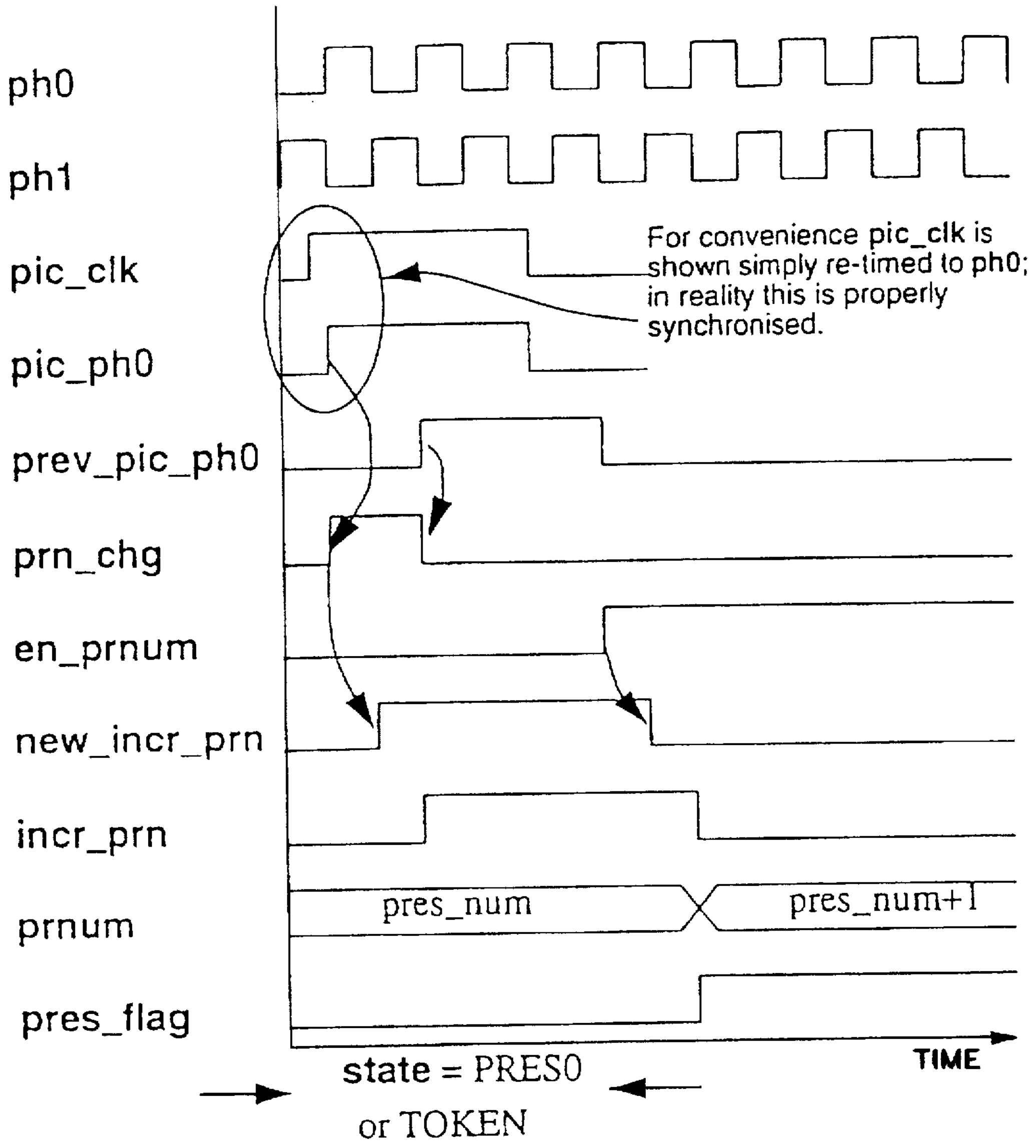
Figure 157:
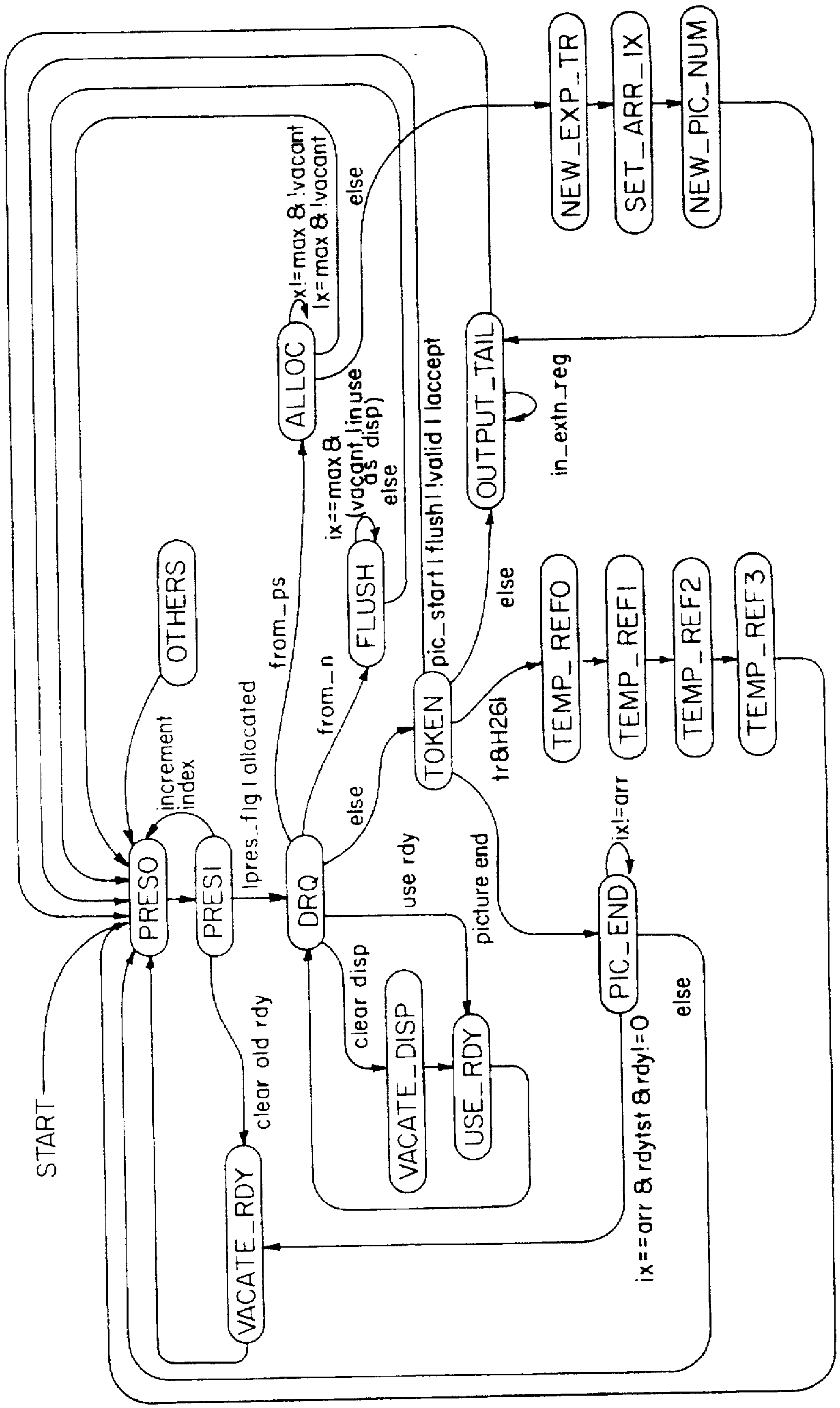
Figure 158:
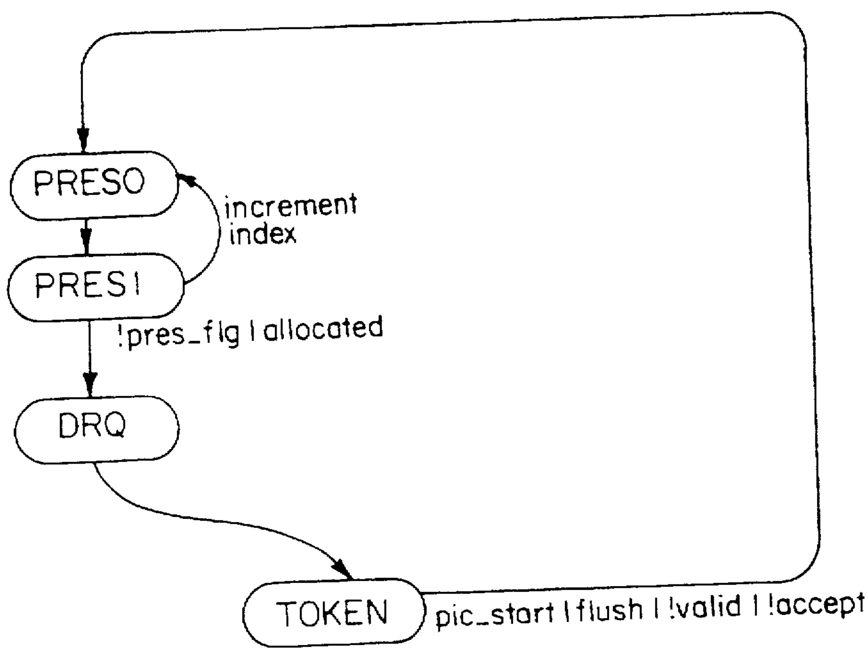
Figure 159A:
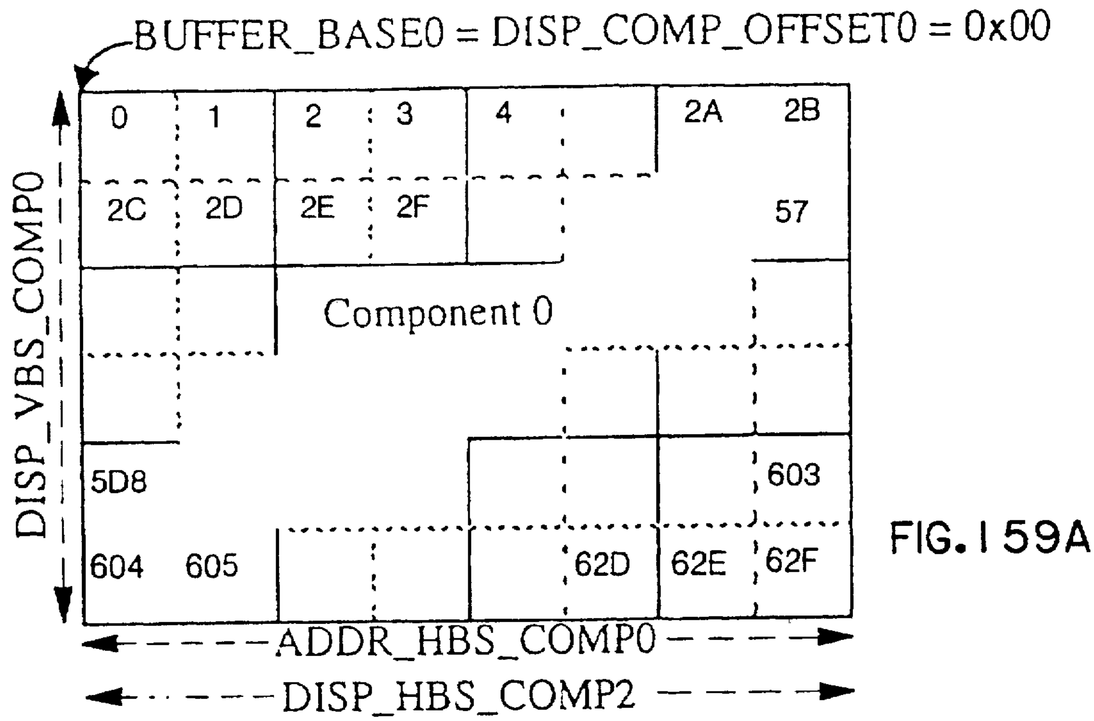
Figure 159B:
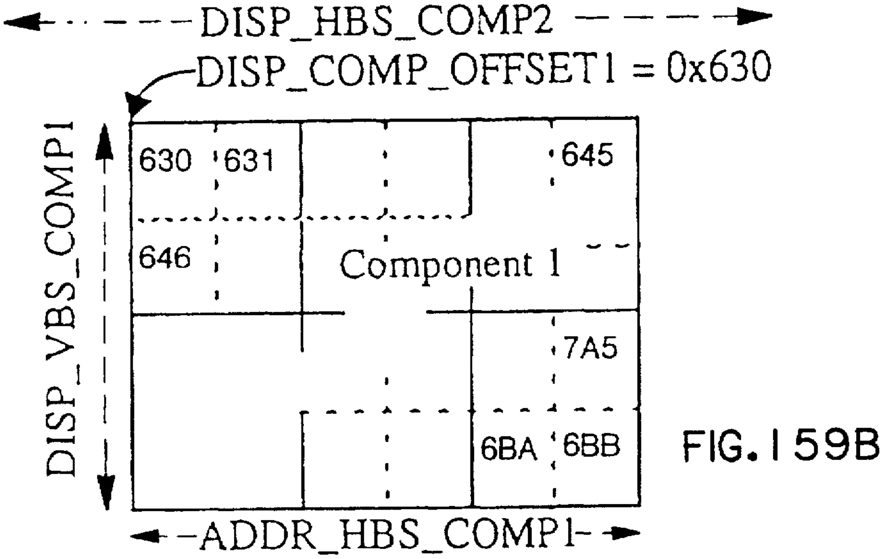
Figure 159C:
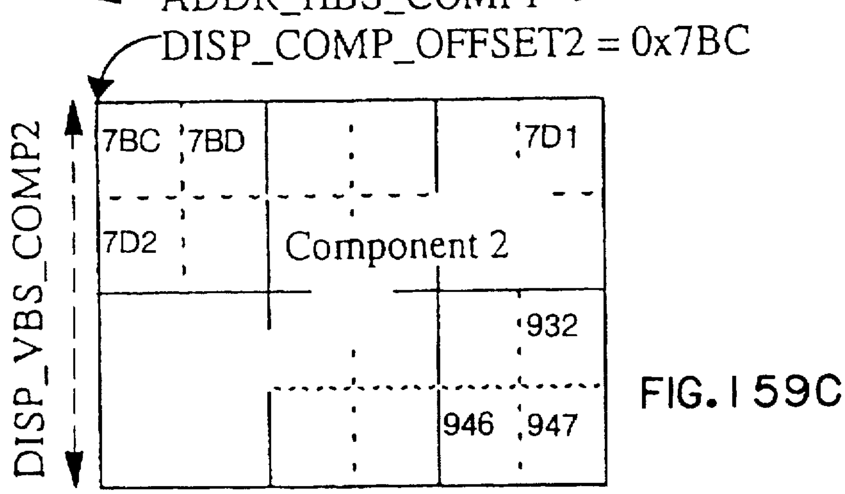
Figure 160:
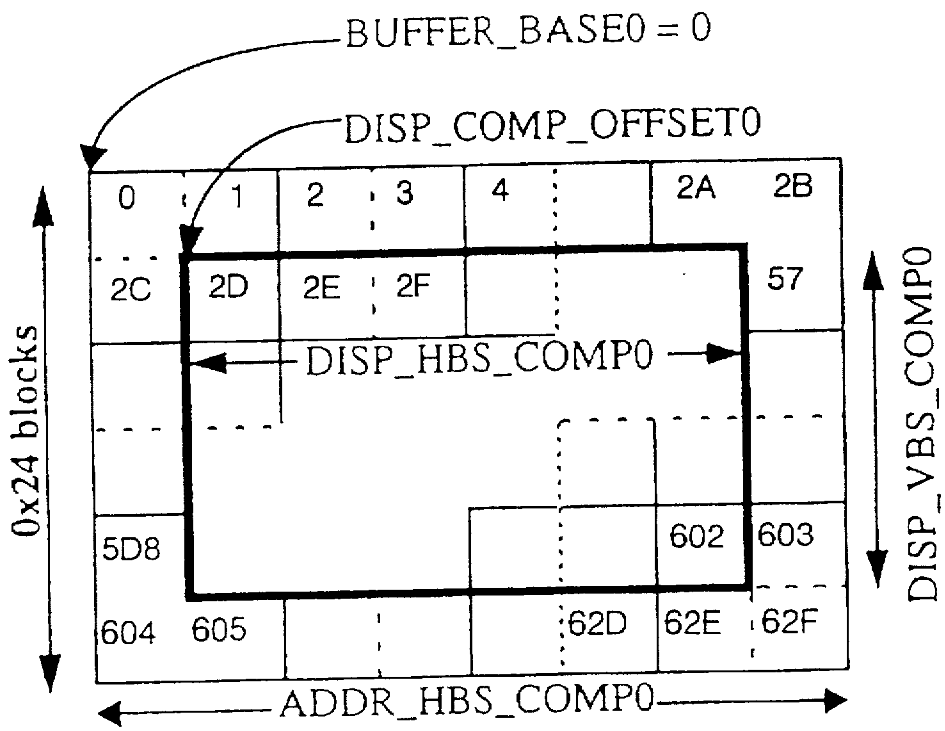
Figure 162:
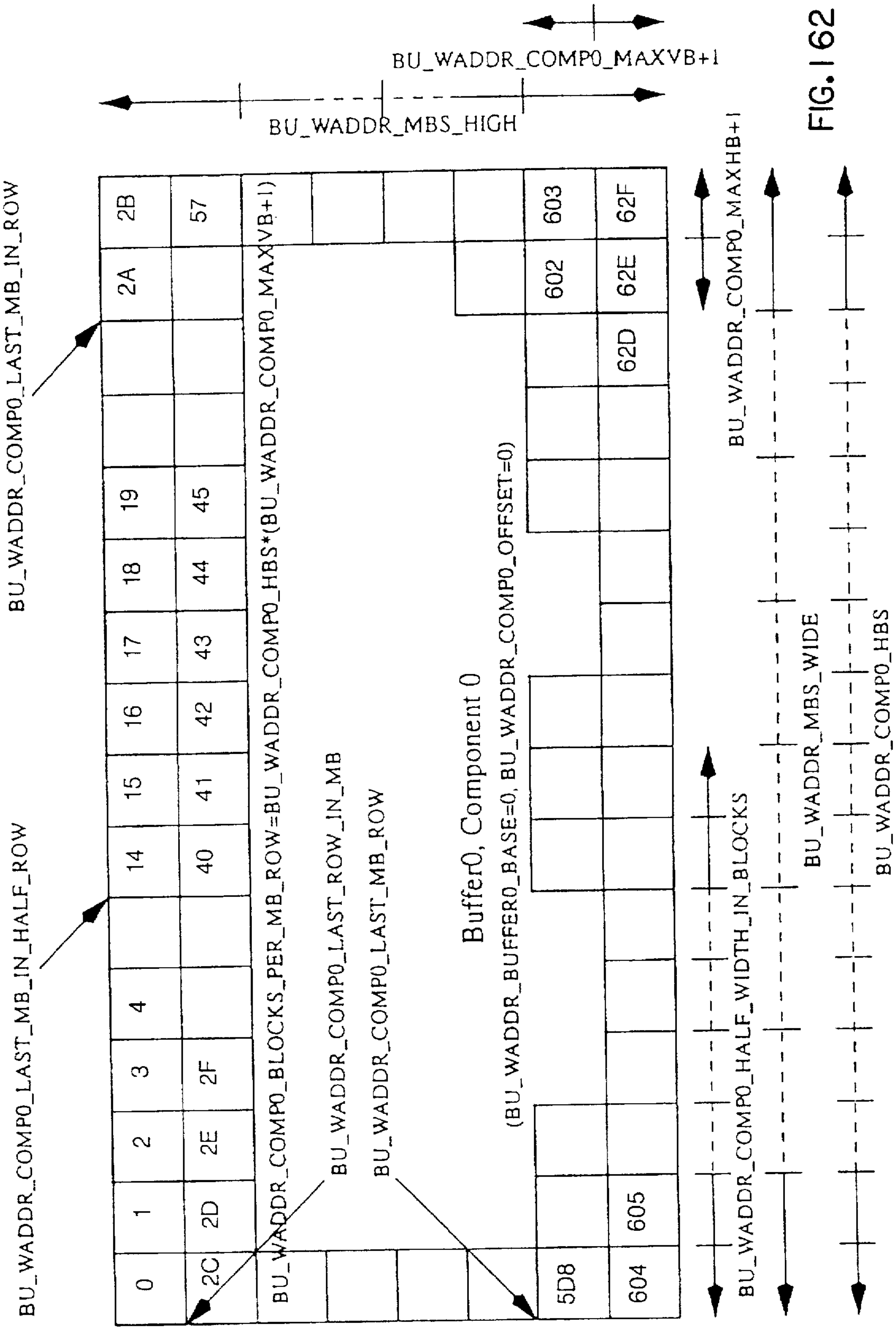
Figure 163A:
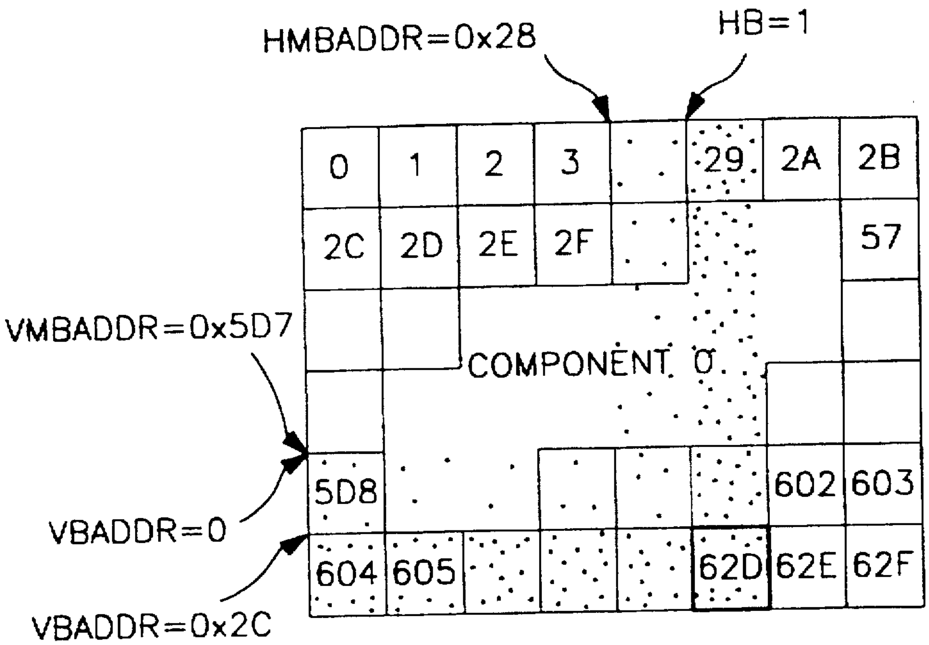
Figure 163B:
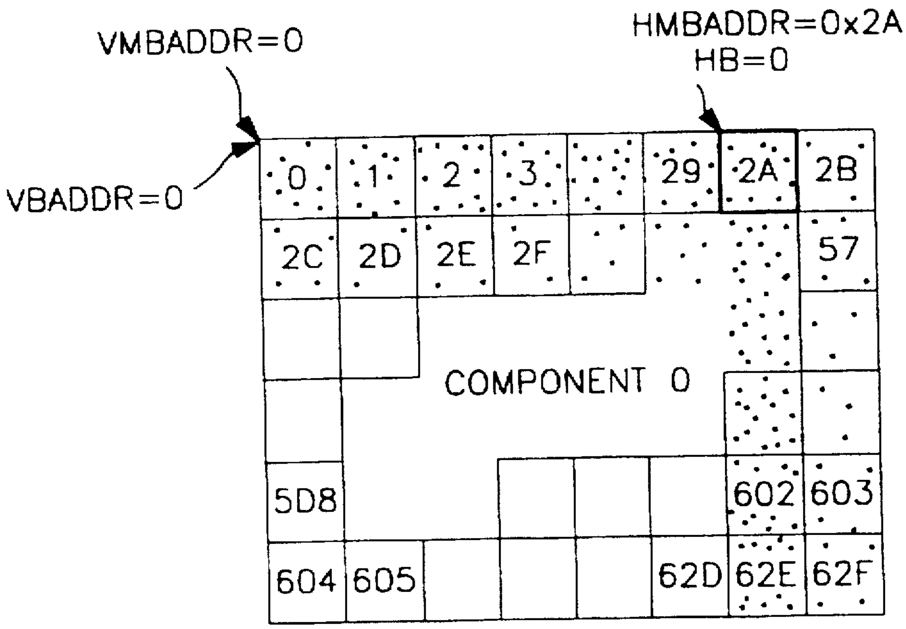
Figure 164:
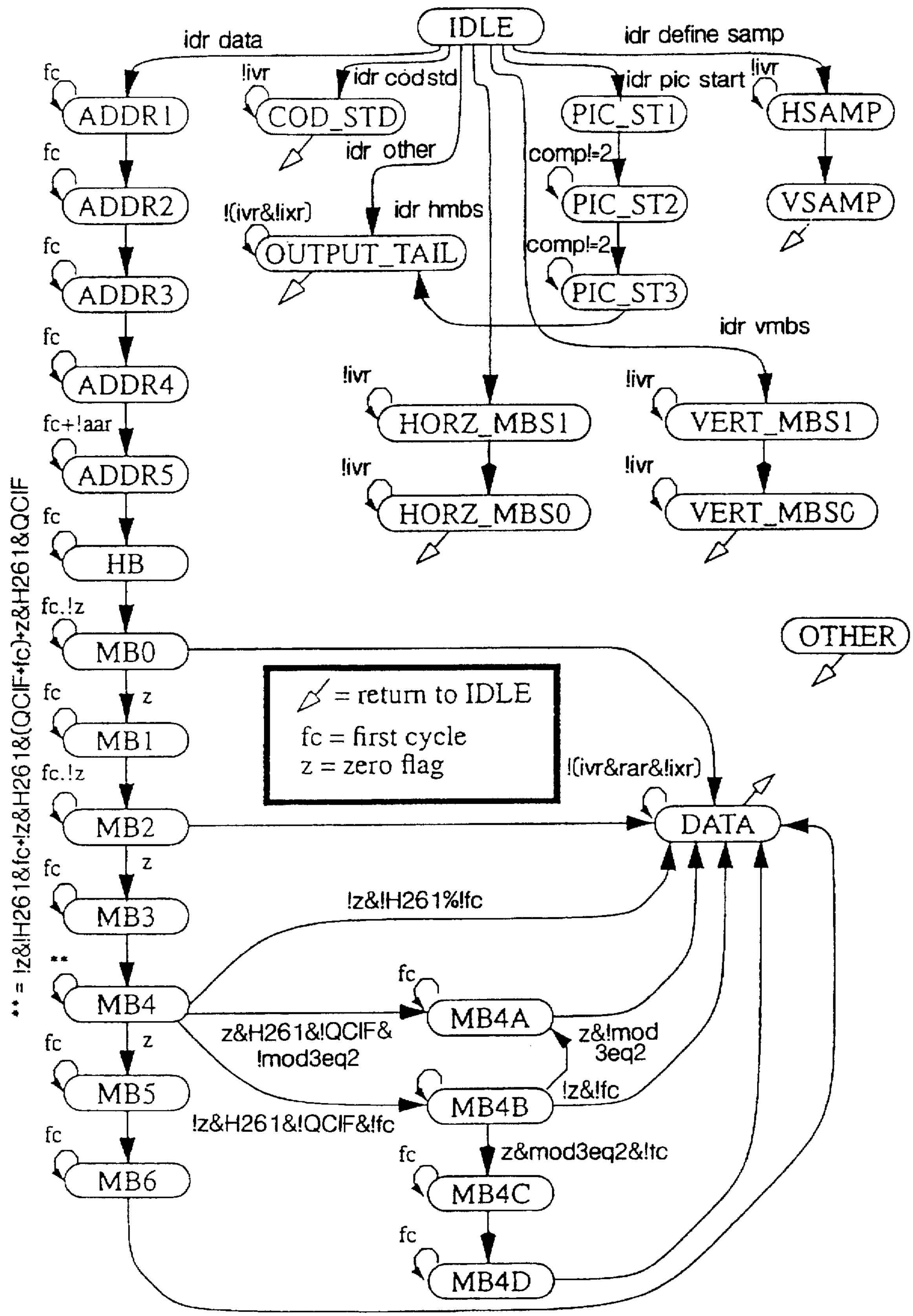
Figure 165:
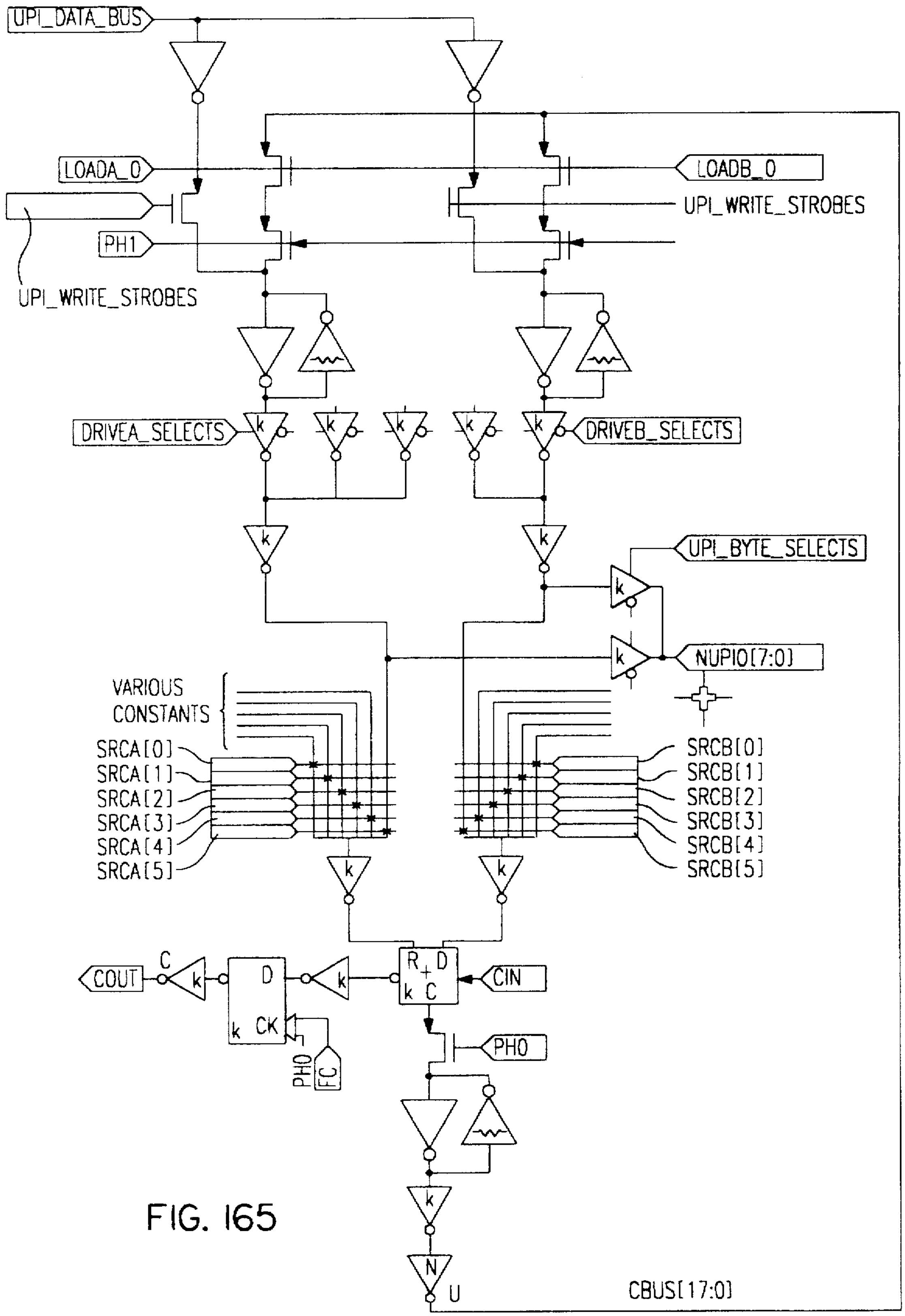
Figure 166:
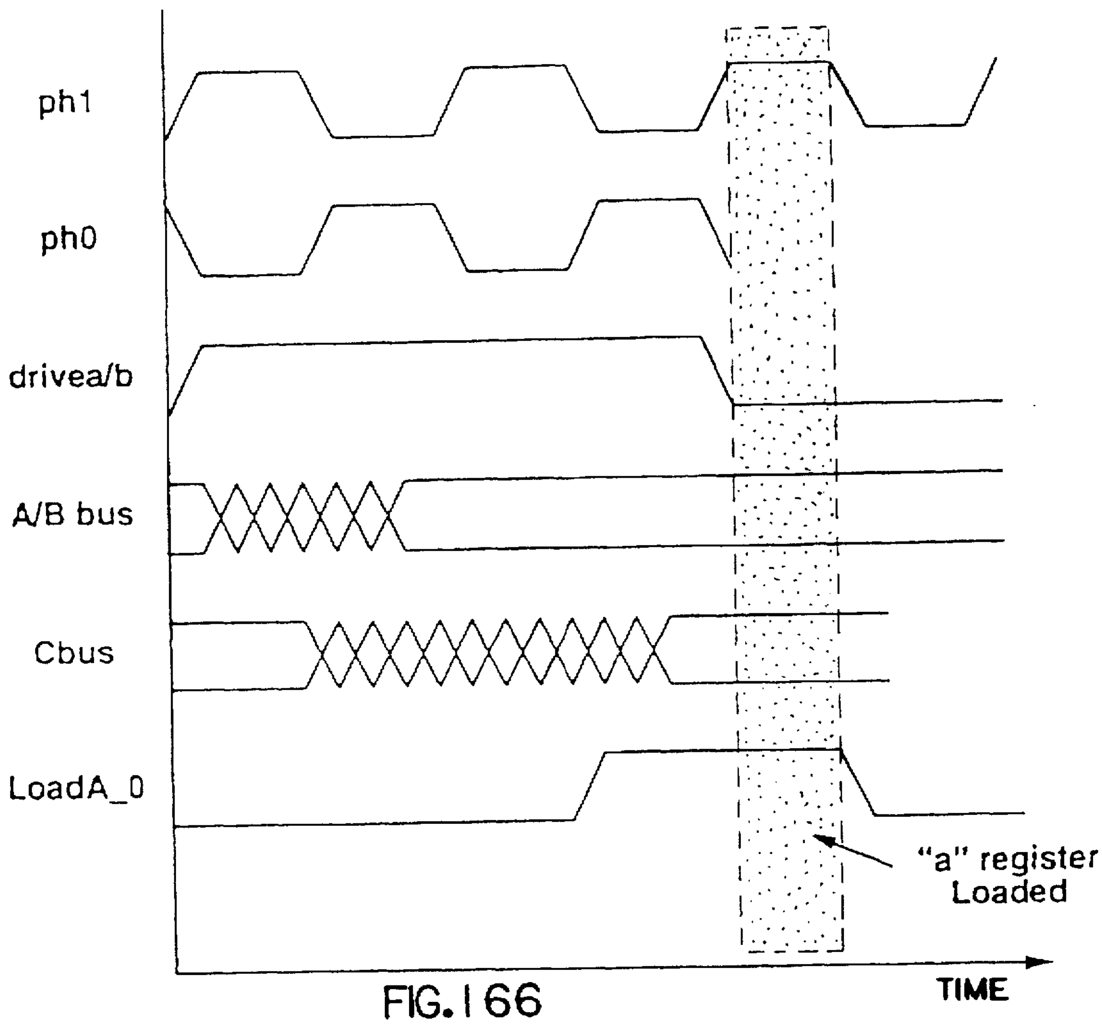
Figure 167:
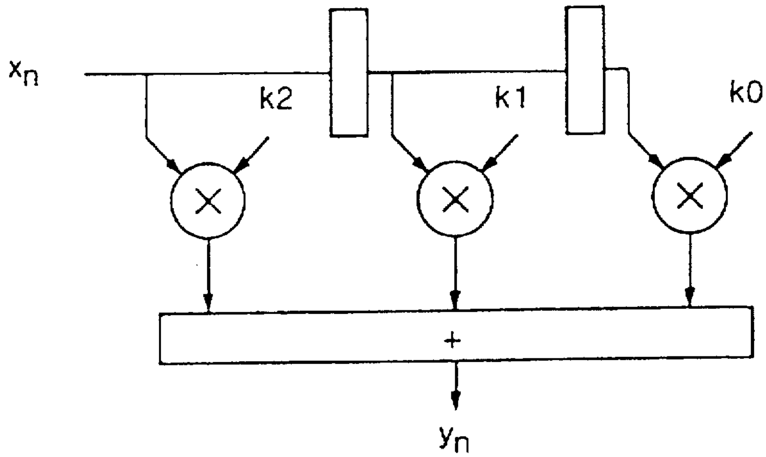
Figure 168:
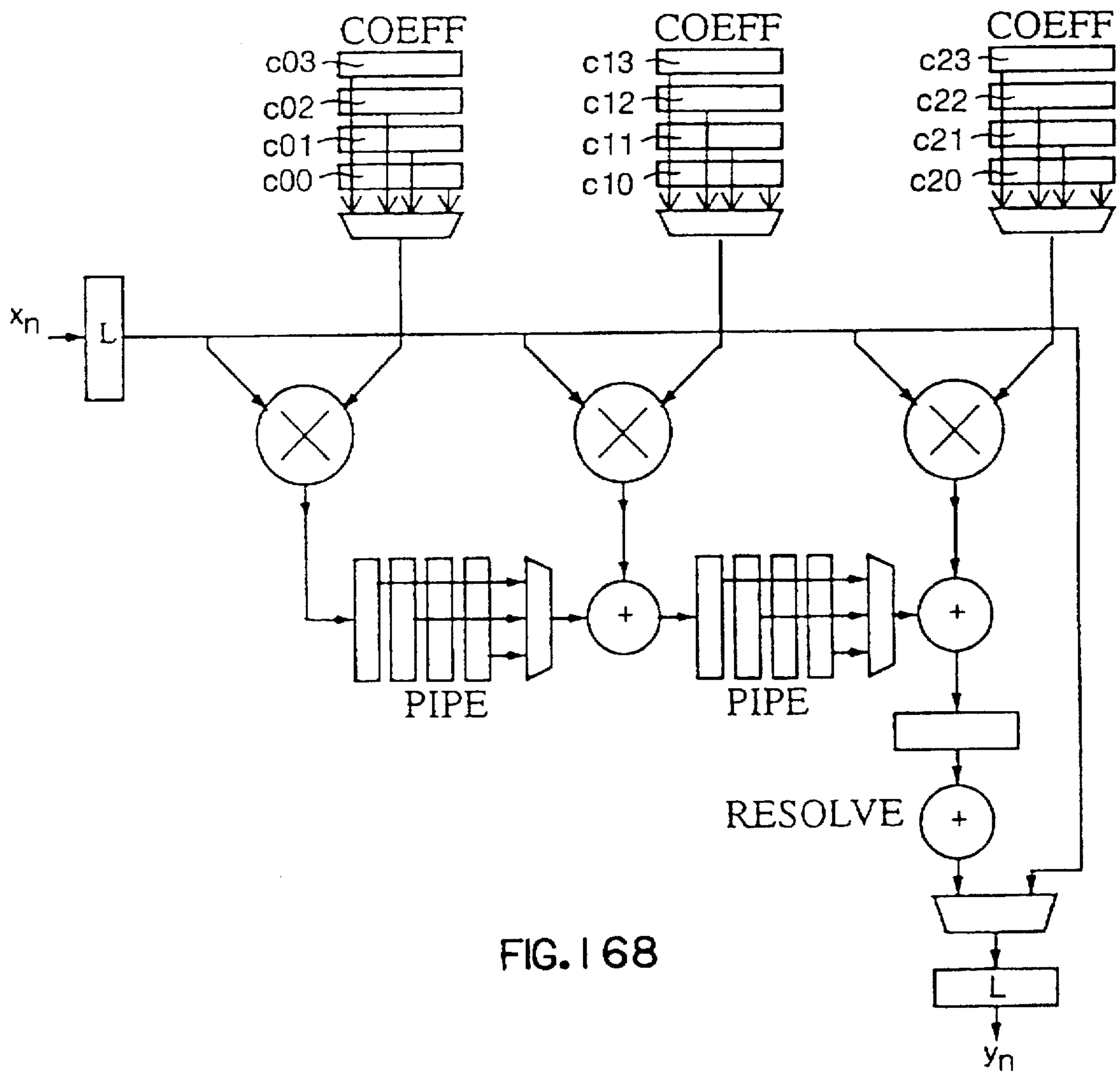
Figure 169:
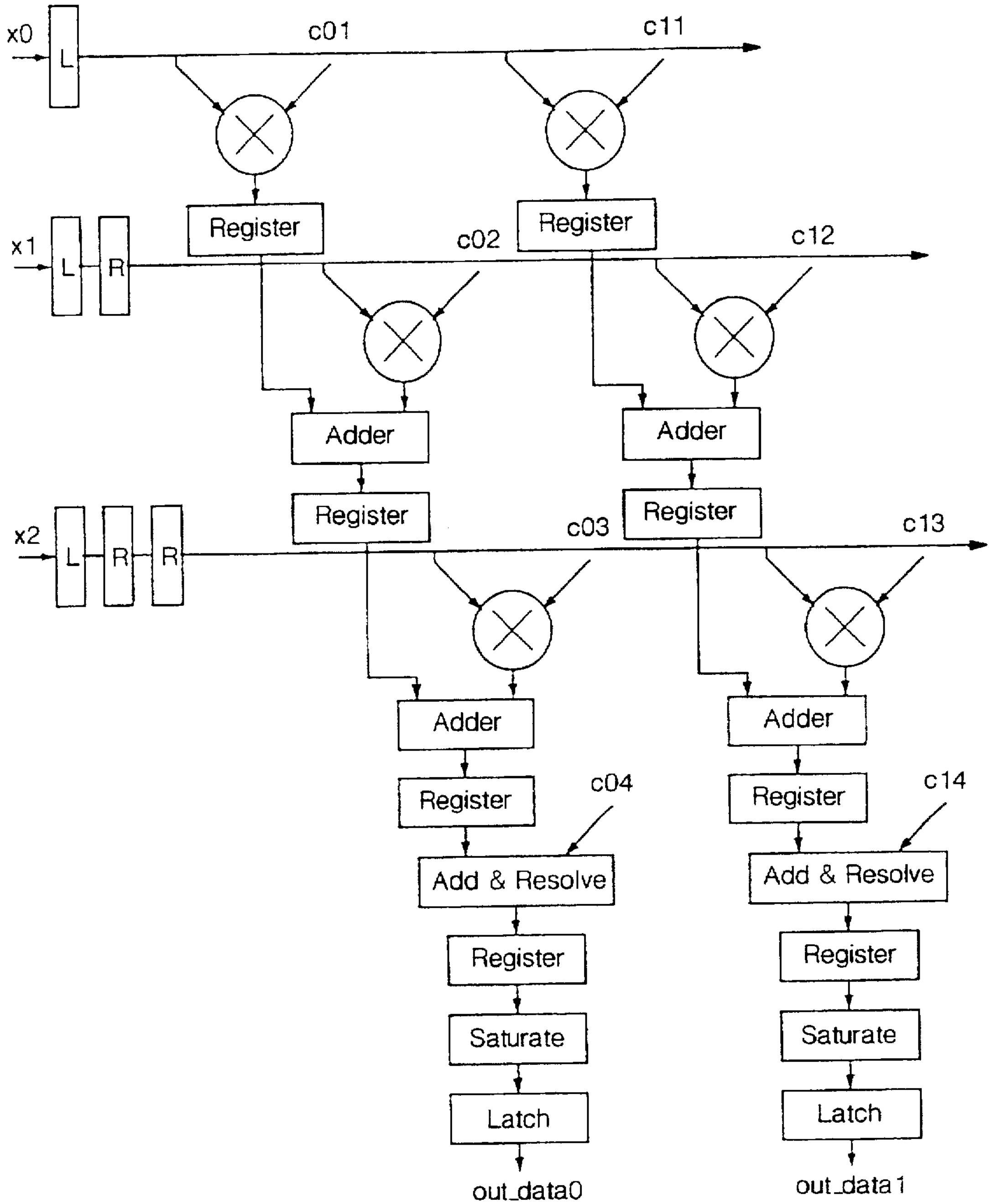

| FIGS. | |
|---|---|
| FIG. 148 | shows the 1-D prediction filter; |
| FIG. 149 | shows a block of pixels; |
| FIG. 150 | shows the structure of the read rudder; |
| FIG. 151 | shows the block and pixel offsets; |
| FIG. 152 | shows a prediction example; |
| FIG. 153 | shows the read cycle; |
| FIG. 154 | shows the write cycle; |
| FIG. 155 | shows the top-level registers block diagram with timing references; |
| FIG. 156 | shows the control for incrementing presentation numbers; |
| FIG. 157 | shows the buffer manager state machine (complete); |
| FIG. 158 | shows the state machine main loop; |
| FIG. 159 | shows the buffer 0 containing an SIF (22 by 18 macroblocks) picture; |
| FIG. 160 | shows the SIF component 0 with a display window; |
| FIG. 161 | shows an example picture format showing storage block address; |
| FIG. 162 | shows a buffer 0 containing a SIF (22 by 18 macroblocks) picture; |
| FIG. 163 | shows an exaiuple address calculation; |
| FIG. 164 | shows a write address generation state machine; |
| FIG. 165 | shows a slice of the datapath; |
| FIG. 166 | shows a two cycle operation of the datapath; |
| FIG. 167 | shows mode 1 filtering; |
| FIG. 168 | shows a horizontal up-sampler datapath; and |
| FIG. 169 | shows the structure of the color-space converter. |

In the ensuing description of the practice of the invention, the following terms are frequently used and are generally defined by the following glossary:

GLOSSARY

BLOCK: An 8-row by 8-column matrix of pels, or 64 DCT coefficients (source, quantized or dequantized).

CHROMINANCE (COMPONENT): A matrix, block or single pel representing one of the two color difference signals related to the primary colors in the manner defined in the bit stream. The symbols used for the color difference signals are Cr and Cb.

CODED REPRESENTATION: A data element as represented in its encoded form.

CODED VIDEO BIT STREAM: A coded representation of a series of one or more pictures as defined in this specification.

CODED ORDER: The order in which the pictures are transmitted and decoded. This order is not necessarily the same as the display order.

COMPONENT: A matrix, block or single pel from one of the three matrices (luminance and two chrominance) that make up a picture.

COMPRESSION: Reduction in the number of bits used to represent an item of data.

DECODER: An embodiment of a decoding process.

DECODING (PROCESS): The process defined in this specification that reads an input coded bitstream and produces decoded pictures or audio samples.

DISPLAY ORDER: The order in which the decoded pictures are displayed. Typically, this is the same order in which they were presented at the input of the encoder.

ENCODING (PROCESS): A process, not specified in this specification, that reads a stream of input pictures or audio samples and produces a valid coded bitstream as defined in this specification.

INTRA CODING: Coding of a macroblock or picture that uses information only from that macroblock or picture.

LUMINANCE (COMPONENT): A matrix, block or single pel representing a monochrome representation of the signal and related to the primary colors in the manner defined in the bit stream. The symbol used for luminance is Y.

MACROBLOCK: The four 8 by 8 blocks of luminance data and the two (for 4:2:0 chroma format) four (for 4:2:2 chroma formal:) or eight (for 4:4:4 chroma format) corresponding 8 by 8 blocks of chrominance data coming from a 16 by 16 section of the luminance component of the picture. Macroblock is sometimes used to refer to the pel data and sometimes to the coded representation of the pel values and other data elements defined in the macroblock header of the syntax defined in this part of this specification. To one of ordinary skill in the art, the usage is clear from the context.

MOTION COMPENSATION: The use of motion vectors to improve the efficiency of the prediction of pel values. The prediction uses motion vectors to provide offsets into the past and/or future reference pictures containing previously decoded pel values that are used to form the prediction error signal.

MOTION VECTOR: A two-dimensional vector used for motion compensation that provides an offset from the coordinate position in the current picture to the coordinates in a reference picture.

NON-INTRA CODING: Coding of a macroblock or picture that uses information both from itself and from macroblocks and pictures occurring at other times.

PEL: Picture element.

PICTURE: Source, coded or reconstructed image data. A source or reconstructed picture consists of three rectangular matrices of 8-bit numbers representing the luminance and two chrominance signals. For progressive video, a picture is identical to a frame, while for interlaced video, a picture can refer to a frame, or the top field or the bottom field of the frame depending on the context.

PREDICTION: The use of a predictor to provide an estimate of the pel value or data element currently being decoded.

RECONFIGURABLE PROCESS STAGE (RPS): A stage, which in response to a recognized token, reconfigures itself to perform various operations.

SLICE: A series of macroblocks.

TOKEN: A universal adaptation unit in the form of an interactive interfacing messenger package for control and/or data functions.

START CODES [SYSTEM AND VIDEO]: 32-bit codes embedded in a coded bitstream that are unique. They are used for several purposes including identifying some of the structures in the coding syntax.

VARIABLE LENGTH CODING; VLC: A reversible procedure for coding that assigns shorter code-words to frequent events and longer code-words to less frequent events.

VIDEO SEQUENCE: A series of one or more pictures.

Detailed Descriptions

DESCRIPTION OF THE PREFERRED EMBODIMENT(S)

Figure 1:
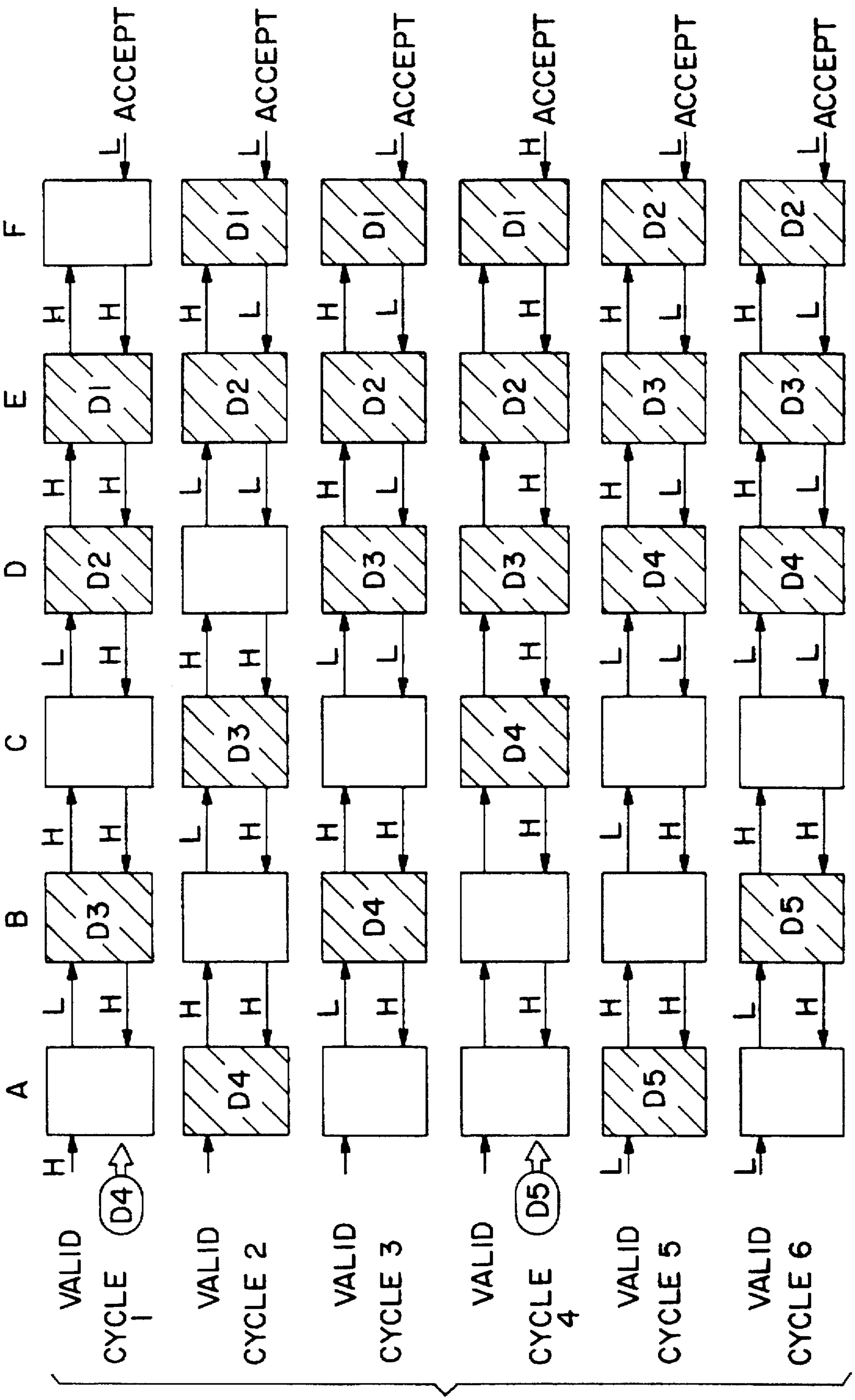
FIG. 1 illustrates six cycles of a six-stage pipeline for different combinations of two internal control signals.
Figure 2A:
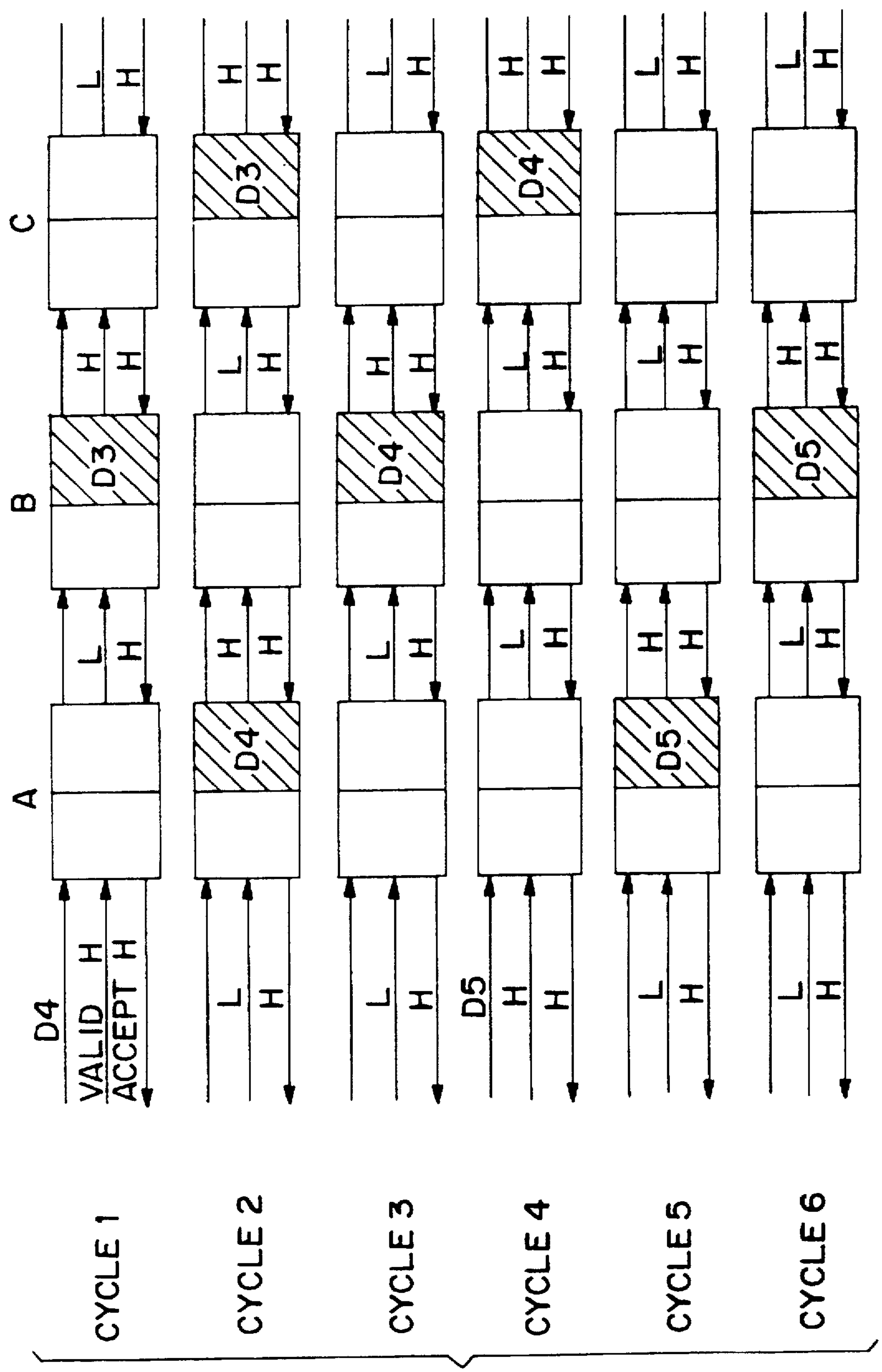
FIGS. 2*a* and 2*b* illustrate a pipeline in which each stage includes auxiliary data storage. They also show the manner in which pipeline stages can "compress" and "expand" in response to delays in the pipeline.
Figure 2B:
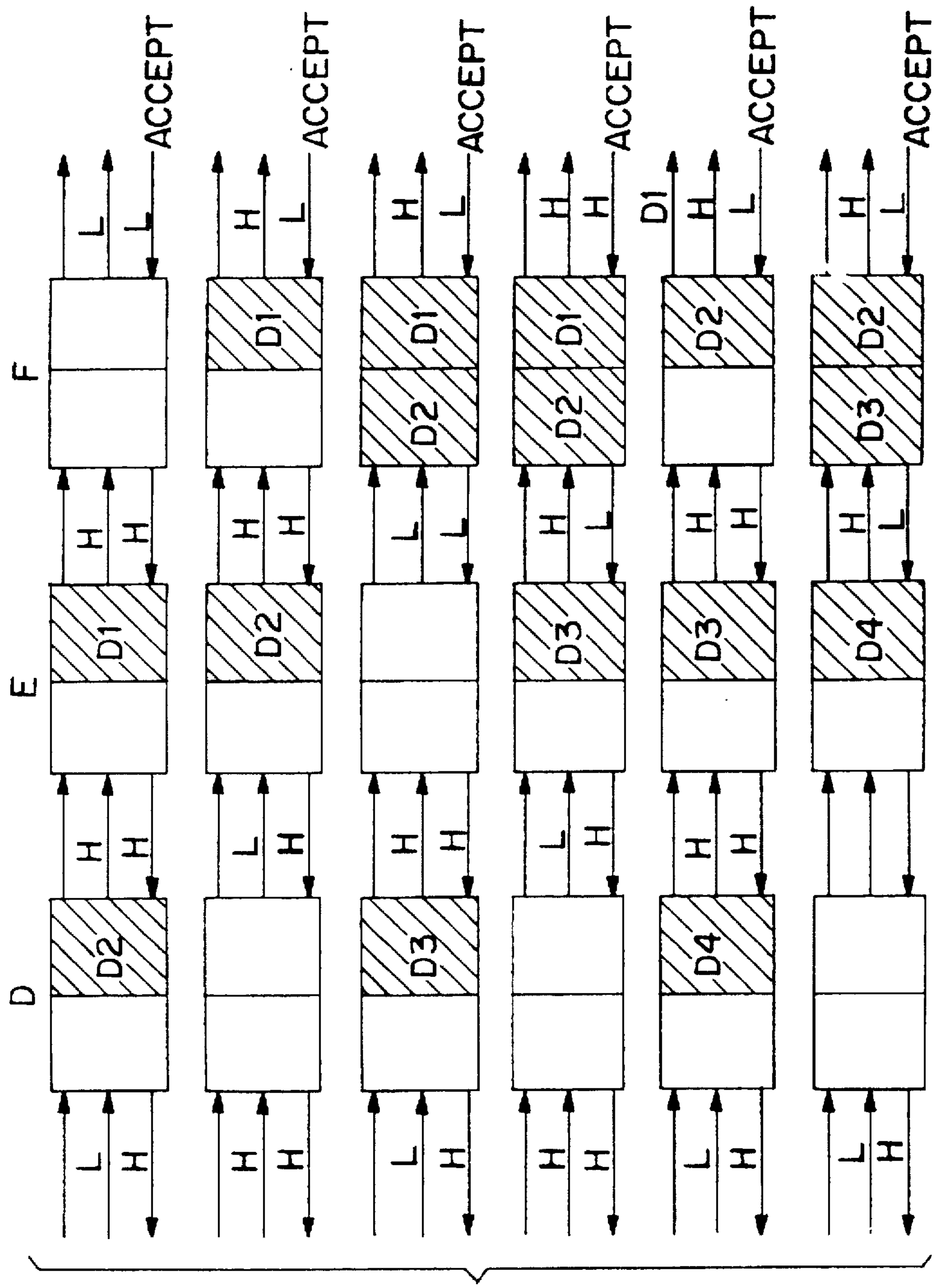

As an introduction to the most general features used in a pipeline system which is utilized in the preferred embodiments of the invention, FIG. 1 is a greatly simplified illustration of six cycles of a six-stage pipeline. (As is explained in greater detail below, the preferred embodiment of the pipeline includes several advantageous features not shown in FIG. 1.).

Referring now to the drawings, wherein like reference numerals denote like or corresponding elements throughout the various figures of the drawings, and more particularly to FIG. 1, there is shown a block diagram of six cycles in practice of the present invention. Each row of boxes, illustrates a cycle and each of the different stages are labelled A–F, respectively. Each shaded box indicates that the corresponding stage holds valid data, i.e., data that is to be processed in one of the pipeline stages. After processing (which may involve nothing more than a simple transfer without manipulation of the data) valid data is transferred out of the pipeline as valid output data.

Note that an actual pipeline application may include more or fewer than six pipeline stages. As will be appreciated, the present invention may be used with any number of pipeline stages. Furthermore, data may be processed in more than one stage and the processing time for different stages can differ.

In addition to clock and data signals (described below), the pipeline includes two transfer control signals—a "VALID" signal and an "ACCEPT" signal. These signals are used to control the transfer of data within the pipeline. The VALID signal, which is illustrated as the upper of the two lines connecting neighboring stages, is passed in a forward or downstream direction from each pipeline stage to the nearest neighboring device. This device may be another pipeline stage or some other system. For example, the last pipeline stage may pass its data on to subsequent processing circuitry. The ACCEPT signal, which is illustrated as the lower of the two lines connecting neighboring stages, passes in the other direction upstream to a preceding device.

A data pipeline system of the type used in the practice of the present invention has, in preferred embodiments, one or more of the following characteristics:

1. The pipeline is "elastic" such that a delay at a particular pipeline stage causes the minimum disturbance possible to other pipeline stages. Succeeding pipeline stages are allowed to continue processing and, therefore, this means that gaps open up in the stream of data following the delayed stage. Similarly, preceding pipeline stages may also continue where possible. In this case, any gaps in the data stream may, wherever possible, be removed from the stream of data.

2. Control signals that arbitrate the pipeline are organized so that they only propagate to the nearest neighboring pipeline stages. In the case of signals flowing in the same direction as the data flow, this is the immediately succeeding stage. In the case of signals flowing in the opposite direction to the data flow, this is the immediately preceding stage.

3. The data in the pipeline is encoded such that many different types of data are processed in the pipeline. This encoding accommodates data packets of variable size and the size of the packet need not be known in advance.

4. The overhead associated with describing the type of data is as small as possible.

5. It is possible for each pipeline stage to recognize only the minimum number of data types that are needed for its required function. It should, however, still be able to pass all data types onto the succeeding stage even though it does not recognize them. This enables communication between non-adjacent pipeline stages.

Although not shown in FIG. 1, there are data lines, either single lines or several parallel lines, which form a data bus that also lead into and out of each pipeline stage. As is explained and illustrated in greater detail below, data is transferred into, out of, and between the stages of the pipeline over the data lines.

Note that the first pipeline stage may receive data and control signals from any form of preceding device. For example, reception circuitry of a digital image transmission system, another pipeline, or the like. On the other hand, it may generate itself, all or part of the data to be processed in the pipeline. Indeed, as is explained below, a "stage" may contain arbitrary processing circuitry, including none at all (for simple passing of data) or entire systems (for example, another pipeline or even multiple systems or pipelines), and it may generate, change, and delete data as desired.

When a pipeline stage contains valid data that is to be transferred down the pipeline, the VALID signal, which indicates data validity, need not be transferred further than to the immediately subsequent pipeline stage. A two-wire interface is, therefore, included between every pair of pipeline stages in the system. This includes a two-wire interface between a preceding device and the first stage, and between a subsequent device and the last stage, if such other devices are included and data is to be transferred between them and the pipeline.

Each of the signals, ACCEPT and VALID, has a HIGH and a LOW value. These values are abbreviated as "H", and "L", respectively. The most common applications of the pipeline, in practicing the invention, will typically be digital. In such digital implementations, the HIGH value may, for example, be a logical "1" and the LOW value may be a logical "0". The system is not restricted to digital implementations, however, and in analog implementations, the HIGH value may be a voltage or other similar quantity above (or below) a set threshold, with the LOW value being indicated by the corresponding signal being below (or above) the same or some other threshold. For digital applications, the present invention may be implemented using any known technology, such as CMOS, bipolar etc.

It is not necessary to use a distinct storage device and wires to provide for storage of VALID signals. This is true even in a digital embodiment. All that is required is that the indication of "validity" of the data be stored along with the data. By way of example only, in digital television pictures that are represented by digital values, as specified in the international standard CCIR 601, certain specific values are not allowed. In this system, eight-bit binary numbers are used to represent samples of the picture and the values zero and 255 may not be used.

If such a picture were to be processed in a pipeline built in the practice of the present invention, then one of these values (zero, for example) could be used to indicate that the data in a specific stage in the pipeline is not valid. Accordingly, any non-zero data would be deemed to be valid. In this example, there is no specific latch that can be identified and said to be storing the "validness" of the associated data. Nonetheless, the validity of the data is stored along with the data. As shown in FIG. 1, the state of the VALID signal into each stage is indicated as an "H" or an "L" on an upper, right-pointed arrow. Therefore, the VALID signal from Stage A into Stage B is LOW, and the VALID signal from Stage D into Stage E is HIGH. The state of the ACCEPT signal into each stage is indicated as an "H" or an "L" on a lower, left-pointing arrow. Hence, the ACCEPT signal from Stage E into Stage D is HIGH, whereas the ACCEPT signal from the device connected downstream of the pipeline into Stage F is LOW.

Data is transferred from one stage to another during a cycle (explained below) whenever the ACCEPT signal of the downstream stage into its upstream neighbor is HIGH. If the ACCEPT signal is LOW between two stages, then data is not: transferred between these stages.

Referring again to FIG. 1, if a box is shaded, the corresponding pipeline stage is assumed, by way of example, to contain valid output data. Likewise, the VALID signal which is passed from that stage to the following stage is HIGH. FIG. 1 illustrates the pipeline when stages B, D, and E contain valid data. Stages A, C, and F do not contain valid data. At the beginning, the VALID signal into pipeline stage A is HIGH, meaning that the data on the transmission line into the pipeline is valid.

Also at this time, the ACCEPT signal into pipeline stage F is LOW, so that no data, whether valid or not, is transferred out of Stage F. Note that both valid and invalid data is transferred between pipeline stages. Invalid data, which is data not worth saving, may be written over, thereby, eliminating it from the pipeline. However, valid data must not be written over since it is data that must be saved for processing or use in a downstream device e.g., a pipeline stage, a device or a system connected to the pipeline that receives data from the pipeline.

In the pipeline illustrated in FIG. 1, Stage E contains valid data D1, Stage D contains valid data D2, Stage B contains valid data D3, and a device (not shown) connected to the pipeline upstream contains data D4 that is to be transferred into and processed in the pipeline. Stages B, D and E, in addition to the upstream device, contain valid data and, therefore, the VALID signal from these stages or devices into their respective following devices is HIGH. The VALID signal from the Stages A, C and F is, however, LOW since these stages do not contain valid data.

Assume now that the device connected downstream from the pipeline is not ready to accept data from the pipeline. The device signals this by setting the corresponding ACCEPT signal LOW into Stage F. Stage F itself, however, does not contain valid data and is, therefore, able to accept data from the preceding Stage E. Hence, the ACCEPT signal from Stage F into Stage E is set HIGH.

Similarly, Stage E contains valid data and Stage F is ready to accept this data. Hence, Stage E can accept new data as long as the valid data D1 is first transferred to Stage F. In other words, although Stage F cannot transfer data downstream, all the other stages can do so without any valid data being overwritten or lost. At the end of Cycle 1, data can, therefore, be "shifted" one step to the right. Tis condition is shown in Cycle 2.

In the illustrated example, the downstream device is still not ready to accept new data in Cycle 2 and, therefore, the ACCEPT signal into Stage F is still LOW. Stage F cannot, therefore, accept new data since doing so would cause valid data D1 to be overwritten and lost. The ACCEPT signal from Stage F into Stage E, therefore, goes LOW, as does the ACCEPT signal from Stage E into Stage D since Stage E also contains valid data D2. All of the Stages A–D, however, are able to accept new data (either because they do not contain valid data or because they are able to shift their valid data downstream and accept new data) and they signal this condition to their immediately preceding neighbors by setting their corresponding ACCEPT signals HIGH.

The state of the pipelines after Cycle 2 is illustrated in FIG. 1 for the row labelled Cycle 3. By way of example, it is assumed that the downstream device is still not ready to accept new data from Stage F (the ACCEPT signal into Stage F is LOW). Stages E and F, therefore, are still "blocked", but in Cycle 3, Stage D has received the valid data D3, which has overwritten the invalid data that was previously in this stage. Since Stage D cannot pass on data D3 in Cycle 3, it cannot accept new data and, therefore, sets the ACCEPT signal into Stage C LOW. However, stages A–C are ready to accept new data and signal this by setting their corresponding ACCEPT signals HIGH. Note that data D4 has been shifted from Stage A to Stage B.

Assume now that the downstream device becomes ready to accept new data in Cycle 4. It signals this to the pipeline by setting the ACCEPT signal into Stage F HIGH. Although Stages C–F contain valid data, they can now shift the data downstream and are, thus, able to accept new data. Since each stage is therefore able to shift data one step downstream, they set their respective ACCEPT signals out HIGH.

As long as the ACCEPT signal into the final pipeline stage (in this example, Stage F) is HIGH, the pipeline shown in FIG. 1 acts as a rigid pipeline and simply shifts data one step downstream on each cycle. Accordingly, in Cycle 5, data D1, which was contained in Stage F in Cycle 4, is shifted out of the pipeline to the subsequent device, and all other data is shifted one step downstream.

Assume now, that the ACCEPT signal into Stage F goes LOW in Cycle 5. Once again, this means that Stages D–F are not able to accept new data, and the ACCEPT signals out of these stages into their immediately preceding neighbors go LOW. Hence, the data D2, D3 and D4 cannot shift downstream, however, the data D5 can. The corresponding state of the pipeline after Cycle 5 is, thus, shown in FIG. 1 as Cycle 6.

The ability of the pipeline, in accordance with the preferred embodiments of the present invention, to "fill up" empty processing stages is highly advantageous since the processing stages in the pipeline thereby become decouple from one another. In other words, even though a pipeline stage may not be ready to accept data, the entire pipeline does not have to stop and wait for the delayed stage. Rather, when one stage is unable to accept valid data it simply forms a temporary "wall" in the pipeline. Nonetheless, stages downstream of the "wall" can continue to advance valid data even to circuitry connected to the pipeline, and stages to the left of the "wall" can still accept and transfer valid data downstream. Even when several pipeline stages temporarily cannot accept new data, other stages can continue to operate normally. In particular, the pipeline can continue to accept data into its initial stage A as long as stage A does not already contain valid data that cannot be advanced due to the next stage not being ready to accept new data. As this example illustrates, data can be Transferred into the pipeline and between stages even when one or more processing stages is blocked.

In the embodiment shown in FIG. 1, it is assumed that the various pipeline stages do not store the ACCEPT signals they receive from their immediately following neighbors. Instead, whenever the ACCEPT signal into a downstream stage goes LOW, this LOW signal is propagated upstream as far as the nearest pipeline stage that does not contain valid data. For example, referring to FIG. 1, it was assumed that the ACCEPT signal into Stage F goes LOW in Cycle 1. In Cycle 2, the LOW signal propagates from Stage F back to Stage D.

In Cycle 3, when the data D3 is latched into Stage D, the ACCEPT signal propagates upstream four stages to Stage C. When the ACCEPT signal into Stage F goes HIGH in Cycle 4, it must propagate upstream all the way to Stage C. In other words, the change in the ACCEPT signal must propagate back four stages. It is not necessary, however, in the embodiment illustrated in FIG. 1, for the ACCEPT signal to propagate all the way back to the beginning of the pipeline if there is some intermediate stage that is able to accept new data.

In the embodiment illustrated in FIG. 1, each pipeline stage will still need separate input and output data latches to allow data to be transferred between stages without unintended overwriting. Also, although the pipeline illustrated in FIG. 1 is able to "compress" when downstream pipeline stages are blocked, i.e., they cannot pass on the data they contain, the pipeline does not "expand" to provide stages that contain no valid data between stages that do contain valid data. Rather, the ability to compress depends on there being cycles during which no valid data is presented to the first pipeline stage.

In Cycle 4, for example, if the ACCEPT signal into Stage F remained LOW and valid data filled pipeline stages A and B, as long as valid data continued to be presented to Stage A the pipeline would not be able to compress any further and valid input data could be lost. Nonetheless, the pipeline illustrated in FIG. 1 reduces the risk of data loss since It is able to compress as long as there is a pipeline stage that does not contain valid data.

Figures 1, 3A:
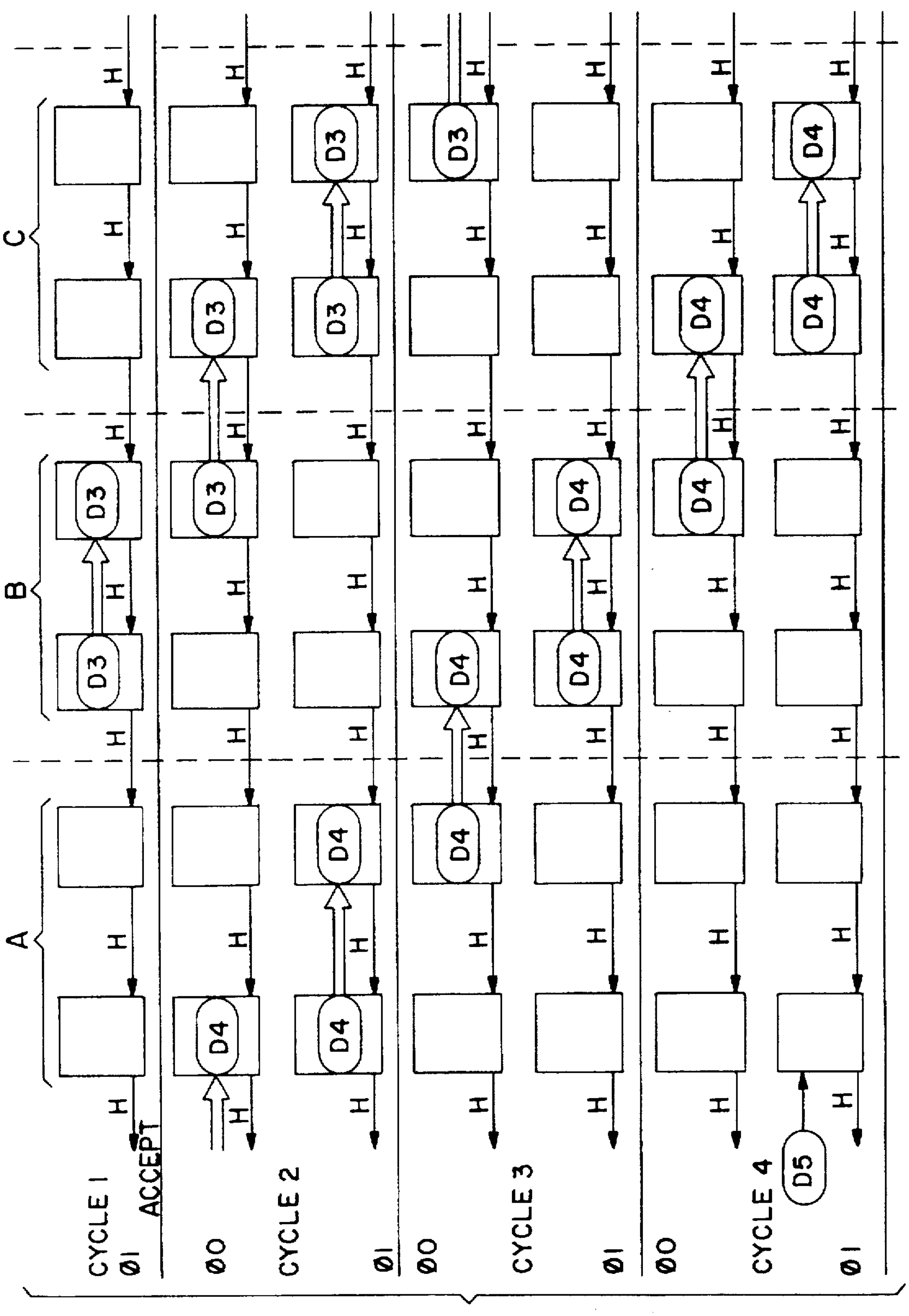
FIGS. 3*a*(1), 3*a*(2), 3*b*(1) and 3*b*(2) illustrate the control of data transfer between stages of a preferred embodiment of a pipeline using a two-wire interface and a multi-phase clock.
Figures 2, 3A:
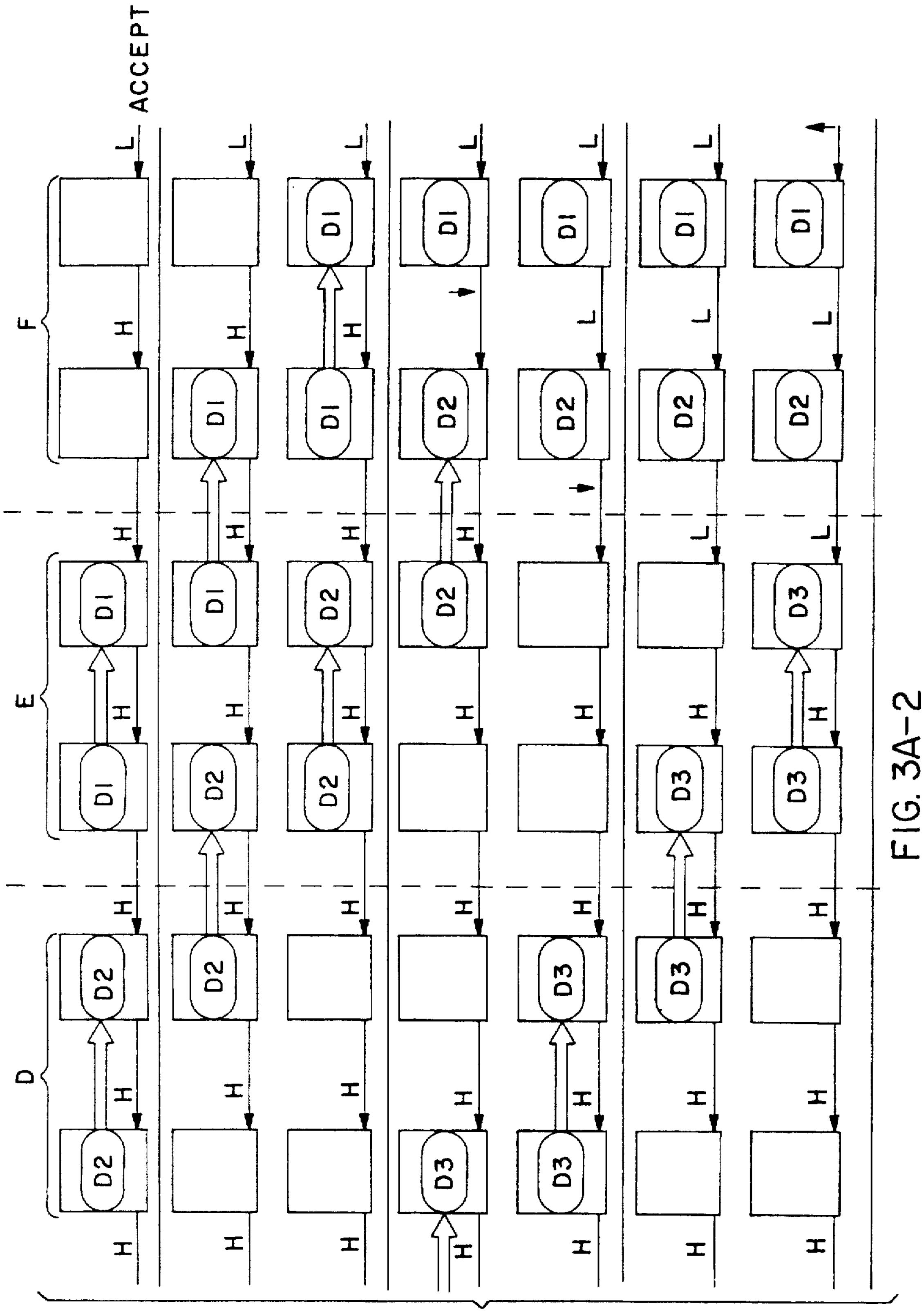
Figures 1, 3B:
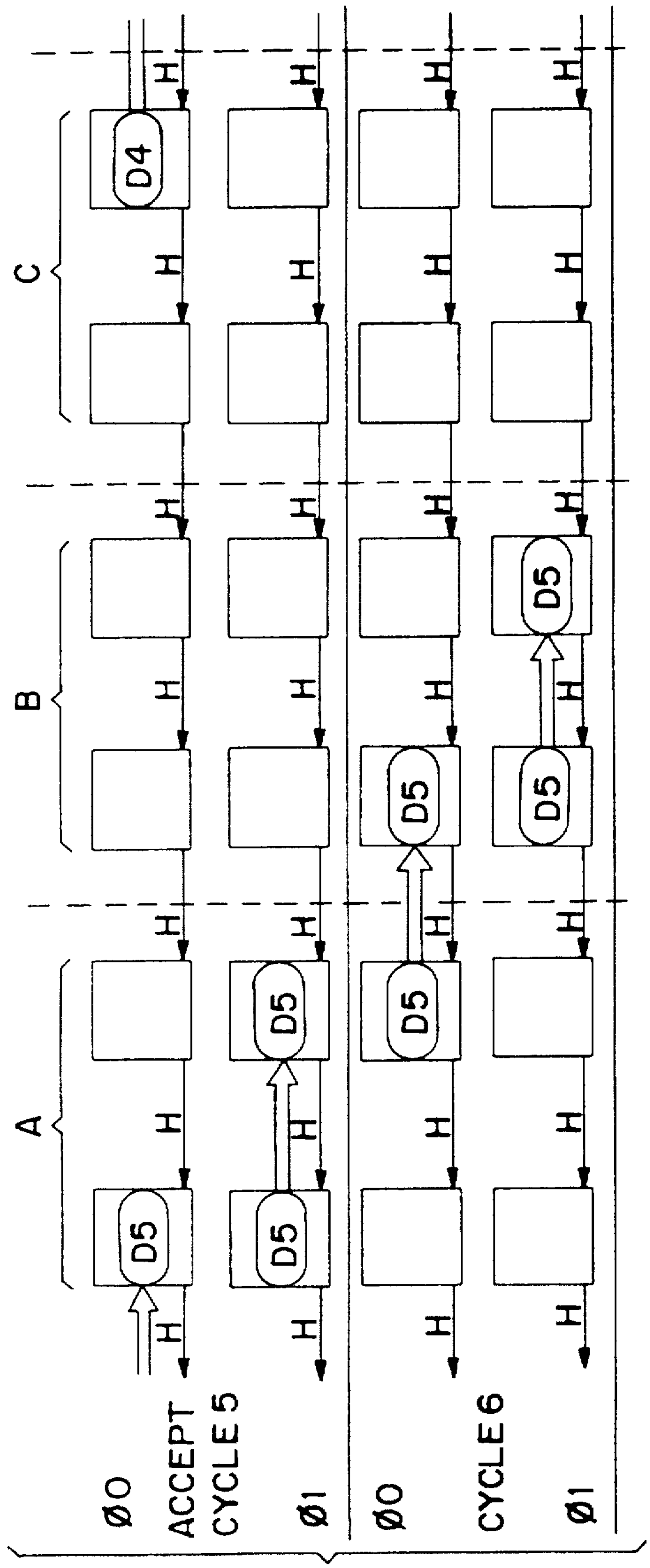
Figures 2, 3B:
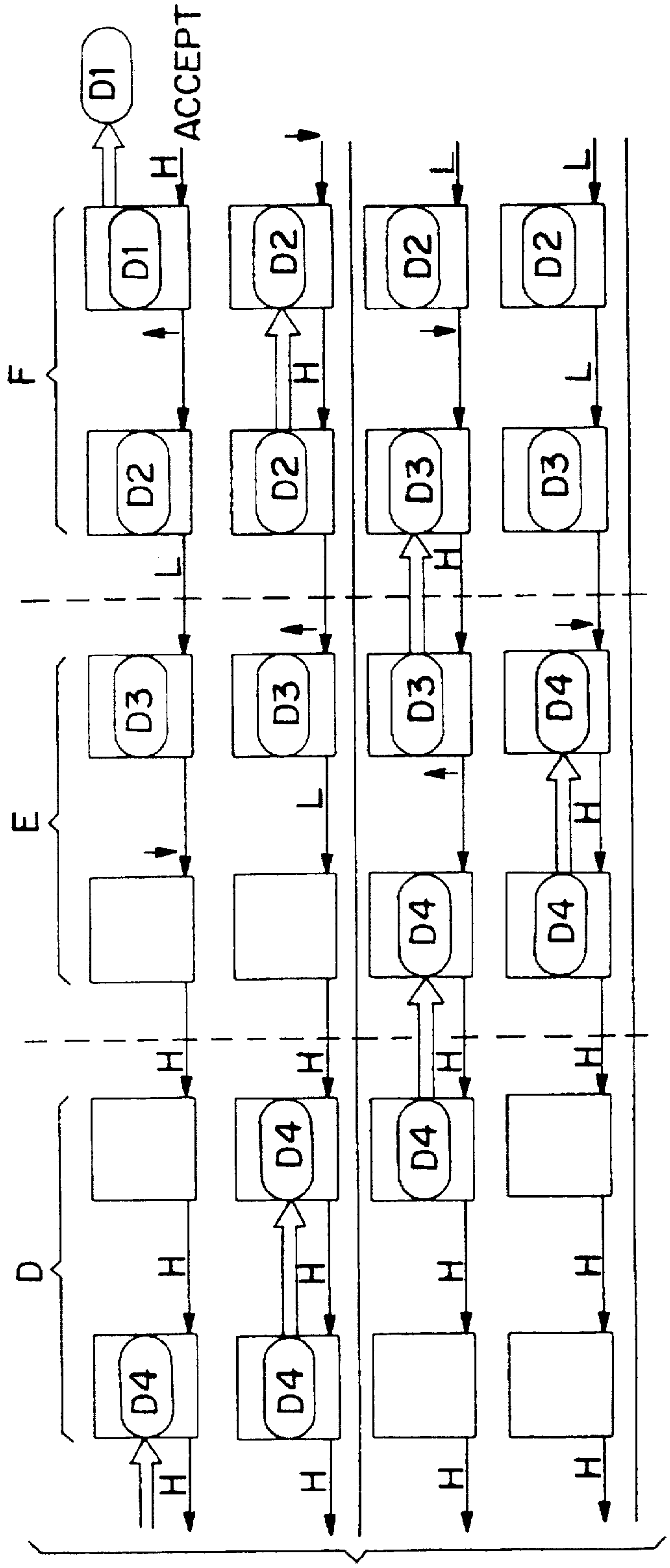

FIG. 2 illustrates another embodiment of the pipeline that can both compress and expand in a logical manner and which includes circuitry that limits propagation of the ACCEPT signal to the nearest preceding stage. Although the circuitry for implementing this embodiment is explained and illustrated in greater detail below, FIG. 2 serves to illustrate the principle by which it operates.

For ease of comparison only, the input data and ACCEPT signals into the pipeline embodiment shown in FIG. 2 are the same as in the pipeline embodiment shown in FIG. 1. Accordingly, stages E, D and B contain valid data D1, D2 and D3, respectively. The ACCEPT signal into Stage F is LOW; and data D4 is presented to the beginning pipeline Stage A. In FIG. 2, three lines are shown connecting each neighboring pair of pipeline stages. The uppermost line, which may be a bus, is a data line. The middle line is the line over which the VALID signal is transferred, while the bottom line is the line over which the ACCEPT signal is transferred. Also, as before, the ACCEPT signal into Stage F remains LOW except in Cycle 4. Furthermore, additional data D5 is presented to the pipeline in Cycle 4.

In FIG. 2, each pipeline stage is represented as a block divided into two halves to illustrate that each stage in this embodiment of the pipeline includes primary and secondary data storage elements. In FIG. 2, the primary data storage is shown as the right half of each stage. However, it will be appreciated that this delineation is for the purpose of illustration only and is not intended as a limitation.

As FIG. 2 illustrates, as long as the ACCEPT signal into a stage is HIGH, data is transferred from the primary storage elements of the stage to the secondary storage elements of the following stage during any given cycle. Accordingly, although the ACCEPT signal into Stage F is LOW, the ACCEPT signal into all other stages is HIGH so that the data D1, D2 and D3 is shifted forward one stage in Cycle 2 and the data D4 is shifted into the first Stage A.

Up to this point, the pipeline embodiment shown in FIG. 2 acts in a manner similar to the pipeline embodiment shown in FIG. 1. The ACCEPT signal from Stage F into Stage E, however, is HIGH even though the ACCEPT signal into Stage F is LOW. As is explained below, because of the secondary storage elements, it is not necessary for the LOW ACCEPT signal to propagate upstream beyond Stage F. Moreover, by leaving the ACCEPT signal into Stage E HIGH, Stage F signals that it is ready to accept new data. Since Stage F is not able to transfer the data D1 in its primary storage elements downstream (the ACCEPT signal into Stage F is LOW) in Cycle 3, Stage E must, therefore, transfer the data D2 into the secondary storage elements of Stage F. Since both the primary and the secondary storage elements of Stage F now contain valid data that cannot be passed on, the ACCEPT signal from Stage F into Stage E is set LOW. Accordingly, this represents a propagation of the LOW ACCEPT signal back only one stage relative to Cycle 2, whereas this ACCEPT signal had to be propagated back all the way to Stage C in the embodiment shown in FIG. 1.

Since Stages A–E are able to pass on their data, the ACCEPT signals from the stages into their immediately preceding neighbors are set HIGH. Consequently, the data D3 and D4 are shifted one stage to the right so that, in Cycle 4, they are loaded into the primary data storage elements of Stage E and Stage C, respectively. Although Stage E now contains valid data D3 in its primary storage elements, its secondary storage elements can still be used to store other data without risk of overwriting any valid data.

Assume now, as before, that the ACCEPT signal into Stage F becomes HIGH in Cycle 4. This indicates that the downstream device to which the pipeline passes data is ready to accept data from the pipeline. Stage F, however, has set its ACCEPT signal LOW and, thus, indicates to Stage E that Stage F is not prepared to accept new data. Observe that the ACCEPT signals for each cycle indicate what will "happen" in the next cycle, that is, whether data will be passed on (ACCEPT HIGH) or whether data must remain in place (ACCEPT LOW). Therefore, from Cycle 4 to Cycle 5, the data D1 is passed from Stage F to the following device, the data D2 is shifted from secondary to primary storage in Stage F, but the data D3 in Stage F is not transferred to Stage F. The data D4 and D5 can be transferred into the following pipeline stages as normal since the following stages have their ACCEPT signals HIGH.

Comparing the state of the pipeline in Cycle 4 and Cycle 5, it can be seen that the provision of secondary storage elements, enables the pipeline embodiment shown in FIG. 2 to expand, that is, to free up data storage elements into which valid data can be advanced. For example, in Cycle 4, the data blocks D1, D2 and D3 form a "solid wall" since their data cannot be transferred until the ACCEPT signal into Stage F goes HIGH. Once this signal does become HIGH, however, data D1 is shifted out of the pipeline, data D2 is shifted into the primary storage elements of Stage F, and the secondary storage elements of Stage F become free to accept new data if the following device is not able to receive the data D2 and the pipeline must once again "compress." This is shown in Cycle 6, for which the data D3 has been shifted into the secondary storage elements of Stage F and the data D4 has been passed on from Stage D to Stage E as normal.

FIGS. 3*a*(1), 3*a*(2), 3*b*(1) and 3*b*(2) (which are referred to collectively as FIG. 3) illustrate generally a preferred embodiment of the pipeline. This preferred embodiment implements the structure shown in FIG. 2 using a two-phase, non-overlapping clock with phases ø0 and ø1. Although a two-phase clock is preferred, it will be appreciated that it is also possible to drive the various embodiments of the invention using a clock with more than two phases.

As shown in FIG. 3, each pipeline stage is represented as having two separate boxes which illustrate the primary and secondary storage elements. Also, although the VALID signal and the data lines connect the various pipeline stages as before, for ease of illustration, only the ACCEPT signal is shown in FIG. 3. A change of state during a clock phase of certain of the ACCEPT signals is indicated in FIG. 3 using an upward-pointing arrow for changes from LOW to HIGH. Similarly, a downward-pointing arrow for changes from HIGH to LOW. Transfer of data from one storage element to another is indicated by a large open arrow. It is assumed that the VALID signal out of the primary or secondary storage elements; of any given stage is HIGH whenever the storage elements contain valid data.

In FIG. 3, each cycle is shown as consisting of a full period of the non-overlapping clock phases ø0 and ø1. As is explained in greater detail below, data is transferred from the secondary storage elements (shown as the left box in each stage) to the primary storage elements (shown as the right box in each stage) during clock cycle ø1, whereas data is transferred from the primary storage elements of one stage to the secondary storage elements of the following stage during the clock cycle ø0. FIG. 3 also illustrates that the primary and secondary storage elements in each stage are further connected via an internal acceptance line to pass an ACCEPT signal in the same manner that the ACCEPT signal is passed from stage to stage. In this way, the secondary storage element will know when it can pass its date to the primary storage element.

FIG. 3 shows the ø1 phase of Cycle 1, in which data D1, D2 and D3, which were previously shifted into the secondary storage elements of stages E, D and B, respectively, are shifted into the primary storage elements of the respective stage. During the ø1 phase of Cycle 1, the pipeline, therefore, assumes the same configuration as is shown as Cycle 1 of FIG. 2. As before, the ACCEPT signal into Stage F is assumed to be LOW. As FIG. 3 illustrates, however, this means that the ACCEPT signal into the primary storage element of Stage F is LOW, but since this storage element does not contain valid data, it sets the ACCEPT signal into its secondary storage element HIGH.

The ACCEPT signal from the secondary storage elements of Stage F into the primary storage elements of Stage E is also set HIGH since the secondary storage elements of Stage F do not contain valid data. As before, since the primary storage elements of Stage F are able to accept data, data in all the upstream primary and secondary storage elements can be shifted downstream without any valid data being overwritten. The shift of data from one stage to the next takes place during the next ø0 phase in Cycle 2. For example, the valid data D1 contained in the primary storage element of Stage E is shifted into the secondary storage element of Stage F, the data D4 is shifted into the pipeline, that is, into the secondary storage element of Stage A, and so forth.

The primary storage element of Stage F still does not contain valid data during the ø0 phase in Cycle 2 and, therefore, the ACCEPT signal from the primary storage elements into the secondary storage elements of Stage F remains HIGH. During the ø1 phase in Cycle 2, data can therefore be shifted yet another step to the right, i.e., from the secondary to the primary storage elements within each stage.

However, once valid data is loaded into the primary storage elements of Stage F, if the ACCEPT into Stage F from the downstream device is still LOW, it is not possible to shift data out of the secondary storage element of Stage F without overwriting and destroying the valid data D1. The ACCEPT signal from the primary storage elements into the secondary storage elements of Stage F therefore goes LOW. Data D2, however, can still be shifted into the secondary storage of Stage F since it did not contain valid data and its ACCEPT signal out was HIGH.

During the ø1 phase of Cycle 3, it is not possible to shift data D2 into the primary storage elements of Stage F, although data can be shifted within all the previous stages. Once valid data is loaded into the secondary storage elements of Stage F, however, Stage F is not able to pass on this data. It signals this event setting its ACCEPT signal out LOW.

Assuming that the ACCEPT signal into Stage F remains LOW, data upstream of Stage F can continue to be shifted between stages and within stages on the respective clock phases until the next valid data block D3 reaches the primary storage elements of Stage E. As illustrated, this condition is reached during the ø1 phase of Cycle 4.

During the ø0 phase of Cycle 5, data D3 has been loaded into the primary storage element of Stage E. Since this data cannot be shifted further, the ACCEPT signal out of the primary storage elements of Stage E is set LOW. Upstream data can be shifted as normal.

Assume now, as in Cycle 5 of FIG. 2, that the device connected downstream of the pipeline is able to accept pipeline data. It signals this event by setting the ACCEPT signal into pipeline Stage F HIGH during the ø1 phase of Cycle 4. The primary storage elements of Stage F can now shift data to the right and they are also able to accept new data. Hence, the data D1 was shifted out during the ø1 phase of Cycle 5 so that the primary storage elements of Stage F no longer contain data that must be saved. During the ø1 phase of Cycle 5, the data D2 is, therefore, shifted within Stage F from the secondary storage elements to the primary storage elements. The secondary storage elements of Stage F are also able to accept new data and signal this by setting the ACCEPT signal into the primary storage elements of Stage E HIGH.

During transfer of data within a stage, that is, from its secondary to its primary storage elements, both sets of storage elements will contain the same data, but the data in the secondary storage elements can be overwritten with no data loss since this data will also be held in the primary storage elements. The same holds true for data transfer from the primary storage elements of one stage into the secondary storage elements of a subsequent stage.

Assume now, that the ACCEPT signal into the primary storage elements of Stage F goes LOW during the ø1 phase in Cycle 5. This means that Stage F is not able to transfer the data D2 out of the pipeline. Stage F, consequently, sets the ACCEPT signal from its primary to its secondary storage elements LOW to prevent overwriting of the valid data D2. The data D2 stored in the secondary storage elements of Stage F, however, can be overwritten without loss, and the data D3, is therefore, transferred into the secondary storage elements of Stage F during the ø0 phase of Cycle 6. Data D4 and D5 can be shifted downstream as normal. Once valid data D3 is stored in Stage F along with data D2, as long as the ACCEPT signal into the primary storage elements of Stage F is LOW, neither of the secondary storage elements can accept new data, and it signals this by setting the ACCEPT signal into Stage E LOW.

When the ACCEPT signal into the pipeline from the downstream device changes from LOW to HIGH or vice versa, this change does not have to propagate upstream within the pipeline further than to the immediately preceding storage elements (within the same stage or within the preceding pipeline stage). Rather, this change propagates upstream within the pipeline one storage element block per clock phase.

As this example illustrates, the concept of a "stage" in the pipeline structure illustrated in FIG. 3 is to some extent a matter of perception. Since data is transferred within a stage (from the secondary to the primary storage elements) as it is between stages (from the primary storage elements of the upstream stage into the secondary storage elements of the neighboring downstream stage), one could just as well consider a stage to consist of "primary" storage elements followed by "secondary storage elements" instead of as illustrated in FIG. 3. The concept of "primary" and "secondary" storage elements is, therefore, mostly a question of labeling. In FIG. 3, the "primary" storage elements can also be referred to as "output" storage elements, since they are the elements from which data is transferred out of a stage into a following stage or device, and the "secondary" storage elements could be "input" storage elements for the same stage.

In explaining the aforementioned embodiments, as shown in FIGS. 1–3, only the transfer of data under the control of the ACCEPT and VALID signals has been mentioned. It is to be further understood that each pipeline stage may also process the data it has received arbitrarily before passing it between its internal storage elements or before passing it to the following pipeline stage. Therefore, referring once again to FIG. 3, a pipeline stage can, therefore, be defined as the portion of the pipeline that contains input and output storage elements and that arbitrarily processes data stored in its storage elements.

Furthermore, the "device" downstream from the pipeline Stage F, need not be some other type of hardware structure, but rather it can be another section of the same or part of another pipeline. As illustrated below, a pipeline stage can set its ACCEPT signal LOW not only when all of the downstream storage elements are filled with valid data, but also when a stage requires more than one clock phase to finish processing its data. This also can occur when it creates valid data in one or both of its storage elements. In other words, it is not necessary for a stage simply to pass on the ACCEPT signal based on whether or not the immediately downstream storage elements contains valid data that cannot be passed on. Rather, the ACCEPT signal itself may also be altered within the stage or, by circuitry external to the stage, in order to control the passage of data between adjacent storage elements. The VALID signal may also be processed in an analogous manner.

A great advantage of the two-wire interface (one wire for each of the VALID and ACCEPT signals) is its ability to control the pipeline without the control signals needing to propagate back up the pipeline all the way to its beginning stage. Referring once again to FIG. 1, Cycle 3, for example, although stage F "tells" stage E that it cannot accept data, and stage E tells stage D, and stage D tells stage C. Indeed, if there had been more stages containing valid data, then this signal would have propagated back even further along the pipeline. In the embodiment shown in FIG. 3, Cycle 3, the LOW ACCEPT signal is not propagated any further upstream than to Stage E and, then, only to its primary storage elements.

As described below, this embodiment is able to achieve this flexibility without adding significantly to the silicon area that is required to implement the design. Typically, each latch in the pipeline used for data storage requires only a single extra transistor (which lays out very efficiently in silicon). In addition, two extra latches and a small number of gates are preferably added to process the ACCEPT and VALID signals that are associated with the data latches in each half-stage.

Figure 4:
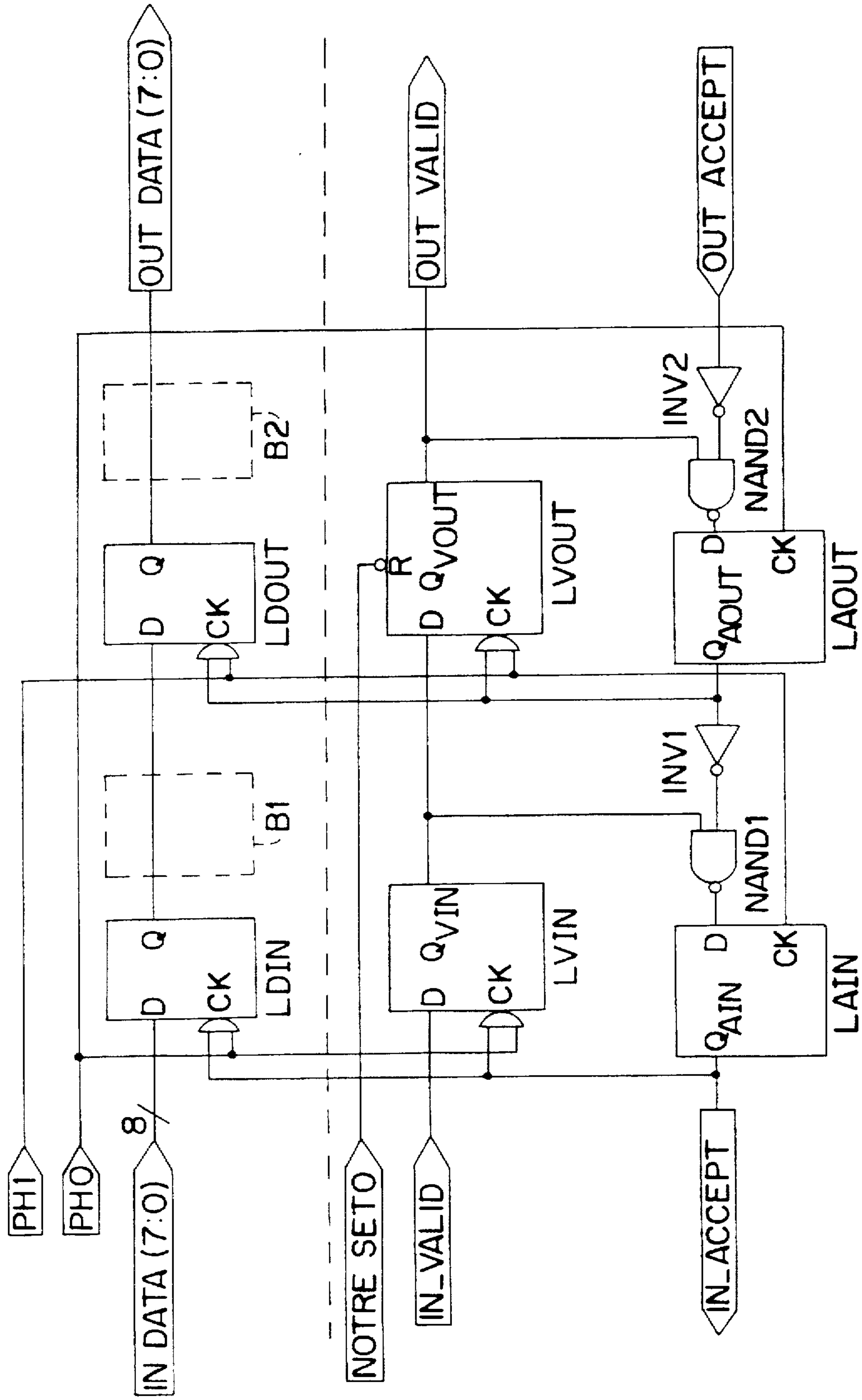
FIG. 4 is a block diagram that illustrates a basic embodiment of a pipeline stage that incorporates a two-wire transfer control and also shows two consecutive pipeline processing stages with the two-wire transfer control.

FIG. 4 illustrates a hardware structure that implements a stage as shown in FIG. 3.

By way of example only, it is assumed that eight-bit data is to be transferred (with or without further manipulation in optional combinatorial logic circuits) in parallel through the pipeline. However, it will be appreciated that either more or less than eight-bit data can be used in practicing the invention. Furthermore, the two-wire interface in accordance with this embodiment is, however, suitable for use with any data bus width, and the data bus width may even change from one stage to the next if a particular application so requires. The interface in accordance with this embodiment can also be used to process analog signals.

As discussed previously, while other conventional timing arrangements may be used, the interface is preferably controlled by a two-phase, non-overlapping clock. In FIGS. 4–9, these clock phase signals are referred to as PH0 and PH1. In FIG. 4, a line is shown for each clock phase signal.

Input data enters a pipeline stage over a multi-bit data bus IN_DATA and is transferred to a following pipeline stage or to subsequent receiving circuitry over an output data bus OUT_DATA. The input data is first loaded in a manner described below into a series of input latches (one for each input data signal) collectively referred to as LDIN, which constitute the secondary storage elements described above.

In the illustrated example of this embodiment, it is assumed that the Q outputs of all latches follow their D inputs, that is, they are "loaded", when the clock input is HIGH, i.e., at a logic "1" level. Additionally, the Q outputs hold their last values. In other words, the Q outputs are "latched" on the falling edge of their respective clock signals. Each latch has for its clock either one of two non-overlapping clock signals PH0 or PH1 (as shown in FIG. 5), or the logical AND combination of one of these clock signals PH0, PH1 and one logic signal. The invention works equally well, however, by providing latches that latch on the rising edges of the clock signals, or any other known latching arrangement, as long as conventional methods are applied to ensure proper timing of the latching operations.

The output data from the input data latch LDIN passes via an arbitrary and optional combinatorial logic circuit B1, which may be provided to convert output data from input latch LDIN into intermediate data, which is then later loaded in an output data latch LDOUT. Which comprises the primary storage elements described above. The output from the output data latch LDOUT may similarly pass through an arbitrary and optional combinatorial logic circuit B2 before being passed onward as OUT_DATA to the next device downstream. This may be another pipeline stage or any other device connected to the pipeline.

In the practice of the present invention, each stage of the pipeline also includes a validation input latch LVIN, at validation output latch LVOUT, an acceptance input latch LAIN, and an acceptance output latch LAOUT. Each of these four latches is, preferably, a simple, single-stage latch. The outputs from latches LVIN, LVOUT, LAIN and LAOUT are, respectively, QVIN, QVOUT, QAIN, QAOUT. The output signal QVIN from the validation input latch is connected either directly as an input to the validation output latch LVOUT, or via intermediate logic devices or circuits that may alter the signal.

Similarly, the output validation signal QVOUT of a given stage may be connected either directly to the input of the validation input latch QVIN of the following stage, or via intermediate devices or logic circuits, which may alter the validation signal. This output QVIN is also connected to a logic gate (to be described below), whose output is connected to the input of the acceptance input latch LAIN. The output QAOUT from the acceptance output latch LAOUT is connected to a similar logic gate (described below), optionally via another logic gate.

As shown in FIG. 4, the output validation signal QVOUT forms an OUT_VALID signa that can be received by subsequent stages as an IN_VALID signal, or simply to indicate valid data to subsequent circuity connected to the pipeline. The readiness of the following circuit or stage to accept data is indicated to each stage as the signal OUT ACCEPT, which is connected as the input to the acceptance output latch LAOUT, preferably via logic circuitry, which is described below. Similarly, the output QAOUT of the acceptance output latch LAOUT is connected as the input to the acceptance input latch LAIN, preferably via logic circuitry, which is described below.

In practicing the present invention, the output signals QVIN, QVOUT from the validation latches LVIN, LVOUT are combined with the acceptance signals QAOUT, OUT_ACCEPT, respectively, to form the inputs to the acceptance latches LAIN, LAOUT, respectively. In the embodiment illustrated in FIG. 4, these input signals are formed as the logical NAND combination of the respective validation signals QVIN, QVOUT, with the logical inverse of the respective acceptance output signals QAOUT, OUT_ACCEPT. Conventional logic gates, NAND1 and NAND2, perform the NAND operation, and the inverters INV1, INV2 form the logical inverses of the respective acceptance signals.

As is well known in the art of digital design, the output from a NAND gate is a logical "1" when any or all of its input signals are in the logical "0" state. The output from a NAND gate is, therefore, a logical "0" only when all of its inputs are in the logical "1" state. Also well known in the art, is that the output of a digital inverter such as INV1 is a logical "1" when its input signal is a "0" and is a "0" when its input signal is a "1".

The inputs to the NAND gate NAND1 are, therefore, QVIN and NOT (QAOUT), where "NOT" indicates binary inversion. Using known techniques, the input to the acceptance latch LAIN can be resolved as follows:

NAND(QVIN,NOT(QAOUT))=NOT(QVIN) OR QAOUT

In other words, the combination of the inverter INV1 and the NAND gate NAND1 is a logical "1" either when the signal QVIN is a "0" or the signal QAOUT is a "1", or both. The gate NAND1 and the inverter INV1 can, therefore, be implemented by a single OR gate that has one of its inputs tied directly to the QAOUT output of the acceptance latch LAOUT and its other input tied to the inverse of the output signal QVIN of the validation input latch LVIN.

As is well known in the art of digital design, many latches suitable for use as the validation and acceptance latches may have two outputs, Q and NOT(Q), that is, Q and its logical inverse. If such latches are chosen, the one input to the OR gate can, therefore, be tied directly to the NOT(Q) output of the validation latch LVIN. The gate NAND1 and the inverter INV1 can be implemented using well known conventional techniques. Depending on the latch architecture used, however, it may be more efficient to use a latch without an inverting output, and to provide instead the gate NAND1 and the inverter INV1, both of which also can be implemented efficiently in a silicon device. Accordingly, any known arrangement may be used to generate the Q signal and/or its logical inverse.

The data and validation latches LDIN, LDOUT, LVIN and LVOUT, load their respective data inputs when both clock signals (PH0 at the input side and PH1 at the output side) and the output from the acceptance latch of the same side are logical "1". Thus, the clock signal (PH0 for the input latches LDIN and LVIN) and the output of the respective acceptance latch (in this case, LAIN) are used in a logical AND manner and data is loaded only when they are both logical "1".

In particular applications, such as CMOS implementations of the latches, the logical AND operation that controls the loading (via the illustrated CK or enabling "input") of the latches can be implemented easily in a conventional manner by connecting the respective enabling input signals (for example, PH0 and QAIN for the latches LVIN and LDIN), to the gates of MOS transistors connected in series in the input lines of the latches. Consequently, is necessary to provide an actual logic AND gate, which might cause problems of timing due to propagation delay in high-speed applications. The AND gate shown in the figures, therefore, only indicates the logical function to be performed in generating the enable signals of the various latches.

Thus, the data latch LDIN loads input data only when PH0 and QAIN are both "1". It will latch this data when either of these two signals goes to a "0".

Although only one of the clock phase signals PH0 or PH1, is used to clock the data and validation latches at the input (and output) side of the pipeline stage, the other clock phase signal is used, directly, to clock the acceptance latch at the same side. In other words, the acceptance latch on either side (input or output) of a pipeline stage is preferably clocked "out of phase" with the data and validation latches on the same side. For example, PH1 is used to clock the acceptance input latch, although PH0 is used in generating the clock signal CK for the data latch LDIN and the validation latch LVIN.

As an example of the operation of a pipeline augmented by the two-wire validation and acceptance circuitry assume that no valid data is initially presented at the input to the circuit, either from a preceding pipeline stage, or from a transmission device. In other words, assume that the validation input signal IN_VALID to the illustrated stage has not gone to a "1" since the system was most recently reset. Assume further that several clock cycles have taken place since the system was last reset and, accordingly, the circuitry has reached a steady-state condition. The validation input signal QVIN from the validation latch LVIN is, therefore, loaded as a "0" during the next positive period of the clock PH0. The input to the acceptance input latch LAIN (via the gate NAND1 or another equivalent gate), is, therefore, loaded as a "1" during the next positive period of the clock signal PH1. In other words, since the data in the data input latch LDIN is not valid, the stage signals that it is ready to accept input data (since it does not hold any data worth saving).

In this example, note that the signal IN_ACCEPT is used to enable the data and validation latches LDIN and LVIN. Since the signal IN_ACCEPT at this time is a "1", these latches effectively work as conventional transparent latches so that whatever data is on the IN_DATA bus simply is loaded into the data latch LDIN as soon as the clock signal PH0 goes to a "1". Of course, this invalid data will also be loaded into the next data latch LDOUT of the following pipeline stage as long as the output QAOUT from its acceptance latch is a "1".

Hence, as long as a data latch does not contain valid data, it accepts or "loads" any data presented to it during the next positive period of its respective clock signal. On the other hand, such invalid data is not loaded in any stage for which the acceptance signal from its corresponding acceptance latch is low (that is, a "0"). Furthermore, the output signal from a validation latch (which forms the validation input signal to the subsequent validation latch) remains a "0" as long as the corresponding IN_VALID (or QVIN) signal to the validation latch is low.

When the input data to a data latch is valid, the validation signal IN_VALID indicates this by rising to a "1". The output of the corresponding validation latch then rises to a "1" on the next rising edge of its respective clock phase signal. For example, the validation input signal QVIN of latch LVIN rises to a "1" when its corresponding IN_VALID signal goes high (that is, rises to a "1") on the next rising edge of the clock phase signal PH0.

Assume now, instead, that the data input latch LDIN contains valid data. If the data output latch LDOUT is ready to accept new data, its acceptance signal QAOUT will be a "1". In this case, during the next positive period of the clock signal PH1, the data latch LDOUT and validation latch LVOUT will be enabled, and the data latch LDOUT will load the data present at its input. This will occur before the next rising edge of the other clock signal PH0, since the clock signals are non-overlapping. At the next rising edge of PH0, the preceding data latch (LDIN) will, therefore, not latch in new input data from the preceding stage until the data output latch LDOUT has safely latched the data transferred from the latch LDIN.

Accordingly, the same sequence is followed by every adjacent pair of data latches (within a stage or between adjacent stages) that are able to accept data, since they will be operating based on alternate phases of the clock. Any data latch that is not ready to accept new data because it contains valid data that cannot yet be passed, will have an output acceptance signal (the QA output from its acceptance latch LA) that is LOW, and its data latch LDIN or LDOUT will not be loaded. Hence, as long as the acceptance signal (the output from the acceptance latch) of a given stage or side (input or output) of a stage is LOW, its corresponding data latch will not be loaded.

FIG. 4 also shows a reset feature included in a preferred embodiment. In the illustrated example, a reset signal NOTRESET0 is connected to an inverting reset input R (inversion is hereby indicated by a small circle, as is conventional) of the validation output latch LVOUT. As is well known, this means that the validation latch LVOUT will be forced to output a "0" whenever the reset signal NOTRESET0 becomes a "0". One advantage of resetting the latch when the reset signal goes low (becomes a "0") is that a break in transmission will reset the latches. They will then be in their "null" or reset state whenever a valid transmission begins and the reset signal goes HIGH. The reset signal NOTRESET0, therefore, operates as a digital "ON/OFF" switch, such that it must be at a HIGH value in order to activate the pipeline.

Note that it is not necessary to reset all of the latches that hold valid data in the pipeline. As depicted in FIG. 4, the validation input latch LVIN is not directly reset by the reset signal NOTRESET0, but rather is reset indirectly. Assume that the reset signal NOTRESET0 drops to a "0". The validation output signal QVOUT also drops to a "0", regardless of its previous state, whereupon the input to the acceptance output latch LAOUT (via the gate NAND1) goes HIGH. The acceptance output signal QAOUT also rises to a "1". This QAOUT value of "1" is then transferred as a "1" to the input of the acceptance input latch LAIN regardless of the state of the validation input signal QVIN. The acceptance input signal QAIN then rises to a "1" at the next rising edge of the clock signal PH1. Assuming that the validation signal IN_VALID has been correctly reset to a "0", then upon the subsequent rising edge of the clock signal PH0, the output from the validation latch LVIN will become a "0", as it would have done if it had been reset directly.

As this example illustrates, it is only necessary to reset the validation latch in only one side of each stage (including the final stage) in order to reset all validation latches. In fact, in many applications, it will not be necessary to reset every other validation latch: If the reset signal NOTRESET0 can be guaranteed to be low during more than one complete cycle of both phases PH0, PH1 of the clock, then the "automatic reset" (a backwards propagation of the reset signal) will occur for validation latches in preceding pipeline stages. Indeed, if the reset signal is held low for at least as many full cycles of both phases of the clock as there are pipeline stages, it will only be necessary to directly reset the validation output latch in the final pipeline stage.

Figure 5A:
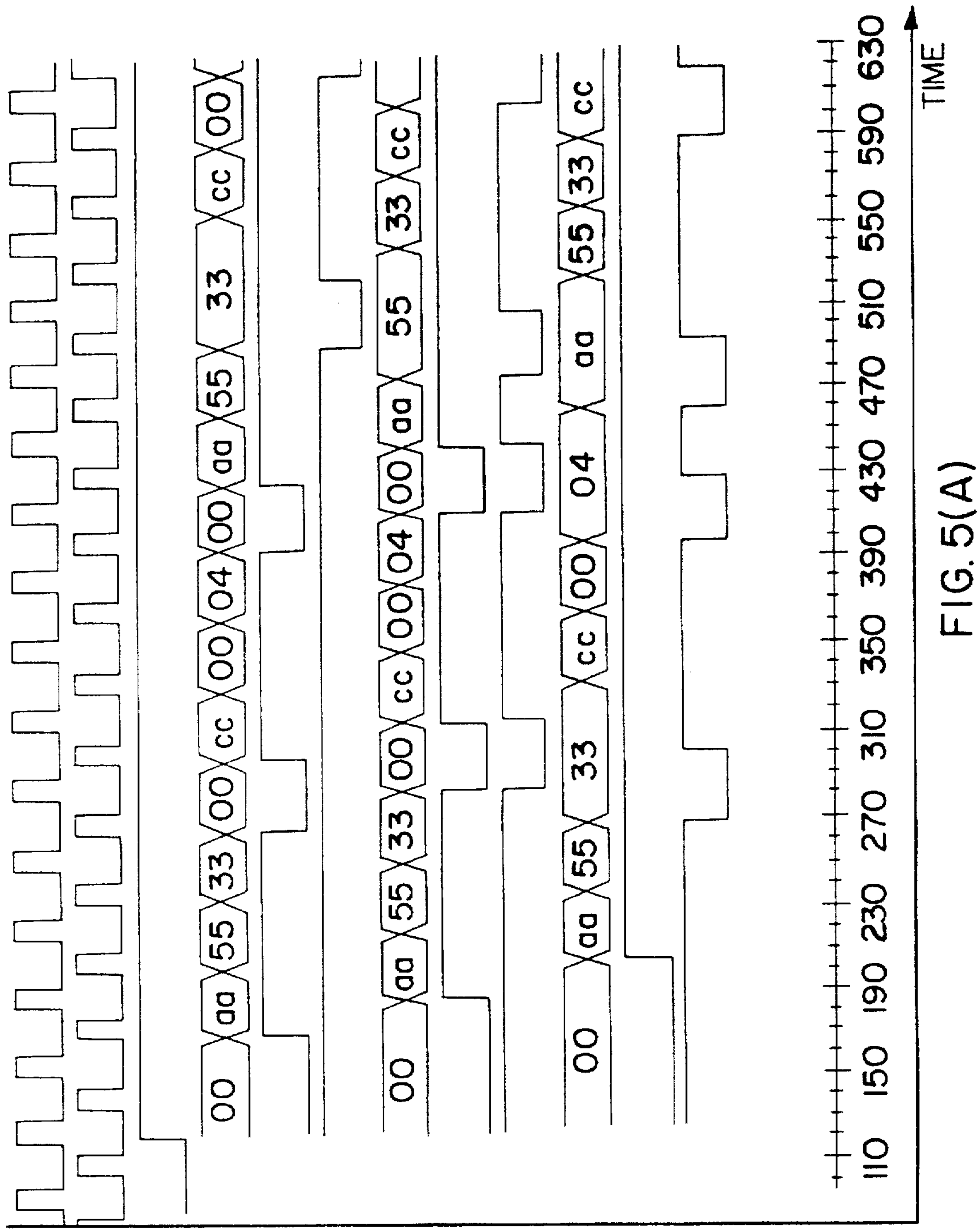
FIGS. 5*a* and 5*b* taken together depict one example of a timing diagram that shows the relationship between timing signals, input and output data, and internal control signals used in the pipeline stage as shown in FIG. 4.
Figure 5B:
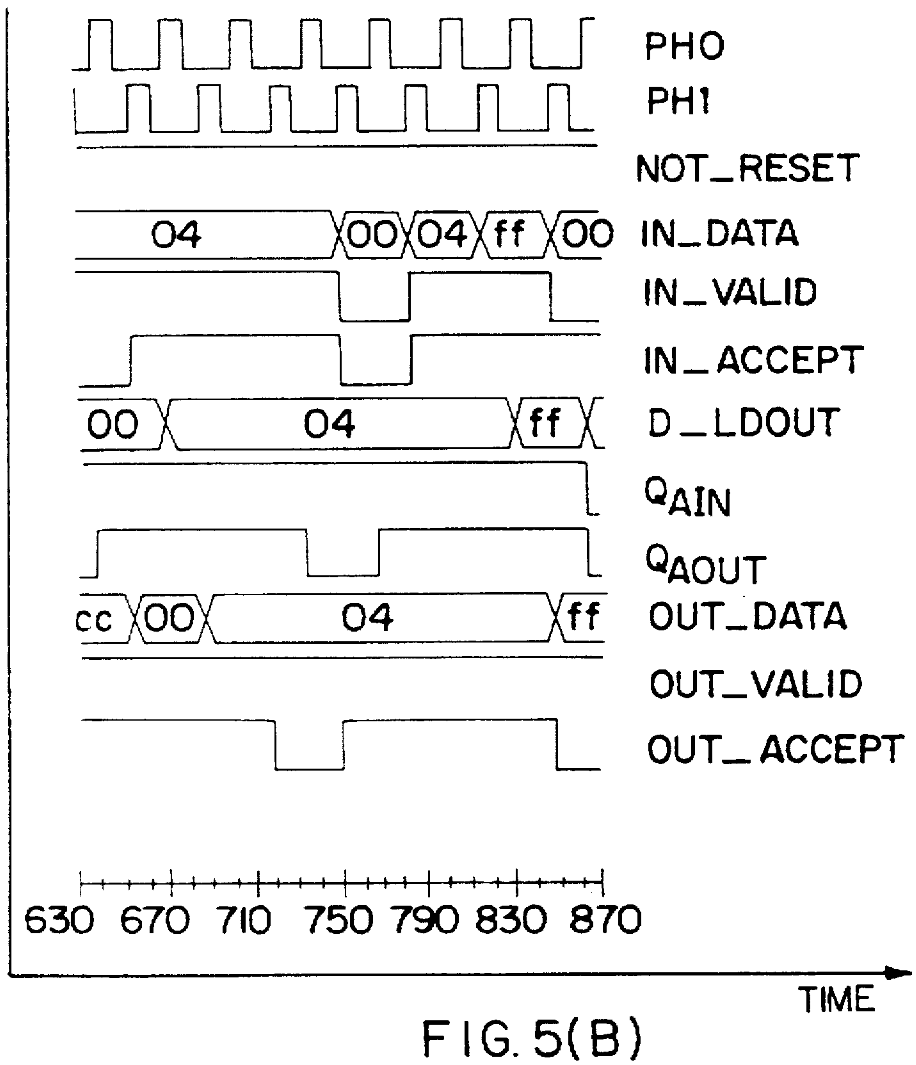

FIGS. 5*a* and 5*b* (referred to collectively as FIG. 5) illustrate a timing diagram showing the relationship between the non-overlapping clock signals PH0, PH1, the effect of the reset signal, and the holding and transfer of data for the different permutations of validation and acceptance signals into and between the two illustrated sides of a pipeline stage configured in the embodiment shown in FIG. 4. In the example illustrated in the timing diagram of FIG. 5, it has been assumed that the outputs from the data latches LDIN, LDOUT are passed without further manipulation by intervening logic blocks B1, B2. This is by way of example and not necessarily by way of limitation. It is to be understood that any combinatorial logic structures may be included between the data latches of consecutive pipeline stages, or between the input and output sides of a single pipeline stage. The actual illustrated values for the input data (for example the HEX data words "aa" or "04") are also merely illustrative. As is mentioned above, the input data bus may have any width (and may even be analog), as long as the data latches or other storage devices are able to accommodate and latch or store each bit or value of the input word.

Preferred Data Structure—"tokens"

In the sample application shown in FIG. 4, each stage processes all input data, since there is no control circuitry that excludes any stage from allowing input data to pass through its combinatorial logic block B1, B2, and so forth. To provide greater flexibility, the present invention includes a data structure in which "tokens" are used to distribute data and control information throughout the system. Each token consists of a series of binary bits separated into one or more blocks of token words. Furthermore, the bits fall into one of three types: address bits (A), data bits (D), or an extension bit (E). Assume by way of example and, not necessarily by way of limitation, that data is transferred as words over an 8-bit bus with a 1-bit extension bit line. An example of a four-word token is, in order of transmission:

| | | | | | | | | | |
|---|---|---|---|---|---|---|---|---|---|
| First word: | E | A | A | A | D | D | D | D | D |
| Second word: | E | D | D | D | D | D | D | D | D |
| Third word: | E | D | D | D | D | D | D | D | D |
| Fourth word: | E | D | D | D | D | D | D | D | D |

Note that the extension bit E is used as an addition (preferably) to each data word. In addition, the address field can be of variable length and is preferably transmitted just after the extension bit of the first word.

Tokens, therefore, consist of one or more Words of (binary) digital data in the present invention. Each of these words is transferred in sequence and preferably in parallel, although this method of transfer is not necessary: serial data transfer is also possible using known techniques. For example, in a video parser, control information is transmitted in parallel, whereas data is transmitted serially.

As the example illustrates, each token has, preferably at the start, an address field (the string of A-bits) that identifies the type of data that is contained in the token. In most applications, a single word or portion of a word is sufficient to transfer the entire address field, but this is not necessary in accordance with the invention, so long as logic circuitry is included in the corresponding pipeline stages that is able to store some representation of partial address fields long enough for the stages to receive and decode the entire address field.

Note that no dedicated wires or registers are required to transmit the address field. It is transmitted using the data bits. As is explained below, a pipeline stage will not be slowed down if it is not intended to be activated by the particular address field, i.e., the stage will be able to pass along the token without delay.

The remainder of the data in the token following the address field is not constrained by the use of tokens. These D-data bits may take on any values and the meaning attached to these bits is of no importance here. That is, the meaning of the data can vary, for example, depending upon where the data is positioned within the system at a particular point in time. The number of data bits D appended after the address field can be as long or as short as required, and the number of data words in different tokens may vary greatly. The address field and extension bit are used to convey control signals to the pipeline stages. Because the number of words in the data field (the string of D bits) can be arbitrary, as can be the information conveyed in the data field can also vary accordingly. The explanation below is, therefore, directed to the use of the address and extension bits.

In the present invention, tokens are a particularly useful data structure when a number of blocks of circuitry are connected together in a relatively simple configuration. The simplest configuration is a pipeline of processing steps. For example, in the one shown in FIG. 1. The use of tokens, however, is not restricted to use on a pipeline structure.

Assume once again that each box represents a complete pipeline stage. In the pipeline of FIG. 1, data flows from left to right in the diagram. Data enters the machine and passes into processing Stage A. This may or may not modify the data and it then passes the data to Stage B. The modification, if any, may be arbitrarily complicated and, in general, there will not be the same number of data items flowing into any stage as flow out. Stage B modifies the data again and passes it onto Stage C, and so forth. In a scheme such as this, it is impossible for data to flow in the opposite direction, so that, for example, Stage C cannot pass data to Stage A. This restriction is often perfectly acceptable.

On the other hand, it is very desirable for Stage A to be able to communicate information to Stage C even though there is no direct connection between the two blocks. Stage A and C communication is only via Stage B. One advantage of the tokens is their ability to achieve this kind of communication. Since any processing stage that does not recognize a token simply passes it on unaltered to the next block.

According to this example, an extension bit is transmitted along with the address and data fields in each token so that a processing stage can pass on a token (which can be of arbitrary length) without having to decode its address at all. According to this example, any token in which the extension bit is HIGH (a "1") is followed by a subsequent word which is part of the same token. This word also has an extension bit, which indicates whether there is a further token word in the token. When a stage encounters a token word whose extension bit is LOW (a "0"), it is known to be the last word of the token. The next word is then assumed to be the first word of a new token.

Note that although the simple pipeline of processing stages is particularly useful, it will be appreciated that tokens may be applied to more complicated configurations of processing elements. An example of a more complicated processing element is described below.

It is not necessary, in accordance with the present invention, to use the state of the extension bit to signal the last word of a given token by giving it an extension bit set to "0". One alternative to the preferred scheme is to move the extension bit so that it indicates the first word of a token instead of the last. This can be accomplished with appropriate changes in the decoding hardware.

The advantage of using the extension bit of the present invention to signal the last word in a token rather than the first, is that it is often useful to modify the behavior of a block of circuitry depending upon whether or not a token has extension bits. An example of this is a token that activates a stage that processes video quantization values stored in a quantization table (typically a memory device). For example, a table containing 64 eight-bit arbitrary binary integers.

In order to load a new quantization table into the quantizer stage of the pipeline, a "QUANT_TABLE" token is sent to the quantizer. In such a case the token, for example, consists of 65 token words. The first word contains the code "QUANT_TABLE", i.e., build a quantization table. This is followed by 64 words, which are the integers of the quantization table.

When encoding video data, it is occasionally necessary to transmit such a quantization table. In order to accomplish this function, a QUANT_TABLE token with no extension words can be sent to the quantizer stage. On seeing this token, and noting that the extension bit of its first word is LOW, the quantizer stage can read out its quantization table and construct a QUANT_TABLE token which includes the 64 quantization table values. The extension bit of the first word (which was LOW) is changed so that it is HIGH and the token continues, with HIGH extension bits, until the new end of the token, indicated by a LOW extension bit on the sixty fourth quantization table value. This proceeds in the typical way through the system and is encoded into the bit stream.

Continuing with the example, the quantizer may either load a new quantization table into its own memory device or read out its table depending on whether the first word of the QUANT_TABLE token has its extension bit set or not.

The choice of whether to use the extension bit to signal the first or last token word in a token will, therefore, depend on the system in which the pipeline will be used. Both alternatives are possible in accordance with the invention.

Another alternative to the preferred extension bit scheme is to include a length count at the start of the token. Such an arrangement may, for example, be efficient if a token is very long. For example, assume that a typical token in a given application is 1000 words long. Using the illustrated extension bit scheme (with the bit attached to each token word), the token would require 1000 additional bits to contain all the extension bits. However, only ten bits would be required to encode the token length in binary form.

Although there are, therefore, uses for long tokens, experience has shown that there are many uses for short tokens. Here the preferred extension bit scheme is advantageous. If a token is only one word long, then only one bit is required to signal this. However, a counting scheme would typically require the same ten bits as before.

Disadvantages of a length count scheme include the following: 1) it is inefficient for short tokens; 2) it places a maximum length restriction on a token (with only ten bits, no more than 1023 words can be counted); 3) the length of a token must be known in advance of generating the count (which is presumably at the start of the token); 4) every block of circuitry that deals with tokens would need to be provided with hardware to count words; and 5) if the count should get corrupted (due to a data transmission error) it is not clear whether recovery can be achieved.

The advantages of the extension bit scheme in accordance with the present invention include: 1) pipeline stages need not include a block of circuitry that decodes every token since unrecognized tokens can be passed on correctly by considering only the extension bit; 2) the coding of the extension bit is identical for all tokens; 3) there is no limit placed on the length of a token; 4) the scheme is efficient (in terms of overhead to represent the length of the token) for short tokens; and 5) error recovery is naturally achieved. If an extension bit is corrupted then one random token will be generated (for an extension bit corrupted from "1" to "0") or a token will be lost (extension bit corrupted "0" to "1"). Furthermore, the problem is localized to the tokens concerned. After that token, correct operation is resumed automatically.

In addition, the length of the address field may be varied. This is highly advantageous since it allows the most common tokens to be squeezed into the minimum number of words. This, in turn, is of great importance in video data pipeline systems since it ensures that all processing stages can be continuously running at full bandwidth.

In accordance to the present invention, in order to allow variable length address fields, the addresses are chosen so that a short address followed by random data can never be confused with a longer address. The preferred technique for encoding the address field (which also serves as the "code" for activating an intended pipeline stage) is the well-known technique first described by Huffman, hence the common name "Huffman Code". Nevertheless, it will be appreciated by one of ordinary skill in the art, that other coding schemes may also be successfully employed.

Although Huffman encoding is well understood in the field of digital design, the following example provides a general background:

Huffman codes consist of words made up of a string of symbols (in the context of digital systems, such as the present invention, the symbols are usually binary digits). The code words may have variable length and the special property of Huffman code words is that a code word is chosen so that none of the longer code words start with the symbols that form a shorter code word. In accordance with the invention, token address fields are preferably (although not necessarily) chosen using known Huffman encoding techniques.

Also in the present invention, the address field preferably starts in the most significant bit (MSB) of the first word token. (Note that the designation of the MSB is arbitrary and that this scheme can be modified to accommodate various designations of the MSB.) The address field continues through contiguous bits of lesser significance. If, in a given application, a token address requires more than one token word, the least significant bit in any given word the address field will continue in the most significant bit of the next word. The minimum length of the address field is one bit.

Any of several known hardware structures can be used to generate the tokens used in the present invention. One such structure is a microprogrammed state machine. However, known microprocessors or other devices may also be used.

The principle advantage of the token scheme in accordance with the present invention, is its adaptability to unanticipated needs. For example, if a new token is introduced, it is most likely that this will affect only a small number of pipeline stages. The most likely case is gnat only two stages or blocks of circuitry are affected, i.e., the one block that generates the tokens in the first place and the block or stage that has been newly designed or modified to deal with this new token. Note that it is not necessary to modify any other pipeline stages. Rather, these will be able to deal with the new token without modification to their designs because they will not recognize it and will, accordingly, pass that token on unmodified.

This ability of the present invention to leave substantially existing designed devices unaffected has clear advantages. It may be possible to leave some semiconductor chips in a chip set completely unaffected by a design improvement in some other chips in the set. This is advantageous both from the perspective of a customer and from that of a chip manufacturer. Even if modifications mean that all chips are affected by the design change (a situation that becomes increasingly likely as levels of integration progress so that the number of chips in a system drops) there will still be the considerable advantage of better time-to-market than can be achieved, since the same design can be reused.

In particular, note the situation that occurs when it becomes necessary to extend the token set to include two word addresses. Even in this case, it is still not necessary to modify an existing design. Token decoders in the pipeline stages will attempt to decode the first word of such a token and will conclude that it does not recognize the token. It will then pass on the token unmodified using the extension bit to perform this operation correctly. It will not attempt to decode the second word of the token (even though this contains address bits) because it will "assume" that the second word is part of the data field of a token that it does not recognize.

In many cases, a pipeline stage or a connected block of circuitry will modify a token. This usually, but not necessarily, takes the form of modifying the data field of a token. In addition, it is common for the number of data words in the token to be modified, either by removing certain data words or by adding new ones. In some cases, tokens are removed entirely from the token stream.

In most applications, pipeline stages will typically only decode (be activated by) a few tokens; the stage does not recognize other tokens and passes them on unaltered. In a large number of cases, only one token is decoded, the DATA Token word itself.

In many applications, the operation of a particular stage will depend upon the results of its own past operations. The "state" of the stage, thus, depends on its previous states. In other words, the stage depends upon stored state information, which is another way of saying it must retain some information about its own history one or more clock cycles ago. The present invention is well-suited for use in pipelines that include such "state machine" stages, as well as for use in applications in which the latches in the data path are simple pipeline latches.

The suitability of the two-wire interface, in accordance with the present invention, for such "state machine" circuits is a significant advantage of the invention. This is especially true where a data path is being controlled by a state machine. In this case, the two-wire interface technique above-described may be used to ensure that the "current state" of the machine stays in step with the data which it is controlling in the pipeline.

Figure 6:
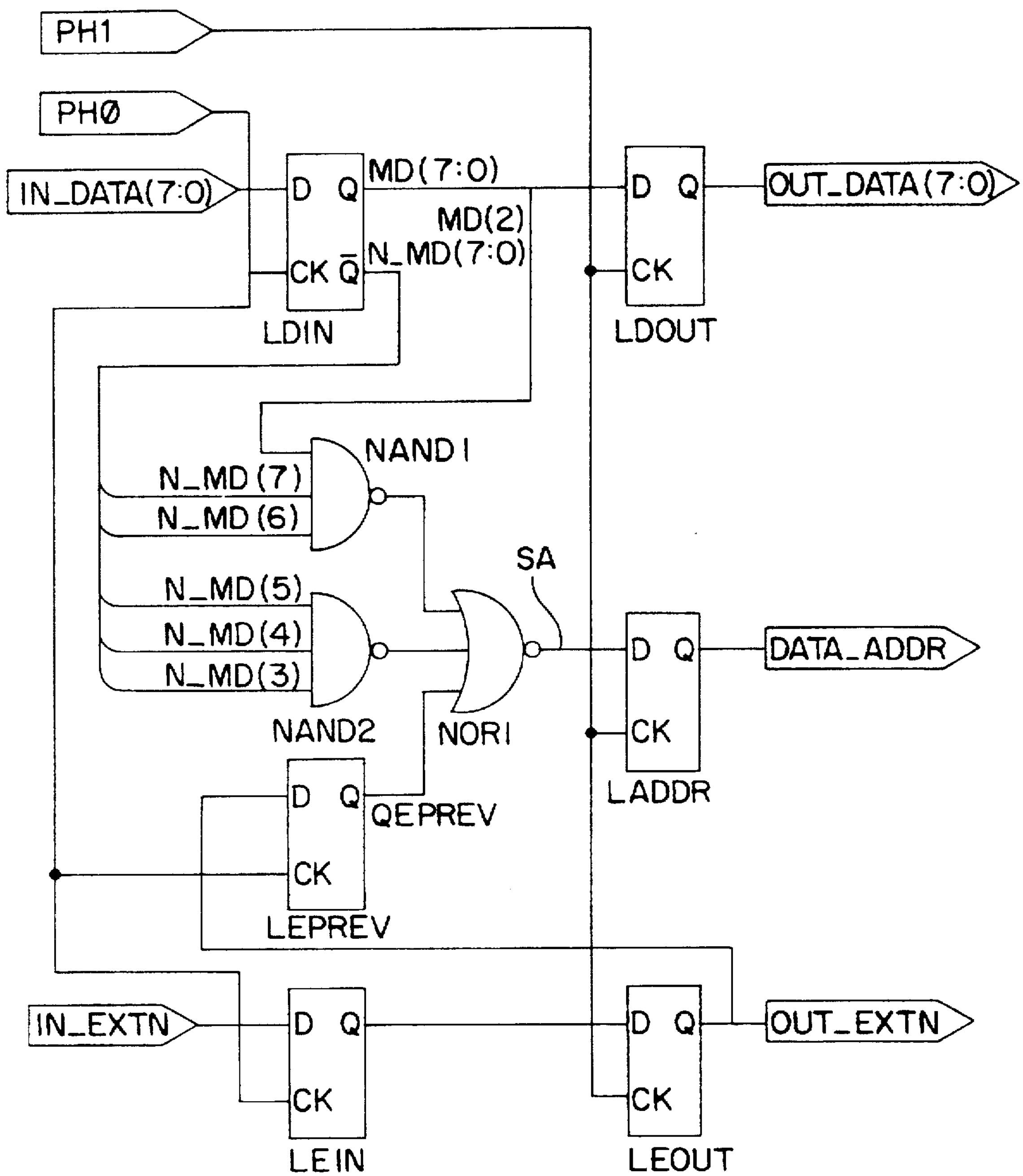
FIG. 6 is a block diagram of one example of a pipeline stage that holds its state under the control of an extension bit.

FIG. 6 shows a simplified block diagram of one example of circuitry included in a pipeline stage for decoding a token address field. This illustrates a pipeline stage that has the characteristics of a "state machine". Each word of a token includes an "extension bit" which is HIGH if there are more words in the token or LOW if this is the last word of the token. If this is the last word of a token, the next valid data word is the start of a new token and, therefore, its address must be decoded. The decision as to whether or not to decode the token address in any given word, thus, depends upon knowing the value of the previous extension bit.

For the sake of simplicity only, the two-wire interface (with the acceptance and validation signals and latches) is not illustrated and all details dealing with resetting the circuit are omitted. As before, an 8-bit data word is assumed by way of example only and not by way of limitation.

This exemplifying pipeline stage delays the data bits and the extension bit by one pipeline stage. It also decodes the DATA Token. At the point when the first word of the DATA Token is presented at the output of the circuit, the signal "DATA_ADDR" is created and set HIGH. The data bits are delayed by the latches LDIN and LDOUT, each of which is repeated eight times for the eight data bits used in this example (corresponding to an 8-input, 8-output latch). Similarly, the extension bit is delayed by extension bit latches LEIN and LEOUT.

In this example, the latch LEPREV is provided to store the most recent state of the extension bit. The value of the extension bit is loaded into LEIN and is then loaded into LEOUT on the next rising edge of the non-overlapping clock phase signal PH1. Latch LEOUT, thus, contains the value of the current extension bit, but only during the second half of the non-overlapping, two-phase clock. Latch LEPREV, however, loads this extension bit value on the next rising edge of the clock signal PH0, that is, the same signal that enables the extension bit input latch LEIN. The output QEPREV of the latch LEPREV, thus, will hold the value of the extension bit during the previous PH0 clock phase.

The five bits of the data word output from the inverting Q output, plus the non-inverted MD[2], of the latch LDIN are combined with the previous extension bit value QEPREV in a series of logic gates NAND1, NAND2, and NOR1, whose operations are well known in the art of digital design. The designation "N_MD[m] indicates the logical inverse of bit m of the mid-data word MD[7:0]. Using known techniques of Boolean algebra, it can be shown that the output signal SA from this logic block (the output from NOR1) is HIGH (a "1") only when the previous extension bit is a "0" (QPREV= "0") and the data word at the output of the non-inverting Q latch (the original input word) LDIN has the structure "000001xx", that is, the five high-order bits MD[7]–MD[3] bits are all "0" and the bit MD[2] is a "1" and the bits in the Zero-one positions have any arbitrary value.

There are, thus, four possible data words (there are four permutations of "xx") that will cause SA and, therefore, the output of the address signal latch LADDR to whose input SA is connected, to become HIGH. In other words, this stage provides an activation signal (DATA_ADDR="1") only when one of the four possible proper tokens is presented and only when the previous extension bit was a zero, that is, the previous data word was the last word in the previous series of token words, which means that the current token word is the first one in the current token.

When the signal QPREV from latch LEPREV is LOW, the value at the output of the latch LDIN is therefore the first word of a new token. The gates NAND1, NAND2 and NOR1 decode the DATA token (000001xx). This address decoding signal SA is, however, delayed in latch LADDR so that the signal DATA_ADDR has the same timing as the output data OUT_DATA and OUT_EXTN.

Figure 7:
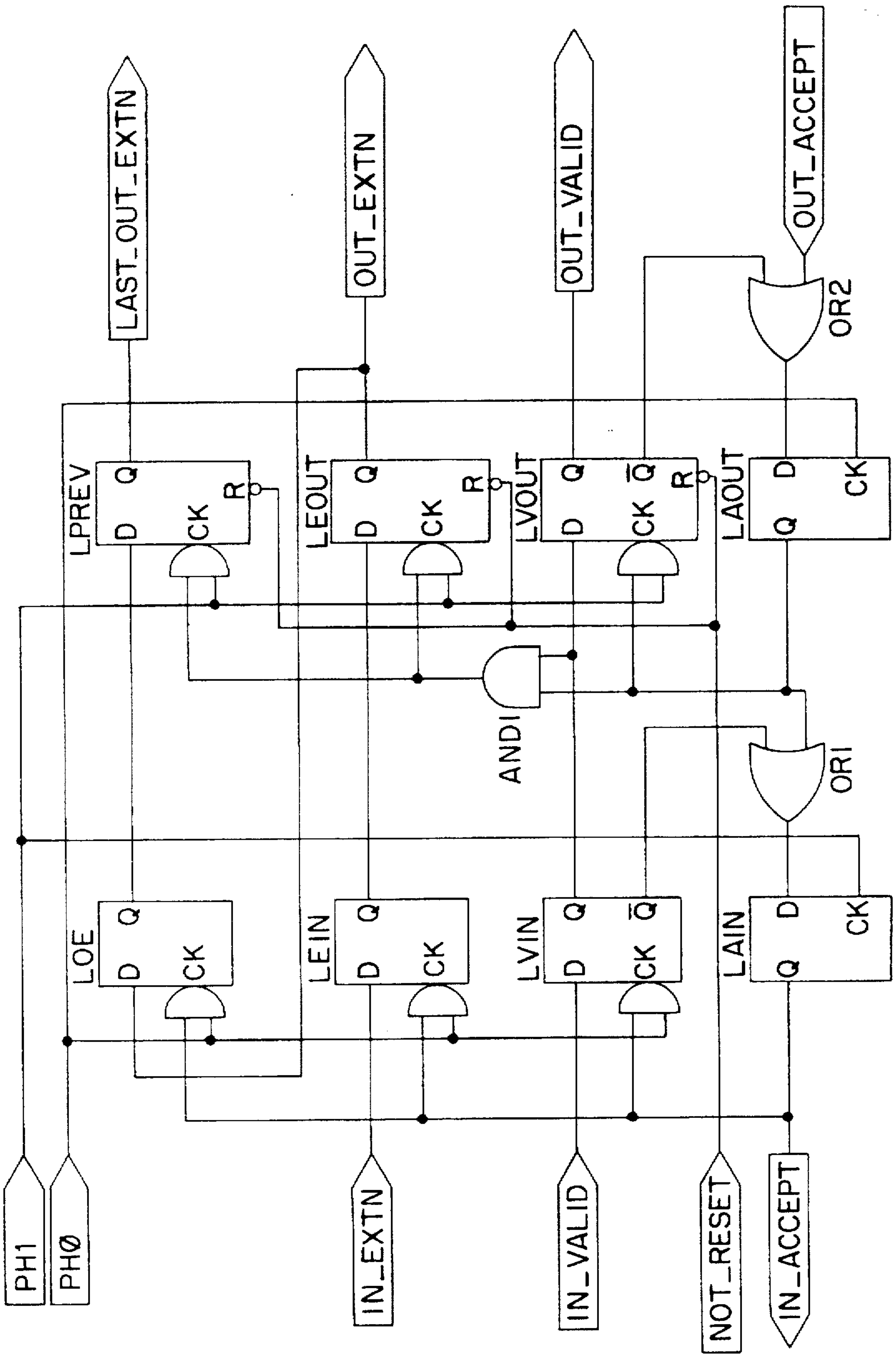
FIG. 7 is a block diagram of a pipeline stage that decodes stage activation data words.

FIG. 7 is another simple example of a state-dependent pipeline stage in accordance with the present invention, which generates the signal LAST_OUT_EXTN to indicate the value of the previous output extension bit OUT_EXTN. One of the two enabling signals (at the CK inputs) to the present and last extension bit latches, LEOUT and LEPREV, respectively, is derived from the gate AND1 such that these latches only load a new value for them when the data is valid and is being accepted (the Q outputs are HIGH from the output validation and acceptance latches LVOUT and LAOUT, respectively). In this way, they only hold valid extension bits and are not loaded with spurious values associated with data that is not valid. In the embodiment shown in FIG. 7, the two-wire valid/accept logic includes the OR1 and OR2 gates with input signals consisting of the downstream acceptance signals and the inverting output of the validation latches LVIN and LVOUT, respectively. This illustrates one way in which the gates NAND1/2 and INV1/2 in FIG. 4 can be replaced if the latches have inverting outputs.

Although this is an extremely simple example of a "state-dependent" pipeline stage, i.e., since it depends on the state of only a single bit, it is generally true that all latches holding state information will be updated only when data is actually transferred between pipeline stages. In other words, only when the data is both valid and being accepted by the next stage. Accordingly, care must be taken to ensure that such latches are properly reset.

The generation and use of tokens in accordance with the present invention, thus, provides several advantages over known encoding techniques for data transfer through a pipeline.

First, the tokens, as described above, allow for variable length address fields (and can utilize Huffman coding for example) to provide efficient representation of common tokens.

Second, consistent encoding of the length of a token allows the end of a token (and hence the start of the next token) to be processed correctly (including simple non-manipulative transfer), even if the token is not recognized by the token decoder circuitry in a given pipeline stage.

Third, rules and hardware structures for the handling of unrecognized tokens (that is, for passing them on unmodified) allow communication between one stage and a downstream stage that is not its nearest neighbor in the pipeline. This also increases the expandability and efficient adaptability of the pipeline since it allows for future changes in the token set without requiring large scale redesigning of existing pipeline stages. The tokens of the present invention are particularly useful when used in conjunction with the two-wire interface that is described above and below.

As an example of the above, FIGS. 8*a* and 8*b*, taken together (and referred to collectively below as FIG. 8), depict a block diagram of a pipeline stage whose function is as follows. If the stage is processing a predetermined token (known in this example as the DATA token), then it will duplicate every word in this token with the exception of the first one, which includes the address field of the DATA token. If, on the other hand, the stage is processing any other kind of token, it will delete every word. The overall effect is that, at the output, only DATA Tokens appear and each word within these tokens is repeated twice.

Many of the components of this illustrated system may be the same as those described in the much simpler structures shown in FIGS. 4, 6, and 7. This illustrates a significant advantage. More complicated pipeline stages will still enjoy the same benefits of flexibility and elasticity, since the same two-wire interface may be used with little or no adaptation.

The data duplication stage shown in FIG. 8 is merely one example of the endless number of different types of operations that a pipeline stage could perform in any given application. This "duplication stage" illustrates, however, a stage that can form a "bottleneck", so that the pipeline according to this embodiment will "pack together".

A "bottleneck" can be any stage that either takes a relatively long time to perform its operations, or that creates more data in the pipeline than it receives. This example also illustrates that the two-wire accept/valid interface according to this embodiment can be adapted very easily to different applications.

Figure 8A:
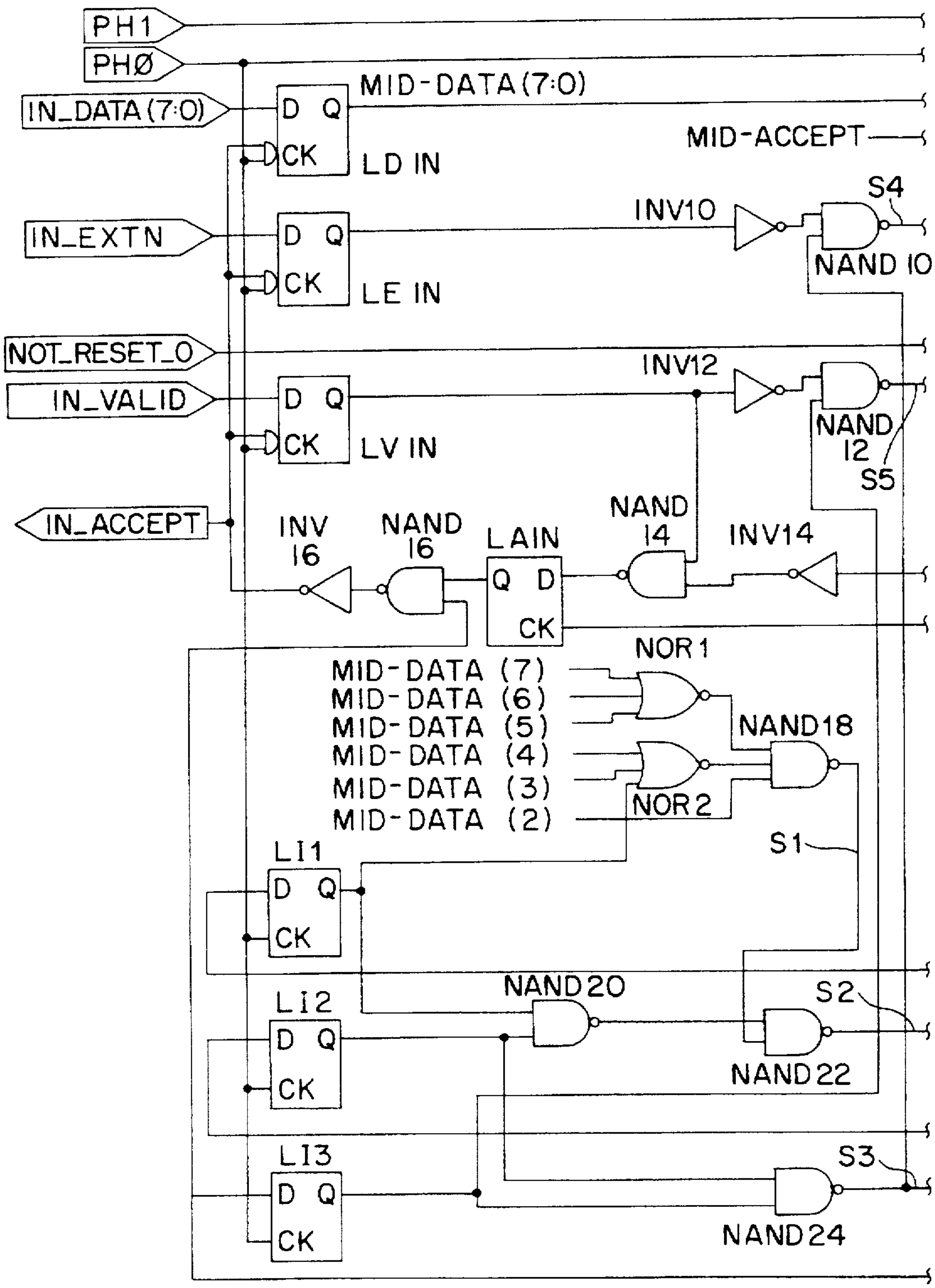
FIGS. 8*a* and 8*b* taken together form a block diagram showing the use of the two-wire transfer control in an exemplifying "data duplication" pipeline stage.

The duplication stage shown in FIG. 8 also has two latches LEIN and LEOUT that, as in the example shown in FIG. 6, latch the state of the extension bit at the input and at the output of the stage, respectively. As FIG. 8*a* shows, the input extension latch LEIN is clocked synchronously with the input data latch LDIN and the validation signal IN_VALID.

For ease of reference, the various latches included in the duplication stage are paired below with their respective output signals:

In the duplication stage, the output from the data latch LDIN forms intermediate data referred to as MID_DATA. This intermediate data word is loaded into the data output latch LDOUT only when an intermediate acceptance signal (labeled "MID_ACCEPT" in FIG. 8*a*) is set HIGH.

The portion of the circuitry shown in FIG. 8 below the acceptance latches LAIN, LAOUT, shows the circuits that are added to the basic pipeline structure to generate the various internal control signals used to duplicate data. These include a "DATA_TOKEN" signal that indicates that the circuitry is currently processing a valid DATA Token, and a NOT_DUPLICATE signal which is used to control duplication of data. When the circuitry is processing a DATA Token, the NOT_DUPLICATE signal toggles between a HIGH and a LOW state and this causes each word in the token to be duplicated once (but no more times). When the circuitry is not processing a valid DATA Token then the NOT_DUPLICATE signal is held in a HIGH state. Accordingly, this means that the token words that are being processed are not duplicated.

As FIG. 8*a* illustrates, the upper six bits of 8-bit intermediate data word and the output signal QI1 from the latch LI1 form inputs to a group of logic gates NOR1, NOR2, NAND18. The output signal from the gate NAND18 is labeled S1. Using well-known Boolean algebra, it can be shown that the signal S1 is a "0" only when the output signal QI1 is a "1" and the MID_DATA word has the following structure: "000001xx", that is, the upper five bits are all "0", the bit MID_DATA[2] is a "1" and the bits in the MID_DATA[1] and MID_DATA[0] positions have any arbitrary value. Signal S1, therefore, acts as a "token identification signal" which is low only when the MID_DATA signal has a predetermined structure and the output from the latch LI1 is a "1". The nature of the latch LI1 and its output QI1 is explained further below.

Latch LO1 performs the function of latching the last value of the intermediate extension bit (labeled "MID_EXTN" and as signal S4), and it loads this value on the next rising edge of the clock phase PH0 into the latch LI1, whose output is the bit QI1 and is one of the inputs to the token decoding logic group that forms signal S1. Signal S1, as is explained above, may only drop to a "0" if the signal QI1 is a "1" (and the MID_DATA signal has the predetermined structure). Signal S1 may, therefore, only drop to a "0" whenever the last extension bit was "0", indicating that the previous token has ended. Therefore, the MID_DATA word is the first data word in a new token.

The latches LO2 and LI2 together with the NAND gates NAND20 and NAND22 form storage for the signal, DATA_TOKEN. In the normal situation, the signal QI1 at the input to NAND20 and the signal S1 at the input to NAND22 will both be at logic "1". It can be shown, again by the techniques of Boolean algebra, that in this situation these NAND gates operate in the same manner as inverters, that is, the signal QI2 from the output of latch LI2 is inverted in NAND20 and then this signal is inverted again by NAND22 to form the signal S2. In this case, since there are two logical inversions in this path, the signal S2 will have the same value as QI2.

It can also be seen that the signal DATA_TOKEN at the output of latch LO2 forms the input to latch LI2. As a result, as long as the situation remains in which both QI1 and S1 are HIGH, the signal DATA_TOKEN will retain its state (whether "0" or "1"). This is true even though the clock signals PH0 and PH1 are clocking the latches (LI2 and LO2 respectively). The value of DATA_TOKEN can only change when one or both of the signals QI1 and S1 are "0".

As explained earlier, the signal QI1 will be "0" when the previous extension bit was "0". Thus, it will be "0" whenever the MID_DATA value is the first word of a token (and, thus, includes the address field for the token). In this situation, the signal S1 may be either "0" or "1". As explained earlier, signal S1 will be "0" if the MID_DATA word has the predetermined structure that in this example indicates a "DATA" Token. If the MID_DATA word has any other structure, (indicating that the token is some other token, not a DATA Token), S1 will be "1".

If QI1 is "0" and S1 is "1", this indicates there is some token other than a DATA Token. As is well known in the field of digital electronics, the output of NAND20 will be "1". The NAND gate NAND22 will invert this (as previously explained) and the signal S2 will thus be a "0". As a result, this "0" value will be loaded into latch LO2 at the start of the next PH1 clock phase and the DATA_TOKEN signal will become "0", indicating that the circuitry is not processing a DATA token.

If QI1 is "0" and S0 is "0", thereby indicating a DATA token, then the signal S2 will be "1" (regardless of the other input to NAND22 from the output of NAND20). As a result, this "1" value will be loaded into latch LO2 at the start of the next PH1 clock phase and the DATA_TOKEN signal will become "1", indicating that the circuitry is processing a DATA token.

The NOT_DUPLICATE signal (the output signal QO3) is similarly loaded into the latch LI3 on the next rising edge of the clock PH0. The output signal QI3 from the latch LI3 is combined with the output signal QI2 in a gate NAND24 to form the signal S3. As before, Boolean algebra can be used to show that the signal S3 is a "0" only when both of the signals QI2 and QI3 have the value "1". If the signal QI2 becomes a "0", that is, the DATA TOKEN signal is a "0", then the signal S3 becomes a "1". In other words, if there is not a valid DATA TOKEN (QI2=0) or the data word is not a duplicate (QI3=0), then the signal S3 goes high.

Assume now, that the DATA TOKEN signal remains HIGH for more than one clock signal. Since the NOT_DUPLICATE signal (QO3) is "fed back" to the latch LI3 and will be inverted by the gate NAND 24 (since its other input QI2 is held HIGH), the output signal QO3 will toggle between "0" and "1". If there is no valid DATA Token, however, the signal QI2 will be a "0", and the signal S3 and the output QO3, will be forced HIGH until the DATE_TOKEN signal once again goes to a "1".

The output QO3 (the NOT_DUPLICATE signal) is also fed back and is combined with the output QA1 from the acceptance latch LAIN in a series of logic gates (NAND16 and INV16, which together form an AND gate) that have as their output a "1", only when the signals QA1 and QO3 both have the value "1". As FIG. 8*a* shows, the output from the AND gate (the gate NAND16 followed by the gate INV16) also forms the acceptance signal, IN_ACCEPT, which is used as described above in the two-wire interface structure.

The acceptance signal IN_ACCEPT is also used as an enabling signal to the latches LDIN, LEIN, and LVIN. As a result, if the NOT_DUPLICATE signal is low, the acceptance signal IN_ACCEPT will also be low, and all three of these latches will be disabled and will hold the values stored at their outputs. The stage will not accept new data until the NOT_DUPLICATE signal becomes HIGH. This is in addition to the requirements described above for forcing the output from the acceptance latch LAIN high.

As long as there is a valid DATA_TOKEN (the DATA_TOKEN signal QO2 is a "1"), the signal QO3 will toggle between the HIGH and LOW states, so that the input latches will be enabled and will be able to accept data, at most, during every other complete cycle of both clock phases PH0, PH1. The additional condition that the following stage be prepared to accept data, as indicated by a "HIGH" OUT_ACCEPT signal, must, of course, still be satisfied. The output latch LDOUT will, therefore, place the same data word onto the output bus OUT_DATA for at least two full clock cycles. The OUT_VALID signal will be a "1" only when there is both a valid DATA_TOKEN (QO2 HIGH) and the validation signal QVOUT is HIGH.

The signal QEIN, which is the extension bit corresponding MID_DATA, is combined with the signal S3 in a series of logic gates (INV10 and NAND10) to form a signal S4. During presentation of a DATA Token, each data word MID_DATA will be repeated by loading it into the output latch LDOUT twice. During the first of these, S4 will be forced to a "1" by the action of NAND10. The signal S4 is loaded in the latch LEOUT to form OUTEXTN at the same time as MID_DATA is loaded into LDOUT to form OUT_DATA[7:0].

Thus, the first time a given MID_DATA is loaded into LEOUT, the associated OUTEXTN will be forced high, whereas, on the second occasion, OUTEXTN will be the same as the signal QEIN. Now consider the situation during the very last word of a token in which QEIN is known to be low. During the first time MID_DATA is loaded into LDOUT, OUTEXTN will be "1", and during the second time, OUTEXTN will be "0", indicating the true end of the token.

The output signal QVIN from the validation latch LVIN is combined with the signal QI3 in a similar gate combination (INV12 and NAND12) to form a signal S5. Using known Boolean techniques, it can be shown that the signal S5 is HIGH either when the validation signal QVIN is HIGH, or when the signal QI3 is low (indicating that the data is a duplicate). The signal S5 is loaded into the validation output latch LVOUT at the same time that MID_DATA is loaded into LDOUT and the intermediate extension bit (signal S4) is loaded into LEOUT. Signal S5 is also combined with the signal QO2 (the data token signal) in the logic gates NAND30 and INV30 to form the output validation signal OUT_VALID. As was mentioned earlier, OUT_VALID is HIGH only when there is a valid token and the validation signal QVOUT is high.

In the present invention, the MID_ACCEPT signal is combined with the signal S5 in a series of logic gates (NAND26 and INV26) that perform the well-known AND function to form a signal S6 that is used as one of the two enabling signals to the latches LO1, LO2 and LO3. The signal S6 rises to a "1" when the MID_ACCEPT signal is HIGH and when either the validation signal QVIN is high, or when the token is a duplicate (QI3 is a "0"). If the signal MID_ACCEPT is HIGH, the latches LO1–LO3 will, therefore, be enabled when the clock signal PH1 is high whenever valid input data is loaded at the input of the stage, or when the latched data is a duplicate.

Figure 8B:
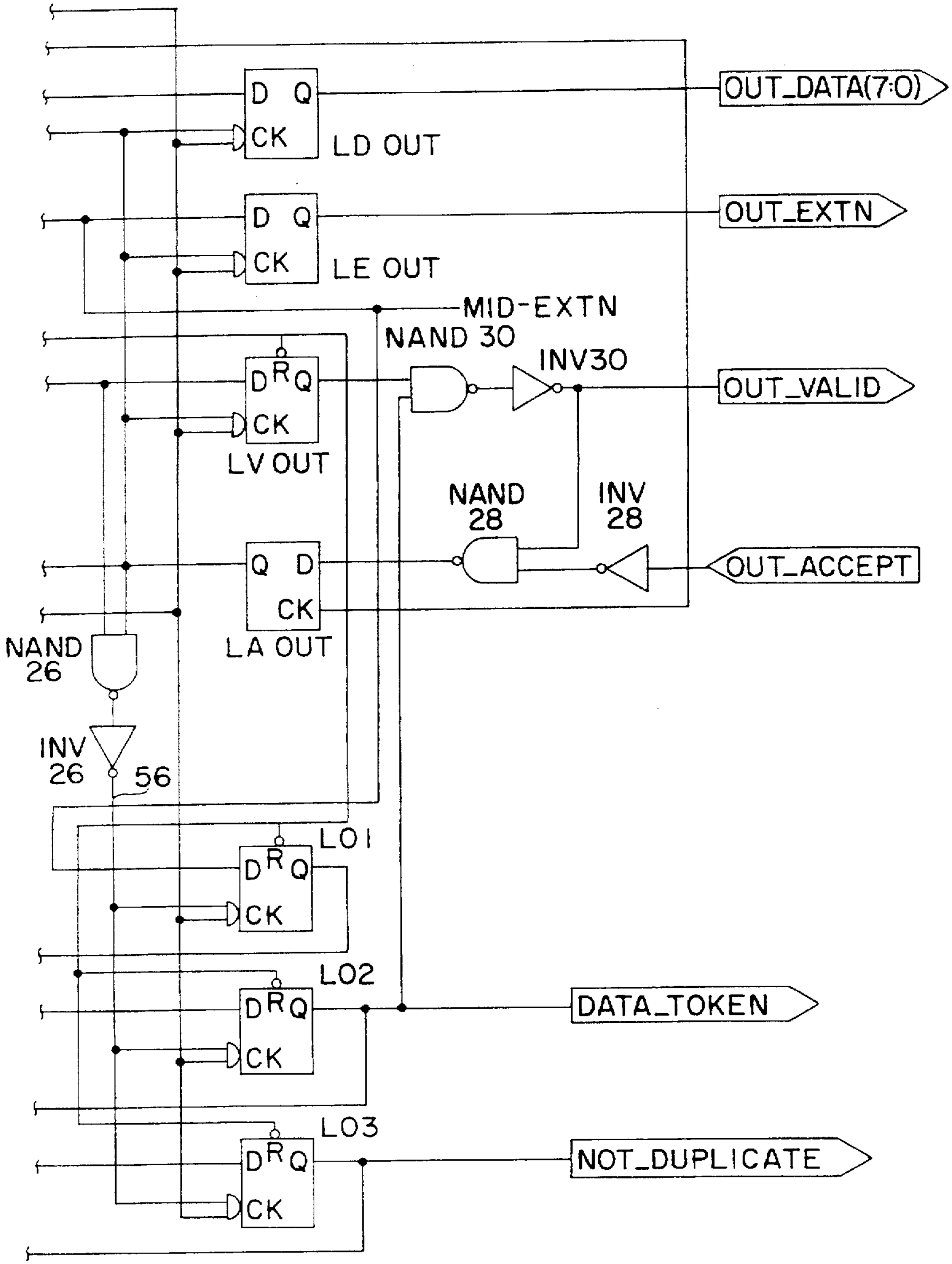

From the discussion above, one can see that the stage shown in FIGS. 8*a* and 8*b* will receive and transfer data between stages under the control of the validation and acceptance signals, as in previous embodiments, with the exception that the output signal from the acceptance latch LAIN at the input side is combined with the toggling duplication signal so that a data word will be output twice before a new word will be accepted.

The various logic gates such as NAND16 and INV16 may, of course, be replaced by equivalent logic circuitry (in this case, a single AND gate). similarly, if the latches LEIN and LVIN, for example, have inverting outputs, the inverters INV10 and INV12 will not be necessary. Rather, the corresponding input to the gates NAND10 and NAND12 can be tied directly to the inverting outputs of these latches. As long as the proper logical operation is performed, the stage will operate in the same manner. Data words and extension bits will still be duplicated.

One should note that the duplication function that the illustrated stage performs will not be performed unless the first data word of the token has a "1" in the third position of the word and "0's" in the five high-order bits. (Of course, the required pattern can easily be changed and set by selecting other logic gates and interconnections other than the NOR1, NOR2, NND18 gates shown.)

In addition, as FIG. 8 shows, the OUT_VALID signal will be forced low during the entire token unless the first data word has the structure described above. This has the effect that all tokens except the one that causes the duplication process will be deleted from the token stream, since a device connected to the output terminals (OUTDATA, OUTEXTN and OUTVALID) will not recognize these token words as valid data.

As before, both validation latches LVIN, LVOUT in the stage can be reset by a single conductor NOT RESET0, and a single resetting input R on the downstream latch LVOUT, with the reset signal being propagated backwards to cause the upstream validation latch to be forced low on the next clock cycle.

It should be noted that in the example shown in FIG. 8, the duplication of data contained in DATA tokens serves only as an example of the way in which circuitry may manipulate the ACCEPT and VALID signals so that more data is leaving the pipeline stage than that which is arriving at the input. Similarly, the example in FIG. 8 removes all non-DATA tokens purely as an illustration of the way in which circuitry may manipulate the VALID signal to remove data from the stream. In most typical applications, however, a pipeline stage will simply pass on any tokens that it does not recognize, unmodified, so that other stages further down the pipeline may act upon them if required.

Figure 9A:
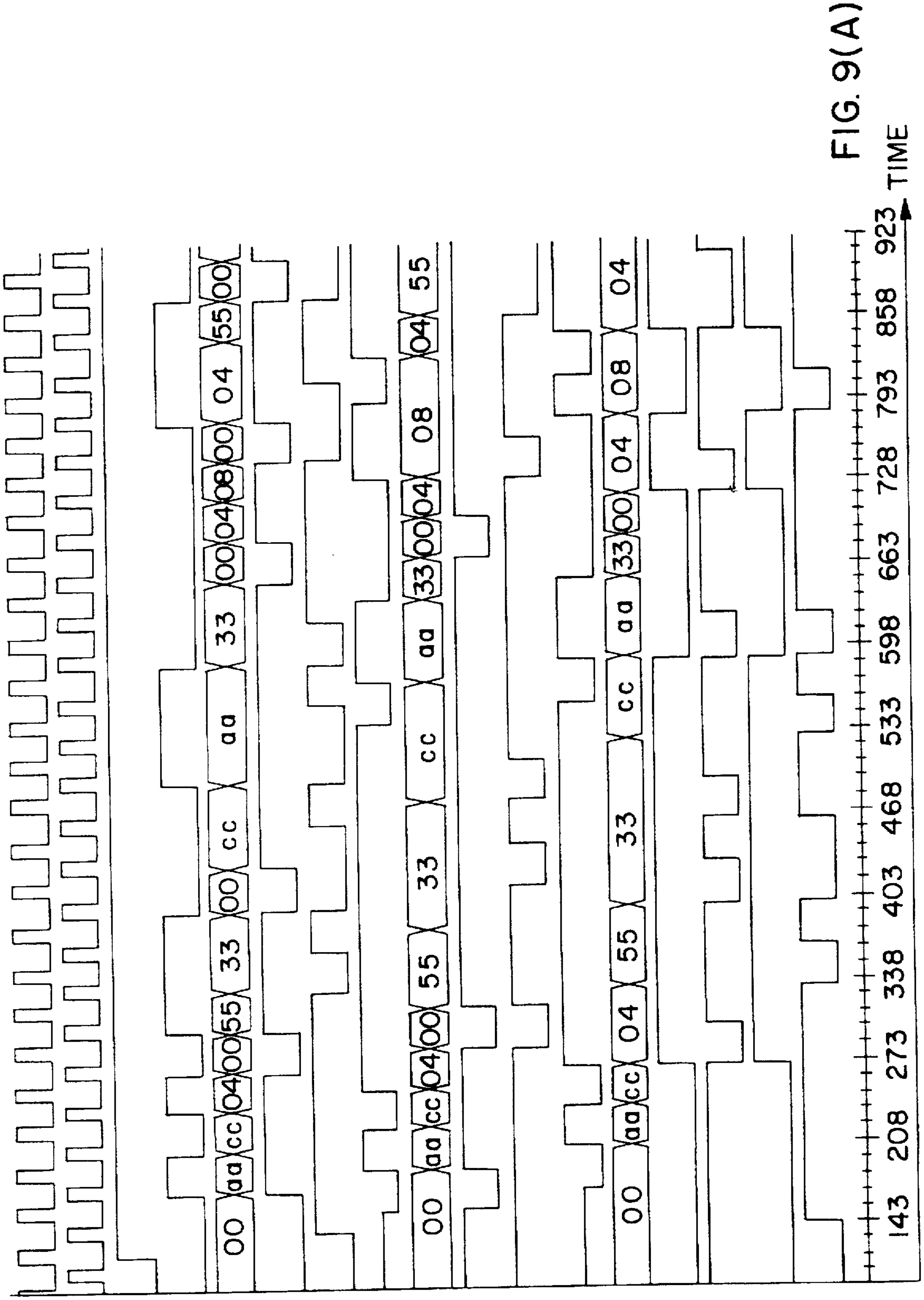
FIGS. 9*a* and 9*b* taken together depict one example of a timing diagram that shows the two-phase clock, the two-wire transfer control signals and the other internal data and control signals used in the exemplifying embodiment shown in FIGS. 8*a* and 8*b*.
Figure 9B:
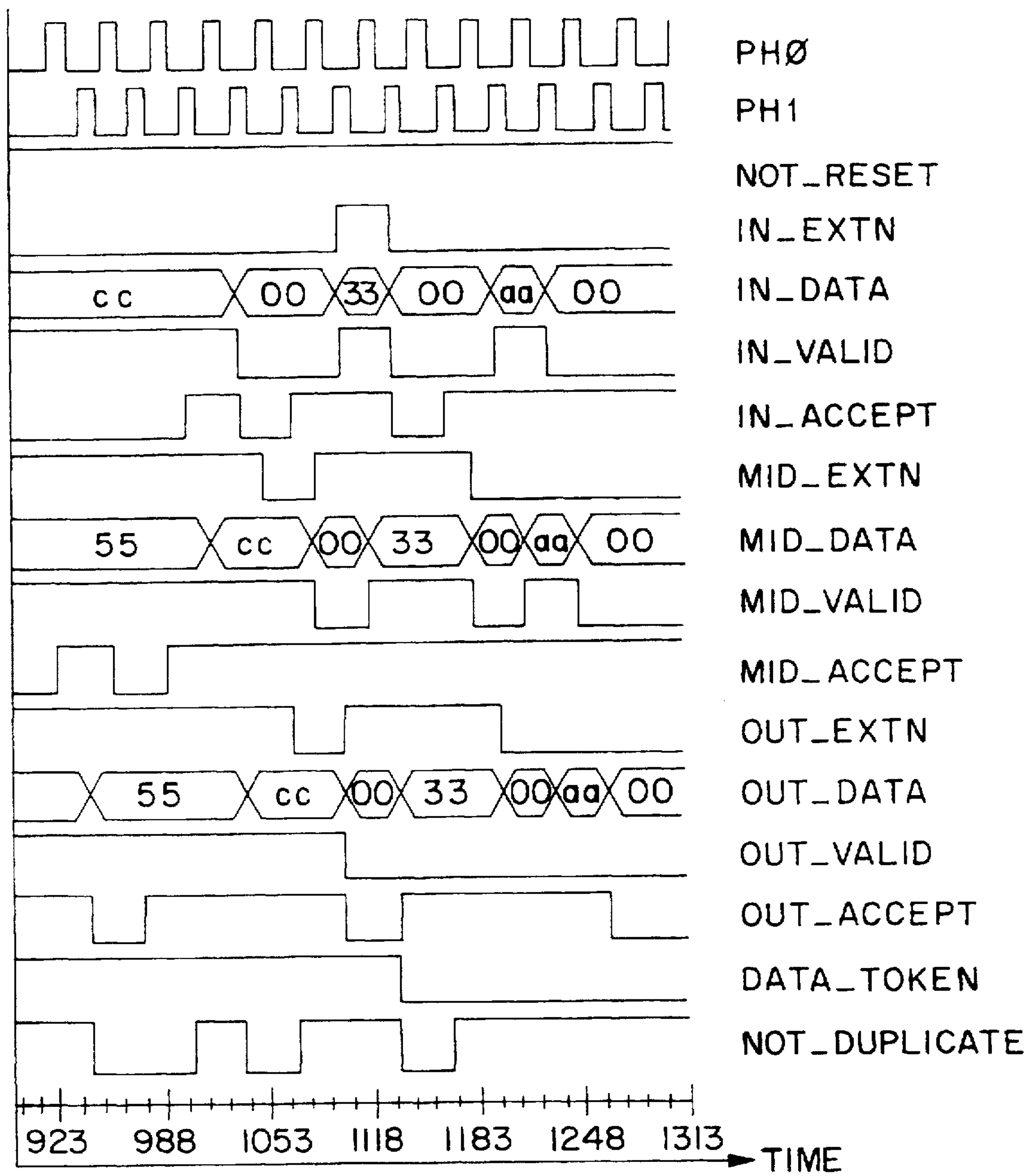

FIGS. 9*a* and 9*b* taken together illustrate an example of a timing diagram for the data duplication circuit shown in FIGS. 8*a* and 8*b*. As before, the timing diagram shows the relationship between the two-phase clock signals, the various internal and external control signals, and the manner in which data is clocked between the input and output sides of the stage and is duplicated.

Figure 10:
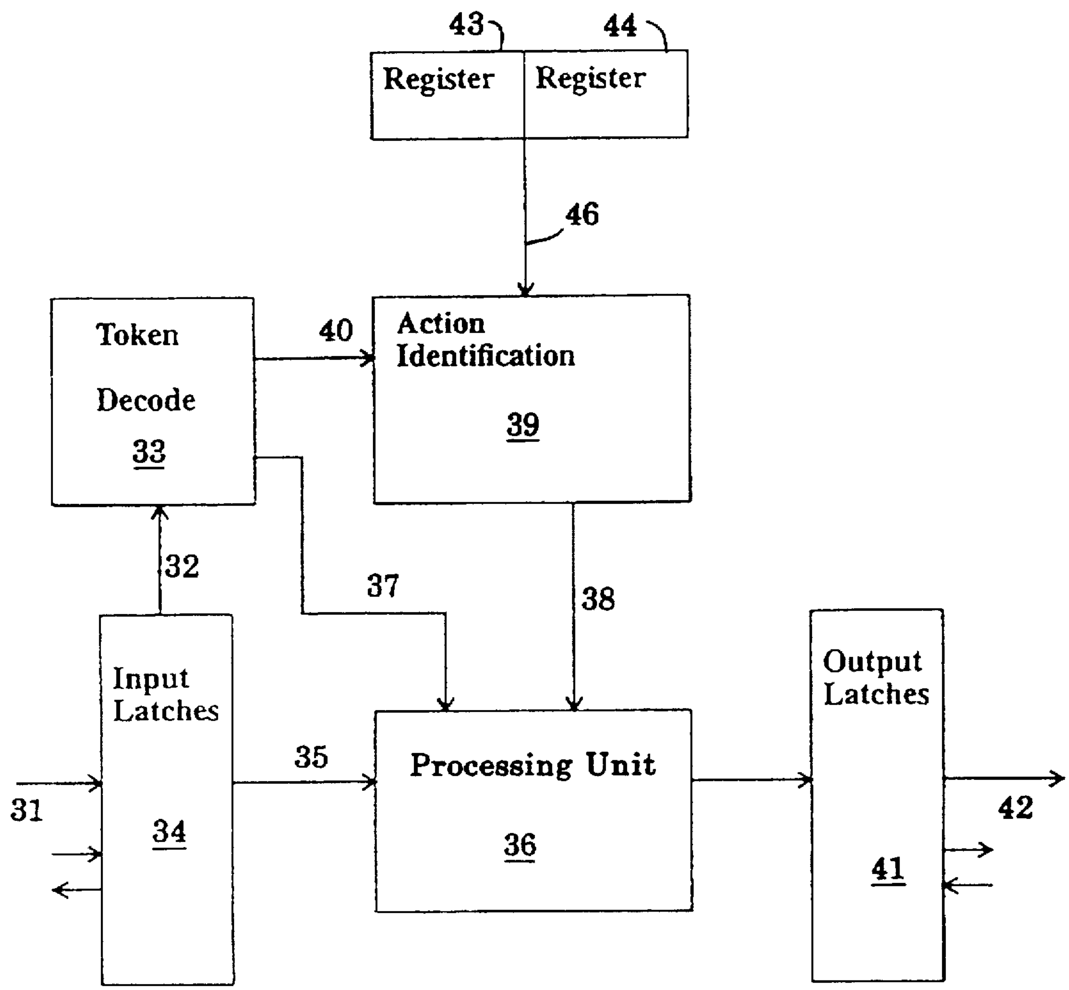
FIG. 10 is a block diagram of a reconfigurable processing stage.

Referring now more particularly to FIG. 10, there is shown a reconfigurable process stage in accordance with one aspect of the present invention.

Input latches 34 receive an input over a first bus 31. A first output from the input latches 34 is passed over line 32 to a token decode subsystem 33. A second output from the input latches 34 is passed as a first input over line 35 to a processing unit 36. A first output from the token decode subsystem 33 is passed over line 37 as a second input to the processing unit 36. A second output from the token decode 33 is passed over line 40 to an action identification unit 39. The action identification unit 39 also receives input from registers 43 and 44 over line 46. The registers 43 and 44 hold the state of the machine as a whole. This state is determined by the history of tokens previously received. The output from the action identification unit 39 is passed over line 38 as a third input to the processing unit 36. The output from the processing unit 36 is passed to output latches 41. The output from the output latches 41 is passed over a second bus 42.

Figure 11:
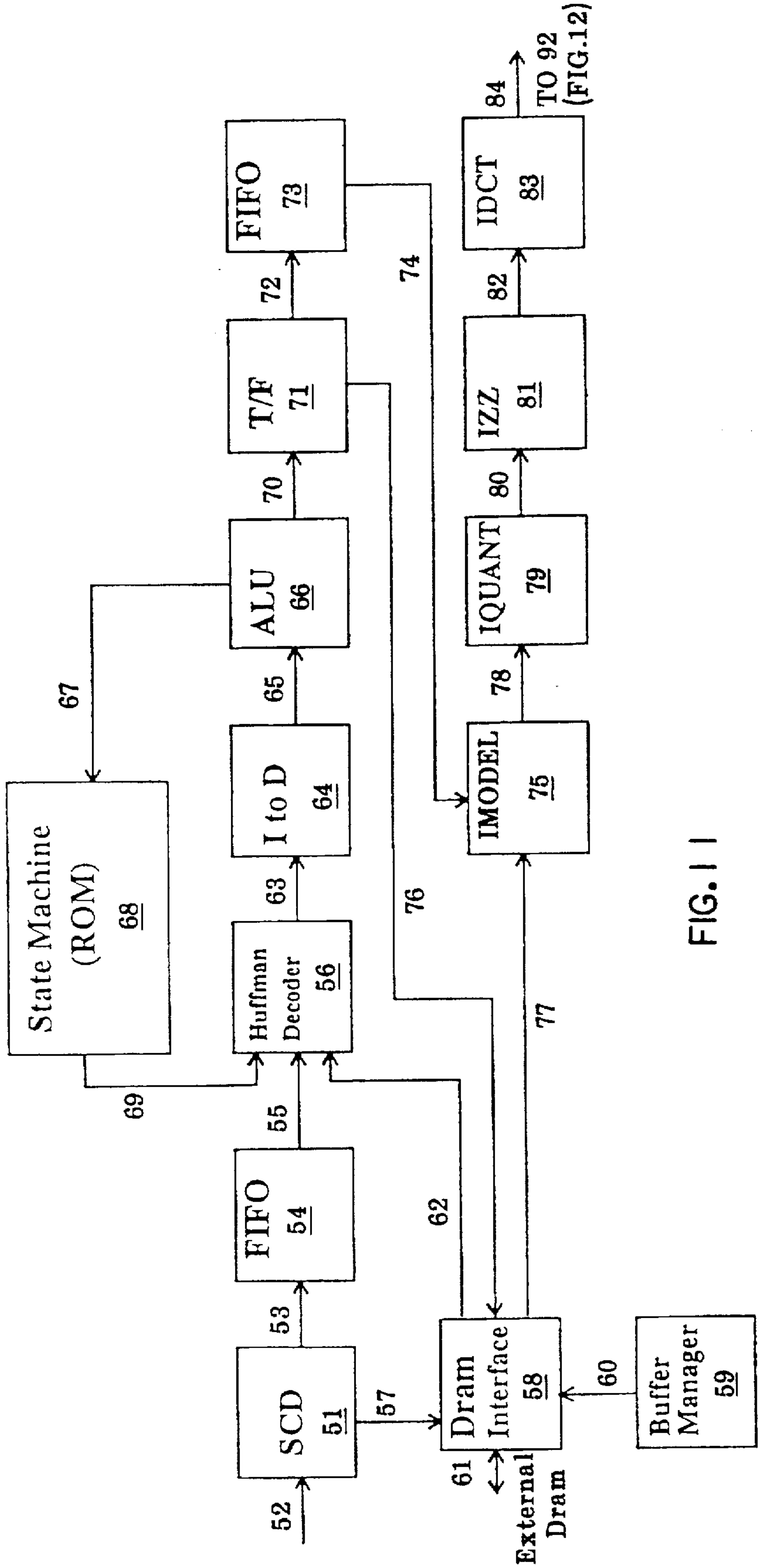
FIG. 11 is a block diagram of a spatial decoder.

Referring now to FIG. 11, a Start Code Detector (SCD) 51 receives input over a two-wire interface 52. This input can be either in the form of DATA tokens or as data bits in a data stream. A first output from the Start Code Detector 51 is passed over line 53 to a first logical first-in first-out buffer (FIFO) 54. The output from the first FIFO 54 is logically passed over line 55 as a first input to a Huffman decoder 56. A second output from the Start Code Detector 51 is passed over line 57 as a first input to a DRAM interface 58. The DRAM interface 58 also receives input from a buffer manager 59 over line 60. Signals are transmitted to and received from external DRAM (not shown) by the DRAM interface 58 over line 61. A first output from the DRAM interface 58 is passed over line 62 as a first physical input to the Huffman decoder 56.

The output from the Huffman decoder 56 is passed over line 63 as an input to an Index to Data Unit (ITOD) 64. The Huffman decoder 56 and the ITOD 64 work together as a single logical unit. The output from the ITOD 64 is passed over line 65 to an arithmetic logic unit (ALU) 66. A first output from the ALU 66 is passed over line 67 to a read-only memory (ROM) state machine 68. The output from the ROM state machine 68 is passed over line 69 as a second physical input to the Huffman decoder 56. A second-output from the ALU 66 is passed over line 70 to a Token Formatter (T/F) 71.

A first output 72 from the T/F 71 of the present invention is passed over line 72 to a second FIFO 73. The output from the second FIFO 73 is passed over line 74 as a first input to an inverse modeller 75. A second output from the T/F 71 is passed over line 76 as a third input to the DRAM interface 58. A third output from the DRAM interface 58 is passed over line 77 as a second input to the inverse modeller 75. The output from the inverse modeller 75 is passed over line 78 as an input to an inverse quantizer 79 The output from the inverse quantizer 79 is passed over line 80 as an input to an inverse zig-zag (IZZ) 81. The output from the IZZ 81 is passed over line 82 as an input to an inverse discrete cosine transform (IDCT) 83. The output from the IDCT 83 is passed over line 84 to a temporal decoder (not shown).

Figure 12:
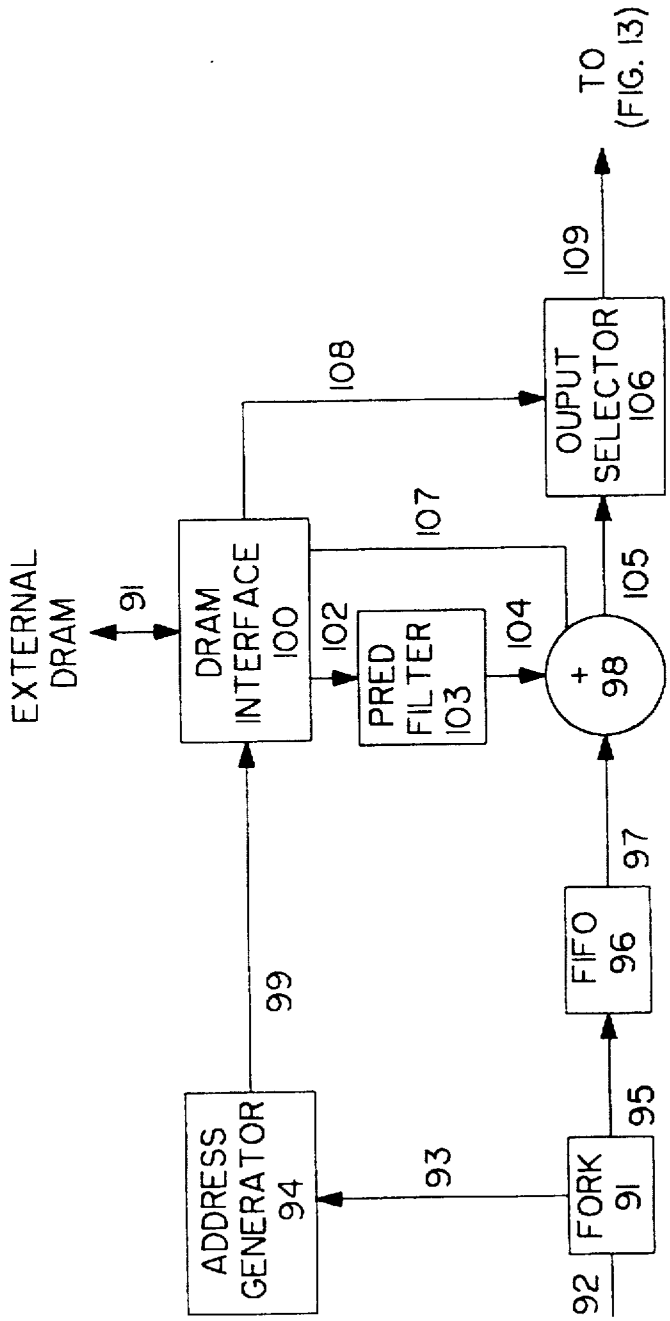
FIG. 12 is a block diagram of a temporal decoder.

Referring now more particularly to FIG. 12, a temporal decoder in accordance with the present invention is shown. A fork 91 receives as input over line 92 the output from the IDCT 83 (shown in FIG. 11). As a first output from the fork 91, the control tokens, e.g., motion vectors and the like, are passed over line 93 to an address generator 94. Data tokens are also passed to the address generator 94 for counting purposes. As a second output from the fork 91, the data is passed over line 95 to a FIFO 96. The output from the FIFO 96 is then passed over line 97 as a first input to a summer 98. The output from the address generator 94 is passed over line 99 as a first input to a DRAM interface 100. Signals are transmitted to and received from external DRAM (not shown) by the DRAM interface 100 over line 101. A first output from the DRAM interface 100 is passed over line 102 to a prediction filter 103. The output from the prediction filter 103 is passed over line 104 as a second input to the summer 98. A first output from the summer 98 is passed over line 105 to output selector 106. A second output from the summer 98 is passed over line 107 as a second input to the DRAM interface 100. A second output from the DRAM interface 100 is passed over line 108 as a second input to the output selector 106. The output from the output selector 106 is passed over line 109 to a Video Formatter (not shown in FIG. 12).

Figure 13:
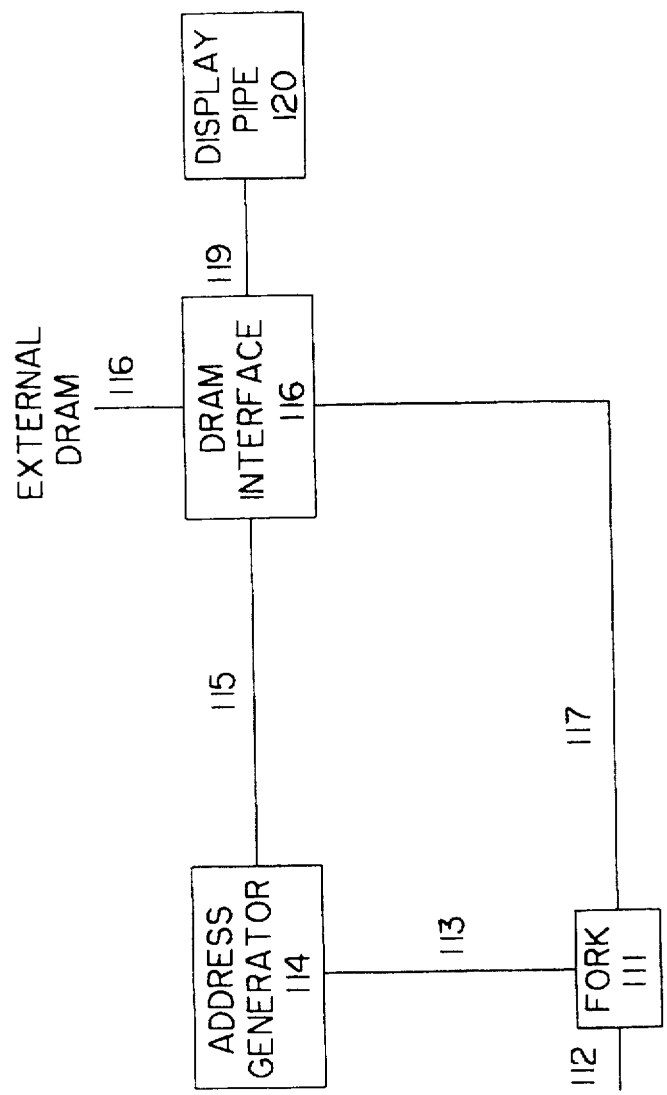
FIG. 13 is a block diagram of a video formatter.

Referring now to FIG. 13, a fork 111 receives input from the output selector 106 (shown in FIG. 12) over line 112. As a first output from the fork 111, the control tokens are passed over line 113 to an address generator 114. The output from the address generator 114 is passed over line 115 as a first input to a DRAM interface 116. As a second output from the fork 111 the data is passed over line 117 as a second input to the DRAM interface 116. Signals are transmitted to and received from external DRAM (not shown) by the DRAM interface 116 over line 118. The output from the DRAM interface 116 is passed over line 119 to a display pipe 120.

It will be apparent from the above descriptions that each line may comprise a plurality of lines, as necessary.

Figure 14A:
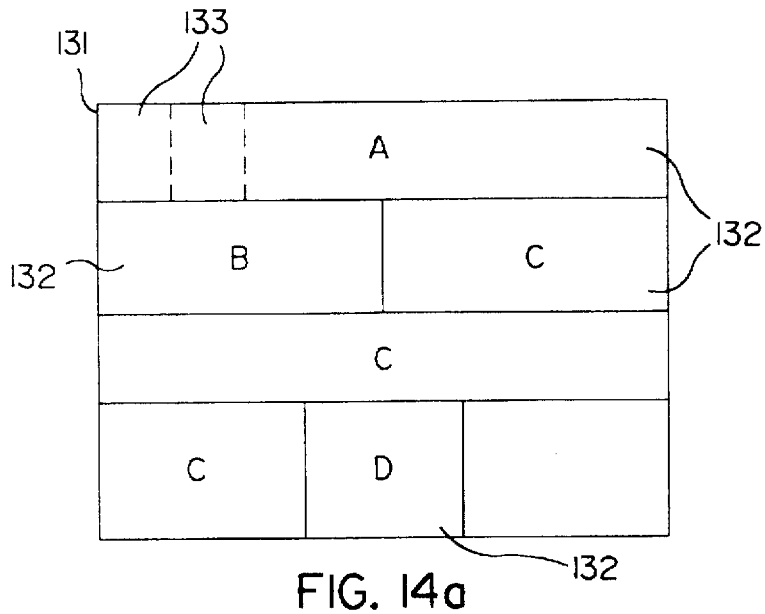
FIGS. 14*a–c* show various arrangements of memory blocks used in the present invention.

Referring now to FIG. 14*a*, in the MPEG standard a picture 131 is encoded as one or more slices 132. Each slice 132 is, in turn, comprised of a plurality of blocks 133, and is encoded row-by-row, left-to-right in each row. As is shown, each slice 132 may span exactly one full line of blocks 133, less than one line B or D of blocks 133 or multiple lines C of blocks 133.

Figure 14B:
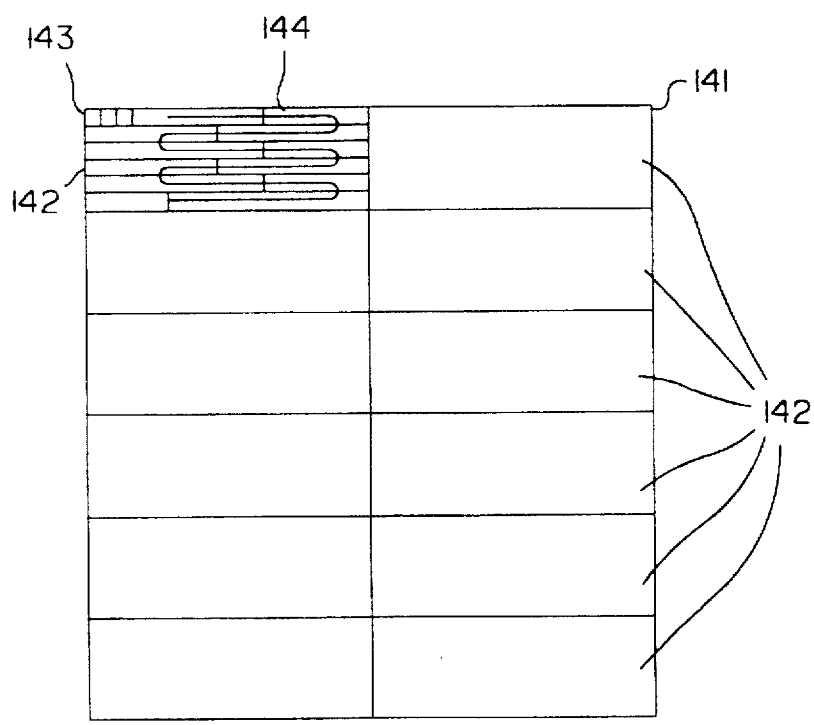

Referring to FIG. 14*b*, in the JPEG and H.261 standards, the Common Intermediate Format (CIF) is used, wherein a picture 141 is encoded as 6 rows each containing 2 groups of blocks (GOBs) 142. Each GOB 142 is, in turn, composed of either 3 rows or 6 rows of an indeterminate number of blocks 143. Each GOB 142 is encoded in a zigzag direction indicated by the arrow 144. The GOBs 142 are, in turn, processed row-by-row, left-to-right in each row.

Figure 14C:
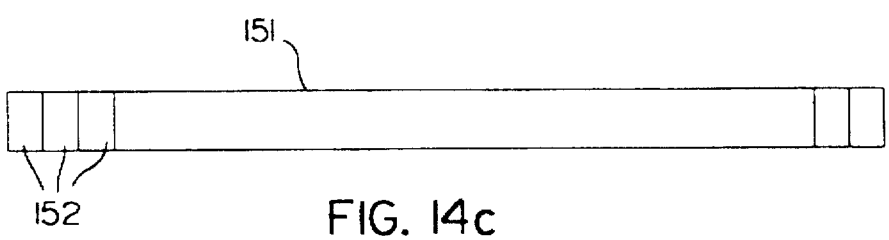

Referring now to FIG. 14*c*, it can be seen that, for both MPEG and CIF, the output of the encoder is in the form of a data stream 151. The decoder receives this data stream 151. The decoder can then reconstruct the image according to the format used to encode it. In order to allow the decoder to recognize start and end points for each standard, the data stream 151 is segmented into lengths of 33 blocks 152.

Figure 15:
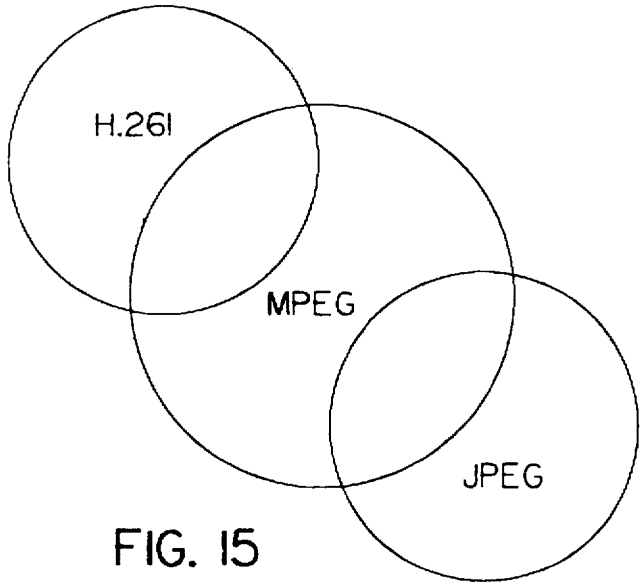
FIG. 15 shows a Venn diagram of possible table selection values.

Referring to FIG. 15, a Venn diagram is shown, representing the range of values possible for the table selection from the Huffman decoder 56 (shown in FIG. 11) of the present invention. The values possible for an MPEG decoder and an H.261 decoder overlap, indicating that a single table selection will decode both certain MPEG and certain H.261 formats. Likewise, the values possible for an MPEG decoder and a JPEG decoder overlap, indicating that: a single table selection will decode both certain MPEG and certain JPEG formats. Additionally, it is shown that the H.261 values and the JPEG values do not overlap, indicating that no single table selection exists that will decode both formats.

Figure 16:
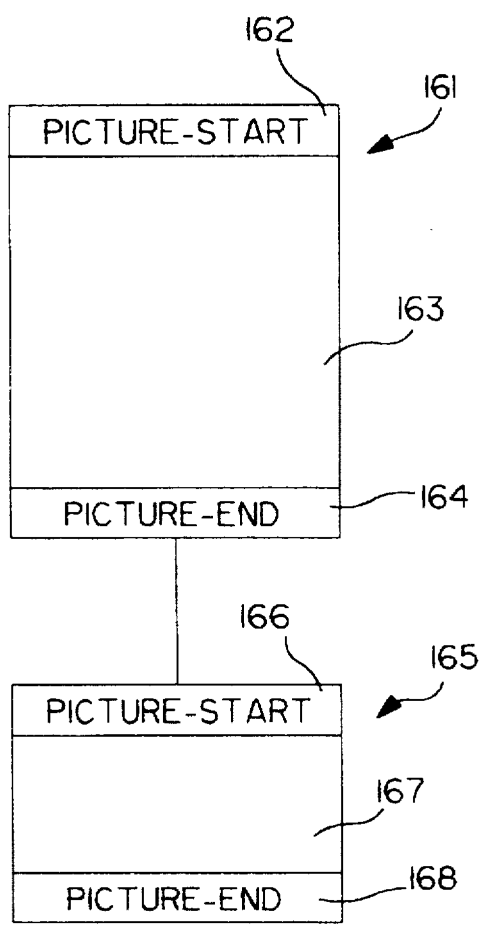
FIG. 16 shows the variable length of picture data used in the present invention.

Referring now more particularly to FIG. 16, there is shown a schematic representation of variable length picture data in accordance with the practice of the present invention. A first picture 161 to be processed contains a first PICTURE_START token 162, first picture information of indeterminate length 163, and a first PICTURE_END token 164. A second picture 165 to be processed contains a second PICTURE_START token 166, second picture information of indeterminate length 167, and a second PICTURE_END token 168. The PICTURE_START tokens 162 and 166 indicate the start of the pictures 161 and 165 to the processor. Likewise, the PICTURE_END tokens 164 and 168 signify the end of the pictures 161 and 165 to the processor. This allows the processor to process picture information 163 and 167 of variable lengths.

Figure 17:
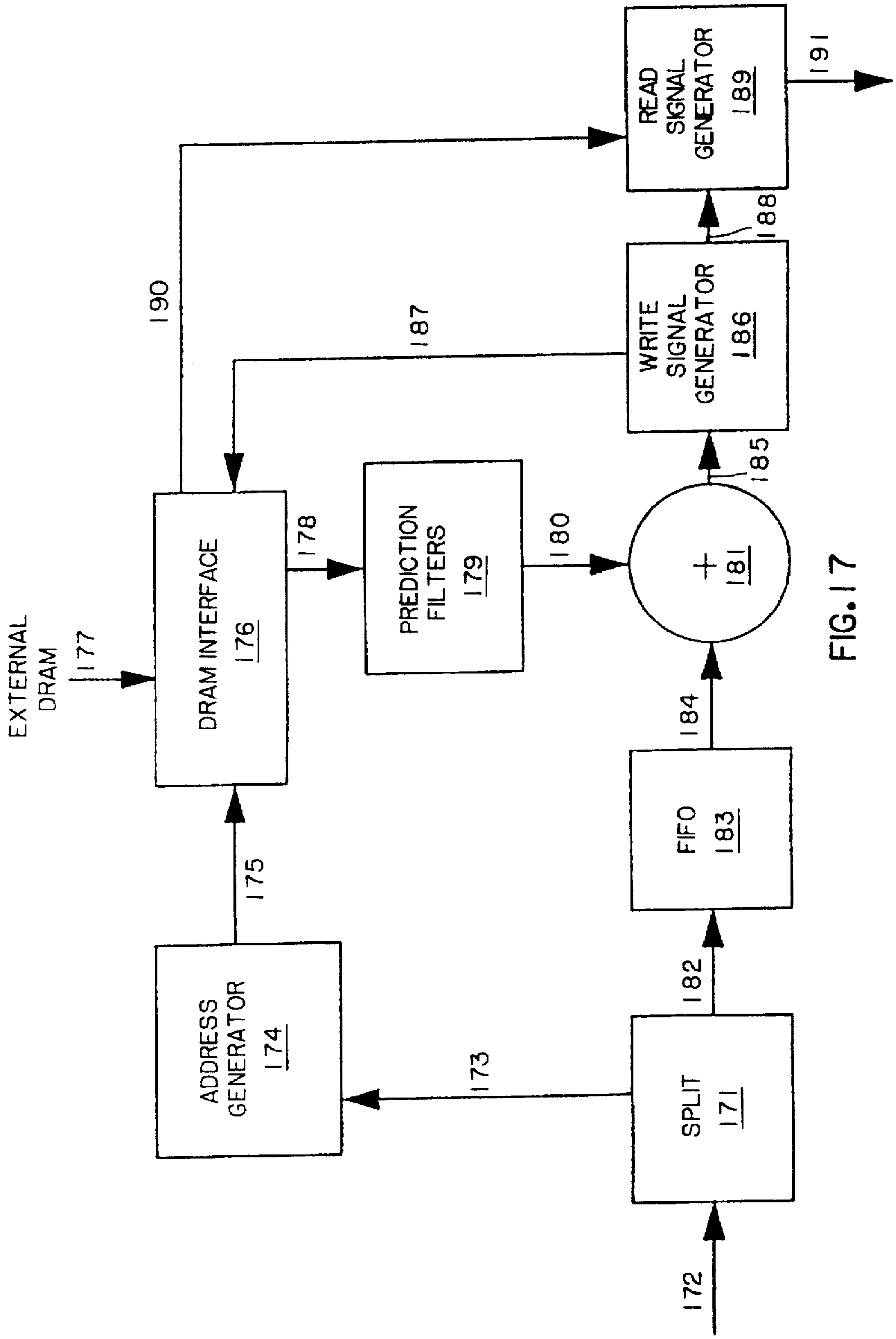
FIG. 17 is a block diagram of the temporal decoder including the prediction filters.

Referring to FIG. 17, a split 171 receives input over line 172. A first output from the split 171 is passed over line 173 to an address generator 174. The address generated by the address generator 174 is passed over line 175 to a DRAM interface 176. Signals are transmitted to and received from external DRAM (not shown) by the DRAM interface 176 over line 177. A first output from the DRAM interface 176 is passed over line 178 to a prediction filter 179. The output from the prediction filter 179 is passed over line 180 as a first input to a summer 181. A second output from the split 171 is passed over line 182 as an input to a first-in first-out buffer (FIFO) 183. The output from the FIFO 183 is passed over line 184 as a second input to the summer 181. The output from the summer 181 is passed over line 185 to a write signal generator 186. A first output from the write signal generator 186 is passed over line 187 to the DRAM interface 176. A second output from the write signal generator 186 is passed over line 188 as a first input to a read signal generator 189. A second output from the DRAM interface 176 is passed over line 190 as a second input to the read signal generator 189. The output from the read signal generator 189 is passed over line 191 to a Video Formatter (not shown in FIG. 17).

Figure 18:
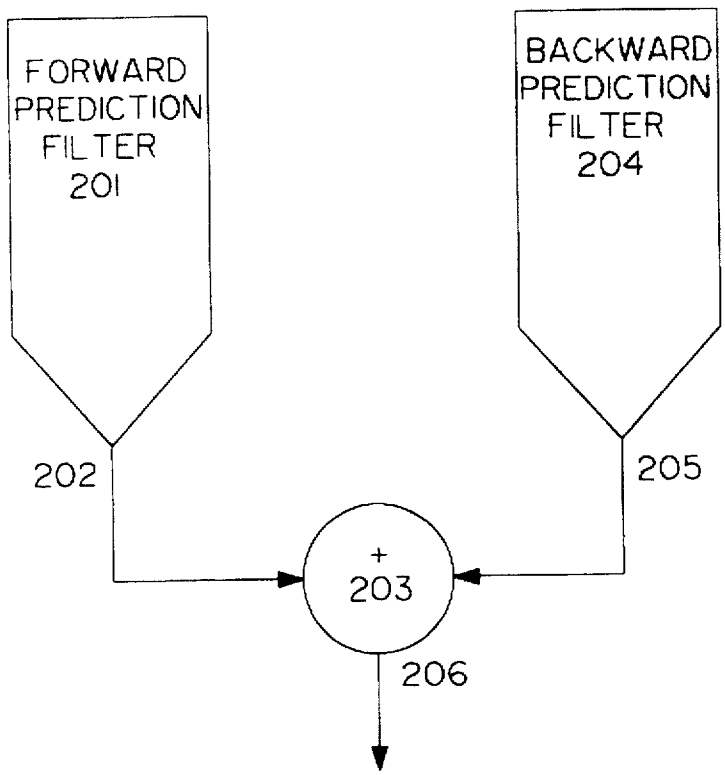
FIG. 18 is a pictorial representation of the prediction filtering process.

Referring now to FIG. 18, the prediction filtering process is illustrated. A forward picture 201 is passed over line 202 as a first input to a summer 203. A backward picture 204 is passed over line 205 as a second input to the summer 203. The output from the summer 203 is passed over line 206.

Figure 19:
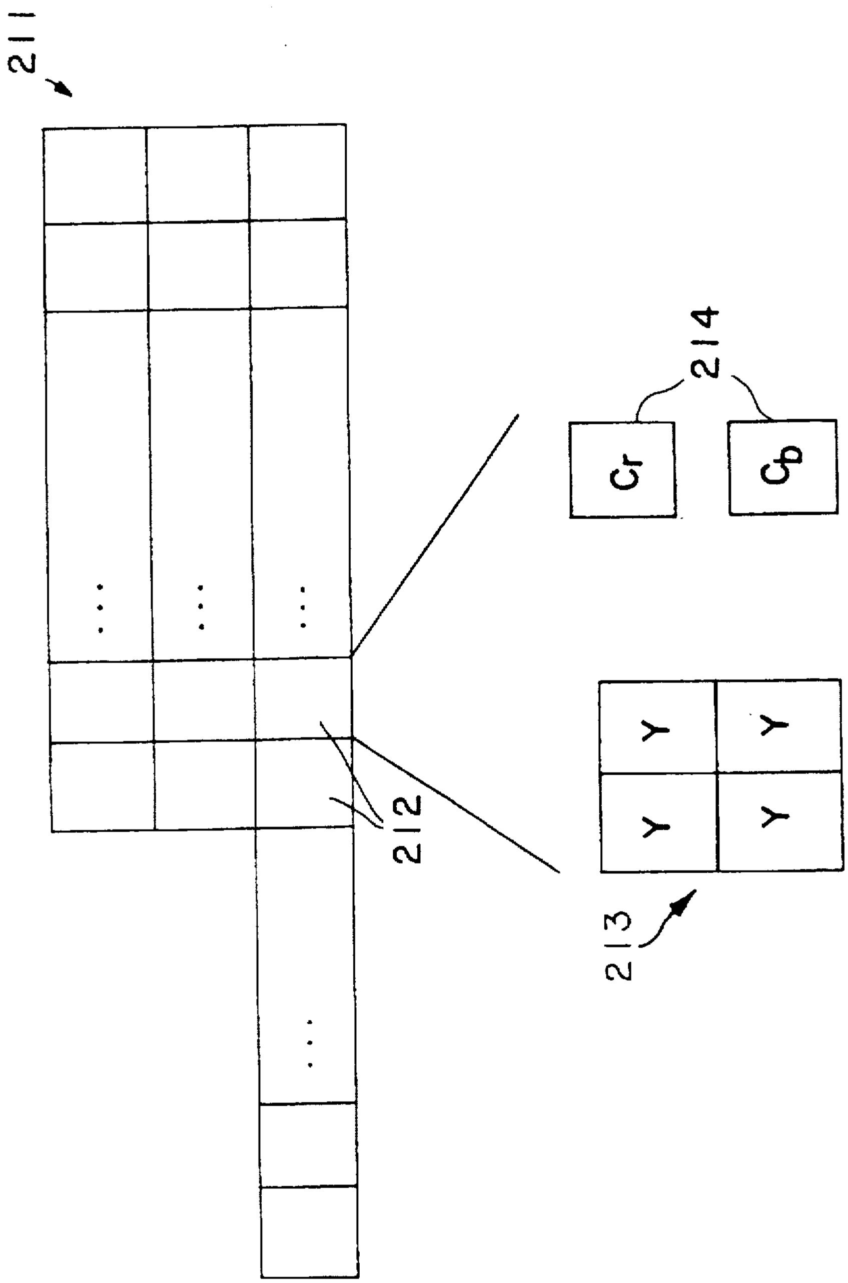
FIG. 19 shows a generalized representation of the macroblock structure.

Referring to FIG. 19, a slice 211 comprises one or more macroblocks 212. In turn, each macroblock 212 comprises four luminance blocks 213 and two chrominance blocks 214, and contains the information for an original 16 ×16 block of pixels. Each of the four luminance blocks 213 and two chrominance blocks 214 is 8×8 pixels in size. The four luminance blocks 213 contain a 1 pixel to 1 pixel mapping of the luminance (Y) information from the original 16×16 block of pixels. One chrominance block 214 contains a representation of the chrominance level of the blue color signal (Cu/b), and the other chrominance block 214 contains a representation of the chrominance level of the red color signal (Cv/r). Each chrominance level is subsampled such that each 8×8 chrominance block 214 contains the chrominance level of its color signal for the entire original 16×16 block of pixels.

Figure 20:
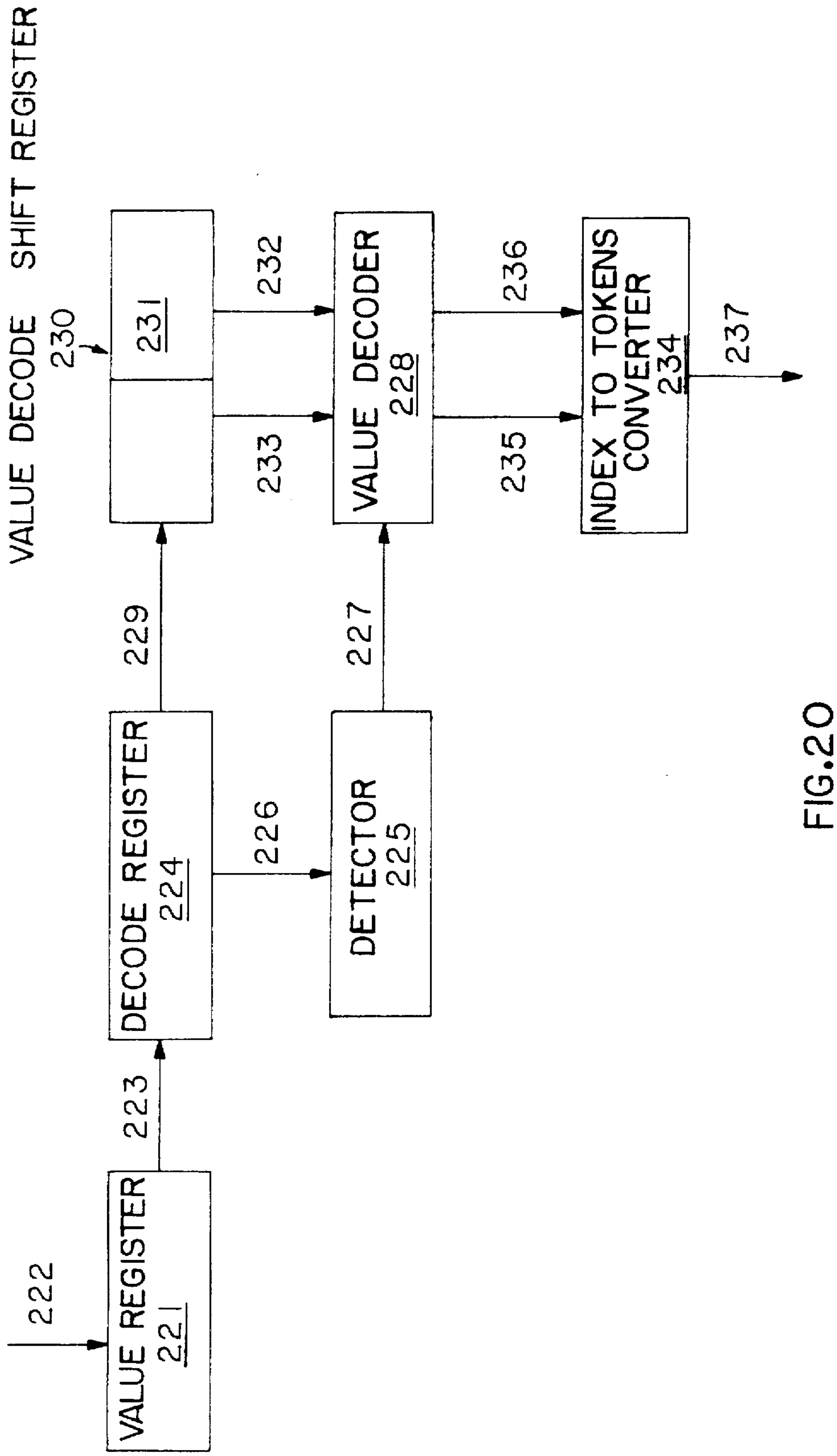
FIG. 20 shows a generalized block diagram of a Start Code Detector.

Referring now to FIG. 20, the structure and function of the Start Code Detector will become apparent. A value register 221 receives image data over a line 222. The line 222 is eight bits wide, allowing for parallel transmission of eight bits at a time. The output from the value register 221 is passed serially over line 223 to a decode register 224. A first output from the decode register 224 is passed to a detector 225 over a line 226. The line 226 is twenty-four bits wide, allowing for parallel transmission of twenty-four bits at a time. The detector 225 detects the presence or absence of an image which corresponds to a standard-independent start code of 23 "zero" values followed by a single "one" value. An 8-bit data value image follows a valid start code image. On detecting the presence of a start code image, the detector 225 transmits a start image over a line 227 to a value decoder 228.

A second output from the decode register 224 is passed serially over line 229 to a value decode shift register 230. The value decode shift register 230 can hold a data value image fifteen bits long. The 8-bit data value following the start code image is shifted to the right of the value decode shift register 230, as indicated by area 231. This process eliminates overlapping start code images, as discussed below. A first output from the value decode shift register 230 is passed to the value decoder 228 over a line 232. The line 232 is fifteen bits wide, allowing for parallel transmission of fifteen bits at a time. The value decoder 228 decodes the value image using a first look-up table (not shown). A second output from the value decode shift register 230 is passed to the value decoder 228 which passes a flag to an index-to-tokens converter 234 over a line 235. The value decoder 228 also passes information to the index-to-tokens converter 234 over a line 236. The information is either the data value image or start code index image obtained from the first look-up table. The flag indicates which form of information is passed. The line 236 is fifteen bits wide, allowing for parallel transmission of fifteen bits at a time. While 15 bits has been chosen here as the width in the present invention it will be appreciated that bits of other lengths may also be used. The index-to-tokens converter 234 converts the information to token images using a second look-up table (not shown) similar to that given in Table 12-3 of the Users Manual. The token images generated by the index-to-tokens converter 234 are then output over a line 237. The line 237 is fifteen bits wide, allowing for parallel transmission of fifteen bits at a time.

Figure 21:
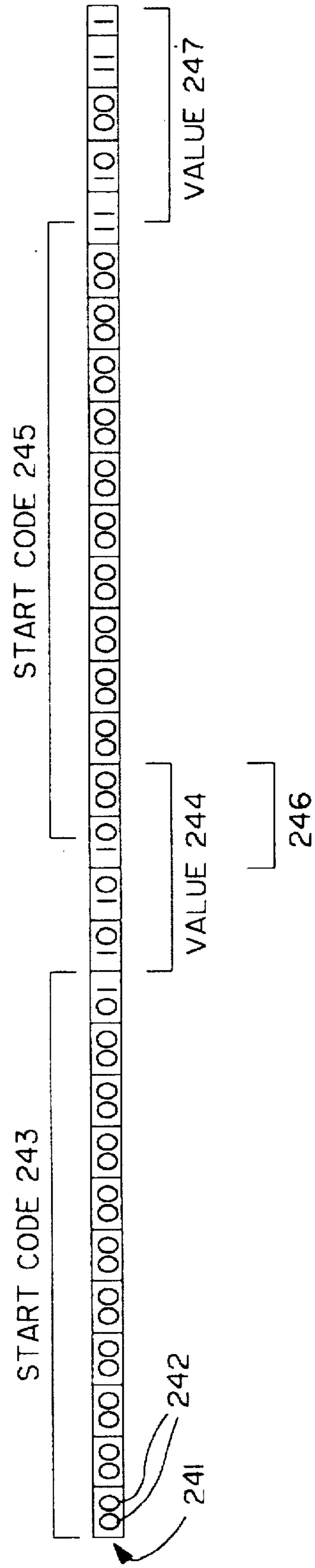
FIG. 21 illustrates examples of start codes in a data stream.

Referring to FIG. 21, a data stream 241 consisting of individual bits 242 is input to a Start Code Detector (not shown in FIG. 21). A first start code image 243 is detected by the Start Code Detector. The Start Code Detector then receives a first data value image 244. Before processing the first data value image 244, the Start Code Detector may detect a second start code image 245, which overlaps the first data value image 244 at a length 246. If this occurs, the Start Code Detector does not process the first data value image 244, and instead receives and processes a second data value image 247.

Figure 22:
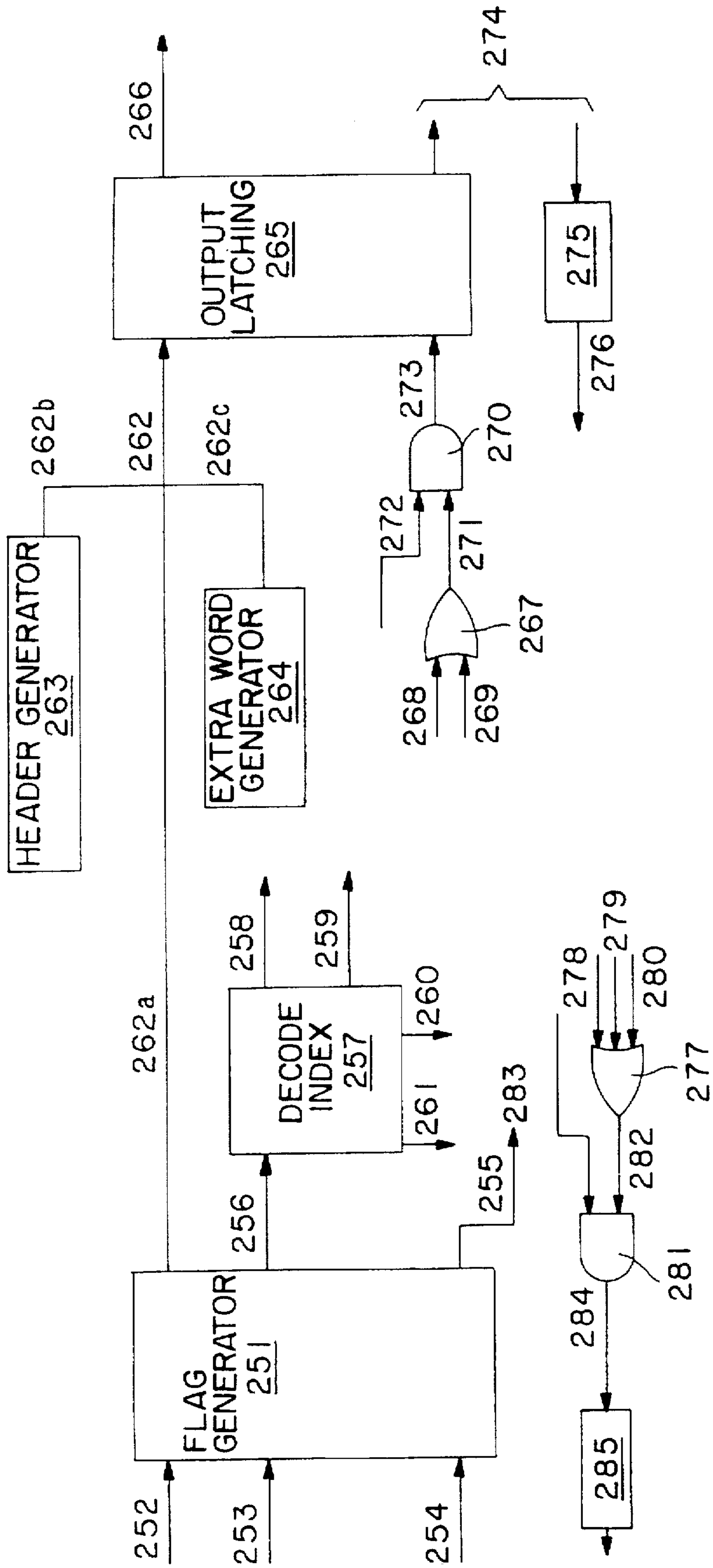
FIG. 22 is a block diagram depicting the relationship between the flag generator, decode index, header generator, extra word generator and output latches.

Referring now to FIG. 22, a flag generator 251 receives data as a first input over a line 252. The line 252 is fifteen bits wide, allowing for parallel transmission of fifteen bits at a time. The flag generator 251 also receives a flag as a second input over a line 253, and receives an input valid image over a first two-wire interface 254. A first output from the flag generator 251 is passed over a line 255 to an input valid register (not shown). A second output from the flag generator 251 is passed over a line 256 to a decode index 257. The decode index 257 generates four outputs; a picture start image is passed over a line 258, a picture number image is passed over a line 259, an insert image is passed over a line 260, and a replace image is passed over a line 261. The data from the flag generator 251 is passed over a line **262*a*. A header generator 263 uses a look-up table to generate a replace image, which is passed over a line 262*b*. An extra word generator 264 uses the MPU to generate an insert image, which is passed over a line 262*b*. Line 262*a*, and line 262*b* combine to form a line 262, which is first input to output latches 265. The output latches 265 pass data over a line 266. The line 266** is fifteen bits wide, allowing for parallel transmission of fifteen bits at a time.

The input valid register (not shown) passes an image as a first input to a first OR gate 267 over a line 268. An insert image is passed over a line 269 as a second input to the first OR gate 267. The output from the first OR gate 267 is passed as a first input to a first AND gate 270 over a line 271. The logical negation of a remove image is passed over a line 272 as a second input to the first AND gate 270 is passed as a second input to the output latches 265 over a line 273. The output latches 265 pass an output valid image over a second two-wire interface 274. An output accept image is received over the second two-wire interface 274 by an output accept latch 275. The output from the output accept latch 275 is passed to an output accept register (not shown) over a line 276.

The output accept register (not shown) passes an image as a first input to a second OR gate 277 over a line 278. The logical negation of the output from the input valid register is passed as a second input to the second OR gate 277 over a line 279. The remove image is passed over a line 280 as a third input to the second OR gate 277. The output from the second OR gate 277 is passed as a first input to a second AND gate 281 over a line 282. The logical negation of an insert image is passed as a second input to the second AND gate 281 over a line 283. The output from the second AND gate 281 is passed over a line 284 to an input accept latch 285. The output from the input accept latch 285 is passed over the first two-wire interface 254.

TABLE 600

| | Format | Image Received | Tokens Generated |
|---|---|---|---|
| 1. | H.261 | SEQUENCE START | SEQUENCE START |
| | MPEG | PICTURE START | GROUP START |
| | JPEG | (None) | PICTURE START |
| | | | PICTURE DATA |
| 2. | H.261 | (None) | PICTURE END |
| | MPEG | (None) | PADDING |
| | JPEG | (None) | FLUSH |
| | | | STOP AFTER PICTURE |

As set forth in Table 600 which shows a relationship between the absence or presence of standard signals in the certain machine independent control tokens, the detection of an image by the Start Code Detector 51 generates a sequence of machine independent Control Tokens. Each image listed in the "Image Received" column starts the generation of all machine independent control tokens listed in the group in the "Tokens Generated" column. Therefore, as shown in line 1 of Table 600, whenever a "sequence start" image is received during H.261 processing or a "picture start" image is received during MPEG processing, the entire group of four control tokens is generated, each followed by its corresponding data value or values. In addition, as set forth at line 2 of Table 600, the second group of four control tokens is generated at the proper time irrespective of images received by the Start Code Detector 51.

TABLE 601

| | | | | | | | | | | |
|---|---|---|---|---|---|---|---|---|---|---|
| DISPLAY ORDER: | I1 | B2 | B3 | P4 | B5 | B6 | P7 | B8 | B9 | I10 |
| TRANSMIT ORDER: | I1 | P4 | B2 | B3 | P7 | B5 | B6 | I10 | B8 | B9 |

As shown in line 1 of Table 601 which shows the timing relationship between transmitted pictures and displayed pictures, the picture frames are displayed in numerical order. However, in order to reduce the number of frames that must be stored in memory, the frames are transmitted in a different order. It is useful to begin the analysis from an intraframe (I frame). The I1 frame is transmitted in the order it is to be displayed. The next predicted frame (P frame), P4, is then transmitted. Then, any bi-directionally interpolated frames (B frames) to be displayed between the I1 frame and P4 frame are transmitted, represented by frames B2 and B3. This allows the transmitted B frames to reference a previous frame (forward prediction) or a future frame (backward prediction). After transmitting all the B frames to be displayed between the I1 frame and the P4 frame, the next P frame, P7, is transmitted. Next, all the B frames to be displayed between the P4 and P7 frames are transmitted, corresponding to B5 and B6. Then, the next I frame, I10, is transmitted. Finally, all the B frames to be displayed between the P7 and I10 frames are transmitted, corresponding to frames B8 and B9. This ordering of transmitted frames requires only two frames to be kept in memory at any one time, and does not require the decoder to wait for the transmission of the next P frame or I frame to display an interjacent B frame.

Further information regarding the structure and operation, as well as the features, objects and advantages, of the invention will become more readily apparent to one of ordinary skill in the art from the ensuing additional detailed description of illustrative embodiment of the invention which, for purposes of clarity and convenience of explanation are grouped and set forth in the following sections:

1. Multi-Standard Configurations
2. JPEG Still Picture Decoding
3. Motion Picture Decompression
4. RAM Memory Map
5. Bitstream Characteristics
6. Reconfigurable Processing Stage
7. Multi-Standard Coding
8. Multi-Standard Processing Circuit-2nd Mode of Operation
9. Start Code Detector
10. Tokens
11. DRAM Interface
12. Prediction Filter
13. Accessing Registers 14. Microprocessor Interface (MPI)
15. MPI Read Timing
16. MPI Write Timing
17. Key Hole Address Locations
18. Picture End
19. Flushing Operation
20. Flush Function
21. Stop-After-Picture
22. Multi-Standard Search Mode
23. Inverse Modeler
24. Inverse Quantizer
25. Huffman Decoder and Parser
26. Diverse Discrete Cosine Transformer
27. Buffer Manager

1. MULTI-STANDARD CONFIGURATION

Since the various compression standards, i.e., JPEC, MPEG and H.261, are well known, as for example as described in the aforementioned U.S. Pat. No. 5,212,742, the detailed specifications of those standards are not repeated here.

As previously mentioned, the present invention is capable of decompressing a variety of differently encoded, picture data bitstreams. In each of the different standards of encoding, some form of output formatter is required to take the data presented at the output of the spatial decoder operating alone, or the serial output of a spatial decoder and temporal decoder operating in combination, (as subsequently described herein in greater detail) and reformatting this output for use, including display in a computer or other display systems, including a video display system. Implementation of this formatting varies significantly between encoding standards and/or the type of display selected.

In a first embodiment, in accordance with the present invention, as previously described with reference to FIGS. 10–12 an address generator is employed to store a block of formatted data, output from either the first decoder (Spatial Decoder) or the combination of the first decoder (Spatial Decoder) and the second decoder (the Temporal Decoder), and to write the decoded information into and/or from a memory in a raster order. The video formatter described hereinafter provides a wide range of output signal combinations.

In the preferred multi-standard video decoder embodiment of the present invention, the Spatial Decoder and the Temporal Decoder are required to implement both an MPEG encoded signal and an H.261 video decoding system. The DRAM interfaces on both devices are configurable to allow the quantity of DRAM required to be reduced when working with small picture formats and at low coded data rates. The reconfiguration of these DRAMs will be further described hereinafter with reference to the DRAM interface. Typically, a single 4 megabyte DRAM is required by each of the Temporal Decoder and the Spatial Decoder circuits.

The Spatial Decoder of the present invention performs all the required processing within a single picture. This reduces the redundancy within one picture.

The Temporal Decoder reduces the redundancy between the subject picture with relationship to a picture which arrives prior to the arrival of the subject picture, as well as a picture which arrives after the arrival of the subject picture. One aspect of the Temporal Decoder is to provide an address decode network which handles the complex addressing needs to read out the data associated with all of these pictures with the least number of circuits and with high speed and improved accuracy.

As previously described with reference to FIG. 11, the data arrives through the Start Code Detector, a FIFO register which precedes a Huffman decoder and parser, through a second FIFO register, an inverse modeller, an inverse quantizer, inverse zigzag and inverse DCT. The two FIFOs need not be on the chip. In one embodiment, the data does not flow through a FIFO that is on the chip. The data is applied to the DRAM interface, and the FIFO-IN storage register and the FIFO-OUT register is off the chip in both cases. These registers, whose operation is entirely independent of the standards, will subsequently be described herein in further detail.

The majority of the subsystems and stages shown in FIG. 11 are actually independent of the particular standard used and include the DRAM interface 58, the buffer manager 59 which is generating addresses for the DRAM interface, the inverse modeller 75, the inverse zig-zag 81 and the inverse DCT 83. The standard independent units within the Huffman decoder and parser include the ALU 66 and the token formatter 71.

Referring now to FIG. 12, the standard-independent units include the DRAM interface 100, the fork 91, the FIFO register 96, the summer 98 and the output selector 106. The standard dependent units are the address generator 94, which is different in H.261 and in MPEG, and the prediction filter 103, which is reconfigurable to have the ability to do both H.261 and MPEG. The JPEG data will flow through the entire machine completely unaltered.

FIG. 13 depicts a high level block diagram of the video formatter chip. The vast majority of this chip is independent of the standard. The only items that are affected by the standard is the way the data is written into the DRAM in the case of H.261, which differs from MPEG or JPEG; and that in H.261, it is not necessary to code every single picture. There is some timing information referred to as a temporal reference which provides some information regarding when the pictures are intended to be displayed, and that is also handled by the address generation type of logic in the video formatter.

The remainder of the circuitry embodied in the video formatter, including all of the color space conversion, the up-sampling filters and all of the gamma correction RAMs, is entirely independent of the particular compression standard utilized.

The Start Code Detector of the present invention is dependent on the compression standard in that it has to recognize different start code patterns in the bitstream for each of the standards. For example, H.261 has a 16 bit start code, MPEG has a 24 bit start code and JPEG uses marker codes which are fairly different from the other start codes. Once the Start Code Detector has recognized those different start codes, its operation is essentially independent of the compression standard. For instance, during searching, apart from the circuitry that recognizes the different category of markers, much of the operation is very similar between the three different compression standards.

The next unit is the state machine 68 (FIG. 11) located within the Huffman decoder and parser. Here, the actual circuitry is almost identical for each of the three compression standards. In fact, the only element that is affected by the standard in operation is the reset address of the machine. If just the parser is reset, then it jumps to a different address for each standard. There are, in fact, four standards that are recognized. These standards are H.261, JPEG, MPEG and one other, where the parser enters a piece of code that is used for testing. This illustrates that the circuitry is identical in almost every aspect, but the difference is the program in the microcode for each of the standards. Thus, when operating in H.261, one program is running, and when a different program is running, there is no overlap between them. The same holds true for JPEG, which is a third, completely independent program.

The next unit is the Huffman decoder 56 which functions with the index to data unit 64. Those two units cooperate together to perform the Huffman decoding. Here, the algorithm that is used for Huffman decoding is the same, irrespective of the compression standard. The changes are in which tables are used and whether or not the data coming into the Huffman decoder is inverted. Also, the Huffman decoder itself includes a state machine that understands some aspects of the coding standards. These different operations are selected in response to an instruction coming from the parser state machine. The parser state machine operates with a different program for each of the three compression standards and issues the correct command to the Huffman decoder at different times consistent with the standard in operation.

The last unit on the chip that is dependent on the compression standard is the inverse quantizer 79, where the mathematics that the inverse quantizer performs are different for each of the different standards. In this regard, a CODING_STANDARD token is decoded and the inverse quantizer 79 remembers which standard it is operating in. Then, any subsequent DATA tokens that happen after that event, but before another CODING_STANDARD may come along, are dealt with in the way indicated by the CODING_STANDARD that has been remembered inside the inverse quantizer. In the detailed description, there is a table illustrating different parameters in the different standards and what circuitry is responding to those different parameters or mathematics.

The address generation, with reference to H.261, differs for each of the subsystems shown in FIG. 12 and FIG. 13. The address generation in FIG. 11, which generates addresses for the two FIFOs before and after the Huffman decoder, does not change depending on the coding standards. Even in H.261, the address generation that happens on that chip is unaltered. Essentially, the difference between these standards is that in MPEG and JPEG, there is an organization of macroblocks that are in linear lines going horizontally across pictures. As best observed in FIG. 14*a*, a first macroblock A covers one full line. A macroblock B covers less than a line. A macroblock C covers multiple lines. The division in MPEG is into slices 132, and a slice may be one horizontal line, A, or it may be part of a horizontal line B, or it may extend from one line into the next line, C. Each of these slices 132 is made up of a row of macroblocks.

In H.261, the organization is rather different because the picture is divided into groups of blocks (GOB). A group of blocks is three rows of macroblocks high by eleven macroblocks wide. In the case of a CIF picture, there are twelve such groups of blocks. However, they are not organized one above the other. Rather, there are two groups of blocks next to each other and then six high, i.e., there are 6 GOB's vertically, and 2 GOB's horizontally.

In all other standards, when performing the addressing, the macroblocks are addressed in order as described above. More specifically, addressing proceeds along the lines and at the end of the line, the next line is started. In H.261, the order of the blocks is the same as described within a group of blocks, but in moving onto the next group of blocks, it is almost a zig-zag.

The present invention provides circuitry to deal with the latter affect. That is the way in which the address generation in the spatial decoder and the video formatter varies for H.261. This is accomplished whenever information is written into the DRAM. It is written with the knowledge of the aforementioned address generation sequence so the place where it is physically located in the RAM is exactly the same as if this had been an MPEG picture of the same size. Hence, all of the address generation circuitry for reading from the DRAM, for instance, when forming predictions, does not have to comprehend that it is H.261 standard because the physical placement of the information in the memory is the same as it would have been if it had been in MPEG sequence. Thus, in all cases, only writing of data is affected.

In the Temporal Decoder, there is an abstraction for H.261 where the circuitry pretends something is different from what is actually occurring. That is, each group of blocks is conceptually stretched out so that instead of having a rectangle which is 11×3 macroblocks, the macroblocks are stretched out into a length of 33 blocks (see FIG. 14*c*) group of blocks which is one macroblock high. By doing that, exactly the same counting mechanisms used on the Temporal Decoder for counting through the groups of blocks are also used for MPEG.

There is a correspondence in the way that the circuitry is designed between an H.261 group of blocks and an MPEG slice. When H.261 data is processed after the Start Code Detector, each group of blocks is preceded by a slice_start_code. The next group of blocks is preceded by the next slice_start code. The counting that goes on inside the Temporal Decoder for counting through this structure pretends that it is a 33 macroblock-long group that is one macroblock high. This is sufficient, although the circuitry also counts every 11th interval. When it counts to the 11th macroblock or the 22nd macroblock, it resets some counters. This is accomplished by simple circuitry with another counter that counts up each macroblock, and when it gets to 11, it resets to zero. The microcode interrogates that and does that work. All the circuitry in the temporal decoder of the present invention is essentially independent of the compression standard with respect to the physical placement of the macroblocks.

In terms of multi-standard adaptability, there are a number of different tables and the circuitry selects the appropriate table for the appropriate standard at the appropriate time. Each standard has multiple tables; the circuitry selects from the set at any given time. Within any one standard, the circuitry selects one table at one time and another table another time. In a different standard, the circuitry selects a different set of tables. There is some intersection between those tables as indicated previously in the discussion of FIG. 15. For example, one of the tables used in MPEG is also used in JPEG. The tables are not a completely isolated set. FIG. 15 illustrates an H.261 set, an MPEG set and a JPEG set. Note that there is a much greater overlap between the H.261 set and the MPEG set. They are quite common in the tables they utilize. There is a small overlap between MPEG and JPEG, and there is no overlap at all between H.261 and JPEG S0 that these standards have totally different sets of tables.

As previously indicated, most of the system units are compression standard independent. If a unit is standard independent, and such units need not remember what CODING_STANDARD is being processed. All of the units that are standard dependent remember the compression standard as the CODING_STANDARD token flows by them. When information encoded/decoded in a first coding standard is distributed through the machine, and a machine is changing standards, prior machines under microprocessor control would normally choose to perform in accordance with the H.261 compression standard. The MPU in such prior machines generates signals stating in multiple different places within the machine that the compression standard is changing. The MPU makes changes at different times and, in addition, may flush the pipeline through.

In accordance with the invention, by issuing a change of CODING_STANDARD tokens at the Start Code Detector that is positioned as the first unit in the pipeline, this change of compression standard is readily handled. The token says a certain coding standard is beginning and that control information flows down the machine and configures all the other registers at the appropriate time. The MPU need not program each register.

The prediction token signals how to form predictions using the bits in the bitstream. Depending on which compression standard is operating, the circuitry translates the information that is found in the standard, i.e. from the bitstream into a prediction mode token. This processing is performed by the Huffman decoder and parser state machine, where it is easy to manipulate bits based on certain conditions. The Start Code Detector generates this prediction mode token. The token then flows down the machine to the circuitry of the Temporal Decoder, which is the device responsible for forming predictions. The circuitry of the spatial decoder interprets the token without having to know what standard it is operating in because the bits in it are invariant in the three different standards. The Spatial Decoder just does what it is told in response to that token. By having these tokens and using them appropriately, the design of other units in the machine is simplified. Although there may be some complications in the program, benefits are received in that some of the hard wired logic which would be difficult to design for multi-standards can be used here.

2. JPEG STILL PICTURE DECODING

As previously indicated, the present invention relates to signal decompression and, more particularly, to the decompression of an encoded video signal, irrespective of the compression standard employed.

One aspect of the present invention is to provide a first decoder circuit (the Spatial Decoder) to decode a first encoded signal (the JPEG encoded video signal) in combination with a second decoder circuit (the Temporal Decoder) to decode a first encoded signal (the MPEG or H.261 encoded video signal) in a pipeline processing system. The Temporal Decoder is not needed for JPEG decoding.

In this regard, the invention facilitates the decompression of a plurality of differently encoded signals through the use of a single pipeline decoder and decompression system. The decoding and decompression pipeline processor is organized on a unique and special configuration which allows the handling of the multi-standard encoded video signals through the use of techniques all compatible with the single pipeline decoder and processing system. The Spatial Decoder is combined with the Temporal Decoder, and the Video Formatter is used in driving a video display.

Another aspect of the invention is the use of the combination of the Spatial Decoder and the Video Formatter for use with only still pictures. The compression standard independent Spatial Decoder performs all of the data processing within the boundaries of a single picture. Such a decoder handles the spatial decompression of the internal picture data which is passing through the pipeline and is distributed within associated random access memories, standard independent address generation circuits for handling the storage and retrieval of information into the memories. Still picture data is decoded at the output of the Spatial Decoder, and this output is employed as input to the multi-standard, configurable Video Formatter, which then provides an output to the display terminal. In a first sequence of similar pictures, each decompressed picture at the output of the Spatial Decoder is of the same length in bits by the time the picture reaches the output of the Spatial Decoder. A second sequence of pictures may have a totally different picture size and, hence, have a different length when compared to the first length. Again, all such second sequence of similar pictures are of the same length in bits by the time such pictures reach the output of the Spatial Decoder.

Another aspect of the invention is to internally organize the incoming standard dependent bitstream into a sequence of control tokens and DATA tokens, in combination with a plurality of sequentially-positioned reconfigurable processing stages selected and organized to act as a standard-independent, reconfigurable-pipeline-processor.

With regard to JPEG decoding, a single Spatial Decoder with no off chip DRAM can rapidly decode baseline JPEG images. The Spatial Decoder supports all features of baseline JPEG encoding standards. However, the image size that can be decoded may be limited by the size of the output buffer provided. The Spatial Decoder circuit also includes a random access memory circuit, having machine-dependent, standard independent address generation circuits for handling the storage of information into the memories.

As previously, indicated the Temporal Decoder is not: required to decode JPEG-encoded video. Accordingly, signals carried by DATA tokens pass directly through the Temporal Decoder without further processing when the Temporal Decoder is configured for a JPEG operation.

Another aspect of the present invention is to provide in the Spatial Decoder a pair of memory circuits, such as buffer memory circuits, for operating in combination with the Huffman decoder/video demultiplexor circuit (HD & VDM). A first buffer memory is positioned before the HD & VDM, and a second buffer memory is positioned after the HD & VDM. The HD & VDM decodes the bitstream from the binary ones and zeros that are in the standard encoded bitstream and turns such stream into numbers that are used downstream. The advantage of the two buffer system is for implementing a multi-standard decompression system. These two buffers, in combination with the identified implementation of the Huffman decoder, are described hereinafter in greater detail.

A still further aspect of the present multi-standard, decompression circuit is the combination of a Start Code Detector circuit positioned upstream of the first forward buffer operating in combination with the Huffman decoder. One advantage of this combination is increased flexibility in dealing with the input bitstream, particularly padding, which has to be added to the bitstream. The placement of these identified components, Start Code Detector, memory buffers, and Huffman decoder enhances the handling of certain sequences in the input bitstream.

In addition, off chip DRAMs are used for decoding JPEG-encoded video pictures in real time. The size and speed of the buffers used with the DRAMs will depend on the video encoded data rates.

The coding standards identify all of the standard dependent types of information that is necessary for storage in the DRAMs associated with the Spatial Decoder using standard independent circuitry.

3. MOTION PICTURE DECOMPRESSION

In the present invention, if motion pictures are being decompressed through the steps of decoding, a further Temporal Decoder is necessary. The Temporal Decoder combines the data decoded in the Spatial Decoder with pictures, previously decoded, that are intended for display either before or after the picture being currently decoded. The Temporal Decoder receives, in the picture coded datastream, information to identify this temporally-displaced information. The Temporal Decoder is organized to address temporally and spatially displaced information, retrieve it, and combine it in such a way as to decode the information located in one picture with the picture currently being decoded and ending with a resultant picture that is complete and is suitable for transmission to the video formatter for driving the display screen. Alternatively, the resultant picture can be stored for subsequent use in temporal decoding of subsequent pictures.

Generally, the Temporal Decoder performs the processing between pictures either earlier and/or later in time with reference to the picture currently being decoded. The Temporal Decoder reintroduces information that is not encoded within the coded representation of the picture, because it is redundant and is already available at the decoder. More specifically, it is probable that any given picture will contain similar information as pictures temporally surrounding it, both before and after. This similarity can be made greater if motion compensation is applied. The Temporal Decoder and decompression circuit also reduces the redundancy between related pictures.

In another aspect of the present invention, the Temporal Decoder is employed for handling the standard-dependent output information from the Spatial Decoder. This standard dependent information for a single picture is distributed among several areas of DRAM in the sense that the decompressed output information, processed by the Spatial Decoder, is stored in other DRAM registers by other random access memories having still other machine-dependent, standard-independent address generation circuits for combining one picture of spatially decoded information packet of spatially decoded picture information, temporally displaced relative to the temporal position of the first picture.

In multi-standard circuits capable of decoding MPEG-encoded signals, larger logic DRAM buffers may be required to support the larger picture formats possible with MPEG.

The picture information is moving through the serial pipeline in 8 pel by 8 pel blocks. In one form of the invention, the address decoding circuitry handles these pel blocks (storing and retrieving) along such block boundaries. The address decoding circuitry also handles the storing and retrieving of such 8 by 8 pel blocks across such boundaries. This versatility is more completely described hereinafter.

A second Temporal Decoder may also be provided which passes the output of the first decoder circuit (the Spatial Decoder) directly to the Video Formatter for handling without signal processing delay.

The Temporal Decoder also reorders the blocks of picture data for display by a display circuit. The address decode circuitry, described hereinafter, provides handling of this reordering.

As previously mentioned, one important feature of the Temporal Decoder is to add picture information together from a selection of pictures which have arrived earlier or later than the picture under processing. When a picture is described in this context, it may mean any one of the following:

1. The coded data representation of the picture;
2. The result, i.e., the final decoded picture resulting from the addition of a process step performed by the decoder;
3. Previously decoded pictures read from the DRAM; and
4. The result of the spatial decoding, i.e., the extent of data between a PICTURE_START token and a subsequent PICTURE_END token.

After the picture data information is processed by the Temporal Decoder, it is either displayed or written back into a picture memory location. This information is then kept for further reference to be used in processing another different coded data picture.

Re-ordering of the MPEG encoded pictures for visual display involves the possibility that a desired scrambled picture can be achieved by varying the re-ordering feature of the Temporal Decoder.

4. RAM MEMORY MAP

The Spatial Decoder, Temporal Decoder and video Formatter all use external DRAM. Preferably, the same DRAM is used for all three devices. While all three devices use DRAM, and all three devices use a DRAM interface in conjunction with an address generator, what each implements in DRAM is different. That is, each chip, e.g. Spatial Decoder and Temporal Decoder, have a different DRAM interface and address generation circuitry even through they use a similar physical, external DRAM.

In brief, the Spatial Decoder implements two FIFOs in the common DRAM. Referring again to FIG. 11, one FIFO 54 is positioned before the Huffman decoder 56 and parser, and the other is positioned after the Huffman decoder and parser. The FIFOs are implemented in a relatively straightforward manner. For each FIFO, a particular portion of DRAM is set aside as the physical memory in which the FIFO will be implemented.

The address generator associated with the Spatial Decoder DRAM interface 58 keeps track of FIFO addresses using two pointers. One pointer points to the first word stored in the FIFO, the other pointer points to the last word stored in the FIFO, thus allowing read/write operation on the appropriate word. When, in the course of a read or write operation, the end of the physical memory is reached, the address generator "wraps around" to the start of the physical memory.

In brief, the Temporal Decoder of the present invention must be able to store two full pictures or frames of whatever encoding standard (MPEG or H.261) is specified. For simplicity, the physical memory in the DRAM into which the two frames are stored is split into two halves, with each half being dedicated (using appropriate pointers) to a particular one of the two pictures.

MPEG uses three different picture types: Intra (I) Predicted (P) and Bidirectionally interpolated (B). As previously mentioned, B pictures are based on predictions from two pictures. One picture is from the future and one from the past. I pictures require no further decoding by the Temporal Decoder, but must be stored in one of the two picture buffers for later use in decoding P and B pictures. Decoding P pictures requires forming predictions from a, previously decoded P or I picture. The decoded P picture is stored in a picture buffer for use decoding P and B pictures. B pictures can require predictions form both of the picture buffers. However, B pictures are not stored in the external DRAM.

Note that I and P pictures are not output from the Temporal Decoder as they are decoded. Instead, I and P pictures are written into one of the picture buffers, and are read out only when a subsequent I or P picture arrives for decoding. In other words, the Temporal Decoder relies on subsequent P or I pictures to flush previous pictures out of the two picture buffers, as further discussed hereinafter in the section on flushing. In brief, the Spatial Decoder can provide a fake I or P picture at the end of a video sequence to flush out the last P or I picture. In turn, this fake picture is flushed when a subsequent video sequence starts.

The peak memory band width load occurs when decoding B pictures. The worst case is the B frame may be formed from predictions from both the picture buffers, with all predictions being made to half-pixel accuracy.

As previously described, the Temporal Decoder can be configured to provide MPEG picture reordering. With this picture reordering, the output of P and I pictures is delayed until the next P or I picture in the data stream starts to be decoded by the Temporal Decoder.

As the P or I pictures are reordered, certain tokens are stored temporarily on chip as the picture is written into the picture buffers. When the picture is read out for display, these stored tokens are retrieved. At the output of the Temporal Decoder, the DATA Tokens of the newly decoded P or I picture are replaced with DATA Tokens for the older P or I picture.

In contrast, H.261 makes predictions only from the picture just decoded. As each picture is decoded, it is; written into one of the two picture buffers so it can be used in decoding the next picture. The only DRAM memory operations required are writing 8×8 blocks, and forming predictions with integer accuracy motion vectors.

In brief, the Video Formatter stores three frames or pictures. Three pictures need to be stored to accommodate such features as repeating or skipping pictures.

5. BITSTREAM CHARACTERISTICS

Referring now particularly to the Spatial Decoder of the present invention, it is helpful to review the bitstream characteristics of the encoded datastream as these characteristics must be handled by the circuitry of the Spatial Decoder and the Temporal Decoder. For example, under one or more compression standards, the compression ratio of the standard is achieved by varying the number of bits that it uses to code the pictures of a picture. The number of bits can vary by a wide margin. Specifically, this means that the length of a bitstream used to encode a referenced picture of a picture might be identified as being one unit long, another picture might be a number of units long, while still a third picture could be a fraction of that unit.

None of the existing standards (MPEG 1.2, JPEG, H.261) define a way of ending a picture, the implication being that when the next picture starts, the current one has finished. Additionally, the standards (H.261 specifically) allow incomplete pictures to be generated by the encoder.

In accordance with the present invention, there is provided a way of indicating the end of a picture by using one of its tokens: PICTURE_END. The still encoded picture data leaving the Start Code Detector consists of pictures starting with a PICTURE_START token and ending with a PICTURE_END token, but still of widely varying length. There may be other information transmitted here (between the first and second picture), but it is known that the first picture has finished.

The data stream at the output of the Spatial Decoder consists of pictures, still with picture-starts and-picture-ends, of the same length (number of bits) for a given sequence. The length of time between a picture-start and a picture-end may vary.

The Video Formatter takes these pictures of non-uniform time and displays them on a screen at a fixed picture rate determined by the type of display being driven. Different display rates are used throughout the world, e.g. PAL-NTSC television standards. This is accomplished by selectively dropping or repeating pictures in a manner which is unique. Ordinary "frame rate converters," e.g. 2–3 pulldown, operate with a fixed input picture rate, whereas the Video Formatter can handle a variable input picture rate.

6. RECONFIGURABLE PROCESSING STAGE

Referring again to FIG. 10, the reconfigurable processing stage (RPS) comprises a token decode circuit 3 which is employed to receive the tokens coming from a two wire interface 37 and input latches 34. The output of the token decode circuit 33 is applied to a-processing unit :.6 over the two-wire interface 37 and an action identification circuit 39. The processing unit 36 is suitable for processing data under the control of the action identification circuit 39. After the processing is completed, the processing unit 36 connects such completed signals to the output, two-wire interface bus 40 through output latches 41.

The action identification decode circuit 39 has an input from the token decode circuit 33 over the two-wire interface bus 40 and/or from memory circuits 43 and 44 over two-wire interface bus 46. The tokens from the token decode circuit 33 are applied simultaneously to the action identification circuit 39 and the processing unit 36. The action identification function as well as the RPS is described in further detail by tables and figures in a subsequent portion of this specification.

The functional block diagram in FIG. 10 illustrates those stages shown in FIGS. 11, 12 and 13 which are not standard independent circuits. The data flows through the token decode circuit 33, through the processing unit 36 and onto the two-wire interface circuit 42 through the output latches 41. If the Control Token is recognized-by the RPS, it is decoded in the token decode circuit 33 and appropriate action will be taken. If it is not recognized, it will be passed unchanged to the output two-wire interface 42 through the output circuit 41. The present invention operates as a pipeline processor having a two-wire interface for controlling the movement of control tokens through the pipeline. This feature of the invention is described in greater detail in the previously filed EPO patent application number 92306038.8.

In the present invention, the token decode circuit 33 is employed for identifying whether the token presently entering through the two-wire interface 42 is a DATA token or control token. In the event that the token being examined by the token decode circuit 33 is recognized, it is exited to the action identification circuit 39 with a proper index signal or flag signal indicating that action is to be taken. At the same time, the token decode circuit 33 provides a proper flag or index signal to the processing unit 36 to alert it to the presence of the token being handled by the action identification circuit 39.

Control tokens may also be processed.

A more detailed description of the various types of tokens usable in the present invention will be subsequently described hereinafter. For the purpose of this portion of the specification, it is sufficient to note that the address carried by the control token is decoded in the decoder 33 and is used to access registers contained within the action identification circuit 39. When the token being examined is a recognized control token, the action identification circuit 39 uses its reconfiguration state circuit for distributing the control signals throughout the state machine. As previously mentioned, this activates the state machine of the action identification decoder 39, which then reconfigures itself. For example, it may change coding standards. In this way, the action identification circuit 39 decodes the required action for handling the particular standard now passing through the state machine shown with reference to FIG. 10.

Similarly, the processing unit 36 which is under the control of the action identification circuit 39 is now ready to process the information contained in the data fields of the DATA token when it is appropriate for this to occur. On many occasions, a control token arrives first, reconfigures the action identification circuit 39 and is immediately followed by a DATA token which is then processed by the processing unit 36. The control token exits the output latches circuit 41 over the output two-wire interface 42 immediately preceding the DATA token which has been processed within the processing unit 36.

In the present invention, the action identification circuit, 39, is a state machine holding history state. The registers, 43 and 44 hold information that has been decoded from the token decoder 33 and stored in these registers. Such registers can be either on-chip or-off chip as needed. These plurality of state registers contain action information connected to the action identification currently being identified in the action identification circuit 39. This action information has been stored from previously decoded tokens and can affect the action that is selected. The connection 40 is going straight from the token decode 33 to the action identification block 39. This is intended to show that the action can also be affected by the token that is currently being processed by the token decode circuit 33.

In general, there is shown token decoding and data processing in accordance with the present invention. The data processing is performed as configured by the action identification circuit 39. The action is affected by a number of conditions and is affected by information generally derived from a previously decoded token or, more specifically, information stored from previously decoded tokens in registers 43 and 44, the current token under processing, and the state and history information that the action identification unit 39 has itself acquired. A distinction is thereby shown between Control tokens and DATA tokens.

In any RPS, some tokens are viewed by that RPS unit as being Control tokens in that they affect the operation of the RPS presumably at some subsequent time. Another set of tokens are viewed by the RPS as DATA tokens. Such DATA tokens contain information which is processed by the RPS in a way that is determined by the design of the particular circuitry, the tokens that have been previously decoded and the state of the action identification circuit 39. Although a particular RPS identifies a certain set of tokens for that particular RPS control and another set of tokens as data, that is the view of that particular RPS. Another RPS can have a different view of the same token. Some of the tokens might be viewed by one RPS unit as DATA Tokens while another RPS unit might decide that it is actually a Control Token. For example, the quantization table information, as far as the Huffman decoder and state machine is concerned, is data, because it arrives on its input as coded data, it gets formatted up into a series of 8 bit words, and they get formed into a token called a quantization table token (QUANT_TABLE) which goes down the processing pipeline. As far as that machine is concerned, all of that was data; it was handling data, transforming one sort of data into another sort of data, which is clearly a function of the processing performed by that portion of the machine. However, when that information gets to the inverse quantizer, it stores the information in that token a plurality of registers. In fact, because there are 64 8-bit numbers and there are many registers, in general, many registers may be present. This information is viewed as control information, and then that control information affects the processing that is done on subsequent DATA tokens because it affects the number that you multiply each data word. There is an example where one stage viewed that token as being data and another stage viewed it as being control.

Token data, in accordance with the invention is almost universally viewed as being data through the machine. One of the important aspects is that, in general, each stage of circuitry that has a token decoder will be looking for a certain set of tokens, and any tokens that it does not recognize will be passed unaltered through the stage and down the pipeline, so that subsequent stages downstream of the current stage have the benefit of seeing those tokens and may respond to them. This is an important feature, namely there can be communication between blocks that are not adjacent to one another using the token mechanism.

Another important feature of the invention is that each of the stages of circuitry has the processing capability within it to be able to perform the necessary operations for each of the standards, and the control, as to which operations are to be performed at a given time, come as tokens. There is one processing element that differs between the different stages to provide this capability. In the state machine ROM of the parser, there are three separate entirely different programs;, one for each of the standards that are dealt with. Which program is executed depends upon a CODING_STANDARD token. In otherwords, each of these three programs has within it the ability to handle both decoding and the CODING_STANDARD standard token. When each of these programs sees which coding standard, is to be decoded next, they literally jump to the start address in the microcode ROM for that particular program. This is how stages deal with multi-standardness.

Two things are affected by the different standards. First, it affects what pattern of bits in the bitstream are recognized as a start-code or a marker code in order to reconfigure the shift register to detect the length of the start marker code. Second, there is a piece of information in the microcode that denotes what that start or marker code means. Recall that the coding of bits differs between the three standards. Accordingly, the microcode looks up in a table, specific to that compressor standard, something that is independent of the standard, i.e., a type of token that represents the incoming codes. This token is typically independent of the standard since in most cases, each of the various standards provide a certain code that will produce it.

The inverse quantizer 79 has a mathematical capability. The quantizer multiplies and adds, and has the ability to do all three compression standards which are configured by parameters. For example, a flag bit in the ROM in control tells the inverse quantizer whether or not to add a constant, K. Another flag tells the inverse quantizer whether to add another constant. The inverse quantizer remembers in a register the CODING_STANDARD token as it flows by the quantizer. When DATA tokens pass thereafter, the inverse quantizer remembers what the standard is and it looks up the parameters that it needs to apply to the processing elements in order to perform a proper operation. For example, the inverse quantizer will look up whether K is set to 0, or whether it is set to 1 for a particular compression standard, and will apply that to its processing circuitry.

In a similar sense the Huffman decoder 56 has a number of tables within it, some for JPEG, some for MPEG and some for H.261. The majority of those tables, in fact, will service more than one of those compression standards. Which tables are used depends on the syntax of the standard. The Huffman decoder works by receiving a command from the state machine which tells it which of the tables to use. Accordingly, the Huffman decoder does not itself directly have a piece of state going into it, which is remembered and which says what coding it is performing. Rather, it is the combination of the parser state machine and Huffman decoder together that contain information within them.

Regarding the Spatial Decoder of the present invention, the address generation is modified and is similar to that shown in FIG. 10, in that a number of pieces of information are decoded from tokens, such as the coding standard. The coding standard and additional information as well, is recorded in the registers and that affects the progress of the address generator state machine as it steps through and counts the macroblocks in the system, one after the other. The last stage would be the prediction filter 179 (FIG. 17) which operates in one of two modes, either H.261 or MPEG and are easily identified.

7. MULTI-STANDARD CODING

The system of the present invention also provides a combination of the standard-independent indices generation circuits, which are strategically placed throughout the system in combination with the token decode circuits. For example, the system is employed for specifically decoding either the H.261 video standard, or the MPEG video standard or the JPEG video standard. These three compression coding standards specify similar processes to be done on the arriving data, but the structure of the datastreams is different. As previously discussed, it is one of the functions of the Start Code Detector to detect MPEG start-codes, H.261 start-codes, and JPEG marker codes, and convert them all into a form, i.e., a control token which includes a token stream embodying the current coding standard. The control tokens are passed through the pipeline processor, and are used, i.e., decoded, in the state machines to which they are relevant, and are passed through other state machines to which the tokens are not relevant. In this regard, the DATA Tokens are treated in the same fashion, insofar as they are processed only in the state machines that are configurable by the control tokens into processing such DATA Tokens. In the remaining state machines, they pass through unchanged.

More specifically, a control token in accordance with the present invention, can consist of more than one word in the token. In that case, a bit known as the extension bit is set specifying the use of additional words in the token for carrying additional information. Certain of these additional control bits contain indices indicating information for use in corresponding state machines to create a set of standard-independent indices signals. The remaining portions of the token are used to indicate and identify the internal processing control function which is standard for all of the datastreams passing through the pipeline processor. In one form of the invention, the token extension is used to carry the current coding standard which is decoded by the relative token decode circuits distributed throughout the machine, and is used to reconfigure the action identification circuit 39 of stages throughout the machine wherever it is appropriate to operate under a new coding standard. Additionally, the token decode circuit can indicate whether a control token is related to one of the selected standards which the circuit was designed to handle.

More specifically, an MPEG start code and a JPEG marker are followed by an 8 bit value. The H.261 start code is followed by a 4 bit value. In this context, the Start Code Detector 51, by detecting either an MPEG start-code or a JPEG marker, indicates that the following 8 bits contain the value associated with the start-code. Independently, it can then create a signal which indicates that it is either an MPEG start code or a JPEG marker and not an H.261 start code. In this first instance, the 8 bit value is entered into a decode circuit, part of which creates a signal indicating the index and flag which is used within the current circuit for handling the tokens passing through the circuit. This is also used to insert portions of the control token which will be looked at thereafter to determine which standard is being handled. In this sense, the control token contains a portion indicating that it is related to an MPEG standard, as well as a portion which indicates what type of operation should be performed on the accompanying data. As previously discussed, this information is utilized in the system to reconfigure the processing stage used to perform the function required by the various standards created for that purpose.

For example, with reference to the H.261 start code, it is associated with a 4 bit value which follows immediately after the start code. The Start Code Detector passes this value into the token generator state machine. The value is applied to an 8 bit decoder which produces a 3 bit start number. The start number is employed to identify the picture-start of a picture number as indicated by the value.

The system also includes a multi-stage parallel processing pipeline operating under the principles of the two-wire interface previously described. Each of the stages; comprises a machine generally taking the form illustrated in FIG. 10. The token decode circuit 33 is employed to direct the token presently entering the state machine into the action identification circuit 39 or the processing unit 36, as appropriate. The processing unit has been previously reconfigured by the next previous control token into the form needed for handling the current coding standard, which is none entering the processing stage and carried by the next DATA token. Further, in accordance with this aspect of the invention, the succeeding state machines in the processing pipeline can be functioning under one coding standard, i.e., H.261, while a previous stage can be operating under a separate standard, such as MPEG. The same two-wire interface is used for carrying both the control tokens and the DATA Tokens.

The system of the present invention also utilizes control tokens required to decode a number of coding standards with a fixed number of reconfigurable processing stages. More specifically, the PICTURE-END control token is employed because it is important to have an indication of when a picture actually ends. Accordingly, in designing a multi-standard machine, it is necessary to create additional control tokens within the multi-standard pipeline processing machine which will then indicate which one of the standard decoding techniques to use. Such a control token is the PICTURE_END token. This PICTURE_END token is used to indicate that the current picture has finished, to force the buffers to be flushed, and to push the current picture through the decoder to the display.

8. MULTI-STANDARD PROCESSING CIRCUIT—SECOND MODE OF OPERATION

A compression standard-dependent circuit, in the form of the previously described Start Code Detector, is suitably interconnected to a compression standard-independent circuit over an appropriate bus. The standard-dependent circuit is connected to a combination dependent-independent circuit over the same bus and an additional bus. The standard-independent circuit applies additional input to the standard dependent-independent circuit, while the latter provides information back to the standard-independent circuit. Information from the standard-independent circuit is applied to the output over another suitable bus. Table 600 illustrates that the multiple standards applied as the input to the standard-dependent Start Code Detector 51 include certain bit streams which have standard-dependent meanings within each encoded bit stream.

9. START-CODE DETECTOR

As previously indicated the Start Code Detector, in accordance with the present invention, is capable of taking MPEG, JPEG and H.261 bit streams and generating from them a sequence of proprietary tokens which are meaningful to the rest of the decoder. As an example of how multi-standard decoding is achieved, the MPEG (1 and 2) picture_start_code, the H.261 picture_start_code and the JPEG start_of_scan (SOS) marker are treated as equivalent by the Start Code Detector, and all will generate an internal PICTURE_START token. In a similar way, the MPEG sequence_start_code and the JPEG SOI (start_of_image) marker both generate a machine sequence_start_token. The H.261 standard, however, has no equivalent start code. Accordingly, the Start Code Detector, in response to the first H.261 picture_start_code, will generate a sequence-start token.

None of the above described images are directly used other than in the SCD. Rather, a machine PICTURE_START token, for example, has been deemed to be equivalent to the PICTURE_START images contained in the bit stream. Furthermore, it must be borne in mind that the machine PICTURE_START by itself, is not a direct image of the PICTURE_START in the standard. Rather, it is a control token which is used in combination with other control tokens to provide standard-independent decoding which emulates the operation of the images in each of the compression coding standards. The combination of control tokens in combination with the reconfiguration of circuits, in accordance with the information carried by control tokens, is unique in and of itself, as well as in further combination with indices and/or flags generated by the token decode circuit portion of a respective state machine. A typical reconfigurable state machine will be described subsequently.

Referring again to Table 600, there are shown the names of a group of standard images in the left column. In the right column there are shown the machine dependent control tokens used in the emulation of the standard encoded signal which is present or not used in the standard image.

With reference to Table 600, it can be seen that a machine sequence_start signal is generated by the Start Code Detector, as previously described, when it decodes any one of the standard signals indicated in Table 600. The Start Code Detector creates sequence_start, group_start, sequence_end, slice_start, user-data, extra-data and PICTURE_START tokens for application to the two-wire interface which is used throughout the system. Each of the stages which operate in conjunction with these control tokens are configured by the contents of the tokens, or are configured by indices created by contents of the tokens, and are prepared to handle data which is expected to be received when the picture DATA Token arrives at that station.

As previously described, one of the compression standards, such as H.261, does not have a sequence_start image in its data stream, nor does it have a PICTURE_END image in its data stream. The Start Code Detector indicates the PICTURE_END point in the incoming bit stream and creates a PICTURE_END token. In this regard, the system of the present invention is intended to carry data words that are fully packed to contain a bit of information in each of the register positions selected for use in the practice of the present invention. To this end, 15 bits have been selected as the number of bits which are passed between two start codes. Of course, it will be appreciated by one of ordinary skill in the art, that a selection can be made to include either greater or fewer than 15 bits. In other words, all 15 bits of a data word being passed from the Start Code Detector into the DRAM interface are required for proper operation. Accordingly, the Start Code Detector creates extra bits, called padding, which it inserts into the last word of a DATA Token. For purposes of illustration 15 data bits has been selected.

To perform the Padding operation, in accordance with the present invention, binary 0 followed by a number of binary 1's are automatically inserted to complete the 15 bit data word. This data is then passed through the coded data buffer and presented to the Huffman decoder, which removes the padding. Thus, an arbitrary number of bits can be passed through a buffer of fixed size and width.

In one embodiment, a slice_start control token is used to identify a slice of the picture. A slice_start control token is employed to segment the picture into smaller regions. The size of the region is chosen by the encoder, and the start Code Detector identifies this unique pattern of the slice_start code in order for the machine-dependent state stages, located downstream from the Start Code Detector, to segment the picture being received into smaller regions. The size of the region is chosen by the encoder, recognized by the Start Code Detector and used by the recombination circuitry and control tokens to decompress the encoded picture. The slice_start_codes are principally used for error recovery.

The start codes provide a unique method of starting up the decoder, and this will subsequently be described in further detail. There are a number of advantages in placing the Start Code Detector before the coded data buffer, as opposed to placing the Start Code Detector after the coded data buffer and before the Huffman decoder and video demultiplexor. Locating the Start Code Detector before the first buffer allows it to 1) assemble the tokens, 2) decode the standard control signals, such as start codes, 3) pad the bitstream before the data goes into the buffer, and 4) create the proper sequence of control tokens to empty the buffers, pushing the available data from the buffers into the Huffman Decoder.

Most of the control token output by the Start Code Detector directly reflect syntactic elements of the various picture and video coding standards. The Start Code Detector converts the syntactic elements into control tokens. In addition to these natural tokens, some unique and/or machine-dependent tokens are generated. The unique tokens include those tokens which have been specifically designed for use with the system of the present invention which are unique in and of themselves, and are employed for aiding in the multi-standard nature of the present invention. Examples of such unique tokens include PICTURE_END and CODING_STANDARD.

Tokens are also introduced to remove some of the syntactic differences between the coding standards and to function in co-operation with the error conditions. The automatic token generation is done after the serial analysis of the standard-dependent data. Therefore, the Spatial Decoder responds equally to tokens that have been supplied directly to the input of the Spatial Decoder, i.e. the SCD, as well as to tokens that have been generated following the detection of the start-codes in the coded data. A sequence of extra tokens is inserted into the two- wire interface in order to control the multi-standard nature of the present invention.

The MPEG and H.261 coded video streams contain standard dependent, non-data, identifiable bit patterns, one of which is hereinafter called a start image and/or standard-dependent code. A similar function is served in JPEG, by marker codes. These start/marker codes identify significant parts of the syntax of the coded datastream. The analysis of start/marker codes performed by the Start Code Detector is the first stage in parsing the coded data.

The start/marker code patterns are designed so that they can be identified without decoding the entire bit stream. Thus, they can be used, in accordance with the present invention, to assist with error recovery and decoder start-up. The Start Code Detector provides facilities to detect errors in the coded data construction and to assist the start-up of the decoder. The error detection capability of the Start Code Detector will subsequently be discussed in further detail, as will the process of starting up of the decoder.

The aforementioned description has been concerned primarilty with the characteristics of the machine-dependent bit stream and its relationship with the addressing characteristics of the present invention. The following description is of the bit stream characteristics of the standard-dependent coded data with reference to the Start Code Detector.

Each of the standard compression encoding systems employs a unique start code configuration or image which has been selected to identify that particular compression specification. Each of the start codes also carries with it a start code value. The start code value is employed to identify within the language of the standard the type of operation that the start code is associated with. In the multi-standard decoder of the present invention, the compatibility is based upon the control token and DATA token configuration as previously described. Index signals, including flag signals, are circuit-generated within each state machine, and are described hereinafter as appropriate.

The start and/or marker codes contained in the standards, as well as other standard words as opposed to data words, are sometimes identified as images to avoid confusion with the use of code and/or machine-dependent codes to refer to the contents of control and/or DATA tokens used in the machine. Also, the term start code is often used as a generic term to refer to JPEG marker codes as well as MPEG and H.261 start codes. Marker codes and start codes serve the same purpose. Also, the term "flush" is used both to refer to the FLUSH token, and as a verb, for example when referring to flushing the Start Code Detector shift registers (including the signal "flushed"). To avoid confusion, the FLUSH token is always written in upper case. All other uses of the term (verb or noun) are in lower case.

The standard-dependent coded input picture input stream comprises data and start images of varying lengths. The start images carry with them a value telling the user what operation is to be performed on the data which immediately follows according to the standard. However, in the multi-standard pipeline processing system of the present invention, where compatibility is required for multiple standards, the system has been optimized for handling all functions in all standards. Accordingly, in many situations, unique start control tokens must be created which are compatible not only with the values contained in the values of the encoded signal standard image, but which are also capable of controlling the various stages to emulate the operation of the standard as represented by specified parameters for each standard which are well known in the art. All such standards are incorporated by reference into this specification.

It is important to understand the relationship between tokens which, alone or in combination with other control tokens, emulate the nondata information contained in the standard bit stream. A separate set of index signals, including flag signals, are generated by each state machine to handle some of the processing within that state machine. Values carried in the standards can be used to access machine dependent control signals to emulate the handling of the standard data and non-data signals. For example, the slice_start token is a two word token, and it is then entered onto the two wire interface as previously described.

The data input to the system of the present invention may be a data source from any suitable data source such ads disk, tape, etc., the data source providing 8 bit data to the first functional stage in the Spatial Decoder, the Start Code Detector 51 (FIG. 11). The Start Code Detector includes three shift registers; the first shift register is 8 bits wide, the next is 24 bits wide, and the next is 15 bits wide. Each of the registers is part of the two-wire interface. The data from the data source is loaded into the first register as a single 8 bit byte during one timing cycle. Thereafter, the contents of the first shift register is shifted one bit at a time into the decode (second) shift register. After 24 cycles, the 24 bit register is full.

Every 8 cycles, the 8 bit bytes are loaded into the first shift register. Each byte is loaded into the value shift register 221 (FIG. 20), and 8 additional cycles are used to empty it and load the shift register 231. Eight cycles are used to empty it, so after three of those operations or 24 cycles, there are still three bytes in the 24 bit register. The value decode shift register 230 is still empty.

Assuming that there is now a PICTURE_START word in the 24 bit shift register, the detect cycle recognizes the PICTURE_START code pattern and provides a start signal as its output. Once the detector has detected a start, the byte following it is the value associated with that start code, and this is currently sitting in the value register 221.

Since the contents of the detect shift register has been identified as a start code, its contents must be removed from the two wire interface to ensure that no further processing takes place using these 3 bytes. The decode register is emptied, and the value decode shift register 230 waits for the value to be shifted all the way over to such register.

The contents now of the low order bit positions of the value decode shift register contains a value associated with the PICTURE_START. The Spatial Decoder equivalent to the standard PICTURE_START signal is referred to as the SD PICTURE_START signal. The SD PICTURE_START signal itself is going to now be contained in the token header, and the value is going to be contained in the extension word to the token header.

10. TOKENS

In the practice of the present invention, a token is a universal adaptation unit in the form of an interactive interfacing messenger package for control and/or data functions and is adapted for use with a reconfigurable processing stage (RPS) which is a stage, which in response to a recognized token, reconfigures itself to perform various operations.

Tokens may be either position dependent or position independent upon the processing stages for performance of various functions. Tokens may also be metamorphic in that they can be altered by a processing stage and then passed down the pipeline for performance of further functions. Tokens may interact with all or less than all of the stages and in this regard may interact with adjacent and/or non-adjacent stages. Tokens may be position dependent for some functions and position independent for other functions, and the specific interaction with a stage may be conditioned by the previous processing history of a stage.

A PICTURE_END token is a way of signalling the end of a picture in a multi-standard decoder.

A multi-standard token is a way of mapping MPEG, JPEG and H.261 data streams onto a single decoder using a mixture of standard dependent and standard independent hardware and control tokens.

A SEARCH_MODE token is a technique for searching MPEG, JPEG and H.261 data streams which allows random access and enhanced error recovery.

A STOP_AFTER_PICTURE token is a method of achieving a clear end to decoding which signals the end of a picture and clears the decoder pipeline, i.e., channel change.

Furthermore, padding a token is a way of passing an arbitrary number of bits through a fixed size, fixed width buffer.

The present invention is directed to a pipeline processing system which has a variable configuration which uses tokens and a two-wire system. The use of control tokens and DATA Tokens in combination with a two-wire system facilitates a multi-standard system capable of having extended operating capabilities as compared with those systems which do not use control tokens.

The control tokens are generated by circuitry within the decoder processor and emulate the operation of a number of different type standard-dependent signals passing into the serial pipeline processor for handling. The technique used is to study all the parameters of the multi-standards that are selected for processing by the serial processor and noting 1) their similarities, 2) their dissimilarities, 3) their needs and requirements and 4) selecting the correct token function to effectively process all of the standard signals sent into the serial processor. The functions of the tokens are to emulate the standards. A control token function is used partially as an emulation/translation between the standard dependent signals and as an element to transmit control information through the pipeline processor.

In prior art system, a dedicated machine is designed according to well-known techniques to identify the standard and then set up dedicated circuitry by way of microprocessor interfaces. Signals from the microprocessor are used to control the flow of data through the dedicated downstream components. The selection, timing and organization of this decompression function is under the control of fixed logic circuitry as assisted by signals coming from the microprocessor.

In contrast, the system of the present invention configures the downstream functional stages under the control of the control tokens. An option is provided for obtaining needed and/or alternative control from the MPU.

The tokens provide and make a sensible format for communicating information through the decompression circuit pipeline processor. In the design selected hereinafter and used in the preferred embodiment, each word of a token is a minimum of 8 bits wide, and a single token can extend over one or more words. The width of the token is changeable and can be selected as any number of bits. An extension bit indicates whether a token is extended beyond the current word, i.e., if it is set to binary one in all words of a token, except the last word of a token. If the first word of a token has an extension bit of zero, this indicates that the token is only one word long.

Each token is identified by an address field that starts at bit 7 of the first word of the token. The address field is variable in length and can potentially extend over multiple words. In a preferred embodiment, the address is no longer than 8 bits long. However, this is not a limitation on the invention, but on the magnitude of the processing steps elected to be accomplished by use of these tokens. It is to be noted under the extension bit identification label that the extension bit in words 1 and 2 is a 1, signifying that additional words will be coming thereafter. The extension bit in word 3 is a zero, therefore indicating the end of that token.

The token is also capable of variable bit length. For example, there are 9 bits in the token word plus the extension bit for a total of 10 bits. In the design of the present invention, output buses are of variable width. The output from the Spatial Decoder is 9 bits wide, or 10 bits wide when the extension bit is included. In a preferred embodiment, the only token that takes advantage of these extra bits is the DATA token; all other tokens ignore this extra bit. It should be understood that this is not a limitation, but only an implementation.

Through the use of the DATA token and control token configuration, it is possible to vary the length of the data being carried by these DATA tokens in the sense of the number of bits in one word. For example, it has been discussed that data bits in word of a DATA Token can be combined with the data bits in another word of the same DATA token to form an 11 bit or 10 bit address for use in accessing the random access memories used throughout this serial decompression processor. This provides an additional degree of variability that facilitates a broad range of versatility.

As previously described, the DATA token carries data from one processing stage to the next. Consequently, the characteristics of this token change as it passes through the decoder. For example, at the input to the Spatial Decoder, DATA Tokens carry bit serial coded video data packed into 8 bit words. Here, there is no limit to the length of each token. However, to illustrate the versatility of this aspect of the invention (at the output of the Spatial Decoder circuit), each DATA Token carries exactly 64 words and each word is 9 bits wide. More specifically, the standard encoding signal allows for different length messages to encode different intensities and details of pictures. The first picture of a group normally carries the longest number of data bits because it needs to provide the most information to the processing unit so that it can start the decompression with as much information as possible. Words which follow later are typically shorter in length because they contain the difference signals comparing the first word with reference to the second position on the scan information field.

The words are interspersed with each other, as required by the standard encoding system, so that variable amounts of data are provided into the input of the Spatial Decoder. However, after the Spatial Decoder has functioned, the information is provided at its output at a picture format rate suitable for display on a screen. The output rate in terms of time of the spatial decoder may vary in order to interface with various display systems throughout the world, such as NTSC, PAL and SECAM. The video formatter converts this variable picture rate to a constant picture rate suitable for display. However, the picture data is still carried by DATA tokens consisting of 64 words.

11. DRAM INTERFACE

A single high performance, configurable DRAM interface is used on each of the 3 decoder chips. In general, the DRAM: interface on each chip is substantially the same; however, the interfaces differ from one to another in how they handle channel priorities. This interface is designed to directly drive the external DRAMs used by the Spatial Decoder, the Temporal Decoder and the Video Formatter. Typically, no external logic, buffers or components will be required to connect the DRAM interface to the DRAMs in those systems.

In accordance with the present invention, the interface is configurable in two ways:

1. The detailed timing of the interface can be configured to accommodate a variety of different DRAM types.
2. The width of the data interface to the DRAM can be configured to provide a cost/performance trade off for different applications.

In general, the DRAM interface is a standard-independent block implemented on each of the three chips in the system. Again, these are the Spatial Decoder, Temporal Decoder and video formatter. Referring again to FIGS. 11, 12 and 13, these figures show block diagrams that depict the relationship between the DRAM interface, and the remaining blocks of the Spatial Decoder, Temporal Decoder and video formatter, respectively. On each chip, the DRAM interface connects the chip to an external DRAM. External DRAM is used because, at present, it is not practical to fabricate on chip the relatively large amount of DRAM needed. Note: each chip has its own external DRAM and its own DRAM interface.

Furthermore, while the DRAM interface is compression standard-independent, it still must be configured to implement each of the multiple standards, H.261, JPEG and MPEG. How the DRAM interface is reconfigured for multi-standard operation will be subsequently further described herein.

Accordingly, to understand the operation of the DRAM interface requires an understanding of the relationship between the DRAM interface and the address generator, and how the two communicate using the two wire interface.

In general, as its name implies, the address generator generates the addresses the DRAM interface needs in order to address the DRAM (e.g., to read from or to write to a particular address in DRAM). With a two-wire interface, reading and writing only occurs when the DRAM interface has both data (from preceding stages in the pipeline), and a valid address (from address generator). The use of a separate address generator simplifies the construction of both the address generator and the DRAM interface, as discussed further below.

In the present invention, the DRAM interface can operate from a clock which is asynchronous to both the address generator and to the clocks of the stages through which data is passed. Special techniques have been used to handle this asynchronous nature of the operation.

Data is typically transferred between the DRAM interface and the rest of the chip in blocks of 64 bytes (the only exception being prediction data in the Temporal Decoder)s Transfers take place by means of a device known as a "swing buffer". This is essentially a pair of RAMs operated in a double-buffered configuration, with the DRAM interface filling or emptying one RAM while another part of the chip empties or fills the other RAM. A separate bus which carries an address from an address generator is associated with each swing buffer.

In the present invention, each of the chips has four swing buffers, but the function of these swing buffers is different in each case. In the spatial decoder, one swing buffer is used to transfer coded data to the DRAM, another to read coded data from the DRAM, the third to transfer tokenized data to the DRAM and the fourth to read tokenized data from the DRAM. In the Temporal Decoder, however, one swing buffer is used to write intra or predicted picture data to the DRAM, the second to read intra or predicted data from the DRAM and the other two are used to read forward and backward prediction data. In the video formatter, one swing buffer is used to transfer data to the DRAM and the other three are used to read data from the DRAM, one for each of luminance (Y) and the red and blue color difference data (Cr and Cb, respectively).

The following section describes the operation of a hypothetical DRAM interface which has one write swing buffer and one read swing buffer. Essentially, this is the same as the operation of the Spatial Decoder's DRAM interface. The operation is illustrated in FIG. 23.

Figure 23:
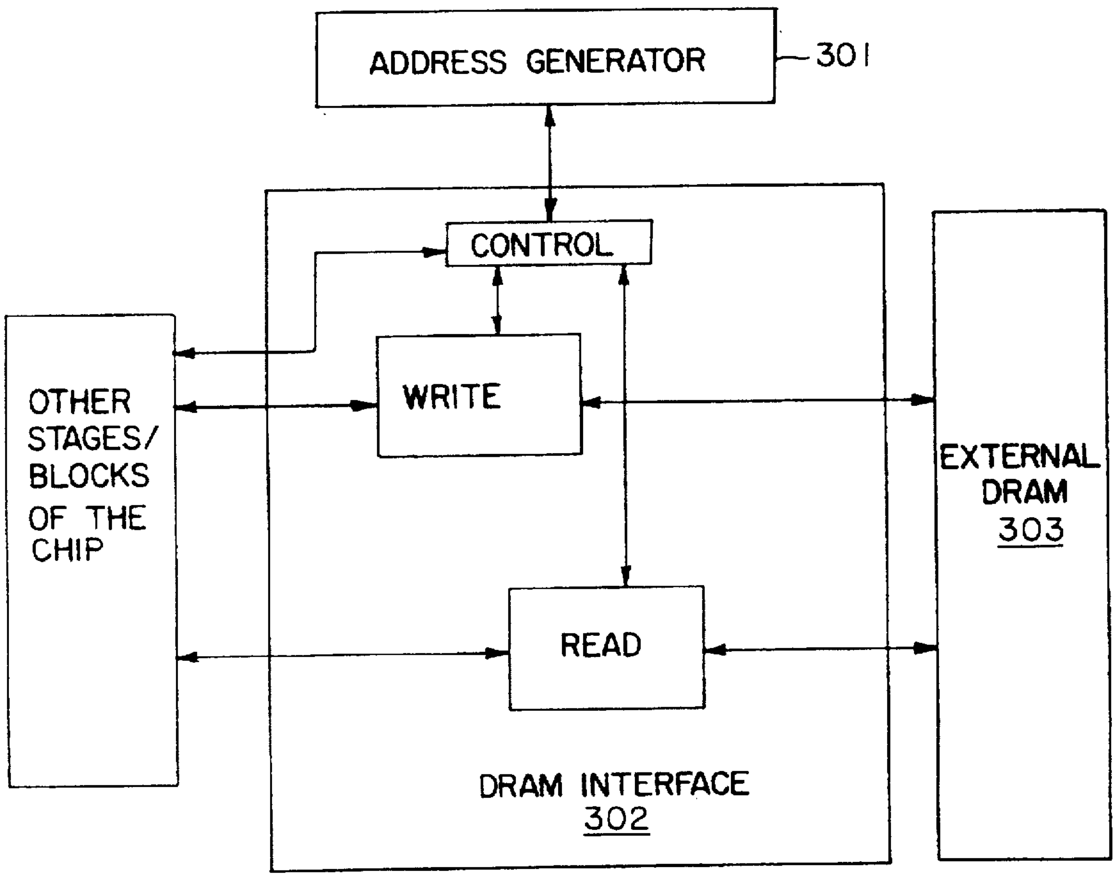
FIG. 23 is a block diagram of the Spatial Decoder DRAM interface.

FIG. 23 illustrates that the control interfaces between the address generator 301, the DRAM interface 302, and the remaining stages of the chip which pass data are all two wire interfaces. The address generator 301 may either generate addresses as the result of receiving control tokens, or it may merely generate a fixed sequence of addresses (e.g., for the FIFO buffers of the Spatial Decoder). The DRAM interface treats the two wire interfaces associated with the address generator 301 in a special way. Instead of keeping the accept line high when it is ready to receive an address, it waits for the address generator to supply a valid address, processes that address and then sets the accept line high for one clock period. Thus, it implements a request/acknowledge (REQ/ACK) protocol.

A unique feature of the DRAM interface 302 is its ability to communicate independently with the address generator 301 and with the stages that provide or accept the data. For example, the address generator may generate an address associated with the data in the write swing buffer (FIG. 24), but no action will be taken until the write swing buffer signals that there is a block of data ready to be written to the external DRAM. Similarly, the write swing buffer may contain a block of data which is ready to be written to the external DRAM, but no action is taken until an address is supplied on the appropriate bus from the address generator 301. Further, once one of the RAMs in the write swing buffer has been filled with data, the other may be completely filled and "swung" to the DRAM interface side before the data input is stalled (the two-wire interface accept signal set low).

In understanding the operation of the DRAM interface 302 of the present invention, it is important to note that in a properly configured system, the DRAM interface will be able to transfer data between the swing buffers and the external DRAM 303 at least as fast as the sum of all the average data rates between the swing buffers and the rest of the chip.

Each DRAM interface 302 determines which swing buffer it will service next. In general, this will either be a "round robin" (i.e., the next serviced swing buffer is the next available swing buffer which has least recently had a turn), or a priority encoder, (i.e., in which some swing buffers have a higher priority than others). In both cases, an additional request will come from a refresh request generator which has a higher priority than all the other requests. The refresh request is generated from a refresh counter which can be programmed via the microprocessor interface.

Figure 24:
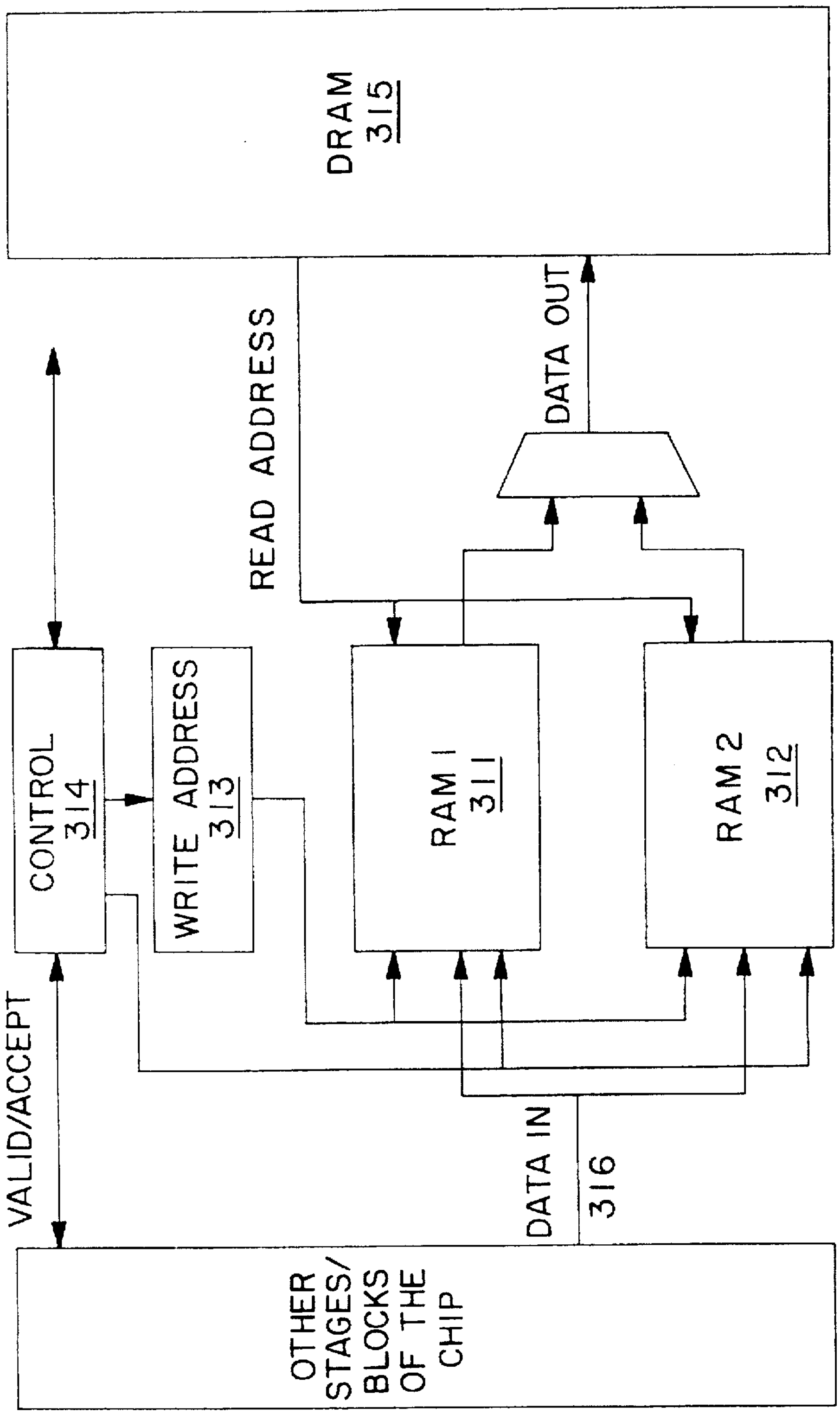
FIG. 24 is a block diagram of a write swing buffer.

Referring now to FIG. 24, there is shown a block diagram of a write swing buffer. The write swing buffer interface includes two blocks of RAM, RAM1 311 and RAM2 312. As discussed further herein, data is written into RAM1 311 and RAM2 312 from the previous stage, under the control of the write address 313 and control 314. From RAM1 311 and RAM2 312, the data is written into DRAM 515. When writing data into DRAM 315, the DRAM row address is provided by the address generator, and the column address is provided by the write address and control, as described further herein. In operation, valid data is presented at the input 316 (data in). Typically, the data is received from the previous stage. As each piece of data is accepted by the DRAM interface, it is written into RAM1 311 and the write address control increments the RAM1 address to allow the next piece of data to be written into RAM1. Data continues to be written into RAM1 311 until either there is no more data, or RAM1 is full. When RAM1 311 is full, the input side gives up control and sends a signal to the read side to indicate that RAM1 is now ready to be read. This signal passes between two asynchronous clock regimes and, therefore, passes through three synchronizing flip flops.

Provided RAM2 312 is empty, the next item of data to arrive on the input side is written into RAM2. Otherwise, this occurs when RAM2 312 has emptied. When the round robin or priority encoder (depending on which is used by the particular chip) indicates that it is now the turn of this swing buffer to be read, the DRAM interface reads the contents of RAM1 311 and writes them to the external DRAM 315. A signal is then sent back across the asynchronous interface, to indicate that RAM1 311 is now ready to be filled again.

If the DRAM interface empties RAM1 311 and "swings" it before the input side has filled RAM2 312, then data can be accepted by the swing buffer continually. Otherwise, when RAM2 is filled, the swing buffer will set its accept single low until RAM1 has been "swung" back for use by the input side.

The operation of a read swing buffer, in accordance with the present invention, is similar, but with the input and output data busses reversed.

The DRAM interface of the present invention is designed to maximize the available memory bandwidth. Each 8×8 block of data is stored in the same DRAM page. In this way, full use can be made of DRAM fast page access modes, where one row address is supplied followed by many column addresses. In particular, row addresses are supplied by the address generator, while column addresses are supplied by the DRAM interface, as discussed further below.

In addition, the facility is provided to allow the data bus to the external DRAM to be 8, 16 or 32 bits wide. Accordingly, the amount of DRAM used can be matched to the size and bandwidth requirements of the particular application.

In this example (which is exactly how the DRAM interface on the Spatial Decoder works) the address generator provides the DRAM interface with block addresses for each of the read and write swing buffers. This address is used as the row address for the DRAM. The six bits of column address are supplied by the DRAM interface itself, and these bits are also used as the address for the swing buffer RAM. The data bus to the swing buffers is 32 bits wide. Hence, if the bus width to the external DRAM is less than 32 bits, two or four external DRAM accesses must be made before the next word is read from a write swing buffer or the next word is written to a read swing buffer (read and write refer to the direction of transfer relative to the external DRAM).

The situation is more complex in the case of the Temporal Decoder and the Video Formatter. The Temporal Decoder's addressing is more complex because of its predictive aspects as discussed further in this section. The video formatter's addressing is more complex because of multiple video output standard aspects, as discussed further in the sections relating to the video formatter.

As mentioned previously, the Temporal Decoder has four swing buffers: two are used to read and write decoded intra and predicted (I and P) picture data. These operate as described above. The other two are used to receive prediction data. These buffers are more interesting.

Figure 25:
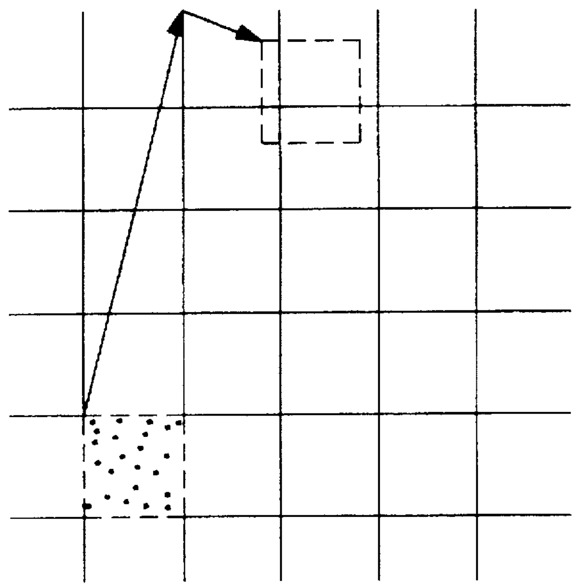
FIG. 25 is a pictorial diagram illustrating prediction data offset from the block being processed.

In general, prediction data will be offset from the position of the block being processed as specified in the motion vectors in x and y. Thus, the block of data to be retrieved will not generally correspond to the block boundaries of the data as it was encoded (and written into the DRAM). This is illustrated in FIG. 25, where the shaded area represents the block that is being formed whereas the dotted outline represents the block from which it is being predicted. The address generator converts the address specified by the motion vectors to a block offset (a whole number of blocks), as shown by the big arrow, and a pixel offset, as shown by the little arrow.

In the address generator, the frame pointer, base block address and vector offset are added to form the address of the block to be retrieved from the DRAM. If the pixel offset is zero, only one request is generated. If there is an offset in either the x or y dimension then two requests are generated, i.e., the original block address and the one immediately below. With an offset in both x and y, four requests are generated. For each block which is to be retrieved, the address generator calculates start and stop addresses which is best illustrated by an example.

Figure 26:
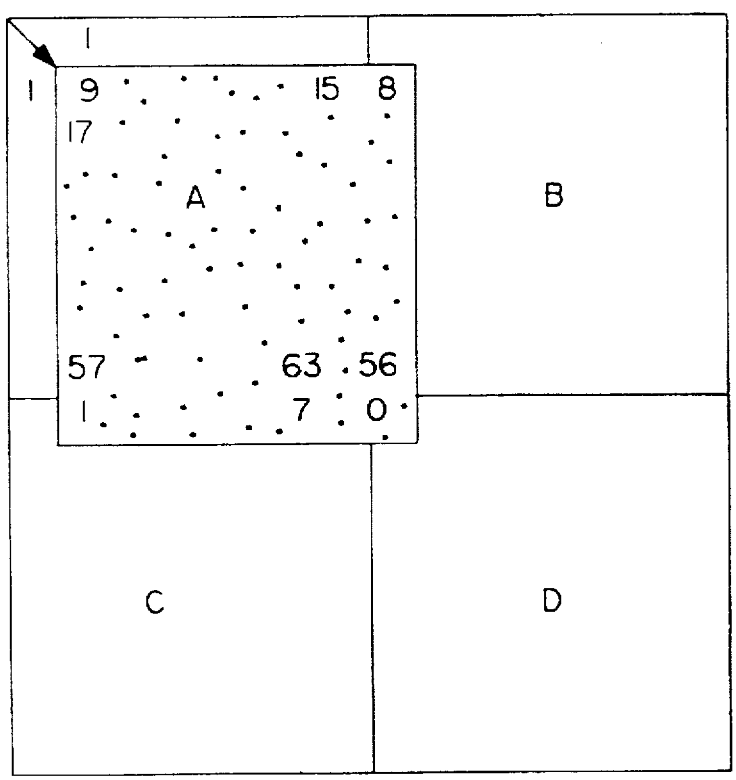
FIG. 26 is a pictorial diagram illustrating prediction data offset by (1,1)

Consider a pixel offset of (1,1), as illustrated by the shaded area in FIG. 26. The address generator makes four requests, labelled A through D in the Figure. The problem to be solved is how to provide the required sequence of row addresses quickly. The solution is to use "start/stop" technology, and this is described below.

Consider block A in FIG. 26. Reading must start at position (1,1) and end at position (7,7). Assume for the moment that one byte is being read at a time (i.e., an 8 bit DRAM interface). The x value in the-co-ordinate pair forms the three LSBs of the address, the y value the three MSB. The x and y start values are both 1, providing the address, 9. Data is read from this address and the x value is incremented. The process is repeated until the x value reaches its stop value, at which point, the y value is incremented by 1 and the x start value is reloaded, giving an address of 17. As each byte of data is read, the x value is again incremented until it reaches its stop value. The process is repeated until both x and y values have reached their stop values. Thus, the address sequence of 9, 10, 11, 12, 13, 14, 15, 17 . . . , 23, 25, . . . , 31, 33, . . . . . . . . , 57, . . . , 63 is generated.

In a similar manner, the start and stop co-ordinates for block B are: (1,0) and (7,0), for block C: (0,1) and (0,7), and for block D: (0,0) and (0,0).

The next issue is where this data should be written. Clearly, looking at block A, the data read from address 9 should be written to address 0 in the swing buffer, while the data from address 10 should be written to address 1 in the swing buffer, and so on. Similarly, the data read from address 8 in block B should be written to address 15 in the swing buffer and the data from address 16 should be written to address 15 in the swing buffer. This function turns out to have a very simple implementation, as outlined below.

Consider block A. At the start of reading, the swing buffer address register is loaded with the inverse of the stop value. The y inverse stop value forms the 3 MSBs and the x inverse stop value forms the 3 LSB. In this case, while the DRAM interface is reading address 9 in the external DRAM, the swing buffer address is zero. The swing buffer address register is then incremented as the external DRAM address register is incremented, as consistent with proper prediction addressing.

The discussion so far has centered on an 8 bit DRAM interface. In the case of a 16 or 32 bit interface, a few minor modifications must be made. First, the pixel offset vector must be "clipped" so that it points to a 16 or 32 bit boundary. In the example we have been using, for block A, the first DRAM read will point to address 0, and data in addresses 0 through 3 will be read. Second, the unwanted data must be discarded. This is performed by writing all the data into the swing buffer (which must now be physically larger than was necessary in the 8 bit case) and reading with an offset. When performing MPEG half-pel interpolation, 9 bytes in x and/or y must be read from the DRAM interface. In this case, the address generator provides the appropriate start and stop addresses. Some additional logic in the DRAM interface is used, but there is no fundamental change in the way the DRAM interface operates.

The final point to note about the Temporal Decoder DRAM interface of the present invention, is that additional information must be provided to the prediction filters to indicate what processing is required on the data. This consists of the following:

a "last byte" signal indicating the last byte of a transfer (of 64,72 or 81 bytes);

an H.261 flag;

a bidirectional prediction flag;

two bits to indicate the block's dimensions (8 or 9 bytes in x and y); and a two bit number to indicate the order of the blocks.

The last byte flag can be generated as the data is read out of the swing buffer. The other signals are derived from the address generator and are piped through the DRAM interface so that they are associated with the correct block of data as it is read out of the swing buffer by the prediction filter block.

In the Video Formatter, data is written into the external DRAM in blocks, but is read out in raster order. Writing is exactly the same as already described for the Spatial Decoder, but reading is a little more complex.

The data in the Video Formatter, external DRAM is organized so that at least 8 blocks of data fit into a single page. These 8 blocks are 8 consecutive horizontal blocks. When rasterizing, 8 bytes need to be read out of each of 8 consecutive blocks and written into the swing buffer (i.e., the same row in each of the 8 blocks).

Considering the top row (and assuming a byte-wide interface), the x address (the three LSBS) is set to zero, as is the y address (3 MSBS). The x address is then incremented as each of the first 8 bytes are read out. At this point, the top part of the address (bit 6 and above—LSB=bit 0) is incremented and the x address (3 LSBS) is reset to zero. This process is repeated until 64 bytes have been read. With a 16 or 32 bit wide interface to the external DRAM the x address is merely incremented by two or four, respectively, instead of by one.

In the present invention, the address generator can signal to the DRAM interface that less than 64 bytes should be read (this may be required at the beginning or end of a raster line), although a multiple of 8 bytes is always read. This is achieved by using start and stop values. The start value is used for the top part of the address (bit 6 and above), and the stop value is compared with the start value to generate the signal which indicates when reading should stop.

The DRAM interface timing block in the present invention uses timing chains to place the edges of the DRAM signals to a precision of a quarter of the system clock period. Two quadrature clocks from the phase locked loop are used. Theses are combined to form a notional 2x clock. Any one chain is then made from two shift registers in parallel, on opposite phases of the 2x clock.

First of all, there is one chain for the page start cycle and another for the read/write/refresh cycles. The length of each cycle is programmable via the microprocessor interface, after which the page start chain has a fixed length, and the cycle chain's length changes as appropriate during a page start.

On reset, the chains are cleared and a pulse is created. The pulse travels along the chains and is directed by the state information from the DRAM interface. The pulse generates the DRAM interface clock. Each DRAM interface clock period corresponds to one cycle of the DRAM, consequently, as the DRAM cycles have different lengths, the DRAM interface clock is not at a constant rate.

Moreover, additional timing chains combine the pulse from the above chains with the information from the DRAM interface to generate the output strobes and enables such as notcas, notras, notwe, notbe.

12. PREDICTION FILTERS

Figure 28:
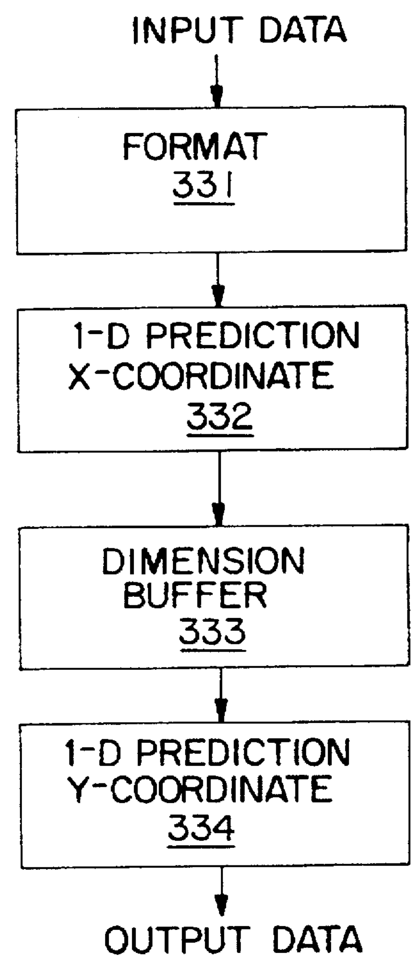
FIG. 28 is a block diagram illustrating the prediction filter.

Referring again to FIGS. 12, 17, 18, and more particularly to FIG. 12, there is shown a block diagram of the Temporal Decoder. This includes the prediction filter. The relationship between the prediction filter and the rest of the elements of the temporal decoder is shown in greater detail in FIG. 17. The essence of the structure of the prediction filter is shown in FIGS. 18 and 28. A detailed description of the operation of the prediction filter can be found in the section, "More Detailed Description of the Invention."

In general, the prediction filter in accordance with the present invention, is used in the MPEG and H.261 modes, but not in the JPEG mode. Recall that in the JPEG mode, the Temporal Decoder just passes the data through to the Video Formatter, without performing any substantive decoding beyond that accomplished by the Spatial Decoder. Referring again to FIG. 18, in the MPEG mode the forward and backward prediction filters are identical and they filter the respective MPEG forward and backward prediction blocks. In the H.261 mode, however, only the forward prediction filter is used, since H.261 does not use backward prediction.

Each of the two prediction filters of the present invention is substantially the same. Referring again to FIGS. 18 and 28 and more particularly to FIG. 28, there is shown a block diagram of the structure of a prediction filter. Each prediction filter consists of four stages in series. Data enters the format stage 331 and is placed in a format that can be readily filtered. In the next stage 332 an I-D prediction is performed on the X-coordinate. After the necessary transposition is performed by a dimension buffer stage 333, an I-D prediction is performed on the Y-coordinate in stage 334. How the stage perform the filtering is further described in greater detail subsequently. Which filtering operations are required, are defined by the compression standard. In the case of H.261, the actual filtering performed is similar to that of a low pass filter.

Referring again to FIG. 17, multi-standard operation requires that the prediction filters be reconfigurable to perform either MPEG or H.261 filtering, or to perform no filtering at all in JPEG mode. As with many other reconfigurable aspects of the three chip system, the, prediction filter is reconfigured by means of tokens. Tokens are also used to inform the address generator of the particular mode of operation. In this way, the address generator can supply the prediction filter with the addresses of the needed data, which varies significantly between MPEG and JPEG.

13. ACCESSING REGISTERS

Most registers in the microprocessor interface (MPI) can only be modified if the stage with which they are associated is stopped. Accordingly, groups of registers will typically be associated with an access register. The value zero in an access register indicates that the group of registers associated with that particular access register should not be modified. Writing 1 to an access register requests that a stage be stopped. The stage may not stop immediately, however, so the stages access register will hold the value, zero, until it is stopped.

Any user software associated with the MPI and used to perform functions by way of the MPI should wait "after writing a 1 to a request access register" until 1 is read from the access register. If a user writes a value to a configuration register while its access register is set to zero, the results are undefined.

14. MICRO-PROCESSOR INTERFACE

A standard byte wide micro-processor interface (MPI) is used on all circuits with in the Spatial Decoder and Temporal Decoder. The MPI operates asynchronously with various Spatial and Temporal Decoder clocks. Referring to Table A.6.1 of the subsequent further detailed description, there is shown the various MPI signals that are used on this interface. The character of the signal is shown on the input/output column, the signal name is shown on the signal name column and a description of the function of the signal is shown in the description column. The MPI electrical specification are shown with reference to Table A.6.2. All the specifications are classified according to type and there types are shown in the column entitled symbol. The description of what these symbols represent is shown in the parameter column. The actual specifications are shown in the respective columns min, max and units.

The DC operating conditions can be seen with reference to Table A.6.3. Here the column headings are the same as with reference to Table A.6.2. The DC electrical characteristics are shown with reference to Table A.6.4 and carry the same column headings as depicted in Tables A.6.2 and A.6.3.

15. MPI READ TIMING

The AC characteristics of the MPI read timing diagrams are shown with reference to FIG. 54. Each line of the Figure is labelled with a corresponding signal name and the timing is given in nano-seconds. The full microprocessor interface read timing characteristics are shown with reference to Table A.6.5. The column entitled Number is used to indicate the signal corresponding to the name of that signal as set forth in the characteristic column. The columns identified by MIN and MAX provide the minimum length of time that the signal is present the maximum amount of time that this signal is available. The Units column gives the units of measurement used to describe the signals.

16. MPI WRITE TIMING

The general description of the MPI write timing diagrams are shown with reference to FIG. 54. This Figure shows each individual signal name as associated with the MPI write timing. The name, the characteristic of the signal, and other various physical characteristics are shown with reference to Table 6.6.

17. KEYHOLE ADDRESS LOCATIONS

In the present invention, certain less frequently accessed memory map locations have been placed behind keyhole registers. A keyhole register has two registers associated with it. The first register is a keyhole address register and the second register is a keyhole data register. The keyhole address specifies a location within a extended address space. A read or a write operation to a keyhole data register accesses the locations specified by the keyhole address register. After accessing a keyhole data register, the associated keyhole address register increments. Random access within the extended address space is only possible by writing in a new value to the keyhole address register for each access. A circuit within the present invention may have more than one keyhole memory maps. Nonetheless, there is no interaction between the different keyholes.

18. PICTURE_END

Referring again to FIG. 11, there is shown a general block diagram of the Spatial Decoder used in the present invention. It is through the use of this block diagram that the function of PICTURE_END will be described. The PICTURE_END function has the multi-standard advantage of being able to handle H.261 encoded picture information, MPEG and JPEG signals.

As previously described, the system of FIG. 11 is interconnected by the two wire interface previously described. Each of the functional blocks is arranged to operate according to the state machine configuration shown with reference to FIG. 10.

In general, the PICTURE_END function in accordance with the invention begins at the Start Code Detector which generates a PICTURE_END control token. The PICTURE_END control token is passed unaltered through the start-up control circuit to the DRAM interface. Here it is used to flush out the write swing buffers in-the DRAM interface. Recall, that the contents of a swing buffer are only written to RAN when the buffer is full. However, a picture may end at a point where the buffer is not full, therefore, causing the picture data to become stuck. The PICTURE_END token forces the data out of the swing buffer.

Since the present invention is a multi-standard machine, the machine operates differently for each compression standard. More particularly, the machine is fully described as operating pursuant to machine-dependent action cycles. For each compression standard, a certain number of the total available action cycles can be selected by a combination of control tokens and/or output signals from the MPU or they can be selected by the design of the control tokens themselves. In this regard, the present invention is organized so as to delay the information from going into subsequent blocks until all of the information has been collected in an upstream block. The system waits until the data has been prepared for passing to the next stage. In this way, the PICTURE_END signal is applied to the coded data buffer, and the control portion of the PICTURE_END signal causes the contents of the data buffers to be read and applied to the Huffman decoder and video demultiplexor circuit.

Another advantage of the PICTURE_END control token is to identify, for the use by the Huffman decoder demultiplexor, the end of picture even though it has not had the typically expected full range and/or number of signals applied to the Huffman decoder and video demultiplexor circuit. In this situation, the information held in the coded data buffer is applied to the Huffman decoder and video demultiplexor as a total picture. In this way, the state machine of the Huffman decoder and video demultiplexor can still handle the data according to system design.

Another advantage of the PICTURE_END control token is its ability to completely empty the coded data buffer so that no stray information will inadvertently remain in the off chip DRAM or in the swing buffers.

Yet another advantage of the PICTURE_END function is its use in error recovery. For example, assume the amount of data being held in the coded data buffer is less than is typically used for describing the spatial information with reference to a single picture. Accordingly, the last picture will be held in the data buffer until a full swing buffer, but, by definition, the buffer will never fill. At some point, the machine will determine that an error condition exits. Hence, to the extent that a PICTURE_END token is decoded and forces the data in the coded data buffers to be applied to the Huffman decoder and video demultiplexor, the final picture can be decoded and the information emptied from the buffers. Consequently, the machine will not go into error recovery mode and will successfully continue to process the coded data.

A still further advantage of the use of a PICTURE_END token is that the serial pipeline processor will continue the processing of uninterrupted data. Through the use of a PICTURE_END token, the serial pipeline processor is configured to handle less than the expected amount of data and, therefore, continues processing. Typically, a prior art machine would stop itself because of an error condition. As previously described, the coded data buffer counts macroblocks as they come into its storage area. In addition, the Huffman Decoder and Video Demultiplexor generally know the amount of information expected for decoding each picture, i.e., the state machine portion of the Huffman decode and Video Demultiplexor know the number of blocks that it will process during each picture recovery cycle. When the correct number of blocks do not arrive from the coded data buffer, typically an error recovery routine would result. However, with the PICTURE_END control token having reconfigured the Huffman Decoder and Video Demultiplexor, it can continue to function because the reconfiguration tells the Huffman Decoder and Video Demultiplexor that it is, indeed, handling the proper amount of information.

Referring again to FIG. 10, the Token Decoder portion of the Buffer Manager detects the PICTURE_END control token generated by the Start Code Detector. Under normal operations, the buffer registers fill up and are emptied, as previously described with reference to the normal operation of the swing buffers. Again, a swing buffer which is partially full of data will not empty until it is totally filled and/or it knows that it is time to empty. The PICTURE_END control token is decoded in the Token Decoder portion of the Buffer Manager, and it forces the partially full swing buffer to empty itself into the coded data buffer. This is ultimately passed to the Huffman Decoder and Video Demultiplexor either directly or through the DRAM interface.

19. FLUSHING OPERATION

Another advantage of the PICTURE_END control token i. its function in connection with a FLUSH token. The FLUSH token is not associated with either controlling the reconfiguration of the state machine or in providing data for the system. Rather, it completes prior partial signals for handling by the machine-dependent state machines. Each of the state machines recognizes a FLUSH control token as information not to be processed. Accordingly, the FLUSH token is used to fill up all of the remaining empty parts of the coded data buffers and to allow a full set of information to be sent to the Huffman Decoder and Video Demultiplexor. In this way, the FLUSH token is like padding for buffers.

The Token Decoder in the Huffman circuit recognizes the FLUSH token and ignores the pseudo data that the FLUSH token has forced into it. The Huffman Decoder then operates only on the data contents of the last picture buffer as it: existed prior to the arrival of the PICTURE_END token and FLUSH token. A further advantage of the use of the PICTURE_END token alone or in combination with a FLUSH token is the reconfiguration and/or reorganization of the Huffman Decoder circuit. With the arrival of the PICTURE_END token, the Huffman Decoder circuit knows that it will have less information than normally expected to decode the last picture. The Huffman decode circuit finishes processing the information contained in the last picture, and outputs this information through the DRAM interface into the Inverse Modeller. Upon the identification of the last picture, the Huffman Decoder goes into its cleanup mode and readjusts for the arrival of the next picture information.

20. FLUSH FUNCTION

The FLUSH token, in accordance with the present invention, is used to pass through the entire pipeline processor and to ensure that the buffers are emptied and that other circuits are reconfigured to await the arrival of new data. More specifically, the present invention comprises a combination of a PICTURE_END token, a padding word and a FLUSH token indicating to the serial pipeline processor that the picture processing for the current picture form is completed. Thereafter, the various state machines need reconfiguring to await the arrival of new data for new handling. Note also that the FLUSH Token acts as a special reset for the system. The FLUSH token resets each stage as it passes through, but-allows subsequent stages to continue processing. This prevents a loss of data. In other words, the FLUSH token is a variable reset, as opposed to, an absolute reset.

21. STOP-AFTER PICTURE

The STOP_AFTER_PICTURE function is employed to shut down the processing of the serial pipeline decompressing circuit at a logical point in its operation. At this point, a PICTURE_END token is generated indicating that data is finished coming in from the data input line, and the padding operation has been completed. The padding function fills partially empty DATA tokens. A FLUSH token, is then generated which passes through the serial pipeline system and pushes all the information out of the registers and forces the registers back into their neutral stand-by condition. The STOP_AFTER_PICTURE event is then generated and no more input is accepted until either the user or the system clears this state. In other words, while a PICTURE_END token signals the end of a picture, the STOP_AFTER_PICTURE operation signals the end of all current processing.

22. MULTI-STANDARD—SEARCH MODE

Another feature of the present invention is the use of a SEARCH_MODE control token which is used to reconfigure the input to the serial pipeline processor to look at the incoming bit stream. When the search mode is set, the Start Code Detector searches only for a specific start code or marker used in any one of the compression standards. It will be appreciated, however, that, other images from other data bitstreams can be used for this purpose. Accordingly, these images can be used throughout this present invention to change it to another embodiment which is capable of using the combination of control tokens, and DATA tokens along with the reconfiguration circuits, to provide similar processing.

The use of search mode in the present invention is convenient in many situations including 1) if a break in the data bit stream occurs; 2) when the user breaks the data bit stream by purposely changing channels, e.g., data arriving, by a cable carrying compressed digital video; or 3) by user activation of fast forward or reverse from a controllable data source such as an optical disc or video disc. In general, a search mode is convenient when the user interrupts the normal processing of the serial pipeline at a point where the machine does not expect such an interruption.

When any of the search modes are set, the Start Code Detector looks for incoming start images which are suitable for creating the machine independent tokens. All data coming into the Start Code Detector prior to the identification of standard-dependent start images is discarded as meaningless and the machine stands in an idling condition as it waits for this information.

The Start Code Detector can assume any one of a number of configurations. For example, one of these configurations allows a search for a group of pictures or higher start codes. This pattern causes the Start Code Detector to discard all its input and look for the group_start standard image. When such an image is identified, the Start Code Detector generates a GROUP_START token and the search mode is reset automatically.

It is important to note that a single circuit, the Huffman Decoder and Video Demultiplex circuit, is operating with a combination of input signals including the standard-independent set-up signals, as well as, the CODING_STANDARD signals. The CODING_STANDARD signals are conveying information directly from the incoming bit stream as required by the Huffman Decoder and Video Demultiplex circuit. Nevertheless, while the functioning of the Huffman Decoder and Video Demultiplex circuit is under the operation of the standard independent sequence of signals.

This mode of operation has been selected because it is the most efficient and could have been designed wherein special control tokens are employed for conveying the standard-dependent input to the Huffman Decoder and Video Demultiplexer instead of conveying the actual signals themselves.

23. INVERSE MODELLER

Inverse modeling is a feature of all three standards, and is the same for all three standards. In general, DATA tokens in the token buffer contain information about the values of the quantized coefficients, and about the number of zeros between the coefficients that are represented (a form of run length coding). The Inverse Modeller of the present invention has been adapted for use with tokens an(I simply expands the information about runs of zeros so that each DATA Token contains the requisite 64 values. Thereafter, the values in the DATA Tokens are quantized coefficients which can be used by the Inverse Quantizer.

24. INVERSE QUANTIZER

The Inverse Quantizer of the present invention is a required element in the decoding sequence, but has been implemented in such away to allow the entire IC set to handle multi-standard data. In addition, the Inverse Quantizer has been adapted for use with tokens. The Inverse Quantizer lies between the Inverse modeller and inverse DCT (IDCT).

For example, in the present invention, an adder in the Inverse Quantizer is used to add a constant to the pel decode number before the data moves on to the IDCT.

The IDCT uses the pel decode number, which will vary according to each standard used to encode the information. In order for the information to be properly decoded, a value of 1024 is added to the decode number by the Inverse Quantizer before the data continues on to the IDCT.

Using adders, already present in the Inverse Quantizer, to standardize the data prior to it reaching the IDCT, eliminates the need for additional circuitry or software in the IC, for handling data compressed by the various standards. Other operations allowing for multi-standard operation are performed during a "post quantization function" and are discussed below.

The control tokens accompanying the data are decoded and the various standardization routines that need to be performed by the Inverse Quantizer are identified in detail below. These "post quantization" functions are all implemented to avoid duplicate circuitry and to allow the IC to handle multi-standard encoded data.

25. HUFFMAN DECODER AND PARSER

Referring again to FIGS. 11 and 27, the Spatial Decoder includes a Huffman Decoder for decoding the data that the various compression standards have Huffman-encoded. While each of the standards, JPEG, MPEG and H.261, require certain data to be Huffman encoded, the Huffman decoding required by each standard differs in some significant ways. In the Spatial Decoder of the present invention, rather than design and fabricate three separate Huffman decoders, one for each standard, the present invention saves valuable die space by identifying common aspects of each Huffman Decoder, and fabricating these common aspects only once. Moreover, a clever multi-part algorithm is used that makes common more aspects of each Huffman Decoder common to the other standards as well than, would otherwise be the case.

Figure 27:
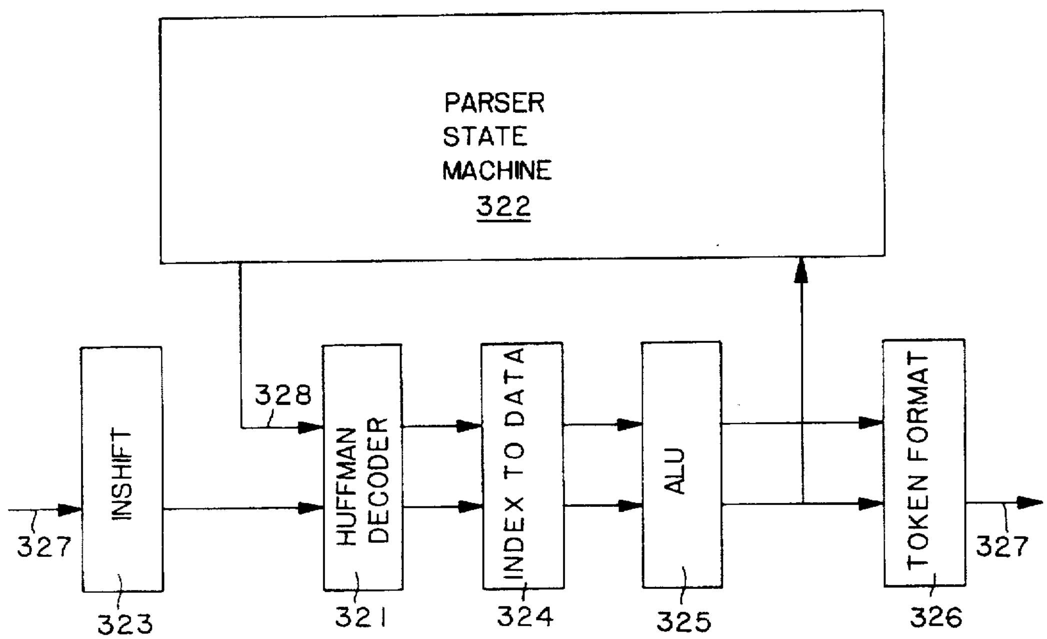
FIG. 27 is a block diagram illustrating the Huffman decoder and parser state machine of the Spatial Decoder.

In brief, the Huffman Decoder 321 works in conjunction with the other units shown in FIG. 27. These other units are the Parser State Machine 322, the inshifter 323, the Index to Data unit 324, the ALU 325, and the Token Formatter 326. As described previously, connection between these blocks is governed by a two wire interface. A more detailed description of how these units function is subsequently described herein in greater detail, the focus; here is on particular aspects of the Huffman Decoder, in accordance with the present invention, that support multi-standard operation.

The Parser State Machine of the present invention, is a programmable state machine that acts to coordinate the operation of the other blocks of the Video Parser. In response to data, the Parser State Machine controls the other system blocks by generating a control word which is passed to the other blocks, side by side with the data, upon which this control word acts. Passing the control word alongside the associated data is not only useful, it is essential, since these blocks are connected via a two-wire interface. In this way, both data and control arrive at the same time. The passing of the control word is indicated in FIG. 27 by a control line 327 that runs beneath the data line 328 that connects the blocks. Among other things, this code word identifies the particular standard that is being decoded.

The Huffman decoder 321 also performs certain control functions. In particular, the Huffman Decoder 321 contains; a state machine that can control certain functions of the Index to Data 324 and ALU 325. Control of these units by the Huffman Decoder is necessary for proper decoding of block-level information. Having the Parser State Machine 322 make these decisions would take too much time.

An important aspect of the Huffman Decoder of the present invention, is the ability to invert the coded data bits as they are read into the Huffman Decoder. This is needed to decode H.261 style Huffman codes, since the particular type of Huffman code used by H.261 (and substantially by MPEG) has the opposite polarity then the codes used by JPEG. The use of an inverter, thereby, allows substantially the same table to be used by the Huffman Decoder for all three standards. Other aspects of how the Huffman Decoder implements all three standards are discussed in further detail in the "More Detailed Description of the Invention" section.

The Index to Data unit 324 performs the second part of the multi-part algorithm. This unit contains a look up table that provides the actual Huffman decoded data. Entries in the table are organized based on the index numbers generated by the Huffman Decoder.

The ALU 325 implements the remaining parts of the multi-part algorithm. In particular, the ALU handles sign-extension. The ALU also includes a register file which holds vector predictions and DC predictions, the use of which is described in the sections related to prediction filters. The ALU, further, includes counters that count through the structure of the picture being decoded by the Spatial Decoder. In particular, the dimensions of the picture are programmed into registers associated with the counters, which facilitates detection of "start of picture," and start of macroblock codes.

In accordance with the present invention, the Token Formatter 326 (TF) assembles decoded data into DATA tokens that are then passed onto the remaining stages or blocks in the Spatial Decoder.

In the present invention, the in shifter 323 receives data from a FIFO that buffers the data passing through the Start Code Detector. The data received by the inshifter is generally of two types: DATA tokens, and start codes which the Start Code Detector has replaced with their respective tokens, as discussed further in the token section. Note that most of the data will be DATA tokens that require decoding.

The In shifter 323 serially passes data to the Huffman Decoder 321. On the other hand, it passes control tokens in parallel. In the Huffman decoder, the Huffman encoded data is decoded in accordance with the first part of the multi-part algorithm. In particular, the particular Huffman code is identified, and then replaced with an index number.

The Huffman Decoder 321 also identifies certain data that requires special handling by the other blocks shown in FIG. 27. This data includes end of block and escape. In the present invention, time is saved by detecting these in the Huffman Decoder 321, rather than in the Index to Data unit 324.

This index number is then passed to the Index to Data unit 324. In essence, the Index to Data unit is a look-up table. In accordance with one aspect of the algorithm, the look-up table is little more than the Huffman code table specified by JPEG. Generally, it is in the condensed data format that JPEG specifies for transferring an alternate JPEG table.

From the Index to Data unit 324, the decoded index number or other data is passed, together with the accompanying control word, to the ALU 325, which performs the operations previously described.

From the ALU 325, the data and control word is passed to the Token Formatter 326 (TF). In the Token Formatter, the data is combined as needed with the control word to form tokens. The tokens are then conveyed to the next stages of the Spatial Decoder. Note that at this point, there are as many tokens as will be used by the system.

26. INVERSE DISCRETE COSINE TRANSFORM

The Inverse Discrete Cosine Transform (IDCT), in accordance with the present invention, decompresses data related to the frequency of the DC component of the picture. When a particular picture is being compressed, the frequency of the light in the picture is quantized, reducing the overall amount of information needed to be stored. The IDCT takes this quantized data and decompresses it back into frequency information.

The IDCT operates on a portion of the picture which is 8×8 pixels in size. The math which performed on this data is largely governed by the particular standard used to encode the data. However, in the present invention, significant use is made of common mathematical functions between the standards to avoid unnecessary duplication of circuitry.

Using a particular scaling order, the symmetry between the upper and lower portions of the algorithms is increased, thus common mathematical functions can be reused which eliminates the need for additional circuitry.

The DCT responds to a number of multi-standard tokens. The first portion of the IDCT checks the entering data to ensure that the DATA tokens are of the correct size for processing. In fact, the token stream can be corrected in some situations if the error is not too large.

27. BUFFER MANAGER

The Buffer Manager of the present invention, receives incoming video information and supplies the address generators with information on the timing of the datas arrival, display and frame rate. Multiple buffers are used to allow changes in both the presentation and display rates. Presentation and display rates will typically vary in accordance with the data that was encoded and the monitor on which the information is being displayed. Data arrival rates will generally vary according to errors in encoding, decoding or the source material used to create the data. When information arrives at the Buffer Manager, it is decompressed. However, the data is in an order that is useful for the decompression circuits, but not for the particular display unit being used. When a block of data enters the Buffer Manager, the Buffer Manager supplies information to the address generator so that the block of data can be placed in the order that the display device can use. In doing this, the Buffer Manager takes into account the frame rate conversion necessary to adjust the incoming data blocks so they are presentable on the particular display device being used.

In the present invention, the Buffer Mnager primarily supplies information to the address generators. Nevertheless, it is also required to interface with other elements of the system. For example, there is an interface with an input FIFO which transfers tokens to the Buffer Manager which, in turn, passes these tokens on to the write address generators.

The Buffer Manager also interfaces with the display address generators, receiving information on whether the display device is ready to display new data. The Buffer Manager also confirms that the display address generators have cleared information from a buffer for display.

The Buffer Manager of the present invention keeps track of whether a particular buffer is empty, full, ready for use or in use. It also keeps track of the presentation number associated with the particular data in each buffer. In this way, the Buffer Manager determines the states of the buffers, in part, by making only one buffer at a time ready for display. Once a buffer is displayed, the buffer is in a "vacant" state. When the Buffer Manager receives a PICTURE_START, FLUSH, valid or access token, it determines the status of each buffer and its readiness to accept new data. For example, the PICTURE_START token causes the Buffer Manager to cycle through each buffer to find one which is capable of accepting the new data.

The Buffer Manager can also be configured to handle the multi-standard requirements dictated by the tokens it receives. For example, in the H.261 standard, data maybe skipped during display. If such a token arrives at the Buffer Mnager, the data to be skipped will be flushed from the buffer in which it is stored.

Thus, by managing the buffers, data can be effectively displayed according to the compression standard used to encode the data, the rate at which the data is decoded and the particular type of display device being used.

The foregoing description is believed to adequately describe the overall concepts, system implementation and operation of the various aspects of the invention in sufficient detail to enable one of ordinary skill in the art to make and practice the invention with all of its attendant features, objects and advantages. However, in order to facilitate a further, more detailed in depth understanding of the inventions and additional details in connection with even more specific, commercial implementation of various embodiments of the invention, the following further description and explanation is preferred.

This is a more detailed description for a multi-standard video decoder chip-set. It is divided into three main sections: A, B and C.

Again, for purposes of organization, clarity and convenience of explanation, this additional disclosure is set forth in the following sections.

Description of features common to chips in the chip-set:

Tokens

Two wire interfaces

DRAM interface

Microprocessor interface

Clocks

Description of the Spatial Decoder chip

Description of the Temporal Decoder chip

SECTION A.1

The first description section covers the majority of the electrical design issues associated with using the chip-set.

A.1.1 Typographic conventions

A small set of typographic conventions is used to emphasize some classes of information:

NAMES_OF_TOKENS wire_name active high signal wire_name active low signal register_name SECTION A.2 Video Decoder Family 30 MHz operation Decodes MPEG, JPEG & H.261

Coded data rates to 25 Mb/s

Video data rates to 21 MB/s

MPEG resolutions up to 704×480, 30 Hz, 4:2:0

Flexible chroma sampling formats

Full JPEG baseline decoding

Glue-less page mode DRAM interface 208 pin PQFP package

Independent coded data and decoder clocks

Re-orders MPEG picture sequence

The Video decoder family provides a low chip count solution for implementing high resolution digital video decoders. The chip-set is currently configurable to support three different video and picture coding systems: JPEG, MPEG and H.261.

Full JPEG baseline picture decoding is supported. 720×480, 30 Hz, 4:2:2 JPEG encoded video can be decoded in real-time.

CIF (Common Interchange Format) and QCIF H.261 video can be decoded. Full feature MPEG video with formats up to 740×480, 30 Hz, 4:2:0 can be decoded.

Note: The above values are merely illustrative, by way of example and not necessarily by way of limitation, of one embodiment of the present invention. Accordingly, it will be appreciated that other values and/or ranges may be used.

A.2.1 System configurations

A.2.1.1 Output formatting

In each of the examples given below, some form of output formatter will be required to take the data presented at the output of the Spatial Decoder or Temporal Decoder and re-format it for a computer or display system. The details of this formatting will vary between applications. In a simple case, all that is required is an address generator to take the block formatted data output by the decoder chip and write it into memory in a raster order.

The Image Formatter is a single chip VLSI device providing a wide range of output formatting functions.

A.2.1.2 JPEG still picture decoding

A single Spatial Decoder, with no-off-chip DRAM, can rapidly decode baseline JPEG images. The Spatial Decoder will support all features of baseline JPEG. However, the image size that can be decoded may be limited by the size of the output buffer provided by the user. The characteristics of the output formatter may limit the chroma sampling formats and color spaces that can be supported.

A.2.1.3 JPEG video decoding

Adding off-chip DRAMs to the Spatial Decoder allows it to decode JPEG encoded video pictures in real-time. The size and speed of the required buffers will depend on the video and coded data rates. The Temporal Decoder is not required to decode JPEG encoded video. However, if a Temporal Decoder is present in a multi-standard decoder chip-set, it will merely pass the data through the Temporal Decoder without alteration or modification when the system is configured for JPEG operation.

A.2.1.4 H.261 decoding

The Spatial Decoder and the Temporal Decoder are both required to implement an H.261 video decoder. The DRAM interfaces on both devices are configurable to allow the quantity of DRAM required for proper operation to be reduced when working with small picture formats and at low coded data rates. Typically, a single 4Mb (e.g. 512k×8) DRAM will be required by each of the Spatial Decoder and the Temporal Decoder.

A.2.1.5 MPEG decoding

The configuration required for MPEG operation is the same as for H.261. However, as will be appreciated by one of ordinary skill in the art, larger DRAM buffers may be required to support the larger picture formats possible with MPEG.

SECTION A.3 Tokens

A.3.1 Token format

In accordance with the present invention, tokens provide an extensible format for communicating information through the decoder chip-set. While in the present invention, each word of a Token is a minimum of 8 bits wide, one of ordinary skill in the art will appreciate that tokens can be of any width. Furthermore, a single Token can be spread over one or more words; this is accomplished using an extension bit in each word. The formats for the tokens are summarized in Table A.3.1.

The extension bit indicates whether a Token continues into another word. It is set to 1 in all words of a Token except the last one. If the first word of a Token has an extension bit of 0, this indicates that the Token is only one word long.

Each Token is identified by an Address Field that starts; in bit 7 of the first word of the Token. The Address Field is of variable length and can potentially extend over multiple words (in the current chips no address is more than 8 bits long, however, one of ordinary skill in the art will again appreciate that addresses can be of any length).

Some interfaces transfer more than 8 bits of data. For example, the output of the Spatial Decoder is 9 bits wide (10 bits including the extension bit). The only Token that takes advantage of these extra bits is the DATA Token. The DATA Token can have as many bits as are necessary for carrying out processing at a particular place in the system. All other Tokens ignore the extra bits.

A.3.2 The DATA Token

The DATA Token carries data from one processing stage to the next. Consequently, the characteristics of this Token change as it passes through the decoder. Furthermore, the meaning of the data carried by the DATA Token varies depending on where the DATA Token is within the system, i.e., the data is position dependent. In this regard, the data may be either frequency domain or Pel domain data depending on where the DATA Token is within the Spatial Decoder. For example, at the input of the Spatial Decoder, DATA Tokens carry bit serial coded video data packed into 8 bit words. At this point, there is no limit to the length of each Token. In contrast, however, at the output of the Spatial Decoder each DATA Token carries exactly 64 words and each word is 9 bits wide.

A.3.3 Using Token formatted data

In some applications, it may be necessary for the circuitry that connect directly to the input or output of the Decoder or chip set. In most cases it will be sufficient to collect DATA Tokens and to detect a few Tokens that provide synchronization information (such as PICTURE_START). In this regard, see subsequent sections A.16, "Connecting to the output of Spatial Decoder", and A.19, "Connecting to the output of the Temporal Decoder".

As discussed above, it is sufficient to observe activity on the extension bit to identify when each new Token starts. Again, the extension bit signals the last word of the current token. In addition, the Address field can be tested to identify the Token. Unwanted or unrecognized Tokens can be consumed (and discarded) without knowledge of their content. However, a recognized token causes an appropriate action to occur.

Furthermore, the data input to the Spatial Decoder can either be supplied as bytes of coded data, or in DATA Tokens (see Section A.10, "Coded data input"). Supplying Tokens via the coded data port or via the microprocessor interface allows many of the features of the decoder chip set to be configured from the data stream. This provides an alternative to doing the configuration via the micro processor interface.

TABLE A.3.1

Summary of Tokens

| 7 | 6 | 5 | 4 | 3 | 2 | 1 | 0 | Token Name | Reference |
|---|---|---|---|---|---|---|---|---|---|
| 0 | 0 | 1 | | | | | | QUANT_SCALE | |
| 0 | 1 | 0 | | | | | | PREDICTION_MODE | |
| 0 | 1 | 1 | | | | | | (reserved) | |
| 1 | 0 | 0 | | | | | | MVD_FORWARDS | |
| 1 | 0 | 1 | | | | | | MVD_BACKWARDS | |
| 0 | 0 | 0 | 0 | 1 | | | | QUANT_TABLE | |
| 0 | 0 | 0 | 0 | 0 | 1 | | | DATA | |
| 1 | 1 | 0 | 0 | 0 | 0 | | | COMPONENT_NAME | |
| 1 | 1 | 0 | 0 | 0 | 1 | | | DEFINE_SAMPLING | |
| 1 | 1 | 0 | 0 | 1 | 0 | | | JPEG_TABLE_SELECT | |
| 1 | 1 | 0 | 0 | 1 | 1 | | | MPEG_TABLE_SELECT | |
| 1 | 1 | 0 | 1 | 0 | 0 | | | TEMPORAL_REFERENCE | |
| 1 | 1 | 0 | 1 | 0 | 1 | | | MPEG_DCH_TABLE | |
| 1 | 1 | 0 | 1 | 1 | 0 | | | (reserved) | |
| 1 | 1 | 0 | 1 | 1 | 1 | | | (reserved) | |
| 1 | 1 | 1 | 0 | 0 | 0 | 0 | | (reserved)SAVE_STATE | |
| 1 | 1 | 1 | 0 | 0 | 0 | 1 | | (reserved)RESTORE_STATE | |
| 1 | 1 | 1 | 0 | 0 | 1 | 0 | | TIME_CODE | |
| 1 | 1 | 1 | 0 | 0 | 1 | 1 | | (reserved) | |

TABLE A.3.1-continued

Summary of Tokens

| 7 | 6 | 5 | 4 | 3 | 2 | 1 | 0 | Token Name | Reference |
|---|---|---|---|---|---|---|---|---|---|
| 0 | 0 | 0 | 0 | 0 | 0 | 0 | 0 | NULL | |
| 0 | 0 | 0 | 0 | 0 | 0 | 0 | 1 | (reserved) | |
| 0 | 0 | 0 | 0 | 0 | 0 | 1 | 0 | (reserved) | |
| 0 | 0 | 0 | 0 | 0 | 0 | 1 | 1 | (reserved) | |
| 0 | 0 | 0 | 1 | 0 | 0 | 0 | 0 | SEQUENCE_START | |
| 0 | 0 | 0 | 1 | 0 | 0 | 0 | 1 | GROUP_START | |
| 0 | 0 | 0 | 1 | 0 | 0 | 1 | 0 | PICTURE_START | |
| 0 | 0 | 0 | 1 | 0 | 0 | 1 | 1 | SLICE_START | |
| 0 | 0 | 0 | 1 | 0 | 1 | 0 | 0 | SEQUENCE_END | |
| 0 | 0 | 0 | 1 | 0 | 1 | 0 | 1 | CODING_STANDARD | |
| 0 | 0 | 0 | 1 | 0 | 1 | 1 | 0 | PICTURE_END | |
| 0 | 0 | 0 | 1 | 0 | 1 | 1 | 1 | FLUSH | |
| 0 | 0 | 0 | 1 | 1 | 0 | 0 | 0 | FIELD_INFO | |
| 0 | 0 | 0 | 1 | 1 | 0 | 0 | 1 | MAX_COMP_ID | |
| 0 | 0 | 0 | 1 | 1 | 0 | 1 | 0 | EXTENSION_DATA | |
| 0 | 0 | 0 | 1 | 1 | 0 | 1 | 1 | USER_DATA | |
| 0 | 0 | 0 | 1 | 1 | 1 | 0 | 0 | DHT_MARKER | |
| 0 | 0 | 0 | 1 | 1 | 1 | 0 | 1 | DQT_MARKER | |
| 0 | 0 | 0 | 1 | 1 | 1 | 1 | 0 | (reserved)DNL_MARKER | |
| 0 | 0 | 0 | 1 | 1 | 1 | 1 | 1 | (reserved)DRI_MARKER | |
| 1 | 1 | 1 | 0 | 1 | 0 | 0 | 0 | (reserved) | |
| 1 | 1 | 1 | 0 | 1 | 0 | 0 | 1 | (reserved) | |
| 1 | 1 | 1 | 0 | 1 | 0 | 1 | 0 | (reserved) | |
| 1 | 1 | 1 | 0 | 1 | 0 | 1 | 1 | (reserved) | |
| 1 | 1 | 1 | 0 | 1 | 1 | 0 | 0 | BIT_RATE | |
| 1 | 1 | 1 | 0 | 1 | 1 | 0 | 1 | VBV_BUFFER_SIZE | |
| 1 | 1 | 1 | 0 | 1 | 1 | 1 | 0 | VBV_DELAY | |
| 1 | 1 | 1 | 0 | 1 | 1 | 1 | 1 | PICTURE_TYPE | |
| 1 | 1 | 1 | 1 | 0 | 0 | 0 | 0 | PICTURE_RATE | |
| 1 | 1 | 1 | 1 | 0 | 0 | 0 | 1 | PEL_ASPECT | |
| 1 | 1 | 1 | 1 | 0 | 0 | 1 | 0 | HORIZONTAL_SIZE | |
| 1 | 1 | 1 | 1 | 0 | 0 | 1 | 1 | VERTICAL_SIZE | |
| 1 | 1 | 1 | 1 | 0 | 1 | 0 | 0 | BROKEN_CLOSED | |
| 1 | 1 | 1 | 1 | 0 | 1 | 0 | 1 | CONSTRAINED | |
| 1 | 1 | 1 | 1 | 0 | 1 | 1 | 0 | (reserved)SPECTRAL_LIMIT | |
| 1 | 1 | 1 | 1 | 0 | 1 | 1 | 1 | DEFINE_MAX_SAMPLING | |
| 1 | 1 | 1 | 1 | 1 | 0 | 0 | 0 | (reserved) | |
| 1 | 1 | 1 | 1 | 1 | 0 | 0 | 1 | (reserved) | |
| 1 | 1 | 1 | 1 | 1 | 0 | 1 | 0 | (reserved) | |
| 1 | 1 | 1 | 1 | 1 | 0 | 1 | 1 | (reserved) | |
| 1 | 1 | 1 | 1 | 1 | 1 | 0 | 0 | HORIZONTAL_MBS | |
| 1 | 1 | 1 | 1 | 1 | 1 | 0 | 1 | VERTICAL_MBS | |
| 1 | 1 | 1 | 1 | 1 | 1 | 1 | 0 | (reserved) | |
| 1 | 1 | 1 | 1 | 1 | 1 | 1 | 1 | (reserved) | |

A.3.4 Description of Tokens

This section documents the Tokens which are implemented in the Spatial Decoder and the Temporal Decoder chips in accordance with the present invention; see Table A.3.2.

Note:

"r" signifies bits that are currently reserved and carry the value 0 unless indicated all integers are unsigned

TABLE A.3.2

Tokens implemented in the Spatial Decoder and Temporal Decoder

| E | 7 | 6 | 5 | 4 | 3 | 2 | 1 | 0 | Description |
|---|---|---|---|---|---|---|---|---|---|
| 1 | 1 | 1 | 1 | 0 | 1 | 1 | 0 | 0 | BIT_RATE test info only |
| 1 | r | r | r | r | r | r | b | b | Carries the MPEG bit rate parameter R. Generated by the Huffman |
| 1 | b | b | b | b | b | b | b | b | decoder when decoding an MPEG bitstream. |
| 0 | b | b | b | b | b | b | b | b | b - an 18 bit integer as defined by MPEG |
| 1 | 1 | 1 | 1 | 1 | 0 | 1 | 0 | 0 | BROKEN_CLOSED |
| 0 | r | r | r | r | r | r | c | b | Carries two MPEG flags bits: |
| | | | | | | | | | c - closed_gop |
| | | | | | | | | | b - broken_link |
| 1 | 0 | 0 | 0 | 1 | 0 | 1 | 0 | 1 | CODING_STANDARD |
| 0 | s | s | s | s | s | s | s | s | s - an 8 bit integer indicating the current coding standard. The |
| | | | | | | | | | values currently assigned are: |
| | | | | | | | | | 0 - H.261 |

TABLE A.3.2-continued

Tokens implemented in the Spatial Decoder and Temporal Decoder

| E | 7 | 6 | 5 | 4 | 3 | 2 | 1 | 0 | Description |
|---|---|---|---|---|---|---|---|---|---|
| | | | | | | | | | 1 - JPEG<br>2 - MPEG |
| 1 | 1 | 1 | 0 | 0 | 0 | 0 | c | c | COMPONENT_NAME |
| 0 | n | n | n | n | n | n | n | n | Communicates the relationship between a component ID and the component name. See also . . .<br>c - 2 bit component ID<br>n - 8 bit component "name" |
| 1 | 1 | 1 | 1 | 1 | 0 | 1 | 0 | 1 | CONSTRAINED |
| 0 | r | r | r | r | r | r | r | c | c - carries the constrained_parameters_flag decoded from an MPEG bitstream. |
| 1 | 0 | 0 | 0 | 0 | 0 | 1 | c | c | DATA |
| 1 | d | d | d | d | d | d | d | d | Carries data through the decoder chip-set. |
| 0 | d | d | d | d | d | d | d | d | c - a 2 bit integer component ID (see A.3.5.1 ).This field is not defined for Tokens that carry coded data (rather than pixel information). |
| 1 | 1 | 1 | 1 | 1 | 0 | 1 | 1 | 1 | DEFINE_MAX_SAMPLING |
| 1 | r | r | r | r | r | r | h | h | Max. Horizontal and Vertical sampling numbers. These describe |
| 0 | r | r | r | r | r | r | v | v | the maximum number of blocks horizontally/vertically in any component of a macroblock. See A.3.5.2<br>h - 2 bit horizontal sampling number.<br>v - 2 bit vertical sampling number. |
| 1 | 1 | 1 | 0 | 0 | 0 | 1 | c | c | DEFINE_SAMPLING |
| 1 | r | r | r | r | r | r | h | h | Horizontal and Vertical sampling numbers for a particular colour |
| 0 | r | r | r | r | r | r | v | v | component. See A.3.5.2<br>c - 2 bit component ID.<br>h - 2 bit horizontal sampling number.<br>v - 2 bit vertical sampling number. |
| 0 | 0 | 0 | 0 | 1 | 1 | 1 | 0 | 0 | DHT_MARKER<br>The Token informs the Video Demux that the DATA Token that follows contains the specification of a Huffman table described using the JPEG "define Huffman table segment" syntax. This Token is only valid when the coding standard is configured as JPEG.<br>This Token is generated by the start code detector during JPEG decoding when a DHT marker has been encountered in the data stream. |
| 0 | 0 | 0 | 0 | 1 | 1 | 1 | 1 | 0 | DNL_MARKER<br>This Token informs the Video Demux that the DATA Token that follows contains the JPEG parameter NL which specifies the number of lines in a frame.<br>This Token is generated by the start code detector during JPEG decoding when a DNL marker has been encountered in the data stream. |
| 0 | 0 | 0 | 0 | 1 | 1 | 1 | 0 | 1 | DQT_MARKER<br>This Token informs the Video Demux that the DATA Token that follows contains the specification of a quantisation table described using the JPEG "define quantisation table segment" syntax. This Token is only valid when the coding standard is configured as JPEG. The Video Demux generates a QUANT_TABLE Token containing the new quantisation table information.<br>This Token is generated by the start code detector during JPEG decoding when a DQT marker has been encountered in the data stream. |
| 0 | 0 | 0 | 0 | 1 | 1 | 1 | 1 | 1 | DRI_MARKER<br>This Token informs the Video Demux that the DATA Token that follows contains the JPEG parameter Ri which specifies the number of minimum coding units between restart markers.<br>This Token is generated by the start code detector during JPEG decoding when a DRI marker has been encountered in the data stream. |
| 1 | 0 | 0 | 0 | 1 | 1 | 0 | 1 | 0 | EXTENSION_DATA JPEG |
| 0 | v | v | v | v | v | v | v | v | This Token informs the Video Demux that the DATA Token that follows contains extension data. See A.11.3, "Conversion of start codes to Tokens". and A.14.6. "Receiving User and Extension data",<br>During JPEG operation the 8 bit field "v" carries the JPEG marker value. This allows the class of extension data to be identified. |
| 0 | 0 | 0 | 0 | 1 | 1 | 0 | 1 | 0 | EXTENSION_DATA MPEG<br>This Token informs the Video Demux that the DATA Token that follows contains extension data. See A.11.3. "Conversion of start codes to Tokens", and A.14.6, "Receiving User and Extension data", |
| 1 | 0 | 0 | 0 | 1 | 1 | 0 | 0 | 0 | FIELD_INFO |
| 0 | r | r | r | t | p | f | f | f | Carries information about the picture following to aid its display. This function is not signalled by any existing coding standard. |

TABLE A.3.2-continued

| | | | | | | | | | Tokens implemented in the Spatial Decoder and Temporal Decoder |
|---|---|---|---|---|---|---|---|---|---|
| E | 7 | 6 | 5 | 4 | 3 | 2 | 1 | 0 | Description |
| | | | | | | | | | t - if the picture is an interlaced frame this bit indicates if the upper field is first (t=0) or second. |
| | | | | | | | | | p - if pictures are fields this indicates if the next picture is upper (p=0) or lower in the frame. |
| | | | | | | | | | f - a 3 bit number indicating position of the field in the 8 field PAL sequence. |
| 0 | 0 | 0 | 0 | 1 | 0 | 1 | 1 | 1 | FLUSH |
| | | | | | | | | | Used to indicate the end of the current coded data and to push the end of the data stream through the decoder. |
| 0 | 0 | 0 | 0 | 1 | 0 | 0 | 0 | 1 | GROUP_START |
| | | | | | | | | | Generated when the group of pictures start code is found when decoding MPEG or the frame marker is found when decoding JPEG. |
| 1 | 1 | 1 | 1 | 1 | 1 | 1 | 0 | 0 | HORIZONTAL_MBS |
| 1 | r | r | r | h | h | h | h | h | h - a 13 bit number integer indicating the horizontal width of the |
| 0 | h | h | h | h | h | h | h | h | picture in macroblocks. |
| 1 | 1 | 1 | 1 | 1 | 0 | 0 | 1 | 0 | HORIZONTAL_SIZE |
| 1 | h | h | h | h | h | h | h | h | h - 16 bit number integer indicating the horizontal width of the |
| 0 | h | h | h | h | h | h | h | h | picture in pixels. This can be any integer value. |
| 1 | 1 | 1 | 0 | 0 | 1 | 0 | c | c | JPEG_TABLE_SELECT |
| 0 | r | r | r | r | r | r | t | t | Informs the inverse quantiser which quantisation table to use on the specified colour component. |
| | | | | | | | | | c - 2 bit component ID (see A.3.5.1 |
| | | | | | | | | | t - 2 bit integer table number. |
| 1 | 0 | 0 | 0 | 1 | 1 | 0 | 0 | 1 | MAX_COMP_ID |
| 0 | r | r | r | r | r | r | m | m | m - 2 bit integer indicating the maximum value of component ID (see A.3.5.1 ) that will be used in the next picture. |
| 0 | 1 | 1 | 0 | 1 | 0 | 1 | c | c | MPEG_DCH_TABLE |
| 0 | r | r | r | r | r | r | t | t | Configures which DC coefficient Huffman table should be used for colour component cc. |
| | | | | | | | | | c - 2 bit component ID (see A.3.5.1 |
| | | | | | | | | | t - 2 bit integer table number. |
| 0 | 1 | 1 | 0 | 0 | 1 | 1 | d | n | MPEG_TABLE_SELECT |
| | | | | | | | | | informs the inverse quantiser whether to use the default or user defined quantisation table for intra or non-intra information. |
| | | | | | | | | | n - 0 indicates intra information, 1 non-intra. |
| | | | | | | | | | d - 0 indicates default table, 1 user defined. |
| 1 | 1 | 0 | 1 | d | v | v | v | v | MVD_BACKWARDS |
| 0 | v | v | v | v | v | v | v | v | Carries one component (either vertical or horizontal) of the backwards motion vector. |
| | | | | | | | | | d - 0 indicates x component, 1 the y component |
| | | | | | | | | | v - 12 bit two's complement number. The LS8 provides half pixel resolution. |
| 1 | 1 | 0 | 0 | d | v | v | v | v | MVD_FORWARDS |
| 0 | v | v | v | v | v | v | v | v | Carries one component (either vertical or horizontal) of the forwards motion vector. |
| | | | | | | | | | d - 0 indicates x component, 1 the y component |
| | | | | | | | | | v - 12 bit two's complement number. The LS8 provides half pixel resolution. |
| 0 | 0 | 0 | 0 | 0 | 0 | 0 | 0 | 0 | NULL |
| | | | | | | | | | Does nothing. |
| 1 | 1 | 1 | 1 | 1 | 0 | 0 | 0 | 1 | PEL_ASPECT |
| 0 | r | r | r | r | p | p | p | p | p - a 4 bit integer as defined by MPEG. |
| 0 | 0 | 0 | 0 | 1 | 0 | 1 | 1 | 0 | PICTURE_END |
| | | | | | | | | | Inserted by the start code detector to indicate the end of the current. picture. |
| 1 | 1 | 1 | 1 | 1 | 0 | 0 | 0 | 0 | PICTURE_RATE |
| 0 | r | r | r | r | p | p | p | p | p - a 4 bit integer as defined by MPEG. |
| 1 | 0 | 0 | 0 | 1 | 0 | 0 | 1 | 0 | PICTURE_START |
| 0 | r | r | r | r | n | n | n | n | indicates the start of a new picture. |
| | | | | | | | | | n - a 4 bit picture index allocated to the picture by the start code detector. |
| 1 | 1 | 1 | 1 | 0 | 1 | 1 | 1 | 1 | PICTURE_TYPE MPEG |
| 0 | r | r | r | r | r | r | p | p | p - a 2 bit integer indicating the picture coding type of the picture that follows: |
| | | | | | | | | | 0 - Intra |
| | | | | | | | | | 1 - Predicted |
| | | | | | | | | | 2 - Bidirectionally Predicted |
| | | | | | | | | | 3 - DC Intra |
| 1 | 1 | 1 | 1 | 0 | 1 | 1 | 1 | 1 | PICTURE_TYPE H.261 |
| 1 | r | r | r | r | r | r | 0 | 1 | Indicates various H.261 options are on (1) or off (0). These options |
| 0 | r | r | s | d | f | q | 1 | 1 | are always off for MPEG and JPEG: |
| | | | | | | | | | s - Split Screen Indicator |
| | | | | | | | | | d - Document Camera |

TABLE A.3.2-continued

| | | | | | | | | | Tokens implemented in the Spatial Decoder and Temporal Decoder |
|---|---|---|---|---|---|---|---|---|---|
| E | 7 | 6 | 5 | 4 | 3 | 2 | 1 | 0 | Description |
| | | | | | | | | | f - Freeze Picture Release |
| | | | | | | | | | Source picture format: |
| | | | | | | | | | q = 0 - QCIF |
| | | | | | | | | | q = 1 - CIF |
| 0 | 0 | 1 | 0 | h | y | x | b | f | PREDICTION_MODE |
| | | | | | | | | | A set of flag bits that indicate the prediction mode for the macroblocks that follow: |
| | | | | | | | | | f - forward prediction |
| | | | | | | | | | b - backward prediction |
| | | | | | | | | | x - reset forward vector predictor |
| | | | | | | | | | y - reset backward vector predictor |
| | | | | | | | | | h - enable H.261 loop filter |
| 0 | 0 | 0 | 1 | s | s | s | s | s | QUANT_SCALE |
| | | | | | | | | | informs the inverse quantiser of a new scale factor |
| | | | | | | | | | s - 5 bit integer in range 1 . . . 31. The value 0 is reserved. |
| 1 | 0 | 0 | 0 | 0 | 1 | 1 | 1 | 1 | QUANT_TABLE |
| 1 | q | q | q | q | q | q | q | q | Loads the specified inverse quantiser table with 64 8 bit unsigned |
| 0 | q | q | q | q | q | q | q | q | integers. The values are in zig-zag order. |
| | | | | | | | | | t - 2 bit integer specifying the inverse quantiser table to be loaded. |
| 0 | 0 | 0 | 0 | 1 | 0 | 1 | 0 | 0 | SEQUENCE_END |
| | | | | | | | | | The MPEG sequence_end_code and the JPEG EOI marker cause this token to be generated. |
| 0 | 0 | 0 | 0 | 1 | 0 | 0 | 0 | 0 | SEQUENCE_START |
| | | | | | | | | | Generated by the MPEG sequence_start start code. |
| 1 | 0 | 0 | 0 | 1 | 0 | 0 | 1 | 1 | SLICE_START |
| 0 | s | s | s | s | s | s | s | s | Corresponds to the MPEG slice_start, the H.261 GOB and the JPEG resync interval. The interpretation of 8 bit integer "s" differs between coding standards: |
| | | | | | | | | | MPEG - Slice Vertical Position -1. |
| | | | | | | | | | H.261 - Group of Blocks Number - 1. |
| | | | | | | | | | JPEG - resychronisation interval identification (4 LSBs only). |
| 1 | 1 | 1 | 0 | 1 | 0 | 0 | t | t | TEMPORAL_REFERENCE |
| 0 | t | t | t | t | t | t | t | t | t - carries the temporal reference. For MPEG this is a 10 bit integer. For H.261 only the 5 LSBs are used, the MSBs will always be zero. |
| 1 | 1 | 1 | 1 | 0 | 0 | 1 | 0 | d | TIME_CODE |
| 1 | r | r | r | h | h | h | h | h | The MPEG time_code. |
| 1 | r | r | m | m | m | m | m | m | d - Drop frame flag |
| 1 | r | r | s | s | s | s | s | s | d - Drop |
| 0 | r | r | p | p | p | p | p | p | h - 5 bit integer specifying hours |
| | | | | | | | | | m - 6 bit integer specifying minutes |
| | | | | | | | | | s - 6 bit integer specifying seconds |
| | | | | | | | | | p - 6 bit integer specifying pictures |
| 1 | 0 | 0 | 0 | 1 | 1 | 0 | 1 | 1 | USER_DATA JPEG |
| 0 | v | v | v | v | v | v | v | v | This Token informs the Video Demux that the DATA Token that follows contains user data. See A.11.3, "Conversion of start codes to Tokens", and A.14.6, "Receiving User and Extension data". |
| | | | | | | | | | During JPEG operation the 8 bit field "v" carries the JPEG marker value. This allows the class of user data to be identified. |
| 0 | 0 | 0 | 0 | 1 | 1 | 0 | 1 | 1 | USER_DATA MPEG |
| | | | | | | | | | This Token informs the Video Demux that the DATA Token that follows contains user data. See A.11.3, "Conversion of start codes to Tokens", and A.14.6, "Receiving User and Extension data," |
| 1 | 1 | 1 | 1 | 0 | 1 | 1 | 0 | 1 | VBV_BUFFER_SIZE |
| 1 | r | r | r | r | r | r | s | s | s - a 10 bit integer as defined by MPEG. |
| 0 | s | s | s | s | s | s | s | s | |
| 1 | 1 | 1 | 1 | 0 | 1 | 1 | 1 | 0 | VBV_DELAY |
| 1 | b | b | b | b | b | b | b | b | b - a 16 bit integer as defined by MPEG. |
| 0 | b | b | b | b | b | b | b | b | |
| 1 | 1 | 1 | 1 | 1 | 1 | 1 | 1 | 0 | 1 VERTICAL_MBS |
| 1 | r | r | r | v | v | v | v | v | v - a 13 bit integer indicating the vertical size of the picture in macroblocks. |
| 0 | v | v | v | v | v | v | v | v | |
| 1 | 1 | 1 | 1 | 1 | 0 | 0 | 1 | 1 | VERTICAL_SIZE |
| 1 | v | v | v | v | v | v | v | v | v - a 16 bit integer indicating the vertical size of the picture in pixels. |
| 0 | v | v | v | v | v | v | v | v | This can be any integer value. |

A.3.5 Numbers signalled in Tokens

A.3.5.1 Component Identification number

In accordance with the present invention, the Component ID number is a 2 bit integer specifying a color component. This 2 bit field is typically located as part of the Header in the DATA Token. With MPEG and H.261 the relationship is set forth in Table A.3.3.

TABLE A.3.3

Component ID for MPEG and H.261

| Component ID | MPEG or H.261 colour component |
|---|---|
| 0 | Luminance (Y) |
| 1 | Blue difference signal (Cb/U) |
| 2 | Red difference signal (Cr/V) |
| 3 | Never used |

With JPEG the situation is more complex as JPEG does not limit the color components that can be used. The decoder chips permit up to 4 different color components in each scan. The IDs are allocated sequentially as the specification of color components arrive at the decoder.

A.3.5.2 Horizontal and Vertical sampling numbers

For each of the 4 color components, there is a specification for the number of blocks arranged horizontally and vertically in a macroblock. This specification comprises a two bit integer which is one less; than the number of blocks.

For example, in MPEG (or H.261) with 4:2:0 chroma sampling (FIG. 36) and component IDs allocated as per Table A.3.4.

TABLE A.3.4

Sampling numbers for 4:2:0/MPEG

| Component ID | Horizontal sampling number | Width in blocks | Vertical sampling number | Height in blocks |
|---|---|---|---|---|
| 0 | 1 | 2 | 1 | 2 |
| 1 | 0 | 1 | 0 | 1 |
| 2 | 0 | 1 | 0 | 1 |
| 3 | Not used | Not used | Not used | Not used |

With JPEG and 4:2:2 chroma sampling (allocation of component to component ID will vary between applications. See A.3.5.1. Note: JPEG requires a 2:1:1 structure for its macroblocks when processing 4:2:2 data. See Table A.3.5.

TABLE A.3.5

Sampling numbers for 4:2:2 JPEG

| Component ID | Horizontal sampling number | Width in blocks | Vertical sampling number | Height in blocks |
|---|---|---|---|---|
| Y | 1 | 2 | 0 | |
| U | 0 | 1 | 1 | |
| V | 0 | 0 | 1 | |

A.3.6 Special Token formats

In accordance with the present invention, tokens such as the DATA Token and the QUANT_TABLE Token are used in their "extended form" within the decoder chip-set. In the extended form the Token includes some data. In the case of DATA Tokens, they can contain coded data or pixel data. In the case of QUANT_TABLE tokens, they contain quantizer table information.

Furthermore, "non-extended form" of these Tokens is defined in the present invention as "empty". This Token format provides a place in the Token stream that can be subsequently filled by an extended version of the same Token. This format is mainly applicable to encoders and, therefore, it is not documented further here.

TABLE A.3.6 tokens for different standards

| Token Name | MPEG | JPEG | H.261 |
|---|---|---|---|
| BIT_RATE | ✓ | | |
| BROKEN_CLOSED | ✓ | | |
| CODING_STANDARD | ✓ | ✓ | ✓ |
| COMPONENT_NAME | | ✓ | |
| CONSTRAINED | ✓ | | |
| DATA | ✓ | ✓ | ✓ |
| DEFINE_MAX_SAMPLING | ✓ | ✓ | ✓ |
| DEFINE_SAMPLING | ✓ | ✓ | ✓ |
| DHT_MARKER | | ✓ | |
| DNL_MARKER | | ✓ | |
| DQT_MARKER | | ✓ | |
| DRI_MARKER | | ✓ | |
| EXTENSION_DATA | ✓ | ✓ | |
| FIELD_INFO | | | |
| FLUSH | ✓ | ✓ | ✓ |
| GROUP_START | ✓ | ✓ | |
| HORIZONTAL_MBS | ✓ | ✓ | ✓ |
| HORIZONTAL_SIZE | ✓ | ✓ | ✓ |
| JPEG_TABLE_SELECT | | ✓ | |
| MAX_COMP_ID | ✓ | ✓ | ✓ |
| MPEG_DCH_TABLE | ✓ | | |
| MPEG_TABLE_SELECT | ✓ | | |
| MVD_BACKWARDS | ✓ | | |
| MVD_FORWARDS | ✓ | | ✓ |
| NULL | ✓ | ✓ | ✓ |
| PEL_ASPECT | ✓ | | |
| PICTURE_END | ✓ | ✓ | ✓ |
| PICTURE_RATE | ✓ | | |
| PICTURE_START | ✓ | ✓ | ✓ |
| PICTURE_TYPE | ✓ | ✓ | ✓ |
| PREDICTION_MODE | ✓ | ✓ | ✓ |
| QUANT_SCALE | ✓ | | ✓ |
| QUANT_TABLE | ✓ | ✓ | |
| SEQUENCE_END | ✓ | ✓ | |
| SEQUENCE_START | ✓ | ✓ | ✓ |
| SLICE_START | ✓ | ✓ | ✓ |
| TEMPORAL_REFERENCE | ✓ | | ✓ |
| TIME_CODE | ✓ | | |
| USER_DATA | ✓ | ✓ | |
| VBV_BUFFER_SIZE | ✓ | | |
| VBV_DELAY | ✓ | | |
| VERTICAL_MBS | ✓ | ✓ | ✓ |
| VERTICAL_SIZE | ✓ | ✓ | ✓ |

A.3.7 Use of Tokens for different standards

Each standard uses a different sub-set of the defined Tokens in accordance with the present invention; ss Table A.3.6.

SECTION A.4 The two wire interface

A.4.1 Two-wire interfaces and the Token Port

A simple two-wire valid/accept protocol is used at all levels in the chip-set to control the flow of information. Data is only transferred between blocks when both the sender and receiver are observed to be ready when the clock rises.

1) Data transfer

2) Receiver not ready

3) Sender not ready

If the sender is not ready (as in 3 Sender not ready above) the input of the receiver must wait. If the receiver is not ready (as in 2 Receiver not ready above) the sender will continue to present the same data on its output until it is accepted by the receiver.

When Token information is transferred between blocks the two-wire interface between the blocks is referred to as a Token Port.

A.4.2 where used

The decoder chip-set, in accordance with the present invention, uses two-wire interfaces to connect the three chips. In addition, the coded data input to the Spatial Decoder is also a two-wire interface.

A.4.3 Bus signals

The width of the data word transferred by the two-wire interface varies depending upon the needs of the interface concerned (See FIG. 35, "Tokens on interfaces wider than 8 bits". For example, 12 bit coefficients are input to the Inverse Discrete Cosine Transform (IDCT), but only 9 bits are output.

TABLE A.4.1

Two wire interface data width

| Interface | Data Width (bits) |
|---|---|
| Coded data input to Spatial Decoder | 8 |
| Output port of Spatial Decoder | |
| Inut port of Temporal Decoder | 9 |
| Output port of Temporal Decoder | 8 |
| Input port of Image Formatter | 8 |

In addition to the data signals there are three other signals transmitted via the two-wire interface:

valid
accept
extension

A.4.3.1 The extension signal

The extension signal corresponds to the Token extension bit previously described.

A.4.4 Design considerations

The two wire interface is intended for short range, point to point communication between chips.

The decoder chips should be placed adjacent to each other, so as to minimize the length of the PCB tracks between chips. Where possible, track lengths should be kept below 25 mm. The PCB track capacitance should be kept to a minimum.

The clock distribution should be designed to minimize the clock slew between chips. If there is any clock slew, it should be arranged so that "receiving chips" see the clock before "sending chips".[1]

[1] Note: FIG. 38 shows the two-wire interface between the system de-mux chip and the coded data port of the Spatial Decoder operating from the main decoder clock. This is optional as this two wire interface can work from the coded data clock which can be asynchronous to the decoder clock. See Section A.10.5, "Coded data clock". Similarly the display interface of the Image Formatter can operate from a clock that is asynchronous to the main decoder clock.

All chips communicating via two wire interfaces should operate from the same digital power supply.

A.4.5 Interface timing

TABLE A.4.2

Two wire interface timing

| | | 30 MHz | | | Note[a] |
|---|---|---|---|---|---|
| Num. | Characteristic | Min. | Max. | Unit | b |
| 1 | Input signal set-up time | 5 | | ns | |
| 2 | Input signal hold time | 0 | | ns | |
| 3 | Output signal drive time | | 23 | ns | |
| 4 | Output signal hold time | 2 | | ns | |

[a]FIGURES in Table A.4.2 may vary in accordance with design variations
b. Maximum signal loading is approximately 20 $_pF$
[1]Note:

TABLE A.4.2-continued

Two wire interface timing

| | | 30 MHz | | | Note[a] |
|---|---|---|---|---|---|
| Num. | Characteristic | Min. | Max. | Unit | b |

FIGURE 38 shows the two-wire interface between the system de-mux chip and the coded data port of the Spatial Decoder operating from the main decoder clock. This is optional as this two wire interface can work from the coded data clock which can be asynchronous to the decoder clock. See Section A.10.5, "Coded data clock". Similarly the display interface of the Image Formatter can operate from a clock that is asynchronous to the main decoder clock.

A.4.6 Signal levels

The two-wire interface uses CMOS inputs and output. $V_{1Hmin}$ is approx. 70% of $V_{DD}$ and $V_{1Lmax}$ is approx. 30% of $V_{DD}$. The values shown in Table A.4.3 are those for $V_{1H}$ and $V_{1L}$ at their respective worst case $V_{DD}$. $V_{DD}$=5.0±0.25V.

TABLE A.4.3

DC electrical characteristics

| Symbol | Parameter | Min. | Max. | Units |
|---|---|---|---|---|
| $V_{IM}$ | Input logic "1" voltage | 3.68 | $V_{DD}$ - 0.5 | V |
| $V_{IL}$ | Input logic "0" voltage | GND - 0.5 | 1 .43 | V |
| $V_{OH}$ | Output logic "1" voltage | $V_{DD}$ - 0.1 | | $V^a$ |
| | | $V_{DD}$ - 0.4 | | $V^b$ |
| $V_{OL}$ | Output logic "0" voltage | | 0.1 | $V^c$ |
| | | | 0.4 | $V^d$ |
| $I_{IN}$ | Input leakage current | | =10 | $\mu^A$ |

[a]$1_{OH} \leqq 1$ mA
[b]$1_{OH} \leqq 4$ mA
[c]$1_{OH} \leqq 1$ mA
[d]$1_{OH} \leqq 4$ mA A.4.7 Control clock In general, the clock controlling the transfers across the two wire interface is the chip's decoder_clock. The exception is the coded data port input to the Spatial Decoder. This is controlled by coded_clock. The clock signals are further described herein.

SECTION A.5 DRAM Interface

A.5.1 The DRAM interface

A single high performance, configurable, DRAM interface is used on each of the video decoder chips. In general, the DRAM interface on each chip is substantially the same; however, the interfaces differ from one another in how they handle channel priorities. The interface is designed to directly drive the DRAM used by each of the decoder chips. Typically, no external logic, buffers or components will be necessary to connect the DRAM interface to the DRAMs in most systems.

A.5.2 Interface signals

TABLE A.5.1

DRAM interface signals

| Signal Name | Input/ Output | Description |
|---|---|---|
| DRAM_data[31:0] | I/O | The 32 bit wide DRAM data bus. Optionally this bus can be configured to be 16 or 8 bits wide. See Section A.5.6 |
| DRAM_addr[10:0] | O | The 22 bit wide DRAM interface address is time multiplexed over this |

TABLE A.5.1-continued

| DRAM interface signals | | |
|---|---|---|
| Signal Name | Input/ Output | Description |
| | | 11 bit wide bus. |
| $\overline{RAS}$ | O | The DRAM Row Address Strobe signal |
| $\overline{CAS[3:0]}$ | O | The DRAM Column Address Strobe signal. One signal is provided per byte of the interface's data bus. All the $\overline{CAS}$signals are driven simultaneously. |
| $\overline{WE}$ | O | The DRAM Write Enable signal |
| $\overline{OE}$ | O | The DRAM Output Enable signal |
| DRAM_enable | I | This input signal, when low, makes all the output signals on the interface go high impedance. Note: on-chip data processing is not stopped when the DRAM interface is high impedance. So errors will occur if the chip attempts to access DRAM while DRAM_enable is low. |

In accordance with the present invention, the interface is configurable in two ways:

The detail timing of the interface can be configured to accommodate a variety of different DRAM types The "width" of the DRAM interface can be configured to provide a cost/performance trade-off in different applications.

A.5.3 Configuring the DRAM interface

Generally, there are three groups of registers associated with the DRAM interface: interface timing configuration registers, interface bus configuration registers and refresh configuration registers. The refresh configuration registers (registers in Table A.5.4) should be configured last.

A.5.3.1 Conditions after reset

After reset, the DRAM interface, in accordance with the present invention, starts operation with a set of default timing parameters (that correspond to the slowest mode of operation). Initially, the DRAM interface will continually execute refresh cycles (excluding all other transfers). This will continue until a value is written into refresh_interval. The DRAM interface will then be able to perform other types of transfer between refresh cycles.

A.5.3.2 Bus configuration

Bus configuration (registers in Table A.5.3) should only be done when no data transfers are being attempted by the interface. The interface is placed in this condition immediately after reset, and before a value is written into refresh_interval. The interface can be re-configured later, if required, only when no transfers are being attempted. See the Temporal Decoder chip_access register (A.18.3.1) and the Spatial Decoder buffer_manager_access register (A.13.1.1).

A.5.3.3 Interface timing configuration

In accordance with the present invention, modifications to the interface timing configuration information are controlled by the interface_timing_access register. Writing 1 to this register allows the interface timing registers (in Table A.5.2) to be modified. While interface_timing_access=1, the DRAM interface continues operation with its previous configuration. After writing 1, the user should wait until 1 can be read back from the interface_timing_access before writing to any of the interface timing registers.

When configuration is compete, 0 should be written to the interface_timing_access. The new configuration will then be transferred to the DRAM interface.

A.5.3.4 Refresh configuration

The refresh interval of the DRAM interface of the present invention can only be configured once following reset. Until refresh_interval is configured, the interface continually executes refresh cycles. This prevents any other data transfers. Data transfers can start after a value is written to refresh_interval.

As is well known in the art, DRAMs typically require a "pause" of between 100 μs and 500 μs after power is first applied, followed by a number of refresh cycles before normal operation is possible. Accordingly, these DRAM start-up requirements should be satisfied before writing a value to refresh_interval.

A.5.3.5 Read access to configuration registers

All the DRAM interface registers of the present invention can be read at any time.

A.5.4 Interface timing (ticks)

The DRAM interface timing is derived from a Clock which is running at four times the input Clock rate of the device (decoder_clock). This clock is generated by an on-chip PLL.

For brevity, periods of this high speed clock are referred to as ticks.

A.5.5 Interface registers

TABLE A.5.2

| Interface timing configuration registers | | | |
|---|---|---|---|
| Register name | Size/ Dir | Reset State | Description |
| interface_timing_access | 1 bit rw | 0 | This function enable register allows access to the DRAM interface timing configuration registers. The configuration registers should not be modified while this register holds the value 0. Writing a one to this register requests access to modify the configuration registers. After a 0 has been written to this register the DRAM interface will start to use the new values in the timing configuration registers. |
| page_start_length | 5 bit rw | 0 | Specifies the length at the access start in ticks The minimum value that can be used is 4 (meaning 4 ticks). 0 selects the maximum length at 32 ticks. |
| transfer_cycle_length | 4 bit | 0 | Specifies the length at the last pace read or write cycle in ticks. The minimum value that can be used is 4 (meaning 4 ticks). 0 selects the |

TABLE A.5.2-continued

| Interface timing configuration registers | | | |
|---|---|---|---|
| Register name | Size/ Dir | Reset State | Description |
| | rw | | maximum length at 16 ticks. |
| refresh_cycle_length | 4 bit | 0 | Specifies the length of the refresh cycle in ticks. The minimum value that can be used is 4 (meaning 4 ticks). 0 selects the maximum length of 16 ticks. |
| RAS_falling | 4 bit | 0 | Specifies the number of ticks after the start of the access start that RAS falls. The minimum value that can be used is 4 (meaning 4 ticks). 0 selects the maximum length of 6 ticks. |
| CAS_falling | 4 bit rw | 8 | Specifies the number of ticks after the start of a read cycle, write cycle or access start that CAS falls. The minimum value that can be used is 1 (meaning 1 tick). 0 selects the maximum length of 16 ticks. |
| DRAM_data_width | 2 bit rw | 0 | Specifies the number of bits used on the DRAM interface data bus DRAM_data[31:0]. See A.5.8 |
| row_address_bits | 2 bit rw | 0 | Specifies the number of bits used for the row address portion of the DRAM interface address bus. See A.5.10 |
| DRAM_enable | 1 bit rw | 1 | Writing the value 0 in to this register forces the DRAM interface into a high impedence state. 0 will be read from this register if either the DRAM_enable signal is low or 0 has been written to the register. |
| CAS_strength<br>RAS_strength<br>addr_strength<br>DRAM_data_strength<br>OEWE_strength | 3 bit rw | 6 | These three bit registers configure the output drive strength of DRAM interface signals. This allows the interface to be configured for various different loads. See A.5.13 |

A.5.6 Interface operation

The DRAM interface uses fast page mode. Three different types of access are supported:

Read

Write

Refresh

Each read or write access transfers a burst of 1 to 64 bytes to a single DRAM page address. Read and write transfers are not mixed within a single access and each successive access is treated as a random access to a new DRAM page.

TABLE A.5.4

| Refresh configuration registers | | | |
|---|---|---|---|
| Register name | Size/ Dir. | Reset State | Description |
| refresh_interval | 8 bit rw | 0 | This value specifies the interval between refresh cycles in periods of 16 decoder_clock cycles. Values in the range 1 . . . 255 can be configured. The value 0 is automatically loaded after reset and forces the DRAM interface to continuously execute refresh cycles until a valid refresh interval is configured. It is recommended that refresh_Interval should be configured only once after each reset. |
| no_refresh | 1 bit rw | 0 | Writing the value 1 to this register prevents execution at any refresh cycles. |

A.5.7 Access structure

Each access is composed of two parts:

Access start

Data transfer

In the present invention, each access begins with an access start and is followed by one or more data transfer cycles. In addition, there is a read, write and refresh variant of both the access start and the data transfer cycle.

Upon completion of the last data transfer for a particular access, the interface enters its default state (see A.5.7.3) and remains in this state until a new access is ready to begin. If a new access is ready to begin when the last access has finished, then the new access will begin immediately.

A.5.7.1 Access start

The access start provides the page address for the read or write transfers and establishes some initial signal conditions. In accordance with the present invention, there are three different access starts:

Start of read

Start of write

Start of refresh

TABLE A.5.5

| DRAM Interface timing parameters | | | | | |
|---|---|---|---|---|---|
| Num. | Characteristic | Min. | Max. | Unit | Notes |
| 5 | RAS precharge period set by register RAS_falling | 4 | 16 | DCK | |
| 6 | Access start duration set by register page_start_length | 4 | 32 | | |
| 7 | CAS precharge length set by register CAS_falling. | 1 | 16 | | * |
| 8 | Fast page read or write cycle length set by the register transfer_cycle_length. | 4 | 16 | | |

TABLE A.5.5-continued

| DRAM Interface timing parameters | | | | | |
|---|---|---|---|---|---|
| Num. | Characteristic | Min. | Max. | Unit | Notes |
| 9 | Refresh cycle length set by the register refresh_cycle. | | | | |

[a]This value must be less than RAS_falling to ensure CAS before RAS refresh occurs.

In each case, the timing of RAS and the row address is controlled by the registers RAS_falling and page_start_length. The state of OE and DRAM_data[31:0] is held from the end of the previous data transfer until **RAS falls. The three different access start types only vary in how they drive OE and DRAM_data[31:0] when RAS falls. See FIG. 43.

A.5.7.2 Data transfer

In the present invention, there are different types of data transfer cycles:

Fast page read cycle

Fast page late write cycle

Refresh cycle

A start of refresh can only be followed by a single refresh cycle. A start of read (or write) can be followed by one or more fast page read (or write) cycles. At the start of the read cycle CAS is driven high and the new column address is driven.

Furthermore, an early write cycle is used. WE is driven low at the start of the first write transfer and remains low until the end of the last write transfer. The output data is driven with the address.

As a CAS before RAS refresh cycle is initiated by the start of refresh cycle, there is no interface signal activity during the refresh cycle. The purpose of the refresh cycle is to meet the minimum RAS low period required by the DRAM.

A.5.7.3 Interface default state

The interface signals in the present invention enter a default state at the end of an access:

RAS, CAS and WE high data and OE remain in their previous state addr remains stable A.5.8 Data bus width The two bit register, DRAM_data width, allows the width of the DRAM interface's data path to be configured. This allows the DRAM cost to be minimized when working with small picture formats.

TABLE A.5.6

| Configuring DRAM_data_width | |
|---|---|
| DRAM_data_width | |
| 0[a] | 8 bit wide data bus on DRAM_data[31:24][b]. |
| 1 | 16 bit wide data bus on DRAM_data[31:16][b]. |
| 2 | 32 bit wide data bus on DRAM_data[31:0]. |

[a]Default after reset.
[b]Unused signals are held high impedance.

A.5.9 row address width

The number of bits that are taken from the middle section of the 24 bit internal address in order to provide the row address is configured by the register, row_address_bits.

TABLE A.5.7

| Configuring row_address_bits | |
|---|---|
| row_address_bits | Width of row address |
| 1 | 10 bits on DRAM_addr[9:0] |
| 2 | 11 bits on DRAM_addr[10:0] |

A.5.10 Address bits

On-chip, a 24 bit address is generated. How this address is used to form the row and column addresses depends on the width of the data bus and the number of bits selected for the row address. Some configurations do not permit all the internal address bits to be used and, therefore, produce "hidden bits)".

Similarly, the row address is extracted from the middle portion of the address. Accordingly, this maximizes the rate at which the DRAM is naturally refreshed.

TABLE A.5.8

Mapping between internal and external addresses

| row address width | row address translation internal → external | data bus width | column address translation internal → external | |
|---|---|---|---|---|
| 9 | [14:6] → [8:0] | 8 | [19:15] → [10:6] | [5:0] → [5.O] |
| | | 16 | [20:15] → [10:5] | [6:1] → [4:0] |
| | | 32 | [21:15] → [10:4] | [5:2] → [3:0] |
| 10 | [15:6] → [9:0] | [11 8 | [19:16] → [10:6] | [5:0] → [5:0] |
| | | 16 | [20:16] → [10:5] | [5:1] → [4:0] |
| | | 32 | [21:16] → [10:4] | [5:2] → [3-:0] |
| 11 | [16:6] → [10:0] | 8 | [19:17] → [10:6] | [5:0] → [5:0] |
| | | 16 | [20:1] → [10:5] | [5:1] → [4:0] |
| | | 32 | [21:1] → [10:4] | [5:2] → [3:0] |

A.5.10.1 Low order column address bits

The least significant 4 to 6 bits of the column address are used to provide addresses for fast page mode transfers of up to 64 bytes. The number of address bits required to control these transfers will depend on the width of the data bus (see A.5.8).

A.5.10.2 Decoding row address to access more DRAM banks

Where only a single bank of DRAM is used, the width of the row address used will depend on the type of DRAM used. Applications that require more memory than can be typically provided by a single DRAM bank, can configure a wider row address and then decode some row address bits to select a single DRAM bank.

NOTE: The row address is extracted from the middle of the internal address. If some bits of the row address are decoded to select banks of DRAM, then all possible values of these "bank select bits" must select a bank of DRAM. Otherwise, holes will be left in the address space.

A.5.11 DRAM Interface enable

In the present invention, there are two ways to make all the output signals on the DRAM interface become high impedance, i.e., by setting the DRAM_enable register and the DRAM-enable signal. Both the register and the signal must be at a logic 1 in order for the drivers on the DRAM interface to operate. If either is low then the interface is taken to high impedance.

Note: on-chip data processing is not terminated when the DRAM interface is at high impedance. Therefore, errors will occur if the chip attempts to access DRAM while the interface is at high impedance.

In accordance with the present invention, the ability to take the DRAM interface to high impedance is provided to allow other devices to test or use the DRAM controlled by the Spatial Decoder (or the Temporal Decoder) when the Spatial Decoder (or the Temporal Decoder) is not in use. It is not intended to allow other devices to share the memory during normal operation.

A.5.12 Refresh

Unless disabled by writing to the register, no refresh, the DRAM interface will automatically refresh the DRAM using a $\overline{CAS}$ before $\overline{RAS}$ refresh cycle at an interval determined by the register, refresh_interval.

The value in refresh_interval specifies the interval between refresh cycles in periods of 16 decoder_clock cycles. Values in the range 1.255 can be configured. The value 0 is automatically loaded after reset and forces the DRAM interface to continuously execute refresh cycles (once enabled) until a valid refresh_interval is configured. It is recommended that refresh_interval should be configured only once after each reset.

While $\overline{reset}$ is asserted, the DRAM interface is unable to refresh the DRAM. However, the reset time required by the decoder chips is sufficiently short, so that it should be possible to reset them and then to re-configure the DRAM interface before the DRAM contents decay.

A.5.13 signal strengths

The drive strength of the outputs of the DRAM interface can be configured by the user using the 3 bit registers, CAS_strength, RAS_strength, addr_strength, DRAM_data_strength, and OEWE_strength. The MSB of this 3 bit value selects either a fast or slow edge rate. The two less significant bits configure the output for different load capacitances.

The default strength after reset is 6 and this configures the outputs to take approximately 10 ns to drive a signal between GND and $V_{DD}$ if loaded with $24_pF$.

TABLE A.5.9

Output strength configurations

| strength value | Drive characteristics |
|---|---|
| 0 | Approx. 4 ns/v into 6 pt load |
| 1 | Approx. 4 ns/v into 12 pt load |
| 2 | Approx. 4 ns/v into 24 pt load |
| 3 | Approx. 4 ns/V into 48 pf load |
| 4 | Approx. 2 ns/v into 6 pt load |
| 5 | Approx. 2 ns/v into 12 pt load |
| 6[a] | Approx. 2 ns/v into 24 pt load |
| 7 | Approx. 2 ns/v into 6 pt load |

[a]Default after reset

When an output is configured appropriately for the load it is driving, it will meet the AC electrical characteristics specified in Tables A.5.13 to A.5.16. When appropriately configured, each output is approximately matched to its load and, therefore, minimal overshoot will occur after a signal transition.

A.5.14 Electrical specifications

All information provided in this section is merely illustrative of one embodiment of the present invention and is included by example and not necessarily by way of limitation.

TABLE A.5.10

Maximum Ratings[a]

| Symbol | Parameter | Min. | Max. | Units |
|---|---|---|---|---|
| $V_{DD}$ | Supply voltage relative to GND | −0.5 | 6.5 | V |
| $V_{IN}$ | Input voltage on any pin | GND−0.5 | $V_{DD\pm0.5}$ | V |
| $T_A$ | Operating temperature | −40 | +85 | °C. |
| $T_S$ | Storage temperature | −55 | +150 | °C. |

Table A.5.10 sets forth maximum ratings for the illustrative embodiment only. For this particular embodiment stresses below those listed in this table should be used to ensure reliability of operation.

TABLE A.5.11

DC Operating conditions

| Symbol | Parameter | Min. | Max. | Units |
|---|---|---|---|---|
| $V_{DD}$ | Supply voltage relative to GND | 4.75 | 5.25 | V |
| GND | Ground | 0 | 0 | V |
| $V_{IH}$ | Input logic "1" voltage | 2.0 | $V_{DD-0.5}$ | V |
| $V_{IL}$ | Input logic "0" voltage | GND−0.5 | 0.8 | V |
| $T_A$ | Operating temperature | 0 | 70 | °C.[a] |

[a]With TBA linear ft/min transverse airflow

TABLE A.5.12

DC Electrical characteristics

| Symbol | Parameter | Min. | Max. | Units |
|---|---|---|---|---|
| $V_{OL}$ | Output logic "0" voltage | | 0.4 | V[a] |
| $V_{OH}$ | Output logic "1" voltage | 2.8 | | V |
| $I_O$ | Output current | ±100 | | μA[b] |
| $I_{OZ}$ | Output off state leakage current | ±20 | | μA |
| $I_{IZ}$ | Input leakage current | ±10 | | μA |
| $I_{DD}$ | RMS power supply current | | 500 | mA |
| $C_{IN}$ | Input capacitance | | 5 | pF |
| $C_{OUT}$ | Output/IO capacitance | | 5 | pF |

[a]AC parameters are specified using $V_{OLmax} = 0.8$ V as the measurement level.
[b]This is the steady state drive capability of the interface.
Transient currents may be much greater.

A.5.14.1 AC Characteristics

TABLE A.5.13

Differences from nominal values for a strobe

| Num. | Parameter | Min. | Max. | Unit | Note[a] |
|---|---|---|---|---|---|
| 10 | Cycle time | −2 | +2 | ns | |
| 11 | Cycle time | −2 | +2 | ns | |
| 12 | High pulse | −5 | +2 | ns | |
| 13 | Low pulse | −11 | +2 | ns | |
| 14 | Cycle time | −8 | +2 | ns | |

[a]As will be appreciated by one of ordinary skill in the art, the driver strength of the signal must be configured appropriately for its load.

TABLE A.5.14

Differences from nominal values between two strobes

| Num. | Parameter | Min. | Max. | Unit | Note[a] |
|---|---|---|---|---|---|
| 15 | Strobe to strobe delay | −3 | +3 | ns | |
| 16 | Low hold time | −13 | +3 | ns | |
| 17 | Strobe to strobe precharge e.g. tCRP, | −9 | +3 | ns | |

TABLE A.5.14-continued

| Differences from nominal values between two strobes | | | | | |
|---|---|---|---|---|---|
| Num. | Parameter | Min. | Max. | Unit | Note[a] |
| | tRCS, tRCH, tRRH, tRPC CAS precharge pulsse between any two CAS Signals on wide DRAMs e.g. tCP, or between RAS rising and CAS falling e.g. tRPC | −5 | +2 | ns | |
| 18 | Precharge before disable | −12 | +3 | ns | |

[a]The driver strength of the two signals must be configured appropriately ffor their loads.

TABLE A.5.15

| Differences from nominal between a bus and a strobe | | | | | |
|---|---|---|---|---|---|
| Num. | Parameter | Min. | Max. | Unit | Note[a] |
| 19 | Set up time | −12 | +3 | ns | |
| 20 | Hold time | −12 | +3 | ns | |
| 21 | Address access time | −12 | +3 | ns | |
| 22 | Next valid after strobe | −12 | +3 | ns | |

[a]The driver strength of the bus and the strobe must be configured appropriateiy for their loads.

TABLE A.5.16

| Differences from nominal between a bus and a strobe | | | | | |
|---|---|---|---|---|---|
| Num. | Parameter | Min. | Max. | Unit | Note |
| 23 | Read data set-up time before $\overline{CAS}$ signal starts to rise | 0 | | ns | |
| 24 | Read data hold time after CAS signal starts to go high | 0 | | ns | |

When reading from DRAM, the DRAM interface samples DRAM_data [31:0] as the CAS signals rise.

TABLE A.5.17

Cross-reference between "standard" DRAM parameter names and timing parameter numbers

| parameter name | parameter number |
|---|---|
| lPC | 10 |
| tRC | 11 |
| tRP | 12 |
| tCP | |
| tCPN | |
| tRAS | 13 |
| tCAS | |
| tCAC | |
| tWP | |
| tRASP | |
| tRASC | |
| tACP/tCPA | 14 |
| tRCD | 15 |
| tCSR | |
| tRSH | 16 |
| tCSH | |
| tRWL | |
| tCWL | |
| tRAC | |
| tOAC/tOE | |
| tCHR | |
| tCRP | 17 |

TABLE A.5.17-continued

Cross-reference between "standard" DRAM parameter names and timing parameter numbers

| parameter name | parameter number |
|---|---|
| tRCS | |
| tRCH | |
| tRRH | |
| tRPC | |
| tCP | |
| tRPC | |
| tRHCP | 18 |
| tCPRH | 19 |
| tASC | |
| tDS | |
| tRAH | 20 |
| tAA | 21 |
| tRAL | |
| tRAD | 22 |

SECTION A.6 Microprocessor Interface (MPI)

A standard byte wide microprocessor interface (MPI) is used on all chips in the video decoder chip-set. However, one of ordinary skill in the art will appreciate that microprocessor interfaces of other widths may also be used. The MPI operates synchronously to various decoder chip clocks.

A.6.1 MPI Signals

TABLE A.6.1

| MPI interface signals | | |
|---|---|---|
| Signal Name | Input/ Output | Description |
| enable[1:0] | Input | Two active low chip enables. Both must be low to enable accesses via the MPI |
| rw | Input | High indicates that a device wishes to read values from the video chip. This signal should be stable while the chip is enabled. |
| addr[n:0] | Input | Access specifies one of 2 locations in the chip's memory map. This signal should be stable while the chip is enabled. |
| data[7:0] | Output | B bit wide data I/O port. These pins are high impedance if either enable signal is high |
| irq | Output | An actve low, open collector interrupt request signal. |

A.6.2 MPI Electrical Specifications

TABLE A.6.2

| Absolute Maximum Ratings[a] | | | | |
|---|---|---|---|---|
| Symbol | Parameter | Min. | Max. | Units |
| $V_{DD}$ | Supply voltage relative to GND | −0.5 | 6.5 | V |
| $V_{IN}$ | Input voltage on any pin | GND-0.5 | $V_{DD}$ + 0.5 | V |
| $T_A$ | Operating temperature | −40 | +85 | °C. |
| $T_S$ | Storage temperatature | −55 | +150 | °C. |

TABLE A.6.3

DC Operating conditions

| Symbol | Parameter | Min. | Max. | Units |
|---|---|---|---|---|
| $V_{DD}$ | Supply voltage relative to GND | 4.75 | 5.25 | V |
| GND | Ground | 0 | 0 | V |
| $V_{IH}$ | Input logic "1" voltage | 2.0 | $V_{DD}$-0.5 | V[a] |
| $V_{IL}$ | Input logic "0" voltage | GND-0.5 | 0.8 | $V_{[a]}$ |
| $T_A$ | Operating temperature | 0 | 70 | °C.[b] |

[a]AC input parameters are measured at a 1.4 V measurement level.
[b]With TBA linear ft/min transverse airflow.

TABLE A.6.4

DC Electrical characteristics

| Symbol | Parameter | Min. | Max. | Units |
|---|---|---|---|---|
| $V_{OL}$ | Output logic "0" voltage | | 0.4 | V |
| $V_{OLDC}$ | Open collector output logic "0" voltage | | 0.4 | V[a] |
| $V_{OH}$ | Outpout logic "1" voltage | 2.4 | | V |
| $I_O$ | Output current | ± 100 | | μA[b] |
| $I_{OC}$ | Open collector output current | 4.0 | 8.0 | mA[c] |
| $I_{OZ}$ | Output off state leakage current | | ±20 | μA |
| $I_{IN}$ | Input leakage current | | ±10 | μA |
| $I_{DD}$ | RMS power supply current | | 500 | mA |
| $C_{IN}$ | input capacitance | | 5 | pF |
| $C_{OUT}$ | Output/IO capacitance | | 5 | pF |

[a]$I_O \leqq I_{OOC\ min}$
[b]This is the steady state drive capability of the interface. Transient currents may be much greater.
[c]When asserted the open collector irq output pulls down with an impedance of 100Ω or less.

A.6.2.1 AC Characteristics

TABLE A.6.5

Microprocessor interface read timing

| Num. | Characteristic | Min. | Max | Unit | Notes [a] |
|---|---|---|---|---|---|
| 25 | Enable low period | 100 | | ns | |
| 26 | Enable high period | 50 | | ns | |
| 27 | Address or $\overline{rw}$ set-up to chip enable | 0 | | ns | |
| 28 | Address or $\overline{rw}$hold from chip disable | 0 | | ns | |
| 29 | Output turn-on time | 20 | | ns | |
| 30 | access time | | 70 | ns | b |
| 31 | Read data hold time | 5 | | ns | |
| 32 | Read data turn-off time | | 20 | | |

[a]The choice, in this example, of enable[0] to start the cycle and enable[1] to end it is arbitrary. These signal are of equal status.
[b]The access time is specified for a maximum load of 50 $_p$F on each of the data[7.0]. Larger loads may increase the access time.

TABLE A.6.6

Microprocessor interface write timing

| Num. | Characteristic | Min. | Max | Unit | Notes |
|---|---|---|---|---|---|
| 33 | Write data set-up time | 15 | | ns | a |
| 34 | Write dat hold time | 0 | | ns | |

[a]The choice, in this example, of enable[0] to starte the cycle and enable[1] to end it is arbitrary. These signal are of equal status.

A.6.3 Interrupts

In accordance with the present invention, "event" is the term used to describe an on-chip condition that a user might want to observe. An event can indicate an error or it can be informative to the user's software.

There are two single bit registers associated with each interrupt or "event". These are the condition event register and the condition mask register.

A.6.3.1 Condition Event Register

The condition event register is a one bit read/write register whose value is set to one by a condition occurring within the circuit. The register is set to one even if the condition was merely transient and has now gone away. The register is then guaranteed to remain set to one until the user's software resets it (or the entire chip is reset).

The register is set to zero by writing the value one

Writing zero to the register leaves the register unaltered.

The register must be set to zero by user software before another occurrence of this condition can be observed.

The register will be reset to zero on reset.

A.6.3.2 Condition Mask Register

The condition mask register is one bit read/write register which enables the generation of an interrupt request if the corresponding condition event register(s) is(are) set. If the condition event is already set when 1 is written to the condition mask register, an interrupt request will be issued immediately.

The value 1 enables interrupts.

The register clears to zero on reset.

Unless stated otherwise a block will stop operation after generating an interrupt request and will re-start operation after either the condition event or the condition mask register is cleared.

A.6.3.3 Event and Mask Bits

Event bits and mask bits are always grouped into corresponding bit positions in consecutive bytes in the memory map (see Table A.9.6 and Table A.17.6). This allows interrupt service software to use the value read from the mask registers as a mask for the value in the event registers to identify which event generated the interrupt.

A.6.3.4 The Chip Event and Mask

Each chip has a single "global" event bit that summarizes the event activity on the chip. The chip event register presents the OR of all the on-chip events that have 1 in their mask bit.

A 1 in the chip mask bit allows the chip to generate interrupts. A 0 in the chip mask bit prevents any on-chip events from generating interrupt requests.

Writing 1 to 0 to the chip event has no effect. It will only clear when all the events (enabled by a 1 in their mask bit) have been cleared.

A.6.3.5 The irq Signal

The $\overline{irq}$ signal is asserted if both the chip event bit and the chip event mask are set.

The $\overline{irq}$ signal is an active low, "open collector" output which requires an off-chip pull-up resistor. When active the $\overline{irq}$ output is pulled down by an impedance of 100Ω or less.

I will be appreciated that pull-up resistor of approximately 4kΩ should be suitable for most applications.

A.6.4 Accessing Registers

A.6.4.1 Stopping Circuits to Enable Access

In the present invention, most registers can only modified if the block with which they are associated is stopped. Therefore, groups of registers will normally be associated with an access register.

The value 0 in an access register indicates that the group of registers associated with that access register should not be modified. Writing 1 to an access register requests that a block be stopped. However, the block may not stop immediately and block's access register will hold the value 0 until it is stopped.

Accordingly, user software should wait (after writing 1 to request access) until 1 is read from the access register. If the user writes a value to a configuration register while its access register is set to 0, the results are undefined.

A.6.4.2 Registers Holding Integers

The least significant bit of any byte in the memory map is that associated with the signal data[0].

Registers that hold integers values greater than 8 bits are split over either 2 or 4 consecutive byte locations in the memory map. The byte ordering is "big endian" as shown in FIG. 55. However, no assumptions are made about the order in which bytes are written into multi-byte registers.

Unused bits in the memory map will return a 0 when read except for unused bits in registers holding signed integers. In this case, the most significant bit of the register will be sign extended. For example, a 12 bit signed register will be sign extended to fill a 16 bit memory map location (two bytes). A 16 bit memory map location holding a 12 bit unsigned integer will return a 0 from its most significant bits.

A.6.4.3 Keyholed Address Locations

In the present invention, certain less frequently accessed memory map locations have been placed behind "keyholes". A "keyhole" has two registers associated with it, a keyhole address register and a keyhole data register.

The keyhole address specifies a location within an extended address space. A read or a write operation to the keyhole data register accesses the location specified by the keyhole address register.

After accessing a keyhole data register the associated keyhole address register increments. Random access within the extended address space is only possible by writing a new value to the keyhole address register for each access.

A chip in accordance with the present invention, may have more than one "keyholed" memory map. There is no interaction between the different keyholes.

A.6.5 Special Registers

A.6.5.1 Unused Registers

Registers or bits described as "not used" are locations in the memory map that have not been used in the current implementation of the device. In general, the value 0 can be read from these locations. Writing 0 to these locations will have no effect.

As will be appreciated by one of ordinary skill in the art, in order to maintain compatibility with future variants of these products, it is recommended that the user's software should not depend upon values read from the unused locations. Similarly, when configuring the device, these locations should either be avoided or set to the value 0.

A.6.5.2 Reserved Registers

Similarly, registers or bits described as "reserved" in the present invention have un-documented effects on the behavior of the device and should not be accessed.

A.6.5.3 Test Registers

Furthermore, registers or bits described as "test registers" control various aspects of the device's testability. Therefore, these registers have no application in the normal use of the devices and need not be accessed by normal device configuration and control software.

SECTION A.7 Clocks

In accordance with the present inventions, many different clocks can be identified in the video decoder system. Examples of clocks are illustrated in FIG. 56.

As data passes between different clock regimes within the video decoder chip-set, it is resynchronized (on-chip) to each new clock. In the present invention, the maximum frequency of any input clock is 30 MHz. However, one of ordinary skill in the art will appreciate that other frequencies, including those greater than 30 MHz, may also be used. On each chip, the microprocessor interface (MPI) operates asynchronously to the chip clocks. In addition, the Image Formatter can generate a low frequency audio clock which is synchronous to the decoded video's picture rate. Accordingly, this clock can be used to provide audio/video synchronization.

A.7.1 Spatial Decoder Clock Signals

The Spatial Decoder has two different (and potentially asynchronous) clock inputs:

TABLE A.7.1

| Spatial Decoder clocks | | |
|---|---|---|
| Signal Name | Input/ Output | Description |
| coded_clock | Input | This clock controls data transfer in to the coded data port of the Spatial Decoder. On-chip this clock controls the processing of the coded data until it reaches the coded data buffer. |
| decoder_clock | Input | The decoder clock controls the majority of the processing functions or the Spatial Decoder. The decoder clock also controls the transfer of data out of the Spatial Decoder through its output port. |

A.7.2 Temporal Decoder Clock Signals

The Temporal Decoder has only one clock input:

TABLE A.7.2

| Temporal Decoder clocks | | |
|---|---|---|
| Signal Name | Input/ Output | Description |
| decoder_clock | Input | The decoder clock controls all of the processing functions on the Temporal Decoder. The decoder clock also controls transfer of data in to the Temporal Decoder through its input port and out via its output port. |

A.7.3 Electrical Specifications

TABLE A.7.3

| Input clock requirements | | | | | |
|---|---|---|---|---|---|
| | | 30 MHz | | | |
| Num. | Characteristic | Min. | Max. | Unit | Note |
| 35 | Clock period | 33 | | ns | |
| 36 | Clock high period | 13 | | ns | |
| 37 | Clock low period | 13 | | ns | |

TABLE A.7.4

| Clock input conditions | | | | |
|---|---|---|---|---|
| Symbol | Parameter | Min. | Max. | Units |
| $V_{IH}$ | Input logic '1' voltage | 3.68 | $V_{DD}$ + 0.5 | V |
| $V_{IL}$ | Input logic '0' voltage | GND − 0.5 | 1.43 | V |
| $I_{OZ}$ | Input leakage current | | ±10 | μA |

A.7.3.1 CMOS Levels

The clock input signals are CMOS inputs. $V_{IHmin}$ is approx. 70% of $V_{DD}$ and $V_{ILmax}$ is approx. 30% Of $V_{DD}$. The values shown in Table A.7.4 are those for $V_{IH}$ and $V_{IL}$ at their respective worst case $V_{DD}$. $V_{DD}$=5.0±0.25V.

A.7.3.2 Stability of Clocks

In the present invention, clocks used to drive the DRAM interface and the chip-to-chip interfaces are derived from the input clock signals. The timing specifications for these interfaces assume that the input clock timing is stable to within ±100 ps.

SECTION A.8 JTAG

As circuit boards become more densely populated, it is increasingly difficult to verify the connections between components by traditional means, such as in-circuit testing using a bed-of-nails approach. In an attempt to resolve the access problem and standardize on a methodology, the Joint Test Action Group (JTAG) was formed. The work of this group culminated in the "Standard Test Access Port and Boundary Scan Architecture", now adopted by the IEEE as standard 1149.1. The Spatial Decoder and Temporal Decoder comply with this standard.

The standard utilizes a boundary scan chain which serially connects each digital signal pin on the device. The test circuitry is transparent in normal operation, but in test mode the boundary scan chain allows test patterns to be shifted in, and applied to the pins of the device. The resultant signals appearing on the circuit board at the inputs to the JTAG device, may be scanned out and checked by relatively simple test equipment. By this means, the inter-component connections can be tested, as can areas of logic on the circuit board.

All JTAG operations are performed via the Test Access Port (TAP), which consists of five pins. The $\overline{trst}$ (Test Reset) pin resets the JTAG circuitry, to ensure that the device doesn't power-up in test mode. The tck (Test Clock) pin is used to clock serial test patterns into the tdi (Test Data Input) pin, and out of the tdo (Test Data Output) pin. Lastly, the operational mode of the JTAG circuitry is set by clocking the appropriate sequence of bits into the tms (Test Mode Select) pin.

The JTAG standard is extensible to provide for additional features at the discretion of the chip manufacturer. On the Spatial Decoder and Temporal Decoder, there are 9 user instructions, including three JTAG mandatory instructions. The extra instructions allow a degree of internal device testing to be performed, and provide additional external test flexibility. For example, all device outputs may be made to float by a simple JTAG sequence.

For full details of the facilities available and instructions on how to use the JTAG port, refer to the following JTAG Applications Notes.

A.8.1 Connection of JTAG Pins in Non-JTAG Systems

TABLE A.8.1

How to connect JTAG inputs

| Signal | Direction | Description |
|---|---|---|
| $\overline{trst}$ | Input | This pin has an internal pull-up, but must be taken low at power-up even if the JTAG features are not being used. This may be achieved by connecting $\overline{trst}$ in common with the chip reset pin reset. |
| tdi<br>tms | Input | These pins have internal pull-ups, and may be left disconnected if the JTAG circuitry is not being used. |
| tck | Input | This pin does not have a pull-up, and should be tied to ground if the JTAG circuitry is not used. |
| tdo | Output | High impedance except during JTAG scan operations. If JTAG is not being used, this pin may be left disconnected. |

A.8.2 Level of Conformance to IEEE 1149.1

A.8.2.1 Rules

All rules are adhered to, although the following should be noted:

TABLE A.8.2

JTAG Rules

| Rules | Description |
|---|---|
| 3.1.1(b) | The $\overline{trst}$ pin is provided. |
| 3.5.1(b) | Guaranteed for all public instructions (see IEEE 1149.1 5.2.1(c)). |
| 5.2.1(c) | Guaranteed for all public instructions. For some private instructions, the TDO pin may be active during any of the states Capture-DR, Exit 1-DR, Exit-2-DR & Pause-DR. |
| 5.3.1(a) | Power on-reset is achieved by use of the $\overline{trst}$ pin. |
| 6.2.1(e,f) | A code for the BYPASS instruction is loaded in the Test-Logic-Reset state. |
| 7.1.1(d) | Un-allocated instruction codes are equivalent to BYPASS. |
| 7.2.1(c) | There is no device ID register. |
| 7.8.1(b) | Single-step operation requires external control of the system clock. |
| 7.9.1(. . .) | There is no RUNBIST facility. |
| 7.11.1(. . .) | There is no IDCODE instruction. |
| 7.12.1(. . .) | There is no USERCODE instruction. |
| 8.1.1(b) | There is no device identification register. |
| 8.2.1(c) | Guaranteed for all public instructions. The apparent length of the path from tdi to tdo may change under certain circumstances while private instruction codes are loaded. |
| 8.3.1(d–i) | Guaranteed for all public instructions. Data may be loaded at times other than on the rising edge of tck while private instructions codes are loaded. |
| 10.4.1(e) | During INTEST, the system clock pin must be controlled externally. |
| 10.6.1(c) | During INTEST, output pins are controlled by data shifted in via tdl. |

A.8.2.2 Recommendations

TABLE A.8.3

Recommendations met

| Recommendation | Description |
|---|---|
| 3.2.1(b) | tek is a high-impedance CMOS input. |
| 3.3.1(c) | tms has a high impedance pull-up. |
| 3.6.1(d) | (Applies to use of chip). |
| 3.7.1(a) | (Applies to use of chip). |
| 6.1.1(e) | The SAMPLE/PRELOAD instruction code is loaded during Capture-IR. |
| 7.2.1(f) | The INTEST instruction is supported. |
| 7.7.1(g) | Zeros are loaded at system output pins during EXTEST. |
| 7.7.2(h) | All system outputs may be set high-impedance. |
| 7.8.1(f) | Zeros are loaded at system input pins during INTEST. |
| 8.1.1(d,e) | Design-specific test data registers are not publicly accessible. |

TABLE A.8.4

Recommendations not implemented

| Recommendation | Description |
|---|---|
| 10.4.1(f) | During EXTEST, the signal driven into the on-chip logic from the system clock pin is that supplied externally. |

A.8.2.3 Permissions

TABLE A.8.5

| Permissions met | |
|---|---|
| Permissions | Description |
| 3.2.1(c) | Guaranteed for all public instructions. |
| 6.1.1(f) | The instruction register is not used to capture design-specific information. |
| 7.2.1(g) | Several additional public instructions are provided. |
| 7.3.1(a) | Several private instruction codes are allocated. |
| 7.3.1(c) | (Rule?) Such instructions codes are documented. |
| 7.4.1(f) | Additional codes perform identically to BYPASS. |
| 10.1.1(i) | Each output pin has its own 3-state control. |
| 10.3.1(h) | A parallel latch is provided. |
| 10.3.1(i,j) | During EXTEST, input pins are controlled by data shifted in via tdl. |
| 10.6.1(d,e) | 3-state cells are not forced inactive in the Test-Logic-Reset state. |

SECTION A.9 Spatial Decoder

30 $MH_z$ operation
Decodes MPEG, JPEG & H.261
Coded data rates to 25 Mb/s
Video data rates to 21 MB/s
Flexible chroma sampling formats
Full JPEG baseline decoding
Glue-less DRAM interface
Single +5V supply
208 pin PQFP package
Max. power dissipation 2.5 W
Independent coded data and decoder clocks
Uses standard page mode DRAM The Spatial Decoder is a configurable VLSI decoder chip for use in a variety of JPEG, MPEG and H.261 picture and video decoding applications.

In a minimum configuration, with no off-chip DRAM, the Spatial Decoder is a single chip, high speed JPEG decoder. Adding DRAM allows the Spatial Decoder to decode JPEG encoded video pictures. 720×480, 30 Hz, 4:2:2 "JPEG video" can be decoded in real-time.

With the Temporal Decoder Temporal Decoder the Spatial Decoder can be used to decode H.261 and MPEG (as well as JPEG). 704×480, 30 Hz, 4:2:0 MPEG video can be decoded.

Again, the above values are merely illustrative, by way of example and not necessarily by way of limitation, of typical values for one embodiment in accordance with the present invention. Accordingly, those of ordinary skill in the art will appreciate that other values and/or ranges may be used.

A.9.1 Spatial Decoder Signals

TABLE A.9.1

Spatial Decoder Signals

| Signal Name | I/O | Pin Number | Description |
|---|---|---|---|
| coded_clock | I | 182 | Coded Data Port Used to supply |
| coded_data[7:0] | I | 172, 171, 169, 168, 167, 166, 164, 163 | coded data or Tokens to the Spatial Decoder. |
| coded_extn | I | 174 | See sections A.10.1 and |
| coded_valid | I | 162 | A.4.1 |
| coded_accept | O | 161 | |
| byte_mode | I | 176 | |
| enable[1:0] | I | 126, 127 | Micro Processor Interface (MPI). |
| rw | I | 125 | See section A.6.1 |
| addr[6:0] | I | 136, 135, 133, 132, 131, 130, 128 | |
| data[7:0] | O | 152, 151, 149, 147, 145, 143, 141, 140 | |
| irq | O | 154 | |
| DRAM_data[31:0] | I/O | 15, 17, 19, 20, 22, 25, 27, 30, 31, 33, 35, 38, 39, 42, 44, 47, 49, 57, 59, 61, 63, 66, 68, 70, 72, 74, 76, 79, 81, 83, 84, 85 | DRAM interface See section A.5.2 |
| DRAM_addr[10:0] | O | 184, 186, 188, 189, 192, 193, 195, 197, 199, 200, 203 | |
| RAS | O | 11 | |
| CAS[3:0] | O | 2, 4, 6, 8 | |
| WE | O | 12 | |
| OE | O | 204 | |
| DRAM_enable | I | 112 | |
| out___data[8:0] | O | 88, 89, 90, 92, 93, 94, 95, 97, 98 | Output Port. |
| out_extn | O | 87 | See section A.4.1 |
| out_valid | O | 99 | |
| out_accept | I | 100 | |
| tck | I | 115 | JTAG port. |
| tdi | I | 116 | See section A.8 |
| tdo | O | 120 | |
| tms | I | 117 | |
| trst | I | 121 | |
| decoder_clock | I | 177 | The main decoder clock. See section A.7 |
| reset | I | 160 | Reset |

TABLE A.9.2

Spatial Decoder Test signals

| Signal Name | I/O | Pin Num. | Description |
|---|---|---|---|
| tph0ish | I | 122 | If override = 1 than tph0ish and tph1ish are |
| tph1ish | I | 123 | inputs for the on-chip two phase clock. |
| override | I | 110 | For normal operation set override = 0. tph0ish and tph1ish are ignored (so connect to GND or $V_{DD}$). |
| chiptest | I | 111 | Set chiptest = 0 for normal operation. |
| tloop | I | 114 | Connect to GND or $V_{DD}$ during normal operation. |
| ramtest | I | 109 | if ramtest = 1 test of the on-chip RAMS is enabled. Set ramtest = 0 for normal operation. |
| pliselect | I | 178 | If pliselect = 0 the on-chip phase locked loops are disabled. Set pliselect = 1 for noraml operation. |
| ti | I | 180 | Two clocks required by the DRAM interface |
| tq | I | 179 | during test operation. Connect to GND or $V_{DD}$ during normal operation. |
| pdout | O | 207 | These two pins are connections for an |
| pdin | I | 206 | external filter for the phase lock loop. |

TABLE A.9.3

Spatial Decoder Pin Assignments

| Signal Name | Pin | Signal Name | Pin | Signal Name | Pin | Signal Name | Pin |
|---|---|---|---|---|---|---|---|
| nc | 208 | nc | 156 | nc | 104 | nc | 52 |
| test pin | 207 | nc | 155 | nc | 103 | nc | 51 |
| test pin | 206 | irq | 154 | nc | 102 | nc | 50 |
| GND | 205 | nc | 153 | VDD | 101 | DRAM_data[15] | 49 |
| OE | 204 | data[7] | 152 | out_accept | 100 | nc | 48 |
| DRAM_addr[0] | 203 | data[6] | 151 | out_valid | 99 | DRAM_data[16] | 47 |
| VDD | 202 | nc | 150 | out_data[0] | 98 | nc | 46 |
| nc | 201 | data[5] | 149 | out_data[1] | 97 | GND | 45 |
| DRAM_addr[1] | 200 | nc | 148 | GND | 96 | DRAM_data[17] | 44 |
| DRAM_addr[2] | 199 | data[4] | 147 | out_data[2] | 95 | nc | 43 |
| GND | 198 | GND | 146 | out_data[3] | 94 | DRAM_data[18] | 42 |
| DRAM_addr[3] | 197 | data[3] | 145 | out_data[4] | 93 | VDD | 41 |
| nc | 196 | nc | 144 | out_data[5] | 92 | nc | 40 |
| DRAM_addr[4] | 195 | data[2] | 143 | VDD | 91 | DRAM_data[19] | 39 |
| VDD | 194 | nc | 142 | out_data[6] | 90 | DRAM_data[20] | 38 |
| DRAM_addr[5] | 193 | data[1] | 141 | out_data[7] | 89 | nc | 37 |
| DRAM_addr[6] | 192 | data[0] | 140 | out_data[8] | 88 | GND | 36 |
| nc | 191 | nc | 139 | out_extn | 87 | DRAM_data[21] | 35 |
| GND | 190 | VDD | 138 | GND | 86 | nc | 34 |
| DRAM_addr[7] | 189 | nc | 137 | DRAM_data[0] | 85 | DRAM_data[22] | 33 |
| DRAM_addr[8] | 188 | addr[6] | 136 | DRAM_data[1] | 84 | VDD | 32 |
| VDD | 187 | addr[5] | 135 | DRAM_data[2] | 83 | DRAM_data[23] | 31 |
| DRAM_addr[9] | 186 | GND | 134 | VDD | 82 | DRAM_data[24] | 30 |
| nc | 185 | addr[4] | 133 | DRAM_data[3] | 81 | nc | 29 |
| DRAM_addr[10] | 184 | addr[3] | 132 | nc | 80 | GND | 28 |
| GND | 183 | addr[2] | 131 | DRAM_data[4] | 79 | DRAM_data[25] | 27 |
| coded_clock | 182 | addr[1] | 130 | GND | 78 | nc | 26 |
| VDD | 181 | VDD | 129 | nc | 77 | DRAM_data[26] | 25 |
| test pin | 180 | addr[0] | 128 | DRAM_data[5] | 76 | nc | 24 |
| test pin | 179 | enable[0] | 127 | nc | 75 | VDD | 23 |
| test pin | 178 | enable[1] | 126 | DRAM_data[6] | 74 | DRAM_data[27] | 22 |
| decoder_clock | 177 | rw | 125 | VDD | 73 | nc | 21 |
| byte_mode | 176 | GND | 124 | DRAM_data[7] | 72 | DRAM_data[28] | 20 |
| GND | 175 | test pin | 123 | nc | 71 | DRAM_data[29] | 19 |
| coded_extn | 174 | test pin | 122 | DRAM_data[8] | 70 | GND | 18 |
| nc | 208 | nc | 156 | nc | 104 | nc | 52 |
| test pin | 207 | nc | 155 | nc | 103 | nc | 51 |
| test pin | 206 | irq | 154 | nc | 102 | nc | 50 |
| GND | 205 | nc | 153 | VDD | 101 | DRAM_data[15] | 49 |
| OE | 204 | data[7] | 152 | out_accept | 100 | nc | 48 |
| DRAM_addr[0] | 203 | data[6] | 151 | out_valid | 99 | DRAM_data[16] | 47 |
| VDD | 202 | nc | 150 | out_data[0] | 98 | nc | 46 |
| nc | 201 | data[5] | 149 | out_data[1] | 97 | GND | 45 |
| DRAM_addr[1] | 200 | nc | 148 | GND | 96 | DRAM_data[17] | 44 |

TABLE A.9.3-continued

Spatial Decoder Pin Assignments

| Signal Name | Pin | Signal Name | Pin | Signal Name | Pin | Signal Name | Pin |
|---|---|---|---|---|---|---|---|
| DRAM_addr[2] | 199 | data[4] | 147 | out_data[2] | 95 | nc | 43 |
| GND | 198 | GND | 146 | out_data[3] | 94 | DRAM_data[18] | 42 |
| DRAM_addr[3] | 197 | data[3] | 145 | out_data[4] | 93 | VDD | 41 |
| nc | 196 | nc | 144 | out_data[5] | 92 | nc | 40 |
| DRAM_addr[4] | 195 | data[2] | 143 | VDD | 91 | DRAM_data[19] | 39 |
| VDD | 194 | nc | 142 | out_data[6] | 90 | DRAM_data[20] | 38 |
| DRAM_addr[5] | 193 | data[1] | 141 | out_data[7] | 89 | nc | 37 |
| DRAM_addr[6] | 192 | data[0] | 140 | out_data[8] | 88 | GND | 36 |
| nc | 191 | nc | 139 | out_extn | 87 | DRAM_data[21] | 35 |
| GND | 190 | VDD | 138 | GND | 86 | nc | 34 |
| DRAM_addr[7] | 189 | nc | 137 | DRAM_data[0] | 85 | DRAM_data[22] | 33 |
| DRAM_addr[8] | 188 | addr[6] | 136 | DRAM_data[1] | 84 | VDD | 32 |
| VDD | 187 | addr[5] | 135 | DRAM_data[2] | 83 | DRAM_data[23] | 31 |
| DRAM_addr[9] | 186 | GND | 134 | VDD | 82 | DRAM_data[24] | 30 |
| nc | 185 | addr[4] | 133 | DRAM_data[3] | 81 | nc | 29 |
| DRAM_addr[10] | 184 | addr[3] | 132 | nc | 80 | GND | 28 |
| GND | 183 | addr[2] | 131 | DRAM_data[4] | 79 | DRAM_data[25] | 27 |
| coded_clock | 182 | addr[1] | 130 | GND | 78 | nc | 26 |
| VDD | 181 | VDD | 129 | nc | 77 | DRAM_data[26] | 25 |
| test pin | 180 | addr[0] | 128 | DRAM_data[5] | 76 | nc | 24 |
| test pin | 179 | enable[0] | 127 | nc | 75 | VDD | 23 |
| test pin | 178 | enable[1] | 126 | DRAM_data[6] | 74 | DRAM_data[27] | 22 |
| decoder_clock | 177 | rw | 125 | VDD | 73 | nc | 21 |
| byte_mode | 176 | GND | 124 | DRAM_data[7] | 72 | DRAM_data[28] | 20 |
| GND | 175 | test pin | 123 | nc | 71 | DRAM_data[29] | 19 |
| coded_extn | 174 | test pin | 122 | DRAM_data[8] | 70 | GND | 18 |
| nc | 173 | trst | 121 | GND | 69 | DRAM_data[30] | 17 |
| coded_data[7] | 172 | tdo | 120 | DRAM_data[9] | 68 | nc | 16 |
| coded_data[6] | 171 | nc | 119 | nc | 67 | DRAM_data[31] | 15 |
| VDD | 170 | VDD | 118 | DRAM_data[10] | 66 | VDD | 14 |
| coded_data[5] | 169 | tms | 117 | VDD | 65 | nc | 13 |
| coded_data[4] | 168 | tdl | 116 | nc | 64 | WE | 12 |
| coded_data[3] | 167 | tck | 115 | DRAM_data[11] | 63 | RAS | 11 |
| coded_data[2] | 166 | test pin | 114 | nc | 62 | nc | 10 |
| GND | 165 | GND | 113 | DRAM_data[12] | 61 | GND | 9 |
| coded_data[1] | 164 | DRAM_enable | 112 | GND | 60 | CAS[0] | 8 |
| coded_data[0] | 163 | test pin | 111 | DRAM_data[13] | 59 | nc | 7 |
| coded_valid | 162 | test pin | 110 | nc | 58 | CAS[1] | 6 |
| coded_accept | 161 | test pin | 109 | DRAM_data[14] | 57 | VDD | 5 |
| reset | 160 | nc | 108 | VDD | 56 | CAS[2] | 4 |
| VDD | 159 | nc | 107 | nc | 55 | nc | 3 |
| nc | 158 | nc | 106 | nc | 54 | CAS[3] | 2 |
| nc | 157 | nc | 105 | nc | 53 | nc | 1 |

A.9.1.1 "nc" No Connect Pins

The pins labeled nc in Table A.9.3 are not currently used these pins should be left unconnected.

A.9.1.2 $V_{DD}$ and GND pins

As will be appreciated by one of ordinary skill in the art, all the $V_{DD}$ and GND pins provided should be connected to the appropriate power supply. Correct device operation cannot be ensured unless all the $V_{DD}$ and GND pins are correctly used.

A.9.1.3 Test Pin Connections for Normal Operation

Nine pins on the Spatial Decoder are reserved for internal test use.

TABLE A.9.4

Default test pin connections

| Pin number | Connection |
|---|---|
| | Connect to GND for normal operation |
| | Connect to $V_{DD}$ for normal operation |
| | Leave Open Circuit for normal operation |

A.9.1.4 JTAG Pins for Normal Operation

See section A.8.1.

A.9.2 Spatial Decoder Memory Map

TABLE A.9.5

Overview of Spatial Decoder memory map

| Addr. (hex) | Register Name | See table |
|---|---|---|
| 0x00 ... 0x03 | Interrupt service area | A.9.6 |
| 0x04 ... 0x07 | Input circuit registers | A.9.7 |
| 0x08 ... 0x0F | Start code detector registers | |
| 0x10 ... 0x15 | Buffer start-up control registers | A.9.8 |
| 0x16 ... 0x17 | Not used | |
| 0x18 ... 0x23 | DRAM interface configuration registers | A.9.9 |
| 0x24 ... 0x26 | Buffer manager access and keyhole registers | A.9.10 |
| 0x27 | Not used | |
| 0x28 ... 0x2F | Huffman decoder registers | A.9.13 |
| 0x30 ... 0x39 | Inverse quantiser registers | A.9.14 |
| 0x3A ... 0x3B | Not used | |
| 0x3C | Reserved | |
| 0x30 ... 0x3F | Not used | |
| 0x40 ... 0x7F | Test registers | |

TABLE A.9.6

Interrupt service area registers

| Addr. (hex) | Bit num. | Register Name | Page references |
|---|---|---|---|
| 0x00 | 7 | chip_event CED_EVENT_0 | |
| | 6 | not used | |
| | 5 | Illegal_length_count_event SCD_ILLEGAL_LENGTH_COUNT | |
| | 4 | reserved may read 1 or 0 SCD_JPEG_OVERLAPPING_START | |
| | 3 | overlapping_start_event SCD_NON_JPEG_OVERLAPPING_START | |
| | 2 | unrecognised_start_event SCD_UNRECOGNISED_START | |
| | 1 | stop_after_picture_event SCD_STOP_AFTER_PICTURE | |
| | 0 | non_aligned_start_event SCD_NON_ALIGNED_START | |
| 0x01 | 7 | chip_mask CED_MASK_0 | |
| | 6 | not used | |
| | 5 | Illegal_length_count_mask | |
| | 4 | reserved write 0 to this location SCD_JPEG_OVERLAPPING_START | |
| | 3 | non_jeg_overlapping_start_mask | |
| | 2 | unrecognised_start_mask | |
| | 1 | stop_after_picture_mask | |
| | 0 | non_aligned_start_mask | |
| 0x02 | 7 | idct_too_few_event IDCT_DEFF_NUM | |
| | 6 | idct_too_many_event_IDCT_SUPER_NUM | |
| | 5 | accept_enable_event BS_STREAM_END_EVENT | |
| | 4 | target_met_event BS_TARGET_MET_EVENT | |
| | 3 | counter_flushed_too_early_event BS_FLUSH_BEFORE_TARGET_MET_EVENT | |
| | 2 | counter_flushed_event BS_FLUSH_EVENT | |
| | 1 | parser_event DEMUX_EVENT | |
| | 0 | huffman_event HUFFMAN_EVENT | |
| 0x03 | 7 | idct_too_few_mask | |
| | 6 | idct_too_many_mask | |
| | 5 | accept_enable_mask | |
| | 4 | target_met_mask | |
| | 3 | counter_flushed_too_early_mask | |
| | 2 | counter_flushed_mask | |
| | 1 | parser_mask | |
| | 0 | huffman_mask | |

TABLE A.9.7

Start code detector and input circuit registers

| Addr. (hex) | Bit num. | Register Name | Page references |
|---|---|---|---|
| 0x04 | 7 | coded_busy | |
| | 6 | enable_mpi_input | |
| | 5 | coded_extn | |
| | 4:0 | not used | |
| 0x05 | 7:0 | coded_data | |
| 0x06 | 7:0 | not used | |
| 0x07 | 7:0 | not used | |
| 0x08 | 7:1 | not used | |
| | 0 | start_code_detector_access also input_circuit_access CED_SCD_ACCESS | |
| 0x09 | 7:4 | not used CED_SCD_CONTROL | |
| | 3 | stop_after_picture | |
| | 2 | discard_extension_data | |
| | 1 | discard_user_data | |
| | 0 | ignore_non_aligned | |
| 0x0A | 7:5 | not used CED_SCD_STATUS | |
| | 4 | insert_sequence_start | |
| | 3 | discard_all_data | |
| | 2:0 | start_code_search | |

TABLE A.9.7-continued

Start code detector and input circuit registers

| Addr. (hex) | Bit num. | Register Name | Page references |
|---|---|---|---|
| 0x0B | 7:0 | Test register length_count | |
| 0x0C | 7:0 | | |
| 0x0D | 7:2 | not used | |
| | 1:0 | start_code_detector_coding_standard | |
| 0x0E | 7:0 | start_value | |
| 0x0F | 7:4 | not used | |
| | 3:0 | picture_number | |

TABLE A.9.8

Buffer start-up registers

| Addr. (hex) | Bit num. | Register Name | Page references |
|---|---|---|---|
| 0x10 | 7:1 | not used | |
| | 0 | startup_access CED_BS_ACCESS | |
| 0x11 | 7:3 | not used | |
| | 2:0 | bit_count_prescale CED_BS_PRESCALE | |
| 0x12 | 7:0 | bit_count_target CED_BS_TARGET | |
| 0x13 | 7:0 | bit_count CED_BS_COUNT | |
| 0x14 | 7:1 | not used | |
| | 0 | offchip_queue CED_BS_QUEUE | |
| 0x15 | 7:1 | not used | |
| | 0 | enable_stream CED_BS_ENABLE_NXT_STM | |

TABLE A.9.9

DRAM interface configuration registers

| Addr. (hex) | Bit num. | Register Name | Page references |
|---|---|---|---|
| 0x18 | 7:5 | not used | |
| | 4:0 | page_start_length CED_IT_PAGE_START_LENGTH | |
| 0x19 | 7:4 | not used | |
| | 3:0 | read_cycle_length | |
| 0x1A | 7:4 | not used | |
| | 3:0 | write_cycle_length | |
| 0x1B | 7:4 | not used | |
| | 3:0 | refresh_cycle_length | |
| 0x1C | 7:4 | not used | |
| | 3:0 | CAS_falling | |
| 0x1D | 7:4 | not used | |
| | 3:0 | RAS_falling | |
| 0x1E | 7:1 | not used | |
| | 0 | Interface_timing_access | |
| 0x1F | 7:0 | refresh_interval | |
| 0x20 | 7 | not used | |
| | 6:4 | DRAM_addr_strength[2:0] | |
| | 3:1 | CAS_strength[2:0] | |
| | 0 | RAS_strength[2] | |
| 0x21 | 7:6 | RAS_strength[1:0] | |
| | 5:3 | OEWE_strength[2:0] | |
| | 2:0 | DRAM_data_strength[2:0] | |
| 0x22 | 7 | ACCESS bit for pad strength etc. ?not used CED_DRAM_CONFIGURE | |
| | 6 | zero_buffers | |
| | 5 | DRAM_enable | |
| | 4 | no_refresh | |
| | 3:2 | row_address_bits[1:0] | |
| | 1:0 | DRAM_data_width[1:0] | |
| 0x23 | 7:0 | Test registers CED_PLL_RES_CONFIG | |

TABLE A.9.10

Buffer manager access and keyhole registers

| Addr. (hex) | Bit num. | Register Name | Page references |
|---|---|---|---|
| 0x24 | 7:1 | not used | |
| | 0 | buffer_manager_access | |
| 0x25 | 7:6 | not used | |
| | 5:0 | buffer_manager_keyhole_address | |
| 0x26 | 7:0 | buffer_manager_keyhole_data | |

TABLE A.9.11

Buffer manager extended address space

| Addr. (hex) | Bit num. | Register Name | Page references |
|---|---|---|---|
| 0x00 | 7:0 | not used | |
| 0x01 | 7:2 | | |
| | 1:0 | cdb_base | |
| 0x02 | 7:0 | | |
| 0x03 | 7:0 | | |
| 0x04 | 7:0 | not used | |
| 0x05 | 7:2 | | |
| | 1:0 | cdb_length | |
| 0x06 | 7:0 | | |
| 0x07 | 7:0 | | |
| 0x08 | 7:0 | not used | |
| 0x09 | 7:0 | cdb_read | |
| 0x0A | 7:0 | | |
| 0x0B | 7:0 | | |
| 0x0C | 7:0 | not used | |
| 0x0D | 7:0 | cdb_number | |
| 0x0E | 7:0 | | |
| 0x0F | 7:0 | | |
| 0x10 | 7:0 | not used | |
| 0x11 | 7:0 | tb_base | |
| 0x12 | 7:0 | | |
| 0x13 | 7:0 | | |
| 0x14 | 7:0 | not used | |
| 0x15 | 7:0 | tb_length | |
| 0x16 | 7:0 | | |
| 0x17 | 7:0 | | |
| 0x18 | 7:0 | not used | |
| 0x19 | 7:0 | tb_read | |
| 0x1A | 7:0 | | |
| 0x1B | 7:0 | | |
| 0x1C | 7:0 | not used | |
| 0x1D | 7:0 | tb_number | |
| 0x1E | 7:0 | | |
| 0x1F | 7:0 | | |
| 0x20 | 7:0 | not used | |
| 0x21 | 7:0 | buffer_limit | |
| 0x22 | 7:0 | | |
| 0x23 | 7:0 | | |
| 0x24 | 7:4 | not used | |
| | 3 | cdb_full | |
| | 2 | cdb_empty | |
| | 1 | tb_full | |
| | 0 | tb_empty | |

TABLE A.9.12

Video demux registers

| Addr. (hex) | Bit num. | Register Name | Page references |
|---|---|---|---|
| 0x28 | 7 | demux_access CED_H_CTRL[7] | |
| | 6:4 | huffman_error_code[2:0] CED_H_CTRL[6:4] | |
| | 3:0 | private huffman control bits [3] selects special CBP, [2] selects 4/8 bit fixed length CBP | |

TABLE A.9.12-continued

Video demux registers

| Addr. (hex) | Bit num. | Register Name | Page references |
|---|---|---|---|
| 0x29 | 7:0 | parser_error_code CED_H_DMUX_ERR | |
| 0x2A | 7:4 | not used | |
| | 3:0 | demux_keyhole_address | |
| 0x2B | 7:0 | CED_H_KEYHOLE_ADDR | |
| 0x2C | 7:0 | demux_keyhole_data CED_H_KEYHOLE | |
| 0x2D | 7 | dummy_last_picture CED_H_ALU_REG0, r_dummy_last_frame_bit | |
| | 6 | field_into CED_H_ALU_REG0, r_field_into_bit | |
| | 5:1 | not used | |
| | 0 | continue CED_H_ALU_REG0, r_continue_bit | |
| 0x2E | 7:0 | rom_revision CED_H_ALU_REG1 | |
| 0x2F | 7:0 | private register | |
| 0x2F | 7 | CED_H_TRACE_EVENT write 1 to single step. one will be read when the step has been completed | |
| | 6 | CED_H_TRACE MASK set to one to enter single step mode | |
| | 5 | CED_H_RST partial reset when sequenced 1,0 | |
| | 4:0 | not used | |

TABLE A.9.13

Video demux extended address space

| Addr. (hex) | Bit num. | Register Name | Page references |
|---|---|---|---|
| 0x00 | 7:0 | not used | |
| 0x0F | | | |
| 0x10 | 7:0 | horiz_pels r_horiz_pets | |
| 0x11 | 7:0 | | |
| 0x12 | 7:0 | vert_pets r_vert_pels | |
| 0x13 | 7:0 | | |
| 0x14 | 7:2 | not used | |
| | 1:0 | buffer_size r_buffer_size | |
| 0x15 | 7:0 | | |
| 0x16 | 7:4 | not used | |
| | 3:0 | pel_aspect r_pel _aspect | |
| 0x17 | 7:2 | not used | |
| | 1:0 | bit_rate r_bit_rate | |
| 0x18 | 7:0 | | |
| 0x19 | 7:0 | | |
| 0x1A | 7:4 | not used | |
| | 3:0 | pic_rate r_pic_rate | |
| 0x1B | 7:1 | not used | |
| | 0 | constrained r_constrained | |
| 0x1C | 7:0 | picture_type | |
| 0x1D | 7:0 | h261_pic_type | |
| 0x1E | 7:2 | not used | |
| | 1:0 | broken_closed | |
| 0x1F | 7:5 | not used | |
| | 4:0 | prediction_mode | |
| 0x20 | 7:0 | vbv_delay | |
| 0x21 | 7:0 | | |
| 0x22 | 7:0 | private register MPEG full_pel_fwd, JPEG pending_frame_change | |
| 0x23 | 7:0 | private register MPEG full_pel_bwd, JPEG restart_index | |
| 0x24 | 7:0 | private register horiz_mb_copy | |
| 0x25 | 7:0 | pic_number | |
| 0x26 | 7:1 | not used | |
| | 1:0 | max_h | |
| 0x27 | 7:1 | not used | |
| | 1:0 | max_v | |
| 0x28 | 7:0 | private register scratch1 | |
| 0x29 | 7:0 | private register scratch2 | |
| 0x2A | 7:0 | private register scratch3 | |
| 0x2B | 7:0 | Nf MPEG unused1, H261 ingob | |

TABLE A.9.13-continued

Video demux extended address space

| Addr. (hex) | Bit num. | Register Name | Page references |
|---|---|---|---|
| 0x2C | 7:0 | private register MPEG first_group, JPEG first_scan | |
| 0x2D | 7:0 | private register MPEG in_picture | |
| 0x2E | 7 | dummy_last_picture r_rom_control | |
| | 6 | field_info | |
| | 5:1 | not used | |
| | 0 | continue | |
| 0x2F | 7:0 | rom_revision | |
| 0x30 | 7:2 | not used | |
| | 1:0 | dc_huff_0 | |
| 0x31 | 7:2 | not used | |
| | 1:0 | dc_huff_1 | |
| 0x32 | 7:2 | not used | |
| | 1:0 | dc_huff_2 | |
| 0x33 | 7:2 | not used | |
| | 1:0 | dc_huff_3 | |
| 0x34 | 7:2 | not used | |
| | 1:0 | ac_huff_0 | |
| 0x35 | 7:2 | not used | |
| | 1:0 | ac_huff_1 | |
| 0x36 | 7:2 | not used | |
| | 1:0 | ac_huff_2 | |
| 0x37 | 7:2 | not used | |
| | 1:0 | ac_huff_3 | |
| 0x38 | 7:2 | not used | |
| | 1:0 | tq_0 r_tq_0 | |
| 0x39 | 7:2 | not used | |
| | 1:0 | tq_1 r_tq_1 | |
| 0x3A | 7:2 | not used | |
| | 1:0 | tq_2 r_tq_2 | |
| 0x3B | 7:2 | not used | |
| | 1:0 | tq_3 r_tq_3 | |
| 0x3C | 7:0 | component_name_0 r_c_0 | |
| 0x3D | 7:0 | component_name_1 r_c_1 | |
| 0x3E | 7:0 | component_name_2 r_c_2 | |
| 0x3F | 7:0 | component_name_3 r_c_3 | |
| 0x40 | 7:0 | private registers | |
| 0x63 | | | |
| 0x40 | 7:0 | r_dc_pred_0 | |
| 0x41 | 7:0 | | |
| 0x42 | 7:0 | r_dc_pred_1 | |
| 0x43 | 7:0 | | |
| 0x44 | 7:0 | r_dc_pred_2 | |
| 0x45 | 7:0 | | |
| 0x46 | 7:0 | r_dc_pred_3 | |
| 0x47 | 7:0 | | |
| 0x48 | 7:0 | not used | |
| 0x4F | | | |
| 0x50 | 7:0 | r_prev_mhf | |
| 0x51 | 7:0 | | |
| 0x52 | 7:0 | r_prev_mvf | |
| 0x53 | 7:0 | | |
| 0x54 | 7:0 | r_prev_mhb | |
| 0x55 | 7:0 | | |
| 0x56 | 7:0 | r_prev_mvb | |
| 0x57 | 7:0 | | |
| 0x58 | 7:0 | not used | |
| 0x5F | | | |
| 0x60 | 7:0 | r_horiz_mbcnt | |
| 0x61 | 7:0 | | |
| 0x62 | 7:0 | r_vert_mbcnt | |
| 0x63 | 7:0 | | |
| 0x64 | 7:0 | horiz_macroblocks r_horiz_mbs | |
| 0x65 | 7:0 | | |
| 0x66 | 7:0 | vert_macroblocks r_vert_mbs | |
| 0x67 | 7:0 | | |
| 0x68 | 7:0 | private register r_restart_cnt | |
| 0x69 | 7:0 | | |
| 0x6A | 7:0 | restart_interval r_restart_int | |
| 0x6B | 7:0 | | |
| 0x6C | 7:0 | private register r_blk_h_cnt | |
| 0x6D | 7:0 | private register r_blk_v_cnt | |
| 0x6E | 7:0 | private register r_compid | |
| 0x6F | 7:0 | max_component_id r_max_compid | |

TABLE A.9.13-continued

Video demux extended address space

| Addr. (hex) | Bit num. | Register Name | Page references |
|---|---|---|---|
| 0x70 | 7:0 | coding_standard r_coding_std | |
| 0x71 | 7:0 | private register r_pattern | |
| 0x72 | 7:0 | private register r_fwd_r_size | |
| 0x73 | 7:0 | private register r_bwd_r_size | |
| 0x74 | 7:0 | not used | |
| 0x77 | | | |
| 0x78 | 7:2 | not used | |
| | 1:0 | blocks_h_0 r_blk_h_0 | |
| 0x79 | 7:2 | not used | |
| | 1:0 | blocks_h_1 r_blk_h_1 | |
| 0x7A | 7:2 | not used | |
| | 1:0 | blocks_h_2 r_blk_h_2 | |
| 0x7B | 7:2 | not used | |
| | 1:0 | blocks_h_3 r_blk_h_3 | |
| 0x7C | 7:2 | not used | |
| | 1:0 | blocks_v_0 r_blk_v_0 | |
| 0x7D | 7:2 | not used | |
| | 1:0 | blocks_v_1 r_blk_v_1 | |
| 0x7E | 7:2 | not used | |
| | 1:0 | blocks_v_2 r_blk_v_2 | |
| 0x7F | 7:2 | not used | |
| | 1:0 | blocks_v_3 r_blk_v_3 | |
| 0x7F | 7:0 | not used | |
| 0xFF | | | |
| 0x100 | 7:0 | dc_bits_0[15:0] CED_H_KEY_DC_CPB0 | |
| 0x10F | | | |
| 0x110 | 7:0 | dc_bits_1[15:0] CED_H_KEY_DC_CPB1 | |
| 0x11F | | | |
| 0X120 | 7:0 | not used | |
| 0x13F | | | |
| 0x140 | 7:0 | ac_bits_0[15:0] CED_H_KEY_AC_CPB0 | |
| 0x14F | | | |
| 0x150 | 7:0 | ac_bits_1[15:0] CED_H_KEY_AC_CPB1 | |
| 0x15F | | | |
| 0x160 | 7:0 | not used | |
| 0x17F | | | |
| 0x180 | 7:0 | dc_zssss_0 CED_H_KEY_ZSSSS_INDEX0 | |
| 0x181 | 7:0 | dc_zssss_1 CED_H_KEY_ZSSSS_INDEX1 | |
| 0x182 | 7:0 | not used | |
| 0x187 | | | |
| 0x188 | 7:0 | ac_eob_0 CED_H_KEY_EOB_INDEX0 | |
| 0x189 | 7:0 | ac_eob_1 CED_H_KEY_EOB_INDEX1 | |
| 0x18A | 7:0 | not used | |
| 0x18B | | | |
| 0x18C | 7:0 | ac_zrl_0 CED_H_KEY_ZRL_INDEX0 | |
| 0x18D | 7:0 | ac_zrl_1 CED_H_KEY_ZRL_INDEX1 | |
| 0x18E | 7:0 | not used | |
| 0x1FF | | | |
| 0x200 | 7:0 | ac_huffval_0[161:0] CED_H_KEY_AC_ITOD_0 | |
| 0x2AF | | | |
| 0x2B0 | 7:0 | dc_huffval_0[11:0] CED_H_KEY_DC_ITOD_0 | |
| 0x2BF | | | |
| 0x2C0 | 7:0 | not used | |
| 0x2FF | | | |
| 0x300 | 7:0 | ac_huffval_1[161:0] CED_H_KEY_AC_ITOD_1 | |
| 0x3AF | | | |
| 0x3B0 | 7:0 | dc_huffval_1[11:0] CED_H_KEY_DC_ITOD_1 | |
| 0x3BF | | | |
| 0x3C0 | 7:0 | not used | |
| 0x7FF | | | |
| 0x800 | 7:0 | private registers | |
| 0xAC F | | | |
| 0x800 | 7:0 | CED_KEY_TCOEFF_CPB | |

TABLE A.9.13-continued

Video demux extended address space

| Addr. (hex) | Bit num. | Register Name | Page references |
|---|---|---|---|
| 0x80F | | | |
| 0x810 | 7:0 | CED_KEY_CBP_CPB | |
| 0x81F | | | |
| 0x820 | 7:0 | CED_KEY_MBA_CPB | |
| 0x82F | | | |
| 0x830 | 7:0 | CED_KEY_MVD_CPB | |
| 0x83F | | | |
| 0x840 | 7:0 | CED_KEY_MTYPE_1_CPB | |
| 0x84F | | | |
| 0x850 | 7:0 | CED_KEY_MTYPE_P_CPB | |
| 0x85F | | | |
| 0x860 | 7:0 | CED_KEY_MTYPE_B_CPB | |
| 0x86F | | | |
| 0x870 | 7:0 | CED_KEY_MTYPE_H.261_CPB | |
| 0x88F | | | |
| 0x880 | 7:0 | not used | |
| 0x900 | | | |
| 0x901 | 7:0 | CED_KEY_HDSTROM_0 | |
| 0x902 | 7:0 | CED_KEY_HDSTROM_1 | |
| 0x903 | 7:0 | CED_KEY_HDSTROM_2 | |
| 0x90F | | | |
| 0x910 | 7:0 | not used | |
| 0xAB F | | | |
| 0xAC 0 | 7:0 | CED_KEY_DMX_WORD_0 | |
| 0xAC 1 | 7:0 | CED_KEY_DMX_WORD_1 | |
| 0xAC 2 | 7:0 | CED_KEY_DMX_WORD_2 | |
| 0xAC 3 | 7:0 | CED_KEY_DMX_WORD_3 | |
| 0xAC 4 | 7:0 | CED_KEY_DMX_WORD_4 | |
| 0xAC 5 | 7:0 | CED_KEY_DMX_WORD_5 | |
| 0xAC 6 | 7:0 | CED_KEY_DMX_WORD_6 | |
| 0xAC 7 | 7:0 | CED_KEY_DMX_WORD_7 | |
| 0xAC 8 | 7:0 | CED_KEY_DMX_WORD_8 | |
| 0xAC 9 | 7:0 | CED_KEY_DMX_WORD_9 | |
| 0xAC A | 7:0 | not used | |
| 0xAC B | | | |
| 0xAC C | 7:0 | CED_KEY_DMX_AINCR | |
| 0xAC D | 7:0 | | |
| 0xAC E | 7:0 | CED_KEY_DMX_CC | |
| 0xAC F | 7:0 | | |

TABLE A.9.14

Inverse quantiser registers

| Addr. (hex) | Bit num. | Register Name | Page references |
|---|---|---|---|
| | 7:1 | not used | |
| 0x30 | 7:1 | not used | |
| | 0 | iq_access | |
| 0x31 | 7:2 | not used | |
| | 1:0 | iq_coding_standard | |
| 0x32 | 7:5 | not used | |
| | 4:0 | test register iq_scale | |

TABLE A.9.14-continued

Inverse quantiser registers

| Addr. (hex) | Bit num. | Register Name | Page references |
|---|---|---|---|
| 0x33 | 7:2 | not used | |
| | 1:0 | test register iq_component | |
| 0x34 | 7:2 | not used | |
| | 1:0 | test register inverse_quantiser_prediction_mode | |
| 0x35 | 7:0 | test register jpeg_indirection | |
| 0x36 | 7:2 | not used | |
| | 1:0 | test register mpeg_indirection | |
| 0x37 | 7:0 | not used | |
| 0x38 | 7:0 | iq_table_keyhole_address | |
| 0x39 | 7:0 | iq_table_keyhole_data | |

TABLE A.9.15

Iq table extended address space

| Addr. (hex) | Register Name | Page references |
|---|---|---|
| 0x00:0x3F | JPEG inverse quantisation table 0<br>MPEG default intra table | |
| 0x40:0x7F | JPEG inverse quantisation table 1<br>MPEG default non-intra table | |
| 0x80:0xBF | JPEG inverse quantisation table 2<br>MPEG down-loaded intra table | |
| 0xC0:0xFF | JPEG inverse quantisation on table 3<br>MPEG down-loaded non-intra table | |

SECTION A.10 Coded Data Input

The system in accordance with the present invention, must know what video standard is being input for processing. Thereafter, the system can accept either pre-existing Tokens or raw byte data which is then placed into Tokens by the Start Code Detector.

Consequently, coded data and configuration Tokens can be supplied to the Spatial Decoder via two routes:

The coded data input port

The microprocessor interface (MPI)

The choice over which route(s) to use will depend upon the application and system environment. For example, at low data rates it might be possible to use a single microprocessor to both control the decoder chip-set and to do the system bitstream de-multiplexing. In this case, it may be possible to do the coded data input via the MPI. Alternatively, a high coded data rate might require that coded data be supplied via the coded data port.

In some applications it may be appropriate to employee a mixture of MPI and coded data port input.

A.10.1 The Coded Data Port

TABLE A.10.1

Coded data port signals

| Signal Name | Input/ Output | Description |
|---|---|---|
| coded_clock | Input | A clock operating at up to 30 MHz controlling the operation of the input circuit |
| coded_data[7:0] | Input | The standard 11 wires required to implement |
| coded_extn | Input | a Token Port transferring 8 bit data values. |

TABLE A.10.1-continued

Coded data port signals

| Signal Name | Input/ Output | Description |
|---|---|---|
| coded_valid | Input | See section A.4 for an electrical description |
| coded_accept | Output | of this interface. Circuits off-chip must package the coded data into Tokens. |
| byte_mode | Input | When high this signal indicates that information is to be transferred across the coded data port in byte mode rather than Token mode. |

The coded data port in accordance with the present invention, can be operated in two modes: Token mode and byte mode.

A.10.1.1 Token Mode

In the present invention, if byte_mode is low, then the coded data port operates as a Token Port in the normal way and accepts Tokens under the control of coded_valid and coded_accept. See section A.4 for details of the electrical operation of this interface.

The signal byte_mode is sampled at the same time as data [7:0], coded_extn and coded_valid, i.e., on the rising edge of coded_clock.

A.10.1.2 Byte Mode

If, however, byte_mode is high, then a byte of data is transferred on data[7:0] under the control of the two wire interface control signals coded_valid and coded_accept. In this case, coded_extn is ignored. The bytes are subsequently assembled on-chip into DATA Tokens until the input mode is changed.

1)First word ("Head") of Token supplied in token mode.

2)Last word of Token supplied (coded_extn goes low).

3)First byte of data supplied in byte mode. A new DATA Token is automatically created on-chip.

A.10.2 Supplying Data Via the MPI

Tokens can be supplied to the Spatial decoder via the MPI by accessing the coded data input registers.

A.10.2.1 Writing Tokens Via the MPI

The coded data registers of the present invention are grouped into two bytes in the memory map to allow for efficient data transfer. The 8 data bits, coded_data[7:0], are in one location and the control registers, coded_busy, enable_mpi_input and coded_extn are in a second location.

(See Table A.9.7).

When configured for Token input via the MPI, the current Token is extended with the current value of coded_extn each time a value is written into coded_data[7:0]. Software is responsible for setting coded_extn to 0 before the last word of any Token is written to coded_data[7:0].

For example, a DATA Token is started by writing 1 into coded_extn and then 0×04 into coded data[7:0]. The start of this new DATA Token then passes into the Spatial Decoder for processing.

Each time a new 8 bit value is written to coded_data[7:0], the current Token is extended. Coded_extn need only be accessed again when terminating the current Token, e.g. to introduce another Token. The last word of the current Token is indicated by writing 0 to coded_extn followed by writing the last word of the current Token into coded data[7:0].

TABLE A.10.2

Coded data input registers

| Register name | Size/ Dir. | Reset State | Description |
|---|---|---|---|
| coded_extn | 1 rw | x | Tokens can be supplied to the Spatial Decoder via the MPI by writing to these registers. |
| coded_data[7:0] | 8 w | x | |
| coded_busy | 1 r | 2 1 | The state of this registers indicates if the Spatial Decoder is able to accept Tokens written into coded_data[7:0] The value 1 indicates that the interface is busy and unable to accept data. Behaviour is undefined if the user tries to write to coded_data[7:0] when coded_busy = 1. |
| enable_mpl_input | 1 rw | 0 | The value in this function enable registers controls whether coded data input to the Scata Decoder is via the coded data port (0) or via the MPI (1). |

Each time before writing to coded_data[7:0], coded_busy should be inspected to see if the interface is ready to accept more data.

A.10.3 Switching Between Input Modes

Provided suitable precautions are observed, it is possible to dynamically change the data input mode. In general, the transfer of a Token via any one route should be completed before switching modes.

TABLE A.10.3

Switching data input modes

| Previous mode | Next Mode | Behaviour |
|---|---|---|
| Byte | Token MPI input | The on-chip circuitry will use the last byte supplied in byte mode as the last byte of the DATA Token that it was constructing (i.e. the extn bit will be set to 0). Before accepting the next Token. |
| Token | Byte | The off-chip circuitry supplying the Token in Token mode is responsible for completing the Token (i.e. with the extn bit of the last byte of information set to 0) before selecting byte mode. |
| | MPI input | Access to input via the MPI will not be granted (i.e. coded_busy will remain set to 1) until the off-chip circuitry supplying the Token in Token mode has completed the Token (i.e. with the extn bit of the last byte of information set to 0). |
| MPI input | Byte MPI input | The control software must have completed the Token (i.e. with the extn bit of the last byte of information set to 0) before enable_mpi_input is set to 0. |

The first byte supplied in byte mode causes a DATA Token header to be generated on-chip. Any further bytes transferred in byte mode are thereafter appended to this DATA Token until the input mode changes. Recall, DATA Tokens can contain as many bits as are necessary.

The MPI register bit, coded busy, and the signal, coded_accept, indicate on which interface the Spatial decoder is willing to accept data. Correct observation of these signals ensures that no data is lost.

A.10.4 Rate of Accepting Coded Data

In the present invention, the input circuit passes Tokens to the Start Code Detector (see section A.11). The Start code Detector analyses data in the DATA Tokens bit serially. The Detector's normal rate of processing is one bit per clock cycle (of coded_clock). Accordingly, it will typically decode a byte of coded data every 8 cycles of coded_clock. However, extra processing cycles are occasionally required, e.g., when a non-DATA Token is supplied or when a start code is encountered in the coded data. When such an event occurs, the Start Code Detector will, for a short time, be unable to accept more information.

After the Start Code Detector, data passes into a first logical coded data buffer. If this buffer fills, then the Start Code Detector will be unable to accept more information.

Consequently, no more coded data (or other Tokens) will be accepted on either the coded data port, or via the MPI, while the Start Code Detector is unable to accept more information. This will be indicated by the state of the signal coded_accept and the register coded_busy.

By using coded_accept and/or coded_busy,the user is guaranteed that no coded information will be lost. However, as will be appreciated by one of ordinary skill in the art, the system must either be able to buffer newly arriving coded data (or stop new data for arriving) if the Spatial decoder is unable to accept data.

A.10.5 Coded Data Clock

In accordance with the present invention, the coded data port, the input circuit and other functions in the Spatial Decoder are controlled by coded_clock. Furthermore, this clock can be asynchronous to the main decoder_clock. Data transfer is synchronized to decoder_clock on-chip.

SECTION A.11 Start Code Detector

A.11.1 Start Codes

As is well known in the art, MPEG and H.261 coded video streams contain identifiable bit patterns called start codes. A similar function is served in JPEG by marker codes. Start/marker codes identify significant parts of the syntax of the coded data stream. The analysis of start/marker codes performed by the Start Code Detector is the first stage in parsing the coded data. The Start Code Detector is the first block on the Spatial Decoder following the input circuit.

The start/marker code patterns are designed so that they can be identified without decoding the entire bitstream. Thus, they can be used in accordance with the present invention, to help with error recovery and decoder start-up. The Start Code Detector provides facilities to detect errors in the coded data construction and to assist the start-up of the decoder.

A.11.2 Start Code Detector Registers

As previously discussed, many of the Start Code Detector registers are in constant use by the Start Code Detector. So, accessing these registers will be unreliable if the Start Code Detector is processing data. The user is responsible for ensuring that the Start Code Detector is halted before accessing its registers.

The register start_code_detector_access is used to halt the Start Code Detector and so allow access to its registers. The Start Code Detector will halt after it generates an interrupt.

There are further constraints on when the start code search and discard all data modes can be initiated. These are described in A.11.8 and A.11.5.1.

TABLE A.11.1

Start code detector registers

| Register name | Size/Dir. | Reset State | Description |
|---|---|---|---|
| start_code_detector_access | 1 rw | 0 | Writing 1 to this register requests that the start code detector stop to allow access to its registers. The user should wait until the value can be read from this register indicating that operation has stopped and access is possible. |
| illegal_length_count_event | 1 rw | 0 | An illegal length count will occur if while decoding JPEG data. a length count field is |
| illegal_length_count_mask | 1 rw | 0 | found carrying a value less than 2. This should only occur as the result of an error in the JPEG data. If the mask register is set to 1 then an interrupt can be generated and the start code detector will stop. Behaviour following an error is not predictable if this error is suppressed (mask register set to 0). See A.11.4.1 |
| jpeg_overlapping_start_event | 1 rw | 0 | If the coding standard is JPEG and the sequence 0xFF 0xFF is found while looking for |
| jpeg_overlapping_start_mask | 1 rw | 0 | a marker code this event will occur. This sequence is a legal stuffing sequence. If the mask register is set to 1 then an interrupt can be generated and the start code detector will stop. See A.11.4.2 |
| overlapping_start_event | 1 rw | 0 | If the coding standard is MPEG or H.261 and an overlapping start code is found while looking |
| overlapping_start_mask | 1 rw | 0 | for a start code this event will occur. If the mask register is set to 1 then an interrupt can be generated and the start code detector will stop. See A.11.4.2 |
| unrecognised_start_event | 1 rw | 0 | If an unrecognised start code is encountered this event will occur. If the mask register is set |
| unrecognised_start_mask | 1 rw | 0 | to 1 then an interrupt can be generated and the start code detector will stop. |
| start_value | 8 | x | The start code value read from the bitstream is |

TABLE A.11.1-continued

Start code detector registers

| Register name | Size/Dir. | Reset State | Description |
|---|---|---|---|
| | ro | | available in the register start_value while the start code detector is halted. See A.11.4.3 During normal operation start_value contains the value of the most recently decoded start/marker code. Only the 4 LSBs of start_value are used during H.261 operation. The 4 MSBs will be zero. |
| stop_after_picture_event | 1 rw | 0 | If the register stop_after_picture is set to 1 then a stop after picture event will be generated |
| stop_after_picture_mask | 1 rw | 0 | after the end of a picture has passed through the start code detector. |
| stop_after_picture | 1 rw | 0 | If the mask register is set to 1 then an interrupt can be generated and the start code detector will stop. See A.11.5.1 stop_after_picture does not reset to 0 after the end of a picture has been detected so should be cleared directly. |
| non_aligned_start_event | 1 rw | 0 | When ignore_non_aligned is set to 1 start codes that are not byte aligned are ignored |
| non_aligned_start_mask | 1 rw | 0 | (treated as normal data). When ignore_non_aligned is set to 0 H.261 |
| ignore_non_aligned | 1 rw | 0 | and MPEG start codes will be detected regardless of byte alignment and the non-aligned start event will be generated. If the mask register is set to 1 then the event will cause an interrupt and the start code detector will stop. See A.11.6 If the coding standard is configured as JPEG ignore_non_aligned is ignored and the non-aligned start event will never be generated. |
| discard_extension_data | 1 rw | 1 | When these registers are set to 1 extension or user data that cannot be decoded by the |
| discard_user_data | 1 rw | 1 | Spatial Decoder is discarded by the start code detector. See A.11.3.3 |
| discard_all_data | 1 rw | 0 | When set to 1 all data and Tokens are discarded by the start code detector. This continues until a FLUSH Token is supplied or the register is set to 0 directly. The FLUSH Token that resets this register is discarded and not output by the start code detector. See A.11.5.1 |
| insert_sequence_start | 1 rw | 1 | See A.11.7 |
| start_code_search | 3 rw | 5 | When this register is set to 0 the start code detector operates normaly. When set to a higher value the start code detector discards data until the specified type of start code is detected. When the specified start code is detected the register is set to 0 and normal operation follows. See A.11.3 |
| start_code_detector_coding_standard | 2 rw | 0 | This register configures the coding standard used by the start code detector. The register can be loaded directly or by using a CODING_STANDARD Token. Whenever the start code detector generates a CODING_STANDARD Token (see A.11.7.4 it carries its current coding standard configuration. This Token will then configure the coding standard used by all other parts of the decoder chip-set. See A.21.1 and A.11.7 |
| picture_number | 4 rw | 0 | Each time the start coded detector detects a picture start code in the data stream (or the H.261 or JPEG equivalent) a PICTURE_START Token is generated which carries the current value of picture_number. This register then increments. |

TABLE A.11.2

| Start code detector test registers | | | |
|---|---|---|---|
| Register name | Size/Dir | Reset State | Description |
| length_count | 16<br>r0 | 0 | This register contains the current value of the JPEG length count. This register is modified under the control of the coded data clock and should only be read via the MPI when the start code detector is stopped. |

A.11.3 Conversion of Start Codes to Tokens

In normal operation the function of the Start Code Detector is to identify start codes in the data stream and to then convert them to the appropriate start code Token. In the simplest case, data is supplied to the Start code Detector in a single long DATA Token. The output of the Start Code Detector is a number of shorter DATA Tokens interleaved with start code Tokens.

Alternatively, in accordance with the present invention, the input data to the Start Code Detector could be divided up into a number of shorter DATA Tokens. There is no restriction on how the coded data is divided into DATA Tokens other than that each DATA Token must contain 8×n bits where n is an integer.

Other Tokens can be supplied directly to the input of the Start Code Detector. In this case, the Tokens are passed through the Start Code Detector with no processing to other stages of the Spatial Decoder. These tokens can only be inserted just before the location of a start code in the coded data.

A.11.3.1 Start Code Formats

Three different start code formats are recognized by the Start Code Detector of the present invention. This is configured via the register, start code_detector_coding_standard.

TABLE A.11.3

| Start code formats | | |
|---|---|---|
| Coding Standard | Start Code Pattern (hex) | Size of start code value |
| MPEG | 0x00 0x00 0x01 <value> | 8 bit |
| JPEG | 0xFF <value> | 8 bit |
| H.261 | 0x00 0x01 <value> | 4 bit |

A.11.3.2 Start Code Token Equivalents

Having detected a start code, the Start Code Detector studies the value associated with the start code and generates an appropriate Token. In general, the Tokens are named after the relevant MPEG syntax. However, one of ordinary skill in the art will appreciate that the Tokens can follow additional naming formats. The coding standard currently selected configures the relationship between start code value and the Token generated. This relationship is shown in Table A.11.4.

TABLE A.11.4

| Tokens from start code values | Start Code Value | | | |
|---|---|---|---|---|
| Start code Token generated | MPEG (hex) | H.251 (hex) | JPEG (hex) | JPEG (name) |
| PICTURE_START | 0x00 | 0x00 | 0xDA | SCS |
| SLICE_START[a] | 0x01 to 0xAF | 0x01 to 0xCC | 0xD0 to 0xD7 | $RST_0$ to $RST_7$ |

TABLE A.11.4-continued

| Tokens from start code values | Start Code Value | | | |
|---|---|---|---|---|
| Start code Token generated | MPEG (hex) | H.251 (hex) | JPEG (hex) | JPEG (name) |
| SEQUENCE_START | 0xB3 | | 0xD8 | SOI |
| SEQUENCE_END | 0xB7 | | 0xD9 | EOI |
| GROUP_START | 0xB8 | | 0xC0 | $SOF_0$[b] |
| USER_DATA | 0xB2 | | 0xE0 to 0xEF | $APP_0$ to $APP_F$ |
| | | | 0xFE | COM |
| EXTENSION_DATA | 0xB5 | | 0xC8 | JPG |
| | | | 0xF0 to 0xFD | $JPG_0$ to $JPG_D$ |
| | | | 0x02 to 0xBF | RES |
| | | | 0xC1 to 0xCB | $SOF_1$ to $SOF_{11}$ |
| | | | 0xCC | DAC |
| DHT_MARKER | | | 0xC4 | DHT |
| DNL_MARKER | | | 0xDC | DNL |
| DQT_MARKER | | | 0xDB | DQT |
| DRI_MARKER | | | 0xDD | DRI |

[a]This Token contains an 8 bit data field which is loaded with a value determined by the start code value.
[b]Indicated start of baseline DCT encoded data.

A.11.3.3 Extended Features of the Coding Standards

The coding standards provide a number of mechanisms to allow data to be embedded in the data stream whose use is not currently defined by the coding standard. This might be application specific "user data" that provides extra facilities for a particular manufacturer. Alternatively, it might be "extension data". The coding standards authorities reserved the right to use the extension data to add features to the coding standard in the future.

Two distinct mechanisms are employed. JPEG precedes blocks of user and extension data with marker codes. However, H.261 inserts "extra information" indicated by an extra information bit in the coded data. MPEG can use both these techniques.

In accordance with the present invention, MPEG/JPEG blocks of user and extension data preceded by start/marker codes can be detected by the Start Code Detector. H.261/MPEG "extra information" is detected by the Huffman decoder of the present invention. See A.14.7, "Receiving Extra Information".

The registers, discard_extension_data and discard_user_data, allow the Start Code Detector to be configured to discard user data and extension data. If this data is not discarded at the Start Code Detector it can be accessed when it reaches the Video Demux see A.14.6, "Receiving User and Extension data".

The Spatial Decoder of the present invention supports the baseline features of JPEG. The non-baseline features of JPEG are viewed as extension data by the Spatial Decoder. So, all JPEG marker codes that precede data for non-baseline JPEG are treated as extension data.

A.11.3.4 JPEG Table Definitions

JPEG supports down loaded Huffman and quantizer tables. In JPEG data, the definition of these tables is preceded by the marker codes DNL and DQT. The Start Code Detector generates the Tokens DHT_MARKER and DQT_MARKER when these marker codes are detected. These Tokens indicate to the Video Demux that the DATA Token which follows contains coded data describing Huffman or quantizer table (using the formats described in JPEG).

A.11.4 Error Detection

The Start Code Detector can detect certain errors in the coded data and provides some facilities to allow the decoder to recover after an error is detected (see A.11.8, "Start code searching").

A.11.4.1 Illegal JPEG Length Count

Most JPEG marker codes have a 16 bit length count field associated with them. This field indicates how much data is associated with this marker code. Length counts of 0 and 1 are illegal. An illegal length should only occur following a data error. In the present invention, this will generate an interrupt if illegal_length_count_mask is set to 1.

Recovery from errors in JPEG data is likely to require additional application specific data due to the difficulty of searching for start codes in JPEG data (see A.11.8.1).

A.11.4.2 Overlapping Start/Marker Codes

In the present invention, overlapping start codes should only occur following a data error. An MPEG, byte aligned, overlapping start code is illustrated in FIG. 64. Here, the Start Code Detector first sees a pattern that looks like a picture start code. Next the Start Code Detector sees that this picture start code is overlapped with a group start. Accordingly, the Start Code Detector generates a overlapping start event. Furthermore, the Start Code Detector will generate an interrupt and stop if overlapping_start_mask is set to 1.

It is impossible to tell which of the two start codes is the correct one and which was caused by a data error. However, the Start Code Detector in accordance with the present invention, discards the first start code and will proceed decoding the second start code "as if it is correct" after the overlapping start code event has been serviced. If there are a series of overlapped start codes, the Start Code Detector will discard all but the last (generating an event for each overlapping start code).

Similar errors are possible in non byte-aligned systems (H.261 or possibly MPEG). In this case, the state of ignore_non_aligned must also be considered. FIG. 65 illustrates an example where the first start code found is byte aligned, but it overlaps a non-aligned start code. If ignore_non_aligned is set to 1, then the second overlapping start code will be treated as data by the Start Code Detector and, therefore no overlapping start code event will occur. This conceals a possible data communications error. If ignore_non_aligned is set to 0, however the Start Code Detector will see the second, non aligned, star: code and will see that it overlaps the first start code.

A.11.4.3 Unrecognized Start Codes

The Start Code Detector can generate an interrupt when an unrecognized start code is detected (if unrecognized_start_mask=1). The value of the start code that caused this interrupt can be read from the register start_value.

The start code value 0×B4 (sequence error) is used in MPEG decoder systems to indicate a channel or media error. For example, this start code may be inserted into the data by an ECC circuit if it detects an error that it was unable to correct.

A.11.4.4 Sequence of Event Generation

In the present invention, certain coded data patterns (probably indicating an error condition) will cause more than one of the above error conditions to occur within a short space of time. Consequently, the sequence in which the Start Code Detector examines the coded data for error conditions is:

1)Non-aligned start codes

2)Overlapping start codes

3)Unrecognized start codes

Thus, if a non-aligned start code overlaps another, later, start code, the first event generated will be associated with the non-aligned start code. After this event has been serviced, the Start Code Detector's operation will proceed, detecting the overlapped start code a short time later.

The Start Code Detector only attempts to recognize the start code after all tests for non-aligned and overlapping start codes are complete.

A.11.5 Decoder Start-up and Shutdown

The Start Code Detector provides facilities to allow the current decoding task to be completed cleanly and for a new task to be started.

There are limitations on using these techniques with JPEG coded video as data segments can contain values that emulate marker codes (see A.11.8.1).

A.11.5.1 Clean End to Decoding

The Start Code Detector can be configured to generate an interrupt and stop once the data for the current picture is complete. This is done by setting stop_after_picture=1 and stop_after_picture_mask=1.

Once the end of a picture passes through the Start Code Detector, a FLUSH Token is generated (A.11.7.2), an interrupt is generated, and the Start Code Detector stops. Note that the picture just completed will be decoded in the normal way. In some applications, however, it may be appropriate to detect the FLUSH arriving at the output of the decoder chip-set as this will indicate the end of the current video sequence. For example, the display could freeze on the last picture output.

When the Start Code Detector stops, there may be data from the "old" video sequence "trapped" in user implemented buffers between the media and the decode chips. Setting the register, discard_all_data, will cause the Spatial Decoder to consume and discard this data. This will continue until a FLUSH Token reaches the Start Code Detector or discard_all_data is reset via the microprocessor interface.

Having discarded any data from the "old" sequence the decoder is now ready to start work on a new sequence.

A.11.5.2 When to Start Discard All Mode

The discard all mode will start immediately after a 1 is written into the discard_all_data register. The result will be unpredictable if this is done when the Start Code Detector is actively processing data.

Discard all mode can be safely initiated after any of the Start Code Detector events (non-aligned start event etc.) has generated an interrupt.

A.11.5.3 Starting a New Sequence

If it is not known where the start of a new coded video sequence is within some coded data, then the start code search mechanism can be used. This discards any unwanted data that precedes the start of the sequence. See A.11.8.

A.11.5.4 Jumping Between Sequences

This section illustrates an application of some of the techniques described above. The objective is to "jump" from one part of one coded video sequence to another. In this example, the filing system only allows access to "blocks" of data. This block structure might be derived from the sector size of a disc or a block error correction system. So, the position of entry and exit points in the coded video data may not be related to the filing system block structure.

The stop_after_picture and discard_all_data mechanisms allow unwanted data from the old video sequence to be discarded. Inserting a FLUSH Token after the end of the last filing system data block resets the discard_all_data mode. The start code search mode can then be used to discard any data in the next data block that precedes a suitable entry point.

A.11.6 Byte Alignment

As is well known in the art, the different coding schemes have quite different views about byte alignment of start/marker codes in the data stream.

For example, H.261 views communications as being bit serial. Thus, there is no concept of byte alignment of start codes. By setting ignore_non_aligned=0 the Start Code Detector is able to detect start codes with any bit alignment. By setting non-aligned_start_mask=0, the start code non-alignment interrupt is suppressed.

In contrast, however, JPEG was designed for a computer environment where byte alignment is guaranteed. Therefore, marker codes should only be detected when byte aligned. When the coding standard is configured as JPEG, the register ignore_non_aligned is ignored and the non-aligned start event will never be generated. However, setting ignore_non_aligned=1 and non_aligned_start_mask=0 is recommended to ensure compatibility with future products.

MPEG, on the other hand, was designed to meet the needs of both communications (bit serial) and computer (byte oriented) systems. Start codes in MPEG data should normally be byte aligned. However, the standard is designed to be allow bit serial searching for start codes (no MPEG bit pattern, with any bit alignment, will look like a start code, unless it is a start code). So, an MPEG decoder can be designed that will tolerate loss of byte alignment in serial data communications.

If a non-aligned start code is found, it will normally indicate that a communication error has previously occurred. If the error is a "bit-slip" in a bit-serial communications system, then data containing this error will have already been passed to the decoder. This error is likely to cause other errors within the decoder. However, new data arriving at the Start Code Detector can continue to be decoded after this loss of byte alignment.

By setting ignore_non_aligned=0 and non_aligned_start_mask=1, an interrupt can be generated if a non-aligned start code is detected. The response will depend upon the application. All subsequent start codes will be non-aligned (until byte alignment is restored). Accordingly, setting non_aligned_start_mask=0 after byte alignment has been lost may be appropriate.

TABLE A.11.5

Configuring for byte alignment

| | MPEG | JPEG | H.261 |
|---|---|---|---|
| ignore_non_aligned | 0 | 1 | 0 |
| non_aligned_start_mask | 1 | 0 | 0 |

A.11.7 Automatic Token Generation

In the present invention, most of the Tokens output by the Start Code Detector directly reflect syntactic elements of the various picture and video coding standards. In addition to these "natural" Tokens,some useful "invented" Tokens are generated. Examples of these proprietary tokens are PICTURE_END and CODING_STANDARD. Tokens are also introduced to remove some of the syntactic differences between the coding standards and to "tidy up" under error conditions.

This automatic Token generation is done after the serial analysis of the coded data (see FIG. 61, "The Start Code Detector"). Therefore the system responds equally to Tokens that have been supplied directly to the input of the Spatial Decoder via the Start Code Detector and to Tokens that have been generated by the Start Code Detector following the detection of start codes in the coded data.

A.11.7.1 Indicating the End of a Picture

In general, the coding standards don't explicitly signal the end of a picture. However, the Start Code Detector of the present invention generates a PICTURE_END Token when it detects information that indicates that the current picture has been completed.

The Tokens that cause PICTURE_END to be generated are: SEQUENCE_START, GROUP_START, PICTURE_START, SEQUENCE_END and FLUSH.

A.11.7.2 Stop After Picture End Option

If the register stop_after_picture is set, then the Start Code Detector will stop after a PICTURE_END Token has passed through. However, a FLUSH Token is inserted after the PICTURE_END to "push" the tail end of the coded data through the decoder and to reset the system. See A.11.5.1.

A.11.7.3 Introducing Sequence Start for H.261

H.261 does not have a syntactic element equivalent to sequence start (see Table A.11.4). If the register insert_sequence_start is set, then the Start Code Detector will ensure that there is one SEQUENCE_START Token before the next PICTURE_START, i.e., if the Start Code Detector does not see a SEQUENCE_START before a PICTURE_START, one will be introduced. No SEQUENCE_START will be introduced if one is already present.

This function should not be used with MPEG or JPEG.

A.11.7.4 Setting Coding Standard for Each Sequence

All SEQUENCE_START Tokens leaving the Start Code Detector are always preceded by a CODING_STANDARD Token. This Token is loaded with the Start Code Detector's current coding standard. This sets the coding standard for the entire decoder chip set for each new video sequence.

A.11.8 Start Code Searching

The Start Code Detector in accordance with the invention, can be used to search through a coded data stream for a specified type of start code. This allows the decoder to re-commence decoding from a specified level within the syntax of some coded data (after discarding any data that precedes it). Applications for this include:

- start-up of a decoder after jumping into a coded data stream at an unknown position (e.g., random accessing).
- to seek to a known point in the data to assist recovery after a data error.

For example, Table A.11.6 shows the MPEG start codes searched, for different configurations of start_code_search. The equivalent H.261 and JPEG start/marker codes can be seen in Table A.11.4.

TABLE A.11.6

Start code search modes

| start_code_search | Start codes searched for . . . |
|---|---|
| 0* | Normal operation |
| 1 | Reserved (will behave as discard data) |

TABLE A.11.6-continued

| Start code search modes | |
|---|---|
| start_code_search | Start codes searched for . . . |
| 2 | |
| 3 | sequence start |
| 4 | group or sequence start |
| 5[b] | picture, group or sequence start |
| 6 | slice, picture, group or sequence start |
| 7 | the next start or marker code |

[a]A FLUSH Token places the Start Code Detector in this search mode.
[b]This is the default mode after reset.

When a non-zero value is written into the start_code_search register, the Start Code Detector will start to discard all incoming data until the specified start code is detected. The start_code_search register will then reset to 0 and normal operation will continue.

The start code search will start immediately after a non-zero value is written into the start_code_search register. The result will be unpredictable if this is done when the Start Code Detector is actively processing data. So, before initiating a start code search, the Start Code Detector should be stopped so no data is being processed. The Start Code Detector is always in this condition if any of the Start Code Detector events (non-aligned start event etc.) has just generated an interrupt.

A.11.8.1 Limitations on Using Start Code Search with JPEG

Most JPEG marker codes have a 16 bit length count field associated with them. This field indicates the length of a data segment associated with the marker code. This segment may contain values that emulate marker codes. In normal operation, the Start Code Detector doesn't look for start codes in these segments of data.

If a random access into some JPEG coded data "lands" in such a segment, the start code search mechanism cannot be used reliably. In general, JPEG coded video will require additional external information to identify entry points for random access.

SECTION A.12 Decoder Start-up Control

A.12.1 Overview of Decoder Start-up

In a decoder, video display will normally be delayed a short time after coded data is first available. During this delay, coded data accumulates in the buffers in the decoder. This pre-filling of the buffers ensures that the buffers never empty during decoding and, this, therefore ensures that the decoder is able to decode new pictures at regular intervals.

Generally, two facilities are required to correctly start-up a decoder. First, there must be a mechanism to measure how much data has been provided to the decoder. Second, there must be a mechanism to prevent the display of a new video stream. The Spatial Decoder of the invention provides a bit counter near its input to measure how much data has arrived and an output gate near its output to prevent the start of new video stream being output.

There are three levels of complexity for the control of these facilities:

Output gate always open

Basic control

Advanced control

With the output gate always open, picture output will start as soon as possible after coded data starts to arrive at the decoder. This is appropriate for still picture decoding or where display is being delayed by some other mechanism.

The difference between basic and advanced control relates to how many short video streams can be accommodated in the decoder's buffers at any time. Basic control is sufficient for most applications. However, advanced control allows user software to help the decoder manage the start-up of several very short video streams.

A.12.2 MPEG Video Buffer Verifier

MPEG describes a "video buffer verifier" (VBV) for constant data rate systems. Using the VBV information allows the decoder to pre-fill its buffers before it starts to display pictures. Again, this pre-filling ensures that the decoder's buffers never empty during decoding.

In summary, each MPEG picture carries a vbv_delay parameter. This parameter specifies how long the coded data buffer of an "ideal decoder" should fill with coded data before the first picture is decoded. Having observed the start-up delay for the first picture, the requirements of all subsequent pictures will be met automatically.

MPEG, therefore, specifies the start-up requirements as a delay. However, in a constant bit rate system this delay can readily be converted to a bit count. This is the basis on which the start-up control of the Spatial Decoder of the present invention operates.

A.12.3 Definition of a Stream

In this application, the term stream is used to avoid confusion with the MPEG term sequence. Stream therefore means a quantity of video data that is "interesting" to an application. Hence, a stream could be many MPEG sequences or it could be a single picture.

The decoder start-up facilities described in this chapter relate to meeting the VBV requirements of the first picture in a stream. The requirements of subsequent pictures in that stream are met automatically.

TABLE A.12.1

| Decoder start-up registers | | | |
|---|---|---|---|
| Register name | Size/ Dir | Reset State | Description |
| startup_access<br>CED_BS_ACCESS | 1<br>rw | 0 | Writing 1 to this register requests that the bit counter and gate opening logic stop to allow access to their configuration registers. |
| bit_count<br>CED_BS_COUNT | 8<br>rw | 0 | This bit counter is incremented as coded data leaves the start code detector. The number of |
| bit_count_prescale<br>CED_BS_PRESCALE | 3<br>rw | 0 | bits required to increment bit_count once is aprox, $2^{(bit\_count\_prescale-1)} \times 512$.<br>The bit counter starts counting bits after a FLUSH Token passes through the bit counter It is reset to zero and then stops incrementing |

TABLE A.12.1-continued

Decoder start-up registers

| Register name | Size/ Dir | Reset State | Description |
|---|---|---|---|
| | | | after the bit count target has been met. |
| bit_count_target<br>CED_BS_TARGET | 8<br>rw | x | This register specifies the bit count target. A target met event is generated whenever the following condition becomes true: bit_count >= bit_count_target. |
| target_met_event<br>BS_TARGET_MET_EVENT | 1<br>rw | 0 | When the bit count target is met this event will be generated. If the mask register is set to 1 |
| target_met_mask | 1<br>rw | 0 | then an interrupt can be generated, however, the bit counter will NOT stop processing data. This event will occur when the bit counter increments to its target. It will also occur if a target value is written which is less than or equal to the current value of the bit counter. Writing 0 to bit_count_target will always generate a target met event. |
| counter_flushed_event<br>BS_FLUSH_EVENT | 1<br>rw | 0 | When a FLUSH Token passes through the bit count circuit this event will occur. If the mask |
| counter_flushed_mask | 1<br>rw | 0 | register is set to 1 then an interrupt can be generated and the bit counter will stop. |
| counter_flushed _too_early_event<br>BS_FLUSH_BEFORE_TARGET_MET_EVENT | 1<br>rw | 0 | If a FLUSH Token passes through the bit count circuit and the bit count target has not |
| counter_flushed_too_early_mask | 1<br>rw | 0 | been met this event will occur. If the mask register is set to 1 then an interrupt can be generated and the bit counter will stop. See A.12.10 |
| offchip_queue<br>CED_BS_QUEUE | 1<br>rw | 0 | Setting this register to 1 configures the gate opening logic to require microprocessor support. When this register is set to 0 the output gate control logic will automatically control the operation of the output gate. See sections A.12.6 and A.12.7. |
| enable_stream<br>CED_BS_ENABLE_NXT_STM | 1<br>rw | 0 | When an off-chip queue is in use writing to enable_stream controls the behaviour of the output gate after the end of a stream passes through it A one in this register enables the output gate to open. The register will be reset when an accept_enable interrupt is generated. |
| accept_enable_event<br>BS_STREAM_END_EVENT | 1<br>rw | 0 | This event indicates that a FLUSH Token has passed through the output gate (causing it to |
| accept_enable_mask | 1<br>rw | 0 | close) and that an enable was available to allow the gate to open If the mask register is set to 1 then an interrupt can be generated and the register enable_stream will be reset. See A.12.7.1 |

A.12.5 Output Gate Always Open

The output gate can be configured to remain open. This configuration is appropriate where still pictures are being decoded, or when some other mechanism is available to manage the start-up of the video decoder.

The following configurations are required after reset (having gained access to the start-up control logic by writing 1 to startup_access):

set offchip_queue=1 set enable_stream=1 ensure that all the decoder start-up event mask registers are set to 0 disabling their interrupts (this is the default state after reset).

(See A.12.7.1 for an explanation of why this holds the output gate open.)

A.12.6 Basic Operation

In the present invention, basic control of the start-up logic is sufficient for the majority of MPEG video applications. In this mode, the bit counter communicates directly with the output gate. The output gate will close automatically as the end of a video stream passes through it as indicated by a FLUSH Token. The gate will remain closed until an enable is provided by the bit counter circuitry when a stream has attained its start-up bit count.

The following configurations are required after reset (having gained access to the start-up control logic by writing 1 to startup_access):

set bit_count_prescale approximately for the expected range of coded data rates set counter_flushed_too_early_mask=1 to enable this error condition to be detected Two interrupt service routines are required:

Video Demux service to obtain the value of vbv_delay for the first picture in each new stream Counter flushed too early service to react to this condition The video demux (also known as the video parser) can generate an interrupt when it decodes the vbv_delay for a new video stream (i.e., the first picture to arrive at the video demux after a FLUSH). The interrupt service routine should compute an appropriate value for bit_count_target and write it. When the bit counter reaches this target, it will insert an enable into a short queue between the bit counter and the output gate. When the output gate opens it removes an enable from this queue.

A.12.6.1 Starting a New Stream Shortly After Another Finishes

As an example, the MPEG stream which is about to finish is called A and the MPEG stream about to start is called B. A FLUSH Token should be inserted after the end of A. This pushes the last of its coded data through the decoder and alerts the various sections of the decoder to expect a new stream.

Normally, the bit counter will have reset to zero, A having already met its start-up conditions. After the FLUSH, the bit counter will start counting the bits in stream B. When the Video Demux has decoded the vbv_delay from the first picture in stream B, an interrupt will be generated allowing the bit counter to be configured.

As the FLUSH marking the end of stream A passes through the output gate, the gate will close. The gate will remain closed until B meets its start-up conditions. Depending on a number of factors such as: the start-up delay for stream B and the depth of the buffers, it is possible that B will have already met its start-up conditions when the output gate closes. In this case, there will be an enable waiting in the queue and the output gate will immediately open. Otherwise, stream B will have to wait until it meets its start-up requirements.

A.12.6.2 A Succession of Short Streams

The capacity of the queue located between the bit counter and the output gate is sufficient to allow 3 separate video streams to have met their start-up conditions and to be waiting for a previous stream to finish being decoded. In the present invention, this situation will only occur if very short streams are being decoded or if the off-chip buffers are very large as compared to the picture format being decoded).

In FIG. 69 stream A is being decoded and the output gate is open). Streams B and C have met their start-up conditions and are entirely contained within the buffers managed by the Spatial Decoder. Stream D is still arriving at the input of the Spatial Decoder.

Enables for streams B and C are in the queue. So, when stream A is completed B will be able to start immediately. Similarly C can follow immediately behind B.

If A is still passing through the output gate when D meets its start-up target an enable will be added to the queue, filling the queue. If no enables have been removed from the queue by the time the end of D passes the bit counter (i.e., A is still passing through the output gate) no new stream will be able to start through the bit counter. Therefore, coded data will be held up at the input until A completes and an enable is removed from the queue as the output gate is opened to allow B to pass through.

A.12.7 Advanced Operation

In accordance with the present invention, advanced control of the start-up logic allows user software to infinitely extend the length of the enable queue described in A.12.6, "Basic operation". This level of control will only be required where the video decoder must accommodate a series of short video streams longer than that described in A.12.6.2, "A succession of short streams".

In addition to the configuration required for Basic operation of the system, the following configurations are required after reset (having gained access to the start-up control logic by writing 1 to start_up access):

set offchip_queue=1 set accept_enable_mask=1 to enable interrupts when an enable has been removed from the queue set target_met_mask=1 to enable interrupts when a stream's bit count target is met Two additional interrupt service routines are required:

accept enable interrupt

Target met interrupt

When a target met interrupt occurs, the service routine should add an enable to its off-chip enable queue.

A.12.7.1 Output Gate Logic Behavior

Writing a 1 to the enable_stream register loads an enable into a short queue.

When a FLUSH (marking the end of a stream) passes through the output gate the gate will close. If there is an enable available at the end of the queue, the gate will open and generate an accept_enable_event. If accept_enable_mask is set to one, an interrupt can be generated and an enable is removed from the end of the queue (the register enable_stream is reset).

However, if accept_enable_mask is set to zero, no interrupt is generated following the accept_enable_event and the enable is NOT removed from the end of the queue. This mechanism can be used to keep the output gate open as described in A.12.5.

A.12.8 Bit Counting

The bit counter starts counting after a FLUSH Token passes through it. This FLUSH Token indicates the end of the current video stream. In this regard, the bit counter continues counting until it meets the bit count target set in the bit_count_target register. A target met event is then generated and the bit counter resets to zero and waits for the next FLUSH Token.

The bit counter will also stop incrementing when it reaches it maximum count (255).

A.12.9 Bit Count Prescale

In the present invention, $2^{(bit\_count\_prescale-1)}\times 512$ bits are required to increment the bit counter once. Furthermore, bit_count_prescale is a 3 bit register than can hold a value between 0 and 7.

TABLE A.12.2

Example bit counter ranges

| n | Range (bits) | Resolution (bits) |
|---|---|---|
| 0 | 0 to 262144 | 1024 |
| 1 | 0 to 524288 | 2048 |
| 7 | 0 to 31457280 | 122880 |

The bit count is approximate, as some elements of the video stream will already have been Tokenized (e.g., the start codes) and, therefore includes non-data Tokens.

A.12.10 Counter Flushed Too Early

If a FLUSH token arrives at the bit counter before the bit count target is attained, an event is generated which can cause an interrupt (if counter_flushed_too_early_mask=1). If the interrupt is generated, then the bit counter circuit will stop, preventing further data input. It is the responsibility of the user's software to decide when to open the output gate after this event has occurred. The output gate can be made to open by writing 0 as the bit count target. These circumstances should only arise when trying to decode video streams that last only a few pictures.

SECTION A.13 Buffer Management

The Spatial Decoder manages two logical data buffers: the coded data buffer (CDB) and the Token buffer (TB).

The CDB buffers coded data between the Start Code Detector and the input of the Huffman decoder. This provides buffering for low data rate coded video data. The TB buffers data between the output of the Huffman decoder and the input of the spatial video decoding circuits (inverse modeler, quantizer and DCT). This second logical buffer allows processing time to include a spread so as to accommodate processing pictures having varying amounts of data.

Both buffers are physically held in a single off-chip DRAM array. The addresses for these buffers are generated by the buffer manager.

A.13.1 Buffer Manager Registers

The Spatial Decoder buffer manager is intended to be configured once immediately after the device is reset. In normal operation, there is no requirement to reconfigure the buffer manager.

After reset is removed from the Spatial Decoder, the buffer manager is halted (with its access register, buffer_manager_access, set to 1) awaiting configuration. After the registers have been configured, buffer_manager_access can be set to 0 and decoding can commence.

Most of the registers used in the buffer manager cannot be accessed reliably while the buffer manager is operating. Before any of the buffer manager registers are accessed buffer_manager_access must be set to 1. This makes it essential to observe the protocol of waiting until the value 1 can be read from buffer_manager_access. The time taken to obtain and release access should be taken into consideration when polling such registers as cdb_full and cdb_empty to monitor buffer conditions.

The Spatial Decoder buffer manager has two sets of registers that define two similar buffers. The buffer limit register (buffer_limit) defines the physical upper limit of the memory space. All addresses are calculated modulo this number.

Within the limits of the available memory, the extent of each buffer is defined by two registers: the buffer base (cdb_base and tb_base) and the buffer length (cdb_length and tb_length). All the registers described thus far must be configured before the buffers can be used.

The current status of each buffer is visible in 4 registers. The buffer read register (cdb_read and tb_read) indicates an offset from the buffer base from which data will be read next. The buffer number registers (cdb_number and tb_number) indicate the amount of data currently held by buffers. The status bits cdb_full, tb_full, cdb_empty and tb_empty indicate if the buffers are full or empty.

As stated in A.13.1.1, the unit for all the above mentioned registers is a 512 bit block of data. Accordingly, the value read from cdb_number should be multiplied by 512 to obtain the number of bits in the coded data buffer.

A.13.3 Zero Buffers

Still picture applications (e.g., using JPEG) that do not have a "real-time" requirement will not need the large off-chip buffers supported by the buffer manager. In this case, the DRAM interface can be configured (by writing 1 to the zero_buffers register) to ignore the buffer manager to provide a 128 bit stream on-chip FIFO for the coded data buffer and the Token buffers.

TABLE A.13.1

Buffer manager registers

| Register name | Size/Dir. | Reset State | Description |
|---|---|---|---|
| buffer_manager_access | 1<br>rw | 1 | This access bit stops the operation of the buffer manager so that its various registers can be accessed reliably. See A.6.4.1<br>Note: this access register is unusual as its default state after reset is 1.1.e. after reset the buffer manager is halted awaiting configuration via the microprocessor interface. |
| buffer_manager_keyhole_address | 6<br>rw | x | Keyhole access to the extended address space used for the buffer manager registers shown below. See A.6.4.3 for more |
| buffer_manager_keyhole_data | 8<br>rw | x | informatian about accessing registers througn a keyhole. |
| buffer_limit | 18<br>rw | x | This specifies the overall size of the DRAM array attached to the Spatial Decoder. All buffer addresses are aculated MCC this buffer size and so will wrap round within the DRAM provided. |
| tdb_base<br>tb_base | 18<br>rw | x | These registers point to the base of the dad data (cdb) abd Token (tb) buffers. |
| cdb_length<br>tb_length | 18<br>rw | x | These registers specify and the length (i.e. size) of the coded data (ddb) and Token (tb) buffers. |
| cdb_read<br>tb_read | 18<br>ro | x | These registers hold an offset from the buffer base and indicate where data will be read from next. |
| cdb_number<br>tb_number | 18<br>ro | x | These registers show how much data is current held in the buffers. |
| cdb_full<br>tb_full | 1<br>ro | x | These registers will be set to 1 if the coded data (cdb) or Token to buffers bits. |
| cdb_empty<br>tb_empty | 1<br>ro | x | The registers will be set to 1 if the coded data (ddb) of Token db buffer empties. |

A.13.1.1 Buffer Manager Pointer Values

Typically, data is transferred between the Spatial Decoder and the off_chip DRAM in 64 byte bursts (using the DRAM's fast page mode). All the buffer pointers and length registers refer to these 64 byte (512 bit) blocks of data. So, the buffer manager's 18 bit registers describe a 256 k block linear address space (i.e., 128 Mb).

The 64 byte transfer is independent of the width (8, 16 or 32 bits) of the DRAM interface.

A.13.2 Use of the Buffer Manager Registers

The zero buffers option may also be appropriate for applications which operate working at low data rates and with small picture formats.

Note: the zero_buffers register is part of the DRAM interface and, therefore, should be set only during the post-reset configuration of the DRAM interface.

A.13.4 Buffer Operation

The data transfer through the buffers is controlled by a handshake Protocol. Hence, it is guaranteed that no data errors will occur if the buffer fills or empties. If a buffer is filled, then the circuits trying to send data to the buffer will be halted until there is space in the buffer. If a buffer continues to be full, more processing stages "up steam" of the buffer will halt until the Spatial Decoder is unable to accept data on its input port. Similarly, if a buffer empties, then the circuits trying to remove data from the buffer will halt until data is available.

As described in A.13.2, the position and size of the coded data and Token buffer are specified by the buffer base and length registers. The user is responsible for configuring these registers and for ensuring that there is no conflict in memory usage between the two buffers.

SECTION A.14 Video Demux

The Video Demux or Video parser as it is also called, completes the task of converting coded data into Tokens started by the Start Code Detector. There are four main processing blocks in the Video Demux: Parser State Machine, Huffman decoder (including an ITOD), Macroblock counter and ALU.

The Parser or state machine follows the syntax of the coded video data and instructs the other units. The Huffman decoder converts variable length coded (VLC) data into integers. The Macroblock counter keeps track of which section of a picture is being decoded. The ALU performs the necessary arithmetic calculations.

A.14.1 Video Demux Registers

TABLE A.14.1

Top level Video Demux registers

| Register name | Size/Dir. | Reset State | Description |
|---|---|---|---|
| demux_access<br>CED_H_CTRL(7) | 1<br>rw | 0 | This access bit stops the operation of the Video Demux so that it's various registers can be accessed reliably. See A.6.4.1 |
| huffman_error_code<br>CED_H_CTRL[6:4] | 3<br>ro | | When the Video Demux stops following the generation of a huffman_event interupt request this 3 bit register holds a value indicating why the interrupt was generated. See A.14.5.1 |
| parser_error_code<br>CED_H_DMUX_ERR | 8<br>ro | | When the Video Demux stops following the generation of a parser_event interrupt request this 8 bit register holds a value indicating why the interrupt was generated. See A.14.5.2 |
| demux_keyhole_addresss<br>CED_H_KEYHOLE_ADDR | 12<br>rw | x | Keyhole access to the Videa Demux's extended address space. See A.6.4.3 for more information about accessing registers |
| demux_keyhole_data<br>CED_H_KEYHOLE | 8<br>rw | x | through a keyhole.<br>Tables A.14.2, A.14.3 and A.14.4 describe the registers that can be accessed via the keyhole. |
| dummy_last_picture<br>CED_H_ALU_REG0<br>r_rom_control<br>r_dummy_last_frame_bit | 1<br>rw | 0 | When this register is set to 1 the Video Demux will generate information for a "dummy" intra picture as the last picture of an MPEG sequence. This function is useful when the Temporal Decoder is configured for automatic picture re-ordering (See A.18.3.5. "Picture sequence re-ordering" to flush the last P or I picture out of the Temporal Decoder.<br>No "dummy" picture is required if:<br>the Temporal Decoder is not configured for re-ordering<br>another MPEG sequence will be decoded immediately (as this will also flush out the last picture)<br>the coding standard is not MPEG |
| field_info<br>CED_H_ALU_REG0<br>r_rom_control<br>r_field_info_bit | 1<br>rw | 0 | When this register is set to 1 the first byte of any MPEG extra_information_picture is placed in the FIELD_INFO Token. See A.14.7.1 |
| continue<br>CED_H_ALU_REG0<br>r_rom_control<br>r_continue_bit | 1<br>rw | 0 | This register allows user software to control how much extra, user or extension data it wants to receive when is it is detected by the decoder. See A.14.6 and A.14.7 |
| rom_revision<br>CED_H_ALU_REG1<br>r_rom_revision | 8<br>ro | | Immediately following reset this holds a copy of the microcode RCM revision number.<br>This register is also used to present to control software data values read from the coded data. See A.14.6, "Receiving User and Extension data" and A.14.7, "Receiving Extra Information". |
| huffman_event | 1<br>rw | 0 | A Huffman event is generated if an error is found in the coded data. See A.14.51 for a description of these events. |
| huffman_mask | 1<br>rw | 0 | If the mask register is set to 1 then an interrupt can be generated and the Video Demux will stop. If the mask regster is set to 0 then no interrupt is generated and the Video Demux will attempt to recover from the error. |
| parser_event | 1<br>rw | 0 | A Parser event can be is response to errors in the coded date or to the arrival of information at the Video Demux that require software intervention. See A.14.5.2 for a description of these events. |
| parser_event | 1<br>rw | 0 | If the mask register is set to 1 then an interrupt can be generate and the Video Demux will stop. If the mask register is set to 0 the no interrupt is generated and the Video Demux will attempt to continue. |

TABLE A.14.2 video demux picture constuction registers

| Register name | Size/Dir. | Reset State | Description |
|---|---|---|---|
| component_name_0<br>component_name_1<br>component_name_2<br>component_name_3 | 8<br>rw | x | During JPEG operation the register component_name_n holds an 8 bit value indicating (to an application) which colour component has the component ID n. |
| horiz_pets | 16<br>rw | x | These registers hold the horizontal and vertical dimensions of the video being decoded in pixels. |
| vert_pets | 16<br>rw | x | See section A.14.2 |
| horiz_macroblocks | 16<br>rw | x | These registers hold the horizontal and vertical dimensions of the video being decoded in macroblocks. |
| vert_macroblocks | 16<br>rw | x | See section A.14.2 |
| max_h | 2<br>rw | x | These registers hold the macroblock width and height in blocks (8 × 8 pixels). The values 0 to 3 indicate a width/height or 1 to 4 blocks. |
| max_v | 2<br>rw | x | See secton A.14.2 |
| max_component_id | 2<br>rw | x | The values 0 to 3 indicate that 1 to 4 different video components are currently being decoded.<br>See section A.14.2 |
| Nf | a<br>rw | x | During JREG operation this register holds the parameter Nf (number of image components in frame). |
| blocks_h_0<br>blocks_h_1<br>blocks_h_2<br>blocks_h_3 | 2<br>rw | x | For each of the 4 colour components the registers blocks_h_n and blocks_v_n hold the number of blocks honzontally and vertically in a macroblock for the colour component with component ID n.<br>See section A.14.2 |
| blocks_v_0<br>blocks_v_1<br>blocks_v_2<br>blocks_v_3 | 2<br>rw | x | |
| tq_0<br>tq_1<br>tq_2<br>tq_3 | 2<br>rw | x | The two bit value held by the register tq_n describes which Inverse Quantisation table is to be used when decoding data with component ID n. |

A.14.1.1 Register Loading and Token Generation

Many of the registers in the Video Demux hold values that relate directly to parameters normally communicated in the coded picture/video data. For example, the horiz_pels register corresponds to the MPEG sequence header information, horizontal_size, and the JPEG frame header parameter, X. These registers are loaded by the Video Demux when the appropriate coded data is decoded. These registers are also associated with a Token. For example, the register, horiz_pels, is associated with Token, HORIZONTAL_SIZE. The Token is generated by the Video Demux when (or soon after) the coded data is decoded. The Token can also be supplied directly to the input of the Spatial Decoder. In this case, the value carried by the Token will configure the Video Demux register associated with it.

TABLE A.14.3

Video demux Huffman table registers

| Reister name | Size/Dir. | Reset State | Decsription |
|---|---|---|---|
| dc_huff_0<br>dc_huff_1<br>dc_huff_2<br>dc_huff_3 | 2<br>rw | | The two bit value held by the register dc_huff_n describes which Huffman decoding table is to be used when decoding the DC coefficients of data with component ID n.<br>Similarly ac_huff_n describes the table to be used when decoding AC coefficients. |
| ac_huff_0<br>ac_huff_1<br>ac_huff_2<br>ac_hufl_3 | 2<br>rw | | Baseline JPEG requires up to two Huffman tables per scan. The only tables implemented are 0 and 1. |
| dc_bits_0[15:0]<br>dc_bits_1[15:0] | 8<br>rw | | Each of these is a table of 16, eight bit values. They provide the BITS information (see JPEG Huffman table specification) which form part of the |
| ac_bits_0[15:0]<br>ac_bits_1[15:0] | 8<br>rw | | description of two DC Huffman tables.<br>See section A.14.3.1 |
| dc_huffval_0[11:0]<br>dc_huffval_1[11:0] | 8<br>rw | | Each of these is a table of 12, eight bit values. They provide the HUFFVAL information (see JPEG Huffman table specificaton) which form part of the description of two AC Huffman tables.<br>See section A.14.3.1 |
| ac_huffval_0[161:0]<br>ac_huffval_1[161:0] | 8<br>rw | | Each of these is a table of 162, eight bit values. They provide the HUFFAVL information (see JPEG Huffman table specification) which form part of the description of two AC Huffman tables.<br>See section A.14.3.1 |

TABLE A.14.3-continued

Video demux Huffman table registers

| Reister name | Size/Dir. | Reset State | Decsription |
|---|---|---|---|
| dc_zssss_0<br>dc_zssss_1<br>ac_eob_0<br>ac_eob_1<br>ac_zrl_0<br>ac_zrl_1 | 8<br>rw<br>8<br>rw<br>8<br>rw | | These 8 bit registers hold values that are "special cased" to accelerate the decoding of certain frequently used JPEG VLCs.<br>dc_ssss - magnitude of DC coefficient is 0<br>ac_eob - end of block<br>ac_zri - run of 16 zeros |

TABLE A.14.4

Other Video Demux registers

| Register name | Size/Dir. | Reset State | Description |
|---|---|---|---|
| buffer_size | 10<br>rw | | This register is loaded when decoding MPEG data with a value indicating the size of VBV buffer required in an ideal decoder.<br>This value is not used by the decoder chips. However, the value it holds may be useful to user software when configuring the coded data buffer size and to determine whether the decoder is capable of decoding a particular MPEG data file. |
| pel_aspect | 4<br>rw | | This register is loaded when decoding MPEG data with a value indicating the pel aspect ratio. The value is a 4 bit integer that is used as an index into a table defined by MPEG.<br>See the MPEG standard for a definition of this table.<br>This value is not used by the decoder chips. However, the value it holds may be useful to user software when configuring a display or output device. |
| bit_rate | 18<br>rw | | This register is loaded when decoding MPEG data with a value indicating the coded data rate.<br>See the MPEG standard for a definition of this value.<br>This value is not used by the decoder chips. However, the value it holds may be useful to user software when configuring the decoder start-up registers. |
| pic_rate | 4<br>rw | | This register is loaded when decoding MPEG data with a value indicating the picture rate.<br>See the MPEG standard for a definition of this value.<br>This value is not used by the decoder chips. However, the value it holds may be useful to user software when configuring a display or output device. |
| constrained | 1<br>rw | | This register is loaded when decoding MPEG data to indicate if the coded data meets MPEG's constrained parameters.<br>See the MPEG standard for a definition of this flag.<br>This value is not used by the decoder chips. However, the value it holds may be useful to user software to determine whether the decoder is capable of decoding a particular MPEG data file. |
| picture_type | 2<br>rw | | During MPEG operation this register holds the picture type of the picture being decoded |
| h_261_pic_type | 8<br>rw | | This register is loaded when decoding H.261 data. It holds information about the picture format |

| 7 | 6 | 5 | 4 | 3 | 2 | 1 | 0 |
|---|---|---|---|---|---|---|---|
| f | f | s | d | f | q | f | f |

Flags:
s - Split Screen Indicator
d - Document Camera
f - Freeze Picture Release
This value is not used by the decoder chips. However, the information should be used when configuring horiz_pels, vert_pels and the display or output device.

| Register name | Size/Dir. | Reset State | Description |
|---|---|---|---|
| broken_closed | 2<br>rw | | During MPEG operation this register holds the broken_link and closed_gap information for the group of pictures being decoded. |

| 7 | 6 | 5 | 4 | 3 | 2 | 1 | 0 |
|---|---|---|---|---|---|---|---|
| f | f | f | f | f | f | c | b |

Flags:
c - closed_gap

| Register name | Size/Dir. | Reset State | Description |
|---|---|---|---|
| prediction_mode | 5<br>rw | | During MPEG and H.261 operation this register holds the current value of prediction mode. |

TABLE A.14.4-continued

Other Video Demux registers

| Register name | Size/Dir. | Reset State | Description |
|---|---|---|---|
| | | | 7 6 5 4 3 2 1 0<br>f f f h y x b f<br>Flags:<br>h - enable H.261 loop filter<br>y - reset backward vector prediction |
| vbv_delay | 16 rw | | This register is loaded when decoding MPEG data with a value indicating the minimum start-up delay before decoding should start.<br>See the MPEG standard for a definition of this value.<br>This value is not used by the decoder chips. However, the value it holds may be useful to user software when configuring the decoder start-up registers. |
| pic_number | 8 rw | | This register holds the picture number for the pictures that is currently being decoded by the Video Demux. This number was generated by the start code detector when this picture arrived there.<br>See Table A.11.2 for a description of the picture number. |
| dummy_last_picture | 1 rw | 0 | These registers are also visble at the top level. See Table A.14.1 |
| field_info | 1 rw | 0 | |
| continue | 1 rw | 0 | |
| rom_revision | 8 rw | | |
| coding_standard | 2 ro | | This register is loaded by the CODING_STANDARD Token to configure the Video Demux's mode of operation.<br>See section A.21.1 |
| restart_interval | 8 rw | | This register is loaded when decoding JPEG data with a value indicating the minimum start-up delay before decoding should start.<br>See the MPEG standard for a definition of this value. |

TABLE A.14.5

Register to Token cross reference

| register | Token | standard | comment |
|---|---|---|---|
| component_name_n | COMPONENT_NAME | JPEG | in coded data. |
| | | MPEG | not used in standard. |
| | | H.261 | |
| horiz_pels<br>vert_pels | HORIZONTAL_SIZE<br>VERTICAL_SIZE | MPEG | in coded data. |
| | | JPEG | |
| | | H.261 | automatically derived from picture type. |
| horiz_macroblocks<br>vert_macroblocks | HORIZONTAL_MBS<br>VERTICAL_MBS | MPEG | control software must derive from horizontal and vertical picture size. |
| | | JPEG | |
| | | H.261 | automatically derived from picture type. |
| max_h<br>max_v | DEFINE_MAX_SAMPLING | MPEG | control software must configure. Sampling structure is fixed by standard. |
| | | JPEG | in coded data. |
| | | H.261 | automatically configured for 4:2:0 video. |
| max_component_id | MAX_COMP_ID | MPEG | control software must configure. Sampling structure is fixed by standard. |
| | | JPEG | in coded data. |
| | | H.261 | automatically configured for 4:2:0 video. |
| tq_0<br>tq_1<br>tq_2<br>tq_3 | JPEG_TABLE_SELECT | JPEG | in coded data. |
| | | MPEG | not used in standard. |
| | | H.261 | |
| blocks_h_0<br>blocks_h_1<br>blocks_h_2<br>blocks_h_3<br>blocks_v_0 | DEFINE_SAMPLING | MPEG | control software must configure. Sampling structure is fixed by standard. |
| | | JPEG | in coded data. |
| | | H.261 | automatically configured for 4:2:0 |

TABLE A.14.5-continued

Register to Token cross reference

| register | Token | standard | comment |
|---|---|---|---|
| blocks_v_1 | | | video. |
| blocks_v_2 | | | |
| blocks_v_3 | | | |
| dc_huff_0 | in scan header data | JPEG | in coded data. |
| dc_huff_1 | MPEG_DCH_TABLE | MPEG | control software must configure. |
| dc_huff_2 | | H.261 | not used in standard. |
| dc_huff_3 | | | |
| ac_huff_0 | in scan header data | JPEG | in coded data. |
| ac_huff_1 | | MPEG | not used in standard. |
| ac_huff_2 | | H.261 | |
| ac_huff_3 | | | |
| dc_bits_0[15.0] | in DATA Token following | JPEG | in coded data. |
| dc_bits_1[15:0] | DHT_MARKER Token | | |
| dc_huffval_0[11:0] | | MPEG | control software must configure. |
| dc_huffval_1[11:0] | | H.261 | not used in standard. |
| dc_zssss_0 | | | |
| dc_zssss_1 | | | |
| ac_bits_0[15:0] | in DATA Token following | JPEG | in coded data. |
| ac_bits_1[15:0] | DHT_MARKER Token | | |
| ac_huffval_0[161:0] | | MPEG | not used in standard. |
| ac_huffval_1[161:0] | | H.261 | |
| ac_eob_0 | | | |
| ac_eob_1 | | | |
| ac_zrl_0 | | | |
| ac_zrl_1 | | | |
| buffer_size | VBV_BUFFER_SIZE | MPEG | in coded data. |
| | | JPEG | not used in standard |
| | | H.261 | |
| pel_aspect | PEL_ASPECT | MPEG | in coded data. |
| | | JPEG | not used in standard |
| | | H.261 | |
| bit_rate | BIT_RATE | MPEG | in coded data. |
| | | JPEG | not used in standard |
| | | H.261 | |
| pic_rate | PICTURE_RATE | MPEG | in coded data. |
| | | JPEG | not used in standard |
| | | H.261 | |
| constrained | CONSTRAINED | MPEG | in coded data. |
| | | JPEG | not used in standard |
| | | H.261 | |
| picture_type | PICTURE_TYPE | MPEG | in coded data. |
| | | JPEG | not used in standard |
| | | H.261 | |
| broken_closed | BROKEN_CLOSED | MPEG | in coded data. |
| | | JPEG | not used in standard |
| | | H.261 | |
| prediction_mode | PREDICTION_MODE | MPEG | in coded data. |
| | | JPEG | not used in standard |
| | | H.261 | |
| h_261_pic_type | PICTURE_TYPE | MPEG | not relevant |
| | (when standard is H.261) | JPEG | |
| | | H.261 | in coded data. |
| vbv_delay | VBV_DELAY | MPEG | in coded data. |
| | | JPEG | not used in standard |
| | | H.261 | |
| pic_number | Carried by: | MPEG | Generated by start code detector. |
| | PICTURE_START | JPEG | |
| | | H.261 | |
| coding_standard | CODING_STANDARD | MPEG | configured in start code by control |
| | | JPEG | software detector. |
| | | H.261 | |

A.14.2 Picture Structure

In the present invention, picture dimensions are described to the Spatial Decoder in 2 different units: pixels and macroblocks. JPEG and MPEG both communicate picture dimensions in pixels. Communicating the dimensions in pixels determine the area of the buffer that contains the valid data; this may be smaller than the total buffer size. Communicating dimensions in macroblocks determines the size of buffer required by the decoder. The macroblock dimensions must be derived by the user from the pixel dimensions. The Spatial Decoder registers associated with this information are: horiz_pels, vert_pels, horiz_macroblocks and vert_macroblocks.

The Spatial Decoder registers, blocks_h_n, blocks_v_n, max_h, max_v and max_component_id specify the composition of the macroblocks (minimum coding units in JPEG). Each is a 2 bit register than can hold values in the range 0 to 3. All except max_component_id specify a block count of 1 to 4. For example, if register max_h holds 1, then a macroblock is two blocks wide. Similarly, max_component_id specifies the number of different color components involved.

TABLE A.14.6

| Configuration for various macroblock formats | | | | |
|---|---|---|---|---|
| | 2:1:1 | 4:2:2 | 4:2:0 | 1:1:1 |
| max_h | 1 | 1 | 1 | 0 |
| max_v | 0 | 1 | 1 | 0 |
| max_component_id | 2 | 2 | 2 | 2 |
| blocks_h_0 | 1 | 1 | 1 | 0 |
| blocks_h_1 | 0 | 0 | 0 | 0 |
| blocks_h_2 | 0 | 0 | 0 | 0 |
| blocks_h_3 | x | x | x | x |
| blocks_v_0 | 0 | 1 | 1 | 0 |
| blocks_v_1 | 0 | 1 | 0 | 0 |
| blocks_v_2 | 0 | 1 | 0 | 0 |
| blocks_v_3 | x | x | x | x |

A.14.3 Huffman Tables

A.14.3.1 JPEG Style Huffman Table Descriptions

In the invention, Huffman table descriptions are provided to the Spatial decoder via the format used by JPEG to communicate table descriptions between encoders and decoders. There are two elements to each table description: BITS and HUFFVAL. For a full description of how tables are encoded, the user is directed to the JPEG specification.

A.14.3.1.1 BITS

BITS is a table of values that describes how many different symbols are encoded with each length of VLC. Each entry is an 8 bit value. JPEG permits VLCs with up to 16 bits long, so there are 16 entries in each table.

The BITS[0] describes how many different 1 bit VLCs exist while BITS[1] describes how many different 2 bit VLCs exist and so forth.

A.14.3.1.2 HUFFVAL

HUFFVAL is table of 8 bit data values arranged in order of increasing VLC length. The size of this table will depend on the number of different symbols that can be encoded by the VLC.

The JPEG specification describes in further detail how Huffman coding tables can be encoded or decoded into this format.

A.14.3.1.3 Configuration by Tokens

In a JPEG bitstream, the DHT marker precedes the description of the Huffman tables used to code AC and DC coefficients. When the Start Code Detector recognizes a DHT marker, it generates a DHT_MARKER Token and places the Huffman table description in the following DATA Token (see A.11.3.4).

Configuration of AC and DC coefficient Huffman tables within the Spatial Decoder can be achieved by supplying DATA and DHT_MARKER Tokens to the input of the Spatial Decoder while the Spatial Decoder is configured for JPEG operation. This mechanism can be used for configuring the DC coefficient Huffman tables required for MPEG operation, however, the coding standard of the Spatial Decoder must be set to JPEG while the tables are down loaded.

TABLE A.14.7

Huffman table configuration via Tokens

| E | 7 | 6 | 5 | 4 | 3 | 2 | 1 | 0 | Token Name | |
|---|---|---|---|---|---|---|---|---|---|---|
| 1 | 0 | 0 | 0 | 1 | 0 | 1 | 0 | 1 | CODING_STANDARD | |
| 0 | 0 | 0 | 0 | 0 | 0 | 0 | 0 | 1 | 1 = JPEG | |
| 0 | 0 | 0 | 0 | 1 | 1 | 1 | 0 | 0 | DHT_MARKER | |
| 1 | 0 | 0 | 0 | 0 | 0 | 1 | x | x | DATA | |
| 1 | t | t | t | t | t | t | t | t | $T_h$ - Value indicating which Huffman table is to be loaded. JPEG allows 4 tables to be downloaded. Values 0x00 and 0x01 specify DC coefficient coding tables 0 and 1. Values 0x10 and 0x11 specifies AC coefficient coding tables 0 and 1. | This sequence can be repeated to allow several tables to be described in a single Token. |
| 1 | n | n | n | n | n | n | n | n | $L_i$ - 16 words carrying BITS information | |
| | | | | : | | | | | | |
| 1 | n | n | n | n | n | n | n | n | | |
| 1 | n | n | n | n | n | n | n | n | $V_{ij}$ - Words carrying HUFFVAL information (the number of words depends on the number of different symbols). | |
| | | | | : | | | | | | |
| e | n | n | n | n | n | n | n | n | e - the extension bit will be 0 if this is the endof the DATA Token or 1 if another table description is contained in the same DATA Token. | |

A.14.3.1.4 Configuration by MPI

The AC and DC coefficient Huffman tables can also be written directly to registers via the MPI. See Table A.14.3.

The registers dc_bits_0[15:0] and dc_bits_1[15:0] hold the BITS values for tables 0×00 and 0×01.

The registers ac_bits_0[15:0] and ac_bits_1[15:0] hold the BITS values for tables 0×10 and 0×11.

The registers dc_huffval_0[11:0] and dc_huffval_1[11:0] hold the HUFFVAL values for tables 0×00 and 0×01.

The registers ac_huffval_0[161:0] and ac_huffval_1[161:0] hold the HUFFVAL values for tables 0×10 and 0×11.

A.14.4 Configuring for Different Standards

The Video Demux supports the requirements of MPEG, JPEG and H.261. The coding standard is configured automatically by the CODING_STANDARD Token generated by the Start Code Detector.

A.14.4.1 H.261 Huffman Tables

All the Huffman tables required to decode H.261 are held in ROMs within the Spatial Decoder and more particular in the parser state machine of the Video demux and, therefore require no user intervention.

A.14.4.2 H.261 Picture Structure

H.261 is defined as supporting only two picture formats: CIF and QCIF. The picture format in use is signalled in the PTYPE section of the bitstream. When this data is decoded by the Spatial Decoder, it is placed in the h_261_pic_type registers and the PICTURE_TYPE Token. In addition, all the picture and macroblock construction registers are configured automatically.

The information in the various registers is also placed into their related Tokens (see Table A.14.5), and this ensures that other decoder chips (such as the Temporal Decoder) are correctly configured.

A.14.4.3 MPEG Huffman Tables

The majority of the Huffman coding tables required to decode MPEG are held in ROMs within the Spatial Decoder (again, in the parser state machine) and, thus, require no user intervention. The exceptions are the tables required for decoding the DC coefficients of Intral macroblocks. Two tables are required, one for chroma the other for luma. These must be configured by user software before decoding begins.

TABLE A.14.8

Automatic settings for H.261

| macroblock construction | CIF/ QCIF | picture construction | CIF | QCIF |
|---|---|---|---|---|
| max_h | 1 | horiz_pels | 352 | 176 |
| max_v | 1 | vert_pels | 288 | 144 |
| max_component_id | 2 | horiz_macroblocks | 22 | 11 |
| blocks_h_1 | 0 | vert_macroblocks | 18 | 9 |
| blocks_h_1 | 0 | | | |
| blocks_h_2 | 0 | | | |
| blocks_v_0 | 1 | | | |
| blocks_v_1 | 0 | | | |
| blocks_v_2 | 0 | | | |

Table A.14.10 shows the sequence of Tokens required to configure the DC coefficient Huffman tables within the Spatial Decoder. Alternatively, the same results can be obtained by writing this information to registers via the MPI.

The registers dc_huff_n control which DC coefficient Huffman tables are used with each color component. Table A.14.9 shows how they should be configured for MPEG operation. This can be done directly via the MPI or by using the MPEG_DCH_TABLE Token.

TABLE A.14.9

MPEG DC Huffman table selection via MPI

| | |
|---|---|
| dc_huff_0 | 0 |
| dc_huff_1 | 1 |
| dc_huff_2 | 1 |
| dc_huff_3 | x |

TABLE A.14.10

MPEG DC Huffman table configuration

| E | [7:0] | Token Name |
|---|---|---|
| 1 | 0x15 | CODING_STANDARD |
| 0 | 0x01 | 1 = JPEG |
| 0 | 0x1C | DHT_MARKER |
| 1 | 0x04 | DATA (could be any colour component. 0 is used in this example) |
| 1 | 0x00 | 0 indicates that this Huffman table is DC coefficient coding table 0 |
| 1 | 0x00 | 16 words carrying BITS information describing a total of 9 |
| 1 | 0x02 | different VLCs: |

TABLE A.14.10-continued

MPEG DC Huffman table configuration

| E | [7:0] | Token Name |
|---|---|---|
| 1 | 0x03 | 2,2 bit codes |
| 1 | 0x01 | 3,3 bit codes |
| 1 | 0x01 | 1,4 bit codes |
| 1 | 0x01 | 1,5 bit codes |
| 1 | 0x01 | 1,6 bit codes |
| 1 | 0x00 | 1,7 bit codes |
| 1 | 0x00 | if configuring via the MPI rather than with Tokens |
| 1 | 0x00 | these values would be |
| 1 | 0x00 | written into the dc_bits_0[15:0] registers. |
| 1 | 0x00 | |
| 1 | 0x00 | |
| 1 | 0x00 | |
| 1 | 0x00 | |
| 1 | 0x00 | |
| 1 | 0x01 | 9 words carrying HUFFVAL information |
| 1 | 0x02 | If configuring via the MPI rather than with Tokens |
| 1 | 0x00 | these values would be |
| 1 | 0x03 | written into the dc_huffval_0[11:0] registers. |
| 1 | 0x04 | |
| 1 | 0x05 | |
| 1 | 0x06 | |
| 1 | 0x07 | |
| 1 | 0x08 | |
| 0 | 0x1C | DHT_MARKER |
| 1 | 0x04 | DATA (could be any colour component, 0 is used in this example) |
| 1 | 0x01 | 1 indicates that this Huffman table is DC coefficient coding table 1 |
| 1 | 0x00 | 16 words carrying BITS information describing a total of 9 |
| 1 | 0x03 | different VLCs: |
| 1 | 0x01 | 3,2 bit codes |
| 1 | 0x01 | 1,3 bit codes |
| 1 | 0x01 | 1,4 bit codes |
| 1 | 0x01 | 1,5 bit codes |
| 1 | 0x01 | 1,6 bit codes |
| 1 | 0x01 | 1,7 bit codes |
| 1 | 0x00 | 1,8 bit codes |
| 1 | 0x00 | If configuring via the MPI rather than with Tokens |
| 1 | 0x00 | these values would be |
| 1 | 0x00 | written into the dc_bits_1[15:0] registers. |
| 1 | 0x00 | |
| 1 | 0x00 | |
| 1 | 0x00 | |
| 1 | 0x00 | |
| 1 | 0x00 | 9 words carrying HUFFVAL information |
| 1 | 0x01 | If configuring via the MPI rather than with Tokens |
| 1 | 0x02 | these values would be |
| 1 | 0x03 | written into the dc_huffval_1[11:0] registers. |
| 1 | 0x04 | |
| 1 | 0x05 | |
| 1 | 0x06 | |
| 1 | 0x07 | |
| 0 | 0x08 | |
| 1 | 0xD4 | MPEG_DCH_TABLE |
| 0 | 0x00 | Configure so table 0 is used for component 0 |
| 1 | 0xD5 | MPEG_DCH_TABLE |
| 0 | 0x01 | Configure so table 1 is used for component 1 |
| 1 | 0xD6 | MPEG_DCH_TABLE |
| 0 | 0x01 | Configure so table 1 is used for component 2 |
| 1 | 0x15 | CODING_STANDARD |
| 0 | 0x02 | 2 = JPEG |

A.14.4.4 MPEG Picture Structure

The macroblock construction defined for MPEG is the same as that used by H.261. The picture dimensions are encoded in the coded data.

For standard 4:2:0 operation, the macroblock characteristics should be configured as indicated in Table A.14.8. This can be done either by writing to the registers as indicated or by applying the equivalent Tokens (see Table A.14.5) to the input of the Spatial Decoder.

The approach taken to configure picture dimensions will depend upon the application. If the picture format is known before decoding starts, then the picture construction registers listed in Table A.14.8 can be initialized with appropriate values. Alternatively, the picture dimensions can be decoded from the coded data and used to configure the Spatial Decoder. In this case the user must service the parser error ERR_MPEG_SEQUENCE, see A.14.8, "Changes at the MPEG sequence layer".

A.14.4.5 JPEG

Within baseline JPEG, there are a number of encoder options that significantly alter the complexity of the control software required to operate the decoder. In general, the Spatial Decoder has been designed so that the required support is minimal where the following condition is met:

Number of color components per frame is less than 5($N_f \leqq 4$)

A.14.4.6 JPEG Huffman Tables

Furthermore, JPEG allows Huffman coding tables to be down loaded to the decoder. These tables are used when decoding the VLCs describing the coefficients. Two tables are permitted per scan for decoding DC coefficients and two for the AC coefficients.

There are three different types of JPEG file: Interchange format, an abbreviated format for compressed image data, and an abbreviated format for table data. In an interchange format file there is both compressed image data and a definition of all the tables (Huffman, Quantization etc.) required to decode the image data. The abbreviated image data format file omits the table definitions. The abbreviated table format file only contains the table definitions.

The Spatial Decoder will accept all three formats. However, abbreviated image data files can only be decoded if all the required tables have been defined. This definition can be done via either of the other two JPEG file types, or alternatively, the tables could be set-up by user software.

If each scan uses a different set of Huffman tables, then the table definitions are placed (by the encoder) in the coded data before each scan. These are automatically loaded by the Spatial Decoder for use during this and any subsequent scans.

To improve the performance of the Huffman decoding, certain commonly used symbols are specially cased. These are: DC coefficient with magnitude 0, end of block AC coefficients and run of 16 zero AC coefficients. The values for these special cases should be written into the appropriate registers.

A.14.4.6.1 Table Selection

The registers dc_huff_n and ac_huff_n control which AC and DC coefficient Huffman tables are used with which color component. During JPEG operation, these relationships are defined by the $TD_j$ and $Ta_j$ fields of the scan header syntax.

A.14.4.7 JPEG Picture Structure

There are two distinct levels of baseline JPEG decoding supported by the Spatial Decoder: up to 4 components per frame ($N_f \leqq 4$) and greater than 4 components per frame ($N_f > 4$). If $N_f > 4$ is used, the control software required becomes more complex.

A.14.4.7.1 $N_f \leqq 4$

The frame component specification parameters contained in the JPEG frame header configure the macroblock construction registers (see Table A.14.8) when they are decoded. No user intervention is required, as all the specifications required to decode the 4 different color components as defined.

For further details of the options provided by JPEG the reader should study the JPEG specification. Also, there is a short description of JPEG picture formats in §A.16.1.

A.14.4.7.2 JPEG with more than 4 Components

The Spatial Decoder can decode JPEG files containing up to 256 different color components (the maximum permitted by JPEG). However, additional user intervention is required if more than 4 color component are to be decoded. JPEG only allows a maximum of 4 components in any scan. only allows a maximum of 4 components in any scan.

A.14.4.8 Non-standard Variants

As stated above, the Spatial Decoder supports some picture formats beyond those defined by JPEG and MPEG.

JPEG limits minimum coding units so that they contain no more than 10 blocks per scan. This limit does not apply to the Spatial Decoder since it can process any minimum coding unit that can be described by blocks_h_n, blocks_v_n, max_h and max_v.

MPEG is only defined for 4:2:0 macroblocks (see Table A.14.8). However, the Spatial Decoder can process three other component macroblock structures, (e.g., 4:2:2.

A.14.5 Video Events and Errors

The Video Demux can generate two types of events: parser events and Huffman events. See A.6.3, "Interrupts", for a description of how to handle events and interrupts.

A.14.5.1 Huffman Events

Huffman events are generated by the Huffman decoder. The event which is indicated in huffman_event and huffman_mask determines whether an interrupt is generated. If huffman_mask is set to 1, an interrupt will be generated and the Huffman decoder will halt. The register huffman_error_code[2:0] will hold a value indicating the cause of the event.

If 1 is written to huffman_event after servicing the interrupt, the Huffman decoder will attempt to recover from the error. Also, if huffman_mask was set to 0 (masking the interrupt and not halting the Huffman decoder) the Huffman decoder will attempt to recover from the error automatically.

A.14.5.2 Parser Events

Parser events are generated by the Parser. The event is indicated in parser_event. Thereafter, parser_mask determines whether an interrupt is generated. If parser_mask is set to 1, an interrupt will be generated and the Parser will halt. The register parser_error_code[7:0] will hold a value indicating the cause of event.

If 1 is written to huffman_event after servicing the interrupt, the Huffman decoder will attempt to recover from the error. Also, if huffman_mask was set to 0 (masking the interrupt and not halting the Huffman decoder) the Huffman decoder will attempt to recover form the error automatically.

If 1 is written to parser_event after servicing the interrupt, the Parser will start operation again. If the event indicated a bitstream error, the Video Demux will attempt to recover from the error.

If parser_mask was set to 0, the Parser will set its event bit, but will not generate an interrupt or halt. It will continue operation and attempt to recover from the error automatically.

TABLE A.14.11

Huffman error codes

| huffman_error_code | | | |
|---|---|---|---|
| [2] | [1] | [0] | Description |
| 0 | 0 | 0 | No error. This error should not occur during normal operation. |
| X | 0 | 1 | Failed to find terminal code in VLC within 16 bits. |

TABLE A.14.11-continued

Huffman error codes

| huffman_error_code [2] | [1] | [0] | Description |
|---|---|---|---|
| X | 1 | 0 | Found serial data when Token expected |
| X | 1 | 1 | Found Token when serial data expected |
| 1 | X | X | Information describing more than 64 coefficients for a single block was decoded indicating a bitstream error. The block output by the Video Demux will contain only 64 coefficients. |

TABLE A.14.12

Parser error codes

| parser_error_code[7:0] | Description |
|---|---|
| 0x00 | ERR_NO_ERROR<br>No Parser error has occured, this event should not occur during normal operation. |
| 0x10 | ERR_EXTENSION_TOKEN<br>An EXTENSION_DATA Token has been detected by the Parser. The detection of this Token should preceed a DATA Token that contains the extension data. See A.14.6 |
| 0x11 | ERR_EXTENSION_DATA<br>Following the detection of an EXTENSION_DATA Token, a DATA Token containing the extension data has been detedcted. See A.14.6 |
| 0x12 | ERR_USER_TOKEN<br>A USER_DATA Token has been detected by the Parser. The detection of this Token should preceed a DATA Token that contains the user data. See A.14.6 |
| 0x13 | ERR_USER_DATA<br>Following the detection of a USER_DATA Token, a DATA Token containing the user data has been detedcted. See A.14.6 |
| 0x20 | ERR_PSPARE<br>H.261 PSARE information has been detected see A.14.7 |
| 0x21 | ERR_GSPARE<br>H.261 GSARE information has been detected see A.14.7 |
| 0x22 | ERR_PTYPE<br>The value of the H.261 picture type has changed. The register h_261_pic_type can be inspected to see what the new value is. |
| 0x30 | ERR_JPEG_FRAME |
| 0x31 | ERR_JPEG_FRAME_LAST |
| 0x32 | ERR_JPEG_SCAN<br>Picture size or Ns changed |
| 0x33 | ERR_JPEG_SCAN_COMP<br>Component Change! |
| 0x34 | ERR_DNL_MARKER |
| 0x40 | ERR_MPEG_SEQUENCE<br>One of the parameters communicated in the MPEG sequence layer has changed. See A.14.8 |
| 0x41 | ERR_EXTRA_PICTURE<br>MPEG extra_information_picture has been detected see A.14.7 |
| 0x42 | ERR_EXTRA_SLICE<br>MPEG extra_information_slice has been detected see A.14.7 |
| 0x43 | ERR_VBV_DELAY<br>The VBV_DELAY parameter for the first picture in a new MPEG video sequence has been detected by the Video Demux. The new value of delay is available in the register vbv_delay.<br>The first picture of a new sequence is defined as the first picture after a sequence end, FLUSH or reset. |

TABLE A.14.12-continued

Parser error codes

| parser_error_code[7:0] | Description |
|---|---|
| 0x80 | ERR_SHORT_TOKEN<br>An incorrectly formed Token has been detected. This error should not occur during normal operation. |
| 0x90 | ERR_H261_PIC_END_UNEXPECTED<br>During H.261 operation the end of a picture has been encountered at an unexpected position. This is likely to indicate an error in the coded data. |
| 0x91 | ERR_GN_BACKUP<br>During H.261 operation a group of blocks has been encountered with a group number less than that expected. This is likely to indicate an error in the coded data. |
| 0x92 | ERR_GN_SKIP_GOB<br>During H.261 operation a group of blocks has been encountered with a group number greater than that expected. This is likely to indicate an error in the coded data. |
| 0xA0 | ERR_NBASE_TAB<br>During JPEG operation there has been an attempt to down load a Huffman table that is not supported by baseline JPEG (baseline JPEG only supports tables 0 and 1 for entropy coding). |
| 0xA1 | ERR_QUANT_PRECISION<br>During JPEG operation there has been an attempt to down load a quantisation table that is not supported by baseline JPEG (baseline JPEG only supports 8 bit precision in quantisation tables). |
| 0xA2 | ERR_SAMPLE_PRECISION<br>During JPEG operation there has been an attempt to specify a sample precision greater than that supported by baseline JPEG (baseline JPEG only supports 8 bit precision). |
| 0xA3 | ERR_NBASE_SCAN<br>One or more of the JPEG scan header parameters Ss, Se, Ah and Al is set to a value not supported by baseline JPEG (indicating spectral selection and/or successive approximation which are not supported in baseline JPEG). |
| 0xA4 | ERR_UNEXPECTED_DNL<br>During JPEG operation a DNL marker has been encountered in a scan that is not the first scan in a frame. |
| 0xA5 | ERR_EOS_UNEXPECTED<br>During JPEG operation an EOS marker has been encountered in an unexpected place. |
| 0xA6 | ERR_RESTART_SKIP<br>During JPEG operation a restart marker has been encountered either in in an unexpected place or the value of the restart marker is unexpected. If a restart marker is not found when one is expected the Huffman event "Found serial data when Token expected" will be generated. |
| 0xB0 | ERR_SKIP_INTRA<br>During MPEG operation, a macro block with a macro block address increment greater than 1 has been found within an intra (I) picture. This is illegal and probably indicates a bitstream error. |
| 0xB1 | ERR_SKIP_DINTRA<br>During MPEG operation, a macro block with a macro block address increment greater than 1 has been found within an DC only (D) picture. This is illegal and probably indicates a bitstream error. |
| 0xB2 | ERR_BAD_MARKER<br>During MPEG operation, a marker bit did not have the expected value. This is probably indicates a bitstream error. |
| 0xB3 | ERR_D_MBTYPE |

TABLE A.14.12-continued

Parser error codes

| parser_error_code[7:0] | Description |
|---|---|
| | During MPEG operation, within a DC only (D) picture, a macroblock was found with a macroblock type other than 1. This is illegal and probably indicates a bitstream error. |
| 0xB4 | ERR_D_MBEND<br>During MPEG operation, within a DC only (D) picture, a macroblock was found with 0 in it's end of macroblock bit. This is illegal and probably indicates a bitstream error. |
| 0xB5 | ERR_SVP_BACKUP<br>During MPEG operation, a slice has been encountered with a slice vertical position less than that expected. This is likely to indicate an error in the coded data |
| 0xB6 | ERR_SVP_SKIP_ROWS<br>During MPEG operation, a slice has been encountered with a slice vertical position greater than that expected. This is likely to indicate an error in the coded data. |
| 0xB7 | ERR_FST_MBA_BACKUP<br>During MPEG operation, a macroblock has been encountered with a macro block address less than that expected. This is likely to indicate an error in the coded data. |
| 0xB8 | ERR_FST_MBA_SKIP<br>During MPEG operation, a macroblock has been encountered with a macro block address greater than that expected. This is likely to indicate an error in the coded data. |
| 0xB9 | ERR_PICTURE_END_UNEXPECTED<br>During MPEG operation, a PICTURE_END Token has been encountered in an unexpected place. This is likely to indicate an error in the coded data. |
| 0xE0 . . . 0xEF | Errors reserved for internal test programs |
| 0xE0 | ERR_TST_PROGRAM<br>Mysteriously arrived in the test program |
| 0xE1 | ERR_NO_PROGRAM<br>If the test program is not compiled in |
| 0xE2 | ERR_TST_END<br>End of Test |
| 0xF0 . . . 0xFF | Reserved errors |
| 0xF0 | ERR_UCODE_ADDR<br>fell off the end of the world |
| 0xF1 | ERR_NOT_IMPLEMENTED |

TABLE A.14.13

Parser error codes and the different standards

| Token Name | MPEG | JPEG | H.261 |
|---|---|---|---|
| ERR_NO_ERROR | ✓ | ✓ | ✓ |
| ERR_EXTENSION_TOKEN | ✓ | ✓ | |
| ERR_EXTENSION_DATA | ✓ | ✓ | |
| ERR_USER_TOKEN | ✓ | ✓ | |
| ERR_USER_DATA | ✓ | ✓ | |
| ERR_PSPARE | | | ✓ |
| ERR_GSPARE | | | ✓ |
| ERR_PTYPE | | | ✓ |
| ERR_JPEG_FRAME | | ✓ | |
| ERR_JPEG_FRAME_LAST | | ✓ | |
| ERR_JPEG_SCAN | | ✓ | |
| ERR_JPEG_SCAN_COMP | | ✓ | |
| ERR_DNL_MARKER | | ✓ | |
| ERR_MPEG_SEQUENCE | ✓ | | |
| ERR_EXTRA_PICTURE | ✓ | | |
| ERR_EXTRA_SLICE | ✓ | | |
| ERR_VBV_DELAY | ✓ | | |
| ERR_SHORT_TOKEN | ✓ | ✓ | ✓ |
| ERR_H261_PIC_END_UNEXPECTED | | | ✓ |
| ERR_GN_BACKUP | | | ✓ |

TABLE A.14.13-continued

Parser error codes and the different standards

| Token Name | MPEG | JPEG | H.261 |
|---|---|---|---|
| ERR_GN_SKIP_GOB | | | ✓ |
| ERR_NBASE_TAB | | ✓ | |
| ERR_QUANT_PRECISION | | ✓ | |
| ERR_SAMPLE_PRECISION | | ✓ | |
| ERR_NBASE_SCAN | | ✓ | |
| ERR_UNEXPECTED_DNL | | ✓ | |
| ERR_EOS_UNEXPECTED | | ✓ | |
| ERR_RESTART_SKIP | | ✓ | |
| ERR_SKIP_INTRA | ✓ | | |
| ERR_SKIP_DINTRA | ✓ | | |
| ERR_BAD_MARKER | ✓ | | |
| ERR_D_MBTYPE | ✓ | | |
| ERR_D_MBEND | ✓ | | |
| ERR_SVP_BACKUP | ✓ | | |
| ERR_SVP_SKIP_ROWS | ✓ | | |
| ERR_FST_MBA_BACKUP | ✓ | | |
| ERR_FST_MBA_SKIP | ✓ | | |
| ERR_PICTURE_END_UNEXPECTED | ✓ | | |
| ERR_TST_PROGRAM | ✓ | ✓ | ✓ |
| ERR_NO_PROGRAM | ✓ | ✓ | ✓ |
| ERR_TST_END | ✓ | ✓ | ✓ |
| ERR_UCODE_ADDR | ✓ | ✓ | ✓ |
| ERR_NOT_IMPLEMENTED | ✓ | ✓ | 558 |

A.14.6 Receiving User and Extension Data

MPEG and JPEG use similar mechanisms to embed user and extension data. The data is preceded by a start/marker code. The Start Code Detector can be configured to delete this data (see A.11.3.3) if the application has no interest in such data.

A.14.6.1 Identifying the Source of the Data

The Parser events, ERR_EXTENSION_TOKEN and ERR_USER_TOKEN, indicate the arrival of the EXTENSION_DATA or USER_DATA Token at the Video Demux. If these Tokens have been generated by the Start Code Detector, (see A.11.3.3) they will carry the value of the start/marker code that caused the Start Code Detector to generate the Token (see Table A.11.4). This value can be read by reading the rom_revision register while servicing the Parser interrupt. The Video Demux will remain halted until 1 is written to parser_event (see A.6.3, "Interrupts").

A.14.6.2 Reading the Data

The EXTENSION_DATA and USER_DATA Tokens are expected to be immediately followed by a DATA Token carrying the extension or user data. The arrival of this DATA Token at the Video Demux will generate either an ERR_EXTENSION_DATA or an ERR_USER_DATA Parser event. The first byte of the DATA Token can be read by reading the rom_revision register while servicing the interrupt.

The state of the Video Demux register, continue, determines behavior after the event is cleared. If this register holds the value 0, then any remaining data in the DATA Token will be consumed by the Video Demux and no events will be generated. If the continue is set to 1, an event will be generated as each byte of extension or user data arrives at the Video Demux. This continues until the DATA Token is exhausted or continue is set to 0.

NOTE:

1)The first byte of the extension/user data is always presented via the rom_revision register regardless of the state of continue.

2)There is no event indicating that the last byte of extension/user data has been read.

A.14.7 Receiving Extra Information

H.261 and MPEG allow information extending the coding standard to be embedded within pictures and groups of blocks (H.261) or slices (MPEG). The mechanism is different from that used for extension and user data (described in Section A.14.6). No start code precedes the data and, thus, it cannot be deleted by the Start Code Detector.

During H.261 operation, the Parser events ERR_PSPARE and ERR_GSPARE indicate the detection of this information. The corresponding events during MPEG operation are ERR_EXTRA_PICTURE and ERR_EXTRA_SLICE.

When the Parser event is generated, the first byte of the extra information is presented through the register, rom_revision.

The state of the Video Demux register, continue, determines behavior after the event is cleared. If this register holds the value 0, then any remaining extra information will be consumed by the Video Demux and no events will be generated. If the continue is set to 1, an event will be generated as each byte of extra information arrives at the Video Demux. This continues until the extra information is exhausted or continue is set to 0.

NOTE:

1)The first byte of the extension/user data is always presented via the rom_revision register regardless of the state of continue.

2)There is no event indicating that the last byte of extension/user data has been read.

A.14.7.1 Generation of the FIELD INFO Token

During MPEG operation, if the register field_info is set to 1, the first byte of any extra_information_picture is placed in the FIELD_INFO Token. This behavior is not covered by the standardization activities of MPEG. Table A.3.2 shows the definition of the FIELD_INFO Token.

If field_info is set to 1, no Parser event will be generated for the first byte of extra_information_picture. However, events will be generated for any subsequent bytes of extra_information_picture. If there is only a single byte of extra_information_picture, no Parser event will occur.

A.14.8 Changes at the MPEG Sequence Layer

The MPEG sequence header describes the following characteristic of the video about to be decoded:

horizontal and vertical size pixel aspect ratio picture rate coded data rate video buffer verifier buffer size If any of these parameters change when the Spatial Decoder decodes a sequence header, the Parser event ERR_MPEG_SEQUENCE will be generated.

A.14.8.1 Change in Picture Size

If the picture size has changed, the user's software should read the values in horiz_pels and vert_pels and compute new values to be loaded into the registers horiz_macroblocks and vert_macroblocks.

SECTION A.15 Spatial Decoding

In accordance with the present invention, the spatial decoding occurs between the output of the Token buffer and the output of the Spatial Decoder.

There are three main units responsible for spatial decoding: the inverse modeler, the inverse quantizer and the inverse discrete cosine transformer. At the input to this section (from the Token buffer) DATA Tokens contain a run and level representation of the quantized coefficients. At the output (of the inverse DCT) DATA Tokens contain 8×8 blocks of pixel information.

A.15.1 The Inverse Modeler

DATA Tokens in the Token buffer contain information about the values of quantized coefficients and the number of zeros between the coefficients that are represented. The Inverse Modeler expands the information about runs of zeros so that each DATA Token contains 64 values. At this point, the values in the DATA Tokens are quantized coefficients.

The inverse modelling process is the same regardless of the coding standard currently being used. No configuration is required.

For a better understanding of the modelling and inverse modelling function all requirements the reader can examine any of the picture coding standards.

A.15.2 Inverse Quantizer

In an encoder, the quantizer divides down the output of the DCT to reduce the resolution of the DCT coefficients. In a decoder, the function of the inverse quantizer is to multiply up these quantized DCT coefficients to restore them to an approximation of their original values.

A.15.2.1 Overview of the Standard Quantization Schemes

There are significant differences in the quantization schemes used by each of the different coding standards. To obtain a detailed understanding of the quantization schemes used by each of the standards the reader should study the relevant coding standards documents.

The register iq_coding_standard configures the operation of the inverse quantizer to meet the requirements of the different standards. In normal operation, this coding register is automatically loaded by the CODING_STANDARD Token. See section A.21.1 for more information about coding standard configuration.

The main difference between the quantization schemes is the source of the numbers by which the quantized coefficients are multiplied. These are outlined below. There are also detail differences in the arithmetic operations required (rounding etc.), which are not described here.

A.15.2.1.1 H.261 IO Overview

In H.261, a single "scale factor" is used to scale the coefficients. The encoder can change this scale factor periodically to regulate the data rate produced. Slightly different rules apply to the "DC" coefficient in intra coded blocks.

A.15.2.1.2 JPEG IO Overview

Baseline JPEG allows for a picture that contains up to 4 different color components in each scan. For each of these 4 color components, a 64 entry quantization table can be specified. Each entry in these tables is used as the "scale" factor for one of the 64 quantized coefficients.

The values for the JPEG quantization tables are contained in the coded JPEG data and will be loaded automatically into the quantization tables.

A.15.2.1.3 MPEG IO Overview

MPEG uses both H.261 and JPEG quantization techniques. Like JPEG, 4 quantization tables, each with 64 entries, can be used. However, use of the tables is quite different.

Two "types" of data are considered: intra and non-intra. A different table is used for each data type. Two "default" tables are defined by MPEG. One is for use with intra data and the other with non-intra data (see Table A.15.2 and Table A.15.3). These default tables must be written into the quantization table memory of the Spatial Decoder before MPEG decoding is possible.

MPEG also allows two "down loaded" quantization tables. One is for use with intra data and the other with non-intra data. The values for these tables are contained in the MPEG data stream and will be loaded into the quantization table memory automatically.

The value output from the tables is modified by a scale factor.

A.15.2.2 Inverse Quantizer Registers

TABLE A.15.1

Inverse quantizer registers

| Register name | Size/ Dir. | Reset State | Description |
|---|---|---|---|
| iq_access | 1 rw | 0 | This access bit stops the operation of the inverse quantiser so that its various registers can be accessed reliably. See A.6.4.1 |
| iq_coding_standard | 2 rw | 0 | This register configures the coding standard used by the inverse quantiser. The register can be loaded directly or by a CODING_ STANDARD Token. See A.21.1 |
| iq_keyhole_address | 8 rw | x | Keyhole access to the which holds the 4 quantiser tables. See A.6.4.3 |
| iq_keyhole_data | 8 rw | x | for more information about accessing registers through a keyhole. |

In the present invention, the iq_access register must be set before the quantization table memory can be accessed. The quantization table memory will return the value zero if an attempt is made to read it while iq_access is set to 0.

A.15.2.3 Configuring the Inverse Quantizer

In normal operation, there is no need to configure the inverse quantizer's coding standard as this will be automatically configured by the CODING_STANDARD Token.

For H.261 operation, the quantizer tables are not used. No special configuration is required. For JPEG operation, the tables required by the inverse quantizer should be automatically loaded with information extracted from the coded data.

MPEG operation requires that the default quantization tables are loaded. This should be done while iq_access is set to 1. The values in Table A.15.2 should be written into locations 0×00 to 0×3F of the inverse quantizer's extended address space (accessible through the keyhole registers iq_keyhole_address and iq_keyhole data). Similarly, the values in Table A.15.3 should be written into locations 0×40 to 0×7F of the inverse quantizer's extended address space.

TABLE A.15.2

Default MPEG table for intra coded blocks

| i[a] | $W_{i,0}$[b] | i | $W_{i,0}$ | i | $W_{i,0}$ | i | $W_{i,0}$ |
|---|---|---|---|---|---|---|---|
| 0 | 8 | 16 | 27 | 32 | 29 | 48 | 35 |
| 1 | 16 | 17 | 27 | 33 | 29 | 49 | 38 |
| 2 | 16 | 18 | 26 | 34 | 27 | 50 | 38 |
| 3 | 19 | 19 | 26 | 35 | 27 | 51 | 40 |
| 4 | 16 | 20 | 26 | 36 | 29 | 52 | 40 |
| 5 | 19 | 21 | 26 | 37 | 29 | 53 | 40 |
| 6 | 22 | 22 | 27 | 38 | 32 | 54 | 48 |
| 7 | 22 | 23 | 27 | 39 | 32 | 55 | 48 |
| 8 | 22 | 24 | 27 | 40 | 34 | 56 | 46 |
| 9 | 22 | 25 | 29 | 41 | 34 | 57 | 46 |
| 10 | 22 | 26 | 29 | 42 | 37 | 58 | 56 |
| 11 | 22 | 27 | 29 | 43 | 38 | 59 | 56 |
| 12 | 26 | 28 | 34 | 44 | 37 | 60 | 58 |
| 13 | 24 | 29 | 34 | 45 | 35 | 61 | 69 |

TABLE A.15.2-continued

Default MPEG table for intra coded blocks

| i[a] | $W_{i,0}$[b] | i | $W_{i,0}$ | i | $W_{i,0}$ | i | $W_{i,0}$ |
|---|---|---|---|---|---|---|---|
| 14 | 26 | 30 | 34 | 46 | 35 | 62 | 69 |
| 15 | 27 | 31 | 29 | 47 | 34 | 63 | 83 |

[a]Offset from start of quantization table memory
[b]Quantization table value.

TABLE A.15.3

Default MPEG table for non-intra coded blocks

| i | $W_{i,1}$ | i | $W_{i,1}$ | i | $W_{i,1}$ | i | $W_{i,1}$ |
|---|---|---|---|---|---|---|---|
| 0 | 16 | 16 | 16 | 32 | 16 | 48 | 16 |
| 1 | 16 | 17 | 16 | 33 | 16 | 49 | 16 |
| 2 | 16 | 18 | 16 | 34 | 16 | 50 | 16 |
| 3 | 16 | 19 | 16 | 35 | 16 | 51 | 16 |
| 4 | 16 | 20 | 16 | 36 | 16 | 52 | 16 |
| 5 | 16 | 21 | 16 | 37 | 16 | 53 | 16 |
| 6 | 16 | 22 | 16 | 38 | 16 | 54 | 16 |
| 7 | 16 | 23 | 16 | 39 | 16 | 55 | 16 |
| 8 | 16 | 24 | 16 | 40 | 16 | 56 | 16 |
| 9 | 16 | 25 | 16 | 41 | 16 | 57 | 16 |
| 10 | 16 | 26 | 16 | 42 | 16 | 58 | 16 |
| 11 | 16 | 27 | 16 | 43 | 16 | 59 | 16 |
| 12 | 16 | 28 | 16 | 44 | 16 | 60 | 16 |
| 13 | 16 | 29 | 16 | 45 | 16 | 61 | 16 |
| 14 | 16 | 30 | 16 | 46 | 16 | 62 | 16 |
| 15 | 16 | 31 | 16 | 47 | 16 | 63 | 16 |

A.15.2.4 Configuring Tables from Tokens

As an alternative to configuring the inverse quantizer tables via the MPI, they can be initialized by Tokens. These Tokens can be supplied via either the coded data port or the MPI.

The QUANT_TABLE Token is described in Table A.3.2. It has a two bit field tt which specifies which of the 4 (0 to 3) table locations is defined by the Token. For MPEG operation, the default definitions of tables 0 and 1 need to be loaded.

A.15.2.5 Quantization Table Values

For both JPEG and MPEG, the quantization table entries are 8 bit numbers. The values 255 to 1 are legal. The value 0 is illegal.

A.15.2.6 Number Ordering of Quantization Tables

The quantization table values are used in "zig-zag" scan order (see the coding standards). The tables should be viewed as a one dimensional array of 64 values (rather than a 8×8 array). The table entries at lower addresses correspond to the lower frequency DCT coefficients.

When quantization table values are carried by a QUANT_TABLE Token, the first value after the Token header is the table entry for the "DC" coefficient.

A.15.2.7 Inverse Quantizer Test Registers

TABLE A.15.4

Inverse quantiser test registers

| Register name | Size/Dir. | Reset State | Description |
|---|---|---|---|
| iq_quant_scale | 5 rw | | This register holds the current value of the quantisation scale factor. It is loaded by the QUANT_SCALE Token. This is not used during JPEG operation. |
| iq_component | 2 rw | | This register holds the two bit component ID taken from the most recent DATA Token head. This value is involved in the selection of the quantiser table. The register will also hold the table ID after a QUANT_TABLE Token arrives to load the table. |
| iq_prediction_mode | 2 rw | | This holds the two LSBs of the most recent PREDICTION_MODE Token. |
| iq_ipeg_indirection | 8 rw | | This register relates the two bit component ID number of a DATA Token to the table number of the quantisation table that should be used. Bits 1:0 specify the table number that will be sued with component 0 Bits 3:2 specify the table number that will be sued with component 1 Bits 5:4 specify the table number that will be sued with component 2 Bits 7:6 specify the table number that will be sued with component 3 This register is loaded by JPEG_TABLE_SELECT Tokens. |
| iq_mpeg_indirection | 2 rw | 0 | This two bit register records whether to use default of down loaded quantisation tables with the intra and non-intra data. A 0 in the bit position indicates that the default table should be used. A 1 indicates that a down loaded table should be used. Bit 0 refers to intra data. Bit 1 refers to non-intra data. This register is normally loaded by the Token MPEG_TABLE_SELECT. |

A.15.3 Inverse Discrete Cosine Transform

The inverse discrete transform processor of the present invention meets the requirements set out in CCITT recommendation H.261, the IEEE specification P1180 and complies with the requirements described in current draft revision of MPEG.

The inverse discrete cosine transform process is the same regardless of which coding standard is used. No, configuration by the user is required.

There are two events associated with the inverse discrete transform processor.

TABLE A.15.5

Inverse DCT event registers

| Register name | Size/Dir. | Reset State | Description |
|---|---|---|---|
| idct_too_few_event | 1 rw | 0 | The inverse DCT requires that all DATA Tokens contain exactly 64 values. If less than 64 values are found then the too-few event will be |
| idct_too_few_mask | 1 rw | 0 | generated. If the mask register is set to 1 then an interrupt can be generated and the inverse DCT will halt This event should only occur following an error in the coded data. |
| idct_too_many_event | 1 rw | 0 | The inverse DCT requires that all DATA Tokens contain exactly 64 values. If more than 64 values are found then the too-many event will be |
| idct_too_many_mask | 1 rw | 0 | generated. If the mask register is set to 1 then an interrupt can be generated and the inverse DCT will halt. This event should only occur following an error in the coded data. |

For a better understanding of the DCT and inverse DCT function the reader can examine any of the picture coding standards.

SECTION A.16 Connecting to the Output of Spatial Decoder

The output of the Spatial Decoder is a standard Token Port with 9 bit wide data words. See Section A.4 for more information about the electrical behavior of the interface.

The Tokens present at the output will depend on the coding standard employed. By way of example, this section of the disclosure looks at the output of the Spatial Decoder when configured for JPEG operation. This section also describes the Token sequence observed at the output of the Temporal Decoder during JPEG operation as the Temporal Decoder doesn't modify the Token sequence that results from decoding JPEG.

However, MPEG and H.261 both require the use of the Temporal Decoder. See section A.19 for information about connecting to the output of the Temporal Decoder when configured for MPEG and H.261 operation.

Furthermore, this section identifies which of the Tokens are available at the output of the Spatial Decoder and which are most useful when designing circuits to display that output. Other Tokens will be present, but are not needed to display the output and, therefore, are not discussed here.

This section concentrates on showing:

How the start and end of sequences can be identified.

How the start and end of pictures can be identified.

How to identify when to display the picture.

How to identify where in the display the picture data should be placed.

A.16.1 Structure Structure of JPRG pictures

This section provides an overview of some features of the JPEG syntax. Please refer to the coding standard for full details.

JPEG provides a variety of mechanisms for encoding individual pictures. JPEG makes no attempt to describe how a collection of pictures could be encoded together to provide a mechanism for encoding video.

The Spatial Decoder, in accordance with the present invention, supports JPEG's baseline sequential mode of operation. There are three main levels in the syntax: Image, Frame and Scan. A sequential image only contains a single frame. A frame can contain between 1 and 256 different image (color) components. These image components can be grouped, in a variety of ways, into scans. Each scan can contain between 1 and 4 image components (see FIG. 81 "Overview of JPEG baseline sequential structure").

If a scan contains a single image component, it is non-interleaved, if it contains more than one image component, it is an interleaved scan. A frame can contain a mixture of interleaved and non-interleaved scans. The number of scans that a frame can contain is determined by the 256 limit on the number of image components that a frame can contain.

Within an interleaved scan, data is organized into minimum coding units (MCUS) which are analogous to the macroblock used in MPEG and H.261. These MCUs are raster ordered within a picture. In a non-interleaved scan, the MCU is a single 8×8 block. Again, these are raster organized.

The Spatial Decoder can readily decode JPEG data containing 1 to 4 different color components. Files describing greater numbers of components can also be decoded. However, some reconfiguration between scans may be required to accommodate the next set of components to be decoded.

A.16.2 Token Sequence

The JPEG markers codes are converted to an analogous MPEG named Token by the Start Code Detector (see Table A.11.4, see FIG. 82 "Tokenized JPEG picture").

SECTION A.17 Temporal Decoder

30 $MH_z$ operation

Provides temporal decoding for MPEG & H.261 video decoders

H.261 CIF and QCIF formats

MPEG video resolutions up to 704×480, 30 Hz, 4:2:0

Flexible chroma sampling formats

Can re-order the MPEG picture sequence

Glue-less DRAM interface

Single +5V supply 208 pin PQFP package

Max. power dissipation 2.5 W

Uses standard page mode DRAM

The Temporal Decoder is a companion chip to the Spatial Decoder. It provides the temporal decoding required by H.261 and MPEG.

The Temporal Decoder implements all the prediction forming features required by MPEG and H.261. With a single 4 Mb DRAM (e.g., 512k×8) the Temporal Decoder can decode CIF and QCIF H.261 video. With 8 Mb of DRAM (e.g., two 256k×16) the 704×480, 30 Hz, 4:2:0 MPEG video can be decoded.

The Temporal Decoder is not required for Intra coding schemes (such as JPEG). If included in a multi-standard decoder, the Temporal Decoder will pass decoded JPEG pictures through to its output.

Note: The above values are merely illustrative, by way of example and not necessarily by way of limitation, of one embodiment of the present invention. It will be appreciated that other values and ranges may also be used without departing from the invention.

A.17.1 Temporal Decoder Signals

TABLE A.17.1

Temporal Decoder signals

| Signal Name | I/O | Pin Number | Description |
|---|---|---|---|
| in_data[8:0] | I | 173, 172, 171, 169, 168, 167, 166, 164, 163 | Input Port. This is a standard two wire interface normally connected to the |
| in_extn | I | 174 | Output Port of the Spatial Decoder. |
| in_valid | I | 162 | See sections A.4 and |
| in_accept | O | 161 | A.18.1 |
| enable[1:0] | I | 126, 127 | Micro Processor Interface (MPI) |
| rw | I | 125 | See A.6.1 on page 59. |
| addr[7:0] | I | 137, 136, 135, 133, 132, 131, 130, 128 | |
| data[7:0] | O | 152, 151, 149, 147, 145, 143, 141, 140 | |
| irq | O | 154 | |
| DRAM_data[31:0] | I/O | 15, 17, 19, 20, 22, 25, 27, 30, 31, 33, 35, 38, 39, 42, 44, 47, 49, 57, 59, 61, 63, 66, 68, 70, 72, 74, 76, 79, 81, 83, 84, 85 | DRAM interface. See section A.5.2 |
| DRAM_addr[10:0] | O | 184, 186, 188, 189, 192, 193, 195, 197, 199, 200, 203 | |
| RAS | O | 11 | |
| CAS[3:0] | O | 2, 4, 6, 8 | |
| WE | O | 12 | |
| OE | O | 204 | |
| DRAM_enable | I | 112 | |
| out_data[7:0] | O | 89, 90, 92, 93, 94, 95, 97, 98 | Output Port. This is a standard two wire |
| out_extn | O | 87 | interface. |
| out_valid | O | 99 | See sections A.4 and A.19 |
| out_accept | I | 100 | |
| tck | I | 115 | JTAG port. |
| tdi | I | 116 | See section A.8 |
| tdo | O | 120 | |
| tms | I | 117 | |
| trst | I | 121 | |

TABLE A.17.1-continued

Temporal Decoder signals

| Signal Name | I/O | Pin Number | Description |
|---|---|---|---|
| decoder_clock | I | 177 | The main decoder clock. See Table A.7.2 |
| $\overline{\text{reset}}$ | I | 160 | Reset. |

TABLE A.17.2

Temporal Decoder Test signals

| Signal Name | I/O | Pin Num. | Description |
|---|---|---|---|
| tph0ish | I | 122 | if override = 1 then tph0ish and tph1ish are inputs for the on-chip |
| tph1ish | I | 123 | two phase clock. |
| override | I | 110 | For normal operation set override = 0. tph0ish and tph1ish are ignored (so connect to GND or $V_{DD}$). |
| chiptest | I | 111 | Set chiptest = 0 for normal operation. |
| tloop | I | 114 | Connect to GND or $V_{DD}$ during normal operation. |
| ramtest | I | 109 | If ramtest = 1 test of the on-chip RAMs is enabled. Set ramtest = 0 for normal operation. |
| pllselect | I | 178 | If pllselect = 0 the on-chip phase locked loops are disabled. Set pllselect = 1 for normal operation. |
| ti | I | 180 | Two clocks required by the DRAM interface during test operation. |
| tq | I | 179 | Connect to GND or $V_{DD}$ during normal operation. |
| pdout | O | 207 | These two pins are connections for an |
| pdin | I | 206 | external filter for the phase lock loop. |

TABLE A.17.3

Temporal Decoder Pin Assignments

| Signal Name | Pin |
|---|---|
| nc | 208 |
| test pin | 207 |
| test pin | 206 |
| GND | 205 |
| OE | 204 |
| DRAM_addr[0] | 203 |
| VDD | 202 |
| nc | 201 |
| DRAM_addr[1] | 200 |
| DRAM_addr[2] | 199 |
| GND | 198 |
| DRAM_addr[3] | 197 |
| nc | 196 |
| DRAM_addr[4] | 195 |
| VDD | 194 |
| DRAM_addr[5] | 193 |
| DRAM_addr[6] | 192 |
| nc | 191 |
| GND | 190 |
| DRAM_addr[7] | 189 |
| DRAM_addr[8] | 188 |
| VDD | 187 |
| DRAM_addr[9] | 186 |
| nc | 185 |
| DRAM_addr[10] | 184 |
| GND | 183 |
| nc | 182 |
| VDD | 181 |
| test pin | 180 |
| test pin | 179 |
| test pin | 178 |
| decoder_clock | 177 |
| nc | 176 |
| GND | 175 |
| in_extn | 174 |
| in_data[8] | 173 |
| in_data[7] | 172 |

TABLE A.17.3-continued

Temporal Decoder Pin Assignments

| Signal Name | Pin |
|---|---|
| in_data[6] | 171 |
| VDD | 170 |
| in_data[5] | 169 |
| in_data[4] | 168 |
| in_data[3] | 167 |
| in_data[2] | 166 |
| GND | 165 |
| in_data[1] | 164 |
| in_data[0] | 163 |
| in_valid | 162 |
| in_accept | 161 |
| reset | 160 |
| VDD | 159 |
| nc | 158 |
| nc | 157 |
| nc | 156 |
| nc | 155 |
| irq | 154 |
| nc | 153 |
| data[7] | 152 |
| data[6] | 151 |
| nc | 150 |
| data[5] | 149 |
| nc | 148 |
| data[4] | 147 |
| GND | 146 |
| data[3] | 145 |
| nc | 144 |
| data[2] | 143 |
| nc | 142 |
| data[1] | 141 |
| data[0] | 140 |
| nc | 139 |
| VDD | 138 |
| addr[7] | 137 |
| addr[6] | 136 |
| addr[5] | 135 |

TABLE A.17.3-continued

| Temporal Decoder Pin Assignments | |
|---|---|
| Signal Name | Pin |
| GND | 134 |
| addr[4] | 133 |
| addr[3] | 132 |
| addr[2] | 131 |
| addr[1] | 130 |
| VDD | 129 |
| addr[0] | 128 |
| enable[0] | 127 |
| enable[1] | 126 |
| rw̄ | 125 |
| GND | 124 |
| test pin | 123 |
| test pin | 122 |
| trst | 121 |
| tdo | 120 |
| nc | 119 |
| VDD | 118 |
| tms | 117 |
| tdi | 116 |
| tck | 115 |
| test pin | 114 |
| GND | 113 |
| DRAM_enable | 112 |
| test pin | 111 |
| test pin | 110 |
| test pin | 109 |
| nc | 108 |
| nc | 107 |
| nc | 106 |
| nc | 105 |
| nc | 104 |
| nc | 103 |
| nc | 102 |
| VDD | 101 |
| out_accept | 100 |
| out_valid | 99 |
| out_data[0] | 98 |
| out_data[1] | 97 |
| GND | 96 |
| out_data[2] | 95 |
| out_data[3] | 94 |
| out_data[4] | 93 |
| out_data[5] | 92 |
| VDD | 91 |
| out_data[6] | 90 |
| out_data[7] | 89 |
| nc | 88 |
| out_extn | 87 |
| GND | 86 |
| DRAM_data[0] | 85 |
| DRAM_data[1] | 84 |
| DRAM_data[2] | 83 |
| VDD | 82 |
| DRAM_data[3] | 81 |
| nc | 80 |
| DRAM_data[4] | 79 |
| GND | 78 |
| nc | 77 |
| DRAM_data[5] | 76 |
| nc | 75 |
| DRAM_data[6] | 74 |
| VDD | 73 |
| DRAM_data[7] | 72 |
| nc | 71 |
| DRAM_data[8] | 70 |
| GND | 69 |
| DRAM_data[9] | 68 |
| nc | 67 |
| DRAM_data[10] | 66 |
| VDD | 65 |
| nc | 64 |
| DRAM_data[11] | 63 |
| nc | 62 |
| DRAM_data[12] | 61 |
| GND | 60 |
| DRAM_data[13] | 59 |
| nc | 58 |
| DRAM_data[14] | 57 |
| VDD | 56 |
| nc | 55 |
| nc | 54 |
| nc | 53 |
| nc | 52 |
| nc | 51 |
| nc | 50 |
| DRAM_data[15] | 49 |
| nc | 48 |
| DRAM_data[16] | 47 |
| nc | 46 |
| GND | 45 |
| DRAM_data[17] | 44 |
| nc | 43 |
| DRAM_data[18] | 42 |
| VDD | 41 |
| nc | 40 |
| DRAM_data[19] | 39 |
| DRAM_data[20] | 38 |
| nc | 37 |
| GND | 36 |
| DRAM_data[21] | 35 |
| nc | 34 |
| DRAM_data[22] | 33 |
| VDD | 32 |
| DRAM_data[23] | 31 |
| DRAM_data[24] | 30 |
| nc | 29 |
| GND | 28 |
| DRAM_data[25] | 27 |
| nc | 26 |
| DRAM_data[26] | 25 |
| nc | 24 |
| VDD | 23 |
| DRAM_data[27] | 22 |
| nc | 21 |
| DRAM_data[28] | 20 |
| DRAM_data[29] | 19 |
| GND | 18 |
| DRAM_data[30 | 17 |
| nc | 16 |
| DRAM_data[31] | 15 |
| VDD | 14 |
| nc | 13 |
| W̄Ē | 12 |
| R̄ĀS̄ | 11 |
| nc | 10 |
| GND | 9 |
| C̄ĀS̄[0] | 8 |
| nc | 7 |
| C̄ĀS̄[1] | 6 |
| VDD | 5 |
| C̄ĀS̄[2] | 4 |
| nc | 3 |
| C̄ĀS̄[3] | 2 |
| nc | 1 |

A.17.1.1 "nc" No Connect Pins

The pins labelled nc in Table A.17.3 are not currently used in the present invention and are reserved for future products. These pins should be left unconnected. They should not be connected to $V_{DD}$, GND, each other or any other signal.

A.17.1.2 $V_{DD}$ and GND Pins

As will be appreciated all the VDD and GND pins provided must be connected to the appropriate power supply. The device will not operate correctly unless all the VDD and GND pins are correctly used.

A.17.1.3 Test Pin Connections for Normal Operation

Nine pins on the Temporal Decoder are reserved for internal test use.

TABLE A.17.4

Default test pin connections

| Pin number | Connection |
| --- | --- |
| | Connect to GND for normal operation |
| | Connect to $V_{DD}$ for normal operation |
| | Leave Open Circuit for normal operation |

A.17.1.4 JTAG Pins for Normal Operation

See Section A.8.1.

TABLE A.17.5

Overview of Temporal Decoder memory map

| Addr. (hex) | Register Name | See table |
| --- | --- | --- |
| 0x00 . . . 0x01 | Interrupt service area | A.17.6 |
| 0x02 . . . 0x07 | Not used | |
| 0x08 | Chip access | A.17.7 |
| 0x09 . . . 0x0F | Not used | |
| 0x10 | Picture sequencing | A.17.8 |
| 0x11 . . . 0x1F | Not used | |
| 0x20 . . . 0x2E | DRAM interface configuration registers | A.17.9 |
| 0x2F . . . 0x3F | Not used | |
| 0x40 . . . 0x53 | Buffer configuration | A.17.8 |
| 0x54 . . . 0x5F | Not used | |
| 0x60 . . . 0xFF | Test registers | A.17.11 |

TABLE A.17.6

Interrupt service area registers

| Addr. (hex) | Bit num. | Register Name | Page references |
| --- | --- | --- | --- |
| 0x00 | 7 | chip_event | |
| | 6:2 | not used | |
| | 1 | chip_stopped_event | |
| | 0 | count_error_event | |
| 0x01 | 7 | chip_mask | |
| | 6:2 | not used | |
| | 1 | chip_stopped_mask | |
| | 0 | count_error_mask | |

TABLE A.17.7

Chip access register

| Addr. (hex) | Bit num. | Register Name | Page references |
| --- | --- | --- | --- |
| 0x08 | 7:1 | not used | |
| | 0 | chip_access | |

TABLE A.17.8

Picture sequencing

| Addr. (hex) | Bit num. | Register Name | Page references |
| --- | --- | --- | --- |
| 0x10 | 7:1 | not used | |
| | 0 | MPEG_reordering | |

TABLE A.17.9

DRAM interface configuration registers

| Addr. (hex) | Bit num. | Register Name | Page references |
| --- | --- | --- | --- |
| 0x20 | 7:5 | not used | |
| | 4:0 | page_start_length[4:0] | |
| 0x21 | 7:4 | not used | |
| | 3:0 | read_cycle_length[3:0] | |
| 0x22 | 7:4 | not used | |
| | 3:0 | write_cycle_length[3:0] | |
| 0x23 | 7:4 | not used | |
| | 3:0 | refresh_cycle_length[3:0] | |
| 0x24 | 7:4 | not used | |
| | 3:0 | CAS_falling[3:0] | |
| 0x25 | 7:4 | not used | |
| | 3:0 | RAS_falling[3:0] | |
| 0x26 | 7:1 | not used | |
| | 0 | interface_timing_access | |
| 0x27 | 7:0 | not used | |
| 0x28 | 7:6 | RAS_strength[2:0] | |
| | 5:3 | OEWE_strength[3:0] | |
| | 2:0 | DRAM_data_strength[3:0] | |
| 0x29 | 7 | not used | |
| | 6:4 | DRAM_addr_strength[3:0] | |
| | 3:1 | CAS_strength[3:0] | |
| | 0 | RAS_strength[3] | |
| 0x28 | 7 | not used | |
| | 6:4 | DRAM_addr_strength[3:0] | |
| | 3:1 | CAS_strength[3:0] | |
| | 0 | RAS_strength[3] | |
| 0x29 | 7:6 | RAS_strength[2:0] | |
| | 5:3 | OEWE_strength[3:0] | |
| | 2:0 | DRAM_data_strength[3:0] | |
| 0x2A | 7:0 | refresh_interval | |
| 0x2B | 7:0 | not used | |
| 0x2C | 7:6 | not used | |
| | 5 | DRAM_enable | |
| | 4 | no_refresh | |
| | 3:2 | row_address_bits[1:0] | |
| | 1:0 | DRAM_data_width[1:0] | |
| 0x2D | 7:0 | not used | |
| 0x2E | 7:0 | Test registers | |

TABLE A.17.10

Buffer configuration registers

| Addr. (hex) | Bit num. | Registered Name | Page references |
| --- | --- | --- | --- |
| 0x40 | 7:0 | not used | |
| 0x41 | 7:2 | | |
| | 1:0 | picture_buffer_0[7:0] | |
| 0x42 | 7:0 | | |
| 0x43 | 7:0 | | |
| 0x44 | 7:0 | not used | |
| 0x45 | 7:2 | | |
| | 1:0 | picture_buffer_1[17:0] | |
| 0x46 | 7:0 | | |
| 0x47 | 7:0 | | |
| 0x48 | 7:0 | not used | |
| 0x49 | 7:1 | | |
| | 0 | component_offset_0[16:0] | |
| 0x4A | 7:0 | | |
| 0x4B | 7:0 | | |
| 0x4C | 7:0 | not used | |
| 0x4D | 7:1 | | |
| | 0 | component_offset_1[16:0] | |
| 0x4E | 7:0 | | |
| 0x4F | 7:0 | | |
| 0x50 | 7:0 | not used | |
| 0x51 | 7:1 | | |
| | 0 | component_offset_2[16:0] | |
| 0x52 | 7:0 | | |

TABLE A.17.10-continued

| Buffer configuration registers | | | |
|---|---|---|---|
| Addr. (hex) | Bit num. | Registered Name | Page references |
| 0x53 | 7:0 | | |

TABLE A.17.11

| Test registers | | | |
|---|---|---|---|
| Addr. (hex) | Bit num. | Register Name | Page references |
| 0x2E | 7 . . . 4 | PLL resistors | |
| | 3 . . . 0 | | |
| 0x60 | 7 . . . 6 | not used | |
| | 5 . . . 4 | coding_standard[1:0] | |
| | 3...2 | picture_type[1:0] | |
| | 1 | H261_filt | |
| | 0 | H261_s_f | |
| 0x61 | 7 . . . 6 | component_id | |
| | 5 . . . 4 | prediction_mode | |
| | 3 . . . 0 | max_sampling | |
| 0x62 | 7 . . . 0 | samp_h | |
| 0x63 | 7 . . . 0 | samp_v | |
| 0x64 | 7 . . . 0 | back_h | |
| 0x65 | 7 . . . 0 | | |
| 0x68 | 7 . . . 0 | back_v | |
| 0x67 | 7 . . . 0 | | |
| 0x68 | 7 . . . 0 | forw_h | |
| 0x69 | 7 . . . 0 | | |
| 0x6A | 7 . . . 0 | forw_v | |
| 0x6B | 7 . . . 0 | | |
| 0x6C | 7 . . . 0 | width_in_mb | |
| 0x6D | 7 . . . 0 | | |

SECTION A.18 Temporal Decoder Operation

A.18.1 Data Input

The input data port of the Temporal Decoder is a standard Token Port with 9 bit wide data words. In most applications, this will be connected directly to the output Token Port of the Spatial Decoder. See Section A.4 for more information about the electrical behavior of this interface.

A.18.2 Automatic Configuration

Parameters relating to the coded video's picture format are automatically loaded into registers within the Temporal Decoder by Tokens generated by the Spatial Decoder.

TABLE A.18.1

| Configuration of Temporal Decoder via Tokens | |
|---|---|
| Token | Configuration performed |
| CODING_STANDARD | The coding standard of the Temporal Decoder is automatically configured by the CODING_STANDARD Token. This is generated by the Spatial Decoder each time a new sequence is started. See FIGURE 58 |
| DEFINE_SAMPLING | The horizontal and vertical chroma sampling information for each of the color componenta is automatically configured by DEFINE_SAMPLING Tokens. |
| HORIZONTAL_MBS | The horizontal width of pictures in macro blocks is automatically configured by HORIZONTAL_MBS Token. |

A.18.3 Manual Configuration

The user must configure (via the microprocessor interface) application dependent factors.

A.18.3.1 When to Configure

The Temporal Decoder should only be configured when no data processing is taking place. This is the default state after reset is removed. The Temporal Decoder can be stopped to allow re-configuration by writing 1 to the chip_access register. After configuration is complete, 0 should be written to chip_access.

See Section A.5.3 for details of when to configure the DRAM interface.

A.18.3.2 DRAM Interface

The DRAM interface timing must be configured before it is possible to decode predictively coded video (e.g., H.261 or MPEG). See Section A.5, "DRAM Interface".

TABLE A.18.2

| Temporal Decoder registers | | | |
|---|---|---|---|
| Register name | Size/ Dir | Reset State | Description |
| chip_access | 1 rw | 1 | Writing 1 to chip_access requests that the Temporal Decoder halt operation to allow re-configuration. The Temporal Decoder will |
| chip_stopped_event | 1 rw | 0 | continue operating normally until reaches the end of the current video sequence. After reset is removed chip_access = i.e. the |
| chip_stopped_mask | 1 rw | 0 | Temporal Decoder is halted. When the chip stops a chip stopped event will occur. If chip_stopped_mask = 1 an interrupt will be generated. |
| count_error_event | 1 rw | 0 | The Temporal Decoder has an adder that adds predictions to error data. If there is a difference between the number of error data bytes |
| count_error_mask | 1 rw | 0 | and the number of prediction data bytes then a count error event is generated. If count_error_mask = 1 an interrupt will be generated and prediction forming will stop. This event should only arise following a hardware error. |
| picture_buffer_0 | 18 rw | x | These specify the base addresses for the picture buffers. |
| picture_buffer_1 | 18 rw | x | |
| component_offset_2 | 17 rw | x | These specify the offset from the picture buffer pointer at which each of the colour components is stored. Data with component ID = |
| component_offset_1 | 17 rw | x | n is stored starting at the position indicated by component_offset_n. See A.3.5.1, "Component Identification |
| component_offset_2 | 17 | x | number" |

TABLE A.18.2-continued

| Temporal Decoder registers | | | |
|---|---|---|---|
| Register name | Size/ Dir | Reset State | Description |
| MPEG_recordering | rw 1 rw | 0 | Setting this register to 1 makes the Temporal Decoder change the picture order from the non-causal MPEG picture sequence to the correct display order by the See A.18.3.5 This register should is ignored during JPEG and H.261 operation |

A.18.3.3 Numbers in Picture Buffer Registers

The picture buffer pointers (18 bit) and the component offset (17 bit) registers specify a block (8×8 bytes) address, not a byte address.

A.18.3.4 Picture Buffer Allocation

To decode predictively coded video (either H.261 or MPEG) the Temporal Decoder must manage two picture buffers. See Section A.18.4 and A.18.4.4 for more information about how these buffers are used.

The user must ensure that there is sufficient memory above each of the picture buffer pointers (picture_buffer_0 and picture_buffer_1) to store a single picture of the required video format (without overlapping with the other picture buffer). Normally, one of the picture buffer pointers will be set to 0 (i.e., the bottom of memory) and the other will be set to point to the middle of the memory space.

A.18.3.4.1 Normal Configuration for MPEG or H.261

H.261 and MPEG both use a 4:1:1 ratio between the different color components (i.e., there are 4 times as many luminance pels as there are pels in either of the chrominance components).

As documented in Section A.3.5.1, "Component Identification number", component 0 will be the luminance component and components 1 and 2 will be chrominance.

An example configuration of the component offset registers is to set component_offset_0 to 0 so that component 0 starts at the picture buffer pointer. Similarly, component_offset_1 could be set to 4/6 of the picture buffer size and component_offset_2 could be set to 5/6 of the picture buffer size.

A.18.3.5 Picture Sequence Re-ordering

MPEG uses three different picture types: Intra (I), Predicted (P) and Bidirectionally interpolated (B). B pictures are based on predictions from two pictures: one from the future and one from the past. The picture order is modified at the encoder so that I and P picture can be decoded from the coded date before they are required to decode B pictures.

The picture sequence must be corrected before these pictures can be displayed. The Temporal Decoder can provide this picture re-ordering (by setting register MPEG_reordering=1). Alternatively, the user may wish to implement the picture re-ordering as part of his display interface function. Configuring the Temporal Decoder to provide picture re-ordering may reduce the video resolution that can be decoded, see Section A.18.5.

A.18.4 Prediction Forming

The prediction forming requirements of H.261 decoding and MPEG decoding are quite different. The CODING_STANDARD Token automatically configures the Temporal Decoder to accommodate the prediction requirements of the different standards.

A.18.4.1 JPEG Operation

When configured for JPEG operation no predictions are performed since JPEG requires no temporal decoding.

A.18.4.2 H.261 operation

In H.261, predictions are only from the picture just decoded. Motion vectors are only specified to integer pixel accuracy. The encoder can specify that a low pass filter be applied to the result of any prediction.

As each picture is decoded, it is written in to a picture buffer in the off-chip DRAM so that it can be used in decoding the next picture. Decoded pictures appear at the output of the Temporal Decoder as they are written into the off-chip DRAM.

For full details of prediction, and the arithmetic operations involved, the reader is directed to the H.261 standard. The Temporal Decoder of the present invention is; fully compliant with the requirements of H.261.

A.10.4.3 MWEG operation (without re-ordering)

The operation of the Temporal Decoder changes for each of the three different MPEG picture types (I, P and B).

"I" pictures require no further decoding by the Temporal Decoder, but must be stored in a picture buffer (frame store) for later use in decoding P and B pictures.

Decoding P pictures requires forming predictions from a previously decoded P or I picture. The decoded P picture is stored in a picture buffer for use in decoding P and B pictures. MPEG allows motion vectors specified to half pixel accuracy. On-chip filters provide interpolation to support this half pixel accuracy.

B pictures can require predictions from both of the picture buffers. As with P pictures, half pixel motion vector resolution accuracy requires on chip interpolation of the picture information. B pictures are not stored in the off-chip buffers. They are merely transient.

All pictures appear at the output port of the Temporal Decoder as they are decoded. So, the picture sequence will be the same as that in the coded MPEG data (see the upper part of FIG. 85).

For full details of prediction, and the arithmetic operations involved, the reader is directed to the proposed MPEG standard draft. These requirements are met by the Temporal Decoder of the present invention.

A.18.4.4 MPEG Operation (with Re-ordering)

When configured for MPEG operation with picture re-ordering (MPEG_reordering=1), the prediction forming operations are as described above in Section A.18.4.3. However, additional data transfers are performed to re-order the picture sequence.

B picture decoding is as described in section A.18.4.3. However, I and P pictures are not output as they are decoded. Instead, they are written into the off-chip buffers (as previously described) and are read out only when a subsequent I or P picture arrives for decoding.

A.18.4.4.1 Decoder Start-up Characteristics

The output of the first I picture is delayed until the subsequent P (or I) picture starts to decode. This should be taken into consideration when estimating the start-up characteristics of a video decoder.

A.18.4.4.2 Decoder Shut-down Characteristics

The Temporal Decoder relies on subsequent P or I pictures to flush previous pictures out of its off-chip buffers (frame stores). This has consequences at the end of video sequences and when starting new video sequences. The Spatial Decoder provides facilities to create a "fake" I/P picture at the end of a video sequence to flush out the last P (or I) picture. However, this "fake" picture will be flushed out when a subsequent video sequence starts.

The Spatial Decoder provides the option to suppress this "fake" picture. This may be useful where it is known that a new video sequence will be supplied to the decoder immediately after an old sequence is finished. The first picture in this new sequence will flush out the last picture of the previous sequence.

A.18.5 Video Resolution

The video resolution that the Temporal Decoder can support when decoding MPEG is limited by the memory bandwidth of its DRAM interface. For MPEG, two cases need to be considered: with and without MPEG picture re-ordering.

Sections A.18.5.2 and A.18.5.3 discuss the worst case requirements required by the current draft of the MPEG specification. Subsets of MPEG can be envisioned that have lower memory bandwidth requirements. For example, using only integer resolution motion vectors or, alternatively, not using B pictures, significantly reduce the memory bandwidth requirements. Such subsets are not analyzed here.

A.18.5.1 Characteristics of DRAM Interface

The number of cycles taken to transfer data across the DRAM interface depends on a number of factors:

- The timing configuration of the DRAM interface to suite the DRAM employed
- The data bus width (8, 16 or 32 bits)
- The type of data transfer:
  - 8×8 block read or write
  - for prediction to half pixel accuracy
  - for prediction to integer pixel accuracy See section A.5, "DRAM Interface", for more information about the detail configuration of the DRAM interface.

Table A.18.3 shows how many DRAM interface "cycles" are required for each type of data transfer.

TABLE A.18.3

Data transfer times for Temporal Decoder

| Data bus width (bits) | read or write 8x8 block | form prediction (half pixel accuracy) | form prediction (integer pixel accuracy) |
|---|---|---|---|
| 8 | 1 page address + 64 transfers | 4 page address + 81 transfers | 4 page address + 64 transfers |
| 16 | 1 page address + 32 transfers | 4 page address + 45 transfers | 4 page address + 40 transfers |
| 32 | 1 page address + 16 transfers | 4 page address + 27 transfers | 4 page address + 24 transfers |

Table A.18.4 takes the figures in Table A.18.3 and evaluates them for a "typical" DRAM. In this example, a 27 MHz clock is assumed. It will be appreciated that while 27 MHz is used here, it is not intended as a limitation. The access start takes 11 ticks (102 ns) and the data transfer takes 6 ticks (56 ns).

A.18.5.2 MPEG Resolution without Re-ordering

The peak memory bandwidth load occurs when decoding B pictures. In a "worst case" scenario the B frame may be formed from predictions from both the picture buffers with all predictions being to half pixel accuracy.

TABLE A.18.4

Illustration with "typical" DRAM

| Data bus width (bits) | read or write 8 × 8 block | form prediction (half pixel accuracy) | form prediction (integer pixel accuracy) |
|---|---|---|---|
| 8 | 3657 ns | 4907 ns | 3963 ns |
| 16 | 1880 ns | 2907 ns | 2185 ns |
| 32 | 991 ns | 1907 ns | 1741 ns |

Using the example figures from Table A.18.4, it can be seen that it will take the DRAM interface 3815 ns to read the data required for two accurate half pixel accurate predictions (via a 32 bit wide interface). The resolution that the Temporal Decoder can support is determined by the number of these predictions that can be performed within one picture time. In this example, the Temporal Decoder can process 8737 8×8 blocks in a single 33 ms picture period (e.g., for 30 Hz video).

If the required video format is 704×480, then each picture contains 7920 8×8 blocks (taking into consideration the 4:2:0 chroma sampling). It can be seen that this video format consumes approx. 91% of the available DRAM interface bandwidth (before any other factors such as DRAM refresh are taken into consideration). Accordingly, the Temporal Decoder can support this video format.

A.18.5.3 MPEG Resolution with Re-ordering

When MPEG picture re-ordering is employed the worst case scenario is encountered while P pictures are being decoded. During this time, there are 3 loads on the DRAM interface:

- form predictions
- write back the result
- read out the previous P or I picture Using the example figures from Table A.18.3, we can find the time it takes for each of these tasks when a 32 bit wide interface is available. Forming the prediction takes 1907 ns/n while the read and the write each take 991 ns, a total of 3889 ns. This permits the Temporal Decoder to process 8485 8×8 blocks in a 33 ms period.

Hence, processing 704×480 video will use approximately 93% of the available memory bandwidth (ignoring refresh).

A.18.5.4 H.261

H.261 only supports two picture formats CIF (352×288) and QCIF (172×144) at picture rates up to 30 Hz. A CIF picture contains 2376 8×8 blocks. The only memory operations required are the writing of 8×8 blocks and the forming of predictions with integer accuracy motion vectors.

Using the example figures from Table A.18.4 for an 8 bit wide memory interface, it can be seen that writing each block will take 3657 ns while forming the prediction for one block will take 3963 ns/n, a total of 7620 ns per block. Therefore, the processing time for a single CIF picture is about 18 ms, comfortably less than the 33 ms required to support 30 Hz video.

A.18.5.5 JPEG

The resolution of JPEG "video" that can be supported will be determined by the capabilities of the Spatial Decoder of the invention or the display interface. The Temporal Decoder does not affect JPEG resolution.

A.18.6 Events and Errors

A.18.6.1 Chip Stopped

In the present invention, writing 1 to chip_access requests that the Temporal Decoder halt operation to allow re-configuration. Once received, the Temporal Decoder will continue operating normally until it reaches the end of the current video sequence. Thereafter, the Temporal Decoder is halted.

When the chip halts, a chip stopped event will occur. If chip_stopped_mask=1, an interrupt will be generated.

A.18.6.2 Count Error

The Temporal Decoder, of the present invention, contains an adder that adds predictions to error data. If there is a difference between the number of error data bytes and the number of prediction data bytes, then a count error event is generated.

If count_error_mask=1 an interrupt will be generated and forming prediction will stop.

Writing 1 to count_error_event clears the event and allows the Temporal Decoder to proceed. The DATA Token that caused the error will then proceed. However, the DATA Token that caused the error will not be of the correct length (64 bytes). This is likely to cause further problems. Thus, a count error should only arise if a significant hardware error has occurred.

SECTION A.19 Connecting to the Output of the Temporal Decoder

The output of the Temporal Decoder is a standard Token Port with 8 bit wide data words. See Section A.4 for more information about the electrical behavior of the interface.

The Tokens present at the output of the Temporal Decoder will depend on the coding standard employed and, in the case of MPEG, whether the pictures are being re-ordered. This section identifies which of the Tokens are available at the output of the Temporal decoder and which are the most useful when designing circuits to display that output. Other Tokens will be present, but are not needed to display the output and, therefore they are not discussed here.

This section concentrates on showing:

How the start and end of sequences can be identified.

How the start and end of pictures can be identified.

How to identify when to display the picture.

How to identify where in the display the picture data should be placed.

A.19.1 JPEG Output

The Token sequence output by the Temporal Decoder when decoding JPEG data is identical to that seen at the output of Spatial Decoder. Recall, JPEG does not require processing by the Temporal Decoder. However, the Temporal Decoder tests intra data Tokens for negative values (resulting from the finite arithmetic precision of the IDCT in the Spatial Decoder) and replaces them with zero.

See Section A.16 for further discussion of the output sequence observed during JPEG operation.

A.19.2. H.261 Output

A.19.2.1 Start and End of Sessions

H.261 doesn't signal the start and end of the video stream within the video data. Nevertheless, this is implied by the application. For example, the sequence starts when the telecommunication connection is made and ends when the line is dropped. Thus, the highest layer in the video syntax is the "picture layer".

The Start Code Detector of the Spatial Decoder in accordance with the invention, allows SEQUENCE_START and CODING_STANDARD Tokens to be inserted automatically before the first PICTURE_START. See sections A.11.7.3 and A.11.7.4.

At the end of an H.261 session (e.g., when the line is dropped) the user should insert a FLUSH Token after the end of the coded data. This has a number of effects (see Appendix A.31.1:

It ensures that PICTURE_END is generated to signal the end of the last picture.

It ensures that the end of the coded data is pushed through the decoder.

A.19.2.2 Acquiring Pictures

Each picture is composed of a hierarchy of elements referred to as layers in the syntax. The sequence of Tokens at the output of the Temporal Decoder when decoding H.261 reflects this structure.

A.19.2.1 Picture Layer

Each picture is preceded by a PICTURE_START Token and each is immediately followed by a PICTURE_END Token. H.261 doesn't naturally contain a picture end. This Token is inserted automatically by the Start Code Detector of the Spatial Decoder.

After the PICTURE_START Token, there will be TEMPORAL_REFERENCE and PICTURE_TYPE Tokens. The TEMPORAL_REFERENCE Token carries a 10 bit number (of which only the 5 LSBs are used in H.261) that indicates when the picture should be displayed. This should be studied by any display system as H.261 encoders can omit pictures from the sequence (to achieve lower data rates). Omission of pictures can be detected by the temporal reference incrementing by more than one between successive pictures.

Next, the PICTURE_TYPE Token carries information about the picture format. A display system may study this information to detect if CIF or QCIF pictures are being decoded. However, information about the picture format is also available by studying registers within the Huffman decoder.

<Xref to Huffman decoder section>

A.19.2.2.2 Group of Blocks Layer

Each H.261 picture is composed of a number of "groups of blocks". Each of these is preceded by a SLICE_START Token (derived from the H.261 group number and group start code). This Token carries an 8 bit value that indicates where in the display the group of blocks should be placed. This provides an opportunity for the decoder to resynchronize after data errors. Moreover, it provides the encoder with a mechanism to skip blocks if there are areas of a picture that do not require additional information in order to describe them. By the time SLICE_START reaches the output of the Temporal Decoder, this information is effectively redundant as the Spatial Decoder and Temporal Decoder have already used the information to ensure that each picture contains the correct number of blocks and that they are in the correct positions. Hence, it should be possible to compute where to position a block of data output by the Temporal Decoder just by counting the number of blocks that have been output since the start of the picture.

The number carried by SLICE_START is one less than the H.261 group of blocks number (see the H.261 standard for more information). FIG. 94 shows the positioning of H.261 groups of blocks within CIF and QCIF pictures. NOTE: in the present invention, the block numbering shown is the same as that carried by SLICE_START. This is different from the H.261 convention for numbering these groups.

Between the SLICE_START (which indicates the start of each group of blocks) and the first macroblock there may be other Tokens. These can be ignored as they are not required to display the picture data.

A.19.2.2.3 Macroblock Layer

The sequence of macroblocks within each group of blocks is defined by H.261. There is no special Token information describing the position of each macroblock. The user should count through the macroblock sequence to determine where to display each piece of information.

FIG. 96 shows the sequence in which macroblocks are placed in each group of blocks.

Each macroblock contains 6 DATA Tokens. The sequence of DATA Tokens in each group of 6 is defined by the H.261 macroblock structure. Each DATA Token should contain exactly 64 data bytes for an 8×8 area of pixels of a single color component. The color component is carried in a 2 bit number in the DATA Token (see section A.3.5.1). However, the sequence of the color components in H.261 is defined.

Each group of DATA Tokens is preceded by a number of Tokens communicating information about motion vectors, quantizer scale factors and so forth. These Tokens are not required to allow the pictures to be displayed and, thus, can be ignored.

Each DATA Token contains 64 data bytes for an 8×8 of a single color component. These are in a raster order.

A.19.3 XPEG Output

MPEG has more layers in its syntax. These embody concepts such as a video sequence and the group of pictures.

A.19.3.1 XPBG Sequence Layer

A sequence can have multiple entry points (sequence starts) but should have only a single exit point (sequence end). When an MPEG sequence header code is decoded, the Spatial Decoder generates a CODING_STANDARD Token followed by a SEQUENCE_START Token.

After the SEQUENCE_START, there will be a number of Tokens of sequence header information that describe the video format and the like. See the draft MPEG standard for the information that is signalled in the sequence header and Table A.3.2 for information about how this data is converted into Tokens. This information describing the video format is also available in registers in the Huffman decoder.

This sequence header information may occur several times within an MPEG sequence, if that sequence has several entry points.

A.19.3.2 Group of Pictures Layer

An MPEG group of pictures provides a different type of "entry" point to that provided at a sequence start. The sequence header provides information about the picture/video format. Accordingly, if the decoder has no knowledge of the video format used in a sequence, it must start at a sequence start. However, once the video format is configured into the decoder, it should be possible to start decoding at any group of pictures.

MPEG doesn't limit the number of pictures in a group. However, in many applications a group will correspond to about 0.5 seconds, as this provides a reasonable granularity of random access.

The start of a group of pictures is indicated by a GROUP_START Token. The header information provided after GROUP_START includes two useful Tokens: TIME_CODE and BROKEN_CLOSED.

TIME_CODE carries a subset of the SMPTE time code information. This may be useful in synchronizing the video decoder to other signals. BROKEN_CLOSED carries the MPEG closed_gap and broken_link bits. See Section A.19.3.8 for more on the implications of random access and decoding edited video sequences.

A.19.3.3 Picture Layer

The start of a new picture is indict of by the PICTURE_START Token. After this Token, there will be TEMPORAL_REFERENCE and PICTURE_TYPE Tokens. The temporary reference information may be useful if the Temporal Decoder is not configured to provide picture reordering. The picture type information may be useful if a display system wants to specially process B pictures at the start of an open GOP (see Section A.19.3.8).

Each picture is composed of a number of slices.

A.19.3.4 Slice Layer

Section A.19.2.2.2 discusses the group of blocks used in H.261. The slice in MPEG serves a similar function. However, the slice structure is not fixed by the standard. The 8 bit value carried by the SLICE_START Token is one less than the "slice vertical position" communicated by MPEG. See the draft MPEG standard for a description of the slice layer.

By the time SLICE_START reaches the output of the Temporal Decoder, this information is effectively redundant since the Spatial Decoder and Temporal Decoder have already used the information to ensure that each picture contains the correct number of blocks in the correct positions. Hence, it should be possible to compute where to position a block of data output by the Temporal Decoder just by counting the number of blocks that have been output since the start of the picture.

See section A.19.3.7 for discussion of the effects of using MPEG picture re-ordering.

A.19.3.5 Macroblock Layer

Each macroblock contains 6 blocks. These appear at the output of the Temporal Decoder in raster order (as specified by the draft MPEG specification).

A.19.3.6. Block Layer

Each macroblock contains 6 DATA Tokens. The sequence of DATA Tokens in each group of 6 is defined by the draft MPEG specification (this is the same as the H.261 macroblock structure). Each DATA token should contain exactly 64 data bytes for an 8×8 area of pixels of a single color component. The color component is carried in a 2 bit number in the DATA Token (see A.3.5.1). However, the sequence of the color components in MPEG is defined.

Each group of DATA Tokens is preceded by a number of Tokens communicating information about motion vectors, quantizer scale factors, and so forth. These Tokens are not required to allow the pictures to be displayed and, therefore, they can be ignored.

A.19.3.7 Effect of MPEG Picture Re-ordering

As described in A.18.3.5, the Temporal Decoder can be configured to provide MPEG picture re-ordering (MPEG_reordering=1). The output of P and I pictures is delayed until the next P/I picture in the data stream starts to be decoded by the Temporal Decoder. At the output of the Temporal Decoder the DATA Tokens of the newly decoded P/I picture are replaced with DATA Tokens from the older P/I picture.

When re_ordering P/I pictures, the PICTURE_START, TEMPORAL_REFERENCE and PICTURE_TYPE Tokens of the picture are stored temporarily on-chip as the picture is written into the off-chip picture buffers. When the picture is read out for display, these stored Tokens are retrieved. Accordingly, re-ordered P/I pictures have the correct values for PICTURE_START, TEMPORAL_REFERENCE and PICTURE_TYPE.

All other tokens below the picture layer are not re-ordered. As the re-ordered P/I picture is read-out for display it picks up the lower level non-DATA tokens of the picture that has just been decoded. Hence, these sub-picture layer Tokens should be ignored.

A.19.3.8 Random Access and Edited Sequences

The Spatial Decoder provides facilities to help correct video decoding of edited MPEG video data and after a random access into MPEG video data.

A.19.3.8.1 ODES GOPs

A group of pictures (GOP) can start with B pictures that are predicted from a P picture in a previous GOP. This is called an "open GOP". FIG. 107 illustrates this. Pictures 17 and 18 are B pictures at the start of the second GOP. If the GOP is "open", then the encoder may have encoded these two pictures using predictions from the P picture 16 and also the I picture 19. Alternatively, the encoder could have restricted itself to using predictions from only the I picture 19. In this case, the second GOP is a "closed GOP".

If a decoder starts decoding the video at the first GOP, it will have no problems when it encounters the second GOP even if that GOP is open since it will have already decoded the P picture 16. However, if the decoder makes a random access and starts decoding at the second GOP it cannot decode B17 and B18 if they depend on P16 (i.e., if the GOP is open).

If the Spatial Decoder of the present invention encounters an open GOP as the first GOP following a reset or it receives a FLUSH Token, it will assume that a random access to an open GOP has occurred. In this case, the Huffman decoder will consume the data for the B pictures in the normal way. However, it will output B pictures predicted with (0,0) motion vectors off the I picture. The result will be that pictures B17 and B18 (in the example above) will be identical to I19.

This behavior ensures correct maintenance of the MPEG VBV rules. Also, it ensures that B pictures exist in the output at positions within the output stream expected by the other data channels. For example, the MPEG system layer provides presentation time information relating audio data to video data. The video presentation time stamps refer to the first displayed picture in a GOP, i.e., the picture with temporal reference 0. In the example above, the first displayed picture after a random access to the second GOP is B17.

The BROKEN_CLOSED Token carries the MPEG closed_gop bit. Hence, at the output of the Temporal Decoder it is possible to determine if the B pictures output are genuine or "substitutes" have been introduced by the Spatial Decoder. Some applications may wish to take special measures when these "substitute" pictures are present.

A.19.3.8.2 Edited Video

If an application edits an MPEG video sequence, it may break the relationship between two GOPs. If the GOP after the edit is an open GOP it will no longer be possible to correctly decode the B pictures at the beginning of the GOP. The application editing the MPEG data can set the broken_link bit in the GOP after the edit to indicate to the decoder that it will not be able to decode these B pictures.

If the Spatial Decoder encounters a GOP with a broken link, the Huffman decoder will decode the data for the B pictures in the normal way. However, it will output B pictures predicted with (0,0) motion vectors off the I picture. The result will be that pictures B17 and B18 (in the example above) will be identical to I19.

The BROKEN_CLOSED Token carries the MPEG broken_link bit. Hence, at the output of the Temporal Decoder it is possible to determine if the B pictures output are genuine or "substitutes" that have been introduced by the Spatial Decoder. Some applications may wish to take special measures when these "substitute" pictures are present.

SECTION A.20 Late Write DRAM Interface

The interface is configurable in two ways:

The detail timing of the interface can be configured to accommodate a variety of different DRAM types The "width" of the DRAM interface can be configured to provide a cost/performance trade-off

TABLE A.20.1

DRAM interface signals

| Signal Name | Input/ Output | Description |
|---|---|---|
| DRAM_data[31:0] | I/O | The 32 bit wide DRAM data bus. Optionally this bus can be configured to be 16 or 8 bits wide. |
| DRAM_addr[10:0] | O | The 22 bit wide DRAM interface address is time multiplexed over this 11 bit wide bus. |
| $\overline{RAS}$ | O | The DRAM Row Address Strobe signal |
| $\overline{CAS}$[3:0] | O | The DRAM Column Address Strobe signal. One signal is provided per byte of the interface's data bus. All the CAS signals are driven simultaneously. |
| $\overline{WE}$ | O | The DRAM Write Enable signal |
| $\overline{OE}$ | O | The DRAM Output Enable signal |
| DRAM_enable | I | This input signal, when low makes all the output signals on the interface go high impedance and stops activity on the DRAM interface. |

TABLE A.20.2

DRAM interface configuration registers

| Register name | Size/ Dir | Reset State | Description |
|---|---|---|---|
| modify_DRAM_timing | 1 bit rw | 0 | This function enable register allows access to the DRAM interface timing configuration registers. The configuration registers should not be modified while this register holds the value zero. Writing a one of this register requests access to modify the configuration registers After a zero has been written to this register the DRAM interface and start to use the new values in the timing configuration registers |
| page_start_length | 5 bit rw | 0 | Specifies the length of the access start in ticks. The minimum value that can be used is 4 (meaning 4 ticks). 0 selects the maximum length of 32 ticks. |

TABLE A.20.2-continued

DRAM interface configuration registers

| Register name | Size/ Dir | Reset State | Description |
|---|---|---|---|
| read_cycle_length | 4 bit rw | 0 | Specifies the length of the fast page read cycle in ticks. The minimum value that can be used is 4 (meaning 4 ticks). 0 selects the maximum length of 16 ticks. |
| write_cycle_length | 4 bit rw | 0 | Specifies the length of the fast page late write cycle in ticks. The minimum value that can be used is 4 (meaning 4 ticks). 0 selects the maximum length of 16 ticks. |
| refresh_cycle_length | 4 bit rw | 0 | Specifies the length of the refresh cycle in ticks. The minimum value that can be used is 4 (meaning 4 ticks). 0 selects the maximum length of 16 ticks. |
| RAS_falling | 4 bit rw | 0 | Specifies the number of ticks after the start of the access start that RAS falls. The minimum value that can be used is 4 (meaning 4 ticks). 0 selects the maximum length of 16 ticks. |
| CAS_falling | 4 bit rw | 8 | Specifies the number of ticks after the start of a read cycle, write cycle or access start that CAS falls. The minimum value that can be used is 1 (meaning 1 tick). 0 selects the maximum length of 16 ticks. |
| DRAM_data_width | 2 bit rw | 0 | Specifies the number of bits used on the DRAM interface data bus DRAM_data[31:0]. See A.20.4 |
| row_address_bits | 2 bit rw | 0 | Specifies the number of bits used for the row address portion of the DRAM interface address bus. See A.20.5 |
| DRAM_enable | 1 bit rw | 1 | Writing the value 0 in to this register forces the DRAM interface into a high impedance state.<br>0 will be read from this register if either the DRAM_enable signals low or 0 has been written to the register. |
| refresh_interval | 8 bit rw | 0 | This value specifies the interval between refresh cycles in periods of 16 decoder_clock cycles. Values in the range 1..255 can be configured. The value 0 is automatically loaded after reset and forces the DRAM interface to continuously execute refresh cycles until a valid refresh interval is configured. It is recommended that refresh_interval should be configured only after each reset. |
| no_refresh | 1 bit rw | 0 | Writing the value 1 to this register prevents execution of any refresh cycles. |
| CAS_strength<br>RAS_strength<br>addr_strength<br>DRAM_data_strength<br>OEWE_strength | 3 bit rw | 6 | These three bit registers configure the output drive strength of DRAM interface signals.<br>This allows the interface to be configured for various different loads<br>See A.20.8 |

A.20.1 Interface Timing (Ticks)

In the present invention, the DRAM interface timing is derived from a clock which is running at four times the input clock rate of the device (decoder_clock). This clock is generated by an on-chip PLL.

For brevity, periods of this high speed clock are referred to as ticks.

A.20.2 Interface Operation

The interface uses of the DRAM fast page mode. Three different types of access are supported:

Read

Write

Refresh

Each read or write access transfers a burst of between 1 and 64 bytes at a single DRAM page address. Read and write transfers are not mixed within a single access. Each successive access is treated as a random access to a new DRAM page.

A.20.3 Access Structure

Each access is composed of two parts:

Access start

Data transfer

Each access starts with an access start and is followed by one or more data transfer cycles. There is a read, write and refresh variant of both the access start and the data transfer cycle.

At the end of the last data transfer in an access the interface enters it's default state and remains in this state until a new access is ready to start. If a new access is ready to start when the last access finishes, then the new access will start immediately.

A.20.3.1 Access Start

The access start provides the page address for the read or write transfers and establishes some initial signal conditions. There are three different access starts:

Start of read

Start of write

Start of refresh

In each case the timing of $\overline{RAS}$ and the row address is controlled by the registers RAS_falling and page_start_length. The state of $\overline{OE}$ and DRAM_data[31:0] is held from the end of the previous data transfer until $\overline{RAS}$ falls. The three different access start types are only different in how they drive $\overline{OE}$ and DRAM_data[31:0] when $\overline{RAS}$ falls. See FIG. 109.

TABLE A.20.3

Access start parameters

| Num. | Characteristic | Min. | Max. | Unit | Notes |
|---|---|---|---|---|---|
| 38 | $\overline{RAS}$ precharge period set by register RAS_falling | 4 | 16 | bck | |
| 39 | Access start duration set by register page_start_length | 4 | 32 | | |
| 40 | $\overline{CAS}$ precharge length set by register CAS_falling. | 1 | 16 | * | |

TABLE A.20.3-continued

| Access start parameters | | | | | |
|---|---|---|---|---|---|
| Num. | Characteristic | Min. | Max. | Unit | Notes |
| 41 | Fast page read cycle length set by the register read_cycle_length. | 4 | 16 | | |
| 42 | Fast page write cycle length set by the register write_cycle_length. | 4 | 16 | | |
| 43 | $\overline{WE}$ falls one tick after CAS. | | | | |
| 44 | Refresh cycle length set by the register refresh_cycle. | 4 | 16 | | |

[a]This value must be less than RAS_falling to ensure CAS before RAB refresh occurs.

A.20.3.2. Data Transfer

There are three different types of data transfer cycle:

Fast page read cycle

Fast page late write cycle

Refresh cycle

A start of refresh is only followed by a single refresh cycle. A start of read (or write) can be followed by one or more fast page read (or write) cycles.

At the start of the read cycle $\overline{CAS}$ is driven high and the new column address is driven.

A late write cycle is used. $\overline{WE}$ is driven low one tick after $\overline{CAS}$. The output data is driven one tick after the address.

As a $\overline{CAS}$ before $\overline{RAS}$ refresh cycle is initiated by the start of refresh cycle, there is no interface signal activity during a refresh cycle. The purpose of the refresh cycle is to meet the minimum $\overline{RAS}$ low period required by the DRAM.

A.20.3.3 Interface Default State

The interface signals enter a default state at the end of an access:

$\overline{RAS}$, $\overline{CAS}$ and $\overline{WE}$ high data and OE remain in their previous state addr remains stable A.20.4 Data Bus Width The two bit register DRAM_data_width allows the width of the DRAM interfaces data path to be configured. This allows the DRAM cost to be minimized when working with small picture formats.

TBLE A.20.4

| Configuring DRAM_data_width | |
|---|---|
| DRAM_data_width | |
| 0[a] | 8 bit wide data bus on DRAM_data(31:24)[b]. |
| 1 | 16 bit wide data bus on DRAM_data(31:16)[(b)]. |
| 2 | 32 bit wide data bus on DRAM_data(31:0). |

[a]Default after reset.
[b]Unused signals are held high impedance.

A.20.5 Address Bits

On-chip, a 24 bit address is generated. How this address is used to form the row and column addresses depends on the width of the data bus and the number of bits selected for the row address. Some configurations do not permit all the internal address bits to be used (and) therefore, produce "hidden bits".

The row address is extracted from the middle portion of the address. This maximizes the rate at which the DRAM is naturally refreshed.

A.20.5.1 Low Order Column Address Bits

The least significant 4 to 6 bits of the column address are used to provide addresses for fast page mode transfers of up to 64 bytes. The number of address bits required to control these transfers will depend on the width of the data bus (see A.20.4).

A.20.9.2. Row Address Bits

The number of bits taken from the middle section of the 24 bit internal address to provide the row address is configured by the register row_address_bits.

TABLE A.20.5

| Configuring row_address_bits | |
|---|---|
| row_address_bits | Width of row address |
| 0 | 9 bits |
| 1 | 10 bits |
| 2 | 11 bits |

The width of row address used will depend on the type of DRAM used and whether the MSBs of the row address are decoded off-chip to access multiple banks of DRAM.

NOTE: The row address is extracted from the middle of the internal address. If some bits of the row address are decoded to select banks of DRAM, then all possible values of these "bank select bits" must select a bank of DRAM. Otherwise, holes will be left in the address space.

TABLE A.20.6

| Selecting a value for row_address_bits | | | |
|---|---|---|---|
| row_address_bits | row address bits | bank select | DRAM depth |
| 0 | DRAM_addr[8:0] | | 256k |
| 1 | DRAM_addr[8:0] | DRAM_addr[9] | 256k |
| | DRAM_addr[9:0] | | 512k |
| | DRAM_addr[9:0] | | 1024k |
| 2 | DRAM_addr[8:0] | DRAM_addr[10:9] | 256k |
| | DRAM_addr[9:0] | DRAM_addr[10] | 512k |
| | DRAM_addr[9:0] | DRAM_addr[10] | 1024k |
| | DRAM_addr[10:0] | | 2048k |
| | DRAM_addr[16:0] | | 4096k |

A.20.6 DRAM Interface Enable

There are two ways to make all the output signals on the DRAM interface become high impedance. The DRAM_enable register and the DRAM_enable signal. Both the register and the signal must be at a logic 1 for the DRAM interface to operate. If either is low, then the interface is taken to high impedance and data transfers through the interface are halted.

The ability to take the DRAM interface to high impedance is provided in order to allow other devices to test or to use the DRAM controlled by the Spatial Decoder (or the Temporal Decoder) when the Spatial Decoder (or the Temporal Decoder) is not in use. It is not intended to allow other devices to share the memory during normal operation.

A.20.7 Refresh

Unless disabled by writing to the register, no_refresh, the DRAM interface will automatically refresh the DRAM using a $\overline{CAS}$ before a $\overline{RAS}$ refresh cycle at an interval determined by the register refresh_interval.

The value in refresh_interval specifies the interval between refresh cycles in periods of 16 decoder_clock cycles. Values in the range 1 to 255 can be configured. The value 0 is automatically loaded after reset and forces the DRAM interface to continuously execute refresh cycles (once enabled) until a valid refresh interval is configured. It is recommended that refresh_interval should be configured only once after each reset.

A.20.8 Signal Strengths

The drive strength of the outputs of the DRAM interface can be configured by the user using the 3 bit registers, CAS_strength, RAS_strength, addr_strength, DRAM_data_strength, OEWE_strength. The MSB of this 3 bit value selects either a fast or slow edge rate. The two less significant bits configure the output for different load capacitances.

The default strength after reset is 6, configuring the outputs to take approximately 10 ns to drive signal between GND and $V_{DD}$ if loaded with $12_pF$.

TABLE A.20.7

Output strength configurations

| strength value | Drive characteristics |
|---|---|
| 0 | Approx. 4 ns/V into 6 pf load |
| 1 | Approx. 4 ns/V into 12 pf load |
| 2 | Approx. 4 ns/V into 24 pf load |
| 3 | Approx. 4 ns/V into 48 pf load |
| 4 | Approx. 2 ns/V into 6 pf load |
| 5 | Approx. 2 ns/V into 12 pf load |
| 6[a] | Approx. 2 ns/V into 24 pf load |
| 7 | Approx. 2 ns/V into 48 pf load |

[a]Default after reset

When an output is configured approximately for the load it is driving, it will meet the AC electrical characteristics specified in Tables A.20.11 to Table A.20.12. When appropriately configured each output is approximately matched to it's load and, therefore, minimal overshoot will occur after a signal transition.

A.20.9 After Reset

After reset, the DRAM interface configuration registers are all reset to their default values. Most significant of these default configurations are:

- The DRAM interface is disabled and allowed to go high impedance.
- The refresh interval is configured to the special value 0 which means execute refresh cycle continuously after the interface is re-enabled.
- The DRAM interface is set to it's slowest configuration.

Most DRAMs require a "pause" of between 100 μs and 500 μs after power is first applied, followed by a number of refresh cycles before normal operation is possible.

Immediately after reset, the DRAM interface is inactive until both the DRAM_enable signal and the DRAM_enable register are set. When these have been set, the DRAM interface will execute refresh cycles (approximately every 400 ns, depending upon the clock frequency used) until the DRAM interface is configured.

The user is responsible for ensuring that the DRAM's "pause" after power_up and for allowing sufficient time after enabling the DRAM interface to ensure that the required number of refresh cycles have occurred before data transfers are attempted.

While reset is asserted, the DRAM interface is unable to refresh the DRAM. However, the reset time required by the decoder chips is sufficiently short so that is should be possible to reset them and to then re-enable the DRAM interface before the DRAM contents decay. This may be required during debugging.

TABLE A.20.8

Maximum Ratings[a]

| Symbol | Parameter | Min | Max. | Units |
|---|---|---|---|---|
| $V_{DD}$ | Supply voltage relative to GND | −0.5 | 6.5 | V |
| $V_{IN}$ | Input voltage on any pin | GND−0.5 | $V_{DD}$ + 0.5 | V |
| $T_A$ | Operating temperature | −40 | +85 | °C. |
| $T_S$ | Storage temperature | −55 | +150 | °C. |

TABLE A.20.9

DC Operating conditions

| Symbol | Parameter | Min. | Max. | Units |
|---|---|---|---|---|
| $V_{DD}$ | Supply voltage relative to GND | 4.75 | 5.25 | V |
| GND | Ground | 0 | 0 | V |
| $V_{IH}$ | Input logic "1" voltage | 2.0 | $V_{DD}$ + 0.5 | V |
| $V_{IL}$ | Input logic "0" voltage | GND−0.5 | 0.8 | V |
| $T_A$ | Operating temperature | 0 | 70 | °C.[a] |

[a]With TBA linear ft/min transverse airflow

TABLE A.20.10

DC Electrical characteristics (contd)

| Symbol | Parameter | Min. | Max. | Units |
|---|---|---|---|---|
| $V_{OL}$ | Output logic "0" voltage | | 0.4 | V[a] |
| $V_{ON}$ | Output logic "1" voltage | 2.8 | | V |
| $I_O$ | Output current | ±100 | | |
| $I_{OZ}$ | Output off state leakage current | ±20 | | μA[b] |
| $I_{IZ}$ | Input leakage current | ±10 | | μA |
| $I_{DD}$ | RMS power supply current | | 500 | mA |
| $C_{IN}$ | Input capacitance | | 5 | pF |
| $C_{OUT}$ | Output/IO capacitance | | 5 | pF |

[a]AC parameters are specified using $V_{OLmax}$ = 0.8 V as the measurement level.
[b]This is the steady state drive capability of the interface. Transient currents maybe much greater.

A.20.10.1 AC Characteristics

TABLE A.20.11

Differences from nominal values for a strobe

| Num. | Parameter | Min. | Max. | Unit | Note[a] |
|---|---|---|---|---|---|
| 45 | Cycle time e.g. tPC | −2 | +2 | ns | |
| 46 | Cycle time e.g. tRC | −2 | −2 | ns | |
| 47 | High pulse e.g. tRP, tCP, tCPN | −5 | +2 | ns | |
| 48 | Low pulse e.g. tRAS, tCAS, tCAC, tWP, tRASP, tRASC | −11 | +2 | ns | |
| 49 | Cycle time e.g. tACP/tCPA | −8 | +2 | ns | |

[a]The driver strength of the signal must be configured appropriately for its load

TABLE A.20.12

Differences from nominal values between two strobes

| Num. | Parameter | Min. | Max. | Unit | Note[a] |
|---|---|---|---|---|---|
| 50 | Strobe to strobe delay e.g. tRCD, tCSR | −3 | +3 | ns | |
| 51 | Low hold time e.g. tRSH, tCSH, tRWL, tCWL, tRAC, tOAC/OE, tCHR | −13 | +3 | ns | |
| 52 | Strobe to strobe precharge e.g. tCRP, tRCS, tRCH, tRRH, tRPC | −9 | +3 | ns | |
| | CAS precharge pulse between any two CAS signals on wide DRAMS | −5 | +2 | ns | |

TABLE A.20.12-continued

| Differences from nominal values between two strobes | | | | | |
|---|---|---|---|---|---|
| Num. | Parameter | Min. | Max. | Unit | Note* |
| | e.g. tCP, or between RAS rising and CAS falling e.g. tRPC | | | | |
| 53 | Precharge before disable e.g. tRHCP/ CPRH | −12 | +3 | ns | |

*The driver strength of the two signals must be configured appropriately for their loads

SECTION B.1 Start Code Detector

B.1.1 Overview

As previously shown in FIG. 11, the Start Code Detector (SCD) is the first block on the Spatial Decoder. Its primary purpose is to detect MPEG, JPEG and H.261 start codes in the input data stream and to replace them with relevant Tokens. It also allows user access to the input data stream via the microprocessor interface, and performs preliminary formatting and "tidying up" of the token data stream. Recall, the SCD can receive either raw byte data or data already assembled in Token format.

Typically, start codes are 24, 16 and 8 bits wide for MPEG, H.261, and JPEG, respectively. The Start Code Detector takes the incoming data in bytes, either from the Microprocessor Interface (upi) or a token/byte port and shifts it through three shift registers. The first register is an 8 bit parallel in serial out, the second register is of programmable length (16 or 24 bits) and is where the start codes are detected, and the third register is 15 bits wide and is used to reformat the data into 15 bit tokens. There are also two "tag" Shift Registers (SR) running parallel with the second and third SRs. These contain tags to indicate whether or not the associated bit in the data SR is good. Incoming bytes that are not part of a DATA Token and are unrecognized by the SCD, are allowed to bypass the shift registers and are output when all three shift registers are flushed (empty) and the contents output successfully. Recognized non-data tokens are used to configure the SCD, spring traps, or set flags. They also bypass the shift registers and are output unchanged.

B.1.2 Major Blocks

The hardware for the Start Code Detector consists of 10 state machines.

B.1.2.1 Input Circuit (scdipc.sch.iplm.M)

The input circuit has three modes of operation: token, byte and microprocessor interface. These modes allow data to be input either as a raw byte stream (but still using the two-wire interface), as a token stream, or by the user via the upi. In all cases, the input circuit will always output the correct DATA Tokens by generating DATA Token headers where appropriate. Transitions to and from upi mode are synchronized to the system clocks and the upi may be forced to wait until a safe point in the data stream before gaining access. The Byte mode pin determines whether the input circuit is in token or byte mode. Furthermore, initially informing the system as to which standard is being decoded (soda CODING_STANDARD Token can be generated) can be done in any of the three modes.

B.1.2.2 Token Decoder (scdipnew.sch, scdipnem.M)

This block decodes the incoming tokens and issues commands to the other blocks.

TABLE B.1.1.

| Recognized input tokens | | |
|---|---|---|
| Input Token | Command issued | Comments |
| NULL | WAIT | NULLS are removed |
| DATA | NORMAL | Load next byte into first SR |
| CODING_STD | BYPASS | Flush shift registers, perform padding, output and switch to bypass mode. Load CODING_STANDARD register. |
| FLUSH | BYPASS | Flush SRs with padding, Output and switch to bypass mode. |
| ELSE (unrecognised token) | BYPASS | Flush SRs with padding, output and switch to bypass mode. |

Note: A change in coding standard is passed to all blocks via the two-wire interface after the SRs are flushed. This ensures that the change from one data stream to another happens at the correct point throughout the SCD. This principle is applied throughout the presentation so that a change in the coding standard can flow through the whole chip prior to the new stream.

B.1.2.3 JPEG (scdjpeg.sch scdjpegm.M)

Start codes (Markers) in JPEG are sufficiently different that JPEG has a state machine all to itself. In the present invention, this block handles all the JPEG marker detection, length counting/checking, and removal of data. Detected JPEG markers are flagged as start codes (with v_not_t—see later text) and the command from scdipnew is overridden and forced to bypass. The operation is best described in code.

```
switch (state)
{
  case (LOOKING):
    if (input == 0xff)
    {
      state = GETVALUE;/*Found a marker*/
      remove; /*Marker gets removed*/
    }
    else
      state = LOOKING;
  break;
  case (GETVALUE);
    if (input == 0xff)
    {
      state = GETVALUE; /*Overlapping markers*/
      remove;
    }
    else if (input ==0=00)
    {
      state = LOOKING;/*Wasn't a marker*/
      insert(0xff);/*Put the 0xff back*/
    }
    else
    {
      command = BYPASS;/*override command*/
        if(lc)/*Does the marker have a length count*/
          state = GETLC0;
        else
          state = LOOKING;
      break;
      case (GETLC0):
        loadlc0;/*Load the top length count byte*/
        state = GETLC1;
        remove;
      break;
      case(GETLC1)
        loadlc1;
        remove;
        state = DECLC;
      break;
      case (DECLC):
        lcnt = lcnt · 2
        state = CHECKLC;
```

-continued

```
        break;
        case(CHECKLC):
          if(lcnt == 0)
            state = LOOKING;/*No more to do*/
          else if (lcnt < 0)
            state = LOOKING;/*generate Illegal_Length_Error*/
          else
            state = COUNT;
        break;
        case (COUNT):
          decrement length count until 1
          if(lc <= 1)
            state = LOOKING;
    }
```

B.1.2.4 Input Shifter (scinshft.sch, scinshm.M)

The basic operation of this block is quite simple. This block takes a byte of data from the input circuit, loads the shift register and shifts it out. However, it also obeys the commands from the input decoder and handles the transitions to and from bypass mode (flushing the other SRs): On receiving a BYPASS command, the associated byte is not loaded into the shift register. Instead "rubbish" (tag=1) is shifted out to force any data held in the other shift registers to the output. The block then waits for a "flushed" signal indicating that this "rubbish" has appeared at the token reconstructor. The input byte is then passed directly to the token reconstructor.

B.1.2.5 Start Code Detector (scdetect.sch, sedetm.M)

This block includes two shift registers which are programmable to 16 or 24 bits, start code detection logic and "valid contents" detection logic. MPEG start codes require the full 24 bits, whereas H.261 requires only 16.

In the present invention, the first SR is for data and the second carries tags which indicate whether the bits in the data SR are valid—there are no gaps or stalls (in the two-wire interface sense) in the SRs, but the bits they contain can be invalid (rubbish) whilst they are being flushed. On detection of a start code, the tag shift register bits are set in order to invalidate the contents of the detector SR.

A start code cannot be detected unless the SR contents are all valid. Non byte-aligned start codes are detected and may be flagged. Moreover, when a start code is detected, it cannot be definitely flagged until an overlapping start code has been checked for. To accomplish this function, the "value" of the detected start code (the byte following it) is shifted right through scinshift, scdetect and into scoshift. Having arrived at scoshift without the detection of another start code, it is overlapping start codes have been eliminated and it is flagged as a valid start code.

B.1.2.6 Output Shifter (scoshift.sch, scoshm.M)

The basic operation of the output shifter is to take serial data (and tags) from scdetect, pack it into 15 bit words and output them. Other functions are:

B.1.2.6.1 Data Padding

The output consists of 15 bit words, but the input may consist of an arbitrary number of bits. In order to flush, therefore, we need to add bits to make the last word up to 15 bits. These extra bits are called padding and must be recognized and removed by the Huffman block. Padding is defined to be:

After the last data bit, a "zero" is inserted followed by sufficient "ones" to make up a 15 bit word.

The data word containing the padding is output with a low extension bit to indicate that it is the end of a data token.

B.1.2.6.2 Generation of "flushed"

In accordance with the present invention, the generation of "flushed" operation involves detecting when all SRs are flushed and signalling this to the input shifter. When the "rubbish" inserted by the input shifter reaches the end of the output shifter, and the output shifter has completed its padding, a "flushed" signal is generated. This "flushed" signal must pass through the token reconstructor before it is safe for the input shifter to enter bypass mode.

B.1.2.6.3 Flagging Valid Start Codes

If scdetect indicates that it has found a start code, padding is performed and the current data is output. The start code value (the next byte) is shifted through the detector to eliminate overlapping start codes. If the "value" arrives at the output shifter without another start code being detected, it was not overlapped and the value is passed out with a flag v_not_t (ValueNotToken) to indicate that it is a start code value. If, however, another start code is detected (by scdetect) whilst the output shifter is waiting for the value, an overlapping_start_error is generated. In this case, the first value is discarded and the system then waits for the second value. This value can also be overlapped, thus causing the same procedure to be repeated until a non-overlapped start code is found.

B.1.2.6.4 Tidying Up After a Start Code

Having detected and output a good start code, a new DATA header is generated when data (not rubbish) starts arriving.

B.1.2.7 Data Stream Reconstructor (sctokrec.sch, sctokrem.M)

The Data Stream reconstructor has two-wire interface inputs: one from scinshift for bypassed tokens, and one from scoshift for packed data and start codes. Switching between the two sources is only allowed when the current token (from either source) has been completed (low extension bit arrived).

B.1.2.8 Start Value to Start Number Conversion (scdromhw.sch, schrom.M)

The process of converting start values into tokens is done in two stages. This block deals mainly with coding standard dependent issues reducing the 520 odd potential codes down to 16 coding standard independent indices.

As mentioned earlier, start values (including JPEG ones) are distinguished from all other data by a flag (value_not_token). If v_not_t is high, this block converts the 4 or 8 bit value, depending on the CODING_STANDARD, into a 4 bit start_number which is independent of the standard, and flags any unrecognized start codes.

The start numbers are as follows:

TABLE B.1.2.

Start Code numbers (indices)

| Start/Marker Code | Index (start_number) | Resulting Token |
|---|---|---|
| not_a_start_code | 0 | — |
| sequence_start_code | 1 | SEQUENCE_START |
| group_start_code | 2 | GROUP_START |
| picture_start_code | 3 | PICTURE_START |
| slice_start_code | 4 | SLICE_START |
| user_data_start_code | 5 | USER_DATA |
| extension_start_code | 6 | EXTENSION_DATA |
| sequence_end_code | 7 | SEQUENCE_END |
| JPEG Markers | | |
| DHT | 8 | DHT |
| DQT | 9 | DOT |
| DNL | 10 | DNL |
| DRI | 11 | DRI |
| JPEG markers that can be mapped onto tokens for MPEG/H.261 | | |
| SOS | picture_start_code | PICTURE_START |

TABLE B.1.2.-continued

Start Code numbers (indices)

| Start/Marker Code | Index (start_number) | Resulting Token |
|---|---|---|
| SOI | sequence_start_code | SEQUENCE_START |
| EOI | sequence_end_code | SEQUENCE_END |
| SOFO | group_start_code | GROUP_START |
| JPEG markers that generate extn or user data | | |
| JPG | extension_start_code | EXTENSION_DATA |
| JPGn | extension_start_code | EXTENSION_DATA |
| APPn | user_data_start_code | USER_DATA |
| COM | user_data_start_code | USER_DATA |

NOTE: All unrecognised JPEG markers generate an extn_start_code index

B.1.2.9 Start Number to Token Conversion (sconvert.sch, sconverm.M)

The second stage of the conversion is where the above start numbers (or indices) are converted into tokens. This block also handles token extensions where appropriate, discarding of extension and user data, and search modes.

Search modes are a means of entering a data stream at a random point. The search mode can be set to one of eight values:

0: Normal Operation—find next start code.

1/2: System level searches not implemented on Spatial Decoder

3: Search for Sequence or higher

4: Search for group or higher

5: Search for picture or higher

6: Search for slice or higher

7: Search for next start code

Any non-zero search mode causes data to be discarded until the desired start code (or higher in the syntax) is detected.

This block also adds the token extensions to PICTURE and SLICE start tokens:

PICTURE START is extended with PICTURE_NUMBER, a four bit count of pictures.

SLICE_START is extended with svp (slice vertical position). This is the "value" of the start code minus one (MPEG, H.261), and minus OXDO (JPEG).

B.1.2.10 Data Stream Formatting (scinsert.sch, scinserx.M)

In the present invention, Data Stream Formatting relates to conditional insertion of PICTURE_END, FLUSH, CODING_STANDARD, SEQUENCE_START tokens, and generation of the STOP_AFTER_PICTURE event. Its function is best simplified and described in software:

```
switch (input_data)
case(FLUSH)
  1. if (in_picture)
     output = PICTURE_END
  2. output = FLUSH
  3. if (in_picture & stop_after_picture)
     sap_error = HIGH
     in_picture = FALSE;
  4. in_picture = FALSE;
break
case (SEQUENCE_START)
  1. if(in_picture)
     output = PICTURE_END
  2. if in_picture & stop_after_picture)
     2a. output = FLUSH
     2b. sap_error = HIGH
      in_picture = FALSE
  3. output = CODING_STANDARD
```

-continued

```
  4. output = standard
  5. output = SEQUENCE_START
  6. in_picture = FALSE;
break
case (SEQUENCE_END) case (GROUP_START):
  1. if (in_picture)
     output = PICTURE_END
  2. if (in_picture & stop_after_picture)
     2a. output = FLUSH
     2b. sap_error = HIGH
      in_picture = FALSE
  3. output = SEQUENCE_END or GROUP_START
  4. in_picture = FALSE;
break
  case (PICTURE_END)
  1. output = PICTURE_END
  2. if (stop_after_picture)
     2a. output = FLUSH
     2b. sap_error = HIGH
  3. in_picture = FALSE
break
case (PICTURE_START)
  1. if (in_picture)
     output = PICTURE_END
  2. if (in_picture & stop_after_picture)
     2a. output = FLUSH
     2b. sap_error = HIGH
  3. if (insert_sequence_start)
     3a. output = CODING_STANDARD
     3b. output = standard
     3c. output = SEQUENCE_START
      insert_sequence_start = FALSE
  4. output = PICTURE_START
     in_picture = TRUE
break
default: Just pass it through
```

SECTION B.2 Huffman Decoder and Parser

B.2.1 Introduction

This section describes the Huffman Decoder and Parser circuitry in accordance with the present invention.

FIG. 118 shows a high level block diagram of the Huffman Decoder and Parser. Many signals and buses are omitted from this diagram in the interests of clarity, in particular, there are several places where data is fed backwards (within the large loop that is shown).

In essence, the Huffman Decoder and Parser of the present invention consist of a number of dedicated processing blocks (shown along the bottom of the diagram) which are controlled by a programmable state machine.

Data is received from the Coded Data Buffer by the "Inshift" block. At this point, there are essentially two types of information which will be encountered: Coded data which is carried by DATA Tokens and start codes which have already been replaced by their respective Tokens by the Start Code Detector. It is possible that other Tokens will be encountered but all Tokens (other than the DATA Tokens) are treated in the same way. Tokens (start codes) are treated as a special case as the vast majority of the data will still be encoded (in H.261, JPEG or MPEG).

In the present invention, all data which is carried by the DATA Tokens is transferred to the Huffman Decoder in a serial form (bit-by-bit). This data, of course, includes many fields which are not Huffman coded, but are fixed length coded. Nevertheless, this data is still passed to the- Huffman Decoder serially. In the case of Huffman encoded data, the Huffman Decoder only performs the first stage of decoding in which the actual Huffman code is replaced by an index number. If there are N district Huffman codes in the particular code table which is being decoded, then this "Huffman Index" lies in the range 0 to N−1. Furthermore, the Huffman Decoder has a "no op", i.e., "no operation" mode, which allows it to pass along data or token information to a subsequent stage without any processing by the Huffman Decoder.

The Index to Data Unit is a relatively simple block of circuitry which performs table look-up operations. It draws its name from the second stage of the Huffman decoding process in which the index number obtained in the Huffman Decoder is converted into the actual decoded data by a simple table look-up. The Index to Data Unit cooperates with the Huffman Decoder to act as a single logical unit.

The ALU is the next block and is provided to implement other transformations on the decoded data. While the Index to Data Unit is suitable for relatively arbitrary mappings, the ALU may be used where arithmetic is more appropriate. The ALU includes a register file which it can manipulate to implement various parts of the decoding algorithms. In particular, the registers which hold vector predictions and DC predictions are included in this block. The ALU is based around a simple adder with operand selection logic. It also includes dedicated circuitry for sign-extension type operations. It is likely that a shift operation will be implemented, but this will be performed in a serial manner; there will be no barrel shifter.

The Token Formatter, in accordance with the present invention, is the last block in the Video Parser and has the task of finally assembling decoded data into Tokens which can be passed onto the rest of the decoder. At this point, there are as many Tokens as will ever be used by the decoder for this particular picture.

The Parser State Machine, which is 18 bits wide and has been adopted for use with a two-wire interface has the task of coordinating the operation of the other blocks. In essence, it is a very simple state machine and it produces a very wide "micro-code" control word which is passed to the other blocks. FIG. 118 shows that the instruction word is passed from block-to-block by the side of the data. This is, indeed, the case and it is important to understand that transfers between the different blocks are controlled by two-wire interfaces.

In the present invention, there is a two-wire interface between each of the blocks in the Video Parser. Furthermore, the Huffman Decoder works with both serial, data, the inshifter inputs data one bit at a time, and with control tokens. Accordingly, there are two modes of operation. If data is coming into the Huffman Decoder via a DATA Token, then it passes through the shifter one bit at a time. Again, there is a two-wire interface between the inshifter and the Huffman Decoder. Other tokens, however, are not shifted in one bit at a time (serial) but rather in the header of the token. If a DATA token is input, then the header containing the address information is deleted and the data following the address is shifted in one bit at a time. If it is not a DATA Token, then the entire token, header and all, is presented to the Huffman Decoder all at once.

In the present invention, it is important to understand that the two-wire interface for the Video Parser is unusual in that it has two valid lines. One line is valid serially and one line is valid tokenly. Furthermore, both lines may not be asserted at the same time. One or the other may be asserted or if no valid data exists, then neither may be asserted although there are two valid lines, it should be recognized that there is only a single accept wire in the other direction. However, this is not a problem. The Huffman Decoder knows whether it wants serial data or token information depending on what needs to be done next based upon the current syntax. Hence, the valid and accept signals are set accordingly and an Accept is sent from the Huffman Decoder to the inshifter. If the proper data or token is there, then the inshifter sends a valid signal.

For example, a typical instruction might decode a Huffman code, transform it in the Index to Data Unit, modify that result in the ALU and then this result is formed into a Token word. A single microcode instruction word is produced which contains all of the information to do this. The command is passed directly to the Huffman Decoder which requests data bits one-by-one from the "Inshift" block until it has decoded a complete symbol. Control Tokens are input in parallel. Once this occurs, the decoded index value is passed along with the original microcode word to the Index to Data Unit. Note that the Huffman Decoder will require several cycles to perform this operation and, indeed, the number of cycles is actually determined by the data which is decoded. The Index to Data Unit will then map this value using a table which is identified in the microcode instruction word. This value is again passed onto the next block, the ALU, along with the original microcode word. Once the ALU has completed the appropriate operation (the number of cycles may again be data dependant) it passes the appropriate data onto the Token Formatting block along with the microcode word which controls the way in which the Token word is formed.

The ALU has a number of status wires or "condition codes" which are passed back to the Parser State Machine. This allows the State Machine to execute conditional jump instructions. In fact, all instructions are conditional jump instructions; one of the conditions that may be selected is hard-wired to the value "False". By selecting this condition, a "no jump" instruction may be constructed.

In accordance with the present invention, the Token Formatter has two inputs: a data field from the ALU and/or a constant field coming from the Parser State Machine. In addition, there is an instruction that tells the Token Formatter how many bits to take from one source and then to fill in with the remaining bits from the other for a total of 8 bits. For example, HORIZONTAL_SIZE has an 8 bit field that is an invariant address identifying it as a HORIZONTAL_SIZE Token. In this case, the 8 bits come from the constant field and no data comes from the ALU. If, however, it is a DATA Token, then you would likely have 6 bits from the constant field and two lower bits indicating the color components from the ALU. Accordingly, the Token Formatter takes this information and puts it into a token for use by the rest of he system. Note that the number of bits from each source in the above examples are merely for illustration purposes and one of ordinary skill in the art will appreciate that the number of bits from either source can vary.

The ALU includes a bank of counters that are used to count through the structure of the picture. The dimensions of the picture are programmed into registers associated with the counters that appear to the "microprogrammer" as part of the register bank. Several of the condition codes are outputs from this counter bank which allows conditional jumps based on "start of picture", "start of macroblock" and the like.

Note that the Parser State Machine is also referred to as the "Demultiplex State Machine". Both terms are used in this document.

Input Shifter

In the present invention, the Input Shifter is a very simple piece of circuitry consisting of a two pipeline stage datapath ("hfidp") and controlling Zcells ("hfi").

In the first pipeline stage, Token decoding takes place. At this stage, only the DATA token is recognized. Data contained in a DATA token is shifted one bit at a time into the Huffman Decoder. The second pipeline stage is the shift register. In the very last word of a DATA token, special coding takes place such that it is possible to transmit an arbitrary number of bits through the coded data buffer. The following are all possible patterns in the last data word.

TABLE B.2.1

Possible Patterns in the Last Data Word

| E | D | C | B | A | 9 | 8 | 7 | 6 | 5 | 4 | 3 | 2 | 1 | 0 | No. of Bits |
|---|---|---|---|---|---|---|---|---|---|---|---|---|---|---|---|
| 0 | 1 | 1 | 1 | 1 | 1 | 1 | 1 | 1 | 1 | 1 | 1 | 1 | 1 | 1 | None |
| X | 0 | 1 | 1 | 1 | 1 | 1 | 1 | 1 | 1 | 1 | 1 | 1 | 1 | 1 | 1 |
| X | X | 0 | 1 | 1 | 1 | 1 | 1 | 1 | 1 | 1 | 1 | 1 | 1 | 1 | 2 |
| X | X | X | 0 | 1 | 1 | 1 | 1 | 1 | 1 | 1 | 1 | 1 | 1 | 1 | 3 |
| X | X | X | X | 0 | 1 | 1 | 1 | 1 | 1 | 1 | 1 | 1 | 1 | 1 | 4 |
| X | X | X | X | X | 0 | 1 | 1 | 1 | 1 | 1 | 1 | 1 | 1 | 1 | 5 |
| X | X | X | X | X | X | 0 | 1 | 1 | 1 | 1 | 1 | 1 | 1 | 1 | 6 |
| X | X | X | X | X | X | X | 0 | 1 | 1 | 1 | 1 | 1 | 1 | 1 | 7 |
| X | X | X | X | X | X | X | X | 0 | 1 | 1 | 1 | 1 | 1 | 1 | 8 |
| X | X | X | X | X | X | X | X | X | 0 | 1 | 1 | 1 | 1 | 1 | 9 |
| X | X | X | X | X | X | X | X | X | X | 0 | 1 | 1 | 1 | 1 | 10 |
| X | X | X | X | X | X | X | X | X | X | X | 0 | 1 | 1 | 1 | 11 |
| X | X | X | X | X | X | X | X | X | X | X | X | 0 | 1 | 1 | 12 |
| X | X | X | X | X | X | X | X | X | X | X | X | X | 0 | 1 | 13 |
| X | X | X | X | X | X | X | X | X | X | X | X | X | X | 0 | 14 |

As the data bits are shifted left, one by one, in the shift register, the bit pattern "0 followed by all ones" is looked for (padding). This indicates that the remaining bits in the shift register are not valid and they are discarded. Note that this action only takes place in the last word of a DATA Token.

As described previously, all other Tokens are passed to the Huffman Decoder in parallel. They are still loaded into the second pipeline stage, but no shifting takes place. Note that the DATA header is discarded and is not passed to the Huffman at all. Two "valid" wires (out_valid and serial_valid) are provided. Only one is asserted at a given time and it indicates what type of data is being presented at that moment.

B.2.2 Huffman Decoder

The Huffman Decoder has a number of modes of operation. The most obvious is that it can decode Huffman Codes, turning them into a Huffman Index Number. In addition, it can decode fixed length codes of a length (in bits) determined by the instruction word. The Huffman Decoder can also accept Tokens from the Inshift block.

The Huffman Decode includes a very small state machine. This is used when decoding block-level information. This is because it takes too long for the Parser State Machine to make decisions (since it must wait for data to flow through the Index to Data Unit and the ALU before it can make a decision about that data and issue a new command). When this State Machine is used, the Huffman Decoder itself issues commands to the Index to Data Unit and ALU. The Huffman Decoder State Machine cannot control all of the microcode instruction bits and, therefore, it cannot issue the full range of commands to the other blocks.

B.2.2.1 Theory of Operation

When decoding Huffman codes, the Huffman Decoder of the present invention uses an arithmetic procedure to decode the incoming code into a Huffman Index Number. This number lies between 0 and N−1 (for a code table that has N entries). Bits are accepted one by one from the Input shifter.

In order to control the operation of the machine, a number of tables are required. These specify for each possible number of bits in a code (1 to 16 bits) how many codes there are of that length. As expected, this information is typically not sufficient to specify a general Huffman code. However, in MPEG, H.261 and JPEG, the Huffman codes are chosen such that this information alone can specify the Huffman Code table. There is unfortunately just one exception to this; the Tcoefficient table from H.261 which is also used in MPEG. This requires an additional table that is described elsewhere (the exception was deliberately introduced in H.261 to avoid start code emulation).

It is important to realize that the tables used by this Huffman Decoder are precisely the same as those transmitted in JPEG. This allows these tables to be used directly while other designs of Huffman decoders would have required the generation of internal tables from the transmitted ones. This would have required extra storage and extra processing to do the conversion. Since the tables in MPEG and H.261 (with the exception noted above) can be described in the same way, a multi-standard decoder becomes practical.

The following fragment of "C" illustrates the decoding process;

```
int total = 0;
int s = 0;
int bit = 0;
unsigned long code = 0;
int index = 0;
while (index>=total)
{
if(bit>=max_bits)
fail("huff_decode: ran off end of huff table\n");
   code=(code<<1) Inext_bit0;
   index=code-s+total;
total+=codes_per_bit[bit];
   s=(s+codes_per_bit[bit])<<1;
   bit++;
}
```

The process generally, is directly mapped into the silicon implementation although advantage is taken of the fact that certain intermediate values can be calculated in clock phases before they are required.

From the code fragment we see that;

$$total_{n+1}=total_n+cpb_n \qquad \text{EQ.1}$$

$$'s_{n+1}=2('s_n+cpb_n) \qquad \text{EQ.2}$$

$$code_{n+1}=2code_n+bit_n \qquad \text{EQ.3}$$

$$index_{n+1}=2code_n+bit_n+total_n-'s_n \qquad EQ.4$$

Unfortunately in the hardware it proved easier to use a modified set of equations in which a variable "shifted" is used in place of the variable "s". In this case:

In the hardware, however, it proved easier to use a modified set of equations in which a variable "shifted" is used in place of the variable "s". In this case;

$$shifted_{n+1}=2shifted_n+cpb_n \qquad EQ.5$$

It turns out that:

$$i_n=2shifted_n \qquad EQ.6$$

and so substituting this back into Equation 4 we see that:

$$index_{n+1}=2(code_n-shifted_n)+total_n+bit_n \qquad EQ.7$$

In addition to calculating successive values of "index", it is necessary to know when the calculation is completed. From the "C" code fragment we see that we are done when:

$$index_{n+1}<total_{n+1} \qquad EQ.8$$

Substituting from Equation 7 and Equation 1 we see that we are done when:

$$2(code_n-shifted_n)+bit_n-cpb_n<0 \qquad EQ.9$$

In the hardware implementation of the present invention, the common term in Equation 7 and Equation 9, ($code_n-shifted_n$) is calculated one phase before the remainder of these equations are evaluated to give the final result and the information that the calculation is "done".

One word of warning. In various pieces of "C" code, notably the behavioral compiled code Huffman Decoder and the sm4code projects, the "C" fragment is used almost directly, but the variable "s" is actually called "shifted". Thus, there are two different variables called "shifted". One in the "C" code and the other in the hardware implementation. These two variables differ by a factor of two.

B.2.2.1.1 Inverting the Data Bits

There is one other piece of information required to correctly decode the Huffman codes. This is the polarity of the coded data. It turns out that H.261 and JPEG use opposite conventions. This reflects itself in the fact that the start codes in H.261 are zero bits whilst the marker bytes in JPEG are one bits.

In order to deal with both conventions, it is necessary to invert the coded data bits as they are read into the Huffman Decoder in order to decode H.261 style Huffman codes. This is done in the obvious manner using an exclusive OR gate. Note that the inversion is only performed for Huffman codes, as when decoding fixed length codes, the data is not inverted.

MPEG uses a mix of the two conventions. In those aspects inherited from H.261, the H.261 convention is used. In those inherited from JPEG (the decoding of DC intra coefficients) the JPEG convention is used.

B.2.2.1.2 Transform Coefficients Table

When using the transform coefficients table in H.261 and MPEG, there are number of anomalies. First, the table in MPEG is a super-set of the table in H.261. In the hardware implementation of the present invention, there is no distinction drawn between the two standards and this means that an H.261 stream that contains codes from the extended part of the table (i.e., MPEG codes) will be decoded in the "correct" manner. Of course, other aspects of the compression standard may well be broken. For example, these extended codes will cause start code emulation in H.261.

Second, the transform coefficient table has an anomaly that means that it is not describable in the normal manner with the codes_per_bit tables. This anomaly occurs with the codes of length six bits. These code words are systematically substituted by alternate code words. In an encoder, the correct result is obtained by first encoding in the normal manner. Then, for all codes that are six bits or longer, the first six bits are substituted by another six bits by a simple table look-up operation. In a decoder, in accordance with the present invention, the decoding process is interrupted just before the sixth bit is decoded, the code words are substituted using a table look-up, and the decoding continues.

In this case, there are only ten possible six-bit codes so the necessary look-up table is very small. The operation is further helped by the fact that the upper two bits of the code are unaltered by the operation. As a result, it is not necessary to use a true look-up table. Instead a small collection of gates are hard-wired to give the appropriate transformation. The module that does this is called "hftcfrng". This type of code substitution is defined herein as a "ring" since each code from the set of possible codes is replaced by another code from that set (no new codes are introduced or old codes omitted).

Furthermore, a unique implementation is used for the very first coefficient in a block. In this case, it is impossible for an end-of-block code to occur and, therefore, the table is modified so that the most commonly occurring symbol can use the code that would otherwise be interpreted as end-of-block. This may save one bit. It turns out that with the architecture for decoding, in accordance with the present invention, this is easily accommodated. In short, for the first bit of the first coefficient the decoding is deemed "done" if "index" has the value zero. Furthermore, after decoding only a single bit there are only two possible values for "index", zero and one, it is only necessary to test one bit.

B.2.2.1.3 Register and Adder Size

The Huffman Decoder of the present invention can deal with Huffman codes that may be as long as 16 bits. However, the decoding machine is only eight bits wide. This is possible because we know that the largest possible value of the decoded Huffman Index number is 255. In fact, this could only happen in extended JPEG and, in the current application, the limit is somewhat lower (but larger than 128, so 7 bits will not suffice).

It turns out that for all legal Huffman codes, not only the final value of "index", but all intermediate values lie in the range 0 to 255. However, for an illegal code, i.e., an attempt to decode a code that is not in the current code table (probably due to a data error) the index value may exceed 255. Since we are using an eight bit machine, it is possible that at the end of decoding, the final value of "index" does not exceed 255 because the more significant bits that tell us an error has occurred have been discarded. For this reason, if at any time during decoding the index value exceeds 255 (i.e., carry out of the adder that forms index) an error occurs and decoding is abandoned.

Twelve bits of "code" are preserved. This is not necessary for decoding Huffman codes where an eight bit register would have been sufficient. These upper bits are required for fixed length codes where up to twelve bits may be read.

B.2.2.1.4 Operation for Fixed Length Codes

For fixed length codes, the "codes per bit" value is forced to zero. This means that "total" and "shifted" remain at zero throughout the operation and "index" is, therefore, the same as code. In fact, the adders and the like only allow an eight bit value to be produced for "index". Because of this, the upper bits of the output word are taken directly from the "code" register when decoding fixed length codes. When decoding Huffman codes these upper bits are forced to zero.

The fact that sufficient bits have been read from the input is calculated in the obvious manner. A comparator compares the desired number of bits with the "bit" counter.

B.2.2.2 Decoding Coefficient Data

The Parser State Machine, in accordance with the present invention, is generally only used for fairly high-level decoding. The very lowest level decoding within an eight-by-eight block of data is not directly handled by this state machine. The Parser State Machine gives a command to the Huffman Decoder of the form "decode a block". The Huffman Decoder, Index to Data Unit and ALU work together under the control of a dedicated state machine (essentially in the Huffman Decoder). This arrangement allows very high performance decoding of entropy coded coefficient data. There are also other feedback paths operational in this mode of operation. For instance, in JPEG decoding where the VLCs are decoded to provide SIZE and RUN information, the SIZE information is fed back directly from the output of the Index to Data Unit to the Huffman Decoder to instruct the Huffman Decoder how many FLC bits to read. In addition, there are several accelerators implemented. For instance, using the same example all VLC values which yield a SIZE of zero are explicitly trapped by looking at the Huffman Index Value before the Index to Data stage. This means that in the case of non-zero SIZE values, the Huffman Decoder can proceed to read one FLC bit BEFORE the actual value of SIZE is known. This means that no clock cycles are wasted because this reading of the first FLC bit overlaps the single clock cycle required to perform the table look-up in the Index to Data Unit.

B.2.2.2.1 MPEG and H.261 AC Coefficient Data

FIG. 127 shows the way in which AC Coefficients are decoded in MPEG and H.261. A flow chart detailing the operation of the Huffman Decoder is given in FIG. 119.

The process starts by reading a VLC code. In the normal course of events, the Huffman index is mapped directly into values representing the six bit RUN and the absolute value of the coefficient. A one bit FLC is then read giving the sign of the coefficient. The ALU assembles the absolute value of the coefficient with this sign bit to provide the final value of the coefficient.

Note that the data format at this point is sign-magnitude and, therefore, there is little difficulty in this operation. The RUN value is passed on an auxiliary bus of six bits while the coefficients value (LEVEL) is passed on the normal data bus.

Two special cases exist and these are trapped by looking at the value of the decoded index before the Index to Data operation. These are End of Block (EOB) and Escape coded data. In the case of EOB, the fact that this occurred is passed along through the Index to Data Unit and the ALU blocks so that the Token Formatter can correctly close the open DATA Token.

Escape coded data is more complicated. First six bits of RUN are read and these are passed directly through the Index to Data Unit and are stored in the ALU. Then, one bit of FLC is read. This is the most significant bit of the eight bits of escape that are described in MPEG and H.261 and it gives the sign of the level. The sign is explicitly read in this implementation because it is necessary to send different commands to the ALU for negative values versus positive values. This allows the ALU to convert the twos complement value in the bit stream into sign magnitude. In either case, the remaining seven bits of FLC are then read. If this has the value zero, then a further eight bits must be read.

In the present invention, the Huffman Decoder's internal state machine is responsible for generating commands to control itself and to also control the Index to Data Unit, the ALU and the Token Formatter. As shown in FIG. 124, the Huffman Decoder's instruction comes from one of three sources, the Parser State Machine, the Huffman State Machine or an instruction stored in a register that has previously been received from the Parser State Machine. Essentially, the original instruction from the Parser State Machine (that causes the Huffman State Machine to take over control and read coefficients) is retained in a register, i.e., each time a new VLC is required, it is used. All the other instructions for the decoding are supplied by the Huffman State Machine.

B.2.2.2.2 MPEG DC Coefficient Data

This is handled in the same way as JPEG DC Coefficient Data. The same (loadable) tables are used and it is the responsibility of the controlling microprocessor to ensure that their contents are correct. The only real difference from the MPEG standard is that the predictors are reset to zero (like in JPEG) the correction for this being made in the, Inverse Quantizer.

B.2.2.2.3 JPEG Coefficient Data

FIG. 120 is a block diagram illustrating the hardware, in accordance with the present invention, for decoding JPEG AC Coefficients. Since the process for DC Coefficients is essentially a simplication of the JPEG process, the diagram serves for both AC and DC Coefficients. The only real addition to the previous diagram for the MPEG AC coefficients is that the "SSSS" field is fed back and may be used as part of the Huffman Decoder command to specify the number of FLC bits to be read. The remainder of the command is supplied by the Huffman State Machine.

FIG. 121 depicts flow charts for the Huffman decoding of both AC and DC Coefficients.

Dealing first with the process for AC Coefficients, the process starts by reading a VLC using the appropriate tables (there are two AC tables). The Huffman index is then converted into the RUN and SIZE values in the Index to Data Unit. Two values are trapped at the Huffman Index stage, these are for EOB and ZRL. These are the only two values for which no FLC bits are read. In the case when the decode index is neither of these two values, the Huffman Decoder immediately reads one bit of FLC while it waits for the Index to Data Unit to complete the look-up operation to determine how many bits are actually required. In the case of EOB, no further processing is performed by the Huffman State Machine in the Huffman Decoder and another command is read from the Parser State Machine.

In the case of ZRL, no FLC bits are required but the block is not completed. In this case, the Huffman decoder immediately commences decoding a further VLC (using the same table as before).

There is a particular problem with detecting the index values associated with ZRL and EOB. This is because (unlike H.261 and MPEG) the Huffman tables are downloadable. For each of the two JPEG AC tables, two registers are provided (one for ZRL and one for EOB). These are loaded when the table is downloaded. They hold the value of index associated with the appropriate symbol.

The ALU must convert the SIZE bit FLC code to the appropriate sign-magnitude value. These are loaded when the table is downloaded. They hold the value of index associated with the appropriate symbol.

The ALU must convert the SIZE bit FLC code to the appropriate sign-magnitude value. This can be done by first sign-extending the value with the wrong sign. If the sign bit is now set, then the remaining bits are inverted (ones complement).

In the case of DC Coefficients, the decision making in the Huffman Decoding Stage is somewhat easier because there is no equivalent of the ZRL field. The only symbol which causes zero FLC bits to be read is the one indicating zero DC difference. This is again trapped at the Huffman Index stage, a register being provided to hold this index for each of the (downloadable) JPEG DC tables.

The ALU of the present invention has the job of forming the final decoded DC coefficient by retaining a copy of the last DC Coefficient value (known as the prediction). Four predictors are required, one for each of the four active color components. When the DC difference has been decoded, the ALU adds on the appropriate predictor to form the decoded value. This is stored again as the predictor for the next DC difference of that color component. Since DC coefficients are signed (because of the DC offset) conversion from twos complement to sign magnitude is required. The value is then output with a RUN of zero. In fact, the instructions to perform some of the last stages of this are not supplied by the Huffman State Machine. They are simply executed by the Parser State Machine.

In a similar manner to the AC Coefficients, the ALU must first form the DC difference from the SIZE bits of FLC. However, in this case, a twos complement value is required to be added to the predictor. This can be formed by first sign extending with the wrong sign, as before. If the result is negative, then one must be added to form the correct value. This can, of course, be added at the same time as the predictor by jamming the carry into the adder.

B.2.2.3 Error Handling

Error handling deserves some mention. There are effectively four sources of error that are detected:

Ran off the end of a table.

Serial when token expected.

Token when serial expected.

Too many coefficients in a block.

The first of these occurs in two situations. If the bit counter reaches sixteen (legal values being 0 to 15) then an error has occurred because the longest legal Huffman code is sixteen bits. If any intermediate value of "index" exceeds 255 then an error has occurred as described in section B.2.2.1.3.

The second occurs when serial data is encountered when a Token was expected. The third when the opposite condition arises.

The last type of error occurs if there are too many coefficients in a block. This is actually detected in the Index to Data Unit.

When any of these conditions arises, the error is noted in the Huffman error register and the Parser state machine is interrupted. It is the responsibility of the Parser State Machine to deal with the error and to issue the commands necessary to recover.

The Huffman cooperates with the Parser State Machine at the time of the interrupt in order to assure correct operation. When the Huffman Decoder interrupts the Parser State Machine, it is possible that a new command is waiting to be accepted at the output of the Parser State Machine. The Huffman Decoder will not accept this command for two whole cycles after it has interrupted the Parser State Machine. This allows the Parser State Machine to remove the command that was there (which should not now be executed) and replace it with an appropriate one. After these two cycles, the Huffman Decoder will resume normal operation and accept a command if a valid command is there. If not, then it will do nothing until the Parser State Machine presents a valid command.

When any of these errors occur, the "Huffman Error" event bit is set and, if the mask bit is set, the block will stop and the controlling microprocessor will be interrupted in the normal manner.

One complication occurs because in certain situations, what looks like an error, is not actually an error. The most important place where this occurs is when reading the macroblock address. It is legal in the syntaxes of MPEG, H.261 and JPEG for a Token to occur in place of the expected macroblock address. If this occurs in a legal manner, the Huffman error register is loaded with zero (meaning no error) but the Parser State Machine is still interrupted. The Parser State Machine's code must recognize this "no error" situation and respond accordingly. In this case, the "Huffman Error" event bit will not be set and the block will not stop processing.

Several situations must be dealt with. First, the Token occurs immediately with no preceding serial bits. In this case, a "Token when serial expected error" would occur. Instead, a "no error" error occurs in the way just described.

Second, the Token is preceded by a few serial bits. In this case, a decision is made. If all of the bits preceding the Token had the value one (remember that in H.261 and MPEG the coded data is inverted so these are zero bits in the coded data file) then no error occurs. If, however, any of them were zero, then they are not valid stuffing bits and, thus, an error has occurred and a "Token when serial expected" error does occur.

Third, the token is preceded by many bits. In this case, the same decision is made. If all sixteen bits are one, then they are treated as padding bits and a "no error" error occurs. If any of them had been zero, then "Ran off Huffman Table" error occurs.

Another place that a token may occur unexpectedly is in JPEG. When dealing with either Huffman tables or Quantizer tables, any number of tables may occur in the same Marker Segment. The Huffman Decoder does not know how many there are. Because of this fact, after each table is completed it reads another 4-bit FLC assuming it to be a new table number. If, however, a new marker segment starts, then a token will be encountered in place of the 4 bit FLC. This requirement is not foreseen and, therefore, an "Ignore Errors" command bit has been added.

B.2.2.4 Huffman Commands

Here are the bits used by the Parser State Machine to control the Huffman Decoder block and their definitions. Note that the Index to Data Unit command bits are also included in this table. From the microprogrammer's point of view, the Huffman Decoder and the Index to Data Unit operate as one coherent logical block.

TABLE B.2.2

Huffman Decoder Commands

| Bit | Name | Function |
|---|---|---|
| 11 | Ignore Errors | Used to disable errors in certain circumstances. |
| 10 | Download | Either nominate a table for download or download data into that table. |
| 9 | Alutab | Use information from the ALU registers to specify the table number (or number of bits of FLC) |
| 8 | Bypass | Bypass the index to Data Unit |
| 7 | Token | Decode a Token rather than FLC or VLC |
| 6 | FirstCoeff | Selects first coefficient tncx for Tcoeff table and other special modes. |
| 5 | Special | If set the Huffman State machine should take over control. |
| 4 | VLC(not FLC) | Specify VLC or FLC |

TABLE B.2.2-continued

| Huffman Decoder Commands | | |
|---|---|---|
| Bit | Name | Function |
| 3 | Table[3] | Specify the table to use for VLC or the number of bits to read for a FLC |
| 2 | Table[2] | |
| 1 | Table[1] | |
| 0 | Table[0] | |

B.2.2.4.1 Reading FLC

In this mode, Ignore Errors, Download, Alutab, Token, First Coeff, Special and VLC are all zero. Bypass will be set so that no Index to Data translation occurs.

The binary number in Table[3:0] indicates how many bits are to be read.

The numbers 0 to 12 are legal. The value zero does indeed read zero bits (as would be expected) and this instruction is, therefore, the Huffman Decoder NOP instruction. The values 13, 14 and 15 will not work and the value 15 is used when the Huffman State Machine is in control to denote the use of "SSSS" as the number of bits of FLC to read.

B.2.2.4.2 Reading VLC

In this mode, Ignore Errors, Download, Alutab, Token, First Coefficient and Special are zero and VLC is one. Bypass will usually be zero so that Index to Data translation occurs.

In this mode Token, First Coefficient and Special are all zero, VLC is one.

The binary number in Table[3:0] indicates which table to use as shown:

TABLE B.2.3

| Huffman Tables | |
|---|---|
| Table[3:0] | VLC Table to use |
| 0000 | TCoefficient (MPEG and H.261) |
| 0001 | CBP (Coded Block Pattern |
| 0010 | MBA (Macroblock Address) |
| 0011 | MVD (Motion Vector Data) |
| 0100 | intra Mtype |
| 0101 | Predicted Mtype |
| 0110 | Interpolated Mtype |
| 0111 | H.261 Mtype |
| 10x0 | JPEG (MPEG) DC Table 0 |
| 10x1 | JPEG (MPEG) DC Table 1 |
| 11x0 | JPEG AC Table 0 |
| 11x1 | JPEG AC Table 1 |

Note that in the case of the tables held in RAM (i.e., the JPEG tables) bit 1 is not used so that the table selections occur twice. If a non-baseline JPEG decoder is built, then there will be four DC tables and four AC tables and Table[1] will then be required.

If Table[3] is zero, then the input data is inverted as it is used in order that the tables are read correctly as H261 style tables. In the case of Table[3:0]=0, the appropriate Ring modification is also applied.

B.2.2.4.3 NOP Instruction

As previously described, the action of reading a FLC of zero bits is used as a No Operation instruction. No data is read from the input ports (either Token or Serial) and the Huffman Decoder outputs a data value of zero along with the instruction word.

B.2.2.4.4 TCoefficient First Coefficient

The H.261 and MPEG TCoefficient Table has a special non-Huffman code that is used for the very first coefficient in the block. In order to decode a TCoefficient at the start of a block, the First Coefficient bit may be set along with a VLC instruction with table zero. One of the many effects of the First Coefficient bit is to enable this code to be decoded.

Note that in normal operation, it is unusual to issue a "simple" command to read a TCoefficient VLC. This is because control is usually handed to the Huffman Decoder by setting the Special Bit.

B.2.2.4.5 Reading Token Words

In order to read Token words, the Token bit should be set to one. The Special and First Coefficient bits should be zero. The VLC bit should also be set if the Table[0] bit is to work correctly.

In this mode, the bits Table[1] and Table[0] are used to modify the behavior of the Token reading as follows:

| Bit | Meaning |
|---|---|
| Table[0] | Discard padding bits of serial data |
| Table[1] | Discard all serial data. |

If both Table[0] and Table[1] are zero, then the presence of serial data before the token is considered to be an error and will be signalled as such.

If Table [1] is set, then all serial data is discarded until a Token Word is encountered. No error will be caused by the presence of this serial data.

If Table[0] is set, then padding bits will be discarded. It is, of course, necessary to know the polarity of the padding bits. This is determined by Table[3] in exactly the same way as for reading VLC data. If Table [3] is zero, input data is first inverted and then any "one" bits are discarded. If Table [3] is set to one, the input data is NOT inverted and "one" bits are discarded. Since the action of inverting the data depending upon the Table[3] bit is conditional on the VLC bit; this bit must be set to one. If any bits that are not padding bits are encountered (i.e., "1" bits in H.261 and MPEG) an error is reported.

Note that in these instructions only a single Token word is read. The state of the extension bit is ignored and it is the responsibility of the Demux to test this bit and act accordingly. Instructions to read multiple words are also provided—see the section on Special Instructions.

B.2.2.4.6 ALU Registers Specify Table

If the "Alutab" bit is set, registers in the ALU's register file can be used to determine the actual table number to use. The table number supplied in the command, together with the VLC bit, determines which ALU registers are used;

TABLE B.2.4

| ALU Register Selection | | |
|---|---|---|
| VLC | table[3:0] | ALU table |
| 0 | x0xx | fwd_r_size |
| 0 | x1xx | bwd_r_size |
| 1 | x0xx | dc_huff[compid] |
| 1 | x1xx | ac_huff[compid] |

In the case of fixed length codes, the correct number of bits are read for decoding the vectors. If r_size is zero, a NOP instruction results.

In the case of Huffman codes, the generated table number has table[3] set to one so that the resulting number refers to one of the JPEG tables.

B.2.2.4.7 Special Instructions

All of the instructions (or modes of operation) described thus far are considered as "Simple" instructions. For each command that is received, the appropriate amount of input data (of either serial of token data) is read and the resulting data is output. If no error is detected, exactly one output will be generated per command.

In the present invention, special instructions have the characteristic that more than one output word may be generated for a single command. In order to accomplish this function, the Huffman Decoder's internal State Machine takes control and will issue itself instructions as required until it decides that the instruction which the Parser requested has been complete.

In all Special instructions, the first real instruction of the sequence that is to be executed is issued with the Special bit set to one. This means that all sequences must have a unique first instruction. The advantage of this scheme is that the first real instruction of the sequence is available without a look-up operation being required based upon the command received from the Parser.

There are four recognized special instructions:

TCoefficient

JPEG DC

JPEG AC

Token

The first of these reads H.261 and MPEG Transform coefficients, and the like, until the end-of-block symbol is read. If the block is a non-intra block, this command will read the entire block. In this case, the "First Coefficient" bit should be set so that the first coefficient trick is applied. If the block is an intra block, the DC term should already have been read and the "First Coefficient" bit should be zero.

In the case of an intra block in H.261, the DC term is read using a "simple" instruction to read the 8 bits FLC value. In MPEG, the "JPEG DC" special instruction described below is used.

The "JPEG DC" command is used to read a JPEG style DC term (including the SSSS bits FLC indicated by the VLC). It is also used in MPEG. The First Coefficient bit must be set in order that a counter (counting the number of coefficients) in the Index to Data Unit is reset.

The "JPEG AC" command is used to read the remainder of a block, after the DC term until either an EOB is encountered or the $64^{th}$ coefficient is read.

The "Token" command is used to read an entire Token. Token words are read until the extension bit is clear. It is a convenient method of dealing with unrecognized tokens.

B.2.2.4.8 Downloading Tables.

In the present invention, the Huffman Decoder tables can be downloaded by using the "Download" bit. The first step is to nominate which table to download. This is done by issuing a command to read a FLC with both the Download and First Coeff bits set. This is treated as an NOP so no bits are actually read, but the table number is stored in a register and is used to identify which table is being loaded in subsequent downloading.

TABLE B.2.5

JPEG Tables

| table[3:0] | Table nominated |
|---|---|
| 10xx | JPEG DC Codes per bit |
| 11xx | JPEG AC Codes per bit |
| 00xx | JPEG DC index to Data |
| 01xx | JPEG AC index to Data |

As the above table shows, either the AC or DC tables can be loaded and table[3] determines whether it is the codesper-bit table (in the Huffman decoder itself) or the Index to Data table that is loaded.

Once the table is nominated, data is downloaded into it by issuing a command to read the required number of FLC (always 8 bits) with the Download bits set (and the First Coeff bit zero). This causes the decoded data to be written into the nominated table. An address counter is maintained, the data is written at the current address and then the address counter is incremented. The address counter is reset to zero whenever a table is nominated.

When downloading the Index to Data tables, the data and addresses are monitored. Note that the address is the Huffman Index number while the data loaded into that address is the final decoded symbol. This information is used to automatically load the registers that hold the Huffman index number for symbols of interest. Accordingly, in a JPEG AC table, when the data has the value corresponding to ZRL is recognized, the current address is written into the register CED_H_KEY_ZRL_INDEX0 or CED_H_KEY_ZRL_INDEX1 as indicated by the table number.

Since decoded data is written into the codes-per-bit table one phase after it has been decoded, it is not possible to read data from the table during this phase. Therefore, an instruction attempting to read a VLC that is issued immediately after a table download instruction will fail. There is no reason why such a sequence should occur in any real application (i.e., when doing JPEG). It is, however, possible to build simulation tests that do this.

B.2.2.5 Huffman State Machine

The Huffman State Machine, in accordance with the present invention, operates to provide the Huffman Decoder commands that are internally generated in certain cases. All of the commands that may be generated by the internal state machine may also be provided to the Huffman Decoder by the Demux.

The basic structure of the State Machine is as follows. When a command is issued to the Huffman Decoder, it is stored in a series of auxiliary latches so that it may be reused at a later time. The command is also executed by the Huffman Decoder and analyzed by the Huffman State Machine. If the command is recognized as being the first of a known instruction sequence and the SPECIAL bit is set, then the Huffman Decoder State Machine takes over control of the Huffman Decoder from the Parser State Machine.

At this point, there are three sources of instructions for the Huffman Decoder:

1)The Parser State Machine—this choice is made at the completion of the special instruction (e.g., when EOB has been decoded) and the next demux command is accepted.

2)The Huffman State Machine. The Huffman State Machine may provide itself with an arbitrary command.

3)The original instruction that was issued by the Parser State Mchine to start the instruction.

In case (2), it is possible that the table number is provided by feedback from the Index to Data Unit, this would then replace the field in the Huffman State Machine ROM.

In case (1), in certain instances, table numbers are provided by values obtained from the ALU register file (e.g., in the case of AC and DC table numbers and F-numbers). These values are stored in the auxiliary command storage, so that when that command is later reused the table number is that which has been stored. It is not recovered again from the ALU since, in general, the counters will have advanced in order to refer to the next block.

Since the choice of the next instruction that will be used depends upon the data that is being decoded, it is necessary for the decision to be made very late in a cycle. Accordingly, the general structure is one in which all of the possible instructions are prepared in parallel and multiplexing late in the cycle determines the actual instruction.

Note that in each case, in addition to determining the instruction that will be used by the Huffman Decoder in the next cycle, the state machine ROM also determines the instruction that will be attached to the current data as it passes to the Index to Data Unit and then onto the ALU. In exactly the same way, all three of these instructions are prepared in parallel and then a choice is made late in the cycle.

Again, there are three choices for this part of the instruction that correspond to the three choices for the next Huffman Decoder instruction above.

1)A constant instruction suitable for End of Block.

2)The Huffman State Machine. The Huffman State Machine may provide an arbitrary instruction for the Index to Data Unit.

3)The original instruction that was issued by the Parser to start the instruction.

B.2.2.5.1 EOB Comparator

The EOB comparator's output essentially forces selection of the constant instruction to be presented to the Index to Data Unit and will also cause the next Huffman Instruction to be the next instruction from the Parser. The exact function of the comparator is controlled by bits in the Huffman State Machine ROM.

Behind the EOB comparator, there are four registers holding the index of the EOB symbol in the AC and DC JPEG tables. In the case of the DC tables, there is of course no End-Of-Block symbol but there is the zero-size symbol, that is generated by a DC difference of zero. Since this causes zero bits of FLC to be read in exactly the same way as the EOB symbol, they are treated identically.

In addition to the four index values held in registers, the constant value, 1, can also be used. This is the index number of the EOB symbol in H.261 and MPEG.

B.2.2.5.2 ZRL Comparator

In the present invention, this is the more general purpose comparator. It causes the choice of either the Huffman State Machine instruction or the Original Instruction for use by the I to D.

Behind the ZRL comparator, there are four values. Two are in registers and hold the index of the ZRL code in the AC tables. The other two values are constants, one is the value zero and the other is 12 (the index of ESCAPE in MPEG and H.261).

The constant zero is used in the case of an FLC. The constant 12 is used whenever the table number is less than 8 (and VLC). One of the two registers is used if the table number is greater than 7 (and VLC) as determined by the low order bit of the table number.

A bit in the state machine ROM is provided to enable the comparator and another is provided to invert its action.

If the TOKEN bit in the instruction is set, the comparator output is ignored and replaced instead by the extn bit. This allows for running until the end of a Token.

B.2.2.5.3 Huffman State Machine ROM

The instruction fields in the Huffman State Machine are as follows:

nxtstate[4:0]

The address to use in the next cycle. This address may be modified.

statect1

Allows modification of the next state address. If zero, the state machine address is unmodified, otherwise the LSB of the address is replaced by the value of either of the two comparators as follows:

| nxtstate[0] | |
|---|---|
| 0 | Replace Lsb by EOB match |
| 1 | Replace Lsb by ZRL match |

Note:
in any case, if the next Huffman Instruction is selected as "Re-run original command" the state machine will jump to location 0, 1, 2 or 3 as appropriate for the command.

eobct[1:0]

This controls the selection of the next Huffman instruction based upon the EOB comparator and extn bit as follows:

| eobctl[1:0] | |
|---|---|
| 00 | No effect - see zrlctl[1:0] |
| 01 | Take new (Parser) command if EOB |
| 10 | Take new (Parser) command if extn low |
| 11 | Unconditional Demux instruction |

zrlct[1:0]

This controls the selection of the next Huffman instruction based upon the ZRL comparator. If the condition is met, then it takes the state machine instruction, otherwise it re-runs the original instruction. In either case, if an eobct1*+ condition takes a demux instruction then this (eobct1*+) takes priority as follows:

| zrlctl[1:0] | |
|---|---|
| 00 | Never take SM (always re-run) |
| 01 | Always take SM command |
| 10 | SM if ZRL matches |
| 11 | SM if ZRL does not match |

smtab[3:0]

In the present invention, this is the table number that will be used by the Huffman Decoder if the selected instruction is the state machine instruction. However, if the ZRL comparator matches, then the zrltab[3:0] field is used in preference.

If it is not required that a different table number be used depending upon whether a ZRL match occurs, then both smtab[3:0] and zrltab{3:0] will have the same value. Note, however, that this can lead to strange simulation problems in Lsim. In the case of MPEG, there is no obvious requirement to load the registers that indicate the Huffman index number for ZRL (a JPEG only construction). However, these are still selected and the output of the ZRL comparator becomes "unknown" despite the fact that both smtab[3:0] and zrltab [3:0] have the same value in all cases that the ZRL comparator may be "unknown" (so it does not matter which is selected) the next state still goes to "unknown".

zrltab[3:0]

This is the table number that will be used by the Huffman decoder if the selected instruction is the state machine instruction. However, if the ZRL comparator matches then the zrltab[3:0} field is used in preference.

If it is not required that a different table number be used depending upon whether a ZRL match occurs, then both smtab[3:0] and zrltab[3:0] will have the same value. Note, however, that this can lead to strange simulation problems in Lsim. In the case of MPEG, there is no obvious requirement to load the register that indicate the Huffman index number for ZRL (a JPEG only construction). However, these are still selected and the output of the ZRL comparator becomes "unknown" despite the fact that both smtab[3:0] and zrltab [3:0] have the same value in all cases that the ZRL comparator may be "unknown" (so it does not matter which is selected) the next state still goes to "unknown".

zrltab[3:0]

This is the table number that will be used by the Huffman Decoder if the selected instruction is the state machine instruction and the ZRL comparator matches.

smvlc

This is the VLC bits used by the Huffman Decoder if the selected instruction is the state machine instruction.

aluzrl[1:0]

This field controls the selection of the instruction that is passed to the ALU. It will either be the command from the Parser State Machine (that was stored at the start of the instruction sequence) or the command from the state machine:

| aluzrl [1:0] | |
|---|---|
| 00 | Always take the saved Parset State Machine Command |
| 01 | Always take the Huffman State Machine Command |
| 10 | Take the Huffman SM command if not EOB |
| 11 | Take the Huffman SM command if not ZRL |

alueob

This wire controls modification of the instruction passed to the ALU based upon the EOB comparator. This simply forces the ALU's output mode to "zinput". This is an arbitrary choice; any output mode apart from "none" will suffice. This is to ensure that the end-of-lock command word is passed to the Token Formatter block where it controls the proper formatting of DATA Tokens:

| alueob | |
|---|---|
| 0 | Do not modify ALU outsrc field |
| 1 | Force "zinput" into outsrc if EOB match |

The remainder of the fields are the ALU instruction fields. These are properly documented in the ALU description.

B.2.2.5.4 Huffman State Machine Modification

In one embodiment of the state machine, the Index to Data Unit needs to "know" when the RUN part of an escape-coded Tcoefficient is being passed to the Index to Data Unit. While this can be accomplished using an appropriate bit in the control ROM, but to avoid changing the ROM, an alternative approach has been used. In this regard, the address going into the ROM is monitored and the address value five is detected. This is the appropriate location designated in the ROM dealing with the RUN field. Of course, it will be apparent that the ROM could be programmed to use other selected address values. Moreover, the aforedescribed approach of using a bit in the control ROM could be utilized.

B.2.2.6 Guided Tour of Schematics

In the present invention, the Huffman Decoder is called "hd". Logically, "hd" actually includes the Index to Data Unit (this is required by the limitations of compiled code generation). Accordingly, "hd" includes the following major blocks;

TABLE B.2.6

| Huffman Modules | |
|---|---|
| Module Name | Description |
| hddp | Huffman Decoder (Arithmetic) datapath |
| hdstdp | Huffman State Machine Datapath |
| hfltod | Index to Data Unit |

The following description of the Huffman modules is accomplished by a global explanation of the various subsystem areas shown in greater detail in the drawings which are readily comprehended by one of ordinary skill in the art.

B.2.2.6.1 Description of "hd"

The logic for the two-wire interface control usually includes three ports controlled by the two-wire interface; data input, data output and the command. In addition, there are two "valid" wires from the input shifter; token_valid indicating that a Token is being presented on in_data[7:0] and serial-valid indicating that data is being presented on serial.

The most important signals generated are the enables that go to the latches. The most important being e1 which is the enable for the ph1 latches. The majority of ph0 latches are not enabled whilst two enables are provided for those that are; e0 associated with serial data and e0t associated with Token data.

In the present invention, the "done" signals (done, notdone and their ph0 variants done0 and notdone0) indicate when a primitive Huffman command is completed. In the case when a Huffman State Machine command is executed, "done" will be asserted at the completion of each primitive command that comprises the entire state-machine command. The signal notnew prevents the acceptance of a new command from the Parser State Machine until the entire Huffman State Machine command is completed.

Regarding control of information received from the Index to Data Unit, the control logic for the "size" field is fed back to the Huffman decoder during JPEG coefficient decoding. This can actually happen in two ways. If the size is exactly one, this is fed back on the dedicated signal notfbone0. Otherwise, the size is fed back from the output of the Index to data unit (out_data[3:0] and a signal fbvalid1 indicates that this is occurring. The signal muxsize is produced to control the multiplexing of the fed-back data into the command register (sheet 10).

In addition, there is feedback that exactly 64 coefficients have been decode. Since in JPEG the EOB is not coded in this situation, the signal forceeob is produced. By analogy, with the signals for feeding back size, as mentioned above, there are in fact two ways in which this is done. Either jpegeob is used (a ph1 signal) or jpegeob0. Note that in the case when a normal feedback is made (jpegeob), the latch i_971 is only loaded as the data is fed back and not cleared until a new Parser State Machine command is accepted. The signal forceeob does not actually get generated until a Huffman code is decoded. Thus, the fixed length code (i.e., size bits) is not affected, but the next Huffman coded information is replaced by the forced end of block. In the case when size is one and jpegeob0 is used, only one bit is read and, therefore, i_1255 and i_1256 delay the signal to the correct time. Note that it is impossible for a size of zero to occur in this situation since the only symbols with size zero are EOB and ZRL.

The decoding is fairly random decoding of the command to produce tcoeff_tab0 (Huffman decoding using Tcoeff table), mba_tab0 (Huffman decoding using the MBA table)

and nop (no operation). There are several reasons for generating nop. A Fixed length code of size zero is one, the forceeob signal is another (since no data should be read from the input shifter even though an output is produced to signal EOB) and lastly table download nomination is a third.

notfrczero (generated by a FLC of size zero, a NOP) ensures that the result is zero when a NOP instruction is used. Furthermore, invert indicates when the serial bits should be inverted before Huffman decoding (see section B.2.2.1.1). ring indicates when the transform coefficient ring should be applied (see section B.2.2.1.2).

Decoding is also accomplished regarding addressing the codes-per-bit ROMs. These are built out of the small datapath ROMs. The signals are duplicated (e.g., csha and csla) purely to get sufficient drive by separating the ROMs into two sections. The address can be taken either from the bit counter (bit[3:0]) or from the microprocessor interface address (key-addr[3:0]) depending upon UPI access to the block being selected.

Additional decoding is concerned with the UPI reading of registers such as those that hold the Huffman index values for the JPEG tables (EOB, ZRL etc.). Also included is a tristate driver control for these registers and the UPI reading of the codes per bit RAMs.

Arithmetic datapath decoding is also provided for certain important bit numbers. first_bit is used in connection with the Tcoeff first coefficient trick and bit_five is concerned with applying the ring in the Tcoeff table. Note the use of forceeob to simulate the action that the EOB comparator matches the decoded index value.

Regarding the extn bit, if a token is read from the input shifter, then the associated extn bit is read along with it. Otherwise, the last value of extn is preserved. This allows the testing of the extn bit by the microcode program at any time after a token has been read.

When zerodat is asserted, the upper four bits of the Huffman output data are forced to zero. Since these only have valid values when decoding fixed length codes, they are zeroed when decoding a VLC, a token or when a NOP instruction is executed for any reason.

Further circuitry detects when each command is completed and generates the "done" signals. Essentially, there are two groups of reasons for being "done"; normal reasons and exceptional reasons. These are each handled by one of the two three way multiplexers.

The lower multiplexer (i_1275) handles the normal reasons. In the case of a FLC, the signal ndnflc is used. This is the output of the comparator comparing the bit counter with the table number. In the case of a VLC, the signal ndnvlc is used. This is an output from the arithmetic datapath and reflects directly Equation 9. In the case of an NOP instruction or a Token, only one cycle is required and, therefore, the system is unconditionally "done".

In the present invention, the upper multiplexer (i_1274) handles exceptional cases. If the decoder is expecting a size to be fed back (fbexpctd0) in JPEG decoding and that size is one (notfbone0), then the decoder is done because only one bit is required. If the decoder is doing the first bit of the first coefficient using the Tcoeff table, it is done if bit zero of the current index is zero (see Section B.2.2.1.2). If neither of these conditions are met then there is no exceptional reason for being done.

The NOR gate (i_1293) finally resolves the "done" condition. The condition generated by i-570 (i.e., that the data is not valid) forces "done". This may seem a little strange. It is used primarily just after reset to force the machine into its "done" state in preparation for the first command ("done" resets all counters, registers, etc.). Note that any error condition also forces "done".

The signal notdonex is required for use in detecting errors. The normal "done" signals cannot be used since on detecting an error "done" is forced anyway. The use of "done" would give a combinatorial feedback loop.

Error detection and handling, is accomplished by circuitry which detects all of the possible error conditions. Those are ORed together in i_1190. In this case, i_1193, i-585 and i_584 constitute the three bit Huffman error register. Note i_1253 and i-1254 which disable the error in the cases when there is no "real" error (section B.2.2.3).

In addition, i_580 and i_579 along with the associated circuitry provide a simple state machine that controls the acceptance of the first command after an error is detected.

As previously indicated, control signals are delayed to match pipeline delays in the Index to Data Unit and the ALU.

Itod_bypass is the actual bypass signal passed to the Index to Data Unit. It is modified when the Huffman State Machine is in control to force bypass whenever a fixed length code is decoded.

Aluinstr[32] is the bit that causes the ALU to feedback (condition codes) to the Parser State Machine. Furthermore, it is important when the Huffman State Machine is in control that the signals are only asserted once (rather than each time one of the primitive commands completes).

Aluinstr[36] is the bit that allows the ALU to step the block counters (if other ALU instruction bits specify an increment too). This also must only be asserted once.

In addition, these bits must only be asserted for ALU instructions that output data to the Token Formatter. Otherwise, the counters may be incremented prior to the first output to the Token formatter causing an incorrect value of "cc" in a DATA token.

In the illustrated embodiment of the invention, either alunode[1] or alunode[0] will be low if the ALU will output to the Token Formatter.

FIG. 118, similar to FIG. 27, illustrates the Huffman State Machine datapath referred to as "hdstdp". There is also a UPI decode for reading the output of the Huffman State machine ROM.

Multiplexing is provided to deal with the case when the table number is specified by the ALU register file locations (see Section B.2.2.4.6).

The modification of aluinstr[3:2] deals with forcing the ALU outsrc instruction field to non-none (section B.2.2.5.3, description of alueob)

Regarding the command register for the Huffman Decoder block (x), each bit of the command has associated multiplexer which selects between the possible sources of commands. Four control signals control this selection:

Selhold causes the register to retain its current state.

Selnew causes a new command to be loaded from the Parser State Machine. This also enables loading of the registers that retain the original Parser State Machine command for later use.

Selold causes loading of the command from the registers that retain the original Parser State Machine command.

/selsm causes loading of the command from the Huffman State Machine ROM.

In the case of the table number, the situation is slightly more complicated since the table number may also be loaded from the output data of the Index to Data Unit (selholdt and muxsize). Latches hold the current address in the Huffman state machine ROM. The logic detects which of the possible four commands are being executed. These signals are combined to form the lower two bits of the start address in the case of a new command.

Logic also detects when the output of the state machine ROM is meaningless (usually because the command is a "simple" command). The signal notignorerom effectively disables operation of the state machine, in particular, disabling any modification of the instruction passed to the ALU.

The circuitry generating fixstate0 controls the limited jumping capability of this state machine.

Decoding is also provided for driving the signals into the Huffman State Machine ROM. This is datapath-style combinatorial ROM.

The generation of escape-run is described in Section B.2.2.5.4.

Decoding also provides for the registers that hold the Huffman Index number for symbols such as ZRL and EOB. These registers can be loaded from the UPI or the datapath. The decoding in the center(es[4:0] and zs[3:0] is generating the select signals for the multiplexers that select which register or constant value to compare against the decode Huffman Index.

Regarding the control logic for the Huffman State Machine. Here the "instruction" bits from the Huffman State Machine ROM are combined with various conditions to determine what to do next and how to modify the instruction word for the ALU.

In the present invention, the signals notnew, notsm and notold are used on sheet 10 to control the operation of the Huffman Decoder command register. They are generated here in an obvious manner from the control bits in the state machine ROM (described in Section B.2.2.5.3) together with the output of the Huffman Index comparators (neobmatch and nzrlmatch).

Selection is also accomplished of the source for the instruction passed to the ALU. The actual multiplexing is performed in the Huffman State Machine datapath "hfstdp". Four control signals are generated.

In the case when the end-of-block has not been encountered, one of aluseldmx (selecting the Parser State Machine instruction) or aluselsm (selecting the Huffman state machine instruction) will be generated.

In the case when the end-of-block has not been encountered, one of aluseleobd (selecting the Parser State Machine instruction) or aluseleobs (selecting the Huffman State Machine instruction) will be generated. In addition the "outsrc" field of the ALU instruction is modified to force it to "zinput".

A register holds the nominated table number during table download. Decoding is provided for the codes-per-bit RAMS. Additional decoding recognizes when symbols like EOB and ZRL are downloaded so that the Huffman Index number registers can be automatically loaded.

Regarding the bit counter, a comparator detects when the correct number of bits have been read when reading a FLC.

B.2.2.6.2 Description of "hddp"

Comparators detect the specific values of Huffman Index. Registers hold the values for the downloadable tables. The multiplexers (meob[7:0] and mzr[7:0]) select which value to use and the exclusive-or gates and gating constitute the comparators.

Adders and registers directly evaluate the equations described in Section B.2.2.1. No further description is thought necessary here. An exclusive or is used for inverting the data (i_807) described in Section B.2.2.1.1.

The "code" register is 12 bits wide. A multiplexing arrangement implements the "ring" substitution described in Section B.2.2.1.2.

Regarding the pipeline delays for data and multiplexing between decoded serial data (index[7:0]) and Token data (ntoken0[7:0]), the Huffman index value is decided in ZRL and EOB symbols.

Codes-per-bit ROMs and their multiplexing are used for deciding which table to use. This arrangement is used because the table select information arrives late. All tables are then accessed and the correct table selected.

Regarding the codes-per-bit RAM, the final multiplexing of the codes-per-bit ROM and the output of the codes-per-bit RAM takes place inside the block "hdcpbram".

B.2.2.6.3 Description of "hdstdp"

In the present invention, "Hdstdp" comprises two modules. "hdstdel" is concerned with delaying the Parser State Machine control bits until the appropriate pipeline stage, e.g., when they are supplied to the ALU and Token Formatter. It only processes about half of the instruction word that is passed to the ALU, the remainder being dealt with by the other module "hdstmod".

"Hdstmod" includes the Huffman State Machine ROM. Some bits of this instruction are used by the Huffman State Machine control logic. The remaining bits are used to replace that part of the ALU instruction word (from the Parser State Machine) that is not dealt with in "hdstdel".

"Hdstmod" is obvious and requires no explanation—there are only pipeline delay registers.

"Hdstdel" is also very simple and is handled by a ROM and multiplexers for modifying the ALU instruction. The remainder of the circuitry is concerned with UPI read access to half of the Huffman State Machine ROM outputs. Buffers are also used for the control signals.

B.2.3 The Token Formatter

The Huffman Decoder Token Formatter, in accordance with the present invention, sits at the end of the Huffman block. Its function, as its name suggests, is to format the data from the Huffman Decoder into the propriety Token structure. The input data is multiplexed with data in the Microinstruction word, under control of the Microinstruction word command field. The block has two operating modes; DATA_WORD, and DATA_TOKEN.

B.2.3.1 The Microinstruction Word

TABLE B.2.7

The Mircoinstruction word consisting of seven fields

| Field Name | Bits |
|---|---|
| Token | 0:7 |
| Mask | 8:11 |
| Block Type (Bt) | 12:13 |
| External Extn (Ee) | 14 |
| Demux Extn (De) | 15 |
| End of Block (Eb) | 16 |
| Command (Cmd) | 17 |

| 17 | 16 | 15 | 14 | 12 | 8 | 0 |
|---|---|---|---|---|---|---|
| Cmd | Bo | De | Ee | Bt | Mask | Token |

The Microinstruction word is governed by the same accept as the Data word.

The Microinstruction word is governed by the same accept as the Data word.

B.2.3.2 Operating Modes

TABLE B.2.8

| Bit Allocation | |
|---|---|
| Cmd | Mode |
| 0 | Data_Word |
| 1 | Data_Token |

B.2.3.2.1 Data Word

In this mode, the top eight bits of the input are fed to the output. The bottom eight bits will be either the bottom eight bits of the input, the Token field of the Microinstruction word or a mixture of both, depending on the mask field. Mask represents the number of input bits in the mix, i.e.

out_data[16:8]=in_data[16:8]

out_data{7:0]=(Token[7:0]&(ff<<mask))indata[7:0]

When mask is set to 0×8 or greater, the output data will equal the input data. This mode is used to output words in non-DATA Tokens. With mask set to 0, out_data[7:0] will be the Token field of the Microinstruction word. This mode is used for outputting Token headers that contain no data. When Token headers do contain data, the number of data bits is given by the mask field.

If External Extn(Ee) is set, out_extn=in_extn, otherwise out_extn=De.Bt and Eb are "don't care".

B.2.3.2.2 Data Token

This mode is used for formatting DATA Tokens and has two functions dependent on a signal, first_coefficient. At reset, first_coefficient is set. When the first data coefficient arrives along with a Microinstruction word that has cmd set to 1, out_data[16:2] is set to 0×1 and out_data[1:0] takes the value of the Bt field in the Microinstruction word. This is the header of a DATA Token. When this word has been accepted, the coefficient that accompanied the command is loaded into a register, RL and first_coefficient takes the value of Eb. When the next coefficient arrives, out_data [16:0] takes the previous coefficient, stored in RL. RL and first_coefficient are then updated. This ensures that when the end of the block is encountered and Eb is set, first_coefficient is set, ready for the next DATA Token, i.e.,

```
If(first_coefficient)
{
  out_data[16:2] = 0 × 1
  out_data[1:0] = Bt[1:0]
 RL[16:0] = in_data[16:0]
}
else
{
  Cut_data[16:0] = RL[16:0]
  RL[16:0] = in_data [16:0]
}
out_extn = ~Eb
```

B.2.3.3 Explanatory Discussion

In accordance with the present invention, most of the instruction bits are supplied in the normal manner by the Parser State Machine. However, two of the fields are actually supplied by other circuitry. The "Bt" field mentioned above is connected directly to an output of the ALU block. This two bit field gives the current value of "cc" or "color component". Thus, when a DATA Token header is constructed, the lowest order two bits take the color component directly from the ALU counters. Secondly, the "Eb" bit is asserted in the Huffman decoder whenever and End-of-block symbols id decoded (or in the case of JPEG when one is assumed because the last coefficient in the block is coded).

The in_extn signal is derived in the Huffman Decoder. It only has meaning with respect to Tokens when the extension bit is supplied along with the Token word in the normal way.

B.2.4 The Parser State Machine

The Parser State Machine of the present invention is actually a very simple piece of circuitry. The complication lies in the programming of the microcode ROM which is discussed in Section B.2.5.

Essentially the machine consists of a register which holds the current address. This address is looked up in the microcode ROM to produce the microcode word. The address is also incremented in a simple incrementer and this incremented address is one of two possible addresses to be used for the next state. The other address is a field in the microcode ROM itself. Thus, each instruction is potentially a jump instruction and may jump to a location specified in the program. If the jump is not taken, control passes to the next location in the ROM.

A series sixteen condition code bits are provided. Any one of these conditions may be selected (by a field in the microcode ROM) and, in addition, it may be inverted (again a bit in the microcode ROM). The resulting signal selects between either the incremented address or the jump address in the microcode ROM. One of the conditions is hard-wired to evaluate as "False". If this condition is selected, no jump will occur. Alternatively, if this condition is selected and then inverted, the jump is always taken; an unconditional jump.

TABLE B.2.9

| Condition Code Bits | | |
|---|---|---|
| Bit No. | Name | Description |
| 0 | user[0] | Connected to a register programmable |
| 1 | user[1] | by the user from the microprocessor interface. |
| 2 | cbp_eignt | They allow "user defined" condition codes |
| 3 | cbp_special | that can be tested with little Overhead. Two are defined to control non-standard "Coded block Pattern" defined to control non-standard "Coded block macroblock structures. |
| 4 | he[0] | These bits connect directly to the Huffman |
| 5 | he[1] | decoder's Huffman Error register. |
| 6 | he[2] | |
| 7 | Extn | The Extension bit (for Tokens) |
| 8 | Btkptn | The Block Pattern Shifter |
| 9 | MBstart | At Start of a Macroblock |
| 10 | Picstart | At Start of a Picture |
| 11 | Restart | At Start af a Restart interval |
| 12 | Chngdet | The "Sticky" Change Detect bit |
| 13 | Zero | ALU zero candition |
| 14 | Sign | ALU sign condition |
| 15 | False | Hard wired to False. |

B.2.4.1 Two Wire Interface Control

The two-wire interface control, in accordance with the invention, is a little unusual in this block. There is a two-wire interface between the Parser State Machine and the Huffman Decoder. This is used to control the progress of commands. The Parser State Machine will wait until a given command has been accepted before it proceeds to read the next command from the ROM. In addition, condition codes are fed back through a wire from the ALU.

Each command has a bit in the microcode ROM that allows it to specify that it should wait for feedback. If this occurs, then after that instruction has been accepted by the Huffman Decoder, no new commands are presented until the feedback wire from the ALU becomes asserted. This wire, fb_valid, indicates that the condition codes currently being supplied by the ALU are valid in the sense that they reflect the data associated with the command that requested the wait for feedback.

The intended use of the feature, in accordance with the present invention, is in constructing conditional jump commands that decide the next state to jump to as a result of decoding (or processing) a particular piece of data. Without this facility it would be impossible to test any conditions depending upon data in the pipeline since the two-wire control means that the time at which a certain command reaches a given processing block (i.e., the ALU in this case) is uncertain.

Not all instructions are passed to the Huffman Decoder. Some instructions may be executed without the need for the data pipeline. These tend to be jump instructions. A bit in the microcode ROM selects whether or not the instruction will be presented to the Huffman Decoder. If not, there is no requirement that the Huffman Decoder accept the instruction and, therefore, execution can continue in these circumstances even if the pipeline is stalled.

B.2.4.2 Event Handling

There are two event bits located in the Parser State Machine. One is referred to as the Huffman event and the other is referred to as the Parser Event.

The Parser Event is the simplest of these. The "condition" being monitored by this event is simply a bit in the microcode ROM. Thus, an instruction may cause a Parser Event by setting this bit. Typically, the instruction that does this will write an appropriate constant into the rom_control register so that the interrupt service routine can determine the cause of the interrupt.

After servicing a Parser Event (or immediately if the event is masked out) control resumes at the point where it left off. If the instruction that caused the event has a jump instruction (whose condition evaluates true) then the jump is taken in the normal manner. Hence, it is possible to jump to an error handler after servicing by coding the jump.

A Huffman event is rather different. The condition being monitored is the "OR" of the three Huffman Error bits. In reality, this condition is handled in a very similar manner to the Parser Event. However, an additional wire from the Huffman Decoder, huffintrpt, is asserted whenever an error occurs. This causes control to jump to an error handler in the microcode program.

When a Huffman error occurs, therefore, the sequence involves generating interrupt and stopping the block. After servicing, control is transferred to the error handler. There is no "call" mechanism and unlike a normal interrupt, it is not possible to return to the point in the microcode before the error occurred following error handling.

It is possible for huffintrpt to be asserted without a Huffman error being generated. This occurs in the special case of a "no-error" error as discussed in Section B.2.2.3. In this case, no interrupt (to the microprocessor interface) is generated, but control is still passed to the error handler (in the microcode). Since the Huffman error register will be clear in this case, the microcode error handler can determine that this is the situation and respond accordingly.

B.2.4.3 Special Locations

There are several special locations in the microcode ROM. The first four locations in the ROM are entry points to the main program. Control passes to one of these four locations on reset. The location jumped to depends upon the coding standard selected in the ALU register, coding_std. Since this location is itself reset to zero by a true reset control passes to location zero. However, it is possible to reset the Parser State Machine alone by using the UPI register bit CED_H_TRACE_RST in CED_H_TRACE. In this case, the coding_std register is not reset and control passes to the appropriate one of the first four locations.

The second four locations (0×004 to 0×007) are used when a Huffman interrupt takes place. Typically, a jump to the actual error handler is placed in each of these locations. Again, the choice of location is made as a result of the coding standard.

B.2.4.4 Tracing

As a diagnostic aid, a trace mechanism is implemented. This allows the microcode to be single-stepped. The bits CED_H_TRACE_EVENT and CED_H_TRACE_MASK in the register CED_H_TRACE control this. As their names suggest, they operate in a very similar fashion to the normal event bits. However, because of several differences (in particular no UPI interrupt is ever generated) they are not grouped with the other event bits.

The tracing mechanism is turned on when CED_H_TRACE_MASK is set to one. After each microcode instruction is read from the ROM, but before it is presented to the Huffman Decoder, a trace event occurs. In this case, CED_H_TRACE_EVENT becomes one. It must be polled because no interrupt will be generated. The entire microcode word is available in the registers CED_H_KEY_DMX_WORD_0 through CED_H_KEY_DMX_WORD_9. The instruction can be modified at this time if required. Writing a one to CED_H_TRACE_EVENT causes the instruction to be executed and clears CED_H_TRACE_EVENT. Shortly after this time, when the next microcode word to be executed has been read from the ROM, a new trace event will occur.

B.2.5 The Microcode

The microcode is programmed using an assembler "hpp" which is a very simple tool and much of the abstraction is achieved by using a macro preprocessor. A standard "C" preprocessor "cpp" may be used for this purpose.

The code is instructed as follows:

Ucode.u is the main file. First, this includes tokens.h to define the tokens. Next, regfile.h defines the ALU register map. The fields.u defines the various fields in the microcode word, giving a list of defined symbols for each possible bit pattern in the field. Next, the labels that are used in the code are defined. After this step, instr.u is included to define a large number of "cpp" macros which define the basic instructions. Then, errors.h defines the numbers which define the Parser events. Next, unword.u defines the order in which the fields are placed to build the microcode word.

The remainder of ucode.u is the microcode program itself.

B.2.5.1 The Instructions

In this section the various instructions defined in ucode.u are described. Not all instructions are described here since in many cases they are small variations on a theme (particularly the ALU instructions).

B.2.5.1.1 Huffman and Index to Data Instructions

In the invention, the H_NOP instruction is used by the Huffman Decoder. It is the No-operation instruction. The Huffman does nothing in the sense that no data is decoded. The data produced by this instruction is always zero. Accordingly, the associated instruction is passed onto the ALU.

The next instructions are the Token groups; H_TOKSRCH, H_TOKSKIP_PAD, H_TOKSKIP_JPAD, H_TOKPASS and H_TOKREAD. These all read a token or tokens from the Input Shifter and pass them onto the rest of the machine. H_TOKREAD reads a single token word. H_TOKPASS can be used to read an entire token, up to and including, the word with a zero extn bit. The associated command is repeated for each word of the Token. H_TOKSRCH discards all serial data preceding a Token and then reads one token word. H_TOKSKIP_PAD skips any padding bits (H.261 and MPEG) and then reads one Token word. H_TOKSKIP_JPAD does the same thing for JPEG padding.

H_FLC(NB) reads a fixed length code of "NB" bits.

H_VLC(TBL) reads a vlc using the indicated table (passed as mnemonic, e.g., H_VLC(tcoeff)).

H_FLC_IE(NB) is like H_FLC, but the "ignore errors" bit is set.

H_TEST_VLC(TBL) is like H_VLC, but the bypass bit is set so that the Huffman Index is passed through the Index to Data Unit unmodified.

H_FWD_R and H_BWD_R read a FLC of the size indicated by the ALU registers r_fwd_r_size and r_bwd_r_size, respectively.

H_DCJ reads JPEG style DC coefficients, the table number from the ALU.

H_DCH reads a H.261 DC term.

H_TCOEFF and H_DCTCOEFF read transform coefficients. In H_DCTCOEFF, the first coeff bit is set and is for non-intra blocks, whilst H_TCOEFF is for intra blocks after the DC term has already been read.

H_NOMINATE(TBL) nominates a table for subsequent download.

H_DNL(NB) reads NB bits and downloads them into the nominated table.

B.2.5.1.2 ALU Instructions

There really are too many ALU instructions to explain them all in detail. The basic way in which the Mnemonics are constructed is discussed and this should make the instructions readable. Furthermore, these should readily be understandable to one of ordinary skill in the art.

Most of the ALU instructions are concerned with moving data from place to place and, therefore, a generic "load" instruction is used. In the Mnemonic, A_LDxy, it is understood that the contents of y are loaded into x., i.e., the destination is listed first and the source second:

TABLE B.2.10

Letters used to denote possible sources and destinations of data

| Letter | Meaning |
|---|---|
| A | A register |
| R | Run register |
| I | Data input |
| O | Data Output |
| F | ALU register File |
| C | Constant |
| Z | Constant of zero |

By way of example, LDAI loads the A register with the data from the data input port of the ALU. If the ALU register file is specified, the mnemonic will take an address so that LDAF(RA) loads A with the contents of location RA in the register file.

The ALU has the ability to modify data as it is moved from source to destination. In this case, the arithmetic is indicated as part of the source data. Accordingly, the Mnemonic LDA_AADDF(RA) loads A with the existing contents of the A register plus the contents of the indicated location in the register file. Another example is LDA_ISGXR, which takes the input data, sign extends from the bit indicated in the RUN register, and stores the result in the A register.

In many cases, more than one destination for the same result is specified. Again, by way of example, LDF_LDA_ASUBC(RA) which loads the result of A minus a constant into both the A register and the register file.

Other mnemonics exist for specific actions. For example, "CLRA" is used for clearing the A register, "RMBC" to reset the macroblock counter. These are fairly obvious and are described in comments in instr.u.

One anomaly is the use of a suffix "_O" to indicate that the result of the operation is output to the Token formatter in addition to the normal action. Thus LDFI_O(RA) stores the input data and also passes it to the token formatter. Alternatively, this could have been LDF_LDO_I(RA) if desired.

B.2.5.1.3 Token Formatter Instructions

This is the T_NOP "No-operation" instruction. This is really a misnomer as it is impossible to construct a no-operation instruction. However, this is used whenever the instruction is of no consequence because the ALU does not output to the Token Formatter.

T_TOK output a Token word.

T_DAT output a DATA Token word (used only with the Huffman State Machine instructions).

T-GENT8 generates a token word based on the 8 bits of constant field.

T_GENT8E like T_GENT8, but the extension bit is one.

T_OPD(NB) NB bits of data from the bottom NB bits of the output with the remainder of the bits coming from the constant field.

T_OPDE(NB) like T_OPD, but the extension bit is high.

T_OPD8 short-hand for T_OPD(8)

T_OPD8E short-hand for T_OPDE(8)

B.2.5.1.4 Parser State Machine Instructions

This instruction, D_NOP No-operation, i.e., the address increments as normal and the Parser State Machine does nothing special. The Remainder of the instruction is passed to the data pipeline. No waiting occurs.

D_WAIT is like D_NOP, but waits for feedback to occur.

The simple jump group. Mnemonics like D_JMP (ADDR) and D_JNX(ADDR) jump if the condition is met. The instruction is not output to the Huffman Decoder.

The external jump group. Mnemonics like D_XJMP (ADDR) and D_XJNX(ADDR). These are like their simple counterparts above, but the instruction is output to the Huffman Decoder.

The jump and wait group. Mnemonics like D_WJNZ (ADDR). These instructions are output to the Huffman Decoder and the Parser waits for feedback from the ALU before evaluating the condition.

The following Mnemonics are used for the conditions themselves.

TABLE B.2.11

Mnemonics used for the conditions

| Mnemonic | | Meaning |
|---|---|---|
| JMP | — | Unconditional jump |
| JXT | JNX | Jump if extn=1(extn=0) |
| JHE0 | JNHE0 | Jump if Huffman error bit 0 set (clear) |
| JHE1 | JNHE1 | Jump if Huffman error bit 1 set (clear) |
| JHE2 | JNHE2 | Jump if Huffman error bit 2 set (clear) |
| JPTN | — | Jump if pattern shifter LSB is set |
| JPICST | JNPICST | Jump is at picture start (not at picture start) |
| JRSTST | JNRSTST | Jump if at start of restart interval (not at start) |
| — | JNCPBS | Jump if not special CPB coding |
| — | JNCPB8 | Jump if not 8 block (i.e. 4 block) macroblock |
| JMI | JPL | Jump if negative (jump if plus) |
| JZE | JNZ | Jump if zero (jump if non-zero) |
| JCHNG | JNCHNG | Jump if change detect bit set (clear) |
| JMBST | JNMBST | Jump if at start of macroblock (not at start) |

D_EVENT causes generation of an event.

D_DFLT for construction of a default instruction. This causes an event and then jumps to a location with the label "dflt". This instruction should never be executed since they are used to fill a ROM so that a jump to an unused location is trapped.

D_ERROR causes an event and then jumps to a label "srch_dispatch" which is assumed to attempt recovery from the error.

SECTION B.3 HUFFMAN DECODER ALU

B.3.1 Introduction

The Huffman Decoder ALU sub-block, in accordance with the present invention, provides general arithmetic and logical functionality for the Huffman Decoder block. It has the ability to do add and subtract operations, various types of sign-extend operations, and formatting of the input data into run-sign-level triples. It also has a flexible structure whose precise operation and configuration are specified by a microinstruction word which arrives at the ALU synchronously with the input data, i.e., under the control of the two-wire interface.

In addition to the 36-bit instruction and 12-bit data input ports, the ALU has a 6-bit run port, and an 8-bit constant port (which actually resides on the token bus). All of these, with the exception of the microinstruction word, drive buses of their respective widths through the ALU datapath. There is a single bit within the microinstruction word which represents an extension bit and is output together with the 17-bit-run-sign-level (out_data). There is a two-wire interface at each end of the ALU datapath, and a set of condition codes which are output together with their own valid signal, cc_valid. There is a register file which is accessible to other Huffman Decoder sub-blocks via the ALU, and also to the microprocessor interface.

B.3.2.2 Basic Structure

The basic structure of the Huffman ALU is as shown in FIG. 126. It comprises the following components:

Input block 400

Output block 401

Condition Codes block 402

"A" register 403 with source multiplexing

Run register (6 bits) 404 with source multiplexing

Adder/Subtractor 405 with source multiplexing

Sign Extend logic 406 with source multiplexing

Register file 407

Each of these blocks (except the output block) drives its output onto a bus running through the datapath, and these buses are, in turn, used as inputs to the multiplexing for block sources. For example, the adder output has it own datapath bus which is one of the possible inputs to the A register. Likewise, the A register has its own bus which forms one of the possible inputs to the adder. Only a subset of all possibilities exist in this respect, as specified in Section 7 on the microinstruction word.

In a single cycle, it is possible to execute either an add-based instruction or a sign-extend-based instruction. Furthermore, it is allowable to execute both of these in a single cycle provided that their operation is strictly parallel. In other words, add then sign extend or sign extend then add sequences are not allowed. The register file may be either read from or written to in a single cycle, but not both.

The output data has three fields:

run—6 bits sign—1 bit level—10 bits

If data is to be passed straight through the ALU, the least significant 11 bits of the input data register are latched into the sign and level fields.

It is possible to program limited multi-cycle operations of the ALU. In this regard, the number of cycles required is given by the contents of the register file location whose address is specified in the microinstruction, and the same operation is performed repeatedly while an iteration counter decrements to one. This facility is typically used to effect left shifts, using the adder to add the A register to itself and to store the result back in the A register.

B.3.3 The Adder/Subtractor Sub-Block

This is a 12-bit wide adder, with optional invert on its input2 and optional setting of the carry-in bit. Output is a 12 bit sum, and carry-out is not used. There are 7 modes of operation:

ADD: add with carry in set to zero: input1+input2

ADC: add with carry in set to one: input1+input2+1

SBC: invert input2, carry in set to zero: input1−input2−1

SUB: invert input2, carry in set to one: input1−input2

TCI: if input2<0, use SUB, else use ADD. This is used with input1 set to zero for obtaining a magnitude value from a two's compliment value.

DCD (DC difference): if input2<0 do ADC, otherwise do ADD.

VRA (vector residual add): if input1<0 do ADC, otherwise do SBC.

B.3.4 The Sign Extend Sub-Block

This is a 12-bit unit which sign extends, in various modes, the input data from the size input. Size is a 4 bit value ranging from 0 to 11 (0 relates to the least significant bit, 11 to the most significant). Output is a 12 bit modified data value, and the "sign" bit.

In SGXMODE=NORMAL, all bits above (and including) the size-th bit, take the value of the size-th bit. All those below remain unchanged. Sign takes the value of the size-th bit. For example:

data=1010 1010 1010 size=2 output=0000 0000 0010, sign=0

In SGXMOD=INVERSE, all bits above (and including) the size-th bit, take the inverse of the size-th bit, while all those below remain unchanged. Sign takes the inverse of the size-th bit. For example:

data=1010 1010 1010 size=0 output=1111 1111 1111, sign=1

In SGXMODE=DIFMAG, if the size-th bit is zero, all the bits below (and including) the size-th bit are inverted, while all those above remain unchanged. If the size-th bit is one, all bits remain unchanged. In both cases, sign takes the inverse of the size-th bit. This is used for obtaining the magnitude of AC difference values. For example:

data=0000 1010 1010 size=2 output=0000 1010 1101, sign=1 data=0000 1010 1010 size=1 output=0000 1010 1010, sign=0

In SGXMODE=DIFCOMP, all bits above (but not including) the size-th bit, take the inverse of the size-th bit, while all those below (and including) remain unchanged. Sign takes the inverse of the size-th bit. This is used for obtaining two's compliment values for DC difference values. For example:

data=1010 1010 1010 size=0 output=1111 1111 1110, sign=1

B.3.5 Condition Codes

There are two bytes (16 bits) of condition codes used by the Huffman block, certain bits of which are generated by the ALU/register file. These are the Sign condition code, the Zero condition code, the Extension condition code and a Change Detect bit. The last two of these codes are not really condition codes since they are not used by the Parser in the same way as the others.

The Sign, Zero and Extension condition codes are updated when the Parser issues an instruction to do so, and for each of these instructions the condition code valid signal is pulsed high once.

The Sign condition code is simply the sign extend sign output latched, while the Zero condition code is set to 1 if the input to the A register is zero. The Extension condition code is the input extension bit latched regardless of OUT-SRC.

Condition codes may be used to evaluate certain condition types:

result equals constant—use subtract and Zero condition result equals register value—use subtract and Zero condition register equals constant—use subtract and Zero condition register bit set—use sign extend and Sign condition result bit set—use sign extend and Sign condition Note that when using the sign extend and Sign condition code combination, it is possible only to evaluate a single specified bit, rather than multiple bits as would be the case with a conventional logical AND.

The Change Detect bit, in the present invention, is generated using the same logic as for the Zero condition code, but it does not have an associated valid signal. A bit in the microinstruction indicates that the Change Detect bit should be updated if the value currently being written to the register file is different from that already present (meaning that two clock cycles are necessary, first with REG-MODE set to READ and second with REGMODE set to WRITE). A microprocessor interrupt can then be initiated if a changed value is detected. The Change Detect bit is reset by activating Change Detect in the normal way, but with REGMODE set to READ.

The hardwired macroblock counter structure (which forms part of the register file—see below) also generates condition codes as follows: Mb_Start, Pattern_Code, Restart and Pic_Start.

B.3.6 The Register File

The address map for the register file is shown below. It uses a 7-bit address space, which is common to both the ALU datapath and the UPI. A number of locations are not accessed by the ALU, these typically being counters in the hardwired macroblock structure, and registers within the ALU itself. The latter have dedicated access, but form part of the address map for the UPI. Some multi-byte locations (denoted in the table by "O" for oversize) have a single ALU address, but multiple UPI addresses. Similarly, groups of registers which are indexed by the component count, CC (Indicated by I" in the table) are treated as a single location by the ALU. This eases microprogramming for initialization and resetting, and also for block-level operations.

All of the locations, except the dedicated ALU registers (UPI read only), are read/write, and all of the counters are reset to zero by a bit in the instruction word. The pattern code register has a right shift capability, its least significant bit forming the Pattern_Code condition bit. All registers in the hardwired macroblock structure are denoted in the table by "M", and those which are also counters (n-bit) are annotated with Cn.

In the present invention, certain locations have their contents hardwired to other parts of the Huffman subsystem-coding standard, two r-size locations, and a single location (2-bit word) for each of ac huff table and dc huff table to the Huffman Decoder.

Addresses in bold indicate that locations are accessible by both the ALU and the UPI, otherwise they have UPI access only. Groups of registers that are undirected through CC by the ALU can have a single ALU address specified in the instruction word and CC will select which physical location in the group to access. The ALU address may be that of any of the registers in the group, though conventionally, the address of the first should be used. This is also the case for multi-byte locations which should be accessed using the lowest address of the pair, although in practice, either address will suffice. Note that locations 2E and 2F are accessible in the top-level address map (denoted "T"), i.e., not only through the keyhole registers. These two locations are also reset to zero.

The register file is physically partitioned into four "banks" to improve access speed, but this does not affect the addressing in any way. The main table shows allocations for MPEG, and the two repeated sections give the variations for JPEG and H.261 respectively.

TABLE B.3.1

Table 1: Huffman Register File Address Map

| | Addr | Location | | Addr | Location | |
|---|---|---|---|---|---|---|
| | 00 | A register 1 | I | 3E | c2 | |
| | 01 | A register 0 | I | 3F | c3 | |
| | 02 | run | I,O | 40 | dc pred_0 1 | |
| | 10 | horiz pels 1 | I,O | 41 | dc pred_0 0 | |
| | 11 | horiz pels 0 | I,O | 42 | dc pred_1 1 | |
| | 12 | vert pels 1 | I,O | 43 | dc pred_1 0 | |
| | 13 | vert pels 0 | I,O | 44 | dc pred_2 1 | |
| | 14 | buff size 1 | I,O | 45 | dc pred_2 0 | |
| | 15 | buff size 0 | I,O | 46 | dc pred_3 1 | |
| | 16 | pel asp. ratio | I,O | 47 | dc pred_3 0 | |
| | 17 | bit rate 2 | O | 50 | prev mhf 1 | |
| | 18 | bit rate 1 | O | 51 | prev mhf 0 | |
| | 19 | bit rate 0 | O | 52 | prev mvf 1 | |
| | 1A | pic rate | O | 53 | prev mvf 0 | |
| | 1B | constrained | O | 54 | prev mhb 1 | |
| | 1C | picture type | O | 55 | prev mhb 0 | |
| | 1D | H261 picture type | O | 56 | prev mvb 1 | |
| | 1E | broken closed | O | 57 | prev mvb 0 | |
| | 1F | pred mode | M | 60 | mb horiz cnt1 | C13 |
| | 20 | vbv delay 1 | M | 61 | mb horiz cnt0 | " |
| | 21 | vbv delay 0 | M | 62 | mb vert cnt1 | C13 |
| | 22 | full pel fwd | M | 63 | mb vert cnt0 | " |
| | 23 | full pel bwd | M | 64 | horiz mb 1 | |
| | 24 | horiz mb copy | M | 65 | horiz mb 0 | |
| | 25 | pic number | M | 66 | vert mb 1 | |
| | 26 | max h | M | 67 | vert mb 0 | |
| | 27 | max v | M | 68 | restart count1 | C16 |
| | 28 | — | M | 69 | restart count0 | " |
| | 29 | — | M | 6A | restart gap1 | |
| | 2A | — | M | 6B | restart gap0 | |
| | 2B | — | M | 6C | horiz blk count | C2 |
| | 2C | first group | M | 6D | vert blk count | C2 |
| | 2D | in picture | H,M | 6E | comp id | C2 |
| T,R | 2E | rom control | M | 6F | max comp id | |
| T,R | 2F | rom revision | H,R | 70 | coding std | |
| I,H | 30 | dc huff 0 | M,H | 71 | pattern code | SR8 |
| I | 31 | dc huff 1 | H | 72 | fwd r size | |
| I | 32 | dc huff 2 | H | 73 | bwd r size | |
| I | 33 | dc huff 3 | | | | |
| I,H | 34 | ac huff 0 | | | | |
| I | 35 | ac huff 1 | | | | |
| I | 36 | ac huff 2 | M,I | 78 | h0 | |
| I | 37 | ac huff 3 | M,I | 79 | h1 | |
| I | 38 | tq0 | M,I | 7A | h2 | |
| I | 39 | tq1 | M,I | 7B | h3 | |
| I | 3A | tq2 | M,I | 7C | v0 | |
| I | 3B | tq3 | M,I | 7D | v1 | |

TABLE B.3.1-continued

| | Table 1: Huffman Register File Address Map | | | | |
|---|---|---|---|---|---|
| | Addr | Location | | Addr | Location |
| I | 3C | c0 | M,I | 7E | v2 |
| I | 3D | c1 | M,I | 7F | v3 |

TABLE B.3.2

| JPEG Variations: | |
|---|---|
| 10 | horiz pels 1 |
| 11 | horiz pels 0 |
| 12 | vert pels 1 |
| 13 | vert pels 0 |
| 14 | buff size 1 |
| 15 | buff size 0 |
| 16 | pel asp. ratio |
| 17 | bit rate 2 |
| 18 | bit rate 1 |
| 19 | bit rate 0 |
| 1A | pic rate |
| 1B | constrained |
| 1C | picture type |
| 1D | H261 picture type |
| 1E | broken closed |
| 1F | pred mode |
| 20 | vbv delay 1 |
| 21 | vbv delay 0 |
| 22 | pending frame ch |
| 23 | restart index |
| 24 | horiz mb copy |
| 25 | pic number |
| 26 | max h |
| 27 | max v |
| 28 | — |
| 29 | — |
| 2A | — |
| 2B | — |
| 2C | first scan |
| 2D | in picture |
| 2E | rom control |
| 2F | rom revision |

TABLE B.3.3

| H.261 Variations: | |
|---|---|
| 10 | horiz pels 1 |
| 11 | horiz pels 0 |
| 12 | vert pels 1 |
| 13 | vert pels 0 |
| 15 | buff size 0 |
| 14 | buff size 1 |
| 16 | pel asp. ratio |
| 17 | bit rate 2 |
| 18 | bit rate 1 |
| 19 | bit rate 0 |
| 1A | pic rate |
| 1B | constrained |
| 1C | picture type |
| 1D | H261 picture type |
| 1E | broken closed |
| 1F | pred mode |
| 20 | vbv delay 1 |
| 21 | vbv delay 0 |
| 22 | full pel fwd |
| 23 | full pel bwd |
| 24 | horiz mb copy |
| 25 | pic number |
| 26 | max h |
| 27 | max v |
| 28 | — |
| 29 | — |
| 2A | — |
| 2B | in gob |
| 2C | first group |
| 2D | in picture |
| 2E | rom control |
| 2F | rom revision |

B.3.7 The microinstruction Word

The ALU microinstruction word, in accordance with the present invention, is split into a number of fields, each controlling a different aspect of the structure described above. The total number of bits used in the instruction word is 36, (plus 1 for the extension bit input) and a minimum of encoding across fields has been adopted so that maximum flexibility of hardware configuration is maintained. The instruction word is partitioned as detailed below. The default field values, that is, those which do not alter the state of the ALU or register file, are those given in the italics.

TABLE B.3.4

Table 2: Huffman ALU microinstruction fields

| Field | Value | Description | Bits |
|---|---|---|---|
| OUTSRC | RSA6 | run, sign, A register as 6 bits | 0000 |
| (specifies | ZZA | zero, zero, A register | 0001 |
| sources for | ZZA8 | zero, zero, A register ls 8 bits | 0010 |
| run, sign and | ZZADDU4 | zero, zero, adder o/p ms 4 bits | 0011 |
| level output) | ZINPUT | zero, input data | 0100 |
| | RSSGX | run, sign, sign extend o/p | 0111 |
| | RSADD | run, sign, adder o/p | 1000 |
| | RZADD | run, zero, adder o/p | 1001 |
| | RIZADD | input run, zero, adder output | |
| | ZSADD | zero, sign, adder o/p | 1010 |
| | ZZADD | zero, zero, adder o/p | 1011 |
| | NONE | no valid output - out_valid set to zero | 11XX |
| REGADDR | 00 - 7F | register file address for ALU access | 7 bits |
| REGSRC | ADD | drive adder o/p onto register file i/p | 0 |
| | SGX | drive sign extend o/p onto register file i/p | 1 |
| REGMODE | READ | read from register file | 0 |

TABLE B.3.4-continued

Table 2: Huffman ALU microinstruction fields

| Field | Value | Description | Bits |
|---|---|---|---|
| | WRITE | write to register file | 1 |
| CNGDET | TEST | update change detect if REGMODE is WRITE | 0 |
| (change | HOLD | do not update change detect bit | 1 |
| detect) | CLEAR | reset change detect if REGMODE is READ | 0 |
| RUNSRC | RUNIN | drive run i/p onto run register i/p | 0 |
| (run source) | ADD | drive adder o/p onto run register i/p | 1 |
| RUNMODE | LOAD | update run register | 0 |
| | HOLD | do not update run register | 1 |
| ASRC | ADD | drive adder o/p onto A register i/p | 00 |
| (A register | INPUT | drive input data onto A register i/p | 01 |
| source) | SGX | drive sign extend o/p onto A register i/p | 10 |
| | REG | drive register file o/p onto A register i/p | 11 |
| AMODE | LOAD | update A register | 0 |
| | HOLD | do not update A register | 1 |
| SGXMODE | NORMAL | sign extend with sign | 00 |
| (sign extend | INVERSE | sign extend with ~sign | 01 |
| mode - see | DIFMAG | invert lower bits if sign bit is 0 | 10 |
| Section 4) | DIFCOMP | Sign extend with ~sign from next bit up | 11 |
| SIZESRC | CONST | drive const. i/p onto sign extend size i/p | 00 |
| (source for | A | drive A register onto sign extend size i/p | 01 |
| sign extend | REG | drive reg.file o/p onto sign extend size i/p | 10 |
| size input) | RUN | drive run reg. onto sign extend size i/p | 11 |
| SGXSRC | INPUT | drive input data onto sign extend data i/p | 0 |
| (sgx input) | A | drive A register onto sign extend data i/p | 1 |
| ADDMODE | ADD | input1 + input2 | 000 |
| (adder mode | ADC | input1 + input2 + 1 | 001 |
| see sect. 3) | SBC | input1 − input2 − 1 | 010 |
| | SUB | input1 − input2 | 011 |
| | TCI | SUB if input2<0, else ADD − 2's comp. | 100 |
| | DCD | ADC if input2<0, else ADD − DC diff | 101 |
| | VRA | ADC if input1<0, else SBC-vec resid add | 110 |
| ADDSRC1 | A | drive A register onto adder input1 | 00 |
| (source for | REG | drive register file o/p onto adder i/p1 | 01 |
| adder i/p 1 - | INPUT | drive input data onto adder input1 | 10 |
| non-invert) | ZERO | drive zero onto adder input1 | 11 |
| ADDSRC2 | CONST | drive constant i/p onto adder input2 | 00 |
| (source for | A | drive A register onto adder input2 | 01 |
| inverting | INPUT | drive input data onto adder input2 | 10 |
| input) | REG | drive register file o/p onto adder i/p2 | 11 |
| CNDC-MODE | TEST | update condition codes | 0 |
| (cond. codes) | HOLD | do not update condition codes | 1 |
| CNTMODE | NOCOUNT | do not increment counters | X00 |
| (mbstructure | BCINCR | increment block counter and ripple | 001 |
| count mode) | CCINCR | force the component count to incr | 010 |
| | RESET | reset all counters in mb structure | 011 |
| | DISABLE | disable all counters | 1XX |
| INSTMODE | MULTI | iterate current instr multi times | 0 |
| | SINGLE | single cycle instruction only | 1 |

SECTION B.4 Buffer Manager

B.4.1 Introduction

This document describes the purpose, actions and implementation of the Buffer Manager, in accordance with the present invention (bman)

B.4.2 Overview

The buffer manager provides four addresses for the DRAM interface. These addresses are page addresses in the DRAM. The DRAM interface maintains two FIFOs in the DRAM, the Coded Data Buffer and the Token Data Buffer. Hence, for the four addresses, there is a read and a write address for each buffer.

B.4.3 Interfaces

The Buffer Manager is connected only to the DRAM interface and to the microprocessor. The microprocessor need only be used for setting up the "Initialization registers" shown in Table B.4.4. The interface with the DRAM interface is the four eighteen bit addresses controlled by a REQuest/ACKnowledge protocol for each address. (Since the Buffer Manager is not in the datapath, the Buffer Manager lacks a two-wire interface.)

Furthermore, the Buffer Manager operates off the DRAM interface clock generator and on the DRAM interface scan chain.

B.4.4 Address Calculation

The read and write addresses for each buffer are generated from 9 eighteen bit registers:

Initialization registers (RW from microprocessor)

BASECB—base address of coded data buffer

LENGTHCB—maximum size (in pages of coded data buffer

BASETB—base address of token data buffer

LENGTHTB—maximum size (in pages) of token data buffer

LIMIT—size (in pages) of the DRAM.

Dynamic registers (RO from microprocessor)

READCB—coded data buffer read pointer relative to BASECB

NUMBERCB—coded data buffer write pointer relative to READCB

READTB—token data buffer read pointer relative to BASETB

NUMBERTB—token data buffer write pointer relative to READTB

To calculate addresses:

readaddr=(BASE+READ) mod LIMIT writeaddr=(((READ+NUMBER) mod LENGTH)+BASE) mod LIMIT The "mod LIMIT" term is used because a buffer may wrap around DRAM.

B.4.5 Block Description

In the present invention, and as shown in FIG. 127, the Buffer Manager is composed of three top level modules connected in a ring which snooper monitors the DRAM interface connection. The modules are bmprtize (prioritize), bminstr (instruction), and bmrecalc (recalculate) are arranged in a ring of that order and omsnoop (snoopers) is arranged on the address outputs. The module, Bmprtize, deals with the REQ/ACK protocol, the FULL/EMPTY flags for the buffers and it maintains the state of each address, i.e., "is it a valid address?". From this information, it dictates to bminstr which (if any) address should be recalculated. It also operates the BUF_CSR (status) microprocessor register, showing FULL/EMPTY flags, and the buf_access microprocessor register, controlling microprocessor write access to the buffer manager registers.

The module, Bminstr, on being told by bmprtize to calculate an address, issues six instructions (one every two cycles) to control bmrecalc to calculating an address.

The module, Bmrecalc, recalculates the addresses under the instruction of bminstr. Running an instruction every two cycles, it contains all of the initialization and dynamic registers, and a simple ALU capable of addition, subtraction and modulus. It informs Sbmprtize of FULL/EMPTY states it detects and when it has finished calculating an address.

B.4.6 Block Implementation

B.4.6.1 Bmprtize

At reset, the buf_access microprocessor register is set to one to allow the setting up of the initialization registers. While buf_access reads back one, no address calculations are initiated because they are meaningless without valid initialization registers.

Once buf_access is de-asserted (write zero to it) bmprtize goes about making all the addresses valid (by recalculating them) since its purpose is to keep all four addresses valid. At this stage, the Buffer Manager is "starting up" (i.e., all addresses have not yet been calculated), thus, no requests are asserted. Once all addresses have become valid start-up ends and all requests are asserted. From this point forward, when an address becomes invalid (because it has been used and acknowledged) it will be recalculated.

No prioritizing between addresses will ever need to be performed, because the DRAM interface can, at its fastest, use an address every seventeen cycles, while the Buffer Manager can recalculate an address every twelve cycles. Therefore, only one address will ever be invalid at one time after start-up. Accordingly, bmprtize will recalculate any invalid address that is not currently being calculated.

In the invention, start-up will be re-entered whenever buf_access is asserted and, therefore, no addresses will be supplied to the DRAM interface during microprocessor accesses.

B.4.6.2 Bminstr

The module, Bminstr, contains a MOD 12 cycle counter (the number of cycle it takes to generate an address). Note that even cycles start an instruction, whereas odd cycles end an instruction. The top 3 bits along with whether it is a read or a write calculation are decoded into instructions for bmrecalc as follows:

For read addresses:

TABLE B.4.1

Read address calculation

| Cycle | Operation | BusA | BusB | result | Meaning of result's sign |
|---|---|---|---|---|---|
| 0–1 | ADD | READ | BASE | | |
| 2–3 | MOD | Accum | LIMIT | Address | |
| 4–5 | ADD | READ | "1" | | |
| 6–7 | MOD | Accum | LENGTH | READ | |
| 8–9 | SUB | NUMBER | "1" | NUMBER | |
| 10–11 | MOD | "0" | Accum | | SET_EMPTY (NUMBER >= 0) |

For write addresses:

TABLE B.4.2

For write address calculations

| Cycle | Operation | BusA | BusB | result | Meaning of result's sign |
|---|---|---|---|---|---|
| 0–1 | ADD | NUMBER | READ | | |
| 2–3 | MOD | Accum | LIMIT | | |
| 4–5 | ADD | Accum | BASE | | |
| 6–7 | MOD | Accum | LIMIT | Address | |
| 8–9 | ADD | NUMBER | "1" | NUMBER | |
| 10–11 | MOD | Accum | LENGTH | | SET_FULL (NUMBER >= LENGTH) |

Note: The result of the last operation is always held in the accummulator.

When there is no addresses to be recalculated, the cycle counter idles at zero, thus causing an instruction that writes to none of the registers. This has no affect.

B.4.6.3 Bmrecalc

The module, Bmrecalc, performs one operation every two clock cycles. It latches in the instruction from bminstr (and which buffer and io type) on an even counter cycle (start_alu_cyc), and latches the result of the operation on an odd counter cycle (end_alu_cyc). The result of the operation is always stored in the "Accum" register in addition to any registers specified by the instruction. Also, on end_alu_cyc, bmrecalc informs bmprtize as to whether the use of the address just calculated will make the buffer full or empty, and when the address and full/empty has been successfully calculated (load_addr).

Full/empty are calculated using the sign bit of the operation's result.

The modulus operation is not a true modulus, but A mod B is implemented as:

(A>B? (A–B):A)

however this is only wrong when

A>(2B–1)

which will never occur.

B.4.6.4 Bmsnoop

The module, Bmsnoop, is composed of four eighteen bit super snoopers that monitor the addresses supplied to the DRAM interface. The snooper must be "super" (i.e., can be accessed with the clocks running) to allow on chip testing of the external DRAM. These snoopers must work on a REQ/ACK system and are, therefore, different to any other on the device.

REQ/ACK is used on this interface, as opposed to a two-wire protocol because it is essential to transmit information (i.e., acknowledges) back to the sender which an accept will not do). Hence, this rigorously monitors the FIFO pointers.

B.4.7 Registers

To gain microprocessor write access to the initialization registers, a one should be written to buf_access, and access will be given when buf_access reads back one. Conversely, to give up microprocessor write access, zero should be written to buf_access. Access will be given when buf_access reads back zero. Note that buf_access is reset to one.

The dynamic and initialization registers of the present invention may be read at any time, however, to ensure that the dynamic registers are not changing the microprocessor, write access must be gained.

It is intended that the initialization registers be written to only once. Re-writing them may cause the buffers to operate incorrectly. However, it is envisioned to increase the buffer length on-the-fly and to have the buffer manager use the new length when appropriate.

No check is ever made to see that the values in the initialization registers are sensible, e.g., that the buffers do not overlap. This is the user's responsibility.

TABLE B.4.3

Buffer manager non-keyhole registers

| Register Name | Usage | Address |
|---|---|---|
| CED_BUF_ACCESS | xxxxxxxD | 0x24 |
| CED_BUF_KEYHOLE_ADDR | xxDDDDDD | 0x25 |
| CED_BUF_KEYHOLE | DDDDDDDD | 0x26 |
| CED_BUF_CB_WR_SNP_2 | xxxxxxDD | 0x54 |
| CED_BUF_CB_WR_SNP_1 | DDDDDDDD | 0x55 |
| CED_BUF_CB_WR_SNP_0 | DDDDDDDD | 0x56 |
| CED_BUF_CB_RD_SNP_2 | xxxxxxDD | 0x57 |
| CED_BUF_CB_RD_SNP_1 | DDDDDDDD | 0x58 |
| CED_BUF_CB_RD_SNP_0 | DDDDDDDD | 0x59 |
| CED_BUF_TB_WR_SNP_2 | xxxxxxDD | 0x5a |
| CED_BUF_TB_WR_SNP_1 | DDDDDDDD | 0x5b |
| CED_BUF_TB_WR_SNP_0 | DDDDDDDD | 0x5c |
| CED_BUF_TB_RD_SNP_2 | xxxxxxDD | 0x5d |
| CED_BUF_TB_RD_SNP_1 | DDDDDDDD | 0x5e |
| CED_BUF_TB_RD_SNP_0 | DDDDDDDD | 0x5f |

Where D indicates a registers bit and x shows no register bit.

TABLE B.4.4

Registers in buffer manager keyhole

| Keyhold Register Name | Usage | Key hole Address |
|---|---|---|
| CED_BUF_CB_BASE_3 | xxxxxxxx | 0x00 |
| CED_BUF_CB_BASE_2 | xxxxxxDD | 0x01 |
| CED_BUF_CB_BASE_1 | DDDDDDDD | 0x02 |
| CED_BUF_CB_BASE_0 | DDDDDDDD | 0x03 |
| CED_BUF_CB_LENGTH_3 | xxxxxxxx | 0x04 |
| CED_BUF_CB_LENGTH_2 | xxxxxxDD | 0x05 |
| CED_BUF_CB_LENGTH_1 | DDDDDDDD | 0x06 |
| CED_BUF_CB_LENGTH_0 | DDDDDDDD | 0x07 |
| CED_BUF_CB_READ_3 | xxxxxxxx | 0x08 |
| CED_BUF_CB_READ_2 | xxxxxxDD | 0x09 |
| CED_BUF_CB_READ_1 | DDDDDDDD | 0x0a |
| CED_BUF_CB_READ_0 | DDDDDDDD | 0x0b |
| CED_BUF_CB_NUMBER_3 | xxxxxxxx | 0x0c |
| CED_BUF_CB_NUMBER_2 | xxxxxxDD | 0x0d |
| CED_BUF_CB_NUMBER_1 | DDDDDDDD | 0x0e |
| CED_BUF_CB_NUMBER_0 | DDDDDDDD | 0x0f |
| CED_BUF_TB_BASE_3 | xxxxxxxx | 0x10 |
| CED_BUF_TB_BASE_2 | xxxxxxDD | 0x11 |
| CED_BUF_TB_BASE_1 | DDDDDDDD | 0x12 |

TABLE B.4.4-continued

Registers in buffer manager keyhole

| Keyhold Register Name | Usage | Key hole Address |
|---|---|---|
| CED_BUF_TB_BASE_0 | DDDDDDDD | 0x13 |
| CED_BUF_TB_LENGTH_3 | xxxxxxxx | 0x14 |
| CED_BUF_TB_LENGTH_2 | xxxxxxDD | 0x15 |
| CED_BUF_TB_LENGTH_1 | DDDDDDDD | 0x16 |
| CED_BUF_TB_LENGTH_0 | DDDDDDDD | 0x17 |
| CED_BUF_TB_READ_3 | xxxxxxxx | 0x18 |
| CED_BUF_TB_READ_2 | xxxxxxDD | 0x19 |
| CED_BUF_TB_READ_1 | DDDDDDDD | 0x1a |
| CED_BUF_TB_READ_0 | DDDDDDDD | 0x1b |
| CED_BUF_TB_NUMBER_3 | xxxxxxxx | 0x1c |
| CED_BUF_TB_NUMBER_2 | xxxxxxDD | 0x1d |
| CED_BUF_TB_NUMBER_1 | DDDDDDDD | 0x1e |
| CED_BUF_TB_NUMBER_0 | DDDDDDDD | 0x1f |
| CED_BUF_LIMIT_3 | xxxxxxxx | 0x20 |
| CED_BUF_LIMIT_2 | xxxxxxDD | 0x21 |
| CED_BUF_LIMIT_1 | DDDDDDDD | 0x22 |
| CED_BUF_LIMIT_0 | DDDDDDDD | 0x23 |
| CED_BUF_CBR | xxxxDDDD | 0x24 |

B.4.8 Verification

Verification was conducted in Lsim with small FIFO's onto a dummy DRAM interface, and in C-code as part of the top level chip simulation.

B.4.9 Testing

Test coverage to the bman is through the snoopers in bmsnoop, the dynamic registers (shown in B.4.4) and using the scan chain which is part of the DRAM interface scan chain.

SECTION B.5 Inverse Modeler

B.5.1 Introduction

This document describes the purpose, actions and implementation of the Inverse Modeller (imodel) and the Token Formatter (hsppk), in accordance with the present invention.

Note: hsppk is a hierarchically part of the Huffman Decoder, but functionally part of the Inverse Modeller. It is, therefore, better discussed in this section.

B.5.2 Overview

The Token buffer, which is between the imodel and hsppk, can contain a great deal of data, all in off-chip DRAM. To ensure that efficient use is made of this memory, the data must be in a 16 bit format. The Formatter "packs" the data from the Huffman Decoder into this format for the Token buffer. Subsequently, the Inverse Modeler "unpacks" data from the Token buffer format.

However, the Inverse Modeller's main function is the expanding out of "run/level" codes into a run of zero data followed by a level. Additionally, the Inverse Modeller ensures that DATA tokens have at least 64 coefficients and it provides a "gate" for stopping streams which have not met their start-up criteria.

B.5.3 Interfaces

B.5.3.1 Hsppk

In the present invention, Hsppk has the Huffman Decoder as input and the Token buffer as output. Both interfaces are of the two-wire type, the input being a 17 bit token port, the output being 16 bit "packed data", plus a FLUSH signal. In addition, Hsppk is clocked from the Huffman clock generator and, thus, connected to the Huffman scan chain.

B.5.3.2 Imodel

Imodel has the Token buffer start-up output gate logic (bsogl) as inputs and the Inverse Quantizer as output. Input from the Token buffer is 16 bit "packed data", plus block_end signal, from the bsogl is one wirestream_enable. Output is an 11 bit token port. All interfaces are controlled by the two-wire interface protocol. Imodel has its own clock generator and scan chain.

Both blocks have microprocessor access only to the snoopers at their outputs.

B.5.4 Block Description

B.5.4.1 Hsppk

Hsppk takes in the 17 bit data from the Huffman and outputs 16 bit data to the Token buffer. This is achieved by first, either truncating or splitting the input data into 12 bit words, and second by packing these words into a 16 bit format.

B.5.4.1.1 Splitting

Hsppk receives 17 bit data from the Inverse Huffman. This data is formatted into 12 bits using the following formats.

Where F=specifies format; E=extension bit; R=Run bit; L=length bit (in sign mag.) or non-DATA token bit; x=don't care.

FLLLLLLLLLLLFormat 0

ELLLLLLLLLLLFormat 0a

FRRRRRROO0OOFormat 1

Normal tokens only occupy the bottom 12 bits, having the form:

ExxxxxxLLLLLLLLLLL

This is truncated to format Oa

However, DATA tokens have a run and a level in each word in the form:

ERRRRRRLLLLLLLLLLL.

This is broken in to the formats:

ERRRRRRLLLLLLLLLLL->FRRRRRR0000Format 1

ELLLLLLLLLLLFormat Oa

Or if the run is zero format 0 is used:

E0000LLLLLLLLLLL->FLLLLLLLLLLLFormat 0

It can be seen that in the format 0,the extension bit is lost and assumed to be one. Therefore, it cannot be used where the extension is zero. In this case, format 1 is unconditionally used.

B.5.4.1.2 Packing

After splitting, all data words are 12 bits wide. Every four 12 bit words are "packed" into three 16 bit words:

TABLE B.5.4.1

Packing method

| Input words | Output words |
|---|---|
| 000000000000 | 0000000000001111 |
| 111111111111 | 1111111122222222 |
| 222222222222 | 2222333333333333 |
| 333333333333 | |

B.5.4.1.3 Flushing of the Buffer

The DRAM interface of the present invention collects a block, 32 sixteen bit "packed" words, before writing them to the buffer. This implies that data can get stuck in the DRAM interface at the end of a stream, if the block is only partially complete. Therefore a flushing mechanism is required. Accordingly, .Hsppk signals the DRAM interface to write it current partially complete block unconditionally.

B.5.4.2.1 Imup (UnPacker)

Imup performs three functions:

4)Unpacking data from its sixteen bit format into 12 bit words.

TABLE B.5.2

Unpacking method

| Input words | Output words |
|---|---|
| 0000000000001111 | 0000000000000000 |
| 1111111122222222 | 1111111111111111 |
| 2222333333333333 | 2222222222222222 |
| | 3333333333333333 |

5)Maintaining correct data during flushing of the Token buffer.

When the DRAM interface flushes, by unconditionally writing the current partially complete block, rubbish data remains in the block. The imup must delete rubbish data, i.e., delete all data from a FLUSH token, until the end of a block.

6)Holding back data until Start-up Criteria are met.

Output of data from the block is conditional that a "valid" (stream_enable) is accepted from the Buffer Start-up for each different stream. Consequently, twelve bit data is output to hsppk.

B.5.4.2.2 Imex (EXpander)

In the invention, Imex expands out all run length codes into runs of zeros followed by a level.

B.5.4.2.3 Impad (PADder)

Impad ensures that all DATA Token bodies contain 64 (or more) words. It does this by padding the last word of the Token with zeros. DATA Tokens are not checked for having over 64 words in the body.

B.5.5 Block Implementation

B.5.5.1 Hsppk

Typically, both the Splitting and packing is done in a single cycle.

B.5.5.1.1 Splitting

First, the format must be determined

```
IF (datatoken)
  IF (lastformat == 1) use format 0a;
  ELSE IF (run == 0) use format 0;
    ELSE use format 1;
  ELSE use format 0a;
and format bit determined
format 0 format bit = 0;
format 0a format bit = extension bit;
format 1 format bit = 1;
```

If format 1 is used, no new data should be accepted in the next cycle because the level of the code has yet to be output.

B.5.5.1.2 Packing

The packing procedure cycles every four valid data inputs. The sixteen bit word output is formed from the last valid word, which is held, and the succeeding word. If this is not valid, then the output is not valid. The procedure is:

TABLE B.5.3

Packing procedure

| | Held Word | Succeeding Word | Packed Word | |
|---|---|---|---|---|
| valid cycle 0 | xxxxxxxxxxxx | 000000000000 | xxxxxxxxxxxxxxxx | don't output |
| valid cycle 1 | 000000000000 | 111111111111 | 0000000000001111 | output |
| valid cycle 2 | 111111111111 | 222222222222 | 1111111122222222 | output |
| valid cycle 3 | 222222222222 | 333333333333 | 2222333333333333 | output |

Where x indicates undefined bits.

During valid cycle 0, no word is output because it is not valid.

The valid cycle number is maintained by a ring counter. It is incremented by valid data from the splitter and an accepted output.

When a FLUSH (or picture_end) token is received and the token itself is ready to output, a flush signal is also output to the DRAM interface to reset the valid cycle to zero. If a FLUSH token arrives on anything but cycle 3, the flush signal must be delayed a valid cycle to ensure the token itself it output.

B.5.5.2 Imodel

B5.5.2.1 Imup (Unpacker)

As with the packer, the last valid input is stored, and combined with the next input, allows unpacking.

TABLE B.5.4

Unpacking procedure

| | Succeeding word | Held Word | Unpacked Word | |
|---|---|---|---|---|
| valid cycle 0 | 0000000000001111 | xxxxxxxxxxxxxxxx | 000000000000 | input |
| valid cycle 1 | 1111111122222222 | 0000000000001111 | 111111111111 | input |
| valid cycle 2 | 2222333333333333 | 1111111122222222 | 222222222222 | don't input |

Where x indicates undefined bits

The valid cycle is maintained by a ring counter. The unpacked data contains the token's data, flush and PICTURE_END decoded from it. Additionally, format and extension bit are decoded from the unpacked data.

formatbit_is_extn=(lastformat==1) 11 databody format=databody && (formatbit && $\overline{\text{lastformatbit}}$)

for token decoding and to be passed on to imex.

When a FLUSH (or picture_end) token is unpacked and output to imex, all data is deleted (Valid forced low) until the block end signal is received from the DRAM interface.

B.5.5.2.2 Imex (EXpander)

In accordance with the present invention, imex is a four state machine to expand run/level codes out. The state machine is:

state0: load run count from run code.

state 1: decrement run count, outputting zeros.

state 2: input data and output levels; default state.

state 3: illegal state.

B.5.5.2.3 Impad (PADder)

Impad is informed of DATA Token headers by imex. Next, it counts the number of coefficients in the body of the token. If the token ends before there are 64 coefficients, zero coefficients are inserted at the end of the token to complete it to 64 coefficients. For example, unextended data headers have 64 zero coefficients inserted after them. DATA tokens with 64 or more coefficients are not affected by impad.

B.5.6 Registers

The imodel and hsppk of the present invention do not have microprocessor registers, with the exception of their snooper.

TABLE B.5.5

Imodel & hsppk registers

| Register Name | Usage | Address |
|---|---|---|
| CED_H_SNP_2 | VAxxxxxx | 0x49 |
| CED_H_SNP_1 | DDDDDDDD | 0x4a |
| CED_H_SNP_0 | DDDDDDDD | 0x4b |
| CED_IM_SNP_1 | VAExxDDD | 0x4a |
| CED_IM_SNP_0 | DDDDDDDD | 0x4d |

Where V=valid bit; A=accept bit; E=extension bit; D=data bit.

B.5.7 Verification

Selected streams run through Lsim simulations.

B.5.8 Testing

Test coverage to the imodel at the input is through the Token buffer output snooper, and at the output through the imodel's own snooper. Logic is covered the imodel's own scan chain.

The output of the hsppk is accessible through the huffman output snooper. The logic is visible through the huffman scan chain.

SECTION B.6 Buffer Start-up

B.6.1 Introduction

This section describes the method and implementation of the buffer start-up in accordance with the present invention.

B.6.2 Overview

To ensure that a stream of pictures can be displayed smoothly and continuously a certain amount of data must be gathered before decoding can start. This is called the start-up condition. The coding standard specifies a VBV delay which can be translated, approximately, into the amount of data needed to be gathered. It is the purpose of the "Buffer Start-up" to ensure that every stream fulfills its start-up condition before its data progresses from the token buffer, allowing decoding. It is held in the buffers by a notional gate (the output gate) at the output of the token buffer (i.e., in the Inverse Modeler). This gate will only be open for the stream once its start-up condition has been met.

B.6.3 Interfaces

Bscntbit (Buffer Start-up bit counter) is in the datapath, and communicates by two-wire interfaces, and is connected to the microprocessor. It also branches with a two-wire interface to bsogl (Buffer Start-up Output Gate Logic). Bsogl via a two-wire interface controls imup (Inverse Modeler UnPacker), which implements the output gate.

B.6.4 Block Structure

As shown in FIG. 130, Bscntbit lies in the datapath between the Start Code Detector and the coded data buffer. This single cycle block counts the valid words of data leaving the block and compares this number with the start-up condition (or target) which will be loaded from the microprocessor. When the target is met, bsogl is informed. Data is unaffected by bscntbit.

Bsogl lies between Bscntbit and imup (in the inverse modeler). In effect, it is a queue of indicators that streams have met their targets. The queue is moved along by streams leaving the buffers (i.e., FLUSH tokens received in the data stream at imup), when another "indicator" is accepted by imup. If the queue is empty (i.e., there are no streams in the buffers which have yet met their start-up target) the stream in imup is stalled.

The queue only has a finite depth, however, this may be indefinitely expanded by breaking the queue in bsogl and allowing the microprocessor to monitor the queue. These queue mechanisms are referred to as internal and external queues respectively.

B.6.5 Block Implementation

B.6.5.1 Bsbitcnt (Buffer Start-up Bit Counter)

Bscntbit counts all the valid words that are input into the buffer start-up. The counter (bsctr) is a programmable counter of 16–24 bits width. Moreover, bsctr has carry look ahead circuitry to give it sufficient speed. Bsctr's width is programmed by ced_bs_prescale. It does this by forcing bits 8–16 high, which makes them always pass a carry. They are, therefore, effectively not used. Only the top eight bits of bsctr are used for comparisons with the target (ced_bs_target).

The comparison (ced_bs_count>=ced_bs_target) is done by bscmp.

The target is derived from the stream when the stream is in the Huffman Decoder and calculated by the microprocessor. It will, therefore, only be set sometime after the start of the stream. Before start-up, the target_valid is set low. Writing to ced_bs_target sets target_valid high and allows comparisons in bscmp to take place. When the comparison shows ced_bs_count>=ced_bs_target, target_valid is set low. The target has been met.

When the target is met the count is reset. Note, it is not reset at the end of a stream. In addition, counting is disabled after the target is met if it is before the end of the stream. The count saturates to 255.

When a stream ends (i.e., a flush) is detected in bsbitcnt, an abs_flush_event is generated. If the stream ends before the target is met, an additional event is also generated (bs_flush_before_target_met_event). When any of these events occur, the block is stalled. This allows the user to recommence the search for the next stream's target or in the case of a bs_flush_before_target_met_event event either:

1)write a target of zero which will force a target_met or 2)note that target was not met and allow the next stream to proceed until this combined with the last stream reaches the target. The target for this next stream can should adjusted accordingly.

B.6.5.2 BSOGL (Buffer Start-up Output Gate Logic)

As previously described, Bsogl is a queue of indicators that a stream has met its target. The queue type is set by ced_bs_queue (internal(0) or external(1)). This is a reset to select an internal queue. The depth of the queue determines the maximum number of satisfied streams that can be in the coded data buffer, Huffman, and token buffer. When this number is reached (i.e. the queue is full) bsogl will force the datapath to stall at bsbitcnt.

Using an internal queue requires no action from the microprocessor. However, if it is necessary to increase the depth of the queue, an external queue can be set (by setting ced_bs_access to gain access to ced_bs_queue which should be set, target_met_event and stream_end_event enabled and access relinquished).

The external queue (a count maintained by the microprocessor) is inserted into the internal queue. The external queue is maintained by two events, target_met_event and stream_end_event. These can simply be referred to as service_queue_input and service_queue_output respectively] and a register ced_bs_enable_nxt_stream. In effect, target_met_event is the up stream end of the internal queue supplying the queue. Similarly, ced_bs_enable_nxt_stream is the down stream end of the internal queue consuming the queue. Similarly, stream_end_event is a request to supply the down stream queue; stream_end_event resets ced_bs_enable_nxt_stream. The two events should be serviced as follows:

```
/* TARGET_MET_EVENT */
j= micro_read(CED_BS_ENABLE_NXT_STM);
if (j == 0) /*Is next stream enabled ?*/
(/*no, enable it */
        micro_write(CED_BS_ENABLE_NXT_STM, 1);
        printf(* enable next stream (queue = 0x%x)\n*, (context->queue)::
}
else /*yes, increment the queue of "target_met" streams*/
{
        queue**;
        printf(* stream already enabled (queue = 0x%x)\n*, (context-
>queue));
}
/* STREAM_EVENT */
if (queue > 0) /* are there any "target_mets" left? */
(/* yes, decrement the queue and enable another stream */
   queue--;
   micro_write(CED_BS_ENABLE_NXT_STM, 1);
   printf(* enable next stream (queue = 0x%x)\n*, (context->queue
   }
else
printf(* queue empty cannot enable next stream (queue = 0x%x)   n*,
```

-continued

```
queue);
micro_write(CED_EVENT_1, 1 << BS_STREAM_END_EVENT); /* clear event
*/
```

The queue type can be changed from internal to external at any time (by the means described above), but they can only be changed external to internal when the external queue is empty (from above "queue==0"), by setting ced_bs_access to gain access to ced_bs_queue which should be reset, target_met_event and stream_end_event masked, and access relinquished.

On the other hand, disable checking of stream start-up conditions, set ced_bs_queue (external), mask target_met_event and stream_end_event and set ced_bs_enable_nxt_stream. In this way, all streams will always be enabled.

B.6.6 Microprocessor Registers

TABLE B.6.1

Bscntbit registers

| Register name | Usage | Address |
|---|---|---|
| CED_BS_ACCESS | xxxxxxxD | 0×10 |
| CED_BS_PRESCALE* | xxxxxDDD | 0×11 |
| CED_BS_TARGET* | DDDDDDDD | 0×12 |
| CED_BS_COUNT* | DDDDDDDD | 0×13 |
| BS_FLUSH_EVENT | rrrrrDrr | 0×02 |
| BS_FLUSH_MASK | rrrrrDrr | 0×03 |
| BS_FLUSH_BEFORE_TARGET_MET_EVENT | rrrrDrr | 0×02 |
| BS_FLUSH_BEFORE_TARGET_MET_MASK | rrrrDrr | 0×03 |

TABLE B.6.2

Bsogl registers

| Register name | Usage | Address |
|---|---|---|
| TARGET_MET_EVENT | rrrDrrrr | 0×02 |
| TARGET_MET_MASK | rrrDrrrr | 0×03 |
| STREAM_END_EVENT | rrDrrrrr | 0×02 |
| STREAM_END_MASK | rrDrrrrr | 0×03 |
| CED_BS_QUEUE* | xxxxxxxD | 0×14 |
| CED_BS_ENABLE_NXT_STM* | xxxxxxxD | 0×15 |

where

D is a register bit x is a non-existent register bit r is a reserved register bit to gain access to these registers ced_bs_access must be set to one and polled until it reads back one, unless in an interrupt service routine. Access is given up by setting ced_bs_access to zero.

SECTION B.7 The DRAM Interface

B.7.1 Overview

In the present invention, the Spatial Decoder, Temporal Decoder and Video Formatter each contain a DRAM interface block for that particular chip. In all three devices, the function of the DRAM interface is to transfer data from the chip to the external DRAM and from the external DRAM into the chip via block addresses supplied by an address generator.

The DRAM interface typically operates from a clock which is asynchronous to both the address generator and to the clocks of the various blocks through which data is passed. This asynchronism is readily managed, however, because the clocks are operating at approximately the same frequency.

Data is usually transferred between the DRAM Interface and the rest of the chip in blocks of 64 bytes (the only exception being prediction data in the Temporal Decoder). Transfers take place by means of a device known as a "swing buffer". This is essentially a pair of RAMs operated in a double-buffered configuration, with the DRAM interface filling or emptying one RAM while another part of the chip empties or fills the other RAM. A separate bus which carries an address from an address generator is associated with each swing buffer.

Each of the chips has four swing buffers, but the function of these swing buffers is different in each case. In the Spatial Decoder, one swing buffer is used to transfer coded data to the DRAM, another to read coded data from the DRAM, the third to transfer tokenized data to the DRAM and the fourth to read tokenized data from the DRAM. In the Temporal Decoder, one swing buffer is used to write Intra or Predicted picture data to the DRAM, the second to read Intra or Predicted data from the DRAM and the other two to read forward and backward prediction data. In the Video Formatter, one swing buffer is used to transfer data to the DRAM and the other three are used to read data from the DRAM, one for each of Luminance (Y) and the Red and Blue color difference data (Cr and Cb, respectively).

The following section describes the operation of a DRAM interface in accordance with the present invention, which has one write swing buffer and one read swing buffer, which is essentially the same as the operation of the Spatial Decoder DRAM Interface. This is illustrated in FIG. 131, "DRAM Interface,".

B.7.2 A Generic DRAM interface

Referring to FIG. 131, the interfaces to the address generator 420 and to the blocks which supply and take the data are all two wire interfaces. The address generator 420 may either generate addresses as the result of receiving control tokens, or it may merely generate a fixed sequence of addresses. The DRAM interface 421 treats the two wire interfaces associated with the address generator in a special way. Instead of keeping the accept line high when it is ready to receive an address, it waits for the address generator to supply a valid address, processes that address and then sets the accept line high for one clock period. Thus, it implements a request/acknowledge (REQ/ACK) protocol.

A unique feature of the DRAM Interface is its ability to communicate with the address generator and the blocks which provide or accept the data completely independent of the other. For example, the address generator may generate an address associated with the data in the write swing buffer, but no action will be taken until the write swing buffer signals that there is a block of data which is ready to be written to the external DRAM 422. However, no action is taken until an address is supplied on the appropriate bus from the address generator. Further, once one of the RAMs in the write swing buffer has been filled with data, the other may be completely filled and "swung" to the DRAM Interface side before the data input is stalled (the two-wire interface accept signal set low).

In understanding the operation of the DRAM Interface of the present invention, it is important to note that in a properly configured system the DRAM Interface will be able to transfer data between the swing buffers and the external DRAM at least as fast as the sum of all the average data rates between the swing buffers and the rest of the chip.

Each DRAM Interface contains a method of determining which swing buffer it will service next. In general, this will be either a "round robin", in which the swing buffer which is serviced is the next available swing buffer which has less recently had a turn, or a priority encoder in which some swing buffers have a higher priority than others. In both cases, an additional request will come from a refresh request generator which has a higher priority than all the other requests. The refresh request is generated from a refresh counter which can be programmed via the microprocessor interface.

B.7.2.1 The Swing Buffers

FIG. 132 illustrates a write swing buffer. The operation is as follows:

1) Valid data is presented at the input 430 (data in). As each piece of data is accepted it is written into RAM1 and the address is incremented.
2) When RAM1 is full, the input side gives up control and sends a signal to the read side to indicate that RAM1 is now ready to be read. This signal passes between two asynchronous clock regimes, and so passes through three synchronizing flip-flops.
3) The next item of data to arrive on the input side is written into RAM2, which is still empty.
4) When the round robin or priority encoder indicates that it is the turn of this swing buffer to be read, the DRAM Interface reads the contents of RAM1 and writes them to the external DRAM. A signal is then sent back across the asynchronous interface, as in (2), to indicate that RAM1 is now ready to be filled again.
5) If the DRAM Interface empties RAM1 and "swings" it before the input side has filled RAM2, then data can be accepted by the swing buffer continually, otherwise when RAM2 is filled the swing buffer will set its accept signal low until RAM1 has been "swung" back for use by the input side.
6) This process is repeated ad infinitum. The operation of a read swing buffer is similar, but with input and output data busses reversed.

B.7.2.2 Addressing of External DRAM and Swing Buffers

The DRAM Interface is designed to maximize the available memory bandwidth. Consequently, it is arranged so that each 8×8 block of data is stored in the same DRAM page. In this way full use can be made of DRAM fast page access modes, where one row address is supplied followed by many column addresses. In addition, a facility is provided to allow the data bus to the external DRAM to be 8, 16 or 32 bits wide, so that the amount of DRAM used can be matched to the size and bandwidth requirements of the particular application.

In this example (which is exactly how the DRAM Interface on the Spatial Decoder works), the address generator provides the DRAM Interface with block addresses for each of the read and write swing buffers. This address is used as the row address for the DRAM. The six bits of column address are supplied by the DRAM Interface itself, and these bits are also used as the address for the swing buffer RAM. The data bus to the swing buffers is 32 bits wide, so if the bus width to the external DRAM is less than 32 bits, two or four external DRAM accesses must be made before the next word is read from a write swing buffer or the next word is written to a read swing buffer (read and write refer to the direction of transfer relative to the external DRAM).

The situation is more complex in the cases of the Temporal Decoder and the Video Formatter. These are covered separately below.

B.7.3 DRAM Interface Timing

In the present invention, the DRAM Interface Timing block uses timing chains to place the edges of the DRAM signals to a precision of a quarter of the system clock period. Two quadrature clocks from the phase locked loop are used. These are combined to form a notional 2× clock. Any one chain is then made from two shift registers in parallel, on opposite phases of the "2× clock".

First of all, there is one chain for the page start cycle and another for the read/write/refresh cycles. The length of each cycle is programmable via the microprocessor interface, after which the page start chain has a fixed length, and the cycle chain's length changes as appropriate during a page start.

On reset, the chains are cleared and a pulse is created. This pulse travels along the chains, being directed by the state information from the DRAM Interface. The DRAM Interface clock is generated by this pulse. Each DRAM Interface clock period corresponds to one cycle of the DRAM. Thus, as the DRAM cycles have different lengths, the DRAM Interface clock is not at a constant rate.

Further, timing chains combine the pulse from the above chains with the information from DRAM Interface to generate the output strobes and enables (notcas, notras, notwe, notoe).

SECTION B.8 Inverse Quantizer

B.8.1 Introduction

This document describes the purpose, actions and implementation of the inverse quantizer, (iq) in accordance with the present invention.

B.8.2 Overview

The inverse quantizer reconstructs coefficients from quantized coefficients, quantization weights and step sizes, all of which are transmitted within the datastream.

B.8.3 Interfaces

The iq lies between the inverse modeler and the inverse DCT in the datapath and is connected to a microprocessor. Datapath connections are via two-wire interfaces. Input data is 10 bits wide, output is 11 bits wide.

B.8.4 Mathematics of Inverse Quantization

B.8.4.1 H261 Equations

For blocks coded in intra mode:

$$\dot{C}_i = 8Q_i \qquad i=0$$

$$\left.\begin{array}{ll} \dot{C}_i = iq\_quant\_\mathrm{scale}[2Q_i + \mathrm{sign}(Q_i)] & \\ \dot{C}_i = \dot{C}_i - \mathrm{sign}(\dot{C}_i) & \dot{C}_i = \mathrm{even} \\ \dot{C}_i = \dot{C}_i & \dot{C}_i = \mathrm{odd} \end{array}\right\} 0 < i < 64$$

$$C_i = \min(\max(\dot{C}_i. -2048).2047)$$

$$\left.\begin{array}{ll} \dot{C}_i = iq\_quant\_scale[2Q_i + \text{sign}(Q_i)] & \\ \dot{C}_i = \dot{C}_i - \text{sign}(\dot{C}_i) & \dot{C}_i = \text{even} \\ \dot{C}_i = \dot{C}_i & \dot{C}_i = \text{odd} \end{array}\right\} 0 \leqq i < 64$$

$$C_i = \min(\max(\dot{C}_i, -2048), 2047)$$

B.8.4.2 JPEG Equations $$\dot{C}_i = W_{i,j}Q_i + 1024 \qquad i = 0$$

$$\dot{C}_i = W_{i,j}Q_i \qquad 0 < i < 64$$

$$C_i = \min(\max(\dot{C}_i, -2048), 2047)$$

$$j = jpeg\_table\_indirection(c)$$

B.8.4.3 MPEG Equations

For blocks coded in intra mode:

$$\dot{C}_i = W_{i,j}Q_i + 1024 \qquad i = 0$$

$$\left.\begin{array}{ll} \dot{C}_i = \text{floor}\left(\frac{2iq\_quant\_scale W_{i,j}Q_i}{16}\right) & \\ \dot{C}_i = \dot{C}_i - \text{sign}(\dot{C}_i) & \dot{C}_i = \text{even} \\ \dot{C}_i = \dot{C}_i & \dot{C}_i = \text{odd} \end{array}\right\} \begin{array}{l} 0 < i < 64 \\ j = 0.2 \end{array}$$

$$C_i = \min(\max(\dot{C}_i, -2048), 2047)$$

1024 is added in intra DC case to account for predictors in huffman being reset to zero. For all other coded blocks:

$$\left.\begin{array}{ll} \dot{C}_i = \text{floor}\left(\frac{iq\_quant\_scale W_{i,j}[2Q_i + \text{sign}(Q_i)]}{16}\right) & \\ \dot{C}_i = \dot{C}_i - \text{sign}(\dot{C}_i) & \dot{C}_i = \text{even} \\ \dot{C}_i = \dot{C}_i & \dot{C}_i = \text{odd} \end{array}\right\} \begin{array}{l} 0 < i < 64 \\ j = 1.3 \end{array}$$

$$C_i = \min(\max(\dot{C}_i, -2048), 2047)$$

B.8.4.4 JPEG Variation Equations $$\dot{C}_i = \text{floor}\left(\frac{2iq\_quant\_scale\ W_{i,j}Q_i}{16}\right) + 1024 \qquad i = 0$$

$$\dot{C}_i = \text{floor}\left(\frac{2iq\_quant\_scale\ W_{i,j}Q_i}{16}\right) \qquad 0 < i < 64$$

$$C_i = \min(\max(\dot{C}_i, -2048), 2047)$$

$$j = jpeg\_table\_indirection(c)$$

B.8.4.5 All Other Tokens

All tokens except DATA Tokens must pass through the iq unquantized

Where:

$$\text{sign}(a) = \begin{cases} -1 & a < 0 \\ 0 & a = 0 \\ 1 & a > 0 \end{cases}$$

$$\max(a,b) = \begin{cases} a & a > b \\ b & a \leqq b \end{cases}$$

$$\min(a,b) = \begin{cases} a & a \leqq b \\ b & a > b \end{cases}$$

Floor(a) returns an integer such that $$(a-1) < \text{floor}(a) \leqq a$$

$$a \geqq 0$$

$$a \leqq \text{floor}(a) < (a+1)$$

$$a \leqq 0$$

$Q_i$ are the quantized coefficients.

$C_i$ are the reconstructed coefficients $W_{ij}$ are the values in the quantisation table matrices i is the coefficient index along the zig-zag j is the quantisation table matrix number ($0 \leqq j \leqq 3$)

B.8.4.6 Multiple Standards Combined

It can be shown that all the above standards and their variations (also control data which must be unchanged by the iq) can be mapped on to single equation:

$$\text{OUTPUT} = \frac{(2\text{INPUT} + k)\,(xy)}{16}$$

With the additional post inverse quantisation functions of:

Add 1024

Convert from sign magnitude to 2's complement representation.

Round all even numbers to the nearest odd number towards zero.

Saturate result to +2047 or −2048.

The variables k, x and y for each variation of the standards and which functions they use is shown in Table B.8.1.

B.8.4.6 Multiple Standards Combined

TABLE B.8.1

| Control decoding | | | | | | | | | |
|---|---|---|---|---|---|---|---|---|---|
| Standard | | x Weight | y Scale | k | Add 1024 | Round Even | SaL Res't | Convert 2's comp |
| H261 | intra DC | 8 | 8 | 0 | No | No | Yes | Yes |
| | intra | 16 | iq_quant_scale | 1 | No | Yes | Yes | Yes |
| | other | 16 | iq_quant_scale | 1 | No | Yes | Yes | Yes |
| JPEG | DC | $W_{ij}$ | 8 | 0 | Yes | No | Yes | Yes |

TABLE B.8.1-continued

Control decoding

| Standard | | x Weight | y Scale | k | Add 1024 | Round Even | SaL Res't | Convert 2's comp |
|---|---|---|---|---|---|---|---|---|
| | other | $W_{ij}$ | 8 | 0 | No | No | Yes | Yes |
| MPEG | intra DC | 8 | 8 | 0 | Yes | No | Yes | Yes |
| | intra | $W_{ij}$ | iq_quant_scale | 0 | No | No | Yes | Yes |
| | other | $W_{ij}$ | iq_quant_scale | 1 | No | Yes | Yes | Yes |
| XXX | DC | $W_{ij}$ | iq_quant_scale | 0 | Yes | No | Yes | Yes |
| | other | $W_{ij}$ | iq_quant_scale | 0 | No | No | Yes | Yes |
| Other Tokens | | 1 | 8 | 0 | No | No | No | No |

B.8.5 Block Structure

From B.8.4.6 and Table B.8.1, it can be seen that a single architecture can be used for a multi-standard inverse quantizer. Its arithmetic block diagram is shown in FIG. 133 "Arithmetic Block":

Control for the arithmetic block can be functionally broken into two sections:

Decoding of tokens to load status registers or quantization tables.

Decoding of the status registers into control signals.

Tokens are decoded in iqca which controls the next cycle, i.e., iqcb's bank of registers. It also controls the access to the four quantization tables in igram. The arithmetic, that is, two multipliers and the post functions, are in iqarith. The complete block diagram for the iq is shown in FIG. 134.

B.8.6. Block Implementation

B.8.6.1 Iqca

In the invention, iqca is a state machine used to decode tokens into control signals for igram and the register in iqcb. The state machine is better described as a state machine for each token since it is reset by each new token. For example:

The code for the QUANT_SCALE (see B.8.7.4, "QUANT_SCALE") and QUANT_TABLE (see B.8.7.6, "QUANT_TABLE") are as follows:

```
if (tokenheader == QUANT_SCALE)
{
 sprintf(preport, "QUANT_SCALE");
 reg_addr = ADDR_IQ_QUANT_SCALE;
 rnotw = WRITE;
 enable = 1;
}
if (tokenheader == QUANT_TABLE) /*QUANT_TABLE token */
switch (substate)
{
 case 0: /* quantisation table header */
     sprintf(preport, "QUANT_TABLE_%s_s0",
      (headerextn ? "(full)" : "(empty)"));
     nextsubstate = 1;
     insertnext = (headerextn ? 0 : 1);
     reg_addr = ADDR_IQ_COMPONENT;
     rnotw = WRITE;
     enable = 1;
      break;
 case 1: /* quantisation table body */
 sprintf(preport, "QUANT_TABLE_%s_s1",
     (headerextn ? "(full)" : "(empty)"));
      nextsubstate = 1;
      insertnext = (headerextn ? 0 : (qtm_addr_63 == 0));
      reg_addr = USE_QTM;
      rnotw = (headerextn ? WRITE : READ);
      enable = 1;
      break;
default:
 sprintf(preport, "ERROR in iq quantisation table tokendecoder
(substate %x) \n",
```

-continued

```
      substate);
      break;
    }
}
```

Where a substate is a state within a token, QUANT_SCALE has, for example, only one substate. However, the QUANT_TABLE has two, one being the header, the second the token body.

The state machine is implemented as a PLA. Unrecognized tokens cause no wordline to rise and the PLA to output default (harmless) controls.

Additionally, iqca supplies addresses to igram from BodyWord counter and inserts words into the stream, for example in an unextended QUANT_TABLE (see B.8.7.4). This is achieved by stalling the input while maintaining the output valid. The words can be filled with the correct data in succeeding blocks (iqcb or iqarith).

iqca is a single cycle in the datapath controlled by two-wire interfaces.

B.8.6.2 iqcb

In the invention, iqcb holds the iq status registers. Under the control of iqca it loads or unloads these from/to the datapath.

The status registers are decoded (see Table B.8.1) into control wires for iqarith; to control the XY multiplier terms and the post quantization functions.

The sign bit of the datapath is separated here and sent to the post quantization functions. Also, zero valued words on the datapath are detected here. The arithmetic is then ignored and zero muxed onto the datapath. This is the easiest way to comply with the "zero in; zero out" spec of the iq.

The status registers are accessible from the microprocessor only when the register iq_access has been set to one and reads back one. In this situation, iqcb has halted the datapath, thus ensuring the registers have a stable value and no data is corrupted in the datapath.

Iqcb is a single cycle in the datapath controlled by two wire interfaces.

B.8.6.3 Iqram

Iqram must hold up to four quantization table matrices (QTM), each 64*8 bits. It is, therefore, a 256*8 bits six transistor RAM, capable of one read or one write per cycle. The RAM is enclosed by two-wire interface logic receiving its control and write data from iqca. It reads out data to iqarith. Similarly, igram occupies the same cycle in the datapath as iqcb.

The RAM may be read and written from the microprocessor when iq_access reads back one. The RAM is placed behind a keyhole register, iq_qtm_keyhole and addressed by iq_qtm_keyhole_addr. Accessing iq_qtm_keyhole will cause the address to which it points, held in iq_qtm_keyhole_addr to be incremented. Likewise, iq_qtm_keyhole_addr can be written to directly.

B.8.6.4 iqarith

Note, iqarith is three functions pipelined and split over three cycles. The functions are discussed below (see FIG. 133).

B.8.6.4.1 XY Multiplier

This is a 5 (X) by 8 (Y) bit carry save unsigned multiplier feeding on to the datapath multiplier. The multiplier and multiplicand are selected with control wires from iqcb. The multiplication is in the first cycle, the resolving adder in the second.

At the input to the multiplier, data from iqram can be muxed onto the datapath to read a QUANT_TABLE out onto the datapath.

B.8.6.4.2 (XY)* Datapath Multiplier

This 13 (XY) by 12 (datapath) bit carry save unsigned multiplier is split over the three cycles of the block. Three partial products in the first cycle, seven in the second and the remaining two in the third.

Since all output from the multiplier is less than 2047 (non_coefficient) or saturated to +2047/−2048, the top twelve bits don't ever need to be resolved. Accordingly, the resolving adder is just two bits wide. On the remainder of the high order bits, a zero detect suffices as a saturate signal.

B.8.6.4.3 Post Quantization Functions

The post quantization functions are

Add 1024

Convert from sign magnitude to 2's complement representation.

Round all even numbers to the nearest odd number towards zero.

Saturate result to +2047 or −2048.

Set output to zero (see B.8.6.2)

The first three functions are implemented on a 12 bit adder (pipelined over the second and third cycles). From this, it can be seen what each function requires and these are then combined onto the single adder.

TABLE B.8.2

Post quantization adder functions

| Function | if datapath > 0 | if datapath > 0 |
|---|---|---|
| Convert to 2's complement | nothing | invert add one |
| Round all even numbers | subtract one | add one |
| Add 1024 | add 1024 | add 1024 |

As will be appreciated by one of ordinary skill in the art, care should be taken when reprogramming these functions as they are very interdependent when combined.

The saturate values, zero and zero+1024 are muxed onto the datapath at the end of the third cycle.

B.8.7 Inverse Quantizer Tokens

The following notes define the behavior of the Inverse Quantizer for each Token tp which it responds. In all cases, the Tokens are also transported to the output of the Inverse Quantizer. In most cases, the Token is unmodified by the Inverse Quantizer with the exceptions as noted below. All unrecognized Tokens are passed unmodified to the output of the Inverse Quantizer.

B.8.7.1 SEQUENCE_START

This Token causes the registers iq_prediction mode[1:0] and iq_mpeg_indirection[1:0] to be reset to zero.

B.8.7.2 CODING_STANDARD

This Token causes iq_standard[1:0] to be loaded with the appropriate value based upon the current standard (MPEG, JPEG or H.261) being decoded.

B.8.7.3 PREDICTION_MODE

This Token loads iq_prediction_mode[1:0]. Although the PREDICTION_MODE Token carries more than two bits, the Inverse Quantizer only needs access to the two lowest order bits. These determine whether or not the block is intra coded.

B.8.7.4 QUANT_SCALE

This Token loads iq_quant_scale[4:0].

B.8.7.5 DATA

In the present invention, this Token carries the actual quantized coefficients. The head of the token contains two bits identifying the color component and these are loaded into iq_component[1:0]. The next sixty four Token words contain the quantized coefficients. These are modified as a result of the inverse quantization process and are replaced by the reconstructed coefficients.

If exactly sixty four extension words are not present in the Token, the behavior of the Inverse Quantizer is undefined.

The DATA Token at the input of the Inverse Quantizer carries quantized coefficients. These are represented in eleven bits in a sign-magnitude format (ten bits plus a sign bit). The value "minus zero" should not be used but is correctly interpreted as zero.

The DATA Token at the output of the Inverse Quantizer carries reconstructed coefficients. These are represented in twelve bits in a twos complement format (eleven bits plus a sign bit). The DATA Token at the output will have the same number of Token Extension words as it had at the input of the Inverse Quantizer.

B.8.7.6 QUANT_TABLE

This Token may be used to load a new quantization table or to read out an existing table. Typically, in the Inverse Quantizer, the Token will be used to load a new table which has been decoded from the bit stream. The action of reading out an existing table is useful in the forward quantizer of an encoder if that table is to be encoded into the bit stream.

The Token Head contains two bits identifying the table number that is to be used. These are placed in iq_component [1:0]. Note that this register now contains a "table number" not a color component.

If the extension bit of the Token Head is one, the Inverse Quantizer expects there to be exactly sixty four extension Token Words. Each one is interpreted as a quantization table value and placed in a successive location of the appropriate table, starting at location zero. The ninth bit of each extension Token word is ignored. The Token is also passed to the output of the Inverse Quantizer, unmodified, in the normal way.

If the extension bit of the Token Head is zero, then the Inverse Quantizer will read out successive locations of the appropriate table starting at location zero. Each location becomes an extension Token word (the ninth bit will be zero). At the end of this operation, the Token will contain exactly sixty four extension Token words.

The operation of the Inverse Quantizer in response to this token is undefined for all numbers of extension words except zero and sixty four.

B.8.7.7 JPEG_TABLE_SELECT

This token is used to load or unload translations of color components to table numbers to/from iq_jpeg_indirection. These translations are used in JPEG and other standards.

The Token Head contains two bits identifying the color component that is currently of interest. These are placed in iq_component[1:0].

If the extension bit of the Token Head is one, the Token should contain one extension word, the lowest two bits of which are written into the iq_jpeg_indirection[2*iq_ component[1:0]+1:2*iq_component [1:0]] location. The value just read becomes a Token extension word (the upper seven bits will be zero). At the end of this operation, the Token will contain exactly one Token extension word.

TABLE B.8.3

| JPEG_TABLE_SELECT action | |
|---|---|
| Colour component in header | bits of iq_ipeg_indirection accessed |
| 0 | [1:0] |
| 1 | [3:2] |
| 2 | [5:4] |
| 3 | [7:6] |

B.8.7.8 MPEG_TABLE_SELECT

This Token is used to define whether to use the default or user defined quantization tables while processing via the MPEG standard. The Token Head contains two bits. Bit zero of the header determines which bit if iq_mpeg_indirection is written into. Bit one is written into that location.

Since the iq_mpeg_indirection[1:0] register is cleared by the SEQUENCE_START Token, it will only be necessary to use this Token if a user defined quantization table has been transmitted in the bit stream.

B.8.8 Microprocessor Registers

B.8.8.1 iq_access

To gain microprocessor access to any of the iq registers, iq_access must be set to one and polled until it reads back one (see B.8.6.2). Failure to do this will result in the registers being read still being controlled by the datapath and, therefore, not being stable. In the case of the igram, the accesses are locked out, reading back zeros.

Writing zero to iq_access relinquishes control back to the datapath.

B.8.8.2 Iq_coding_standard[1:0]

This register holds the coding standard that is being implemented by the Inverse Quantizer.

TABLE B.8.4

| Coding standard values | |
|---|---|
| iq_coding_standard | Coding Standard |
| 0 | H.261 |
| 1 | JPEG |
| 2 | MPEG |
| 3 | XXX |

This register is loaded by the CODING_STANDARD Token.

Although this is a two bit register, at present eight bits are allocated in the memory map and future implementations can deal with more than the above standards.

B.8.8.3 Iq_mpeg_indirection[1:0]

This two bit register is used during MPEG decoding operations to maintain a record of which quantization tables are to be used.

Iq_mpeg_indirection[0] controls the table that is used for intra coded blocks. If it is zero then quantization table 0 is used and is expected to contain the default quantization table. If it is one, then quantization table 2 is used and is expected to contain the user defined quantization table for intra coded blocks.

This register is loaded by the MPEG_TABLE_SELECT Token and is reset to zero by the SEQUENCE_START Token.

B.8.8.4 Iq_ipeg_indirection[7:0]

This eight bit register determines which of the four quantization tables will be used for each of the four possible color components that occur in a JPEG scan.

Bits [1:0] hold the table number that will be used for component zero.

Bits [3:2] hold the table number that will be used for component one.

Bits [5:4] hold the table number that will be used for component two.

Bits [7:6] hold the table number that will be used for component three.

This register is affected by the JPEG_TABLE_SELECT Token.

B.8.8.5 iq_quant_scale[4.0]

This register holds the current value of the quantization scale factor. This register is loaded by the QUANT_SCALE Token.

B.8.8.6 iq_component[1:0]

This register usually holds a value-which is translated into the Quantization Table Matrix (QTM) number. It is loaded by a number of Tokens.

The DATA Token header causes this register be loaded with the color component of the block which is about to be processed. This information is only used in JPEG and JPEG variations to determine the QTM number, which it does with reference to $iq_{_ipeg}$_indirection[7:0]. In other standards, iq_component[1:0] is ignored.

The JPEG_TABLE_SELECT Token causes this register be loaded with a color component. It is then used as an index into iq_ipeg_indirection[7:0] which is accessed by the tokens body.

The QUANT_SCALE Token causes this register to be loaded with the QTM number. This table is then either loaded from the Token (if the extended form of the Token is used) or read out from the table to form a properly extended Token.

B.8.8.7 iq_prediction_mode[1:0]

This two bit register holds the prediction mode that will be used for subsequent blocks. The only use that the Inverse Quantizer makes of this information is to decide whether or not intra coding is being used. If both bits of the register are zero, then subsequent blocks are intra coded.

This register is loaded by the PREDICTION_MODE Token. This register is reset to zero by the SEQUENCE_START Token.

Iq_prediction_mode[1:0] has no effect on the operation in JPEG and JPEG variation modes.

B.8.8.8 Iq_ipeg_indirection[7:0]

Iq_ipeg_indirection is used as a lookup table to translate color components into the QTM number. Accordingly, iq_component is used as an index to iq_ipeg_indirection as shown in Table B.8.3.

This register location is written to directly by the JPEG_TABLE_SELECT Token if the extended form of the Token is used.

This register location is read directly by the JPEG_TABLE_SELECT Token if the non-extended form of the Token is used.

B.8.8.9 Iq_quant_table[3:0] [63:0] [7:0]

There are four quantization tables, each with 64 locations. Each location is an eight bit value. The value zero should not be used in any location.

These registers are implemented as a RAM described in B.8.6.3, "Igram".

These tables may be loaded using the QUANT_TABLE Token

Note that data in these tables are stored in zig-zag scan order. Many documents represent quantization table values as a square eight by eight array of numbers. Usually, the DC term is at the top left with increasing horizontal frequency running left to right and increasing vertical frequency running top to bottom. Such tables must be read along the zig-zag scan path as the numbers are placed into the quantization table with consecutive "i".

B.8.9 Microprocessor Register Map

TABLE B.8.5

Memory Map

| Register | Location | Direction | Reset State |
|---|---|---|---|
| iq_access | 0x30 | R/W | 0 |
| iq_coding_standard[1:0] | 0x31 | R/W | 0 |
| iq_quant_scale[4:0] | 0x32 | R/W | ? |
| iq_component[1:0] | 0x33 | R/W | ? |
| iq_prediction_mode[1:0] | 0x34 | R/W | 0 |
| iq_jpeg_indirection[7:0] | 0x35 | R/W | ? |
| iq_mpeg_indirection[1:0] | 0x36 | R/W | 0 |
| iq_qtm_keyhole_addr[7:0] | 0x38 | R/W | 0 |
| iq_qtm_keyhole[7:0] | 0x39 | R/W | ? |

B.8.10 Test

Test coverage to the Inverse Quantizer at the input is through the Inverse Modeler's output snooper, and at the output through the Inverse Quantizer's own snooper. Logic is covered by the Inverse Quantizer's own scan chain.

Access can be gained to igram without reference to iq_access if the ramtest signal is asserted.

SECTION B.9 IDCT

B.9.1 Introduction

The purpose of this description of the Inverse Discrete Cosine Transform (IDCT) block is to provide a source of engineering information for the IDCT. It includes information on the following.

purpose and main features of the IDCT how it was designed and verified structure It is intended that the description should provide one of ordinary skill in the art sufficient information to facilitate or aid the following tasks.

appreciation of the IDCT as a "sillicon macro function"

integration the IDCT onto another device development of test programs for the IDCT silicon modification, re-design or maintenance of the IDCT development of a forward DCT block B.9.2 Overview A Discrete Cosine Transform/Zig-Zag (DCT/ZZ) performs a transformation on blocks of pixels wherein each block represents an area of the screen 8 pixels high by 8 pixels wide. The purpose of the transform is to represent the pixel block in a frequence domain, sorted according to frequency. Since the eye is sensitive to DC components in a picture, but much less sensitive to high frequency components, the frequency data allows each component to be reduced in magnitude separately, according to the eye's sensitivity. The process of magnitude reduction is known as quantization. The quantization process reduces the information contained in the picture, that is, the quantization process is lossy. Lossy processes give overall data compression by eliminating some information. The frequency data is sorted so that high frequencies, most likely to be quantized to zero, all appear consecutively. The consecutive zeros means that coding the quantized data by using run-length coding schemes yields further data compression, although run-length coding is generally not a lossy process.

The IDCT block (which actually includes an Inverse Zig-Zag RAM, or IZZ, and an IDCT) takes frequency data, which is sorted, and transforms it into spatial data. This inverse sorting process is the function of IZZ.

The picture decompression system, of which the IDCT block forms a part, specifies the pixels as integers. This means that the IDCT block must take, and yield, integer values. However, since the IDCT function is not integer based, the internal number representation uses fractional parts to maintain internal accuracy. Full floating-point arithmetic is preferable, but the implementation described herein uses fixed-point arithmetic. There is some loss of accuracy using fixed-point arithmetic, but the accuracy of this implementation exceeds the accuracy specified by H.261 and the IEEE.

B.9.3 Design Objectives

The main design objective, in accordance with the present invention, was to design a functionally correct IDCT block which uses a minimum silicon area. The design was also required to run with a clock speed of 30 MHz under the specified operating conditions, but it was considered that the design should also be adaptable for the future. Higher clock rates will be needed in the future, and the architecture of the design allows for this wherever possible.

B.9.4 IDCT Interfaces Description

The IDCT block has the following interfaces.

a 12-bit wide Token data input port a 9-bit wide Token data output port a microprocessor interface port a system services input port a test interface resynchronizing signals Both the Token data ports are the standard Two-Wire Interface type previously described. The widths illustrated, refer to the number of bits in the data representation, not the total number of wires in a port. In addition, associated with the input Token data port are the clock and reset signals used for resynchronization to the output of the previous block. There are also two resynchronizing clocks associated with the output Token data port and used by the subsequent block.

The microprocessor interface is standard and uses four bits of address. There are also three externally decoded select inputs which are used to select the address spaces for events, internal registers and test registers. This mechanism provides the flexibility to map the IDCT address space into different positions in different chips. There is also a single event output, idctevent, and two i/o signals, n_derrd and n_serrd, which are the event tristate data wires to be connected externally to the IDCT and to the appropriate bits of the microprocessor notdata bus.

The system services port consists of the standard clock and reset input signals, as well as, the 2-phase override clocks and associated clock override mode select input.

The test interface consists of the JTAG clock and reset signals, the scan-path data and control signals and the ramtest and chiptest inputs.

In normal operation, the microprocessor port is inactive since the IDCT does not require any microprocessor access to achieve its specified function. Similarly, the test interface is only active when testing or verification is required.

B.9.5 The Mathematical Basis for the Discrete Cosine Transformation

In video bandwidth compression, the input data represents a square area of the picture. The transform applied must, therefore, be two-dimensional. Two-dimensional transforms are difficult to compute efficiently, but the two-dimensional DCT has the property of being separable. Separable transforms can be computed along each dimension independent of the other dimensions. This implementation uses a one-dimensional IDCT algorithm designed specifically for mapping onto hardware; the algorithm is not appropriate for software models. The one-dimensional algorithm is applied successively to obtain a two-dimensional result.

The mathematical definition of the two-dimensional DCT for an N by N block of pixels is as follows:

$$Y(j,k) = \frac{2}{N} c(j)c(k) \sum_{m=0}^{N-1} \sum_{n=0}^{N-1} X(m,n) \cos\left[\frac{(2m+1)j\pi}{2N}\right] \cos\left[\frac{(2n+1)k\pi}{2N}\right] \quad \text{EQ 10.forwardDCT}$$

$$X(m,n) = \frac{2}{N} \sum_{j=0}^{N-1} \sum_{k=0}^{N-1} c(j)c(k)Y(j,k) \cos\left[\frac{(2m+1)j\pi}{2N}\right] \cos\left[\frac{(2n+1)k\pi}{2N}\right] \quad \text{EQ 11.inverseDCT}$$

Where $$j,k = 0, 1, \ldots, N-1$$

$$c(j)c(k) = \begin{cases} \frac{1}{\sqrt{2}} & j,k=0 \\ 1 & \text{otherwise} \end{cases}$$

The above definition is mathematically equivalent to multiplying two N by N matrices, twice in succession, with a matrix transposition between the multiplications. A one-dimensional DCT is mathematically equivalent to multiplying two N by N matrices. Mathematically the two-dimensional case is:

$$Y=[X\ C]^T C$$

Where C is the matrix of cosine terms.

Thus the DCT is sometimes described in terms of matrix manipulation. Matrix descriptions can be convenient for mathematical reductions of the transform, but it must be stressed that this only makes notation easier. Note that the 2/N term governs the DC level. The constants c(j) and c(k) are known as the normalization factors.

B.9.6 The IDCT Transform Algorithm

As subsequently explained in further detail, the algorithm used to compute the actual IDCT transform should be a "fast" algorithm. The algorithm used is optimized for an efficient hardware architecture and implementation. The main features of the algorithm are the use of √2 scaling in order to remove one multiplication, and a transformation of the algorithm designed to yield a greater symmetry between the upper and lower sections. This symmetry results in an efficient re-use of many of the most costly arithmetic elements.

In the diagram illustrating the algorithm (FIG. 136), the symmetry between the upper and lower halves is evident in the middle section. The final column of adders and subtractors also has a symmetry, the adders and subtractors can be combined with relatively little cost (4 adder/subtractors being significantly smaller than 4 adders+4 subtractors as illustrated).

Note that all the outputs of a single dimensional transform are scaled by √2. This means that the final 2-dimensional answer will be scaled by 2. This can then be easily corrected in the final saturation and rounding stage by shifting.

The algorithm shown was coded in double precision floating-point C and the results of this compared with a reference IDCT (using straightforward matrix multiplication). A further stage was then used to code a bit-accurate integer version of the algorithm in C (no timing information was included) which could be used to verify the performance and accuracy of the algorithm as it would be implemented on silicon. The allowable inaccuracies of the transform are specified in the H.261 standard and this method was used to exercise the bit-accurate model and measure the delivered accuracy.

FIG. 137 shows the overall IDCT Architecture in a way that illustrates the commonality between the upper and lower sections and which also shows the points at which intermediate results need to be stored. The circuit is time multiplexed to allow the upper and lower sections to be calculated separately.

B.9.7 The IDCT Transform Architecture

As described previously, the IDCT algorithm is optimized for an efficient architecture. The key features of the resulting architecture are as follows:

- significant re-use of the costly arithmetic operations
- small number of multipliers, all being constant coefficient rather than general purpose (reduces multiplier size and removes need for separate coefficient store)
- small number of latches, no more than required for pipelining the architecture
- operations are arranged so that only a single resolving operation is required per pipeline stage
- can arrange to generate results in natural order
- no complex crossbar switching or significant multiplexing (both costly in a final implementation)
- advantage is taken of resolved results in order to remove two carry-save operations (one addition, one subtraction)
- architecture allows each stage to take 4 clock cycles, i.e., removes the requirement for very fast (large) arithmetic operations
- architecture will support much faster operation than current 30 MHz pixel-clock operation by simply changing resolving operations from small/slow ripple carry to larger/faster carry-lookahead versions. The resolving operations require the largest proportion of the time required in each stage so speeding up only these operations has a significant effect on the overall operations speed, whilst having only a relatively small increase on the overall size of the transform. Further increases in speed can also be achieved by increasing the depth of pipelining.
- control of the transform data-flow is very straightforward and efficient The diagram of the 1D Transform Micro-Architecture (FIG. 141) illustrates how the algorithm is mapped onto a small set of hardware resources and then pipelined to allow the necessary performance constraints to be met. The control of this architecture is achieved by matching a "control shift-register" to the data-flow pipeline. This control is straightforward to design and is efficient in silicon layout.

The named control signals on FIG. 141 (latch,sel_byp etc.) are the various enable signals used to control the latches and, thus, the signal flow. The clock signals to the latches are not shown.

Several implementation details are significant in terms of allowing the transform architecture to meet the required accuracy standards whilst minimizing the transform size. The techniques used generally fall into two major classes.

Retention of maximum dynamic range, with a fixed word width, at each intermediate state by individual control of the fixed-point position.

Making use of statistical definition of the accuracy requirement in order to achieve accuracy by selective manipulation of arithmetic operations (rather than increasing accuracy by simply increasing the word width of the entire transform)

The straightforward way to design a transform would involve a simple fixed-point implementation with a fixed word-width made large enough to achieve accuracy. Unfortunately, this approach results in much larger word widths and, therefore, a larger transform. The approach used in the present invention allows the fixed point position to vary throughout the transform in a manner that makes the maximum use of the available dynamic range for any particular intermediate value, achieving the maximum possible accuracy.

Because the allowable results are specified statistically, selective adjustments can be made to any intermediate value truncation operation in order to improve overall accuracy. The adjustments chosen are simple manipulations of LSB calculations, which have little or no cost. The alternative to this technique is to increase the word width, involving significant cost. The adjustments effectively "weight" final results in a given direction, if it is found that previously, these results tend in the opposite direction. By adjusting the fractional parts of results, we are effectively shifting the overall average of these results.

B.9.8 IDCT Block Diagram Description

The block diagram of the IDCT shows all the blocks that are relevant to the processing of the Token Stream. This diagram, FIG. 138, does not show details of clocking, test and microprocessor access and the event mechanism. Snooper blocks, used to provide test access, are not shown in the diagram.

B.9.8.1 DATA Error Checker

The first block is the DATA error checker and corrector, called "decheck" which taken and produces a 12-bit wide Token Stream, parses this stream and checks the DATA Tokens. All other Tokens are ignored and are passed straight through. The checks that are performed are for DATA Tokens with a number of extensions not equal to 64. The possible errors are termed "deficient" (<64 extensions) an idct_too_few_event, and "supernumerary" (>64 extensions), an idct_too_many_event. Such errors are signalled with the standard event mechanism, but the block also attempts simple error recovery by manipulation of the Token Stream. In the case of deficient errors, the DATA Token is packed with "0" value extensions (stops accepting input and performs insert) to make up the correct 64 extensions. In the case of a supernumerary error, the extension bit is forced to "0" for the 64th extension and all extra extensions are removed from the Token Stream.

B.9.8.2 Inverse Zig-Zag

The next block on the Spatial Decoder in FIG. 138 is the inverse zig-zag RAM 441, "izz", and again it takes and produces a 12-bit wide Token Stream. As with all other blocks, the stream is parsed, but only DATA Tokens are recognized. All other Tokens are passed through unchanged. DATA Tokens are also passed through, but the order of the extensions is changed. This block relies on correct DATA Tokens (i.e., 64 extensions only). If this is not true, then operation is unspecified. The reordering is done according to the standard inverse Zig-Zag pattern and, by default, is done so as to provide horizontally scanned data at the IDCT output. It is also possible to change the ordering to provide vertically scanned output. In addition to the standard IZZ ordering, this block performs an extra re-ordering of each 8-word row. This is done because of the specific requirements of the IDCT one-dimensional transform block and results in rows being output in the order (1,3,5,7,0,2,4,6) rather than (0,1,2,3,4,5,6,7).

B.9.8.3 Input Formatter

The next block in FIG. 138 is the input formatter 442, "ip_fmt", which formats DATA input for the first dimension of the IDCT transform. This block has a 12-bit wide Token Stream input and 22-bit wide token Stream output. DATA Tokens are shifted left so as to move the integer part to the correct significance in the IDCT transform standard 22-bit wide word, the fractional part being set to 0. This means that there are 10 bits of fraction at this point. All other Tokens are unshifted and the extra unused bits are simply set to 0.

B.9.8.4 1-Dimensional Transform—1st Dimension

The next block shown in FIG. 138 is the first single dimension IDCT transform block 443, "oned". This inputs and outputs 22-bit wide token Streams and, as usual, the stream is parsed and DATA Tokens are recognized. All other tokens are passed through unaltered. The DATA Tokens pass through a pipelined datapath that performs an implementation of a single dimension of an 8-by-8 Inverse Discrete Cosine Transform. At the output of the first dimension, there are 7 bits of fraction in the data word. All other Tokens run through a merely shift register datapath that simply matches the DATA transform latency and are recombined into the Token Stream before output.

B.9.8.5 Transpose RAM

The transpose RAM 444 "tram", is similar in many ways to the inverse zig-zag RAM 441 in the way it handles a Token Stream. The width of Tokens handled (22 bits) and the re-ordering performed are different, but otherwise they work in the same way and actually share much of their control logic. Again, rows are additionally re-ordered for the requirements of the following IDCT dimension as well as the fundamental swapping of columns into rows.

B.9.8.6 1-Dimensional Transform—2nd Dimension

The next block shown is another instance of a single dimension IDCT transform and is identical in every way to the first dimension. At the output of this dimension there are 4 bits of fraction.

B.9.8.7 Round and Saturate

The round-and-saturate block 446 in FIG. 138, "ras", takes a 22-bit wide Token Stream containing DATA extensions in 22-bit fixed point format and outputs a 9-bit wide Token Stream where DATA extensions have been rounded (towards +ve infinity) into integers and saturated into 9-bit two's complement representation and all other Tokens have been passed straight through.

B.9.9 Hardware Descriptions of Blocks

B.9.9.1 Standard Block Structure

For all the blocks that handle a Token Stream there is a standard notional structure as shown in FIG. 139. This separates the two-wire interface latches from the section that performs manipulation of the Token Stream. Variations on this structure can include extra internal blocks (such as a RAM core). In some blocks shown, the structure is made less obvious in the schematic (although it does actually still exist) because of the requirement of grouping together all the "datapath" logic and separate this from all the standard cell logic. In the case of a very simple block, such as "ras", it is possible to take the latched out_accept straight into the input two-wire latch without logical manipulation.

B.9.9.2 "Decheck"—DATA Error Checking/Recovery

The first block 440 in the Token Stream performs DATA checking and correcting as specified in the Block Diagram Overview section. The detected errors are handled with the standard event mechanism which means that events can be masked and the block can either continue with the recovery procedure when an error is detected or be stopped depending on event mask status. The IDCT should never see incorrect DATA Tokens and, therefore, the recovery that it attempted is only a fairly simple attempt to contain what may be a serious problem.

This block has a pipeline depth of two stages and is implemented entirely in zcells. The input two-wire interface latch is of the "front" type, meaning that all inputs arrive onto transistor gates to allow safe operation when this block (at the front of the IDCT) is on a separate power supply regime from the one preceding it. This block works by parsing a Token Stream and passing non-DATA Tokens straight through. When a DATA Token is found, a count is started of the number of extensions found after the header. If the extension bit is found to be "0" when the count does not equal 63, an error signal is generated (which goes to the event logic) and depending on the state of the mask bit for that event, "decheck" will either be stopped (i.e., no longer accept input or generate output) or will begin error recovery. The recovery mechanism for "deficient" errors uses the counter to control the insertion of the correct number of extensions into the Token Stream (the value inserted is always "0"). Obviously, input is not accepted whilst this insertion proceeds. When it is found that the extension bit is not "0" on the 64th extension, a "supernumerary" error is generated, the DATA Token is completed by forcing the extension bit to "0", and all succeeding words with the extension bit set to "1" are deleted from the Token Stream by continuing to accept data but invalidating the output.

Note that the two error signals are not persistent (unless the block is stopped) i.e., the error signal only remains active from the point when an error is detected until recovery is complete. This is a minimum of one complete cycle and can persist forever in the case of a infinitely supernumerary DATA Token.

B.9.9.3 "Izz" and "tram"—Reordering RAMs

The "izz" 441 (inverse zig-zag RAM) and the "tram" 444 (transpose RAM) are considered here together since they both perform a variation on the same function and they have more similarities than differences. Both these blocks take a Token Stream and re-order the extensions of a DATA Token whilst passing through all other Tokens unchanged. The widths of the extensions handled and the sequences of the re-ordering are different, but a large section of the control logic for each RAM is identical and is actually organized into a "common control" block which is instanced in the schematic for each RAM. The difference in width has no effect upon this control section so it is only necessary to use a different "sequence address generator" for each RAM together with RAM cores and two-wire interface blocks of the appropriate width.

The overall behavior of each RAM is essentially that of a FIFO. This is strictly true at the Token level and a particular modification to the output order is made for the extension words of a DATA Token. The depth of the FIFO is 128 stages. This is necessary to fulfill the requirement for a sustainable 30 MHz throughout the system since output of the FIFO is held up after the start of the output of a DATA Token is detected. This is because the features of the reordering sequences used require that a complete block of 64 extensions be gathered in the FIFO before re-ordered output can begin. More precisely, the minimum number required is different for inverse zig-zag and transpose sequences and is somewhat less than 64 in both cases. However, the complications of controlling a FIFO which has a length which is not a power of two, means that the small saving in RAM core would be outweighed by the additional complexity of control logic required.

The RAM core is implemented with a design which allows a read and a write (to the same or separate addresses) in a single 30 MHz cycle. This means that the RAM is effectively operating with an internal 60 MHz cycle time.

The re-ordering operation is performed by generating a particular sequence of read addresses ("sequence address generation") in the range 0→63, but not in natural order. The sequences required are specified by the standard zig-zag sequence (for eight horizontal or vertical scanning) or by the sequence needed for normal matrix transposition. These standard sequences are then further reordered by the requirement to output each row in Odd/Even format (i.e., 1,3,5,7, 0,2,4,6) rather than (0,1,2,3,4,5,6,7)) because of the requirements of the IDCT transform 1-dimensional blocks.

Transpose address sequence generation is quite straightforward algorithmically. Straight transpose sequence generation simply requires the generation of row and column addresses separately, both implemented with counters. The row re-ordering requirement simply means that row addresses are generated with a simple specific state machine rather than a natural counter.

Inverse zig-zag sequences are rather less straightforward to generate algorithmically. Because of this fact, a small ROM is used to hold the entire 64 6 bit values of address, this being addressed with row and column counters which can be swapped in order to change between horizontal and vertical scan modes. A ROM based generator is very quick to design and it further has the advantage that it is trivial to implement a forward zig-zag (ROM re-program) or to add other alternative sequences in the future.

B.9.9.4 "Oned"—Single Dimension IDCT Transform

This block has a pipeline depth of 20 stages and the pipeline is rigid when stalled. This rigidity greatly simplifies the design and should not unduly affect overall dynamics since the pipeline depth is not that great and both dimensions come after a RAM which provides a certain amount of buffering.

The block follows the standard structure, but has separate paths internally for DATA Token extensions (which are to be processed) and all other items which should be passed through unchanged. Note that the schematic is drawn in a particular way. First, because of the requirements to group together all the datapath logic and second, to allow automatic compiled code generation (this explains the control logic at the top level).

Tokens are parsed as normal and then DATA extensions, and other values, are routed respectively through two different parallel paths before being re-combined with a multiplexer before the output two-wire interface latch block. The parallel paths are required because it is not possible to pass values unchanged through the transform datapath. The latency of the transform datapath is matched with a simple shift register to handle the remainder of the Token Stream.

The control section of "oned" needs to parse the Token Stream and control the splitting and re-combination of the Tokens. The other major section controls the transform datapath. The main mechanism for the control of this datapath is a control shift-register which matches the datapath pipeline and is tapped-off to provide the necessary control signals for each stage of the datapath pipeline.

The "oned" block has the requirement that it can only start operation on complete rows of DATA extensions, i.e., groups of 8. It is not able to handle invalid data ("Gaps") in the middle of rows, although, in fact, the operation of "izz" and the "tram" ensure that complete DATA blocks are output as an uninterrupted sequence of 64 valid extension values.

B.9.9.4.1 Transform Datapath

The micro-architecture of the transform datapath, "t_dp" was previously shown in FIG. 141. Note that some detail (e.g., clocking, shifts, etc.) is not shown. This diagram does illustrate, however, how the datapath operates on four values simultaneously at any stage in the pipeline. The basic sub-Structure of the datapath, i.e., the three main sections can also be seen (e.g., pre-common, common and post-common) as can the arithmetic and latch resources required. The named control signals are the enables for the pipeline latches (and the add/sub selector) which are sequenced with decodes of the control shift-register state. Note that each pipeline stage is actually four clock cycles in length.

Within the transform datapath there are a number of latch stages which are required to gather input, store intermediate results in the pipeline, and serialize the output. Some of latches are of the muxing type, i.e., they can be conditionally loaded from more than one source. All the latches are of the enabled type, i.e., there are separate clock and enable inputs. This means that it is easy to generate enable signals with the correct timing, rather than having to consider issues of skew that would arise if a generated clock scheme was adopted.

The main arithmetic elements required are as follows.

a number of fixed coefficient multipliers (carry-save output)

carry-save adders carry-save subtractors resolving adders resolving adder/subtractors All arithmetic is performed in two's complement representation. This can either be in normal (resolved) form or in carry-save form (i.e., two numbers whose sum represents the actual value). All numbers are resolved before storage and only one resolving operation is performed per pipeline stage since this is the most expensive operation in terms of time. The resolving operations performed here all use simple ripple-carry. This means that the resolvers are quite small, but relatively slow. Since the resolutions dominate the total time in each stage, there is obviously an opportunity to speed up the entire transform by employing fast resolving arithmetic units.

B.9.9.5 "Ras"—Rounding and Saturation

In the present invention, the "ras" block has the task of taking 22-bit fixed point numbers from the output of the second dimension "oned" and turning these into the correctly rounded and saturated 9-bit signed integer results required. This block also performs the necessary divide-by-4 inherent in the scheme (the 2/N term) and to further divide-by-2 required to compensate for the 2 prescaling performed in each of the two dimensions. This division by 8 implies that the fixed point position is interpreted as being three bits further left than anticipated, i.e., treat the result as having 15 bits of integer representation and 7 bits of fraction (rather than 4 bits of fraction). The rounding mode implemented is "round to positive infinity", i.e., add one for fractions of exactly 0.5. This is primarily done because it is the simplest rounding mode to implement. After rounding (a conditional increment of the integer part) is complete, this result is inspected to see whether the 9-bit signed result requires saturation to the maximum or minimum value in this range. This is done by inspection of the increment carry out together with the upper bits of the original integer value.

As usual, the Token Stream is parsed and the round and saturation operation is only applied to DATA Token extension values. The block has a pipeline depth of two stages and is implemented entirely in zcells.

B.9.9.6 "Idctsels"—IDCT Register Select Decoder

This block is a simple decoder which decodes the 4 microprocessor interface address lines, and the "sel_test" input, into select lines for individual blocks test access (snoopers and RAMs). The block consists only of zcells combinatorial logic. The selects decoded are shown in Table B.9.2.

TABLE B.9.1

IDCT Test Address Space

| Addr. (hex) | Bit num. | Register Name |
|---|---|---|
| 0x0 | 7..1 | not used |
| | 0 | TRAM keyhole address |
| 0x1 | 7..0 | |
| 0x2 | 7..0 | TRAM keyhole data |
| 0x3 | 7..0 | TRAM keyhole data* |
| 0x4 | 7..0 | IZZ keyhole address |
| 0x5 | 7..0 | IZZ keyhole data |
| 0x6 | 7..3 | not used |
| | 2 | ipfsnoop test select |
| | 1 | ipfsnoop valid |
| | 0 | ipfsnoop accept |
| 0x7 | 7..6 | not used |
| | 5..0 | ipfsnoop bits[21:16] |
| 0x8 | 7..0 | ipfsnoop bits[15:8] |
| 0x9 | 7..0 | ipfsnoop bits[7:0] |
| 0xA | 7..3 | not used |
| | 2 | d2snoop test select |
| | 1 | d2snoop valid |
| | 0 | d2snoop accept |
| 0xB | 7..6 | not used |
| | 5..0 | d2snoop bits[21:16] |
| 0xC | 7..0 | d2snoop bits[15:6] |
| 0xD | 7..0 | d2snoop bits[7:0] |
| 0xE | 7 | outsnoop test select |
| | 6 | outsnoop valid |
| | 5 | outsnoop accept |
| | 4..2 | not used |
| 0xE | 1..0 | outsnoop data[9:8] |
| 0xF | 7..0 | outsnoop data[7:0] |

*Repeated address

B.9.9.7 "Idctregs"—IDCT Control Register and Events

This block of the invention contains instances of the standard event logic blocks to handle the DATA deficient and supernumerary errors and also a single memory mapped bit "vscan" which can be used to make the "izz" re-ordering change such that the IDCT output is vertically scanned. This bit is reset to the value "0", i.e., the default mode is horizontally scanned output. The two possible events are OR-ed together to form an idctevent signal which can be used as an interrupt. See Section B.9.10 for the addresses and bit positions of registers and events.

B.9.9.8 Clock Generators

Two "standard" type ("clkgen") clock generators are used in the IDCT. This is done so that there can be two separate scan-paths. The clock generators are called "idctcga" and "idctcgb". Functionally, the only difference is that "idctcgb" does not need to generate the "notrst1" signal. The amounts of buffering for each of the clock and reset outputs in the two clock generators is individually tailored to the actual loads driven by each clock or reset. The loads that are matched were actually measured from the gate and track capacitances of the final layout.

When the IDCT top-level Block Place and Route (BPR) was performed, advantage was taken of the capabilities of the interactive global routing feature to increase the widths of tracks of the first sections of the clock distribution trees for the more heavily loaded clocks (ph0_b and ph1_b) since these tracks will carry significant currents.

B.9.9.9 JTAG Control Blocks

Since the IDCT has two separate scan-chains, and two clock generators, there are two instances of the standard JTAG control block, "jspctle". These interface between the test port and the two scan-paths.

B.9.10 Event and Control Registers

The IDCT can generate two events and has a single bit of control. The two events are idct_too_few_event and idct_too_many_event which can be generated by the "decheck" block at the front of the IDCT if incorrect DATA Tokens are detected. The single control bit is "vscan" which is set if it is required to operate the IDCT with the output vertically scanned. This bit, therefore, controls the "izz" block. All the event logic and the memory mapped control bit are located in the block "idctregs".

From the point of view of the IDCT, these registers are located in the following locations. The tristate i/o wires n_derrd and n-serrd are used to read and write to these locations as appropriate.

TABLE B.9.2

IDCT Control Register Address Space

| Addr. (hex) | Bit num. | Register Name |
|---|---|---|
| 0x0 | 7..1 | not used |
| | 0 | vscan |

TABLE B.9.3

IDCT Event Address Space

| Addr. (hex) | Bit name | Register Name |
|---|---|---|
| 0x0 | n_derrd | idct_too_few_event |
| | n_serrd | idct_too_many_event |
| 0x1 | n_derrd | idct_too_few_mask |
| | n_serrd | idct_too_many_mask |

B.9.11 Implementation Issues

B.9.11.1 Logic Design Approach

In the design of all the IDCT blocks, in accordance with the invention, there was an attempt to use a unified and simple logic design strategy which would mean that it was possible to do a "safe" design in a quick and straightforward manner. For the majority of control logic, a simple scheme of using master-slaves only was adopted. Asynchronous set/reset inputs were only connected to the correct system resets. Although it might often be possible to come up with clever non-standard circuit configurations to perform the same functions more efficiently, this scheme possesses the following advantages.

conceptually simple easy to design speed of operation is fairly obvious (cf. latch→logic→latch>logic style design) and amenable to automatic analysis glitches not a problem (cf. SR latches)

using only system reset for initialization allows scan paths to work correctly allows automatic complied C-code generation There are a number of places where transparent d-type latches were used and these are listed below.

B.9.11.1.1 Two-wire Interface Latches

The standard block structure uses latches for the input and output two-wire interfaces. No logic exists between an output two-wire latch and the following input two-wire latch.

B.9.11.1.2 ROM interface

Because of the timing requirements of the ROM circuit, latches are used in the IZZ sequence generator at the output of the ROM.

B.9.11.1.3 Transform Datapath and Control Shift-Register

It is possible to implement every pipeline storage stage as a full master-slave device, but because of the amount of storage required there is a significant savings to be had by using latches. However, this scheme requires the user to consider several factors.

control shift-register must now produce control signals of both phases for use as enables (i.e., need to use latches in this shift-register)

timing analysis complicated by use of latches the "t_postc" will no longer automatically produce compiled code since one latch outputs to another latch of the same phase (because of the timing of the enables this is not a problem for the circuit)

Nonetheless, the area saved by the use of latches makes it worthwhile to accept these factors in the present invention.

B.9.11.1.4 Microprocessor Interfaces

Due to the nature of this interface, there is a requirement for latches (and resynchronizers) in the Event and register block "idctregs" and in the keyhole logic for RAM cores.

B.9.11.1.5 JTAG Test Control

These standard blocks make use of latches.

B.9.11.2 Circuit Design Issues

Apart from the work done in the design of the library cells that were used in the IDCT design (standard cells, datapath library, RAMs, ROMs, etc.) there is no requirement for any transistor level circuit design in the IDCT. Circuit simulations (using Hspice) were performed of some of the known critical paths in the transform datapath and Hspice was also used to verify the results of the Critical Path Analysis (CPA) tool in the case of paths that were close to the allowed maximum length.

Note that the IDCT is fully static in normal operation (i.e., we can stop the system clocks indefinitely) but there are dynamic nodes in scanable latches which will decay when test clocks are stopped (or very slow). Due to the non-restored nature of some nodes which exhibit a Vt drop (e.g., mux outputs) the IDCT will not be "micro-power" when static.

B.9.11.3 Layout Approach

The overall approach to the layout implementation of the present invention was to use BPR (some manual intervention) to lay out a complete IDCT which consisted of many zcells and a small number of macro blocks. These macro blocks were either hand-edited layout (e.g., RAMs, ROM, clock generators, datapaths) or, in the case of the "oned" block, had been built using BPR from further zcells and datapaths.

Datapaths were constructed from kdplib cells. Additionally, locally defined layout variations of kdplib cells were defined and used where this was perceived as providing a worthwhile size benefit. The datapath used in each of the "oned" blocks, "oned_d", is by far the largest single element in the design and considerable effort was put into optimizing the size (height) of this datapath.

The organization of the transform datapath, "t_dp", is rather crucial since the precise ordering of the elements within the datapath will affect the way the interconnect is handled. It is important to minimize the number of "overs" (vertical wires not connecting to a sub-block) which occur at the most congested point since there is a maximum allowed value (ideally 8, 10 is also possible, although highly inconvenient). The datapath is split logically into three major sub-sections and this is the way that the datapath layout was performed. In each subsection, there are really four parallel data flows (which are combined at various points) and there are, therefore, many ways of organizing the flows of data (and, thus, the positions of all the elements) within each subsection. The ordering of the blocks within each subsection, and also the allocation of logical buses to physical bus pitches was worked out carefully before layout commenced in order to make it possible to achieve a layout that could be connected correctly.

B.9.12 Verification

The verification of the IDCT was done at a number of levels, from top-level verification of the algorithms to final layout checks.

The initial work on the transform architecture was done in C, both full-precision and bit-accurate integer models were developed. Various tests were performed on the bit-accurate model in order to prove the conformance to the H.261 accuracy specification and to measure the dynamic ranges of the calculations within the transform architecture.

The design progressed in many cases by writing an M behavioral description of sub-blocks (for example, the control of datapaths and RAMs). Such descriptions were simulated in Lsim before moving onto the design of the schematic description of that block. In some cases (e.g., RAMs, clock generators) the behavioral descriptions were still used for top-level simulations.

The strategy for performing logic simulation was to simulate the schematics for everything that would simulate adequately at that level. The low-level library cells (i.e., zcells and kdplib) were mainly simulated using their behavioral descriptions since this results in far smaller and quicker simulations. Additionally, the behavioral library cells provide timing check features which can highlight some circuit configuration problems. As a confidence check, some simulations were performed using the transistor descriptions of the library cells. All the logic simulations were in the zero-delay manner and, therefore, were intended to verify functional performance. The verification of the real timing behavior is done with other techniques.

Lsim switch-level simulations (with RC_Timing mode being used) were done as a partial verification of timing performance, but also provide checks for some other potential transistor level problems (e.g., glitch sensitive circuits).

The main verification technique for checking timing problems was the use of the CPA tool, the "path" option for "datechk". This was used to identify the longer signal paths (some were already known) and Hspice was used to verify the CPA analysis in some critical cases.

Most Lsim simulations were performed with the standard source→block→sink methodology since the bulk of the IDCT behavior is exercised by the flow of Tokens through the device. Additional simulations are also necessary to test the features accessed through the microprocessor interface (configuration, event and test logic) and those test features accessed via JTAG/scan.

Compiled-code simulations can be readily accomplished by one of ordinary skill in the art for entire IDCT, again using the standard source→bloc→sink method and many of the same Token Streams that were used in the Lsim verification.

B.9.13 Testing and Test Support

This section deals with the mechanisms which are provided for testing and an analysis of how each of the blocks might be tested.

The three mechanisms provided for test access are as follows:

microprocessor access to RAM cores microprocessor access to snooper blocks scan path access to control and datapath logic There are two "snooper" blocks and one "super snooper" block in the IDCT. FIG. 140 shows the positions of the snooper blocks and the other microprocessor test access.

Using these, and the two RAM blocks, it is possible to isolate each of the major blocks for the purpose of testing their behavior in relation to the Token flow. Using microprocessor access, it is possible to control the Token inputs to any block and then to observe the Token port output of that block in isolation. Furthermore, there are two separate scan paths which run through (almost) all of the flip-flops and latches in the control sections of each block and also some of the datapath latches in the case of the "oned" transform datapath pipeline. The two scan paths are denoted "a" and "b", the former running from the "decheck" block to the "ip_fmt" block and the latter from the first "oned" block to the "ras" block.

Access to snoopers is possible by accessing the appropriate memory mapped locations in the normal manner. The same is true of the RAM cores (using the "ramtest" input as appropriate). The scan paths are accessed through the JTAG port in the normal way.

Each of the blocks is now discussed with reference to the various test issues.

B.9.13.1 "Decheck"

This block has the standard structure (see FIG. 139) where two latches for the input and output two-wire interfaces surround a processing block. As usual, no scan is provided to the two-wire latches since these simply pass on data whenever enabled and have no depth of logic to be tested. In this block, the "control" section consists of a 1-stage pipeline of zcells which are all on scanpath "a". The logic in the control section is relatively simple, the most complex path is probably in the generation of the DATA extension count where a 6-bit incrementer is used.

B.9.13.2 "Izz"

This block is a variant of the standard structure and includes a RAM core block added to the two-wire interface latches and the control section. The control section is implemented with zcells and a small ROM used for address sequence generation. All the zcells are on scanpath "a" and there is access to the ROM address and data via zcell latches. There is also further logic, e.g., for the generation of numbers plus the ability to increment or decrement. In addition, there is a 7-bit full adder used for read address generation. The RAM core is accessible through keyhole registers, via the microprocessor interface, see Table B.9.1.

B.9.13.3 "Ip_fat"

This block again has the standard structure. Control logic is implemented with some rather simple zcell logic (all on scanpath "a") but the latching and shifting/muxing of the data is performed in a datapath with no direct access since the logic here is very shallow and simple.

B.9.13.4 "Oned"

Again, this block follows the standard structure and divides into random logic and datapath sections. The zcell logic is relatively straightforward, all the zcells are on scanpath "a". The control signals for the transform pipeline datapath are derived from a long shift register consisting of zcell latches which are on the scanpath. Additionally, some of the pipeline latches are on the scanpath, this being done because there is a considerable depth of logic between some stages of the pipeline (e.g., multipliers and adders). The non-DATA Tokens are passed along a shift register, implemented as a datapath, end there is no test access to any of the stages.

B.9.13.5 Tram'

This block is very similar to the "izz" block. In this case, however, there is no ROM used in the address sequence address generation. This is performed algorithmically. All the zcell control states are an datapath "b".

B.9.13.6 Rram'

This block follows the standard structure and is entirely implemented with zcells. The most complex logical function is the 8-bit incrementer used when rounding up. All other logic is fairly simple- All states are scanpath "b".

B.9.13.7 Other Top-level Blocks

There are several other blocks that appear at the top level of the IDCT. The snoopers are obviously part of the test access logic, as are the JTAG control blocks. There are also the two clock generators which do not have any special test access (although they support various test features). The block "idctsels" is combinatorial zcell logic for decoding microprocessor addresses and the block "idctregs" contains the microprocessor accessible event and control bits associated with the IDCT.

SECTION B.10 Introduction

B.10.1 Overview of the Temporal Decoder

The internal structure of the Temporal Decoder, in accordance with the invention, is shown in FIG. 142.

All data flow between the blocks of the chip (and much of the data flow within blocks) is controlled by means of the usual two-wire interfaces and each of the arrows in FIG. 142 represents a two-wire interface. The incoming token stream passes through the input interface 450 which synchronizes the data from the external system clock to the internal clock derived from the phase-locked-loop (ph0/ph1). The token stream is then split into two paths via a Top Fork 451; one stream passes to the Address Generator 452 and the other to a 256 word FIFO 453. The FIFO buffers data while data from previous I or P frames is fetched from the DRAM and processed in the Prediction Filters 454 before being added to the incoming error data from the Spatial Decoder in the Prediction Adder 455 (P and B frames). During MPEG decoding, frame reordering data must also be fetched for I and P frames so that the output frames are in the correct order, the reordered data being inserted into the stream in the Read Rudder block 456.

The Address Generator 452 generates separate addresses for forward and backward predictions, reorder, read and write-back, the data which is written back being split from the stream in the Write Rudder block 457. Finally, data is resynchronized to the external clock in the Output Interface Block 458.

All the major blocks in the Temporal Decoder are connected to the internal microprocessor interface (UPI) bus. This is derived from the external microprocessor interface (MPI) bus in the Microprocessor Interface block 459. This block has address decodes for the various blocks in the chip associated with it. Also associated with the microprocessor interface is the event logic.

The rest of the logic of the Temporal Decoder is concerned primarily with test. First, the IEE 1149.1 (JTAG) interface 460 provides an interface to internal scan paths as well as to JTAG boundary-scan features. Secondly, two-wire interface stages which allow intrusive access to the data flow via the microprocessor interface while in test mode are included at strategic points in the pipeline architecture.

SECTION B.11 Clocking, Test and Related Issues

B.11.1 Clock Regimes

Before considering the individual functional blocks within the chip, it is helpful to have an appreciation of the clock regimes within the chip and the relationship between them.

During normal operation, most blocks of the chip run synchronously to the signal pllsysclk from the phase-locked-loop (PLL) block. The exception to this is the DRAM interface whose timing is governed by the need to be synchronous to the iftime sub-block, which generates the DRAM control signals (notwe, notoe, notcas, notras). The core of this block is clocked by the two-phase non-overlapping clocks clk0 and clk1, which are derived from the quadrature two-phase clocks supplied independently from the PLL cki0, cki1 and clkq0, ckq1.

Because the clk0, clk1 DRAM interface clocks are asynchronous to the clocks in the rest of the chip, measures have been taken to eliminate the possibility of metastable behavior (as far as practically possible) at the interfaces between the DRAM interface and the rest of the chip. The synchronization occurs in two areas: in the output interfaces of the Address Generator (addrgen/predread/psgsync, addrgen/ip_wrt2/sync18 and addrgen/ip_rd2/sync18) and in the blocks which control the "swinging" of the swing-buffer RAMs in the DRAM Interface (see section on the DRAM Interface). In each case, the synchronization process is achieved by means of three metastable-hard flip-flops in series. It should be noted that this means that clk0/clk1 are used in the output stages of the Address Generator.

In addition to these completely asynchronous clock regimes, there are a number of separate clock generators which generate two-phase non-overlapping clocks (ph0, ph1) from pllsysclk. The Address Generator, Prediction Filters and DRAM Interface each have their own clock generators; the remainder of the chip is run off a common clock generator. The reasons for this are twofold. First, it reduces the capacitive load on individual clock generators, allowing smaller clock drivers and reduced clock routing widths. Second, each scan path is controlled by a clock generator, so increasing the number of clock generators allows shorter scan-paths to be used.

It is necessary to resynchronize signals which are driven across these clock-regime boundaries because the minor skews between the non-overlapping clocks derived from different clock generators could mean that underlap occurred at the interfaces. Circuitry built into each "Snooper" block (see Section B.11.4) ensures that this does not occur, and Snooper blocks have been placed at the boundaries between all the clock regimes, excepting at the front of the Address Generator, where the resynchronization is performed in the Token Decode block.

B.11.2 Control of Clocks

Each standard clock generator generates a number of different clocks which allow operation in normal mode and scan-test mode. The control of clocks in scan-test mode is described in detail elsewhere, but it is worth noting that several of the clocks generated by a clock generator (tph0, tph1, tckm, tcks) do not usually appear to be joined to any primitive symbols on the schematics. This is because scan paths are generated automatically by a post-processor which correctly connects these clocks. From a functional point of view, the fact that the post-processor has connected different clocks from those shown on the schematics can be ignored; the behavior is the same.

During normal operation, the master clocks can be derived in a number of different ways. Table B.11.1 indicates how various modes can be selected depending on the states of the pins pllselect and override.

TABLE B.11.1

Clock Control Modes

| pllselect | override | Mode |
|---|---|---|
| 0 | 0 | pllsysclk is connected directly to external sysclk, bypassing the PLL; DRAM interface clocks (cki0, cki1, ckq0, ckq1) are controlled directly from the pins ti and tq. |
| 0 | 1 | Override mode - ph0 and ph1 clocks are controlled directly from pins tphoish and tph1ish; DRAM interface clocks (cki0, cki1, ckq0, ckq1) are controlled directly from the pins ti and tq. |
| 1 | 0 | Normal operation. pllsysclk is the clock generated by the PLL; DRAM interface clocks are generated by the PLL. |
| 1 | 1 | External resistors connected to ti and tq are used instead of the internal resistors (debug only). |

B.11.3 The Two-wire Interface

The overall functionality of the two-wire interface is described in detail in the Technical Reference. However, the two-wire interface is used for all block-to-block communication within the Temporal Decoder and most blocks consist of a number of pipeline stages, all of which are themselves two-wire interface stages. It is, therefore, essential to understand the internal implementation of the two-wire interface in order to be able to interpret many of the schematics. In general, these internal pipeline stages are structured as shown in FIG. 143.

FIG. 143 shows a latch-logic-latch representation as this is the configuration which is normally used. However, when a number of stages are put together, it is equally valid to think of a "stage" as being latch-latch-logic (for many engineers a more familiar model). The use of the latch-logic-latch configuration allows all inter-block communication to be latch to latch, without any intervening logic in either the sending or receiving block.

Referring again to FIG. 143, a simple two-wire interface FIFO stage can be constructed by removing the logic block, connecting the data and valid signals directly between the latches and the latched in_valid directly into the NOR gate on the input to the in accept latch in the same way as out_valid and out_accept are gated. Data and valid signals then propagate when the corresponding accept signal is high. By ORing in_valid with out_accept_reg in the manner shown, data will be accepted if in_valid in low, even if out_accept_reg is low. In this way gaps (data with the valid bit low) are removed from the pipeline whenever a stall (accept signal low) occurs.

With the logic block inserted, as shown in FIG. 143, in_accept and out_valid may also be dependent on the data or the state of the block. In the configuration shown, it is standard for any state within the block to be held in master-slave devices with the master enabled by ph1 and the slave enabled by ph0.

B.11.4 Snooper Blocks

Snooper blocks enable access to the data stream at various points in the chip via the Microprocessor Interface. There are two types of snooper blocks. Ordinary Snoopers can only be accessed in test mode where the clocks can be controlled directly. "Super Snoopers" can be accessed while the clocks are running and contain circuitry which synchronizes the asynchronous data from the Microprocessor bus to the internal chip clocks. Table B.11.2 lists the locations and types of all Snoopers in the Temporal Decoder.

TABLE B.11.2

Snoopers in Temporal Decoder

| Location | Type |
|---|---|
| addrgervvec_pipe/snoopz31 | Snooper |
| addrgervcnt_pipe/midsnp | Snooper |
| addrgervcnt_pipe/endsnp | Snooper |
| addrgervpredread/snoopz44 | Snooper |
| addrgervvip_wrt2/superz10 | Super Snooper |
| addrgervvip_rd2/superz10 | Super Snooper |
| dramx/dramif/ifsnoops/snoopz15 (fsnp) | Snooper |
| dramx/dramif/ifsnoops/snoopz15 (bsnp) | Snooper |
| dramx/dramif/ifsnoops/superz9 | Super Snooper |
| wrudder/superz9 | Super Snooper |
| pflts/fwdflt/dimbuff/snoopk13 | Snooper |
| pflts/bwdflt.dimbuff/snoopk13 | Snooper |
| pflts/snoopz9 | Snooper |

Details on the use of both Snoopers are contained in the test section. Details of the operation of the JTAG interface are contained in the JTAG document.

SECTION B.12 Functional Blocks

B.12.1 Top Fork

The Top Fork, in accordance with the present invention, serves two different functions. First, it forks the data stream into two separate streams: one to the Address Generator and the other to the FIFO. Second, it provides the means of starting and stopping the chip so that the chip can be configured.

The fork part aspect of the component is very simple. The same data is presented to both the Address Generator and the FIFO, and has to have been accepted by both blocks before an accept is sent back to the previous stage. Thus, the valids of the two branches of the fork are dependent on the accepts from the other branch. If the chip is in a stopped state, the valids to both branches are held low.

The chip powers up in a state where in_accept is held low until the configure bit is set high. This ensures that no data is accepted until the user has configured the chip. If the user needs to configure the chip at any other time, he must set the configure bit and wait until the chip has finished the current stream. The stopping process is as follows:

1) If the configure bit has been set, do not accept any more data after a flush token has been detected by the Top Fork.

2) The chip will have finished processing the stream when the FLUSH Token reaches the Read Rudder. This causes the signal seq_done to go high.

3) When seq_done goes high, set an event bit which can be read by the Microprocessor. The event signal can be masked by the Event block.

B.12.2 Address Generator

In the present invention, the address generator (addrgen) is responsible for counting the numbers of blocks within a frame, and for generating the correct sequence of addresses for DRAM data transfers. The address generator's input is the token stream from the token input port (via topfork), and its output to the DRAM interface consists of addresses and other information, controlled by a request/acknowledge protocol.

The principal sections of the address generator are:

token decode block counting and generation of the DRAM block address conversion of motion vector data into an address offset request and address generator for prediction transfers reorder read address generator write address generator B.12.2.1 Token Decode (tokdec)

In the Token Decoder, tokens associated with coding standards, frame and block information and motion vectors are decoded. The information extracted from the stream is stored in a set of registers which may also be accessed via the upi. The detection of a DATA token header is signalled to subsequent blocks to enable block counting and address generation. Nothing happens when running JPEG.

List of tokens decoded:

CODING_STANDARD

DATA

DEFINE_MAX_SAMPLING

DEFINE_SAMPLING

HORIZONTAL_MBS

MVD_BACKWARDS

MVD_FORWARDS

PICTURE_START

PICTURE_TYPE

PREDICTION_MODE

This block also combines information from the request generators to control the toggling of the frame pointers and to stall the input stream. The stream is stalled when a new frame appears at the input (in the form of a PICTURE_START token) but the writeback or reorder read associated with the previous frame is incomplete.

B.12.2.2 Macroblock Counter (mblkcntr)

The macroblock counter of the present invention consists of four basic counters which point to the horizontal and vertical position of the macroblock in the frame and to the horizontal and vertical position of the block within the macroblock. At the beginning of time, and on each PICTURE_START, all counters are reset to zero. As DATA Token headers arrive, the counters increment and reset according to the color component number in the token header and the frame structure. This frame structure is described by the sampling registers in the token decoder.

For a given color component, the counting proceeds as follows. The horizontal block count is incremented on each new DATA Token of the same component until it reaches the width of the macroblock, and then it resets. The vertical block count is incremented by this reset until it reaches the height of the macroblock, and then it resets. When this happens, the next color component is expected. Hence, this sequence is repeated for each of the components in the macroblock—the horizontal and vertical size of the macroblock, possibly being different for each component. If, for any component, fewer blocks are received than are expected, the count will still proceed to the next component without error.

When the color component of the DATA Token is less than the expected value, the horizontal macroblock count is incremented. (Note that this will also occur when more than the expected number of blocks appear for a given color component, as the counters will then be expecting a higher component index.) This horizontal count is reset when the count reaches the picture width in macroblocks. This reset increments the vertical macroblock count.

There is a further ability to count macroblocks in H.261 CIF format. In this case, there is an extra level hierarchy between macroblocks and the picture called the group of blocks. This is eleven macroblocks wide and three deep, and a picture is always two groups wide. The token decoder extracts the CIF bit from the PICTURE_TYPE token and passes this to the macroblock counter to instruct it to count groups of blocks. Instances of too few or too many blocks per component will provoke similar reactions as above.

B.12.2.3 Block Calculation (blkcalc)

The Block calculation converts the macroblock and block-within-macroblock coordinates into coordinates for the block's position in the picture, i.e., it knocks out the level of hierarchy. This, of course, has to take into account the sampling ratios of the different color components.

B.12.2.4 Base Block Address (bsblkadr)

The information from the blkcalc, together with the color component offsets, is used to calculate the block address within the linear DRAM address space. Essentially, for a given color component, the linear block address is the number of blocks down times the width of the picture plus the number of blocks long. This is added to the color component offset to form the base block address.

B.12.2.5 Vector Offset (vec_pipe)

The motion vector information presented by the token decoder is in the form of horizontal and vertical pixel offset coordinates. That is, for each of the forward and backward vectors there is an (x,y) which gives the displacement in half-pixels from the block being formed to the block from which it is being predicted. Note that these coordinates may be positive or negative. They are first scaled according to the sampling of each color component, and used to form the block and new pixel offset coordinates.

In FIG. 145, the shaded area represents the block that is being formed. The dotted outline is the block from which it is being predicted. The big arrow shows the block offset—the horizontal and vertical vector to the DRAM block that contains the prediction block's origin—in this case (1,4). The small arrow shows the new pixel offset the position of the prediction block origin within that DRAM block. As the DRAM block is 8×8 bytes, the pixel offset looks to be (7,2).

The multiplier array vmarria then converts the block vector offset into a linear vector offset. The pixel information is passed to the prediction request generator as an (x,y) coordinate (pix_info).

B.12.2.6 Prediction Requests

The frame pointer, bass block address and vector offset are added to form the address of the block to be fetched from the DRAM (Inblkad3). If the pixel offset is zero, only one request is generated. If there is an offset in either the x OR y dimension, then two requests are generated—the original block address and the one either immediately to the right or immediately below. With an offset in both x and y, four requests are generated.

Synchronization between the chip clock regime and the DRAM interface clock regime takes place between the first addition (Inblkad3) and the state machine that generates the appropriate requests. Thus, the state machine (psgstate) is clocked by the DRAM interface clocks, and its scanned elements form part of the DRAM interface scan chain.

B.12.2.7 Reorder Read Request and Write Requests

As there is no pixel offset involved here, each address is formed by adding the base block address to the relevant frame pointer. The reorder read uses the same frame store as the prediction and data is written back to the other frame store. Each block includes a short FIFO to store addresses as the transfer of read and write data is likely to lag the prediction transfer at the corresponding address. (This is because the read/write data interacts with stream further along the chip dataflow than the prediction data) . Each block also includes syhchronization between the chip clock and the DRAM interface clock.

B.12.2.8 Offsets

The DRAM is configured an two frame stores, each of which contains up to three color components. The frame store pointers and the color component offsets within each frame must be programmed via the upi.

B.12.2.9 Snoopers

In the present invention, snoopers are positioned as follows:

Between blkcalc and bsblkadr—this interface comprises the horizontal and vertical block coordinates, the appropriate color component offset and the width of the picture in blocks (for that component).

After bsblkadr—the base block address.

After vec_pipe—the linear block offset, the pixel offset within the block, together with information on the prediction mode, color component and H.261 operation.

After lnblkad3—the physical block address, as described under "Prediction Requests".

Super snoopers are located in the reorder read and write request generators for use during testing of the external DRAM. See the DRAM Interface section for all the details.

B.12.2.10 Scan

The addrgen block has its own scan chain, the clocking of which is controlled by the block's own clock generator (adclkgen). Note that the request generators at the back end of the block fall within the DRAM interface clock regime.

B.12.3 **Prediction Filters

The overall structure of the Prediction Filters, in accordance with the present invention, is shown in FIG. 146. The forward and backward filters are identical and filter the MPEG forward and backward prediction blocks. Only the forward filter is used in H.261 mode (the h261_on input of the backward filter should be permanently low because H.261 streams do not contain backward predictions). The entire Prediction Filters block is composed of pipelines of two-wire interface stages.

B.12.3.1 A Prediction Filter

Each Prediction Filter acts completely independently of the other, processing data as soon as valid data appears at its input. It can be seen from FIG. 147 that a Prediction Filter consists of four separate blocks, two of which are identical. It is best if the operation of these blocks is described independently for MPEG and H.261 operation. H.261 being the more complex, is described first.

B.12.3.1.1 H.261 Operation

The one-dimensional filter equation used is as follows:

$$F_i = \frac{x_{i+1} + 2x_i + x_{i-1}}{4} \quad (1 \leqq i \leqq 6)$$

$$F_i = x_i (\text{otherwise})$$

This is applied to each row of the 8×8 block by the x Prediction Filter and to each column by the y Prediction Filter. The mechanism by which this is achieved is illustrated in FIG. 148, which is basically a representation of the pflt1dd schematic. The filter consists of three two-wire interface pipeline stages. For the first and last pixels in a row, registers A and C are reset and the data passes unaltered through registers B, D and F (the contents of B and D being added to zero) The control of Bx2mux is set so that the output of register B is shifted left by one. This shifting is in addition to the one place which it is always shifted in any event. Thus, all values are multiplied by 4 (more of this later). For all other pixels, $x_{i+1}$ is loaded into register C, $x_i$ into register B and $x_{i-1}$ into register A. It can be seen from FIG. 148 that the H.261 filter equation is then implemented. Because vertical filtering is performed in horizontal groups of three (see notes on the Dimension Buffer, below) there is no need to treat the first and last pixels in a row differently. The control and the counting of the pixels within a row is performed by the control logic associated with each 1-D filter. It should be noted that the result has not been divided by 4. Division by 16 (shift right by 4) is performed at the input of the Prediction Filters Adder (Section B.12.4.2) after both horizontal and vertical filtering has been performed, so that arithmetic accuracy is not lost. Registers DA, DD and DF pass control information down the pipeline. This includes h261_on and last byte.

Of the other blocks found in the Prediction Filter, the function of the Formatter is merely to ensure that data is presented to the x-filter in the correct order. It can be seen above that this merely requires a three-stage shift register, the first stage being connected to the input of register C, the second to register B and the third to register A.

Between the x and y filters, the Dimension Buffer buffers data so that groups of three vertical pixels are presented to the y-filter. These groups of three are still processed horizontally, however, so that no transposition occurs within the Prediction Filters. Referring to FIG. 149, the sequence in which pixels are output from the Dimension Buffer is illustrated in Table B.12.1.

TABLE B.12.1

H.261 Dimension Buffer Sequence

| Clock | Input Pixel | Output Pixel | Clock | Input Pixel | Output Pixel |
|---|---|---|---|---|---|
| 1 | 0 | 55[a] | 17 | 16 | 7 |
| 2 | 1 | 56 | 18 | 17 | F (0, 8, 16) [b] |
| 3 | 2 | 57 | 19 | 18 | F (1, 9, 17) |
| 4 | 3 | 58 | 20 | 19 | F (2, 10, 16) |
| 5 | 4 | 59 | 21 | 20 | F (3, 11, 19) |
| 6 | 5 | 60 | 22 | 21 | F (4, 12, 20) |
| 7 | 6 | 61 | 23 | 22 | F (5, 13, 21) |
| 8 | 7 | 62 | 24 | 23 | F (6, 14, 22) |
| 9 | 8 | 63 | 25 | 24 | F (7, 15, 23) |
| 10 | 9 | 0 | 26 | 25 | F (8, 16, 24) |
| 11 | 10 | 1 | 27 | 26 | F (9, 17, 25) |
| 12 | 11 | 2 | 28 | 27 | F (10, 18, 26) |
| 13 | 12 | 3 | 29 | 28 | F (11, 19, 27) |
| 14 | 13 | 4 | 30 | 29 | F (12, 20, 28) |
| 15 | 14 | 5 | 31 | 30 | F (12, 20, 28) |
| 16 | 15 | 6 | 32 | 31 | F (14, 22, 30) |

[a] Least row of pixels from previous block or invalid data if there was no previous block (or if there was a long gap between blocks).
[b] F(x) indicates the function in H.261 filter equation.

B.12.3.1.2 MPEG Operation

During MPEG operation, a Prediction Filter performs a simple half pel interpolation:

$$F_i = \frac{x_i + x_{i+1}}{2} \quad (0 \leqq i \leqq 8, \text{half}pel)$$

$$F_i = x_i \ (0 \leqq i \leqq 7, \text{integer}pel)$$

This is the default filter operation unless the h261_on input is low. If the signal dim into a 1-D filter is low then integer pel interpolation will be performed. Accordingly, if h261_on is low and xdim and ydim are low, all pixels are passed straight through without filtering. It is an obvious requirement that when the dim signal into a 1-D filter is high, the rows (or columns) will be 8 pixels wide (or high). This is summarized in Table B.12.2. Referring to FIG. 148, "1-D Prediction Filter,", the

TABLE B.12.2

1-D Filter Operation

| h261_on | xdim | ydim | Function |
|---|---|---|---|
| 0 | 0 | 0 | $F_i = x_1$ |
| 0 | 0 | 1 | MPEG 8×9 block |
| 0 | 1 | 0 | MPEG 9×8 block |
| 0 | 1 | 1 | MPEG 9×9 block |
| 1 | 0 | 0 | H.261 Low-pass Filter |
| 1 | 0 | 1 | Illegal |
| 1 | 1 | 0 | Illegal |
| 1 | 1 | 1 | Illegal |

operation of the 1-D filter is the same for MPEG inter pel as it is for the first and last pixels in a row in H.261. For MPEG half-pel operation, register A is permanently reset and the output of register C is shifted left by 1 (the output of register B is always shifted left by 1 anyway). Thus, after a couple of clocks register F contains (2B+2C), four times the required result, but this is taken care of at the input of the Prediction Filters Adder, where the number, having passed through both x and y filters, is shifted right by 4.

The function of the Formatter and Dimension Buffer are also simpler in MPEG. The formatter must collect two valid pixels before passing them to the x-filter for half-pel interpolation; the Dimension Buffer only needs to buffer one row. It is worth noting that after data has passed through the x-filter, there can only ever be 8 pixels in a row, because the filtering operation converts 9-pixel rows into 8-pixel rows. "Lost" pixels are replaced by gaps in the data stream. When performing half-pel interpolation, the x-filter inserts a gap at the end of each row (after every 8 pixels); the y-filter inserts 8 gaps at the end of the block. This is significant because the group of 8 or 9 gaps at the end of a block align with DATA Token headers and other tokens between DATA Tokens in the stream coming out of the FIFO. This minimizes the worst-case throughput of the chip which occurs when 9×9 blocks are being filtered.

B.12.3.2 The Prediction Filters Adder

During MPEG operation, predictions may be formed using an earlier picture, a later picture, or the average of the two. Predictions formed from an earlier frame termed forward predictions and those formed from a later frame are called backward predictions. The function of the Prediction Filters Adder (pfadd) is to determine which filtered prediction values are being used (forward, backward or both) and either pass through the forward or backward filtered predictions or the average of the two (rounded towards positive infinity).

The prediction mode can only change between blocks, i.e., at power-up or after the fwd_1st_byte and/or bwd_1st_byte signals are active, indicating the last byte of the current prediction block. If the current block is a forward prediction then only fwd_1st_byte is examined. If it is a backward prediction then only bwd_1st_byte is examined. If it is a bidirectional prediction, then both fwd_1st_byte and bwd_1st_byte are examined.

The signals fwd_on and bwd_on determine which prediction values are used. At any time, either both or neither of these signals may be active. At start-up, or if there is a gap when no valid data is present at the inputs of the block, the block enters a state when neither signal is active.

Two criteria are used to determine the prediction mode for the next block: the signals fwd_ima_twin and bwd_ima_twin, which indicate whether a forward or backward block is part of a bidirectional prediction pair, and the buses fwd_p_num[1:0] and bwd_p_num[1:0]. These buses contain numbers which increment by one for each new prediction block or pair of prediction blocks. These blocks are necessary because, for example, if there are two forward prediction blocks followed by a bidirectional prediction block, the DRAM interface can fetch the backward block of the bidirectional prediction sufficiently far ahead so that it reaches the input of the Prediction Filters Adder before the second of the forward prediction blocks. Similarly, other sequences of backward and forward predictions can get out of sequence at the input of the Prediction Filters Adder. Thus, the next prediction mode is determined as follows:

1) If valid forward data is present and fwd_ima_twin is high, then the block stalls until valid backward data arrives with bwd_ima_twin set and then it goes through the blocks averaging each pair of prediction values.

2) If valid backward data is present and bwd_ima_twin is high, then the block stalls until valid forward data arrives with fwd_ima_twin set and then it proceeds as above. If forward and backward data are valid together, there is no stall.

3) If valid forward data is present, but fwd_ima_twin is not set, then fwd_p_num is examined. If this equals the number from the previous prediction plus one (stored in pred_num) then the prediction mode is set to forward.

4) If valid backward data is present but bwd_ima_twin is not set, then bwd_p_num is examined. If this equals the number from the previous prediction plus one (stored in pred_num) then the prediction mode is set to backward.

Note that "early_valid" signals from one stage back in the pipeline are used so that the Prediction Filters Adder mode can be set up before the first data from a new block arrives. This ensures that no stalls are introduced into the pipeline.

The ima_twin and pred_num signals are not passed along the forward and backward prediction filter pipelines with the filtered data. This is because:

1) These signals are only examined when fwd_1st_byte and/or bwd_1st_byte are valid. This saves about 25 three-bit pipeline stages in each prediction filter.

2) The signals remain valid throughout a block and, therefore, are valid at the time when fwd_1st_byte and/or bwd_1st_byte reach the Prediction Filters Adder.

3) The signals are examined a clock before data arrives anyway.

B.12.4 Prediction Adder and FIFO

The prediction adder (padder) forms the predicted frame by adding the data from the prediction filters to the error data. To compensate for the delay from the input through the address generator, DRAM interface and prediction filters, the error data passes through a 256 word FIFO (sfifo) before reaching padder.

The CODING_STANDARD, PREDICTION_MODE and DATA Tokens are decoded to determine when a predicted block is being formed. The 8-bit prediction data is added to the 9-bit two's complement error data in the DATA Token. The result is restricted to the range 0 to 255 and passes to the next block. Note that this data restriction also applies to all intra-coded data, including JPEG.

The prediction adder of the present invention also includes a mechanism to detect mismatches in the data arriving from the FIFO and the prediction filters. In theory, the amount of data from the filters should exactly correspond to the number of DATA Tokens from the FIFO which involve prediction. In the event of a serious malfunction, however, padder will attempt to recover.

The end of the data blocks from the FIFO and filters are marked, respectively, by the in_extn and fl_last inputs. Where the end of the filter data is detected before the end of the DATA Token, the remainder of the token continues to the output unchanged. If, on the other hand, the filter block is longer than the DATA Token, the input is stalled until all the extra filter data has been accepted and discarded.

There is no snooper in either the FIFO or the prediction adder, as the chip can be configured to pass data from the token input port directly to these blocks, and to pass their output directly to the token output port.

B.12.5 Write and Read Rudders

B.12.5.1 The Write Rudder (wrudder)

The Write Rudder passes all tokens coming from the Prediction Adder on to the Read Rudder. It also passes all data blocks in I or P pictures in MPEG, and all data blocks in H.261 to the DRAM interface so that they can be written back into the external frame stores under the control of the Address Generator. All the primary functionality is contained within one two-wire interface stage, although the write-back data passes through a snooper on its way to the DRAM interface.

The Write Rudder decodes the following tokens:

TABLE B.12.3

Tokens Decoded by the Write Rudder

| Token Name | Function in Write Rudder |
|---|---|
| CODING_STANDARD | Write-back is inhibited for JPEG streams. |
| PICTURE_TYPE | Write-back only occurs in I and P frames, not B frames. |
| DATA | Only the data within DATA tokens is written back. |

After the DATA Token header has been detected, all data bytes are output to the DRAM Interface. The end of the DATA Token is detected by in_extn going low and this causes a flush signal to be sent to the DRAM Interface swing buffer. In normal operation, this will align with the point when the swing buffer would swing anyway, but if the DATA Token does not contain 64 bytes of data this provides a recovery mechanism (although it is likely that the next few output pictures would be incorrect).

B.12.5.2 The Read Rudder (rrudder)

The Read Rudder of the present invention has three functions, the two major ones relating to picture sequence reordering in MPEG:

1) To insert data which has been read-back from the external frame store into the token stream at the correct places.
2) To reorder picture header information in I and P pictures.
3) To detect the end of a token stream by detecting the FLUSH token (see Section B.12.1, "Top Fork").

The structure of the Read Rudder is illustrated in FIG. 150. The entire block is made from standard two-wire interface technology. Tokens in the input interface latches are decoded and these decodes determine the operation of the block:

TABLE B.12.4

Tokens decoded by the Read Rudder

| Token Name | Function in Read Rudder |
|---|---|
| FLUSH | Signals to Top Fork. |
| CODING_STANDARD | Reordering is inhibited if the coding standard is not MPEG. |
| SEQUENCE_START | The read-back data for the first picture of a reordered sequence is invalid. |
| PICTURE_START | Signals that the current output FIFO must be swapped (I or P pictures). The first of the picture header tokens. |
| PICTURE_END | All tokens above the picture layer are allowed through |
| TEMPORTAL_REFERENCE | The second of the picture header tokens. |
| PICTURE_TYPE | The third of the picture header tokens. |
| DATA | When reordering the contents of DATA tokens are replaced with reordered data. |

The reorder function is turned on via the Microprocessor Interface, but is inhibited if the coding standard is not MPEG, regardless of the state of the register. The same MPI register controls whether the Address Generator generates a reorder address and thus, reorder is an output from this block. To understand how the Read Rudder works, consider the input and output control logic separately, bearing in mind that the sequence of tokens is as follows:

CODING_STANDARD
SEQUENCE_START
PICTURE_START
TEMPORAL_REFERENCE
PICTURE_TYPE
Picture containing DATA Tokens and other tokens
PICTURE_END
. . .
PICTURE_START
. . .

B.12.5.2.1 Input Control Logic

From the power-up, all tokens pass into FIFO 1 (called the current input FIFO) until the first PICTURE_TYPE token for an I or P picture is encountered. FIFO 2 then becomes the current input FIFO and all input is directed to it until the next PICTURE_TYPE for an I or P picture is encountered and FIFO 1 becomes the current input FIFO again. Within I and P pictures, all tokens between PICTURE_TYPE and PICTURE_END, except DATA Tokens, are discarded. This is to prevent motion vectors, etc. from being associated with the wrong pictures in the reordered stream, where they would have no meaning.

A three-bit code is put into the FIFO, along with the token stream, to indicate the presence of certain token headers. This saves having to perform token decoding on the output of the FIFOs.

B.12.5.2.2 Output Control Logic

From the power-up, tokens are accepted from FIFO 1 (called the current output FIFO) until a picture start code is encountered, after which FIFO 2 becomes the current output FIFO. Referring back to Section B.12.5.2.1, it can be seen that at this stage the three picture header tokens, PICTURE_START, TEMPORAL_REFERENCE and PICTURE_START are retained in FIFO 1. The current output FIFO is swapped every time a picture start code is encountered in an I or P frame. Accordingly, the three picture header tokens are stored until the next I or P frame, at which time they will become associated with the correctly reordered data. B pictures are not reordered and, hence, pass through without any tokens being discarded. All tokens in the first picture, including PICTURE_END are discarded.

During I and P pictures, the data contained in DATA Tokens in the token stream is replaced by reordered data from the DRAM Interface. During the first picture, "reordered" data is still present at the reordered data input because the Address Generator still requests the DRAM Interface to fetch it. This is considered garbage and is discarded.

SECTION B.13 The DRAM Interface

B.13.1 Overview

In the present invention, the Spatial Decoder, Temporal Decoder and Video Formatter each contain a DRAM Interface block for that particular chip. In all three devices, the function of the DRAM Interface is to transfer data from the chip to the external DRAM and from the external DRAM into the chip via block addresses supplied by an address generator.

The DRAM Interface typically operates from a clock which is asynchronous to both the address generator and to the clocks of the various blocks through which data is passed. This asynchronism is readily managed, however, because the clocks are operating at approximately the same frequency.

Data is usually transferred between the DRAM Interface and the rest of the chip in blocks of 64 bytes (the only exception being prediction data in the Temporal Decoder). Transfers take place by means of a device known as a "swing buffer". This is essentially a pair of RAMs operated in a double-buffered configuration, with the DRAM interface filling or emptying one RAM while another part of the chip empties or fills the other RAM. A separate bus which carries an address from an address generator is associated with each swing buffer.

Each of the chips has four swing buffers, but the function of these swing buffers is different in each case. In the Spatial Decoder, one swing buffer is used to transfer coded data to the DRAM, another to read coded data from the DRAM, the third to transfer tokenized data to the DRAM and the fourth to read tokenized data from the DRAM. In the Temporal Decoder, one swing buffer is used to write Intra or Predicted picture data to the DRAM, the second to read Intra or Predicted data from the DRAM and the other two to read Intra or Predicted data from the DRAM and the other two to read forward and backward prediction data. In the Video Formatter, one swing buffer is used to transfer data to the DRAM and the other three are used to read data from the DRAM, one of each of Luminance (Y) and the Red and Blue color difference data (Cr and Cb respectively).

The operation of the generic features of the DRAM Interface is described in the Spatial Decoder document. The following section describes the features peculiar to the Temporal Decoder.

B.13.2 The Temporal Decoder DRAM Interface

As mentioned in section B.13.1, the Temporal Decoder has four swing buffers: two are used to read and write decoded Intra and Predicted (I and P) picture data and these operate as described above. The other two are used to fetch prediction data.

In general, prediction data will be offset from the position of the block being processed as specified by motion vectors in x and y. Thus, the block of data to be fetched will not generally correspond to the block boundaries of the data as it was encoded (and written into the DRAM). This is illustrated in FIGS. 151 and 25, where the shaded area represents the block that is being formed. The dotted outline shows the block from which it is being predicted. The address generator converts the address specified by the motion vectors to a block offset (a whole number of blocks), as shown by the big arrow, and a pixel offset, as shown by the little arrow.

In the address generator, the frame pointer, base block address and vector offset are added to form the address of the block to be fetched from the DRAM. If the pixel offset is zero, only one request is generated. If there is an offset in either the x or y dimension, then two requests are generated—the original block address and the one either immediately to the right or immediately below. With an offset in both x and y, four requests are generated. For each block which is to be fetched, the address generator calculates start and stop addresses parameters and passes these to the DRAM interface. The use of these start and stop addresses is best illustrated by an example, as outlined below.

Consider a pixel offset of (1, 1), as illustrated by the shaded area in FIG. 152 and FIG. 26. The address generator makes four requests, labelled A through D in the figure. The problem to be solved is how to provide the required sequence of row addresses quickly. The solution is to use "start/stop" technology, and this is described below.

Consider block A in FIG. 152. Reading must start at position (1, 1) and end at position (7, 7). Assume for the moment that one byte is being read at a time (i.e. an 8 bit DRAM Interface). The x value in the coordinate pair forms the three LSBs of the address, the y value the three MSBs. The x and y start values are both 1, giving the address 9. Data is read from this address and the x value is incremented. The process is repeated until the x value reaches its stop value. At this point, the y value is incremented by 1 and the x start value is reloaded, giving an address of 17. As each byte of data is read, the x value is again incremented until it reaches its stop value. The process is repeated until both x and y values have reached their stop values. Thus, the address sequence of 9, 10, 11, 12, 13, 14, 15, 17, . . . , 23, 25, . . . , 31, 33, . . . , 57, . . . , 63 is generated.

In a similar manner, the start and stop coordinates for block B are: (1, 0) and (7, 0), for block C: (0,1) and (0,7), and for block D: (0, 0) and (0, 0).

The next issue is where this data should be written. Clearly, looking at block A, the data read from address 9 should be written to address 0 in the swing buffer, the data from address 10 to address 15 in the swing buffer, and so on. Similarly, the data read from address 8 in block B should be written to address 15 in the swing buffer and the data from address 16 into address 15 in the swing buffer. This function turns out to have a very simple implementation as outlined below.

Consider block A. At the start of reading, the swing buffer address register is loaded with the inverse of the stop value, the y inverse stop value forming the 3 MSBs and the x inverse stop value forming the 3 LSBs. In this case, while the DRAM Interface is reading address 9 in the external DRAM, the swing buffer address is zero. The swing buffer address register is then incremented as the external DRAM address register is incremented, as illustrated in Table B.13.1:

TABLE B.13.1

| Illustration of Prediction Addressing | | | |
|---|---|---|---|
| Ext DRAM Address | Swing Buff Address | Ext DRAM Ad. (Binary) | Swing Buff Ad. (Binary) |
| 9 = y−start, x−start | 0 = $\overline{\text{y−stop}}$, $\overline{\text{x−stop}}$ | 001 001 | 000 000 |
| 10 | 1 | 111 110 | 000 001 |
| 11 | 2 | 001 011 | 000 010 |
| 15 | 6 | 001 111 | 000 110 |
| 17 = y+1, x−start | 8 = y+1, $\overline{\text{x−stop}}$ | 010 001 | 001 000 |
| 18 | 9 | 010 010 | 001 001 |

The discussion thus far has centered on an 8 bit DRAM Interface. In the case of a 16 or 32 bit interface, a few minor modifications must be made. First, the pixel offset vector must be "clipped" so that it points to a 16 or 32 bit boundary. In the example we have been using, for block A, the first DRAM read will point to address 0, and data in addresses 0 through 3 will be read. Next, the unwanted data must be discarded. This is performed by writing all the data into the swing buffer (which must now be physically bigger than was necessary in the 8 bit case) and reading with an offset. When performing MPEG half-pel interpolation, 9 bytes in x and/or y must be read from the DRAM Interface. In this case, the address generator provides the appropriate start and stop addresses and some additional logic in the DRAM Interface is used, but there is no fundamental change in the way the DRAM Interface operates.

The final point to note about the Temporal Decoder DRAM Interface is that additional information must be provided to the prediction filters to indicate what processing is required on the data. This consists of the following:

a "last byte" signal indicating the last byte of a transfer (of 64, 72 or 81 bytes)

an H.261 flag a bidirectional prediction flag two bits to indicate the block's dimensions (8 or 9 bytes in x and y)

a two bit number to indicate the order of the blocks

The last byte flag can be generated as the data is read out of the swing buffer. The other signals are derived from the address generator and are piped through the DRAM Interface so that they are associated with the correct block of data as it is read out of the swing buffer by the prediction filter block.

SECTION B.14 UPI Documentation

B.14.1 Introduction

This document is intended to give the reader an appreciation of the operation of the microprocessor interface in accordance with the present invention. The interface is basically the same on both the SPATIAL DECODER and the Temporal Decoder, the only difference being the number of address lines.

The logic described here is purely the microprocessor internal logic. The relevant schematics are:

UPI

UPI101

UPI102

DINLOGIC

DINCELL

UPIN

TDET

NONOVRLP

WRTGEN

READGEN

VREFCKT

The circuits UPI, UPI101, UPI102 are all the same except that the UPI01 has a 7 bit address input with the 8th bit hardwired to ground, while the other two have an 8 bit address input.

Input/Output Signals

The signals described here are a list of all the inputs and outputs (defined with respect to the UPI) to the UPI module with a note detailing the source or destination of these signals:

NOTRSTInputGlobal chip reset, active low, from Pad Input Driver

E1InputEnable signal 1, active low, from the Pad Input Driver (Schmitt).

E2InputEnable signal 2, active low, from the Pad Input Driver (Schmitt).

RNOTWInputRead not Write signal from the Pad Input Driver (Schmitt).

ADDRIN[7:0]InputAddress bus signals from the Pad Input Drivers (Schmitt).

NOTDIN[7:0]InputInput data bus from the Input Pad Drivers of the Bi-directional Microprocessor Data pins (TTLin).

INT_RNOTWOutputThe Internal Read not Write signal to the internal circuitry being accessed by microprocessor interface (See memory map).

INT_ADDR[7:0]OutputThe Internal Address Bus to all the circuits being accessed by the microprocessor interface (See memory map).

INTDBUS[7:0]Input/OutputThe Internal Data bus to all the circuits being accessed by the microprocessor interface (See the memory map) and also the microprocessor data output pads. The internal Data bus transfers data which is the inverse to that on the pins of the chip.

READ_STROutputAn is an internal timing signal which indicates a read of a location in the device memory map.

WRITE_STROutputAn is an internal signal which indicates a write of a location in the internal memory map.

TRISTATEDPADOutputAn is an internal signal which connects to the microprocessor data output pads which indicates that they should be tristate.

General Comments

The UPI schematic consists of 6 smaller modules: NONOVRLP, UPIN, DINLOGIC, VREFCKT, READGEN, WRTGEN. It should be noted from the overall list of signals that there are no clock signals associated with the microprocessor interface other than the microprocessor bus timing signals which are asynchronous to all the other timing signals on the chip. Therefore, no timing relationship should be assumed between the operation of the microprocessor and the rest of the device other than those that can be forced by external control. For example, stopping of the System clock externally while accessing the microprocessor interface on a test system.

The other implication of not having a clock in the UPI is that some internal timing is self timed. That is, the delay of some signals is controlled internally to the UPI block.

The overall function of the UPI is to take the address, data and enable and read/write signals from the outside world and format them so that they can drive the internal circuits correctly. The internal signals that define access to the memory map are INT_RNOTW_INT_ADDR[. . . ], INTDBUS[. . . ] and READ_STR and WRITE_STR. The timing relationship of these signals is shown below for a read cycle and a write cycle. It should be noted that although the datasheet definition and the following diagram always shows a chip enable cycle, the circuit operation is such that the enable can be held low and the address can be cycled to do successive read or write operations. This function is possible because of the address transition circuits.

Also, the presence of the INT_RNOTW and the READ_STR, WRITE_STR does reflect some redundancy. It allows internal circuits to use either a separate READ_STR and WRITE_STR (and ignore INT_RNOTW) or to use the INT_RNOTW and a separate Strobe signal (Strobe signal being derived from OR of READ_STR and WRITE_STR).

The internal databus is precharged High during a read cycle and it also has resistive pullups so that for extended periods when the internal data bus is not driven it will default to the 0XFF condition. As the internal databus is the inverse of the data on the pins, this translates to 0×00 on the external pins, when they are enabled. This means that, if any external cycle accesses a register or a bit of a register which is a hole in the memory map, then the output data id determinate and is Low.

Circuit Details

UPIN

This circuit is the overall change detect block. It contains a sub-circuit called TDET which is a single bit change detect circuit. UPIN has a TDET module for each address bit and rnotw and for each enable signal. UPIN also contains some combinatorial logic to gate together the outputs of the change detect circuits. This gating generates the signals:

TRAN—which indicates a transition on one of the input signals, and

UPD-DONE—which indicates that transitions have been completed and a cycle can be performed.

CHIP_EN—which indicates that the chip has been selected.

TDET

This is the single bit change detect circuit. It consists of a 2 latches, and 2 exclusive OR gates. The first latch is clocked by the signal SAMPLE and the second by the signal UPDATE. These two non-overlapping signals come from the module NONOVRLP. The general operation is such that an input transition causes a CHANGE which, in turn, causes a SAMPLE. All input changes while SAMPLE is high are accepted and when input changes cease then CHANGE goes low and SAMPLE goes low which causes UPDATE to go high which then transfers data to the output latch and indicates UPD_DONE.

NONOVRLP

This circuit is basically a non-overlapping clock generator which inputs TRAN and generates SAMPLE and UPDATE. The external gating on the output of UPDATE stops UPDATE from going high until a write pulse has been completed.

DINLOGIC

This module consists of eight instances of the data input circuit DINCELL and some gating to drive the TRISTATEPAD signal. This indicates that the output data port will only drive if Enable1 is low, Enable2 is low, RnotW is high and the internal read_str is high.

DINCELL

This circuit consists of the data input latch and a tristate driver to drive the internal databus. Data from the input pad is latched when the signal DATAHOLD is high and when both Enable1 and Enable2 are low. The tristate driver drives the internal data bus whenever the internal signal INT_RNOTW is low. The internal databus precharge transistor and the bus pullup are also included in this module.

WRTGEN

This module generates the WRITE_STR, and the latch signal DATAHOLD for the data latches. The write strobe is a self timed signal, however, the self time delay is defined in the VREFCKT. The output from the timing circuit RESETWRITE is used to terminate the WRITE_STR signal. It should be noted that the actual write pulse which writes a register only occurs after an access cycle is concluded. This is because the data input to the chip is sampled only on the back edge of the cycle. Hence, data is only valid after a normal access cycle has concluded.

READGEN

This circuit, as its name suggests, generates the READ_STR and it also generates the PRECH signal which is used to precharge the internal databus. The PRECH signal is also a self timed signal whose period is dependant on VREFCKT and also on the voltage on the internal databus. The READ_STR is not self timed, but lasts from the end of the precharge period until the end of the cycle. The precharge circuitry uses inverters with their transfer characteristic biased so that they need a voltage of approximately 75% of supply before they invert. This circuit guarantees that the internal bus is correctly precharged before a READ_STR begins. In order to stop a PRECH pulse tending to zero width if the internal bus is already precharged, the timing circuit guarantees a minimum, width via the signal RESETREAD.

VREFCKT

The VREFCKT is the only circuit which controls the self timing of the interface. Both the delays, 1/Width of WRITE_STR and 2/Width of PRECH, are controlled by a current through a P transistor. The gate on this P transistor is controlled by a signal VREF and this voltage is set by a diffusion resistor of 25K ohm.

SECTION C.1 Overview

C.1.1. Introduction

The structure of the image Formatter, in accordance with the present invention, is shown in FIG. 155. There are two address generators, one for writing and one for reading, a buffer manager which supervises the two address generators and which provides frame-rate conversion, a data processing pipeline, including both vertical and horizontal unsamplers, color-space conversion And gamma correction, and a final control block which regulates the output of the processing pipeline.

C.1.2 Buffer Manager

Tokens arriving at the input to the Image Formatter are buffered in the FIFO and then transferred into the buffer manager. This block detects the arrival of new pictures and determines the availability of a buffer in which to store each picture. If there is a buffer available, it is allocated to the arriving picture and its index is transferred to the write address generator. If there is no buffer available, the incoming picture will be stalled until one becomes available. All tokens are passed on to the write address generator.

Each time the read address generator receives a VSYNC signal from the display system, a request is made to the buffer manager for a new display buffer index. If there is a buffer containing complete picture data, and that picture is deemed ready for display, then that buffer's index will be passed to the display address generator. If not, the buffer manager sends the index of the last buffer to be displayed. At start-up, zero is passed as the index until the first buffer is full.

A picture is ready for display if its number (calculated as each picture is input) is greater than or equal to the picture number which is expected at the display (presentation number) given the encoding frame rate. The expected number is determined by counting picture clock pulses, where picture clock can be generated either locally by the clock dividers, or externally. This technology allows frame-rate conversion (e.g., 2–3 pull-down).

External DRAM is used for the buffers, which can be either two or three in number. Three are necessary if frame-rate conversion is to be effected.

C.1.3 Write Address Generator

The write address generator receives tokens from the buffer manager and detects the arrival of each new DATA Token. As each DATA Token arrives, the address generator calculates a new address for the DRAM interface for storing the arriving block. The raw data is then passed to the DRAM interface where it is written into a swing buffer. Note that DRAM addresses are block addresses, and pictures in the DRAM or organized as rasters of blocks. Incoming picture data, however, is actually organized sequences of macroblocks, so the address generation algorithm must take into account line-width (in blocks) offsets for the lower rows of blocks within the macroblock.

The arrival buffer index provided by the buffer manager is used as an address offset for the whole of the picture being stored. Furthermore, each component is stored in a separate area within the specified buffer, so component offsets are also used in the calculation.

C.1.4 Read Address Generator

The Read Address Generator (dispaddr) does not receive or generate tokens, it generates addresses only. In response to a VSYNC, it may, depending on field_info, read_start, sync_mode, and lsb_invert, request a buffer index from the buffer manager. Having received an index, it generates three sets of addresses, one for each component, for the current picture to be read in raster order. Different setups allow for: interlaced/progressive display and/or data, vertical unsampling, and field synchronization (to an interlaced display). At the lower level, the Read Address Generator converts base addresses into a sequence of block addresses and byte counts for each of the three components that are compatible with the page structure of the DRAM. The addresses provided to the DRAM interface are page and line addresses along with block start and block end counts.

C.1.5 Output Pipeline

Data from the DRAM interface feeds the output pipeline. The three component streams are first vertically interpolated, then horizontally interpolated. Following the interpolators, the three components should be of equal ratios (4:4:4), and are passed through the color-space converter and color lookup tables/gamma correction. The output interface may hold the streams at this point until the display has reached an HSYSC. Thereafter, output controller directs the three components into one, two or three 8-bit buses, multiplexing as necessary.

C.1.6 Timing Regimes

There are basically two principal timing regimes associated with the Image Formatter. First, there is a system clock, which provides timing for the front end of the chip (address generators and buffer manager, plus the front end of the DRAM interface). Second, there is a pixel clock which drives all the timing for the back end (DRAM interface output, and the whole of the output pipeline).

Each of the two aforementioned clocks drives a number of on-chip clock generators. The FIFO, buffer manager and read address generator operate from the same clock (DΦ) with the write address generator using a similar, but separate clock (WΦ). Data is clocked into the DRAM interface on an internal DRAM interface clock, (outΦ). DΦ, WΦ and outΦ are all generated from syscik.

Read and write addresses are clocked in the DRAM interface by the DRAM interface's own clock.

Data is read out of the DRAM interface on bifRΦ, and is transferred to the section of the output pipeline named "bushy_ne" (north-east—by virtue of its physical location) which operates on clocks denoted by NEΦ. The section of the pipeline from the gamma RAMs onward is clocked on a separate, but similar, clock (RΦ). bifRΦ, NEΦ and RΦ are all derived from the pixel clock, pixin.

For testing, all of the major interfaces between blocks have either snoopers or super-snoopers attached. This depends on the timing regimes and the type of access required. Block boundaries between separate, but similar timing regimes have retiming latches associated therewith.

SECTION C.2 Buffer Management

C.2.1. Introduction

The purpose of the buffer management block, in accordance with the present invention, is to supply the address generators with indices identifying any of either two or three external buffers for writing and reading of picture data. The allocation of these indices is influenced by three principal factors, each representing the effect of one of the timing regimes in operation. These are the rate at which picture data arrives at the input to Image Formatter (coded data rate), the rate at which data is displayed (display data rate), and the frame rate of the encoded video sequence (presentation rate).

C.2.2 Functional Overview

A three-buffer system allows the presentation rate and the display rate to differ (e.g., 2–3 pulldown), so that frames are either repeated or skipped as necessary to achieve the best possible sequence of frames given the timing constraints of the system. Pictures which present some difficulty in decoding may also be accommodated in a similar way, so that if a picture takes longer than the available display time to decode, the previous frame will be repeated while everything else "catches up". In a two-buffer system, the three timing regimes must be locked—it is the third buffer which provides the flexibility for taking up the slack.

The buffer manager operates by maintaining certain status information associated with each external buffer. This includes flags indicating if the buffer is in use, if it is full of data, or ready for display, and the picture number within the sequence of the picture currently stored in the buffer. The presentation number is also recorded, this being a number which increments every time a picture clock pulse is received, and represents the picture number which is currently expected for display based on the frame rate of the encoded sequence.

An arrival buffer (a buffer to which incoming data will be written) is allocated every time a PICTURE_START token is detected at the input. This buffer is then flagged as IN_USE. On PICTURE_END, the arrival buffer will be deallocated (reset to zero) and the buffer flagged as either FULL or READY depending on the relationship between the picture number and the presentation number.

The display address generator requests a new display buffer, once every vsync, via a two-wire interface. If there is a buffer flagged as READY, then that will be allocated to display by the buffer manager. If there is no READY buffer, the previously displayed buffer will be repeated.

Each time the presentation number changes, it is detected and every buffer containing a complete picture is tested for READY-ness by examining the relationship between its picture number and the presentation number. Buffers are considered in turn. When any of the buffers are deemed to be READY, this automatically cancels the READY-ness of any buffer which was previously flagged as READY. The previous buffer is then flagged as EMPTY. This works because later picture numbers are stored, by virtue of the allocation scheme, in the buffers that are considered later.

TEMPORAL_REFERENCE tokens in H.261 cause a buffer's picture number to be modified if skipped pictures in the input stream are indicated. This feature, although envisioned, is not currently included, however. Similarly, TEMPORAL-REFERENCE tokens in MPEG have no effect.

A FLUSH token causes the input to stall until every buffer is either EMPTY or has been allocated as the display buffer. Thereafter, presentation number and picture number are reset and a new sequence can commence.

C.2.3 Architecture

C.2.3.1 Interfaces

C.2.3.1.1. Interface to bm front

All data is input to the buffer manager from the input FIFO, bm_front. This transfer takes place via a two-wire interface, the data being 8 bits wide plus an extension bit. All data arriving at the buffer manager is guaranteed to be a complete token. This is a necessity for the continued processing of presentation numbers and display buffer requests in the event of significant gaps in the data upstream.

C.2.3.1.2 Interface to waddrgen Tokens (8 bit data, 1 bit extension) are transferred to the write address generator via a two-wire interface. The arrival buffer index is also transferred on the same interface, so that the correct index is available for address generation at the same time as the PICTURE_START token arrives at waddrgen.

C.2.3.1.3 Interface to dispaddr

The interface to the read address generator comprises two separate two-wire interfaces which can be considered to act as "request" and "acknowledge" signals, respectively. Single wires are not adequate, however, because of the two two-wire-based state machines at either end.

The sequence of events normally associated with the dispaddr interface is as follows. First, dis-paddr invokes a request in response to a vsync from the display device by asserting the drq_valid input to the buffer manager. Next, when the buffer manager reaches an appropriate point in its state machine, it will accept the request and go about allocating a buffer to be displayed. Thereafter, the disp_valid wire is asserted, the buffer index is transferred, and this is typically accepted immediately by dispaddr. Furthermore, there is an additional wire associated with this last two-wire interface (rst_fld) which indicates that the field number associated with the current index must be reset regardless of the previous field number.

C.2.3.1.4 Microprocessor Interface

The buffer manager block uses four bits of microprocessor address space, together with the 8-bit data bus and read and write strobes. There are two select signals, one indicating user-accessible locations and the other indicating test locations which should not require access under normal operating conditions.

C.2.3.1.5 Events

The buffer manager is capable of producing two different events, index found and late arrival. The first of these is asserted when a picture arrives and its PICTURE_START extension byte (picture index) matches the value written into the BU_BM TARGET_IX register at setup. The second event occurs when a display buffer is allocated and its picture number is less than the current presentation number, i.e., the processing in the system pipeline up to the buffer manager has not managed to keep up with the presentation requirements.

C.2.3.1.6 Picture Clock

In the present invention, picture clock is the clock signal for the presentation number counter and is either generated on-chip or taken from an external source (normally the display system). The buffer manager accepts both of these signals and selects one based on the value of pclk_ext (a bit in the buffer manager's control register). This signal also acts as the enable for the pad picoutpad, so that if the Image Formatter is generating its own picture clock, this signal is also available as an output from the chip.

C.2.3.2. Major Blocks

The following sections describe the various hardware blocks that make up the buffer manager schematic (bmlogic).

C.2.3.2.1 Input/Output Block (bm input)

This module contains all of the hardware associated with the four two-wire interfaces of the buffer manager (input and output data, drq_valid/accept and disp_valid/accept). The input data register is shown, together with some token decoding hardware attached thereto. The signal vheader at the input to bm_tokdec is used to ensure that the token decoder outputs can only be asserted at a point where a header would be valid (i.e., not in the middle of a token. The rtimd block acts as the output data registers, adjacent to the duplicate input data registers for the next block in the pipeline. This accounts for timing differences due to different clock generators. Signals go and ngo are based on the AND of data valid, accept and not stopped, and are used elsewhere in the state machine to indicate if things are "bunged up" at either the input or the output.

The display index part of this module comprises the two-wire interfaces together with equivalent "go" signals as for data. The rst_fld bit also happens here, this being a signal which, if set, remains high until disp_valid has been high for one cycle. Thereafter, it is reset. In addition, rst_fld is reset after a FLUSH token has caused all of the external buffers to be flagged either as EMPTY or IN_USE by the display buffer. This is the same point at which both picture numbers and presentation number are reset.

There is a small amount of additional circuitry associated with the input data register which appears at the next level up the hierarchy. This circuitry produces a signal which indicates that the input data register contains a value equal to that written into BU_BM_TARGIX and it is used for event generation.

C.2.3.2.2 Index Block (bm index)

The Index block consists mainly of the 2-bit registers denoting the various strategic buffer indices. These are arr_buf, the buffer to which arriving picture data is being written, disp_buf, the buffer from which picture data is being read for display, and rdy_buf, the index of the buffer containing the most up to date picture which could be displayed if a buffer was requested by dispaddr. There is also a register containing buf_ix, which is used as a general pointer to a buffer. This register gets incremented ("D" input to mux) to cycle through the buffers examining their status, or which gets assigned the value of one of arr_buf, disp_ buf or rdy_buf when the status needs changing. All of these registers (ph0 versions) are accessible from the microprocessor as part of the test address space. Old_ix is just a re-timed version of buf_ix and is used for enabling buffer status and picture number registers in the bm_stus block. Both buf_ix and old_ix are decoded into three signals (each can hold the value 1 to 3) which are output from this block. Other outputs indicate whether buf_ix has the same value as either arr_buf or disp_buf, and whether either of rdy_buf and disp_buf have the value zero. Zero is not a reference to a buffer. It merely indicates that there is no arrival/display/ready buffer currently allocated.

Arr_buf and disp_buf are enabled by their respective two-wire interface output accept registers.

Additional circuitry at the bmlogic level is used to determine if the current buffer index (buf_ix) is equal to the maximum index in use as defined by the value written into the control register at setup. A "1" in the control register indicates a three-buffer system, and a "0" indicates a two-buffer system.

C.2.3.2.3 Buffer Status

The main components in the buffer status are status and picture number registers for each buffer. Each of the groups of three is a master-slave arrangement where the slaves are the banks of three registers, and the master is a single register whose output is directed to one of the slaves (switched, using register enables, by old_ix). One of the possible inputs to the master is multiplexed between the different slave outputs (indexed by buf_ix at the bmlogic level). Buffer status, which is decoded at the bmlogic level, for use in the state machine logic can take any of the values shown in Table C.2.1, or recirculate its previous value. Picture number can take the previous value or the previous value incremented by one (or one plus delta, the difference between actual and expected temporal reference, in the case of H.261). This value is supplied by the 8-bit adder present in the block. The first input to this adder is this_pnum, the picture number of the data currently being written.

TABLE C.2.1

Buffer Status Values

| Buffer Status | Value |
|---|---|
| EMPTY | 00 |
| FULL | 01 |
| READY | 10 |
| IN_USE | 11 |

This needs to be stored separately (in its own master-slave arrangement) so that any of the three buffer picture number registers can be easily updated based on the current (or previous) picture number rather than on their own previous picture number (which is almost always out of date). This_pnum is reset to −1 so that when the first picture arrives it is added to the output from the adder and, hence, the input to the first buffer picture number register, is zero.

Note that in the current version, delta is connected to zero because of the absence of the temporal reference block which should supply the value.

C.2.3.2.4 Presentation Number

The 8-bit presentation number register has an associated presentation flag which is used in the state machine to indicate that the presentation number has changed since it was last examined. This is necessary because the pictures clock is essentially asynchronous and may be active during any state, not just those which are concerned with the presentation number. The rest of the circuitry in this block is concerned with detecting that a picture clock pulse has occurred and "remembering" this fact. In this way, the presentation number can be updated at a time when it is valid to do so. A representative sequence of events; is shown in FIG. 156. The signal incr_prn goes active the cycle after the re-timed picture clock rising edge, and persists until a state is entered during which presentation number can be modified. This is indicated by the signal en_prnum. The reason for only allowing presentation number to be updated during certain states is because it is used to drive a significant amount of logic, including a standard-cell, not-very-fast 8-bit adder to provide the signal rdyst. It must, therefore, be changed only during states in which the subsequent state does not use the result.

C.2.3.2.5 Temporal Reference

The temporal reference block in accordance with the present invention, has been omitted from the current embodiment of the Image Formatter, but its operation is described here for completeness.

The function of this block is to calculate delta, the difference between the temporal reference value received in a token in an H.261 data stream, and the "expected" temporal reference (one plus the previous value). This allows frames to be skipped in H.261. Temporal reference tokens are ignored in all non-H.261 streams. The calculated value is used in the status block to calculate picture numbers for the buffers. The effect of omitting the block from bmlogic is that picture numbers will always be sequential in any sequence, even if the H.261 stream indicates that some should be skipped.

The main components of the block (visible in the schematic bm_tref) are registers for tr, exptr and delta. In the invention, tr is reset to zero and loaded, when appropriate, from the input data register. Similarly, exptr is reset to −1, and is incremented by either 1 or delta during the sequence of temporal reference states. In addition, delta is reset to zero and is loaded with the difference between the other two registers. All three registers are reset after a FLUSH token. The adder in this block is used for calculation of both delta and exptr, i.e., a subtract and an add operation, respectively, and is controlled by the signal delta_calc.

C.2.3.2.6 Control Registers (bm uregs)

Control registers for the buffer manager reside in the block bm_uregs. These are the access bit register, setup register (defining the maximum number of external buffers, and internal/external picture clock), and the target index register. The access bit is synchronized as expected. The signals stopd_0, stopd_1 and nstopd_1 are derived form the OR of the access bit and the two event stop bits. Upi address decoding for all of bmlogic is done by the block bm_udec, which takes the lower 4 bits of the upi data bus together with the 2 select signals from the Image Formatter top-level address decode.

C.2.3.2.7 Controlling State Machine

The state machine logic originally occupied its own block, bm_state. For code generation reasons, however, it has now been flattened and resides on sheet 2 of the bmlogic schematic.

The main sections of this logic are the same. This includes the decoding, the generation of logic signals for the control of other bmlogic blocks, and the new state encoding, including the flags from_ps and from_fl which are used to select routes through the state machine. There are separate blocks to produce the mux control signals for bm_stus and bm_index.

Signals in the state machine hardware have been given simple alphabetic names for ease of typing and reference.

They are all listed in Table C.2.2, together with the logic expressions which they represent. They also appear as comments in the behavioral M. description of bmlogic (bmlogic.M).

TABLE C.2.2

Signal Names Used in the State Machine

| Signal Name | Logic Expression |
|---|---|
| A | ST_PRES1.presflg.(bstate==FULL).rdytst.(rdy==0).(ix==max) |
| B | ST_PRES1.presflg.(bstate==FULL).rdytst.(rdy==0).(ix!=max) |
| C | ST_PRES1.presflg.(bstate==FULL).rdytst.(rdy!=0) |
| D | ST_PRES1.presflg.!((bstate==FULL).rdytst).(ix==max) |
| E | ST_PRES1.presflg.!((bstate==FULL).rdytst).(ix!=max) |
| F | ST_PRES1.presflg |
| G | ST_DRQ.drq_valid.disp_acc.(rdy==0).(disp!=0) |
| PP | ST_DRQ.drq_valid.disp_acc.(rdy==0).(disp!=0).fromps |
| QQ | ST_DRQ.drq_valid.disp_acc.(rdy==0).(disp!=0).fromfl |
| RR | ST_DRQ.drq_valid.disp_acc.(rdy==0).(disp!=0).!(fromps+fromfl) |
| H | ST_DRQ.drq_valid.disp_acc.(rdy!=0).(disp!=0) |
| I | ST_DRQ.drq_valid.disp_acc.(rdy!=0).(disp==0) |
| J | ST_DRQ.drq_valid.disp_acc.(rdy==0).(disp==0).fromps |
| NN | ST_DRQ.drq_valid.disp_acc.(rdy==0).(disp==0).fromfl |
| OO | ST_DRQ.drq_valid.disp_acc.(rdy==0).(disp==0).!(fromps+fromfl) |
| K | ST_DRQ.!(drq_valid.disp_acc).fromps |
| LL | ST_DRQ.!(drq_valid.disp_acc).fromfl |
| MM | ST_DRQ.!(drq_valid.disp_acc).!(fromps+fromfl) |
| L | ST_TOKEN.ivr.oar.(idr==TEMPORAL_REFERENCE) |
| SS | ST_TOKEN.ivr.oar.(idr==TEMPORAL_REFERENCE).H261 |
| TT | ST_TOKEN.ivr.oar.(idr==TEMPORAL_REFERENCE).!H261 |
| M | ST_TOKEN.ivr.oar.(idr==FLUSH) |
| N | ST_TOKEN.ivr.oar.(idr==PICTURE_START) |
| O | ST_TOKEN.ivr.oar.(idr==PICTURE_END) |
| P | ST_TOKEN.ivr.oar.(idr==<OTHER_TOKEN>) |
| JJ | ST_TOKEN.ivr.oar.(idr==<OTHER_TOKEN>).in_extn |
| KK | ST_TOKEN.ivr.oar.(idr==<OTHER_TOKEN>).!in_extn |
| Q | ST_TOKEN.!(ivr.oar) |
| S | ST_PICTURE_END.(ix==arr).!rdytst.oar |
| T | ST_PICTURE_END.(ix==arr).rdytst.(rdy==0).oar |
| U | ST_PICTURE_END.(ix==arr).rdytst.(rdy!=0).oar |
| VV | ST_PICTURE_END.!oar |
| RorVV | ST_PICTURE_END.!((ix==arr).oar) |
| V | ST_TEMP_REF0.ivr.oar |
| W | ST_TEMP_REF0.!(ivr.oar) |
| X | ST_OUTPUT_TAIL.ivr.oar |
| FF | ST_OUTPUT_TAIL.ivr.oar.!in_extn |
| Y | ST_OUTPUT_TAIL.!(ivr.oar) |
| GG | ST_OUTPUT_TAIL.!(ivr.oar).in_extn |
| DD | ST_FLUSH.(ix==max).((bstate==VAC)+((bstate==USE).(ix==disp)) |
| Z | ST_FLUSH.(ix!=max).((bstate==VAC)+((bstate==USE).(ix==disp)) |
| DDorEE | !((bstate==VAC)+((bstate==USE).(ix==disp))+(ix==max) |
| AA | ST_ALLOC.(bstate==VAC).oar |
| BB | ST_ALLOC.(bstate!=VAC).(ix==max) |
| CC | ST_ALLOC.(bstate!=VAC).(ix!=max) |
| UU | ST_ALLOC.!oar |

C.2.3.2.8 Monitoring Operation (bminfo)

In the present invention, the module, bminfo, is included so that buffer status information, index values and presentation number can be observed during simulations. It is written in M and produces an output each time one of its inputs changes.

C.2.3.3 Register Address Map

The buffer manager's address space is split into two areas, user-accessible and test. There are, therefore, two separate enable wires derived from range decodes at the top-level. Table C.2.3 shows the user-accessible registers, and Table C.2.4 shows the contents of the test space.

TABLE C.2.3

User-Accessible Registers

| Register Name | Address | Bits | Reset State | Function |
|---|---|---|---|---|
| BU_BM_ACCESS | 0x10 | [0] | 1 | Access bit for buffer manager |
| BU_BM_CTL0 | 0x11 | [0] | 1 | Max buf isb: 1→3 buffers.0→2 |
| | | [1] | 1 | External picture clock select |
| BU_BM_TARGET_IX | 0x12 | [3:0] | 0x0 | For detecting arrival of picture |
| BU_BM_PRES_NUM | 0x13 | [7:0] | 0x00 | Presentation number |
| BU_BM_THIS_PNUM | 0x14 | [7:0] | 0xFF | Current picture number |
| BU_BM_PIC_NUM0 | 0x15 | [7:0] | none | Picture number in |

TABLE C.2.3-continued

User-Accessible Registers

| Register Name | Address | Bits | Reset State | Function |
|---|---|---|---|---|
| | | | | buffer 1 |
| BU_BM_PIC_NUM1 | 0x16 | [7:0] | none | Picture number in buffer 2 |
| BU_BM_PIC_NUM2 | 0x17 | [7:0] | none | Picture number in buffer 3 |
| BU_BM_TEMP_REF | 0x18 | [4:0] | 0x00 | Temporal reference from stream |

TABLE C.2.4

Test Registers

| Register Name | Address | Bits | Reset State | Function |
|---|---|---|---|---|
| BU_BM_PRES_FLAG | 0x80 | [0] | 0 | Presentation flag |
| BU_BM_EXP_TR | 0x81 | [4:0] | 0xFF | Expected temporal reference |
| BU_BM_TR_DELTA | 0x82 | [4:0] | 0x00 | Delta |
| BU_BM_ARR_IX | 0x83 | [1:0] | 0x0 | Arrival buffer index |
| BU_BM_DSP_IX | 0x84 | [1:0] | 0x0 | Display buffer index |
| BU_BM_RDY_IX | 0x85 | [1:0] | 0x0 | Ready buffer index |
| BU_BM_BSTATE3 | 0x86 | [1:0] | 0x0 | Buffer 3 status |
| BU_BM_BSTATE2 | 0x87 | [1:0] | 0x0 | Buffer 2 status |
| BU_BM_BSTATE1 | 0x88 | [1:0] | 0x0 | Buffer 1 status |
| BU_BM_INDEX | 0x89 | [1:0] | 0x0 | Current buffer index |
| BU_BM_STATE | 0x8A | [4:0] | 0x00 | Buffer manager state |
| BU_BM_FROMPS | 0x8B | [0] | 0x0 | From PICTURE_START flag |
| BU_BM_FROMFL | 0x8C | [0] | 0x0 | From FLUSH_TOKEN flag |

C.2.4 Operation of The State Machine

There are 19 states in the buffer manager's state machine, as detailed in Table C.2.5. These interact as, shown in FIG. 157, and also as described in the behavioral description bmloqic.M.

TABLE C.2.5

Buffer States

| State | Value |
|---|---|
| PRES0 | 0×00 |
| PRES1 | 0×10 |
| ERROR | 0×1F |
| TEMP_REF0 | 0×04 |
| TEMP_REF1 | 0×05 |
| TEMP_REF2 | 0×06 |
| TEMP_REF3 | 0×07 |
| ALLOC | 0×03 |
| NEW_EXP_TR | 0×0D |
| SET_ARR_IX | 0×0E |
| NEW_PIC_NUM | 0×0F |
| FLUSH | 0×01 |
| DRQ | 0×0B |
| TOKEN | 0×0C |
| OUTPUT_TAIL | 0×08 |
| VACATE_RDY | 0×17 |
| USE_RDY | 0×0A |
| VACATE_DISP | 0×09 |
| PICTURE_END | 0×02 |

C.2.4.1 The Reset State

The reset state is PRESO, with flags set to zero such that the main loop circulated initially.

C.2.4.2 The Main Loop

The main loop of the state machine comprises the states shown in FIG. 153 (high-lighted in the main diagram FIG. 152). States PRES0 and PRES1 are concerned with detecting a picture clock via the signal presflg. Two cycles are allowed for the tests involved since they all depend on the value of rdyst, the adder output signal described in C.2.3.2.4. If a presentation flag is detected, all of the buffers are examined for possible 'readiness', otherwise the state machine just advances to state DRQ. Each cycle around the PRES0-PRES1 loop examines a different buffer, checking for full and ready conditions. If these are met, the previous ready buffer (if one exists) is cleared, the new ready buffer is allocated and its status is updated. This process is repeated until all buffers have been examined (index==max buf) and the state then advances. A buffer is deemed to be ready for display when any of the following is true:

$$(pic\_num>pres\_num)\&\&((pic\_num-pres_{13}\ num)\geqq 128)$$

or $$(pic\_num<pres\_num)\&\&((pres\_num-pic\_num)\leqq 128)$$

or pic_num==presnum

State DRQ checks for a request for a display buffer (drq_valid_reg && disp_acc_reg). If there is no request the state advances (normally to state TOKEN—as will be described later). Otherwise, a display buffer index is issued as follows. If there is no ready buffer, the previous index is re-issued or, if there is no previous display buffer, a null index (zero) is issued. If a buffer is ready for display, its index is issued and its state is updated. If necessary, the previous display buffer is cleared. The state machine then advances as before.

State TOKEN is the typical option for completing the main loop. If there is valid input and the output is not stalled, tokens are examined for strategic values (described in later sections), otherwise control returns to state PRES0.

Control only diverges from the main loop when certain conditions are met. These are described in the following sections.

C.2.4.3 Allocating The Ready Buffer Index

If during the PRES0-PRES1 loop a buffer is determined to be ready, any previous ready buffer needs to be vacated because only one buffer can be designated ready at any time. State VACATE_RDY clears the old ready buffer by setting its state to VACANT, and it resets the buffer index to 1 so that when control returns to the PRES0 state, all buffers will be tested for readiness. The reason for this is that the index is by now pointing at the previous ready buffer (for the purpose of clearing it) and there is no record of our intended new ready buffer index. It is necessary, therefore, to re-test all of the buffers.

C.2.4.4 Allocating The Display Buffer Index

Allocation of the display buffer index takes place either directly from state DRQ (state USE_RDY) or via state VACATE_DISP which clears the old display buffer state. The chosen display buffer is flagged as IN_USE, the value of rdy_buf is set to zero, and the index is reset to 1 to return to state DRQ. Moreover, disp_buf is given the required index and the two-wire interface wires (disp_valid and drq_acc) are controlled accordingly. Control returns to state DRQ only so that the decision between states TOKEN, FLUSH and ALLOC does not need to be made in state USE_RDY.

C.2.4.5 Operation when PICTURE_END Received

On receipt of a PICTURE_END token, control transfers from state TOKEN to state PICTURE_END where, if the index is not already pointing at the current arrival buffer, it is set to point there so that its status can be updated. Assuming both out_acc_reg and en_full are true, status can be updated as described below. If not, control remains in state PICTURE_END until they are both true. The en_full signal is supplied by the write address generator to indicate that the swing buffer has swung, i.e., the last block has been successfully written and it is, therefore, safe to update the buffer status.

The just-completed buffer is tested for readiness and given the status either FULL or READY depending on the result of the test. If it is ready, rdy_buf is given the value of its index and the set_la_ev signal (late arrival event) is set high (indicating that the expected display has got ahead in time of the decoding). The new value of arr_buf now becomes zero and, if the previous ready buffer needs its status clearing, the index is set to point there and control moves to state VACATE_RDY. Otherwise, the index is reset to 1 and control returns to the start of the main loop.

C.2.4.6 Operation When PICTURE_START Received (Allocation of Arrival Buffer)

When a PICTURE_START token arrives during state TOKEN, the flag from_ps is set, causing the basic state machine loop to be changed such that state ALLOC is visited instead of state TOKEN. State ALLOC is concerned with allocating an arrival buffer (into which the arriving picture data can be written), and cycles through the buffers until it finds one whose status is VACANT. A buffer will only be allocated if out_acc_reg is high since it is output on the data two-wire interface. Accordingly, cycling around the loop will continue until this is indeed the case. Once a suitable arrival buffer has been found, the index is allocated to arr_buf and its status is flagged as IN_USE. Index is set to 1, the flag from_ps is reset, and the state is set to advance to NEW_EXP_TR. A check is made on the picture's index (contained in the word following the PICTURE_START) to determine if it is the same as targ_ix (the target index specified at setup) and, if so, set_if+_ev (index found event) is set high.

The three states NEW_EXP_TR, SET_ARR_IX and NEW_PIC_NUM set up the new expected temporal reference and picture number for the incoming data. The middle state just sets the index to be arr_buf so that the correct picture number register is updated (note that this_pnum is also updated). Control then proceeds to state OUTPUT_TAIL which outputs data (assuming favorable two-wire interface signals) until a low extension is encountered. At this point, the main loop is re-started. This means that whole data blocks (64 items) are output, in between which, there are no tests for presentation flags or display requests.

C.2.4.7 Operation When FLUSH Received

A FLUSH token in the data stream indicates that sequence information (presentation number, picture number, rst_fld) should be reset. This can only occur when all of the data leading up to the FLUSH has been correctly processed. Accordingly, it is necessary, having received a FLUSH, to monitor the status of all of the buffers until it is certain that all frames have been handed over to the display, i.e., all but one of the buffers have status EMPTY, and the other is IN_USE (as the display buffer). At that point, a "new sequence" can safely be used.

When a FLUSH token is detected in state TOKEN, the flag from_fl is set, causing the basic state machine loop to be changed such that state FLUSH is visited instead of state TOKEN. State FLUSH examines the status of each buffer in turn, waiting for it to become VACANT or IN_USE as display. The state machine simply cycles around the loop until the condition is true, then increments its index and repeats the process until all of the buffers have been visited. When the last buffer fulfills the condition, presentation number, picture number, and all of the temporal reference registers assume their reset values rst_fld is set to 1. The flag from_fl is reset and the normal main loop operation is resumed.

C.2.4.8 Operation When TEMPORAL_REFERENCE Received

When a TEMPORAL_REFERENCE token is encountered, a check is made on the H.261 bit and, if set, the four states TEMP_REF0 to TEMP_REF3 are visited. These perform the following operations:

TEMP_REF0:temp_ref=in_data_reg;

TEMP_REF1:delta=temp_ref−exp_tr;index=arr_buf;

TEMP_REF2:exp_tr=delta+exp_tr;

TEMP_REF3:pic_num[i]=this_pnum+delta;index=1.

C.2.4.9 Other Tokens and Tails

State TOKEN passes control to state OUTPUT_TAIL in all cases other than those outlined above. Control remains here until the last word of the token is encountered (in_extn_reg is low) and the main loop is then re-entered.

C.2.5 Applications Notes

C.2.5.1 State Machine Stalling Buffer Manager Input

This requirement repeatedly check for the "asynchronous" timing events of picture clock and display buffer request. The necessity of having the buffer manager input stalled during these checks means that when there is a continuous supply of data at the input to the buffer manager, there will be a restriction on the data rate through the buffer manager. A typical sequence of states may be PRES0, PRES1, DRQ, TOKEN, OUTPUT_TAIL, each, with the exception of OUTPUT_TAIL, lasting one cycle. This means that for each block of 64 data items, there will be an overhead of 3 cycles during which the input is stalled (during states PRES0, PRES1 and DRQ) thereby slowing the write rate by 3/64 or approximately 5%. This number may occasionally increase to up to 13 cycles of overhead when auxiliary branches of the state machine are executed under worst-case conditions. Note that such large overheads will only apply on a once-per-frame basis.

C.2.5.2 Presentation Number Behavior During an Access

The particular embodiment of the bm_pres illustrated by the schematic shown in C.2.3.2.4 means that presentation number free-runs during upi accesses. If presentation number is required to be the same when access is relinquished as it was when access was gained, this can be effected by reading presentation number after access is granted, and writing it back just before it is relinquished. Note that this is asynchronous, so it may be desirable to repeat the accesses several times to further ensure effectiveness.

C.2.5.3 H261 Temporal Reference Numbers

The module bm_tref (not shown) should be included in the bmlogic. The H.261 temporal reference values are correctly processed by directing delta input from the bmtref to the bm_stus module. The delta input can be tied to zero if the frames are always sequential.

SECTION C.3 Write Address Generation

C.3.1 Introduction

The function of the write address generation hardware, in accordance with the present invention, is to produce block addresses for data to be written away to the buffers. This takes account of buffer base addresses, the component indicated in the stream, horizontal and vertical sampling within a macroblock, picture dimensions, and coding standard. Data arrives in macroblock form, but must be stored so that lines may be retrieved easily for display.

C.3.2 Functional Overview

Each time a new block arrives in the data stream (indicated by a DATA token), the write address generator is required to produce a new block address. It is not necessary to produce the address immediately, because up to 64 data words can be stored by the DRAM interface (in the swing buffer) before the address is actually needed. This means that the various address components can be added to a running total in successive cycles, and thus, hence obviating the need for any hardware multipliers. The macroblock counter function is effected by storing strategic terminal values and running counts in the register file, these being the operands for comparisons and conditional updates after each block address calculation.

Considering the picture format shown in FIG. 161, expected address sequences can be derived for both standard and H.261-like data streams. These are shown below. Note that the format does not actually conform to the H.261 specification because the slices are not wide enough (3 macroblocks rather than 11) but the same "half-picture-width-slice" concept is used here for convenience and the sequence is assumed to be "H.261-type". Data arrives as full macroblocks, 4:2:0 in the example shown, and each component is stored in its own area of the specified buffer.

Standard address sequence:

000,001,00C,00D,100,200;
002,003,00E,00F,101,201;
004,005,010,011,102,202;
006,007,012,013,103,203;
008,009,014,015,104,105;
00A,00B,016,017,105,205;
018,019,024,025,106,107;
01A,01B,026. . .
080,081,06C,08D,122,222;
082,083,08E,08F,123,223;

H261-type sequence:

000,001,00C,00D,100,200;
002,003,00E,00F,101,201;
004,005,010,011,102,202;
018,019,024,025,106,107;
01A,01B,026,027,107,207;
01C,01D,028,029,108,208;
030,031,03C,03D,10C,20C,
032,033,03E,03F,10D,20D;
034,035,040,041,10E,20E;
006,007,012,013,103,203;
008,009,014,015,104,105;
00A,00B,016,017,105,205;
01E,01F,02A,02B,109,209;
020,021,02C,02D,10A,20A;
022,023,02E,02F,10B,20B;
036,037,042,043,10F,20F;
038,039,044,045,110,210;
03A,03B,046,047,111,211;
048,049,054,055,112,212;
04A,04B,056 . . .

06A,06B,076,077,11D,21D;
07E,07F,08A,08B,121,221;
080,081,08C,08D,122,222;
082,083,08E,08F,123;223;

C.3.3 Architecture

C.3.3.1 Interfaces

C.3.3.1.1 Interface to buffer manager

The buffer manager outputs data and the buffer index directly to the write address generator. This is performed under the control of a two-wire-interface. In some ways, it is possible to consider the write address generator block as an extension of the buffer manager because the two are very closely linked. They do, however, operate from two separate (but similar) clock generators.

C.3.3.1.2 Interface to dramif

The write address generator provides data and addresses for the DRAM interface. Each of these has their own two-wire-interface, and the dramif uses each of them in different clock regimes. In particular, the address is clocked into the dramif on a clock which is not related to the write address generator clock. It is, therefore, synchronized at the output.

C.3.3.1.3 Microprocessor Interface

The write address generator uses three bits of microprocessor address space together with 8-bit data bus and read and write strobes. There is a single select bit for register access.

C.3.3.1.4 Events

The write address generator is capable of producing five different events. Two are in response to picture size information appearing in the data stream (hmbs and vmbs), and three are in response to DEFINE_SAMPLING tokens (one event for each component.

C.3.3.2 Basic Structure

The structure of the write address generator is shown in the schematic waddrgen.sch. It comprises a datapath, some controlling logic, and snoopers and synchronization.

C.3.3.2.1 The Datapath (bwadpath)

The datapath is of the type described in Chapter C.5 of this document, comprising an 18-bit adder/subtractor and register file (see C.3.3.4), and producing a zero flag (based on the adder output) for use in the control logic.

C.3.3.2.2 The Controlling Logic

The controlling logic of the present invention consists of hardware to generate all of the register file load and drive signals, the adder control signals, the two-wire-interface signals, and also includes the writable control registers.

C.3.3.2.3 Snoopers and Synchronization

Super snoopers exist on both the data and address ports. Snoopers in the datapaths, controlled as super-snoopers from the zcells. The address has synchronization between the write address generator clock and the dramif's "clk" regime. Syncifs are used in the zcells for the two-wire interface signals, and simplified synchronizers are used in the datapath for the address.

C.3.3.3 Controlling Logic and State Machine

C.3.3.3.1 Input/Output Block (wa inout)

This block contains the input and two output two-wire interfaces, together with latches for the input data (for token decode) and arrival buffer index (for decoding four ways).

C.3.3.3.2 Two Cycle Control Block (wa fc)

The flag fc (first cycle) is maintained here and indicates whether the state machine is in the middle of a two-cycle operation (i.e., an operation involving an add).

C.3.3.3.3. Component Count (wa comp)

Separate addresses are required for data blocks in each component, and this block maintains the current component under consideration based on the type of DATA header received in the input stream.

C.3.3.3.4 Modulo-3 Control (wa mod3)

When generating address sequences for H.261 data streams, it is necessary to count three rows of macroblocks to half way along the screen (see C.3.2). This is effected by maintaining a modulo-3 counter, incremented each time a new row of macroblocks is visited.

C.3.3.3.5 Control Registers (wa uregs)

Module wa_uregs contains the setup register and the coding standard register—the latter is loaded from the data stream. The setup register uses 3 bits: QCIF (lsb) and the maximum component expected in the data stream (bits 1 and 2). The access bit also resides in this block (synchronized as usual), with the "stopped" bits being derived at the next level up the hierarchy (walogic) as the OR of the access bit and the event stop bits. Microprocessor address decoding is done by the block wa_udec which takes read and write strobes, a select wire, and the lower two bits of the address bus.

C.3.3.3.6 Controlling State Machine (wa state)

The logic in this block is split into several distinct areas. The sate decode, new state encode, derivation of "intermediate" logic signals, datapath control signals (drivea, driveb, load, adder controls and select signals), multiplexer controls, two-wire-interface controls, and the five event signals.

C.3.3.3.7 Event Generation

The five event bits are generated as a result of certain tokens arriving at the input. It is important that, in each case, the entire token is received before any events are generated because the event service routines perform calculations based on the new values received. For this reason, each of the bits is delayed by a whole cycle before being input to the event hardware.

C.3.3.4 Register Address Map

There are two sets of registers in the write address generator block. These are the top-level setup type registers located in the standard cell section, and keyholed datapath registers. These are listed in Table C.3.1 and C.3.2, respectively.

TABLE C.3.1

Top-Level Registers

| Register Name | Address | Bits | Reset State | Function |
|---|---|---|---|---|
| BU_WADDR_COD_STD | 0x4 | 2 | 0 | Cod std from data stream |
| BU_WADDR_ACCESS | 0x5 | 1 | 0 | Access bit |
| BU_WADDR_CTL1 | 0x6 | 3 | 0 | max component [2:1] and QCIF[0] |
| BU_WADDR_ADDR_SNP2 | 0xB0 | 8 | | snooper on the write |
| BU_WADDR_ADDR_SNP1 | 0xB1 | 8 | | address generator |
| BU_WADDR_ADDR_SNP0 | 0xB2 | 8 | | address o/p |
| BU_WA_DATA_SNP1 | 0xB4 | 8 | | snooper on |
| BU_WA_DATA_SNP0 | 0xB5 | 8 | | data output of WA |

TABLE C.3.2

Image Formatter Address Generator Keyhole

| Keyhole Register Name | Keyhole Address | Bits | Comments |
|---|---|---|---|
| BU_WADDR_BUFFER0_BASE_MSB | 0x85 | 2 | Must be |
| BU_WADDR_BUFFER0_BASE_MID | 0x86 | 8 | Loaded |
| BU_WADDR_BUFFER0_BASE_LSB | 0x87 | 8 | |
| BU_WADDR_BUFFER1_BASE_MSB | 0x89 | 2 | Must be |
| BU_WADDR_BUFFER1_BASE_MID | 0x8a | 8 | Loaded |
| BU_WADDR_BUFFER1_BASE_LSB | 0x8b | 8 | |
| BU_WADDR_BUFFER2_BASE_MSB | 0x8d | 2 | Must be |
| BU_WADDR_BUFFER2_BASE_MID | 0x8e | 8 | Loaded |
| BU_WADDR_BUFFER2_BASE_LSB | 0x8f | 8 | |
| BU_WADDR_COMP0_HMBADDR_MSB | 0x91 | 2 | Test only |
| BU_WADDR_COMP0_HMBADDR_MID | 0x92 | 8 | |
| BU_WADDR_COMP0_HMBADDR_LSB | 0x93 | 8 | |
| BU_WADDR_COMP1_HMBADDR_MSB | 0x95 | 2 | Test only |
| BU_WADDR_COMP1_HMBADDR_MID | 0x96 | 8 | |
| BU_WADDR_COMP1_HMBADDR_LSB | 0x97 | 8 | |
| BU_WADDR_COMP2_HMBADDR_MSB | 0x99 | 2 | Test only |
| BU_WADDR_COMP2_HMBADDR_MID | 0x9a | 8 | |
| BU_WADDR_COMP2_HMBADDR_LSB | 0x9b | 8 | |
| BU_WADDR_COMP0_VMBADDR_MSB | 0x9d | 2 | Test only |
| BU_WADDR_COMP0_VMBADDR_MID | 0x9e | 8 | |
| BU_WADDR_COMP0_VMBADDR_LSB | 0x9f | 8 | |
| BU_WADDR_COMP1_VMBADDR_MSB | 0xa1 | 2 | Test only |
| BU_WADDR_COMP1_VMBADDR_MID | 0xa2 | 8 | |
| BU_WADDR_COMP1_VMBADDR_LSB | 0xa3 | 8 | |
| BU_WADDR_COMP2_VMBADDR_MSB | 0xa5 | 2 | Test only |
| BU_WADDR_COMP2_VMBADDR_MID | 0xa6 | | |
| BU_WADDR_COMP2_VMBADDR_LSB | 0xa7 | 8 | |
| BU_WADDR_VBADDR_MSB | 0xa9 | 2 | Test only |
| BU_WADDR__VBADDR_MID | 0xaa | 8 | |
| BU_WADDR_VBADDR_LSB | 0xab | 8 | |
| BU_WADDR_COMP0_HALF_WIDTH_IN_BLOCKS_MSB | 0xad | 2 | Must be |
| BU_WADDR_COMP0_HALF_WIDTH_IN_BLOCKS_MID | 0xae | 8 | Loaded |

TABLE C.3.2-continued

Image Formatter Address Generator Keyhole

| Keyhole Register Name | Keyhole Address | Bits | Comments |
|---|---|---|---|
| BU_WADDR_COMP0_HALF_WIDTH_IN_BLOCKS_LSB | 0xaf | 8 | |
| BU_WADDR_COMP1_HALF_WIDTH_IN_BLOCKS_MSB | 0xb1 | 2 | Must be |
| BU_WADDR_COMP1_HALF_WIDTH_IN_BLOCKS_MID | 0xb2 | 8 | Loaded |
| BU_WADDR_COMP1_HALF_WIDTH_IN_BLOCKS_LSB | 0xb3 | 8 | |
| BU_WADDR_COMP2_HALF_WIDTH_IN_BLOCKS_MSB | 0xb5 | 2 | Must be |
| BU_WADDR_COMP2_HALF_WIDTH_IN_BLOCKS_MID | 0xb6 | 8 | Loaded |
| BU_WADDR_COMP2_HALF_WIDTH_IN_BLOCKS_LSB | 0xb7 | 8 | |
| BU_WADDR_HB_MSB | 0xb9 | 2 | Test only |
| BU_WADDR_HB_MID | 0xba | 8 | |
| BU_WADDR_HB_LSB | 0xbb | 8 | |
| BU_WADDR_COMP0_OFFSET_MSB | 0xbd | 2 | Must be |
| BU_WADDR_COMP0_OFFSET_MID | 0xbe | 8 | Loaded |
| BU_WADDR_COMP0_OFFSET_LSB | 0xbf | 8 | |
| BU_WADDR_COMP1_OFFSET_MSB | 0xc1 | 2 | Must be |
| BU_WADDR_COMP1_OFFSET_MID | 0xc2 | 8 | Loaded |
| BU_WADDR_COMP1_OFFSET_LSB | 0xc3 | 8 | |
| BU_WADDR_COMP2_OFFSET_MSB | 0xc5 | 2 | Must be |
| BU_WADDR_COMP2_OFFSET_MID | 0xc6 | 8 | Loaded |
| BU_WADDR_COMP2_OFFSET_LSB | 0xc7 | 8 | |
| BU_WADDR_SCRATCH_MSB | 0xc9 | 2 | Test only |
| BU_WADDR_SCRATCH_MID | 0xca | 8 | |
| BU_WADDR_SCRATCH_LSB | 0xcb | 8 | |
| BU_WADDR_MBS_WIDE_MSB | 0xcd | 2 | Must be |
| BU_WADDR_MBS_WIDE_MID | 0xce | 8 | Loaded |
| BU_WADDR_MBS_WIDE_LSB | 0xcf | 8 | |
| BU_WADDR_MBS_HIGH_MSB | 0xd1 | 2 | Must be |
| BU_WADDR_MBS_HIGH_MID | 0xd2 | 8 | Loaded |
| BU_WADDR_MBS_HIGH_LSB | 0xd3 | 8 | |
| BU_WADDR_COMP0_LAST_MB_IN_ROW_MSB | 0xd5 | 2 | Must be |
| BU_WADDR_COMP0_LAST_MB_IN_ROW_MID | 0xd6 | 8 | Loaded |
| BU_WADDR_COMP0_LAST_MB_IN_ROW_LSB | 0xd7 | 8 | |
| BU_WADDR_COMP1_LAST_MB_IN_ROW_MSB | 0xd9 | 2 | Must be |
| BU_WADDR_COMP1_LAST_MB_IN_ROW_MID | 0xda | 8 | Loaded |
| BU_WADDR_COMP1_LAST_MB_IN_ROW_LSB | 0xdb | 8 | |
| BU_WADDR_COMP2_LAST_MB_IN_ROW_MSB | 0xdd | 2 | Must be |
| BU_WADDR_COMP2_LAST_MB_IN_ROW_MID | 0xde | 8 | Loaded |
| BU_WADDR_COMP2_LAST_MB_IN_ROW_LSB | 0xdf | 8 | |
| BU_WADDR_COMP0_LAST_MB_IN_HALF_ROW_MSB | 0xe1 | 2 | Must be |
| BU_WADDR_COMP0_LAST_MB_IN_HALF_ROW_MID | 0xe2 | 8 | Loaded |
| BU_WADDR_COMP0_LAST_MB_IN_HALF_ROW_LSB | 0xe3 | 8 | |
| BU_WADDR_COMP1_LAST_MB_IN_HALF_ROW_MSB | 0xe5 | 2 | Must be |
| BU_WADDR_COMP1_LAST_MB_IN_HALF_ROW_MID | 0xe6 | 8 | Loaded |
| BU_WADDR_COMP1_LAST_MB_IN_HALF_ROW_LSB | 0xe7 | 8 | |
| BU_WADDR_COMP2_LAST_MB_IN_HALF_ROW_MSB | 0xe9 | 2 | Must be |
| BU_WADDR_COMP2_LAST_MB_IN_HALF_ROW_MID | 0xea | 8 | Loaded |
| BU_WADDR_COMP2_LAST_MB_IN_HALF_ROW_LSB | 0xeb | 8 | |
| BU_WADDR_COMP0_LAST_ROW_IN_MB_MSB | 0xed | 2 | Must be |
| BU_WADDR_COMP0_LAST_ROW_IN_MB_MID | 0xee | 8 | Loaded |
| BU_WADDR_COMP0_LAST_ROW_IN_MB_LSB | 0xef | 8 | |
| BU_WADDR_COMP1_LAST_ROW_IN_MB_MSB | 0xf1 | 2 | Must be |
| BU_WADDR_COMP1_LAST_ROW_IN_MB_MID | 0xf2 | 8 | Loaded |
| BU_WADDR_COMP1_LAST_ROW_IN_MB_LSB | 0xf3 | 8 | |
| BU_WADDR_COMP2_LAST_ROW_IN_MB_MSB | 0xf5 | 2 | Must be |
| BU_WADDR_COMP2_LAST_ROW_IN_MB_MID | 0xf6 | 8 | Loaded |
| BU_WADDR_COMP2_LAST_ROW_IN_MB_LSB | 0xf7 | 8 | |
| BU_WADDR_COMP0_BLOCKS_PER_MB_ROW_MSB | 0xf9 | 2 | Must be |
| BU_WADDR_COMP0_BLOCKS_PER_MB_ROW_MID | 0xfa | 8 | Loaded |
| BU_WADDR_COMP0_BLOCKS_PER_MB_ROW_LSB | 0xfb | 8 | |
| BU_WADDR_COMP1_BLOCKS_PER_MB_ROW_MSB | 0xfd | 2 | Must be |
| BU_WADDR_COMP1_BLOCKS_PER_MB_ROW_MID | 0xfe | 8 | Loaded |
| BU_WADDR_COMP1_BLOCKS_PER_MB_ROW_LSB | 0xff | 8 | |
| BU_WADDR_COMP2_BLOCKS_PER_MB_ROW_MSB | 0x101 | 2 | Must be |
| BU_WADDR_COMP2_BLOCKS_PER_MB_ROW_MID | 0x102 | 8 | Loaded |
| BU_WADDR_COMP2_BLOCKS_PER_MB_ROW_LSB | 0x103 | 8 | |
| BU_WADDR_COMP0_LAST_MB_ROW_MSB | 0x105 | 2 | Must be |
| BU_WADDR_COMP0_LAST_MB_ROW_MID | 0x106 | 8 | Loaded |
| BU_WADDR_COMP0_LAST_MB_ROW_LSB | 0x107 | 8 | |
| BU_WADDR_COMP1_LAST_MB_ROW_MSB | 0x109 | 2 | Must be |
| BU_WADDR_COMP1_LAST_MB_ROW_MID | 0x10a | 8 | Loaded |
| BU_WADDR_COMP1_LAST_MB_ROW_LSB | 0x10b | 8 | |
| BU_WADDR_COMP2_LAST_MB_ROW_MSB | 0x10d | 2 | Must be |
| BU_WADDR_COMP2_LAST_MB_ROW_MID | 0x10e | 8 | Loaded |
| BU_WADDR_COMP2_LAST_MB_ROW_LSB | 0x10f | 8 | |
| BU_WADDR_COMP0_HBS_MSB | 0x111 | 2 | Must be |

TABLE C.3.2-continued

Image Formatter Address Generator Keyhole

| Keyhole Register Name | Keyhole Address | Bits | Comments |
|---|---|---|---|
| BU_WADDR_COMP0_HBS_MID | 0x112 | 8 | Loaded |
| BU_WADDR_COMP0_HBS_LSB | 0x113 | 8 | |
| BU_WADDR_COMP1_HBS_MSB | 0x115 | 2 | Must be |
| BU_WADDR_COMP1_HBS_MID | 0x116 | 8 | Loaded |
| BU_WADDR_COMP1_HBS_LSB | 0x117 | 8 | |
| BU_WADDR_COMP2_HBS_MSB | 0x119 | 2 | Must be |
| BU_WADDR_COMP2_HBS_MID | 0x11a | 8 | Loaded |
| BU_WADDR_COMP2_HBS_LSB | 0x11b | 8 | |
| BU_WADDR_COMP0_MAXHB | 0x11f | 2 | Must be |
| BU_WADDR_COMP1_MAXHB | 0x123 | 2 | Loaded |
| BU_WADDR_COMP2_MAXHB | 0x127 | 2 | |
| BU_WADDR_COMP0_MAXVB | 0x12b | 2 | Must be |
| BU_WADDR_COMP1_MAXVB | 0x12f | 2 | Loaded |
| BU_WADDR_COMP2_MAXVB | 0x133 | 2 | |

The keyhole registers fall broadly into two categories. Those which must be loaded with picture size parameters prior to any address calculation, and those which contain running totals of various (horizontal and vertical) block and macroblock counts. The picture size parameters may be loaded in response to any of the interrupts generated by the write address generator, i.e., when any of the picture size or sampling tokens appear in the data stream. Alternatively, if the picture size is known prior to receiving the data stream, they can be written just after reset. Example setups are given in Sectionr C.13, and the picture size parameter registers are defined in the next section.

C.3.4 Programming the Write Address Generator

The following datapath registers must contain the correct picture size information before address calculation can proceed. They are illustrated in FIG. 162.

1)WADDR_HALF_WIDTH_IN_BLOCKS: this defines the half width, in blocks, of the incoming picture.

2)WADDR_MBS_WIDE: this defines the width, in macroblocks, of the incoming picture.

3)WADDR_MBS_HIGH: this defines the height, in macroblocks, of the incoming picture.

4)WADDR_LAST_MB_IN_ROW: this defines the block number of the top left hand block of the last macroblock in a single, full-width row of macroblocks. block numbering starts at zero in the top left corner of the left-most macroblock, increases across the frame with each block and subsequently with each following row of blocks within the macroblock row.

5)WADDR_LAST_MB_IN_HALF_ROW: this is similar to the previous item, but defines the block number of the top left block in the last macroblock in a half-width row of macroblocks.

6)WADDR_LAST_ROW_IN_MB: this defines the block number of the left most block in the last row of blocks within a row of macroblocks.

7)WADDR_BLOCKS_PER_MB_ROW: this defines the total number of blocks contained in a single, full-width row of macroblocks.

8)WADDR_LAST_MB_ROW: this defines the top left block address of the left-most macroblock in the last row of macroblocks in the picture.

9)WADDR_HBS: this defines the width in blocks of the incoming picture.

10)WADDR_MAXHB: this defines the block number of the right-most block in a row of blocks in a single macroblock.

11)WADDR_MAXVB: this defines the height-1, in blocks, of a single macroblock.

In addition, the registers defining the organization of the DRAM must be programmed. These are the three buffer base registers, and the n component offset registers, where n is the number of components expected in the data stream (it can be defined in the data stream, and can be 1 minimum and 3 maximum).

Note that many of the parameters specify block numbers or block addresses. This is because the final address is expected to be a block address, and the calculation is based on a cumulative algorithm.

The screen configuration illustrated in FIG. 162 yields the following register values:

1)WADDR_HALF_WIDTH_IN_BLOCKS=0×16

2)WADDR_MBS_WIDE=0×16

3)WADDR_MBS_HIGH=0×12

4)WADDR_LAST_MB_IN_ROW=0×2A

5)WADDR_LAST_MB_IN_HALF_ROW=0×14

6)WADDR_LAST_ROW_IN_MB=0'2C

7)WADDR_BLOCKS_PER_MB_ROW=0×58

8)WADDR_LAST_MB_ROW=0×5D8

9)WADDR_HBS=0×2C

10)WADDR_MAXVB=1

11)WADDR_MAXHB=1

C.3.5 Operation of The State Machine

There are 19 states in the buffer manager's state machine, as detailed in Table C.3.3. These interact as shown in FIG. 164, and also as described in the behavioral description, bmlogic.M.

TABLE C.3.3

Write Address Generator States

| State | Value |
|---|---|
| IDLE | 0×00 |
| DATA | 0×10 |
| CODING_STANDARD | 0×0C |
| HORZ_MBS0 | 0×07 |
| HORZ_MBS1 | 0×06 |
| VERT_MBS0 | 0×0B |
| VERT_MBS1 | 0×0A |
| OUTPUT_TAIL | 0×08 |

TABLE C.3.3-continued

Write Address Generator States

| State | Value |
|---|---|
| HB | 0×11 |
| MB0 | 0×1D |
| MB1 | 0×12 |
| MB2 | 0×1E |
| MB3 | 0×13 |
| MB4 | 0×0E |
| MB5 | 0×14 |
| MB6 | 0×15 |
| MB4A | 0×18 |

C.3.5.1 Calculation of the Address

The major section of the write address generator state machine is illustrated down the left hand side of FIG. 164. On receipt of a DATA token, the state machine moves from state IDLE to state ADDR1 and then through to state ADDR5, from which an 18-bit block address is output with two-wire-interface controls. The calculations performed by the states ADDR1 through to ADDR5 are:

BU_WADDR_SCRATCH=BU_BUFFERn_BASE +BU_COMPm_OFFSET;

BU_WADDR_SCRATCH=BU_WADDR_SCRATCH +BU_WADDR_VMBADDR;

BU_WADDR_SCRATCH=BU_WADDR-SCRATCH +BU_WADDR_HMBADDR;

BU_WADDR_SCRATCH=BU+WADDR_SCRATCH +BU_WADDR_VBADDR;

out_addr=BU_WADDR_SCRATCH+BU_WADDR_HB;

The registers used are defined as follows:

1) BU_WADDR_VMBADDR: the block address (the top left block) of the left-most macroblock of the row of macroblocks in which the block whose address is being calculated is contained.
2) BU_WADDR_HMBADDR: the block address (top left block) of the top macroblock of the column of macroblocks in which the block whose address is being calculated is contained.
3) BU_WADDR_VBADDR: the block address, within the macroblock row, of the left-most block of the row of blocks in which the block whose address is being calculated is contained.
4) BU_WADDR_HB: the horizontal block number, within the macroblock, of the block whose address is being calculated.
5) BU_WADDR_SCRATCH: the scratch register used for temporary storage of intermediate results.

Considering FIG. 163, and taking, for example, the calculation of the block whose address is 0×62D, the following sequence of calculations will take place;

SCRATCH=BUFFERn_BASE+COMPm_OFFSET; (assume 0)

SCRATCH=0+0×5D8;

SCRATCH=0×5D8+0×28;

SCRATCH=0×600+0×2C;

block address=0×62C+1=0×62D;

The contents of the various registers are illustrated in the Figure.

C.3.5.2 Calculation of New Screen Location Parameters

When the address has been output, the state machine continues to perform calculations in order to update the various screen location parameters described above. The states HB and MB0 through to MB6 do the calculations, transferring control at some point to state DATA from which the reminder of the DATA Token is output.

These states proceed in pairs, the first of a pair calculating the difference between the current count and its terminal value and, hence, generating a zero flag. The second of the pair either resets the register or adds at fixed (based on values in the setup registers derived from screen size) offset. In each case, if the count under consideration has reached its terminal value (i.e., the zero flag is set), control continues down the "MB" sequence of states. If not, all counts are deemed to be correct (ready for the next address calculation) and control transfers to state DATA.

Note that all states which involve the use of an addition or subtraction take two cycles to complete (allowing the use of a standard, ripple-carry adder), this being effected by the use of a flag, fc (first cycle) which alternates between 1 and 0 for adder-based states.

All of the address calculation and screen location calculation states allow data to be output assuming favorable two-wire interface conditions.

C.3.5.2.1 Calculations for Standard (MPEG-style) sequences

The sequence of operations is as follows (in which the zero flag is based on the output of the adder):

```
states HB and MBO:
scratch = hb - maxhb;
if (z)
    hb = 0;
else
(
    hb = hb + 1
    new_state = DATA;
)
states MB1 and MB2:
scratch = vb_addr - last_row_in_mb;
if (z)
    vb_addr = 0;
else
(
    vb_addr = vb_addr + width_in_blocks;
    new_state = DATA;
)
states MB3 and MB4:
scratch = hmb_addr - last_mb_in_row;
if (z)
    hmb_addr = 0;
else
(
    hmb_addr = hmb_addr + maxhb;
    new_state = DATA;
  )
  states MB5 and MB6:
  scratch = vmb_addr - last_mb_row;
  if (!z)
    vmb_addr = vmb_addr + blocks_per_mb_row;
(vmb_addr is reset after a PICTURE_START token is
detected, rather than when the end of a picture is inferred
from the calcuations).
```

C.3.5.2.2 Calculations for H.261 Sequences

The sequence for H.261 calculations diverges from the standard sequence at state MB4:

```
states HB and MBO:-as above
states MB1 and MB2:-as above
states MB3 and MB4:
scratch = hmb_addr - last_mb_in_row;
if (z & (mod3==2)) /*end of slice on right of screen*/
(
   hmb_addr - 0;
   new_state — MB5;
```

-continued

```
)
else if (z) /*end of row on right of screen*/
(
    hmb_addr = half_width_in_blocks;
    new_state = MB4A;
)
else
(
    scratch = hmb_addr - last_mb_in_half_row;
    new-state = MB4B;
}
state MB4A:
vmb_addr = vmb_addr + blocks_per_mb_row;
new_state = DATA;
state (MB4) and MB4B:
(scratch = hmb_addr - last_mb_in_half_row;)
if (z & (mod3==2)) /*end of slice on left of screen*/
{
    hmb_addr = hmb_addr + maxhb;
    new_state = MB4C;
}
else if (z) /*end of row on left of screen*/
{
    hmb_addr = 0;
    new_state = MB4A;
}
else
{
    hmb_addr = hmb_addr + maxhb;
    new_state = DATA;
}
states MB4C and MB4D:
vmb_addr = vmb_addr - blocks_per_mb_row;
vmb_addr = vmb_addr - blocks_per_mb_row;
new_state = DATA;
states MB5and MB6:-as above
```

C.3.5.3 Operation on PICTURE_START Token

When a PICTURE_START token is received, control passes to state PIC_ST1 where the vb_addr register (BU_WADDR_VBADDR) is reset to 0. Each of states PIC_ST2 and PIC_ST3 are then visited, once for each component, resetting hmb_addr and vmb_addr respectively. Control then returns, via state OUTPUT_TAIL, to IDLE.

C.3.5.3 Operation on PICTURE_START Token

When a PICTURE_START token is received, control passes to state PIC_ST1 where the vb_addr register (BU_WADDR_VBADDR) is reset to 0. Each of states PIC_ST2 and PIC_ST3 are then visited, once for each component, resetting hmb_addr and vmb_addr, respectively. Control then returns, via state OUTPUT_TAIL, to IDLE.

C.3.5.4 Operation on DEFINE_SAMPLING Token

When a DEFINE_SAMPLING token is received, the component register is loaded with the least significant two bits of the input data. In addition, via states HSAMP and VSAMP, the maxhb and maxvb registers for that component are loaded. Furthermore, the appropriate define sampling event bit is triggered (delayed by one cycle to allow the whole token to be written).

C.3.5.5 Operation on HORIZONTAL_MBS and VERTICAL_MBS

When each of HORIZONTAL_MBS and VERTICAL_MBS arrive, the 14-bit value contained in the token is written, in two cycles, to the appropriate register. The relevant event bit is triggered, delayed by one cycle.

C.3.5.6 Other Tokens

The CODING_STANDARD token is detected and causes the top-level BU_WADDR_COD_STD register to be written with the input data. This is decoded and the nh261 flag (not H261) is hardwired to the buffer manager block. All other tokens cause control to move to state OUTPUT_TAIL, which accepts data until the token finishes. Note, however, that it does not actually output any data.

SECTION C.4 Read Address Generator

C.4.1 Overview

The read address generator of the present invention consists of four state machine/datapath blocks. The first, "dline", generates line addresses and distributes them to the other three (one for each component) identical page/block address generators, "dramctls". All blocks are linked by two wire interfaces. The modes of operation include all combinations of interlaced/progressive, first field upper/lower, and frame start on upper/lower/both. The Table C.3.4 shows the names, addresses, and reset states of the dispaddr control registers, and Chapter C.13 gives a programming example for both address generators.

C.4.2 Line Address Generator (dline)

This block calculates the line start addresses for each component. Table C.3.4 shows the 18 bit datapath registers in dline.

Note the distinction between DISP_register_name and ADDR_register_name DISP _name registers are in dispaddr only and means that the register is specific to the display area to be read out of the DRAM. ADDR_name means that the register describes something about the structure of the external buffers.

Operation

The basic operation of dline, ignoring all modes repeats etc. is:

```
if (vsync_start)/* first active cycle of vsync*/comp=0
DISP_VB_CNT_COMP[comp]=0;
LINE[comp]=BUFFER_BASE[comp]+0;
LINE[comp]=LINE[comp]+DISP_COMP_OFFSET
[comp];
while (VB_CNT_COMP[comp]<DISP_VBS_COMP
[comp]
(
while (line_count[comp]<8)
(
(
while (comp<3)
(
→OUTPUT LINE[comp]to dramctl[comp]
line[comp]=LINE[comp]+ADDR_HBS_COMP[comp];
comp=comp+1;
)
line_count[comp]=line_count[comp]+1;
VB_CNT_COMP[comp]=VB_CNT_COMP[comp]
+1;
line_count[comp]==0;
)
)
```

TABLE C.3.4

Dispaddr Datapath Registers

| Register Names | Bus | Keyhole Address | Description | Comments |
|---|---|---|---|---|
| BUFFER_BASE0 | A | 0×00,01,02,03 | Block address | These registers |
| BUFFER_BASE1 | A | 0×04,05,06,07 | of the start of | must be loaded |
| BUFFER_BASE2 | A | 0×08,09,0a,0b | each buffer. | by the upi before |
| DISP_COMP_OFFSET0 | B | 0×24,25,26,27 | Offsets from the | operation can |
| DISP_COMP_OFFSET1 | B | 0×28,29,2a,2b | buffer base to | begin. |
| DISP_COMP_OFFSET2 | B | 0×2c,2d,2e,2f | where reading begins. | |
| DISP_VBS_COMP0 | B | 0×30,31,32,33 | Number of | |
| DISP_VBS_COMP1 | B | 0×34,35,36,37 | vertical blocks | |
| DISP_VBS_COMP2 | B | 0×38,39,3a,3b | to be read | |
| ADDR_HBS_COMP0 | B | 0×3c,3d,3e,3f | Number of | |
| ADDR_HBS_COMP1 | B | 0×40,41,42,43 | horizontal | |
| ADDR_HBS_COMP2 | B | 0×44,45,46,4 | blocks IN THE DATA | |
| LINE0 | A | 0×0c,0d,0e,0f | Current line | These registers |
| LINE1 | A | 0c10,11,12,13 | address | are temporary |
| LINE2 | A | 0×14,15,16,17 | | locations used |
| DISP_VB_CNT_COMP0 | A | 0×18,19,1a,1b | Number of | by dispaddr. |
| DISP_VB_CNT_COMP1 | A | 0×1c,1d,1e,1f | vertical blocks | Note: All |
| DISP_VB_CNT_COMP2 | A | 0×20,21,22,23 | remaining to be read. | registers are R/ W form the upi |

C.4.3 Dline Control Registers

The above operation is modified by the dispaddr control registers which are shown in the Table C.4.3 below.

TABLE C.4.3

CONTROL REGISTERS

| Register Name | Address | Bits | Reset State | Function |
|---|---|---|---|---|
| LINES_IN_LAST_ROW0 | 0×08 | [2:0] | 0×07 | These three registers |
| LINES_IN_LAST_ROW1 | 0×09 | [2:0] | 0×07 | determine the number of |
| LINES_IN_LAST_ROW2 | 0×0a | [2:0] | 0×07 | lines (out of 8) of the last row of blocks to read out |
| DISPADDR_ACCESS | 0×0b | [0] | 0×00 | Access bit for dispaddr |
| DISPADDR_CTL0 | 0×0c | [1:0] | 0×0 | SYNC_MODE |
| See below for a detailed | | [2] | 0×0 | READ_START |
| description of these | | [3] | 0×1 | INTERLACED/PROG |
| control bits | | [4] | 0×0 | LSB_INVERT |
| | | [7:5] | 0×0 | LINE_RPT |
| DISPADDR_CTL1 | 0×0d | [0] | 0×1 | COMP0HOLD |

Dispaddr Control Registers

C.4.3.1 LINES_IN_LAST_ROW[component]

These three registers determine, for each component, the number of lines in the last row of blocks that are to be read. Thus, the height of the read window may be an arbitrary number of lines. This is a back-up feature since the top, left and right edges of the window are on block boundaries, and the output controller can clip (discard) excess lines.

C.4.3.2 DISPADDR_ACCESS

This is the access bit for the whole of dispaddr. On writing a "1" to this location, dispaddr is halted synchronously to the clocks. The value read back from the access bit will remain "0" until dispaddr has safely halted. Having reached this state, it is safe to perform asynchronous upi accesses to all the dispaddr registers. Note that the upi is actively locked out from the datapath registers until the access bit is "1". In order for access to dispaddr to be achieved without disrupting the current display or datapath operation, access will only given and released under the following circumstances.

Stopping: Access will only be granted if the datapath has finished its current two cycle operation (if it were doing one), and the "safe" signal from the output controller is high. This signal represents the area on the screen below the display window and is programmed in the output controller (not dispaddr). Note: It is, therefore, necessary to program the output controller before trying to gain access to dispaddr.

Starting-Access will only be released when "safe" is high, or during vsync. This ensures that display will not start too close to the active window.

This scheme allows the controlling software to request access, poll until end of display, modify dispaddr, and release access. If the software is too slow and doesn't release the access bit until after vsync, dispaddr will not start until the next safe period. Border color will be displayed during this "lost" picture (rather than rubbish).

C.4.3.3 DISPADDR_CTL0[7:0]

When reading the following descriptions, it is important to understand the distinction between interlaced data and an interlaced display.

Interlaced data can be of two forms. The Top-Level Registers supports field-pictures (each buffer contains one field), and frames (each buffer contains an entire frame—interlaced or not)

DISPADDR_CTL0[7:0]contains the following control bits: SYNC_MODE[1:0]

With an interlaced display, vsyncs referring to top and bottom fields are differentiated by the field_info pin. In this context, field_info=HIGH meaning the top field. These two control bits determine which vsyncs dispaddr will request a new display buffer from the buffer manager and, thus, synchronize the fields in the buffers (if the data were interlaced) with the fields on the display:

0:New Display Buffer On Top Field

1:Bottom Field

2:Both Fields

3:Both Fields

At startup, dispaddr will request a buffer from the buffer manager on every vsync. Until a buffer is ready, dispaddr will receive a zero (no display) buffer. When it finally gets a good buffer index, dispaddr has no idea where it is on the display. It may, therefore, be necessary to synchronize the display startup with the correct vsync.

READ_START

For interlaced displays at startup, this bit determines on which vsync display will actually start. Furthermore, having received a display buffer index, dispaddr may "sit out" the current vsync in order to line up fields on the display with the fields in the buffer.

INTERLACED/~~PROGRESSIVE~~

0:Progressive

1:Interlaced

In progressive mode, all lines are read out of the display area of the buffer. In interlaced mode, only alternate lines are read. Whether reading starts on the first or second line depends on field_info. Note that with (interlaced) field-pictures, the system wants to read all lines from each buffer so the setting of this bit would be progressive. The mapping between field_info and first/second line start may be inverted by lsb_invert (so named for historical reasons).

LSB_INVERT

When set, this bit inverts the field_info signal seen by the line counter. Thus, reading may be started on the correct line of a frame and aligned to the display regardless of the convention adopted by the encoder, the display or the Top-Level Registers.

LINE_RPT[2:0]

Each bit, when set, causes the lines of the corresponding component to be read twice (bit 0 affects component 0 etc.). This forms the first part of the vertical unsampling. It is used in the 8 times chroma upsampling required for conversion from QFIF to 601.

COMP0HOLD

This bit is used to program the ratio of the number of lines to be read (as opposed to displayed) for component 0 to those of components 1 and 2).

0: Same number of lines, i.e., 4:4:4 data in the buffers.

1: Twice as many component 0 lines, i.e., 4:2:0.

Page/Block Address Generators (dramctls)

When passed a line address, these blocks generate a series of page/line addresses and blocks to read along the line. The minimum page width of 8 blocks is always assumed and the resulting outputs consist of a page address, a 3 bit line number, a 3 bit block start, and a 3 bit block stop address. (The line number is calculated by dline and passed through the dramctls unmodified). Thus, to read out 48 pixels of line 5 form page Oxaa starting from the third block from the left (an arbitrary point along an arbitrary line), the addresses passed to the DRAM interface would be:

Page=Oxaa

Line=5

Block start=2

Block stop=7

Each of these three machines has 5 datapath registers. These are shown in Table C.3.4. The basic behavior of each dramctl is:

Block start=2

Block stop=7

Each of these three machines has 5 datapath registers. These are shown in Table C.3.4

The basic behaviour of each dramctl is:—

```
while (true)
{
CNT_LEFT = 0;
GET_A_NEW_LINE_ADDRESS from dline;
BLOCK_ADDR = input_block_addr + 0;
PAGE_ADDR = input_page_addr + 0;
CNT_LEFT = DISP_HBS + 0;
while (CNT_LEFT > BLOCKS_LEFT)
{
BLOCKS_LEFT = 8 - BLOCK_ADDR;
-> output PAGE_ADDR, start=BLOCK_ADDR, stop=7.
PAGE_ADDR = PAGE_ADDR + 1;
BLOCK_ADDR = 0;
CNT_LEFT = CNT_LEFT - BLOCKS_LEFT;
}
/*Last Page of line */
CNT_LEFT = CNT_LEFT + BLOCK_ADDR;
CNT_LEFT = CNT_LEFT - 1;
-> output PAGE_ADDR,start=BLOCK_ADDR,stop=CNT_LEFT
}
```

TABLE C.3.5

Dramctl(0,1 & 2) Datapath Registers

| Register Names | Bus | Keyhole Address | Description | Comments |
|---|---|---|---|---|
| DISP_COMP0_HBS | A | 0×48,49,4a,4b | The number of horizontal blocks to be read. c.f. ADDR_HBS | This register must be loaded before operation can begin. |
| DISP_COMP1_HBS | A | 0×4c,4d,4e,4f | | |
| DISP_COMP2_HBS | A | 0×50,51,52,53 | | |
| CNT_LEFT0 | A | 0×54,55,56,57 | Number of blocks remaining to be read | These registers are temporary locations used by dispaddr. Note: All |
| CNT_LEFT1 | A | 0×58,59,5a,5b | | |
| CNT_LEFT2 | A | 0×5c,5d,5e,5f | | |
| PAGE_ADDR0 | A | 0×60,61,62,63 | The address of the current | |
| PAGE_ADDR1 | A | 0×64,65,66,67 | | |

TABLE C.3.5-continued

| Dramctl(0,1 & 2) Datapath Registers | | | | |
|---|---|---|---|---|
| Register Names | Bus | Keyhole Address | Description | Comments |
| PAGE_ADDR2 | A | 0×68,69,6a,6b | page. | registers are R/ |
| BLOCK_ADDR0 | B | 0×6c,6d,6e,6f | Current block | W from the ipi |
| BLOCK_ADDR1 | B | 0×70,71,72,73 | address | |
| BLOCK_ADDR2 | B | 0×74,75,76,77 | | |
| BLOCKS_LEFT0 | B | 0×78,79,7a,7b | Blocks left in | |
| BLOCKS_LEFT1 | B | 0×7c,7d,7e,7f | current page | |
| BLOCKS_LEFT2 | B | 0×80,81,82,83 | | |

Programming

The following 15 dispaddr registers must be programmed before operation can begin.

BUFFER_BASE0,1,2

DISP_COMP_OFFSET0,1,2

DISP_VBS_COMP0,1,2

ADDR_HBS_COMP0,1,2

DISP_COMP0,1,2_HBS

Using the reset state of the dispaddr control registers will give a 4:2n interlaced display with no line repeats synchronized and starting on the top field (field_info=HIGH). FIG. 159, "Buffer 0 Containing a SIF (22 by 18 macroblocks) picture," shows a typical buffer setup for a SIF picture. (This example is covered in more detail in Section C.13). Note that in this example, DISP_HBS_COMPn is equal to ADDR_HBS_COMPn and likewise the vertical registers DISP_VBS_COMPn and the equivalent write address generator register are equal, i.e., the area to be read is the entire buffer.

Windowing with the Read Address Generator

It is possible to program dispaddr such that it will read only a portion (window) of the buffer. The size of the window is programmed for each component by the registers DISP_HBS, DISP_VBS, COMPONENT_OFFSET, and LINES_IN_LAST_ROW. FIG. 160, "SIF Component 0 with a display window," shows how this is achieved (for component 0 only).

In this example, the register setting would be:

BUFFER_BASEO=0×00

DISP_COMP_OFFSETO=0×2D

DISP_VBS_COMPO=0×22

ADDR_HBS_COMPO=0×2C

DISP_HBS_COMO=0×2A

Notes:

The window may only start and stop on block boundaries.

In this example we have left LINES_IN_LAST_ROW equal to 7 (meaning all eight).

This example is not practical with anything other than 4:4:4 data. In order to correspond, the window edges for the other two components could not be on block boundaries.

The color space converter will hang up if the data it receives is not 4:4:4. This means that these read windows, in conjunction with the upsamplers must be programmed to achieve this.

SECTION C.5 Datapaths for Address Generation

The datapaths used in dispaddr and waddrgen are identical in structure and width (18 bits), only differing in the number of registers, some masking, and the flags returned to the state machine. The circuit of one slice is shown in FIG. 165, "Slice Of Datapath,". Registers are uniquely assigned to drive the A or B bus and their use (assignment) is optimized in the controller. All registers are loadable from the C bus, however, not all "load" signals are driven. All operations involving the adder cover two cycles; allowing the adder to have ordinary ripple carry. FIG. 166, "Two cycle operation of the datapath," shows the timing for the two cycle sum of two registers being loaded back into the "A" bus register. The various flags are "phO"ed within the datapath to allow ccode generation. For the same reason, the structure of the datapath schematics is a little unusual. The tristates for all the registers (onto the A and B buses) are in a single block which eliminates the combinatorial path in the cell, therefore, allowing better ccode generation. To gain upi access to the datapaths, the access bit must be set, for without this, the upi is locked out. Upi access is different from read and write:

Writing: When the access bit is set, all load signals; are disabled and one of a set of three byte addressed write strobes driven to the appropriate byte of one of the registers. The upi data bus passes vertically down the datapath (replicated, 2-8-8 bits) and the 18 bit register is written as three separate byte writes Reading: This is achieved using the A and B buses. Once again, the access bit must be set. The addressed register is driven onto the A or B bus and a upi byte select picks a byte from the relevant bus and drives it onto the upi bus.

As double cycle datapath operations require the A and B buses to retain their values, and upi accesses disrupt these, access must only be given by the controlling state machine before the start of any datapath operation.

All datapath registers in both address generators are addressed through a 9 bit wide keyhole at the top level address 0×28 (msb) and 0×29 (lsb) for the keyhole, and 0×2A for the data. The keyhole addresses are given in Table C.11.2.

Notes:

1) All address registers in the address generators (dispaddr and waddrgen) contain blocked addresses. Pixel addresses are never used and the only registers containing line addresses are the three LINES_IN_LAST_ROW registers.

2) Some registers are duplicated between the address generators, e.g., BUFFER_BASE0 occurs in the address space for dispaddr and waddrgen. These are two separate registers which BOTH need loading. This allows display windowing (only reading a portion of the display store), and eases the display of formats other than 3 component video.

SECTION C.6 The DRAM Interface

C.6.1 Overview

In the present invention, the Spacial Decoder, Temporal Decoder and Video Formatter each contain a DRAM Interface block for that particular chip. In all three devices, the function of the DRAM Interface is to transfer data from the chip to the external DRAM and from the external DRAM into the chip via block addresses supplied by an address generator.

The DRAM Interface typically operates from a clock which is asynchronous to both the address generator and to the clocks of the various blocks through which data is passed. This asynchronism is readily managed, however, because the clocks are operating at approximately the same frequency.

Data is usually transferred between the DRAM Interface and the rest of the chip in blocks of 64 bytes (the only exception being prediction data in the Temporal Decoder). Transfers take place by means of a device known as a "swing buffer". This is essentially a pair of RAMs operated in a double-buffered configuration, with the DRAM interface filling or emptying one RAM while another part of the chip empties or fills the other RAM. A separate bus which carries an address from an address generator is associated with each swing buffer.

Each of the chips has four swing buffers, but the function of these swing buffers is different in each case. In the Spacial Decoder, one swing buffer is used to transfer coded data to the DRAM, another to read coded data from the DRAM, the third to transfer tokenized data to the DRAM and the fourth to read tokenized data from the DRAM. In the Temporal Decoder, one swing buffer is used to write Intra or Predicted picture data to the DRAM, the second to read Intra or Predicted data from the DRAM and the other two to read forward and backward prediction data. In the Video Formatter, one swing buffer is used to transfer data to the DRAM and the other three are used to read data from the DRAM, one for each of Luminance (Y) and the Red and Blue color difference data (Cr and Cb, respectively).

The operation of a generic DRAM Interface is described in the Spacial Decoder document. The following section describes those features of the DRAM Interface, in accordance with the present invention, peculiar to the Video Formatter.

C.6.2 The Video Formatter DRAM Interface

In the video formatter, data is written into the external DRAM in blocks, but read out in raster order. Writing is exactly the same as already described for the Spacial Decoder, but reading is a little more complex.

The data in the Video Formatter external DRAM is organized so that at least 8 blocks of data fit into a single page. These 8 blocks are 8 consecutive horizontal blocks. When rasterizing, 8 bytes need to be read out of each of 8 consecutive blocks and written into the swing buffer (i.e., the same row in each of the 8 blocks). Considering the top row (and assuming a byte-wide interface), the x address (the three LSBs) is set to zero, as is the y address (3 MSBs). The x address is then incremented as each of the first 8 bytes are read out. At this point, the top part of the address (bit 6 and above—LSB =bit 0) is incremented and the x address (3 LSBs) is reset to zero. This process is repeated until 64 bytes have been read. With a 16 or 32 bit wide interface to the external DRAM, the x address is merely incremented by two or four instead of by one.

The address generator can signal to the DRAM Interface that less than 64 bytes should be read (this may be required at the beginning or end of a raster line) although a multiple of 8 bytes is always read. This is achieved by using start and stop values. The start value is used for the top part of the address (bit 6 and above), and the stop value is compared with this and a signal generated which indicates when reading should stop.

SECTION C.7 Vertical Upsampling

C.7.1 Introduction

Given a raster scan of pixels of one color component at its input, the vertical upsampler in accordance with the present invention, can provide an output scan of twice the height. Mode selection allows the output pixel values to be formed in a number of ways.

C.7.2 Ports

Input two wire interface:

in_valid in_accept in_data[7:0]

in_lastpel in_lastline

Output two wire interface:

out_valid out_accept out_data[9:0]

out_last mode[2:0]

nupdata[7:0], upaddr, upsel[3:0], uprstr, upwstr ramtest tdin, tdout, tpho, tckm, tcks ph0, ph1, notrst0

C.7.3 Mode

As selected by the input bus mode[2:0].

Mode register values 1 and 7 are not used.

In each of the above modes, the output pixels are represented as 10-bit values, not as bytes. No rounding or truncation takes place in this block. Where necessary, values are shifted left to use the same range.

C.7.3.1 Mode 0:Fifo

The block simply acts as a FIFO store. The number of output pixels is exactly the same as at the input. The values are shifted left by two.

C.7.3.2 Mode 2: Repeat

Every line in the input scan is repeated to produce an output scan twice as high. Again, the pixel values are shifted left by two.

*A->ABACBDBCCDD*

C.7.3.3 Mode 4: Lower

Each input line produces two output lines. In this "lower" mode, the second of these two lines (the lower on the display) is the same as the input line. The first of the pair is the average of the current input line and the previous input line. In the case of the first input line, where there is no previous line to use, the input line is repeated.

This should be selected where chroma samples are co-sited with the lower luma samples.

*A->ABAC(A+B)/2DB(B+C)/2C(C+D)/2D*

C.7.3.4 Mode 5: Upper

Similar to the "lower" mode, but in this case the input line forms the upper of the output pair, and the lower is the average of adjacent input lines. The last output line is a repeat of the last input line.

This should be selected where chroma samples are co-sited with the upper luma samples.

A->AB(A+B)/2CBD(B+C)/2C(C+D)/2DD

C.7.3.5 Mode 6: Central

This "central" mode corresponds to the situation where chroma samples lie midway between luma samples. In order to co-site the output chroma pixels with the luma pixels, a weighted average is used to form the output lines.

A->AB(3A+B)/4C(A+3B)/4D(3B+C)/4(B+3C)/4(3C+D)/4(C+3D)/4D

C.7.4 How It Works

There are two linestores, imaginatively designated "a" and "b". In "FIFO" and "repeat" modes, only linestore "a" is used. Each store can accommodate a line of up to 512 pixels (vertical upsampling should be performed before any horizontal upsamplng). There is no restriction on the length of the line in "FIFO" mode.

The input signals in_lastpel and in_lastline are used to indicate the end of the input line and the end of the picture. In_lastpel, it should be high coincident with the last pixel of each line. In_lastline, it should be high coincident with the last pixel of the last line of the picture.

The output signal out_last is high coincident with the last pixel of each output line.

In "repeat" mode, each line is written into store "a". The line is then read out twice. As it is read out for the second time, the next line may start to be written.

In "lower", "upper" and "central" modes, lines are written alternately into stores "a" and "b". The first line of a picture is always written into store "a". Two tiny state machines, one for each store, keep track of what is in each store and which output line is being formed. From these states are generated the read and write requests to the linestore RAMs, and the signals that determine when the next line may overwrite the present data.

A register (lastaddr) stores the write address when in_lastpel is high, thereby providing the length of the line for the formation of the output lines.

C.7.5 UPI

This block contains two 512×8 bit RAM arrays, which may be accessed via the microprocessor interface in the typical way. There are no registers with microprocessor access.

SECTION C.8 The Horizontal Up-Samplers

C.8.1 Overview

In the present invention, top-Level Registers contain three identical Horizontal Up-samplers, one for each color component. All three are controlled independently and, therefore, only one need be described here. From the user's point of view, the only difference is that each Horizontal Up-sampler is mapped into a different set of addresses in the memory map.

The Horizontal Up-sampler performs a combined replication and filtering operation. In all, there are four modes of operation:

TABLE C.7.1

Horizontal Up-sampler Modes

| Mode | Function |
|---|---|
| 0 | Straight-through (no processing). The reset state. |
| 1 | No up-sampling, filter using a 3-tap FIR filter. |

TABLE C.7.1-continued

Horizontal Up-sampler Modes

| Mode | Function |
|---|---|
| 2 | x2 up-sampling and filtering |
| 3 | x4 up-sampling and filtering |

C.8.2 Using a Horizontal Up-Sampler

The address map for each Horizontal Up-sampler consists of 25 locations corresponding to 12 13-bit coefficient registers and one 2-bit mode register. The number written to the mode register determines the mode of operation, as outlined in Table C.7.1. Depending on the mode, some or all of the coefficient registers may be used. The equivalent FIR filter is illustrated below.

Depending on the mode of operation, the input, $x_n$, is held constant for one, two or four clock periods. The actual coefficients that are programmed for each mode are as follows:

TABLE C.7.2

Coefficients for Mode 1

| Coeff | All clock periods |
|---|---|
| k0 | c00 |
| k1 | c10 |
| k2 | c20 |

TABLE C.7.3

Coefficients for Mode 2

| Coeff | 1st clock period | 2nd clock period |
|---|---|---|
| k0 | c00 | c01 |
| k1 | c10 | c11 |
| k2 | c20 | c21 |

TABLE C.7.4

Coefficients for Mode 3

| Coeff | 1st clock period | 2nd clock period | 3rd clock period | 4th clock period |
|---|---|---|---|---|
| k0 | c00 | c01 | c02 | c03 |
| k1 | c10 | c11 | c12 | c13 |
| k2 | c20 | c21 | c22 | c23 |

Coefficients which are not used in a particular mode need not be programmed when operating in that mode.

In order to achieve symmetrical filtering, the first and last pixels of each line are repeated prior to filtering.

For example, when up-sampling by two, the first and last pixels of each line are replicated four times rather than two. Because residual data in the filter is discarded at the end of each line, the number of pixels output is still always exactly one, two or four times the number in the input stream.

Depending on the values of the coefficients, output samples can be placed either coincident with or shifted from the input samples. Following are some example values for coefficients in some sample modes. A "–" indicates that the value of the coefficient is "don't care." All values are in hexadecimal.

TABLE C.7.5

| Sample Coefficients | | | |
|---|---|---|---|
| Coefficient | x2 up-sample, o/p pels coincident with i/p | x2 up-sample, o/p pels in between i/p | x4 up-sample, o/p pels in between i/p |
| c00 | 0000 | 01BD | 00E9 |
| c01 | 0000 | 010B | 00B6 |
| c02 | — | — | 012A |
| c03 | — | — | 0102 |
| c10 | 0800 | 0538 | 0661 |
| c11 | 0400 | 0538 | 0661 |
| c12 | — | — | 0446 |
| c13 | — | — | 029F |
| c20 | 0000 | 010B | 00B6 |
| c21 | 0400 | 01BD | 00E9 |
| c22 | — | — | 0290 |
| c23 | — | — | 045F |

C.8.3 Description of a Horizontal Up-Sampler

The datapath of the Horizontal Up-sampler is illustrated in FIG. 168.

The operation is outlined below for the x4 upsample case. In addition, x2 upsampling and x1 filtering (modes 2 and 1) are degenerate cases of this, and bypass (mode 0) the entire filter, data passing straight from the input latch to the output latch via the final mux, as illustrated.

1)When valid data is latched in the input latch ("L"), it is held for 4 clock periods.

2) The coefficient registers (labelled "COEFF") are multiplexed onto the multipliers for one clock period, each in turn, at the same time as the two sets of four pipeline registers (labelled "PIPE") are clocked. Thus, for input data $x_n$, the first PIPE will fill up with the values $c00.x_n$, $c01.x_n$, $c02.x_n$, $c03.x_n$.

3) Similarly, the second multiplier will multiply $x_n$ by of its coefficients, in turn, and the third multiplier by all its coefficients, in turn.

It can be seen that the output will be of the form shown in Table C.7.6

TABLE C.7.6

| Output Sequence for Mode 3 | |
|---|---|
| Clock1 Period | Output |
| 0 | $c20.x_1 + c10.x_{n-1} + c00.x_{n-2}$ |
| 1 | $c21.x_1 + c11.x_{n-1} + c01.x_{n-2}$ |
| 2 | $c22.x_1 + c12.x_{n-1} + c02.x_{n-2}$ |
| 3 | $c23.x_1 + c13.x_{n-1} + c03.x_{n-2}$ |

From the point of view of the output, each clock period produces an individual pixel. Since each output pixel is dependent on the weighted values of 12 input pixels (although there are only three different values), this can be thought of as implementing a 12 tap filter on x4 up-sampled input pixels.

For x2 upsampling, the operation is essentially the same, except the input data is only held for two clock periods. Furthermore, only two coefficients are used and the "PIPE" blocks are shortened by means of the multiplexers illustrated. For x1 filtering, the input is only held for one clock period. As expected, one coefficient and one "PIPE" stage are used.

We now discuss a few notes about some peculiarities of the implementation in the present invention.

1) The datapath width and coefficient width (13 bit 2's complement) were chosen so that the same multiplier could be used, as was designed for the Color-Space Converter. These widths are more than adequate for the purpose of the Horizontal Up-sampler.

2) The multiplexers which multiplex the coefficients onto the multipliers are shared with the UPI readback. This has led to some complications in the structure of the schematics (primarily because of difficulty in CCODE generation), but the actual circuit is smaller.

3) As in the Color-Space Converter, carry-save multipliers are used, the result only being resolved at the end.

Control for the entire Horizontal Up-sampler can be regarded as a single two-wire interface stage which may produce two or four times the amount of data at its output as there is on its input. The mode which is programmed in via the UPI determines the length of a programmable shift register (bob). The selected mode produces an output pulse every clock period, every two clock periods or every four clock periods. This, in turn, controls the main state machine, whose state is also determined by in_valid, out_accept (for the two-wire interface) and the signal "in_last". This signal is passed on from the vertical up-sampler and is high for the last pixel of every line. This allows the first and last pixels of each line to be replicated twice-over and the clearing down of the pipeline between lines (the pipeline contains partially-processed redundant data immediately after a line has been completed).

SECTION C.9 The Color-Space Converter

C.9.1 Overview

The Color-Space Converter in the present invention (CSC) performs a 3×3 matrix multiplication on the incoming 9-bit data, followed by an addition:

$$\begin{bmatrix} y0 \\ y1 \\ y2 \end{bmatrix} = \begin{bmatrix} c01 & c02 & c03 \\ c11 & c12 & c13 \\ c12 & c22 & c23 \end{bmatrix} \times \begin{bmatrix} x0 \\ x1 \\ x2 \end{bmatrix} + \begin{bmatrix} c04 \\ c14 \\ c24 \end{bmatrix}$$

Where x0–2 are the input data, y0–2 are the output data and cnm are the coefficients. The slightly unconventional naming of the matrix coefficients is deliberate, since the names correspond to signal names in the schematics.

The CSC is capable of performing conversions between a number of different color spaces although a limited set of these conversions are used in Top-Level Registers. The design color-space conversions are as follows:

$E_R, E_G, E_B \rightarrow Y, C_R, C_B$ $R, G, B \rightarrow Y, C_R, C_B$ $Y, C_R, C_B \rightarrow E_R, E_G, E_B$ $Y, C_R, C_B \rightarrow R, G, B$ Where R, G and B are in the range (0 . . . 511) and all other quantities are in the range of (32 . . . 470). Since the input to the Top-Level Registers CSC is Y, $C_R$, $C_B$, only the third and fourth of these equations are of relevance.

In the CSC design, the precision of the coefficients was chosen so that, for 9 bit data, all output values were within plus or minus 1 bit of the values produced by a full floating point simulation of the algorithm (this is the best accuracy that it is possible to achieve). This gave 13 bit twos-complement coefficients for cx0–cx3 and 14 bit twos-complement coefficients for cx4. The coefficients for all the design conversions are given below in both decimal and hex.

It should be noted that each output can be formed from any allowed combination of coefficients and inputs plus (or minus) a constant. Thus, for any given color-space conversion, the order of the outputs can be changed by swapping the rows in the transform matrix (i.e., the addresses into which the coefficients are written).

The CSC is guaranteed to work for all the transforms in Table C.8.1. If other transforms are used the user must remember the following:

1) The hardware will not work if any intermediate result in the calculation requires greater than 10 bits of precision (excluding the sign bit).

2)The output of the CSC is saturated to 0 and 511. That is, any number less than 0 is replaced with 0 and any number more than 511 is replaced with 511. The implementation of the saturation logic assumes that the results will only be slightly above 511 or slightly below 0. If the CSC is programmed incorrectly, then a common symptom will be that the output appears to saturate all (or most of) the time.

C.9.3 Description of the CSC

The structure of the CSC is illustrated in FIG. 169, where only two of the three "components" have been shown because of space limitations. In the Figure, "register" or "R" implies a master-slave register and "latch" or "L" implies a transparent latch.

TABLE C.8.1

| | Coefficients for Various Conversions | | | | | | | |
|---|---|---|---|---|---|---|---|---|
| | $E_R$->Y | | R->Y | | Y->$E_R$ | | Y->R | |
| Coeff | Dec | Hex | Dec | Hex | Dec | Hex | Dec | Hex |
| c01 | 0.299 | 0132 | 0.256 | | 1.0 | 0400 | 1.159 | 04AD |
| c02 | 0.587 | 0259 | 0.502 | | 1.402 | 059C | 1.639 | 068E |
| c03 | 0.114 | 0075 | 0.098 | | 0.0 | 0000 | 0.0 | 0000 |
| c04 | 0.0 | 0000 | 16 | | −179.456 | F4C8 | −229.478 | F1B8 |
| c11 | 0.5 | 0200 | 0.428 | | 1.0 | 0400 | 1.169 | 04AD |
| c12 | −0.419 | FE53 | −0.358 | | −0.714 | FD25 | −0.836 | FCA9 |
| c13 | −0.081 | FFAD | −0.070 | | −0.344 | FEA0 | −0.402 | FE64 |
| c14 | 128.0 | 0800 | 128 | | 135.5 | 0878 | 139.7 | 08BA |
| c21 | −0.169 | FF53 | −0.144 | | 1.0 | 0400 | 1.169 | 04AD |
| c22 | −0.331 | FEAD | −0.283 | | 0.0 | 0000 | 0.0 | 0000 |
| c23 | 0.5 | 0200 | 0.427 | | 1.772 | 0717 | 2.071 | 0849 |
| c24 | 128 | 0800 | 128 | | −226.816 | F1D2 | −283.84 | EE42 |

All these numbers are calculated from the fundamental equation:

$$Y=0.299E_R+0.587E_G+0.0114E_B$$

and the following color-difference equations:

$$C_R=E_R-Y$$

$$C_B=E_B-Y$$

The equations in R, G and B are derived from these after the full-scale ranges of these quantities are considered.

C.9.2 Using the Color-Space Converter

On reset, c01, c12, and c23 are set to 1 and all other coefficients are set to 0. Thus, y0=x0, y1=x1 and y2=x2 and all data is passed through unaltered. To select a color-space conversion, simply write the appropriate coefficients (from Table C.8.1, for example) into the locations specified in the address map.

Referring to the schematics, x0 . . . 2 correspond to in_data0 . . . 2 and y0 . . . 2 correspond to out_data0 . . . 2. Users should remember that input data to the CSC must be up-sampled to 4:4:4. If this is not the case, not only will the color-space transforms have no meaning, but the chip will lock.

All coefficients are loaded into read-write UPI registers which are not shown explicitly in the Figure. To understand the operation, consider the following sequence with reference to the left-most "component" (that which produces output out_data0):

1)Data arrives at inputs x0–2 (in_data0–2). This represents a single pixel in the input color-space. This is latched.

2)x0 is multiplied by c01 and latched into the first pipeline register. x1 and x2 move on one register.

3)x1 is multiplied by c02, added to (x1.c01) and latched into the next pipeline register. x2 moves on one register.

4)x2 is multiplied by c03 and added to the result of (3), producing (x1.c01+x2.c02+x3.c03). The result is latched into the next pipeline register.

5)The result of (4) is added to c04. Since data is kept in carry-save format through the multipliers, this adder is also used to resolve the data from the multiplier chain. The result is latched in the next pipeline register.

6)The final operation is to saturate the data. Partial results are passed from the resolving adder to the saturate block to achieve this.

It can be seen that the result is y0, as specified in the matrix equation at the start of this section. Similarly, y1 and y2 are formed in the same manner.

Three multipliers are used, with the coefficients as the multiplicand and the data as the multiplicator. This allows an efficient layout to be achieved, with partial results flowing down the datapath and the same input data being routed across three parallel and identical datapaths, one for each output.

To achieve the reset state described in Section C.9.2, each of the three "components" must be reset in a different way. In order to avoid having three sets of schematics and three slightly different layouts, this is achieved by having inputs to the UPI registers which are tied high or low at the top level.

The CSC has almost no control associated with it. Nevertheless, each pipeline stage is a two-wire interface stage, so there is a chain of valid and accept latches with their associated control (in_accept=out_accept_r+lin_valid_r). The CSC is, therefore, a 5-stage deep two-wire interface, capable of holding 10 levels of data when stalled.

The output of the CSC contain re-synchronizing latches because the next function in the output pipe runs off a different clock generator.

SECTION C.10 Output Controller

C.10.1 Introduction

The output controller, in accordance with the present invention, handles the following functions:

It provides data in one of three modes 24-bit 4:4:4

16-bit 4:2:2

8-bit 4:2:2

It aligns the data to the video display window defined by the vsync and hsync pulses and by programmed timing registers It adds a border around the video window, if required

C.10.2 Ports

Input two wire interface:

in_valid in_accept in_data[23:0]

Output two wire interface:

out_valid out_accept out_data[23:0]

out_active out_window out_comp[1:0]

in_vsync, in_hsync nupdata[7:0], upaddr[4:0], upsel, rstr, wstr tdin, tdout, tph0, tckm, tcks chiptest ph0, ph1, notrst0, notrst1

C.10.3 Out Modes

The format of the output is selected by writing to the opmode register.

C.10.3.1 Mode 0

This mode is 24-bit 4:4:4 RGB or YCrCb. Input data passes directly to the output.

C.10.3.2 Modes 1 and 2

These modes present 4:2:2 YCrCb. Assuming in_data [23:16] is Y, in_data[15:8] is Cr and in_data[7:0] is Cb.

C.10.3.2.1 Mode 1

In 16-bit YCrCb, Y is presented on out_data[15:8]. Cr and Cb are time multiplexed on out_data[7:0], Cb first. Out_data[23:16] is not used.

C.10.3.2.2 Mode 2

In 8-bit YCrCb, Y,Cr and Cb are time multiplexed on out_data[7:0] in the order Cb, Y, Cr, Y. Out_data[23:8] is not used.

C.10.3.3 Output Timing

The following registers are used to place the data in a video display window.

vdelay—The number of hsync pulses following a vsync pulse before the first line of video or border.

hdelay—The number of clock cycles between hsync and the first pixel of video or border.

height—The height of the video window, in lines.

width—The width of the video window, in pixels.

north, south—The height of the border, respectively, above and below the video window, in lines.

west, east—The width of the border, respectively, to the left and to the right of the video window, in pels.

The minimum vdelay is zero. The first hsync is the first active line. The minimum value that can be programmed into hdelay is 2. Note, however, that the actual delay from in_hsync to the first active output pixel is hdelay+1 cycles.

Any edge of the border can have the value zero. The color of the border is selected by writing to the registers border_r, border_g and border_b. The color of the area outside the border is selected by writing to the registers blank_r, blank_g and blank_b. Note that the multiplexing performed in output modes 1 and 2 will also affect the border and blank components. That is, the values in these registers correspond with in_data[23:16], in_data[15:8] and in_data [7:0].

C.10.4 Output Flags out_active indicates that the output data is part of the active window, i.e., video data or border.

out_window indicates that the output data is part of the video window.

out_comp [1:0] indicates which color component is present on out_data[7:0] in output modes 1 and 2. In mode 1, 0=Cb, 1=Cr. In mode 2, 0=Y, 1=Cr, 2=Cb.

C.10.5 Two-Wire Mode

The two-wire mode of the present invention is selected by writing 1 to the two wire register. It is not selected following reset. In two wire mode, the output timing registers and sync signals are ignored and the flow of data through the block is controlled by out_accept. Note that in normal operation, out_accept should be tied high.

C.10.6 Snooper

There is a super-snooper on the output of the block which includes access to the output flags.

C.10.7 How It Works

Two identical down-counters keep track of the current position in the display. "Vcount" decrements on hsyncs and loads from the appropriate timing register on vsync or at its terminal count. "Hcount" decrements on every pixel and loads on hsync or at its terminal count. Note that in output mode 2, one pixel corresponds to two clock cycles.

SECTION C.11 The Clock Dividers

C.11.1 Overview

Top-Level Registers in the present invention contain two identical Clock Dividers, one to generate a PICTURE_CLK and one to generate an AUDIO_CLK. The Clock Dividers are identical and are controlled independently. Therefore, only one need be described here. From the user's point of view, the only difference is that each Clock Divider's divisor register is mapped into a different set of addresses in the memory map.

The Clock Divider's function is to provide a 4× sysclk divided clock frequency, with no requirement for an even mark-space ratio.

The divisor is required to lay in the range −0 to −16,000, 000 and, therefore, it can be represented using 24bits with the restriction that the minimum divisor be 16. This is because the Clock Divider will approximate an equal mark-space ratio (to within one sysclk cycle) by using divisor/2. As the maximum clock frequency available is sysclk, the maximum divided frequency available is sysclk/2. Furthermore, because four counters are used in cascade divisor/2 must never be less than 8, else the divided clock output will be driven to the positive power rail.

C.11.2 Using a Clock Divider

The address map for each Clock Divider consists of 4 locations corresponding to three 8-bit divisor registers and one 1-bit access register. The Clock Divider will power-up inactive and is activated by the completion of an access to its divisor register.

The divisor registers may be written in any order according to the address map in Table C.10.1. The Clock Divider is activated by sensing a synchronized 0 to 1 transition in its access bit. The first time a transition is sensed, the Clock Divider will come out of reset and generate a divided clock. Subsequent transitions (assuming the divisor has also been altered) will merely cause the Clock Divider to lock to its new frequency "on-the-fly." Once activated, there is no way of halting the Clock Divider other than by Chip RESET.

TABLE C.10.1

Clock Divider Registers

| Address | Register |
|---|---|
| 00b | access bit |
| 01b | divisor MSB |
| 10b | divisor |
| 11b | divisor LSB |

Any divisor value in the range 16 to 16,777,216 may be used.

C.11.3 Description of the Clock Divider

The Clock Divider is implemented as four 22 bit counters which are cascaded such that as one counter carries, it will activate the next counter in turn. A counter will count down the value of divisor/4 before carrying and, therefore, each counter will take it, in turn, to generate a pulse of the divided clock frequency.

After carrying, the counter will reload with divisor/8 and this is counted down to produce the approximate equal mark-space ratio divided clock. As each counter reloads from the divisor register when it is activated by the previous counter, this enables the divided clock frequency to be changed on the fly by simply altering the contents of the divisor.

Each counter is clocked by its own independent clock generator in order to control clock skew between counters precisely and to allow each counter to be clocked by a different set of clocks.

A state machine controls the generation of the divisor/4 and divisor/8 values and also multiplexes the correct source clocks from the PLL to the clock generators. The counters are clocked by different clocks dependent on the value of the divisor. This is because different divisor values will produce a divided clock whose edges are placed using different combinations of the clocks provided from the PLL.

C.11.4 Testing the Clock Divider

The Clock Divider may be tested by powering up the Chip with CHIPTEST High. This will have the effect of forcing all of the clocked logic in the Clock Divider to be clocked by sysclk, as opposed to, the clocks generated by the PLL.

The Clock Divider has been designed with full scan and, thus, may subsequently be tested using standard JTAG access, as long as the Chip has been powered up as above.

The functionality of the Clock Divider is NOT guaranteed if CHIPTEST is held High while the device is running in normal operation.

SECTION C.12 Address Maps

C.12.1 Top Level Address Nap

Notes:—

1) The register for the Top Level Address Map as set forth in Table C.11.1 are the names used during the design. They are not necessarily the names that will appear on the datasheet.

2) Since this is a full address map, many of the locations listed here include locations for test only.

TABLE C.11.1

Top-Level Registers A Top Level Address Map

| REGISTER NAME | Address | Bits | COMMENT |
|---|---|---|---|
| BU_EVENT | 0x0 | 8 | Write 1 to reset |
| BU_MASK | 0x1 | 8 | R/W |
| BU_EN_INTERRUPTS | 0x2 | 1 | R/W |
| BU_WADDR_COD_STD | 0x4 | 2 | R/W |
| BU_WADDR_ACCESS | 0x5 | 1 | R/W-access |
| BU_WADDR_CTL1 | 0x6 | 3 | R/W |
| BU_DISPADDR_LINES_IN_LAST_ROW0 | 0x8 | 3 | R/W |
| BU_DISPADDR_LINES_IN_LAST_ROW1 | 0x9 | 3 | R/W |
| BU_DISPADDR_LINES_IN_LAST_ROW2 | 0xa | 3 | R/W |
| BU_DISPADDR_ACCESS | 0xb | 1 | R/W-access |
| BU_DISPADDR_CTL0 | 0xc | 8 | R/W |
| BU_DISPADDR_CTL1 | 0xd | 1 | R/W |
| BU_BM_ACCESS | 0x10 | 1 | R/W-access |
| BU_BM_CTL0 | 0x11 | 2 | R/W |
| BU_BM_TARGET_IX | 0x12 | 4 | R/W |
| BU_BM_PRES_NUM | 0x13 | 8 | R/W-asynchronous |
| BU_BM_THIS_PNUM | 0x14 | 8 | R/W |
| BU_BM_PIC_NUM0 | 0x15 | 8 | R/W |
| BU_BM_PIC_NUM1 | 0x16 | 8 | R/W |
| BU_BM_PIC_NUM2 | 0x17 | 8 | R/W |
| BU_BM_TEMP_REF | 0x18 | 5 | RO |

TABLE C.11.1-continued

Top-Level Registers A Top Level Address Map

| REGISTER NAME | Address | Bits | COMMENT |
|---|---|---|---|
| BU_ADDRGEN_KEYHOLE_ADDR_MSB | 0x28 | 1 | R/W-Address generator |
| BU_ADDRGEN_KEYHOLE_ADDR_LSB | 0x29 | 8 | keyhole. See |
| BU_ADDRGEN_KEYHOLE_DATA | 0x2a | 8 | Table C.11.2 for contents |
| BU_IT_PAGE_START | 0x30 | 5 | R/W |
| BU_IT_READ_CYCLE | 0x31 | 4 | R/W |
| BU_IT_WRITE_CYCLE | 0x32 | 4 | R/W |
| BU_IT_REFRESH_CYCLE | 0x33 | 4 | R/W |
| BU_IT_RAS_FALLING | 0x34 | 4 | R/W |
| BU_IT_CAS_FALLING | 0x35 | 4 | R/W |
| BU_IT_CONFIG | 0x36 | 1 | R/W |
| BU_OC_ACCESS | 0x40 | 1 | R/W-access |
| BU_OC_MODE | 0x41 | 2 | R/W |
| BU_OC_2WIRE | 0x42 | 1 | R/W |
| BU_OC_BORDER_R | 0x49 | 8 | R/W |
| BU_OC_BORDER_G | 0x4a | 8 | R/W |
| BU_OC_BORDER_B | 0x4b | 8 | R/W |
| BU_OC_BLANK_R | 0x4d | 8 | R/W |
| BU_OC_BLANK_G | 0x4e | 8 | R/W |
| BU_OC_BLANK_B | 0x4f | 8 | R/W |
| BU_OC_HDELAY_1 | 0x50 | 3 | R/W |
| BU_OC_HDELAY_0 | 0x51 | 8 | R/W |
| BU_OC_WEST_1 | 0x52 | 3 | R/W |
| BU_OC_WEST_0 | 0x53 | 8 | R/W |
| BU_OC_EAST_1 | 0x54 | 3 | R/W |
| BU_OC_EAST_0 | 0x55 | 8 | R/W |
| BU_OC_WIDTH_1 | 0x56 | 3 | R/W |
| BU_OC_WIDTH_0 | 0x57 | 8 | R/W |
| BU_OC_VDELAY_1 | 0x58 | 3 | R/W |
| BU_OC_VDELAY_0 | 0x59 | 8 | R/W |
| BU_OC_NORTH_1 | 0x5a | 3 | R/W |
| BU_OC_NORTH_0 | 0x5b | 8 | R/W |
| BU_OC_SOUTH_1 | 0x5c | 3 | R/W |
| BU_OC_SOUTH_0 | 0x5d | 8 | R/W |
| BU_OC_HEIGHT_1 | 0x5e | 3 | R/W |
| BU_OC_HEIGHT_0 | 0x5f | 8 | R/W |
| BU_IF_CONFIGURE | 0x60 | 5 | R/W |
| BU_UV_MODE | 0x61 | 6 | R/W-xnnnxnnn |
| BU_COEFF_KEYADDR | 0x62 | 7 | R/W-See Table C.11.3 |
| BU_COEFF_KAYDATA | 0x63 | 8 | for contents. |
| BU_GA_ACCESS | 0x68 | 1 | R/W |
| BU_GA_BYPASS | 0x69 | 1 | R/W |
| BU_GA_RAM0_ADDR | 0x6a | 8 | R/W |
| BU_GA_RAM0_DATA | 0x6b | 8 | R/W |
| BU_GA_RAM1_ADDR | 0x6c | 8 | R/W |
| BU_GA_RAM1_DATA | 0x6d | 8 | R/W |
| BU_GA_RAM2_ADDR | 0x6e | 8 | R/W |
| BU_GA_RAM2_DATA | 0x6f | 8 | R/W |
| BU_DIVA_3 | 0x70 | 1 | R/W |
| BU_DIVA_2 | 0x71 | 8 | R/W |
| BU_DIVA_1 | 0x72 | 8 | R/W |
| BU_DIVA_0 | 0x73 | 8 | R/W |
| BU_DIVP_3 | 0x74 | 1 | R/W |
| BU_DIVP_2 | 0x75 | 8 | R/W |
| BU_DIVP_1 | 0x76 | 8 | R/W |
| BU_DIVP_0 | 0x77 | 8 | R/W |
| BU_PAD_CONFIG_1 | 0x78 | 7 | R/W |
| BU_PAD_CONFIG_0 | 0x79 | 8 | R/W |
| BU_PLL_RESISTORS | 0x7a | 8 | R/W |
| BU_REF_INTERVAL | 0x7b | 8 | R/W |
| BU_REVISION | 0xff | 8 | RO-revision |
| The following registers are in the "test space". They are unlikely to appear on the datasheet. | | | |
| BU_BM_PRES_FLAG | 0x80 | 1 | R/W |
| BU_BM_EXP_TR | 0x81 | — | These registers are |
| BU_BM_TR_DELTA | 0x82 | — | missing on revA |
| BU_BM_ARR_IX | 0x83 | 2 | R/W |
| BU_BM_DSP_IX | 0x84 | 2 | R/W |
| BU_BM_RDY_IX | 0x85 | 2 | R/W |
| BU_BM_ESTATE3 | 0x86 | 2 | R/W |
| BU_BM_ESTATE2 | 0x87 | 2 | R/W |
| BU_BM_ESTATE1 | 0x88 | 2 | R/W |
| BU_BM_INDEX | 0x89 | 2 | R/W |
| BU_BM_STATE | 0x8a | 5 | R/W |
| BU_BM_FROMPS | 0x8b | 1 | R/W |
| BU_BM_FROMFL | 0x8c | 1 | R/W |

TABLE C.11.1-continued

Top-Level Registers A Top Level Address Map

| REGISTER NAME | Address | Bits | COMMENT |
|---|---|---|---|
| BU_DA_COMP0_SNP3 | 0x90 | 8 | R/W-These are the three |
| BU_DA_COMP0_SNP2 | 0x91 | 8 | snoopers on the display |
| BU_DA_COMP0_SNP1 | 0x92 | 8 | address generators |
| BU_DA_COMP0_SNP0 | 0x93 | 8 | address output |
| BU_DA_COMP1_SNP3 | 0x94 | 8 | |
| BU_DA_COMP1_SNP2 | 0x95 | 8 | |
| BU_DA_COMP1_SNP1 | 0x96 | 8 | |
| BU_DA_COMP1_SNP0 | 0x97 | 8 | |
| BU_DA_COMP2_SNP3 | 0x98 | 8 | |
| BU_DA_COMP2_SNP2 | 0x99 | 8 | |
| BU_DA_COMP2_SNP1 | 0x9a | 8 | |
| BU_DA_COMP2_SNP0 | 0x9b | 8 | |
| BU_UV_RAM1A_ADDR_1 | 0xa0 | 8 | R/W-upi test access into |
| BU_UV_RAM1A_ADDR_0 | 0xa1 | 8 | the vertical upsamplers |
| BU_UV_RAM1A_DATA | 0xa2 | 8 | RAMs |
| BU_UV_RAM1B_ADDR_1 | 0xa4 | 8 | |
| BU_UV_RAM1B_ADDR_0 | 0xa5 | 8 | |
| BU_UV_RAM1B_DATA | 0xa6 | 8 | |
| BU_UV_RAM2A_ADDR_1 | 0xa8 | 8 | |
| BU_UV_RAM2A_ADDR_0 | 0xa9 | 8 | |
| BU_UV_RAM2A_DATA | 0xaa | 9 | |
| BU_UV_RAM2B_ADDR_1 | 0xac | 8 | |
| BU_UV_RAM2B_ADDR_0 | 0xad | 8 | |
| BU_UV_RAM2B_DATA | 0xae | 8 | |
| BU_WA_ADDR_SNP2 | 0xb0 | 8 | R/W-snooper on the write |
| BU_WA_ADDR_SNP1 | 0xb1 | 8 | address generator address |
| BU_WA_ADDR_SNP0 | 0xb2 | 8 | o/p. |
| BU_WA_DATA_SNP1 | 0xb4 | 8 | R/W-snooper on data |
| BU_WA_DATA_SNP0 | 0xb5 | 8 | output of WA |
| BU_IF_SNP0_1 | 0xb8 | 8 | R/W-Three snoopers on |
| BU_IF_SNP0_0 | 0xb9 | 8 | the dramif data outputs. |
| BU_IF_SNP1_1 | 0xba | 8 | |
| BU_IF_SNP1_0 | 0xbb | 8 | |
| BU_IF_SNP2_1 | 0xbc | 8 | |
| BU_IF_SNP2_0 | 0xbd | 8 | |
| BU_IFRAM_ADDR_1 | 0xc0 | 1 | R/W-upi access it if RAM |
| BU_IFRAM_ADDR_0 | 0xc1 | 8 | |
| BU_IFRAM_DATA | 0xc2 | 8 | |
| BU_OC_SNP_3 | 0xc4 | 8 | R/W-snooper on output of |
| BU_OC_SNP_2 | 0xc5 | 8 | chip |
| BU_OC_SNP_1 | 0xc6 | 8 | |
| BU_OC_SNP_0 | 0xc7 | 8 | |
| BU_YAPLL_CONFIG | 0xc8 | 8 | R/W |
| BU_BM_FRONT_BYPASS | 0xca | 1 | R/W |

C.12.1 Address Generator Keyhole Space

Notes on address generator keyhole table:

1) All registers in the address generator keyhole take up 4 bytes of address space regardless of their width. The missing addresses (0×00, 0×04 etc.) will always read back zero.

2) The access bit of the relevant block (dispaddr or waddrgen) must be set before accessing this keyhole.

TABLE C.11.2

Top-Level RegisterA Address Generator Keyhole

| Keyhole Register Name | Keyhole Address | Bits | Comments |
|---|---|---|---|
| BU_DISPADDR_BUFFER0_BASE_MSB | 0x01 | 2 | 18 bit |
| BU_DISPADDR_BUFFER0_BASE_MID | 0x02 | 8 | register- |
| BU_DISPADDR_BUFFER0_BASE_LSB | 0x03 | 8 | Must be loaded |
| BU_DISPADDR_BUFFER1_BASE_MSB | 0x05 | 2 | Must be |
| BU_DISPADDR_BUFFER1_BASE_MID | 0x06 | 8 | Loaded |
| BU_DISPADDR_BUFFER1_BASE_LSB | 0x07 | 8 | |
| BU_DISPADDR_BUFFER2_BASE_MSB | 0x09 | 2 | Must be |

TABLE C.11.2-continued

Top-Level RegisterA Address Generator Keyhole

| Keyhole Register Name | Keyhole Address | Bits | Comments |
|---|---|---|---|
| BU_DISPADDR_BUFFER2_BASE_MID | 0x0a | 8 | Loaded |
| BU_DISPADDR_BUFFER2_BASE_LSB | 0x0b | 8 | |
| BU_DLDPATH_LINE0_MSB | 0x0d | 2 | Test only |
| BU_DLDPATH_LINE0_MID | 0x0e | 8 | |
| BU_DLDPATH_LINE0_LSB | 0x0f | 8 | |
| BU_DLDPATH_LINE1_MSB | 0x11 | 2 | Test only |
| BU_DLDPATH_LINE1_MID | 0x12 | 8 | |
| BU_DLDPATH_LINE1_LSB | 0x13 | 8 | |
| BU_DLDPATH_LINE2_MSB | 0x15 | 2 | Test only |
| BU_DLDPATH_LINE2_MID | 0x16 | 8 | |
| BU_DLDPATH_LINE2_LSB | 0x17 | 8 | |
| BU_DLDPATH_VBCNT0_MSB | 0x19 | 2 | Test only |
| BU_DLDPATH_VBCNT0_MID | 0x1a | 8 | |
| BU_DLDPATH_VBCNT0_LSB | 0x1b | 8 | |
| BU_DLDPATH_VBCNT1_MSB | 0x1d | 2 | Test only |
| BU_DLDPATH_VBCNT1_MID | 0x1e | 8 | |
| BU_DLDPATH_VBCNT1_LSB | 0x1f | 8 | |
| BU_DLDPATH_VBCNT2_MSB | 0x21 | 2 | Test only |
| BU_DLDPATH_VBCNT2_MID | 0x22 | 8 | |
| BU_DLDPATH_VBCNT2_LSB | 0x23 | 8 | |
| BU_DISPADDR_COMP0_OFFSET_MSB | 0x25 | 2 | Must be |
| BU_DISPADDR_COMP0_OFFSET_MID | 0x26 | 8 | Loaded |
| BU_DISPADDR_COMP0_OFFSET_LSB | 0x27 | 8 | |
| BU_DISPADDR_COMP1_OFFSET_MSB | 0x29 | 2 | Must be |
| BU_DISPADDR_COMP1_OFFSET_MID | 0x2a | 8 | Loaded |
| BU_DISPADDR_COMP1_OFFSET_LSB | 0x2b | 8 | |
| BU_DISPADDR_COMP2_OFFSET_MSB | 0x2d | 2 | Must be |
| BU_DISPADDR_COMP2_OFFSET_MID | 0x2e | 8 | Loaded |
| BU_DISPADDR_COMP2_OFFSET_LSB | 0x2f | 8 | |
| BU_DISPADDR_COMP0_VBS_MSB | 0x31 | 2 | Must be |
| BU_DISPADDR_COMP0_VBS_MID | 0x32 | 8 | Loaded |
| BU_DISPADDR_COMP0_VBS_LSB | 0x33 | 8 | |
| BU_DISPADDR_COMP1_VBS_MSB | 0x35 | 2 | Must be |
| BU_DISPADDR_COMP1_VBS_MID | 0x36 | 8 | Loaded |
| BU_DISPADDR_COMP1_VBS_LSB | 0x37 | 8 | |
| BU_DISPADDR_COMP2_VBS_MSB | 0x39 | 2 | Must be |
| BU_DISPADDR_COMP2_VBS_MID | 0x3a | 8 | Loaded |
| BU_DISPADDR_COMP2_VBS_LSB | 0x3b | 8 | |
| BU_ADDR_COMP0_HBS_MSB | 0x3d | 2 | Must be |
| BU_ADDR_COMP0_HBS_MID | 0x3e | 8 | Loaded |
| BU_ADDR_COMP0_HBS_LSB | 0x3f | 8 | |
| BU_ADDR_COMP1_HBS_MSB | 0x41 | 2 | Must be |
| BU_ADDR_COMP1_HBS_MID | 0x42 | 8 | Loaded |
| BU_ADDR_COMP1_HBS_LSB | 0x43 | 8 | |
| BU_ADDR_COMP2_HBS_MSB | 0x45 | 2 | Must be |
| BU_ADDR_COMP2_HBS_MID | 0x46 | 8 | Loaded |
| BU_ADDR_COMP2_HBS_LSB | 0x47 | 8 | |
| BU_DISPADDR_COMP0_HBS_MSB | 0x49 | 2 | Must be |
| BU_DISPADDR_COMP0_HBS_MID | 0x4a | 8 | Loaded |
| BU_DISPADDR_COMP0_HBS_LSB | 0x4b | 8 | |
| BU_DISPADDR_COMP1_HBS_MSB | 0x4d | 2 | Must be |
| BU_DISPADDR_COMP1_HBS_MID | 0x4e | 8 | Loaded |
| BU_DISPADDR_COMP1_HBS_LSB | 0x4f | 8 | |
| BU_DISPADDR_COMP2_HBS_MSB | 0x51 | 2 | Must be |
| BU_DISPADDR_COMP2_HBS_MID | 0x52 | 8 | Loaded |
| BU_DISPADDR_COMP2_HBS_LSB | 0x53 | 8 | |
| BU_DISPADDR_CNT_LEFT0_MSB | 0x55 | 2 | Test only |
| BU_DISPADDR_CNT_LEFT0_MID | 0x56 | 8 | |
| BU_DISPADDR_CNT_LEFT0_LSB | 0x57 | 8 | |
| BU_DISPADDR_CNT_LEFT1_MSB | 0x59 | 2 | Test only |
| BU_DISPADDR_CNT_LEFT1_MID | 0x5a | 8 | |
| BU_DISPADDR_CNT_LEFT1_LSB | 0x5b | 8 | |
| BU_DISPADDR_CNT_LEFT2_MSB | 0x5d | 2 | Test only |
| BU_DISPADDR_CNT_LEFT2_MID | 0x5e | 8 | |
| BU_DISPADDR_CNT_LEFT2_LSB | 0x5f | 8 | |
| BU_DISPADDR_PAGE_ADDR0_MSB | 0x61 | 2 | Test only |
| BU_DISPADDR_PAGE_ADDR0_MID | 0x62 | 8 | |
| BU_DISPADDR_PAGE_ADDR0_LSB | 0x63 | 8 | |
| BU_DISPADDR_PAGE_ADDR1_MSB | 0x65 | 2 | Test only |
| BU_DISPADDR_PAGE_ADDR1_MID | 0x66 | 8 | |
| BU_DISPADDR_PAGE_ADDR1_LSB | 0x67 | 8 | |
| BU_DISPADDR_PAGE_ADDR2_MSB | 0x69 | 2 | Test only |
| BU_DISPADDR_PAGE_ADDR2_MID | 0x6a | 8 | |
| BU_DISPADDR_PAGE_ADDR2_LSB | 0x6b | 8 | |

TABLE C.11.2-continued

Top-Level RegisterA Address Generator Keyhole

| Keyhole Register Name | Keyhole Address | Bits | Comments |
|---|---|---|---|
| BU_DISPADDR_BLOCK_ADDR0_MSB | 0x6d | 2 | Test only |
| BU_DISPADDR_BLOCK_ADDR0_MID | 0x5e | 8 | |
| BU_DISPADDR_BLOCK_ADDR0_LSB | 0x6f | 8 | |
| BU_DISPADDR_BLOCK_ADDR1_MSB | 0x71 | 2 | Test only |
| BU_DISPADDR_BLOCK_ADDR1_MID | 0x72 | 8 | |
| BU_DISPADDR_BLOCK_ADDR1_LSB | 0x73 | 8 | |
| BU_DISPADDR_BLOCK_ADDR2_MSB | 0x75 | 2 | Test only |
| BU_DISPADDR_BLOCK_ADDR2_MID | 0x76 | 8 | |
| BU_DISPADDR_BLOCK_ADDR2_LSB | 0x77 | 8 | |
| BU_DISPADDR_BLOCKS_LEFT0_MSB | 0x79 | 2 | Test only |
| BU_DISPADDR_BLOCKS_LEFT0_MID | 0x7a | 8 | |
| BU_DISPADDR_BLOCKS_LEFT0_LSB | 0x7b | 8 | |
| BU_DISPADDR_BLOCKS_LEFT1_MSB | 0x7d | 2 | Test only |
| BU_DISPADDR_BLOCKS_LEFT1_MID | 0x7e | 8 | |
| BU_DISPADDR_BLOCKS_LEFT1_LSB | 0x7f | 8 | |
| BU_DISPADDR_BLOCKS_LEFT2_MSB | 0x81 | 2 | Test only |
| BU_DISPADDR_BLOCKS_LEFT2_MID | 0x82 | 8 | |
| BU_DISPADDR_BLOCKS_LEFT2_LSB | 0x83 | 8 | |
| BU_WADDR_BUFFER0_BASE_MSB | 0x85 | 2 | Must be |
| BU_WADDR_BUFFER0_BASE_MID | 0x86 | 8 | Loaded |
| BU_WADDR_BUFFER0_BASE_LSB | 0x87 | 8 | |
| BU_WADDR_BUFFER1_BASE_MSB | 0x89 | 2 | Must be |
| BU_WADDR_BUFFER1_BASE_MID | 0x8a | 8 | Loaded |
| BU_WADDR_BUFFER1_BASE_LSB | 0x8b | 8 | |
| BU_WADDR_BUFFER2_BASE_MSB | 0x8d | 2 | Must be |
| BU_WADDR_BUFFER2_BASE_MID | 0x8e | 8 | Loaded |
| BU_WADDR_BUFFER2_BASE_LSB | 0x8f | 8 | |
| BU_WADDR_COMP0_HMBADDR_MSB | 0x91 | 2 | Test only |
| BU_WADDR_COMP0_HMBADDR_MID | 0x92 | 8 | |
| BU_WADDR_COMP0_HMBADDR_LSB | 0x93 | 8 | |
| BU_WADDR_COMP1_HMBADDR_MSB | 0x95 | 2 | Test only |
| BU_WADDR_COMP1_HMBADDR_MID | 0x96 | 8 | |
| BU_WADDR_COMP1_HMBADDR_LSB | 0x97 | 8 | |
| BU_WADDR_COMP2_HMBADDR_MSB | 0x99 | 2 | Test only |
| BU_WADDR_COMP1_HMBADDR_MID | 0x9a | 8 | |
| BU_WADDR_COMP1_HMBADDR_LSB | 0x9b | 8 | |
| BU_WADDR_COMP0_VMBADDR_MSB | 0x9d | 2 | Test only |
| BU_WADDR_COMP0_VMBADDR_MID | 0x9e | 8 | |
| BU_WADDR_COMP0_VMBADDR_LSB | 0x9f | 8 | |
| BU_WADDR_COMP1_VMBADDR_MSB | 0xa1 | 2 | Test only |
| BU_WADDR_COMP1_VMBADDR_MID | 0xa2 | 8 | |
| BU_WADDR_COMP1_VMBADDR_LSB | 0xa3 | 8 | |
| BU_WADDR_COMP2_VMBADDR_MSB | 0xa5 | 2 | Test only |
| BU_WADDR_COMP2_VMBADDR_MID | 0xa6 | 8 | |
| BU_WADDR_COMP2_VMBADDR_LSB | 0xa7 | 8 | |
| BU_WADDR_VBADDR_MSB | 0xa9 | 2 | Test only |
| BU_WADDR_VBADDR_MID | 0xaa | 8 | |
| BU_WADDR_VBADDR_LSB | 0xab | 8 | |
| BU_WADDR_COMP0_HALF_WIDTH_IN_BLOCKS_MSB | 0xad | 2 | Must be |
| BU_WADDR_COMP0_HALF_WIDTH_IN_BLOCKS_MID | 0xae | 8 | Loaded |
| BU_WADDR_COMP0_HALF_WIDTH_IN_BLOCKS_LSB | 0xaf | 8 | |
| BU_WADDR_COMP1_HALF_WIDTH_IN_BLOCKS_MSB | 0xb1 | 2 | Must be |
| BU_WADDR_COMP1_HALF_WIDTH_IN_BLOCKS_MID | 0xb2 | 8 | Loaded |
| BU_WADDR_COMP1_HALF_WIDTH_IN_BLOCKS_LSB | 0xb3 | 8 | |
| BU_WADDR_COMP2_HALF_WIDTH_IN_BLOCKS_MSB | 0xb5 | 2 | Must be |
| BU_WADDR_COMP2_HALF_WIDTH_IN_BLOCKS_MID | 0xb6 | 8 | Loaded |
| BU_WADDR_COMP2_HALF_WIDTH_IN_BLOCKS_LSB | 0xb7 | 8 | |
| BU_WADDR_HB_MSB | 0xb9 | 2 | Test only |
| BU_WADDR_HB_MID | 0xba | 8 | |
| BU_WADDR_HB_LSB | 0xbb | 8 | |
| BU_WADDR_COMP0_OFFSET_MSB | 0xbd | 2 | Must be |
| BU_WADDR_COMP0_OFFSET_MID | 0xbe | 8 | Loaded |
| BU_WADDR_COMP0_OFFSET_LSB | 0xbf | 8 | |
| BU_WADDR_COMP1_OFFSET_MSB | 0xc1 | 2 | Must be |
| BU_WADDR_COMP1_OFFSET_MID | 0xc2 | 8 | Loaded |
| BU_WADDR_COMP1_OFFSET_LSB | 0xc3 | 8 | |
| BU_WADDR_COMP2_OFFSET_MSB | 0xc5 | 2 | Must be |
| BU_WADDR_COMP2_OFFSET_MID | 0xc6 | 8 | Loaded |
| BU_WADDR_COMP2_OFFSET_LSB | oxc7 | 8 | |
| BU_WADDR_SCRATCH_MSB | 0xc9 | 2 | Test only |
| BU_WADDR_SCRATCH_MID | 0xca | 8 | |
| BU_WADDR_SCRATCH_LSB | 0xcb | 8 | |
| BU_WADDR_MBS_WIDE_MSB | 0xcd | 2 | Must be |
| BU_WADDR_MBS_WIDE_MID | 0xce | 8 | Loaded |

TABLE C.11.2-continued

Top-Level RegisterA Address Generator Keyhole

| Keyhole Register Name | Keyhole Address | Bits | Comments |
|---|---|---|---|
| BU_WADDR_MBS_WIDE_LSB | 0xcf | 8 | |
| BU_WADDR_MBS_HIGH_MSB | 0xd1 | 2 | Must be |
| BU_WADDR_MBS_HIGH_MID | 0xd2 | 8 | Loaded |
| BU_WADDR_MBS_HIGH_LSB | 0xd3 | 8 | |
| BU_WADDR_COMP0_LAST_MB_IN_ROW_MSB | 0xd5 | 2 | Must be |
| BU_WADDR_COMP0_LAST_MB_IN_ROW_MID | 0xd6 | 8 | Loaded |
| BU_WADDR_COMP0_LAST_MB_IN_ROW_LSB | 0xd7 | 8 | |
| BU_WADDR_COMP1_LAST_MB_IN_ROW_MSB | 0xd9 | 2 | Must be |
| BU_WADDR_COMP1_LAST_MB_IN_ROW_MID | 0xda | 8 | Loaded |
| BU_WADDR_COMP1_LAST_MB_IN_ROW_LSB | 0xdb | 8 | |
| BU_WADDR_COMP2_LAST_MB_IN_ROW_MSB | 0xdd | 2 | Must be |
| BU_WADDR_COMP2_LAST_MB_IN_ROW_MID | 0xde | 8 | Loaded |
| BU_WADDR_COMP2_LAST_MB_IN_ROW_LSB | 0xdf | 8 | |
| BU_WADDR_COMP0_LAST_MB_IN_HALF_ROW_MSB | 0xe1 | 2 | Must be |
| BU_WADDR_COMP0_LAST_MB_IN_HALF_ROW_MID | 0xe2 | 8 | Loaded |
| BU_WADDR_COMP0_LAST_MB_IN_HALF_ROW_LSB | 0xe3 | 8 | |
| BU_WADDR_COMP1_LAST_MB_IN_HALF_ROW_MSB | 0xe5 | 2 | Must be |
| BU_WADDR_COMP1_LAST_MB_IN_HALF_ROW_MID | 0xe6 | 8 | Loaded |
| BU_WADDR_COMP1_LAST_MB_IN_HALF_ROW_LSB | 0xe7 | 8 | |
| BU_WADDR_COMP2_LAST_MB_IN_HALF_ROW_MSB | 0xe9 | 2 | Must be |
| BU_WADDR_COMP2_LAST_MB_IN_HALF_ROW_MID | 0xea | 8 | Loaded |
| BU_WADDR_COMP2_LAST_MB_IN_HALF_ROW_LSB | 0xeb | 8 | |
| BU_WADDR_COMP0_LAST_ROW_IN_MB_MSB | 0xed | 2 | Must be |
| BU_WADDR_COMP0_LAST_ROW_IN_MB_MID | 0xee | 8 | Loaded |
| BU_WADDR_COMP0_LAST_ROW_IN_MB_LSB | 0xef | 8 | |
| BU_WADDR_COMP1_LAST_ROW_IN_MB_MSB | 0xf1 | 2 | Must be |
| BU_WADDR_COMP1_LAST_ROW_IN_MB_MID | 0xf2 | 8 | Loaded |
| BU_WADDR_COMP1_LAST_ROW_IN_MB_LSB | 0xf3 | 8 | |
| BU_WADDR_COMP2_LAST_ROW_IN_MB_MSB | 0xf5 | 2 | Must be |
| BU_WADDR_COMP2_LAST_ROW_IN_MB_MID | 0xf6 | 8 | Loaded |
| BU_WADDR_COMP2_LAST_ROW_IN_MB_LSB | 0xf7 | 8 | |
| BU_WADDR_COMP0_BLOCKS_PER_MB_ROW_MSB | 0xf9 | 2 | Must be |
| BU_WADDR_COMP0_BLOCKS_PER_MB_ROW_MID | 0xfa | 8 | Loaded |
| BU_WADDR_COMP0_BLOCKS_PER_MB_ROW_LSB | 0xfb | 8 | |
| BU_WADDR_COMP1_BLOCKS_PER_MB_ROW_MSB | 0xfd | 2 | Must be |
| BU_WADDR_COMP1_BLOCKS_PER_MB_ROW_MID | 0xfe | 8 | Loaded |
| BU_WADDR_COMP1_BLOCKS_PER_MB_ROW_LSB | 0xff | 8 | |
| BU_WADDR_COMP2_BLOCKS_PER_MB_ROW_MSB | 0x101 | 2 | Must be |
| BU_WADDR_COMP2_BLOCKS_PER_MB_ROW_MID | 0x102 | 8 | Loaded |
| BU_WADDR_COMP2_BLOCKS_PER_MB_ROW_LSB | 0x103 | 8 | |
| BU_WADDR_COMP0_LAST_MB_ROW_MSB | 0x105 | 2 | Must be |
| BU_WADDR_COMP0_LAST_MB_ROW_MID | 0x106 | 8 | Loaded |
| BU_WADDR_COMP0_LAST_MB_ROW_LSB | 0x107 | 8 | |
| BU_WADDR_COMP1_LAST_MB_ROW_MSB | 0x109 | 2 | Must be |
| BU_WADDR_COMP1_LAST_MB_ROW_MID | 0x10a | 8 | Loaded |
| BU_WADDR_COMP1_LAST_MB_ROW_LSB | 0x10b | 8 | |
| BU_WADDR_COMP2_LAST_MB_ROW_MSB | 0x10d | 2 | Must be |
| BU_WADDR_COMP2_LAST_MB_ROW_MID | 0x10e | 8 | Loaded |
| BU_WADDR_COMP2_LAST_MB_ROW_LSB | 0x10f | 8 | |
| BU_WADDR_COMP0_HBS_MSB | 0x111 | 2 | Must be |
| BU_WADDR_COMP0_HBS_MID | 0x112 | 8 | Loaded |
| BU_WADDR_COMP0_HBS_LSB | 0x113 | 8 | |
| BU_WADDR_COMP1_HBS_MSB | 0x115 | 2 | Must be |
| BU_WADDR_COMP1_HBS_MID | 0x116 | 8 | Loaded |
| BU_WADDR_COMP1_HBS_LSB | 0x117 | 8 | |
| BU_WADDR_COMP2_HBS_MSB | 0x119 | 2 | Must be |
| BU_WADDR_COMP2_HBS_MID | 0x11a | 8 | Loaded |
| BU_WADDR_COMP2_HBS_LSB | 0x11b | 8 | |
| BU_WADDR_COMP0_MAXHB | 0x11f | 2 | Must be |
| BU_WADDR_COMP1_MAXHB | 0x123 | 2 | Loaded |
| BU_WADDR_COMP2_MAXHB | 0x127 | 2 | |
| BU_WADDR_COMP0_MAXVB | 0x12b | 2 | Must be |
| BU_WADDR_COMP1_MAXVB | 0x12f | 2 | Loaded |
| BU_WADDR_COMP2_MAXVB | 0x133 | 2 | |

C. 12.3 Horizontal Upsampler and Color Space Converter Keyhole

TABLE C.11.3

H-Upsamplers and Cspace Keyhole Address Map

| Keyhole Register Name | Keyhole Address | Bits | Comment |
|---|---|---|---|
| BU_UH0_A00_1 | 0x0 | 5 | R/W- Coeff 0,0 |
| BU_UH0_A00_0 | 0x1 | 8 | |
| BU_UH0_A01_1 | 0x2 | 5 | R/W- Coeff 0,1 |
| BU_UH0_A01_0 | 0x3 | 8 | |
| BU_UH0_A02_1 | 0x4 | 5 | R/W- Coeff 0,2 |
| BU_UH0_A02_0 | 0x5 | 8 | |
| BU_UH0_A03_1 | 0x6 | 5 | R/W- Coeff 0,0 |
| BU_UH0_A03_0 | 0x7 | 8 | |
| BU_UH0_A10_1 | 0x8 | 5 | R/W- Coeff 1,0 |
| BU_UH0_A10_0 | 0x9 | 8 | |
| BU_UH0_A11_1 | 0xa | 5 | R/W- Coeff 1,1 |
| BU_UH0_A11_0 | 0xb | 8 | |
| BU_UH0_A12_1 | 0xc | 5 | R/W- Coeff 1,2 |
| BU_UH0_A12_0 | 0xd | 8 | |
| BU_UH0_A13_1 | 0xe | 5 | R/W- Coeff 1,3 |
| BU_UH0_A13_0 | 0xf | 8 | |
| BU_UH0_A20_1 | 0x10 | 5 | R/W- Coeff 2.0 |
| BU_UH0_A20_0 | 0x11 | 8 | |
| BU_UH0_A21_1 | 0x12 | 5 | R/W- Coeff 2.1 |
| BU_UH0_A21_0 | 0x13 | 8 | |
| BU_UH0_A22_1 | 0x14 | 5 | R/W- Coeff 2,2 |
| BU_UH0_A22_0 | 0x15 | 8 | |
| BU_UH0_A23_1 | 0x16 | 5 | R/W- Coeff 2,3 |
| BU_UH0_A23_0 | 0x17 | 8 | |
| BU_UH0_MODE | 0x18 | 2 | R/W |
| BU_UH1_A00_1 | 0x20 | 5 | R/W- Coeff 0,0 |
| BU_UH1_A00_0 | 0x21 | 8 | |
| BU_UH1_A01_1 | 0x22 | 5 | R/W- Coeff 0,1 |
| BU_UH1_A01_0 | 0x23 | 8 | |
| BU_UH1_A02_1 | 0x24 | 5 | R/W- Coeff 0,2 |
| BU_UH1_A02_0 | 0x25 | 8 | |
| BU_UH1_A03_1 | 0x26 | 5 | R/W- Coeff 0,0 |
| BU_UH1_A03_0 | 0x27 | 8 | |
| BU_UH1_A10_1 | 0x28 | 5 | R/W- Coeff 1,0 |
| BU_UH1_A10_0 | 0x29 | 8 | |
| BU_UH1_A11_1 | 0x2a | 5 | R/W- Coeff 1,1 |
| BU_UH1_A11_0 | 0x2b | 8 | |
| BU_UH1_A12_1 | 0x2c | 5 | R/W- Coeff 1,2 |
| BU_UH1_A12_0 | 0x2d | 8 | |
| BU_UH1_A13_1 | 0x2e | 5 | R/W- Coeff 1,3 |
| BU_UH1_A13_0 | 0x2f | 8 | |
| BU_UH1_A20_1 | 0x30 | 5 | R/W- Coeff 2,0 |
| BU_UH1_A20_0 | 0x31 | 8 | |
| BU_UH1_A21_1 | 0x32 | 5 | R/W- Coeff 2,1 |
| BU_UH1_A21_0 | 0x33 | 8 | |
| BU_UH1_A22_1 | 0x34 | 5 | R/W- Coeff 2,2 |
| BU_UH1_A22_0 | 0x35 | 8 | |
| BU_UH1_A23_1 | 0x36 | 5 | R/W- Coeff 2,3 |
| BU_UH1_A23_0 | 0x37 | 8 | |
| BU_UH1_MODE | 0x38 | 2 | R/W |
| BU_UH2_A00_1 | 0x40 | 5 | R/W- Coeff 0,0 |
| BU_UH2_A00_0 | 0x41 | 8 | |
| BU_UH2_A01_1 | 0x42 | 5 | R/W- Coeff 0,1 |
| BU_UH2_A01_0 | 0x43 | 8 | |
| BU_UH2_A02_1 | 0x44 | 5 | R/W- Coeff 0,2 |
| BU_UH2_A02_0 | 0x45 | 8 | |
| BU_UH2_A03_1 | 0x46 | 5 | R/W- COeff 0,0 |
| BU_UH2_A03_0 | 0x47 | 8 | |
| BU_UH2_A10_1 | 0x48 | 5 | R/W- Coeff 1,0 |
| BU_UH2_A10_0 | 0x49 | 8 | |
| BU_UH2_A11_1 | 0x4a | 5 | R/W- Coeff 1,1 |
| BU_UH2_A11_0 | 0x4b | 8 | |
| BU_UH2_A12_1 | 0x4c | 5 | R/W- COeff 1,2 |
| BU_UH2_A12_0 | 0x4d | 8 | |
| BU_UH2_A13_1 | 0x4e | 5 | R/W- Coeff 1,3 |
| BU_UH2_A13f_0 | 0x4f | 8 | |
| BU_UH2_A20_1 | 0x50 | 5 | R/W- Coeff 2,0 |
| BU_UH2_A20_0 | 0x51 | 8 | |
| BU_UH2_A21_1 | 0x52 | 5 | R/W- Coeff 2,1 |
| BU_UH2_A21_0 | 0x53 | 8 | |
| BU_UH2_A22_1 | 0x54 | 5 | R/W- Coeff 2,2 |

TABLE C.11.3-continued

H-Upsamplers and Cspace Keyhole Address Map

| Keyhole Register Name | Keyhole Address | Bits | Comment |
|---|---|---|---|
| BU_UH2_A22_0 | 0x55 | 8 | |
| BU_UH2_A23_1 | 0x56 | 5 | R/W- Coeff 2,3 |
| BU_UH2_A23_0 | 0x57 | 8 | |
| BU_UH2_MODE | 0x58 | 2 | R/W |
| BU_CS_A00_1 | 0x60 | 5 | R/W |
| BU_CS_A00_0 | 0x61 | 8 | |
| BU_CS_A10_1 | 0x62 | 5 | R/W |
| BU_CS_A10_0 | 0x63 | 8 | |
| BU_CS_A20_1 | 0x64 | 5 | R/W |
| BU_CS_A20_0 | 0x65 | 8 | |
| BU_CS_B0_1 | 0x66 | 6 | R/W |
| BU_CS_B0_0 | 0x67 | 8 | |
| BU_CS_A01_1 | 0x68 | 5 | R/W |
| BU_CS_A01_0 | 0x69 | 8 | |
| BU_CS_A11_1 | 0x6a | 5 | R/W |
| BU_CS_A11_0 | 0x6b | 8 | |
| BU_CS_A21_1 | 0x6c | 5 | R/W |
| BU_CS_A21_0 | 0x6d | 8 | |
| BU_CS_B1_1 | 0x6e | 6 | R/W |
| BU_CS_B1_0 | 0x6f | 8 | |
| BU_CS_A02_1 | 0x70 | 5 | R/W |
| BU_CS_A02_0 | 0x71 | 8 | |
| BU_CS_A12_1 | 0x72 | 5 | R/W |
| BU_CS_A12_0 | 0x73 | 8 | |
| BU_CS_A22_1 | 0x74 | 5 | R/W |
| BU_CS_A22_0 | 0x75 | 8 | |
| BU_CS_B2_1 | 0x76 | 6 | R/W |
| BU_CS_B2_0 | 0x77 | 8 | |

SECTION C.13 Picture Size Parameters

C.13.1 Introduction

The following stylized code fragments illustrate the processing necessary to respond to picture size interrupts from the write address generator. Note that the picture size parameters can be changed "on-the-fly" by sending combinations of HORIZONTAL_MBS, VERTICAL_MBS, and DEFINE_SAMPLING (for each component) tokens, resulting in write address generator interrupts. These tokens may arrive in any order and, in general, any one should necessitate the re-calculation of all of the picture size parameters. At setup time, however, it would be more efficient to detect the arrival of all of the events before performing any calculations.

It is possible to write specific values into the picture size parameter registers at setup and, therefore, to not rely on interrupt processing in response to tokens. For this reason, the appropriate register values for SIF pictures are also given.

C.13.2 Interrupt Processing for Picture Size Parameters

There are five picture size events, and the primary response of each is given below:

```
if (hmbs_event)
  load(mbs_wide);
else if (vmbs_event)
  load(mbs_high);
else if (def_samp0_event)
(
  load (maxhb[0]);
  load (maxvb[0]);
)
else if (def_samp1_event)
(
```

-continued

```
        load (maxhb[1]);
        load (maxvb[1]);
    )
    else if (def_samp2_event)
    (
        load (maxhb[2]);
        load (maxvb[2]);
    )
```

In addition, the following calculations are necessary to retain consistent picture size parameters:

```
if (hmbs_event||vmbs_event||
    def_samp0_event||def_samp1_event||def_samp2_event)
(
  for (i=0; i<max_component; i++)
  (
   hbs[i] = addr_hbs[i] = (maxhb[i]+1) * mbs_wide;
   half_width_in_blocks[i] = ((maxhb[i]+1) * mbs_wide)/2;
   last_mb_in_row[i] = hbs[i] - (maxhb[i]+1);
   last_mb_in_half_row[i] = half_width_in_blocks[i] -
(maxhb[i]+1);
   last_row_in_mb[i] = hbs[i] * maxvb[i];
   blocks_per_mb_row[i] = last_row_in_mb[i] + hbs[i];
   last_mb_row[i] = blocks_per_mb_row[i] * (mbs_high-1);
  )
```

Although it is not strictly necessary to modify the dispaddr register values (such as the display window size) in response to picture size interrupts, this may be desirable depending on the application requirements.

C.13.3 Register Values for SIF Pictures

The values contained in all the picture size registers after the above interrupt processing for an SIF, 4:2:0 stream will be as follows:

C.13.3.1 Primary Values

BU_WADDR_MBS_WIDE=0×16

BU_WADDR_MBS_HIGH=0×12

BU_WADDR_COMP0_MAXHB=0×01

BU_WADDR_COMP1_MAXHB=0×00

BU_WADDR_COMP2_MAXHB=0×00

BU_WADDR_COMP0_MAXVB=0×01

BU_WADDR_COMP1_MAXVB=0×00

BU_WADDR_COMP2_MAXVB=0×00

C.13.3.2 secondary Values—After Calculation

BU_WADDR_COMP0_HBS=0×2C

BU_WADDR_COMP1_HBS=0×16

BU_WADDR_COMP2_HBS=0×16

BU_ADDR_COMP0_HBS=0×2C

BU_ADDR_COMP1_HBS=0×16

BU_ADDR_COMP2_HBS=0×16

BU_WADDR_COMP0_HALF_WIDTH_IN_BLOCKS=0×16

BU_WADDR_COMP1_HALF_WIDTH_IN_BLOCKS=0×0B

BU_WADDR_COMP2_HALF_WIDTH_IN_BLOCKS=0×0B

BU_WADDR_COMPO_LAST_MB_IN_ROW=0×2A

BU_WADDR_COMP1_LAST_MB_IN_ROW=0×15

BU_WADDR_COMP2_LAST_MB_IN_ROW=0×15

BU_WADDR_COMP0_LAST_MB_IN_HALF_ROW=0×14

BU_WADDR_COMP1_LAST_MB_IN_HALF_ROW=0×0A

BU_WADDR_COMP2_LAST_MB_IN_HALF_ROW=0×0A

BU_WADDR_COMP0_LAST_ROW_IN_MB=0×2C

BU_WADDR_COMP1_LAST_ROW_IN_MB=0×0

BU_WADDR_COMP2_LAST_ROW_IN_MB=0×0

BU_WADDR_COMP0_BLOCKS_PER_MB_ROW=0×58

BU_WADDR_COMP1_BLOCKS_PER_MB_ROW=0×16

BU_WADDR_COMP2_BLOCKS_PER_MB_ROW=0×16

BU_WADDR_COMP0_LAST_MB_ROW=0×5D8

BU_WADDR_COMP1_LAST_MB_ROW=0×176

BU_WADDR_COMP2_LAST_MB_ROW=0×176

Note that if these values are to be written explicitly at setup, account must be taken of the multi-byte nature of most of the locations.

Note that additional Figures, which are self explanatory to those of ordinary skill in the art, are included with this application for providing further insight into the detailed structure and operation of the environment in which the present invention is intended to function.

The improved system includes a multi-standard video decompression apparatus has a plurality of stages interconnected by a two-wire interface arranged as a pipeline processing machine. Control tokens and DATA Tokens pass over the single two-wire interface for carrying both control and data in token format. A token decode circuit is positioned in certain of the stages for recognizing certain of the tokens as control tokens pertinent to that stage and for passing unrecognized control tokens along the pipeline. Reconfiguration processing circuits are positioned in selected stages and are responsive to a recognized control token for reconfiguring such stage to handle an identified DATA Token. A wide variety of unique supporting subsystem circuitry and processing techniques are disclosed for implementing the system.

It will be apparent from the foregoing that, while particular forms of the invention have been illustrated and described, various modification can be made without departing from the spirit and scope of the invention. Accordingly, it is not intended that the inventors be limited, except as by the appended claims.

I claim:

1. For use with a video decompression system having a plurality of processing stages:

a universal adaptation unit in the form of an interactive interfacing token, for control and/or data functions among said processing stages, wherein said unit is dynamically adaptive and causes said processing stages to reconfigure;

wherein said system operates on a data stream having a plurality of video formats carried therein, and said unit comprises a plurality of units that contain data encoded in different ones of said video formats, and said units are transmitted sequentially through said processing stages and are altered by interfacing with said stages, altered units being transmitted to a subsequent processing stage;

whereby said processing stages are afforded enhanced flexibility in configuration and processing.

2. In a video decompression system having an input, an output and a plurality of processing stages between the input and the output, the improvement comprising:

an interactive metamorphic interfacing token, defining a universal adaptation unit, for control and/or data functions among said processing stages, wherein said unit is dynamically adaptive and causes said processing stages to reconfigure;

wherein said system operates on a data stream having a plurality of video formats carried therein, and said unit comprises a plurality of units that contain data encoded in different ones of said video formats, and said units are transmitted sequentially through said processing stages and are altered by interfacing with said stages, altered units being transmitted to a subsequent processing stage;

wherein said unit is position dependent upon said processing stages for performance of functions:

whereby said processing stages are afforded enhanced flexibility in the performance of diverse tasks.

3. A token as recited in either claim 1 or 2, wherein said unit is position independent of said processing stages for performance of functions.

4. A token as recited in either claim 1 or 2, wherein said unit interacts with all of said stages.

5. A token as recited in either claim 1 or 2, wherein said unit interacts with some, but less than all of said stages.

6. A token as recited in either claim 1 or 2, wherein said unit interacts with only predetermined ones of said stages.

7. A token as recited in either claim 1 or 2, wherein said unit interacts with adjacent stages.

8. A token as recited in either claim 1 or 2, wherein said unit interacts with non-adjacent stages.

9. A token as recited in either claim 1 or 2, wherein said unit is position dependent for some functions and position independent for other functions.

10. A token as recited in either claim 1 or 2, wherein said universal adaptation unit provides a basic building block for the system.

11. A token as recited in either claim 1 or 2, wherein the interaction of said adaptation unit with a stage is conditioned by the previous processing history of said stage.

12. A token as recited in either claim 1 or 2, wherein said adaptation unit has an address field which characterizes said unit.

13. A token as recited in claim 12, wherein interaction with a selected processing stage is determined by said address field.

14. A token as recited in either claim 1 or 2, wherein said adaptation unit includes an extension bit.

15. A token as recited in either claim 1 or 2, wherein said adaptation unit includes an extension bit which indicates the presence of additional words in said adaptation unit.

16. A token as recited in either claim 1 or 2, wherein said adaptation unit includes an extension bit which identifies the last word in said adaptation unit.

17. A token as recited in either claim 1 or 2, wherein said token includes an address field of variable length.

18. A token as recited in claim 17, wherein said address field is Huffman coded.

19. A token as recited in either claim 1 or 2, wherein said adaptation unit is generated by a processing stage.

20. A token as recited in either claim 1 or 2, wherein said adaptation unit includes data for transfer to said processing stages.

21. A token as recited in either claim 1 or 2, wherein said adaptation unit is devoid of data.

22. A token as recited in either claim 1 or 2, wherein said adaptation unit is identified as a DATA token and provides data to said processing stages.

23. A token as recited in either claim 1 or 2, wherein said unit is identified as a control token and only conditions said processing stages.

24. A token as recited in either claim 1 or 2, wherein said adaptation unit provides both data and conditioning to said processing stages.

25. A token as recited in either claim 1 or 2, wherein said adaptation unit identifies a coding standard to said processing stages.

26. A token as recited in either claim 1 or 2, wherein said adaptation unit operates independent of any coding standard among said processing stages.

27. A token as recited in either claim 1 or 2, wherein said adaptation unit is capable of successive alteration by said processing stages.

28. A token as recited in either claim 1 or 2, wherein the interactive flexibility of said adaptation unit in cooperation with said processing stages facilitates greater functional diversity of said processing stages for resident structure.

29. A token as recited in either claim 1 or 2, wherein the flexibility of said adaptation unit facilitates system expansion and/or alteration.

30. A token as recited in either claim 1 or 2, wherein said adaptation unit is capable of facilitating a plurality of functions within a processing stage.

31. A token as recited in either claim 1 or 2, wherein said adaptation unit is hardware based.

32. A token as recited in either claim 1 or 2, wherein said adaptation unit is software based.

33. A token as recited in either claim 1 or 2, wherein said adaptation unit facilitates more efficient use of system bandwidth.

34. A token as recited in either claim 1 or 2, wherein said adaptation unit provides data and control simultaneously to a processing stage.

35. The token as recited in claim 14, wherein said token comprises a plurality of data words, each said word including a said extension bit which indicates a presence or an absence of additional words in said token, a length of said token being determined by said extension bits, whereby said length of said token can be unlimited.

36. In a video decompression system having an input, an output and a plurality of processing stages between the input and the output, the improvement comprising:

said system operating on a data stream comprising a plurality of video formats, an interactive metamorphic interfacing token, transmitted sequentially through said processing stages, defining a universal adaptation unit, for control and/or data functions among said processing stages, wherein said unit is dynamically adaptive and causes said processing stages to reconfigure, said tokens having video format information encoded therein indicative of a current video format;

said processing stages comprising an inverse modeler, a Huffman decoder, and an inverse discrete cosine transform circuit;

wherein each of said inverse modeler, said Huffman decoder, and said inverse discrete cosine transform circuit are reconfigured in response to said encoded video information.

37. The system as recited in claim 36, wherein said system operates on a data stream containing a mixture of data according to an MPEG, JPEG and an H.261 coding standard.

* * * * *